US012796150B2

(12) United States Patent
Haneda et al.

(10) Patent No.: US 12,796,150 B2
(45) Date of Patent: Nov. 10, 2026

(54) OPTICAL DETECTION DEVICE, MANUFACTURING METHOD OF OPTICAL DETECTION DEVICE, AND ELECTRONIC APPARATUS

(71) Applicant: SONY SEMICONDUCTOR SOLUTIONS CORPORATION, Kanagawa (JP)

(72) Inventors: Masaki Haneda, Kanagawa (JP); Kengo Kotoo, Kanagawa (JP); Yoshiki Shirasu, Kanagawa (JP); Kazuki Shimomura, Kanagawa (JP); Nobutoshi Fujii, Kanagawa (JP); Takaaki Hirano, Kanagawa (JP); Yosuke Fujii, Kanagawa (JP); Takashi Oinoue, Tokyo (JP); Suguru Saito, Kanagawa (JP); Toshiyuki Ishimaru, Kanagawa (JP); Keiji Ohshima, Tokyo (JP); Shinichi Imai, Kanagawa (JP); Takuya Kurotori, Kanagawa (JP); Tomohiro Sugiyama, Kanagawa (JP); Ikue Mitsuhashi, Kanagawa (JP); Kenichi Tokuoka, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 297 days.

(21) Appl. No.: 18/568,439

(22) PCT Filed: Jun. 16, 2022

(86) PCT No.: PCT/JP2022/024051

§ 371 (c)(1),
(2) Date: Dec. 8, 2023

(87) PCT Pub. No.: WO2022/265059

PCT Pub. Date: Dec. 22, 2022

(65) Prior Publication Data

US 2024/0290813 A1 Aug. 29, 2024

(30) Foreign Application Priority Data

Jun. 16, 2021 (JP) ................................ 2021-100118
Dec. 9, 2021 (JP) ................................ 2021-200445

(51) Int. Cl.
*H10F 39/00* (2025.01)
*H10F 39/18* (2025.01)

(52) U.S. Cl.
CPC ......... *H10F 39/811* (2025.01); *H10F 39/014* (2025.01); *H10F 39/18* (2025.01);
(Continued)

(58) Field of Classification Search
CPC ...... H10F 39/811; H10F 39/014; H10F 39/18; H10F 39/8037; H10F 39/809;
(Continued)

(56) References Cited

U.S. PATENT DOCUMENTS

2013/0248862 A1* 9/2013 Inoue .................... H10F 39/804 257/432
2016/0071803 A1 3/2016 Saito et al.
(Continued)

FOREIGN PATENT DOCUMENTS

JP H08-162459 6/1996
JP 2011-204915 10/2011
(Continued)

OTHER PUBLICATIONS

International Search Report and Written Opinion prepared by the Japan Patent Office on Aug. 22, 2022, for International Application No. PCT/JP2022/024051, 3 pgs.

*Primary Examiner* — Mohammad A Rahman
(74) *Attorney, Agent, or Firm* — Sheridan Ross P.C.

(57) ABSTRACT

An optical detection device including a through electrode is provided. The optical detection device includes a first semiconductor layer having a photoelectric conversion region, a first surface, and a second surface that is a light entrance surface, a second semiconductor layer with a third surface and a fourth surface, a second wiring layer overlapped with
(Continued)

the third surface, a third wiring layer overlapped with the fourth surface, a first wiring layer with one surface overlapped with the first surface and another surface overlapped with one of the second wiring layer and the third wiring layer, a first conductor that has a first width, includes a first material, and penetrates the second semiconductor layer in a thickness direction, and a second conductor that has a second width smaller than the first width, includes a second material different from the first material, and penetrates the second semiconductor layer in the thickness direction.

59 Claims, 229 Drawing Sheets

(52) U.S. Cl.
CPC ....... *H10F 39/8037* (2025.01); *H10F 39/809* (2025.01); *H10F 39/026* (2025.01)

(58) Field of Classification Search
CPC ...... H10F 39/026; H10F 39/12; H10F 39/182; H10F 39/184; H10P 95/00; H10P 14/40; H10W 20/01; H10W 20/40
See application file for complete search history.

(56) References Cited

U.S. PATENT DOCUMENTS

2018/0286910 A1* 10/2018 Kobayashi ............ H10F 39/802
2019/0244858 A1 8/2019 Yamamoto et al.
2019/0326345 A1* 10/2019 Yamamoto ............ H10F 39/811
2020/0035737 A1* 1/2020 Ito ......................... H10F 39/809
2020/0312913 A1* 10/2020 Yajima ................... H10K 65/00
2021/0104572 A1 4/2021 Kameshima
2021/0118937 A1 4/2021 Tsugawa et al.
2022/0052099 A1 2/2022 Ito et al.
2022/0208823 A1 6/2022 Yoshida
2022/0344400 A1 10/2022 Suzuki

FOREIGN PATENT DOCUMENTS

JP 2013-201188 10/2013
JP 2014-099582 5/2014
JP 2016-058521 4/2016
JP 2018-098495 6/2018
JP 2018-170471 11/2018
JP 2018-182038 11/2018
JP 2018-190766 11/2018
JP 2019-140162 8/2019
JP 2020-161717 10/2020
JP 2020-182112 11/2020
KR 20130108111 A 10/2013
KR 20190093561 A 8/2019
KR 20190095897 A 8/2019
KR 20190139215 A 12/2019
WO WO-2018110636 A1 6/2018
WO WO-2018189994 A1 10/2018
WO WO-2018198814 A1 11/2018
WO WO-2020100806 A1 5/2020
WO WO 2020/137283 7/2020
WO WO-2020218503 A1 10/2020
WO WO 2021/066069 4/2021

* cited by examiner

OPTICAL DETECTION DEVICE, MANUFACTURING METHOD OF OPTICAL DETECTION DEVICE, AND ELECTRONIC APPARATUS

CROSS REFERENCE TO RELATED APPLICATIONS

This application is a national stage application under 35 U.S.C. 371 and claims the benefit of PCT Application No. PCT/JP2022/024051, having an international filing date of 16 Jun. 2022, which designated the United States, which PCT application claimed the benefit of Japanese Patent Application Nos. 2021-100118, filed 16 Jun. 2021, and 2021-200445, filed 9 Dec. 2021, the entire disclosures of each of which are incorporated herein by reference.

TECHNICAL FIELD

The present technology (technology according to the present disclosure) relates to an optical detection device, a manufacturing method of an optical detection device, and an electronic apparatus, and particularly to an optical detection device, a manufacturing method of an optical detection device, and an electronic apparatus each including conductors that penetrates semiconductor layers.

BACKGROUND ART

Some laminated-type image sensors include conductors that penetrates semiconductor layers. PTL 1, PTL 2, and PTL 3 each describe an example of a through electrode which is a conductor that penetrates a semiconductor layer.

CITATION LIST

Patent Literature

PTL 1: Japanese Patent Laid-open No. 2014-99582
PTL 2: Japanese Patent Laid-open No. 2018-190766
PTL 3: Japanese Patent Laid-open No. 2011-204915

SUMMARY

Technical Problems

It is demanded that a through electrode employed as a power source line, for example, have low resistance. It is hence preferable that this type of through electrode have a large diameter in a planar view and include a low-resistance material. Meanwhile, in a case where a through electrode is provided in a narrow area, it is preferable that this through electrode formed in the narrow area have a small diameter and a high aspect ratio.

An object of the present technology is to provide an optical detection device, a manufacturing method of an optical detection device, and an electronic apparatus each including desired through electrodes.

Solution to Problems

An optical detection device according to one aspect of the present technology includes a first semiconductor layer that includes a photoelectric conversion region and has one surface corresponding to a first surface and another surface corresponding to a second surface that is a light entrance surface, a second semiconductor layer that has one surface corresponding to a third surface and another surface corresponding to a fourth surface, a second wiring layer overlapped with the third surface of the second semiconductor layer, a third wiring layer overlapped with the fourth surface of the second semiconductor layer, a first wiring layer that has one surface overlapped with the first surface of the first semiconductor layer and another surface overlapped with one of the second wiring layer and the third wiring layer, a first conductor that has a first width, includes a first material, and penetrates the second semiconductor layer in a thickness direction, and a second conductor that has a second width smaller than the first width, includes a second material different from the first material, and penetrates the second semiconductor layer in the thickness direction.

An optical detection device according to a different aspect of the present technology includes a first semiconductor layer that includes a photoelectric conversion region and has one surface corresponding to a first surface and another surface corresponding to a second surface that is a light entrance surface, a second semiconductor layer that has one surface corresponding to a third surface and another surface corresponding to a fourth surface, a second wiring layer overlapped with the third surface of the second semiconductor layer, a third wiring layer overlapped with the fourth surface of the second semiconductor layer, a first wiring layer that has one surface overlapped with the first surface of the first semiconductor layer and another surface overlapped with one of the second wiring layer and the third wiring layer, a first conductor that includes a first material, and penetrates the second semiconductor layer in a thickness direction, and a second conductor that includes a second material different from the first material, and penetrates the second semiconductor layer in the thickness direction.

A manufacturing method of an optical detection device according to one aspect of the present technology includes forming one conductor in a semiconductor layer such that the one conductor penetrates the semiconductor layer, laminating an insulation film such that the insulation film covers one end of the one conductor, forming, from the insulation film side, a different conductor that includes a material different from a material constituting the one conductor and has a larger diameter than the one conductor, such that the different conductor penetrates the semiconductor layer, and forming, from the insulation film side, a wire connected to the one conductor and a wire connected to the different conductor.

An electronic apparatus according to one aspect of the present technology includes the optical detection device described above, and an optical system that causes the optical detection device to form an image of image light coming from a subject.

An optical detection device according to a different aspect of the present technology includes a first semiconductor layer that includes a photoelectric conversion region and has one surface corresponding to a first surface and another surface corresponding to a second surface that is a light entrance surface, a second semiconductor layer that has one surface corresponding to a third surface and another surface corresponding to a fourth surface, a second wiring layer overlapped with the third surface of the second semiconductor layer, a third wiring layer overlapped with the fourth surface of the second semiconductor layer, a first wiring layer that has one surface overlapped with the first surface of the first semiconductor layer and another surface overlapped with one of the second wiring layer and the third wiring layer, a first conductor that has a first width, and penetrates the second semiconductor layer in a thickness direction, and a second conductor that has a second width smaller than the first width, and penetrates the second semiconductor layer in the thickness direction.

BRIEF DESCRIPTION OF DRAWINGS

FIG. 5O is a step cross-sectional diagram continuing from FIG. 5N.

FIG. 47B is a step cross-sectional diagram continuing from FIG. 47A.

FIG. 48A is a chip layout diagram depicting one configuration example of an optical detection device according to modification 2 of the fifth embodiment of the present technology.

FIG. 48B is a longitudinal cross-sectional diagram depicting a main part of the optical detection device according to modification 2 of the fifth embodiment of the present technology.

FIG. 49 is an explanatory diagram schematically depicting a longitudinal cross-sectional structure of a plurality of second conductors included in an optical detection device according to a sixth embodiment of the present technology.

FIG. 50A is a step cross-sectional diagram depicting a manufacturing method of the second conductors according to the sixth embodiment of the present technology.

FIG. 50B is a step cross-sectional diagram continuing from FIG. 50A.

FIG. 50C is a step cross-sectional diagram continuing from FIG. 50B.

FIG. 50D is a step cross-sectional diagram continuing from FIG. 50C.

FIG. 50E is a step cross-sectional diagram continuing from FIG. 50D.

FIG. 50F is a step cross-sectional diagram continuing from FIG. 50E.

FIG. 50G is a step cross-sectional diagram continuing from FIG. 50F.

FIG. 50H is a step cross-sectional diagram continuing from FIG. 50G.

Figure 51A:
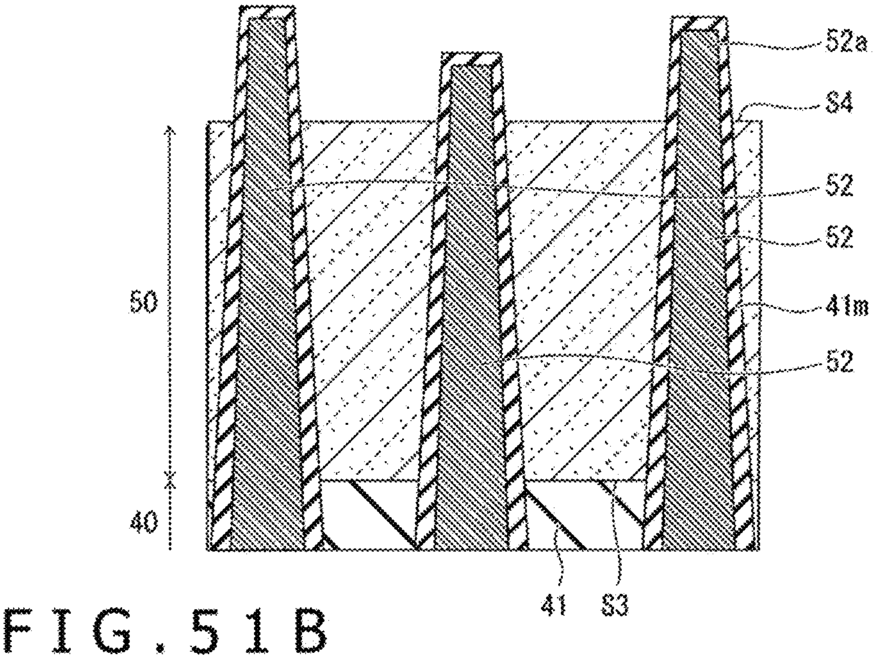

FIG. 51A is a step cross-sectional diagram depicting a manufacturing method of a plurality of second conductors included in a conventional optical detection device.

Figure 51B:
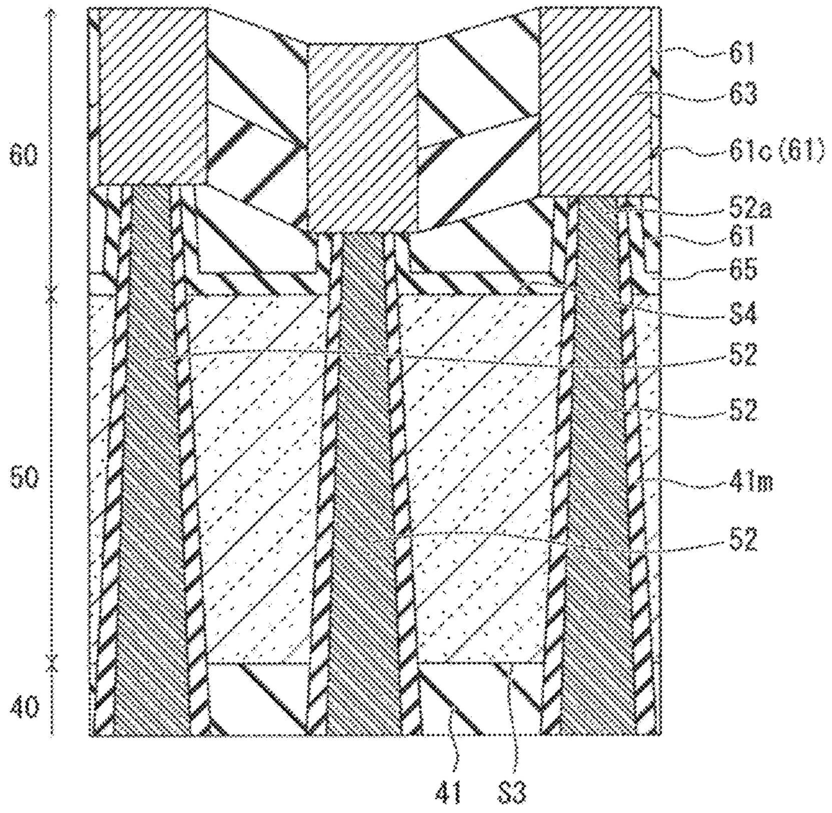

FIG. 51B is a step cross-sectional diagram continuing from FIG. 51A.

Figure 51C:
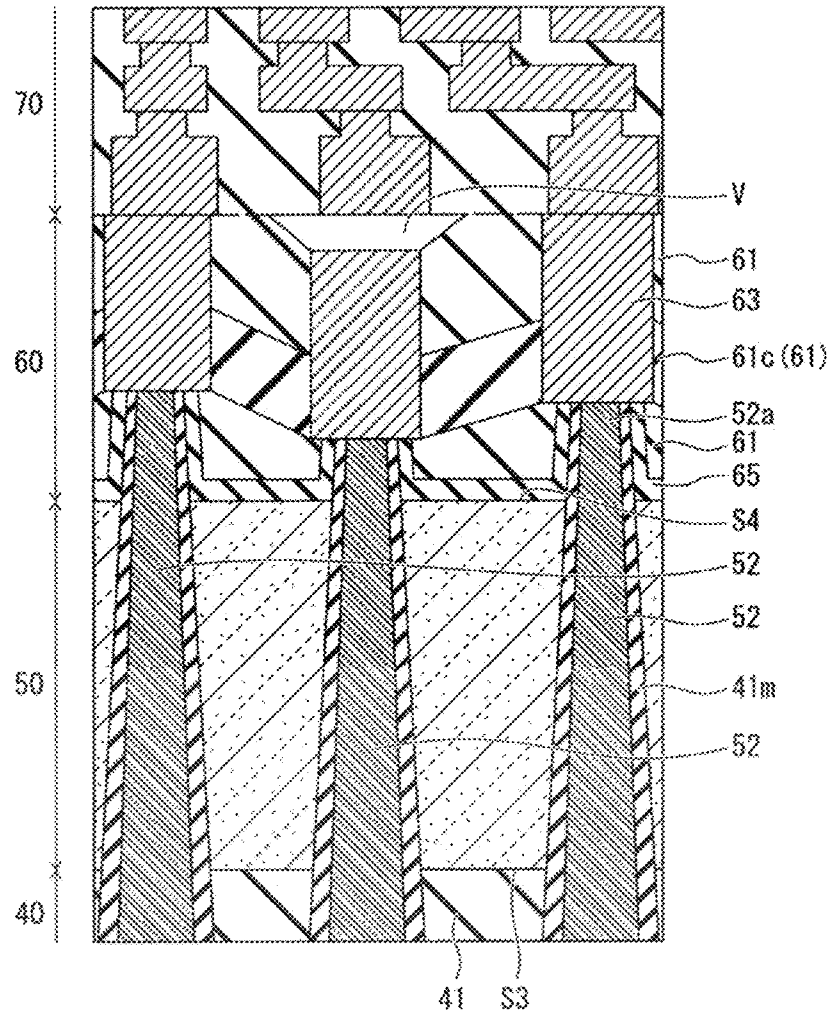

FIG. 51C is a step cross-sectional diagram continuing from FIG. 51B.

Figure 52:
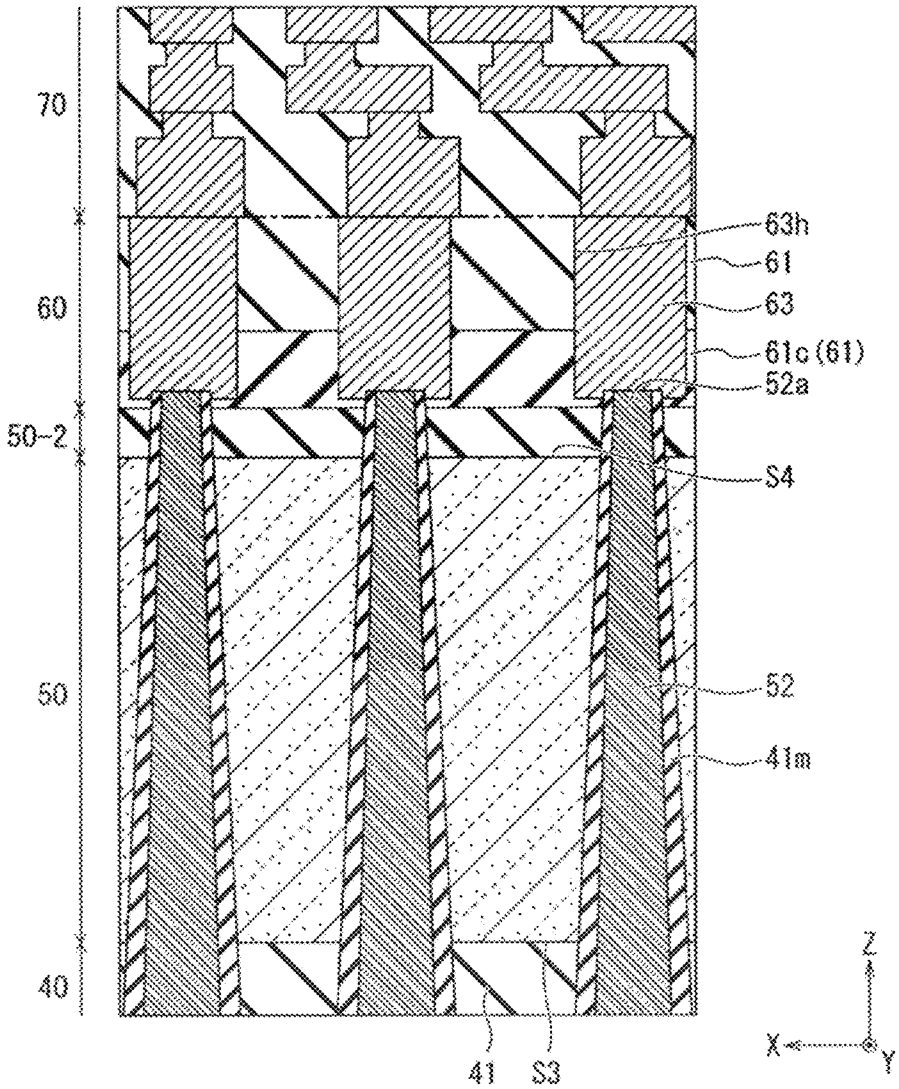

FIG. 52 is an explanatory diagram schematically depicting a longitudinal cross-sectional structure of a plurality of second conductors included in an optical detection device according to modification 1 of the sixth embodiment of the present technology.

Figure 53A:
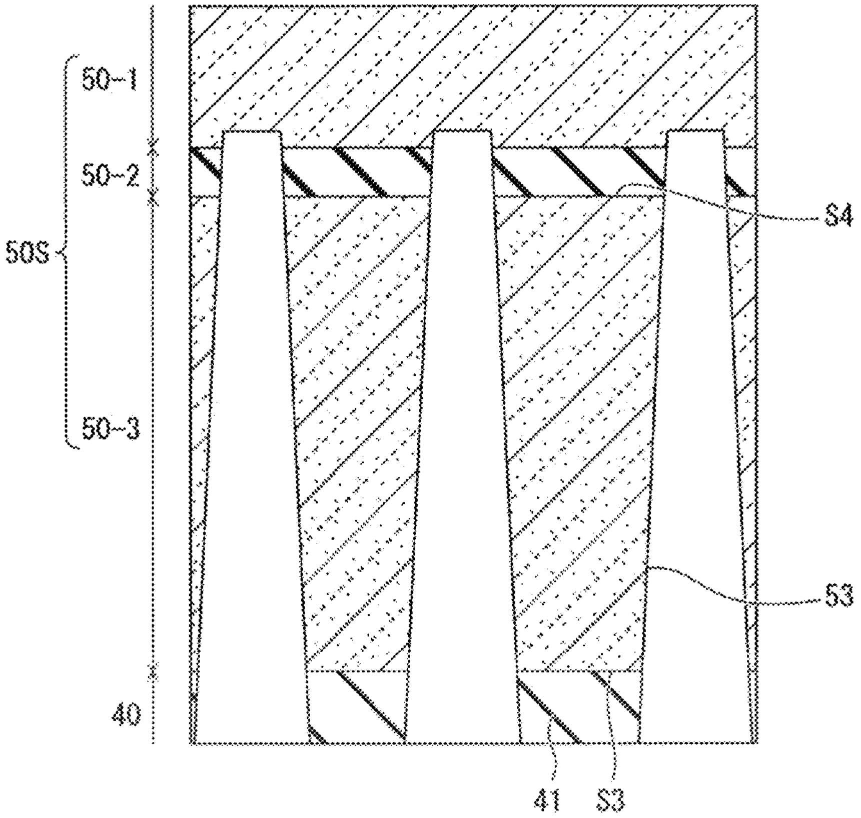

FIG. 53A is a step cross-sectional diagram depicting a manufacturing method of the second conductors according to modification 1 of the sixth embodiment of the present technology.

Figure 53B:
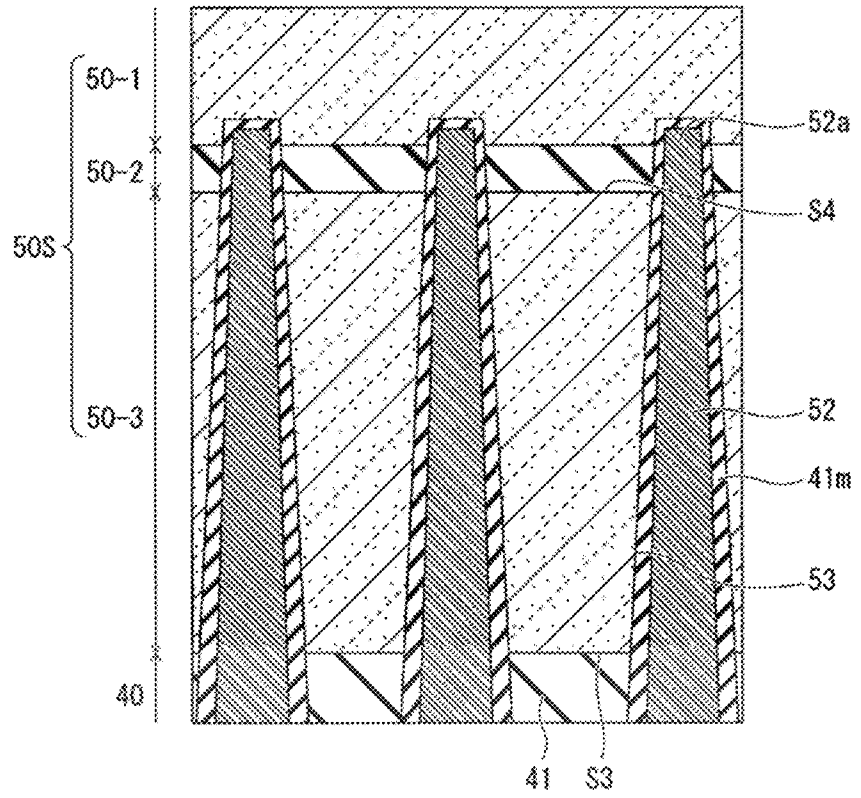

FIG. 53B is a step cross-sectional diagram continuing from FIG. 53A.

Figure 53C:
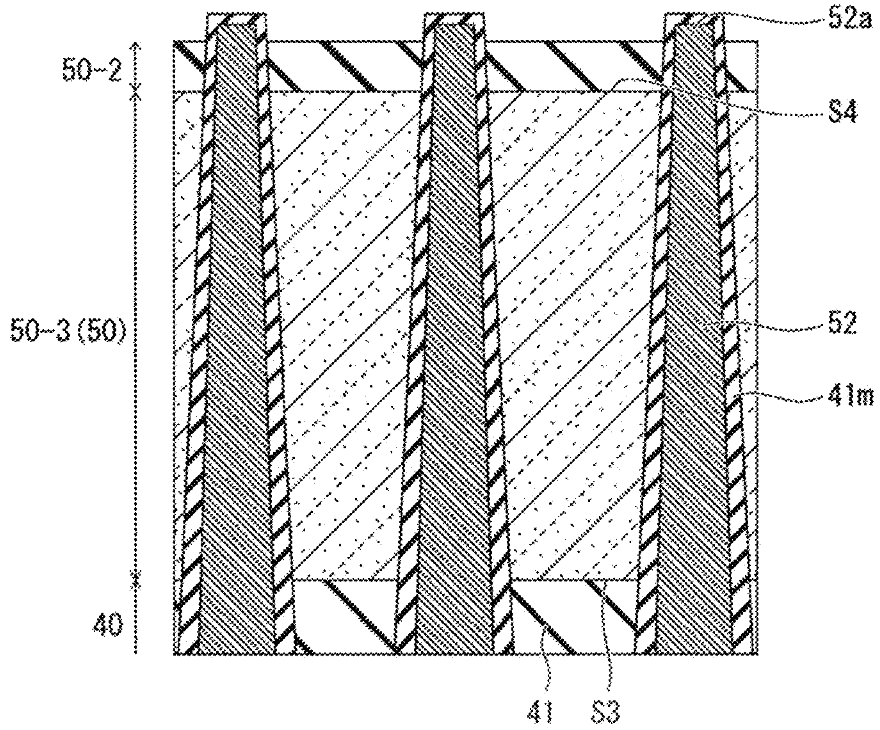

FIG. 53C is a step cross-sectional diagram continuing from FIG. 53B.

Figure 53D:
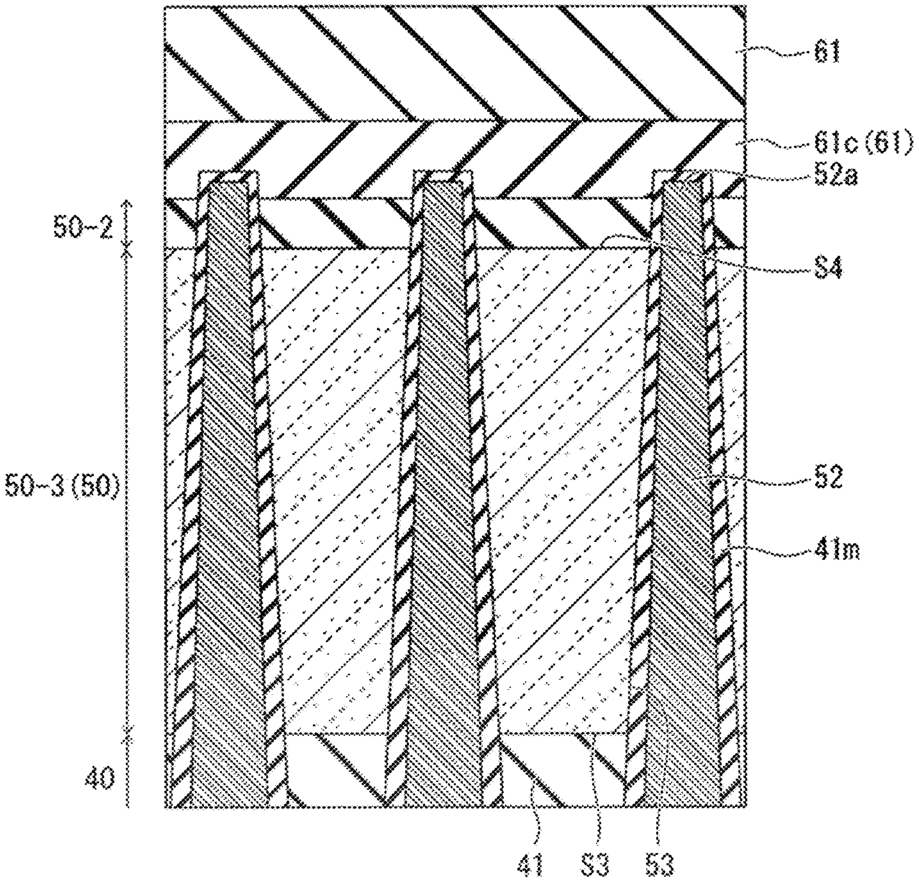

FIG. 53D is a step cross-sectional diagram continuing from FIG. 53C.

Figure 54:
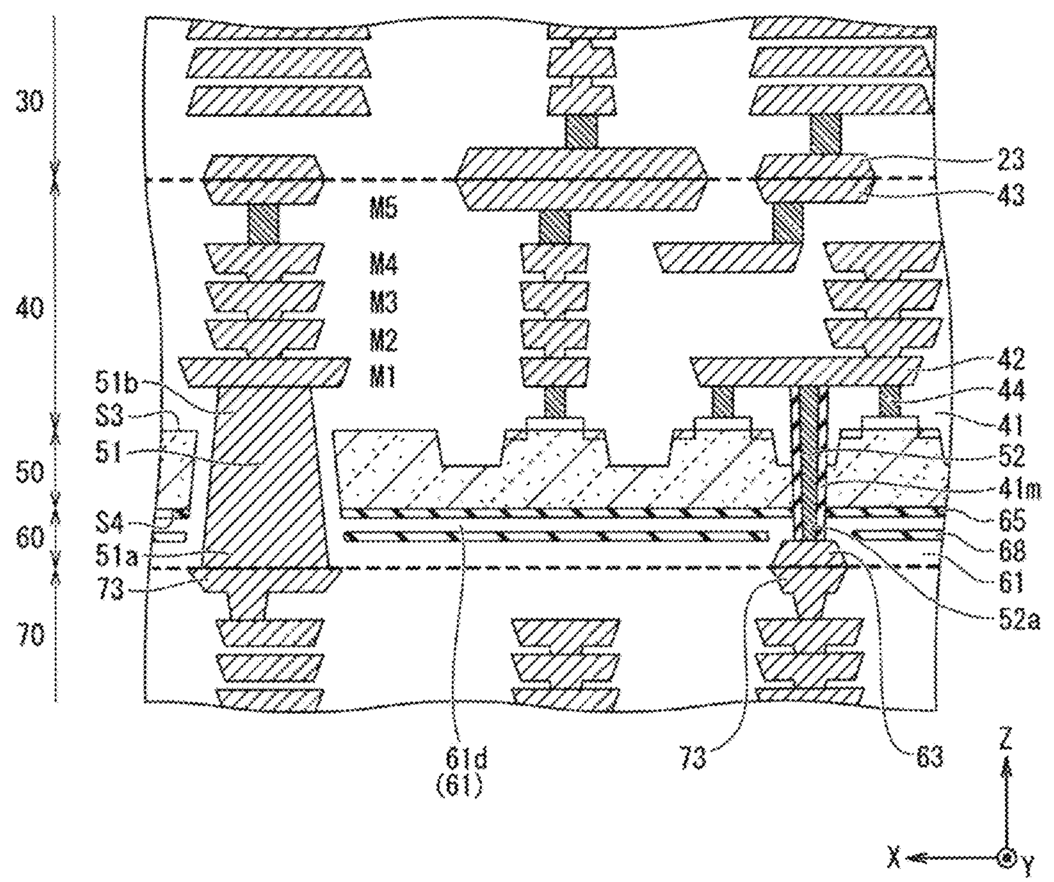

FIG. 54 is a longitudinal cross-sectional diagram depicting a main part of an optical detection device according to a seventh embodiment of the present technology.

Figure 55A:
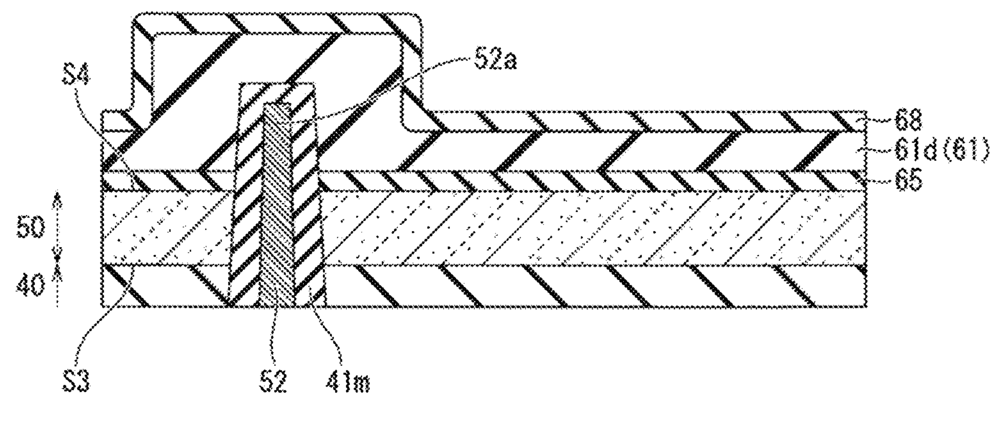

FIG. 55A is a step cross-sectional diagram depicting a manufacturing method of the optical detection device according to the seventh embodiment of the present technology.

Figure 55B:
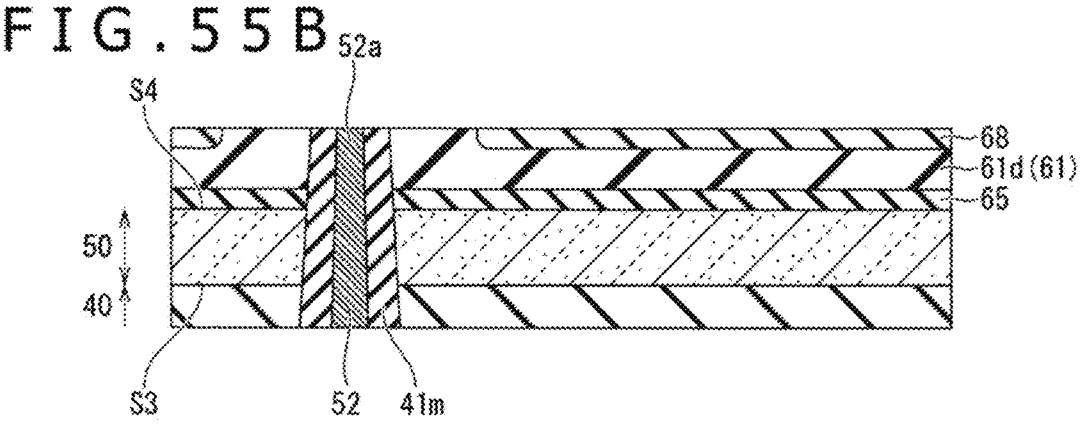

FIG. 55B is a step cross-sectional diagram continuing from FIG. 55A.

Figure 55C:
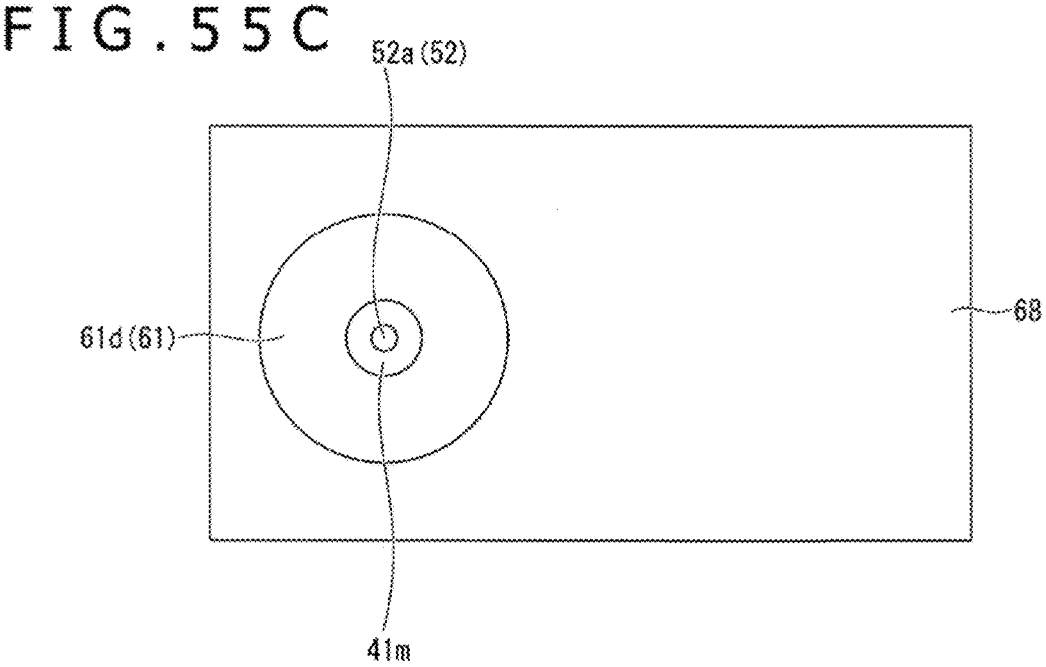

FIG. 55C is a plan diagram of FIG. 55B as viewed from a protection insulation film side.

Figure 55D:
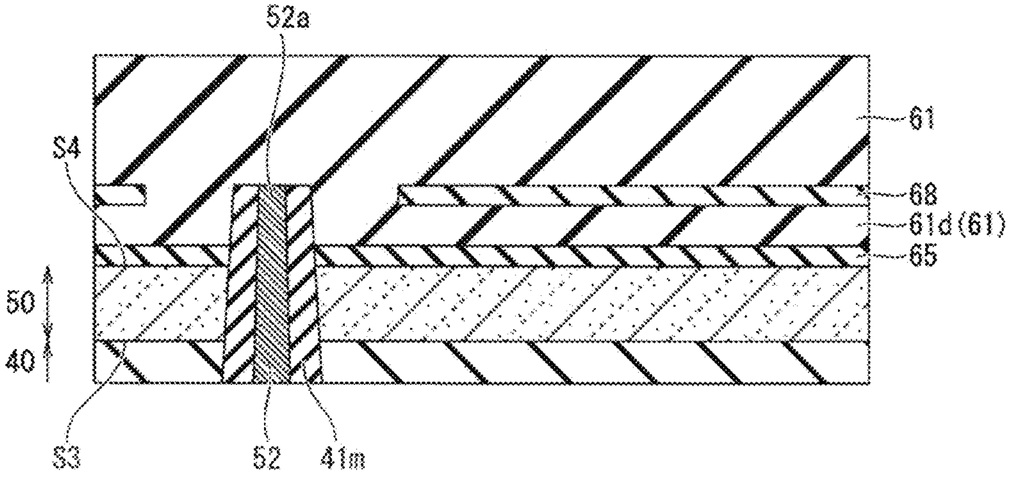

FIG. 55D is a step cross-sectional diagram continuing from FIG. 55B.

Figure 55E:
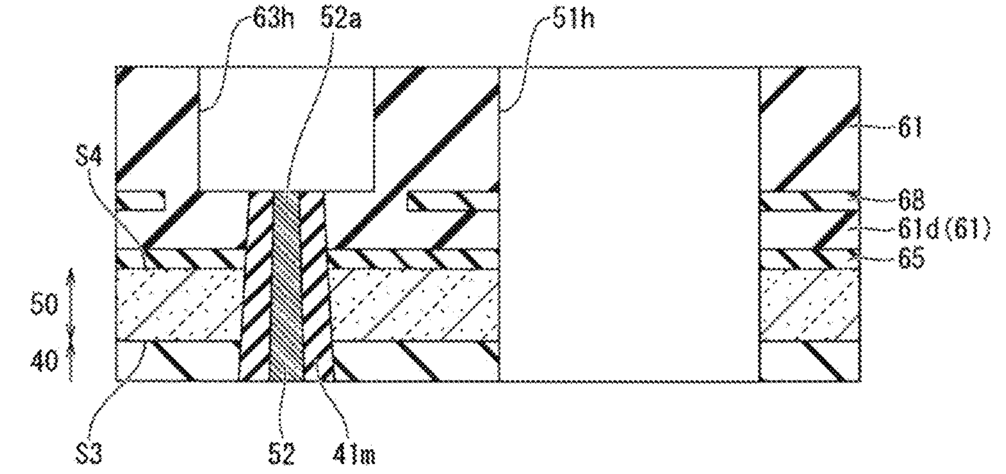

FIG. 55E is a step cross-sectional diagram continuing from FIG. 55D.

Figure 55F:
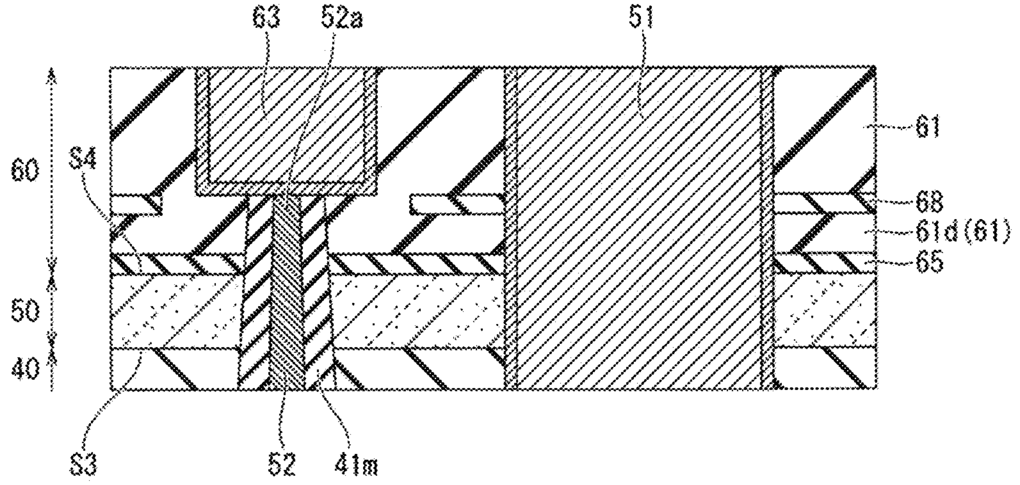

FIG. 55F is a step cross-sectional diagram continuing from FIG. 55E.

Figure 56:
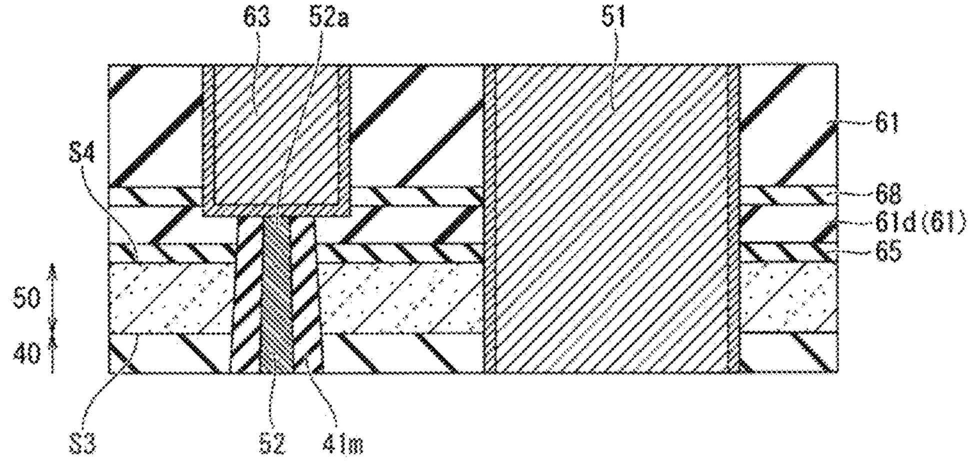

FIG. 56 is a longitudinal cross-sectional diagram depicting a main part of an optical detection device according to modification 1 of the seventh embodiment of the present technology.

Figure 57A:
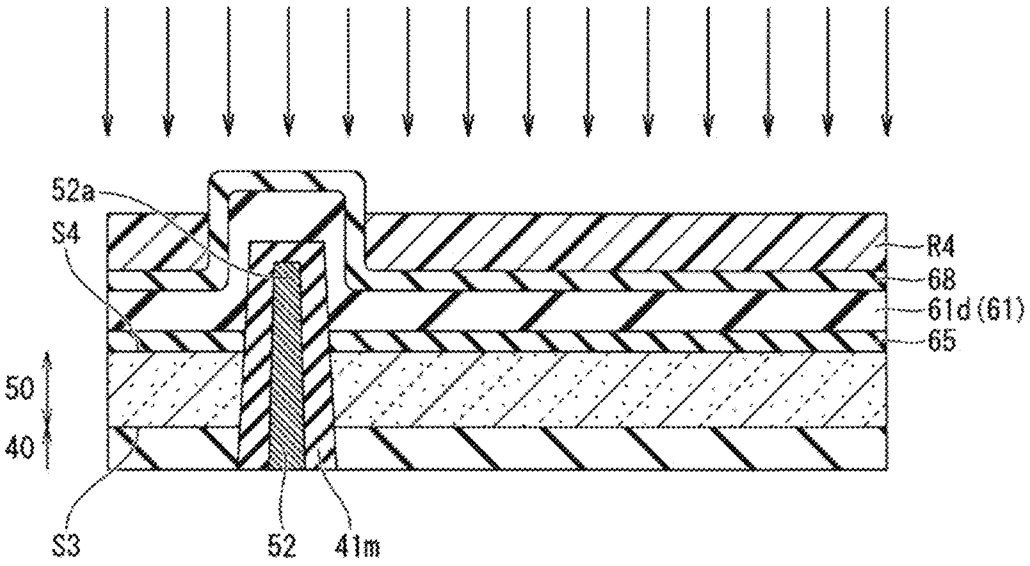

FIG. 57A is a step cross-sectional diagram depicting a manufacturing method of the optical detection device according to modification 1 of the seventh embodiment of the present technology.

Figure 57B:
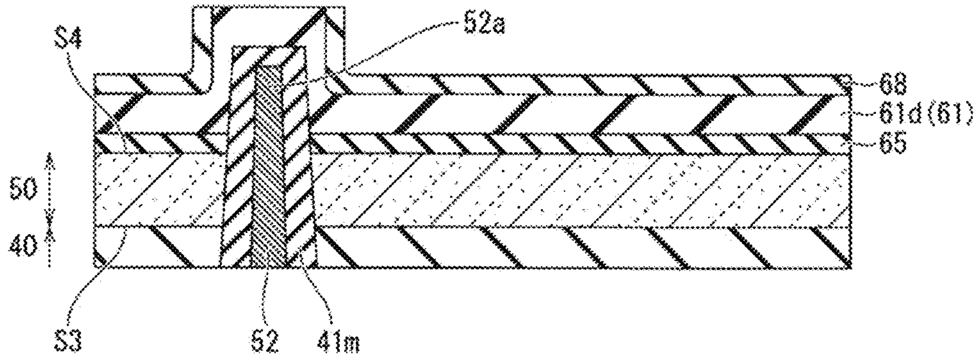

FIG. 57B is a step cross-sectional diagram continuing from FIG. 57A.

Figure 57C:
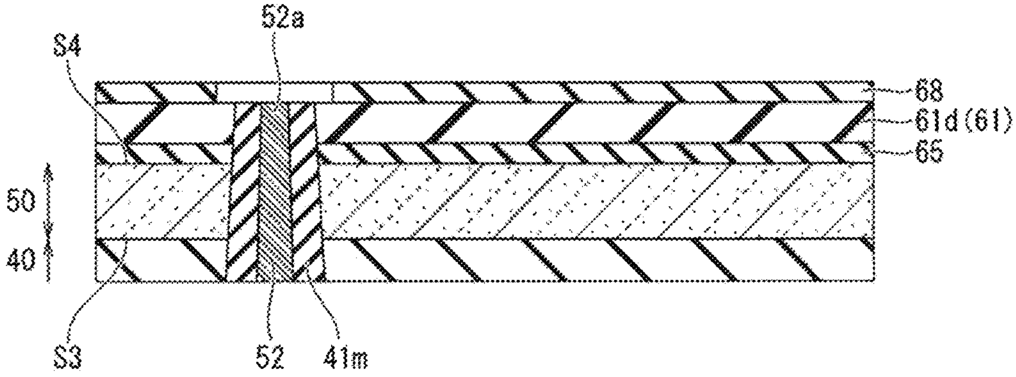

FIG. 57C is a step cross-sectional diagram continuing from FIG. 57B.

Figure 57D:
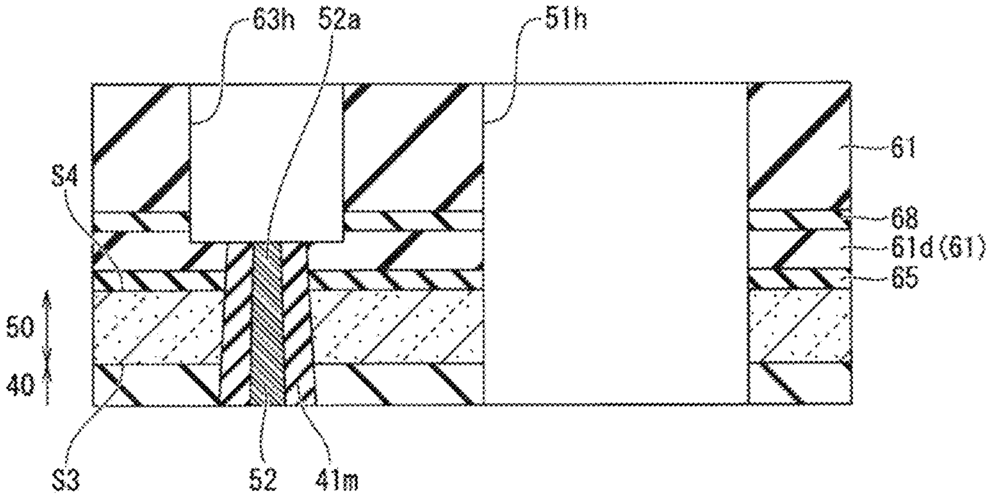

FIG. 57D is a step cross-sectional diagram continuing from FIG. 57C.

Figure 58:
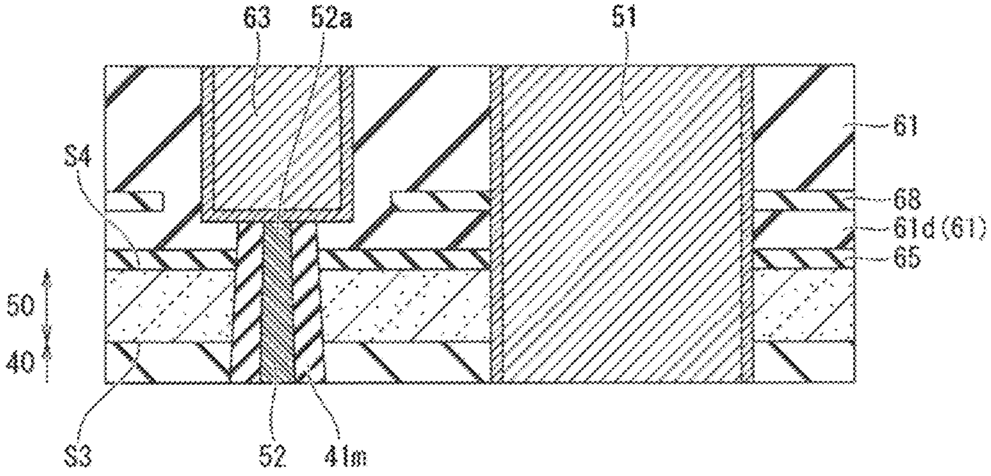

FIG. 58 is a longitudinal cross-sectional diagram depicting a main part of an optical detection device according to modification 2 of the seventh embodiment of the present technology.

Figure 59A:
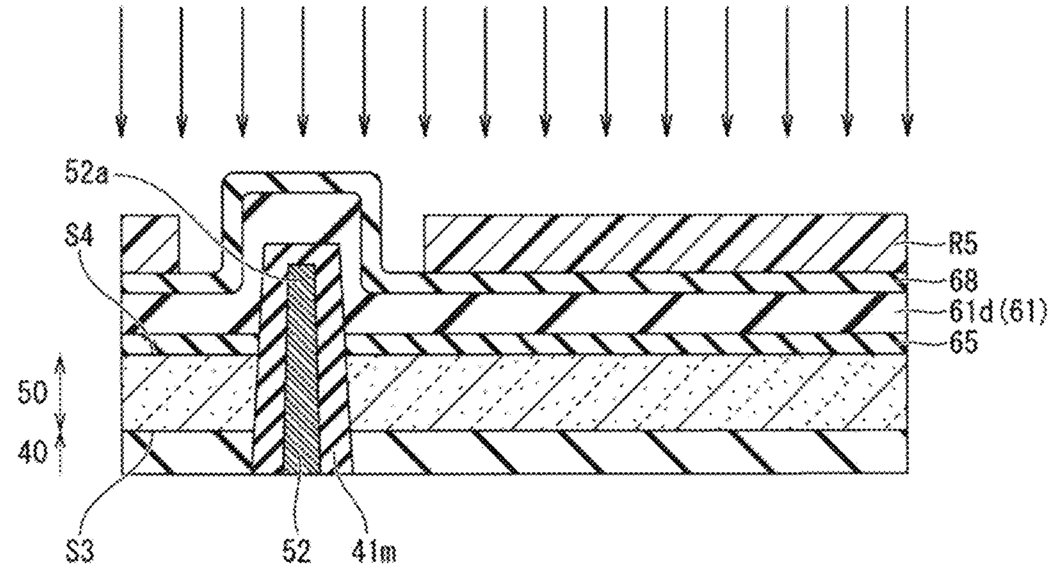

FIG. 59A is a step cross-sectional diagram depicting a manufacturing method of the optical detection device according to modification 2 of the seventh embodiment of the present technology.

Figure 59B:
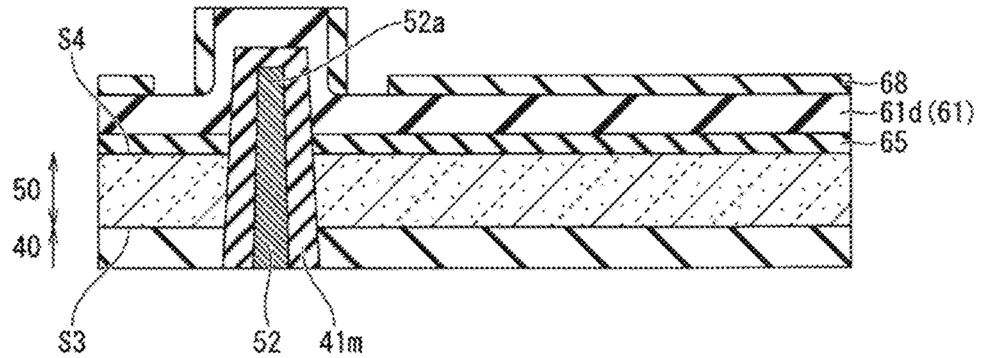

FIG. 59B is a step cross-sectional diagram continuing from FIG. 59A.

Figure 59C:
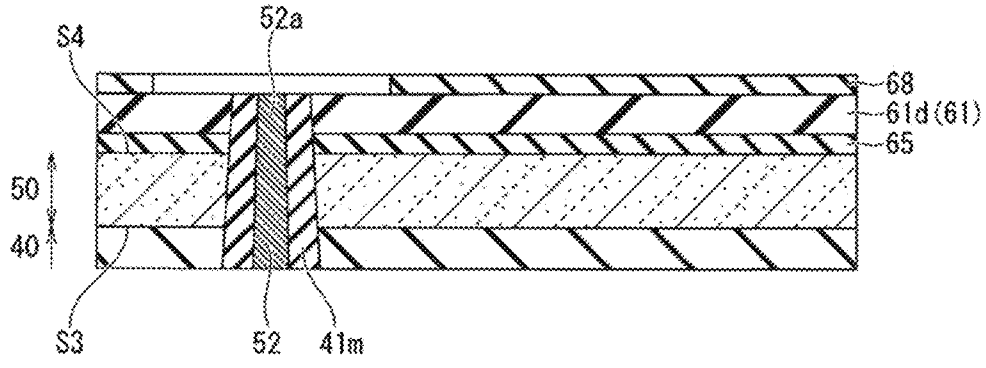

FIG. 59C is a step cross-sectional diagram continuing from FIG. 59B.

Figure 59D:
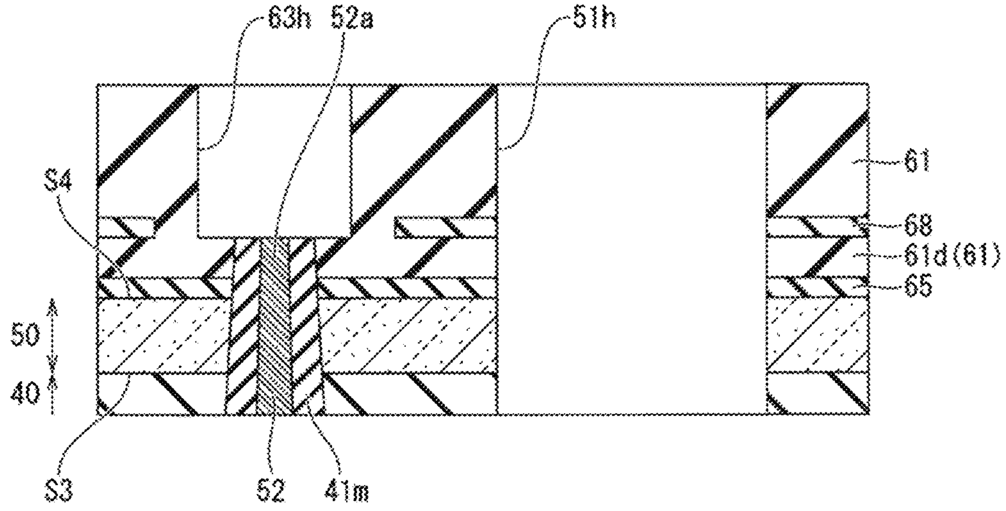

FIG. 59D is a step cross-sectional diagram continuing from FIG. 59C.

Figure 60:
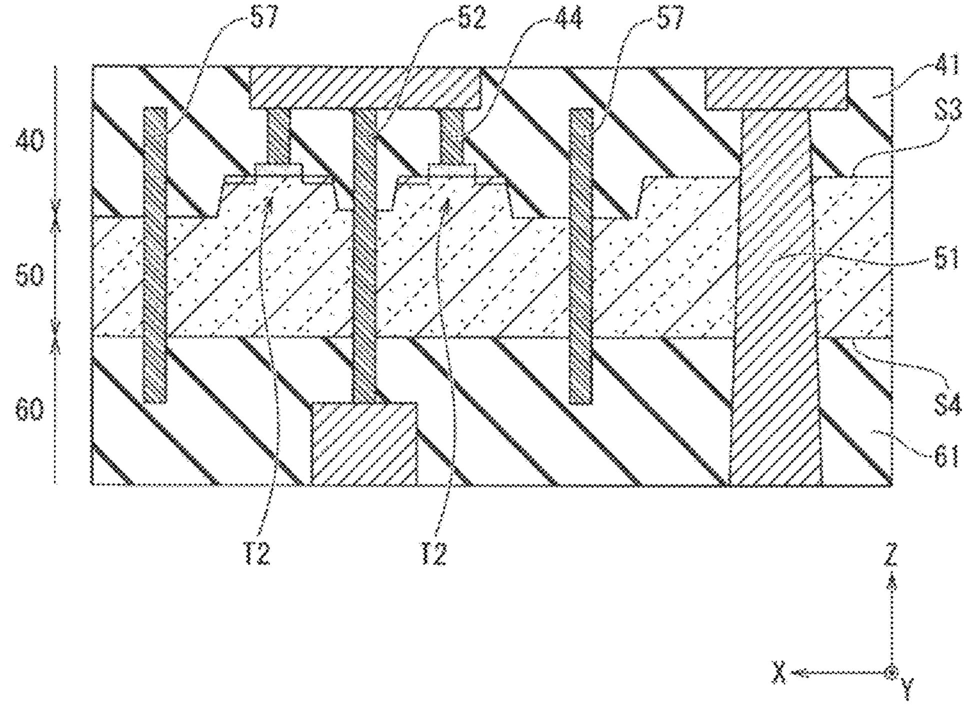

FIG. 60 is a longitudinal cross-sectional diagram depicting a main part of an optical detection device according to an eighth embodiment of the present technology.

Figure 61A:
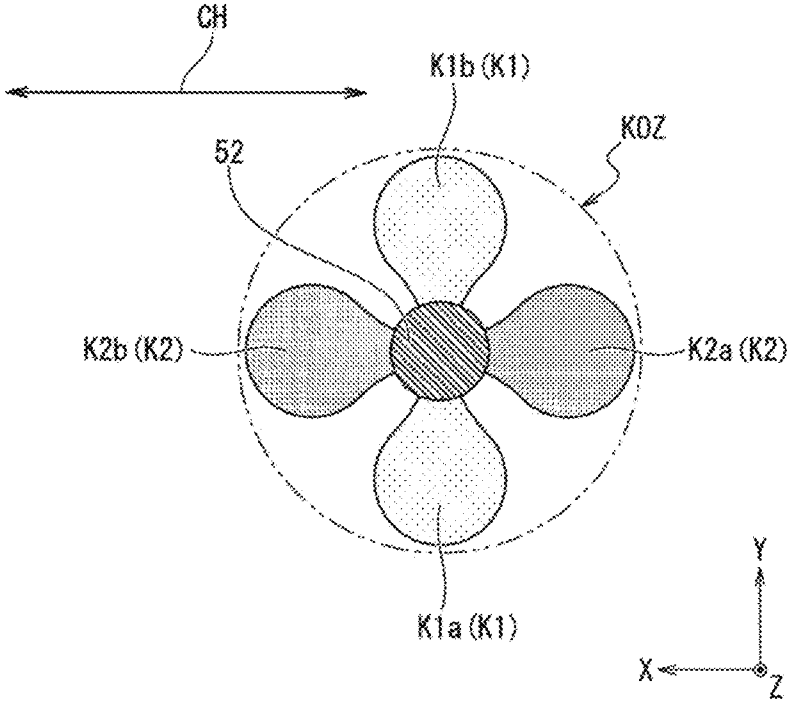

FIG. 61A is a plan diagram for explaining regions in each of which an amount of signal charge increases or decreases.

Figure 61B:
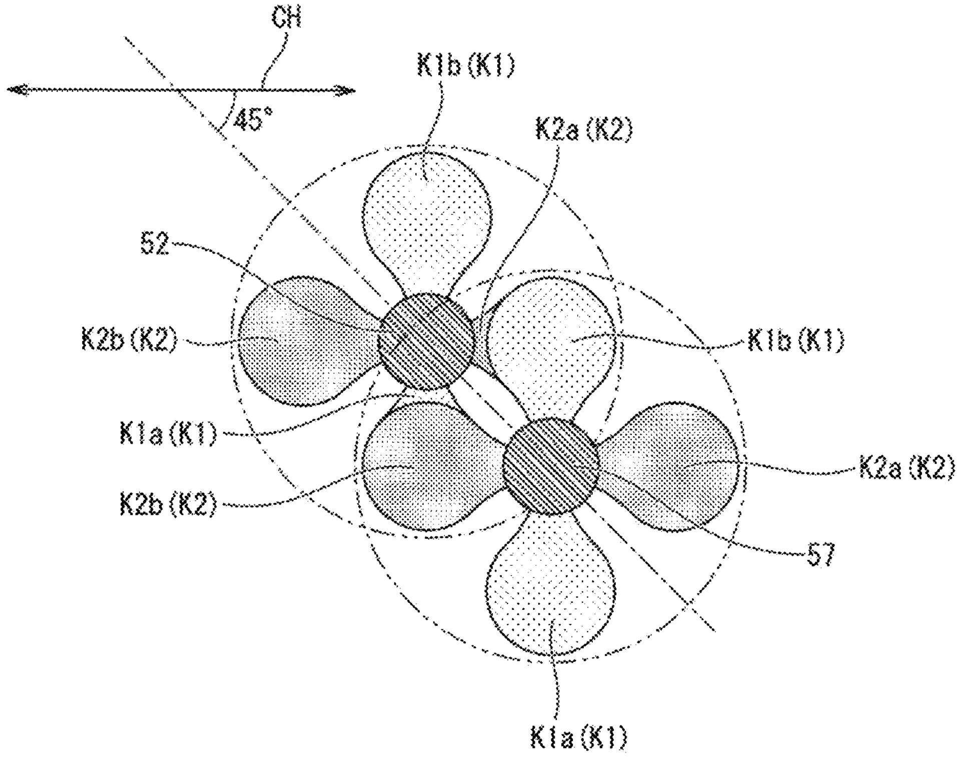

FIG. 61B is a plan diagram for explaining an arrangement relation between a second conductor and a third conductor.

Figure 61C:
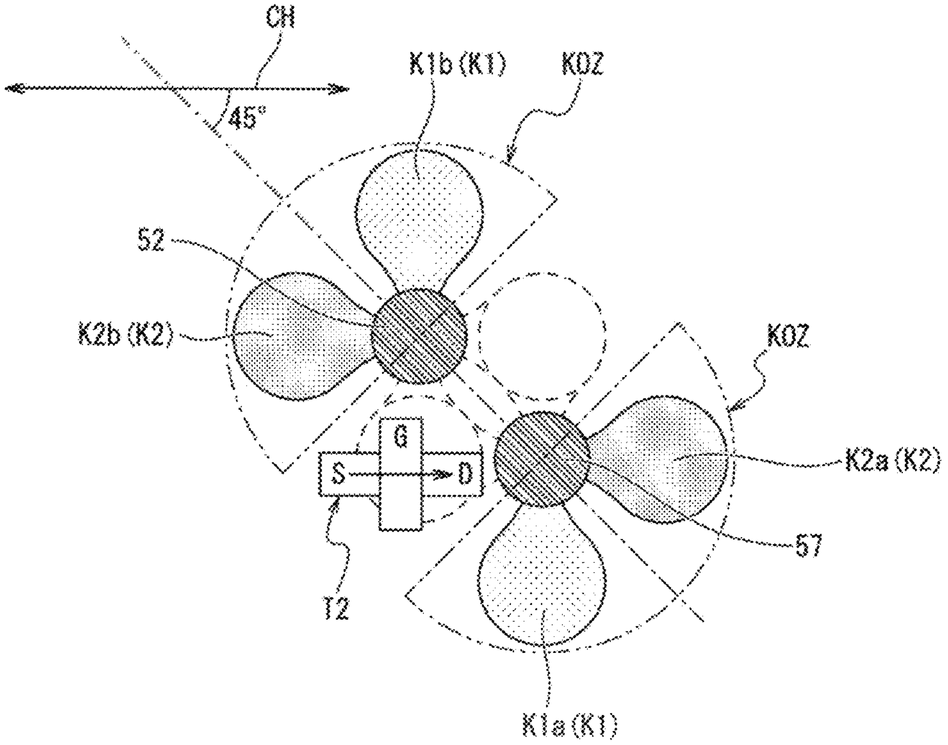

FIG. 61C is a plan diagram for explaining a concept of canceling an increase and a decrease in the amount of signal charge.

Figure 62:
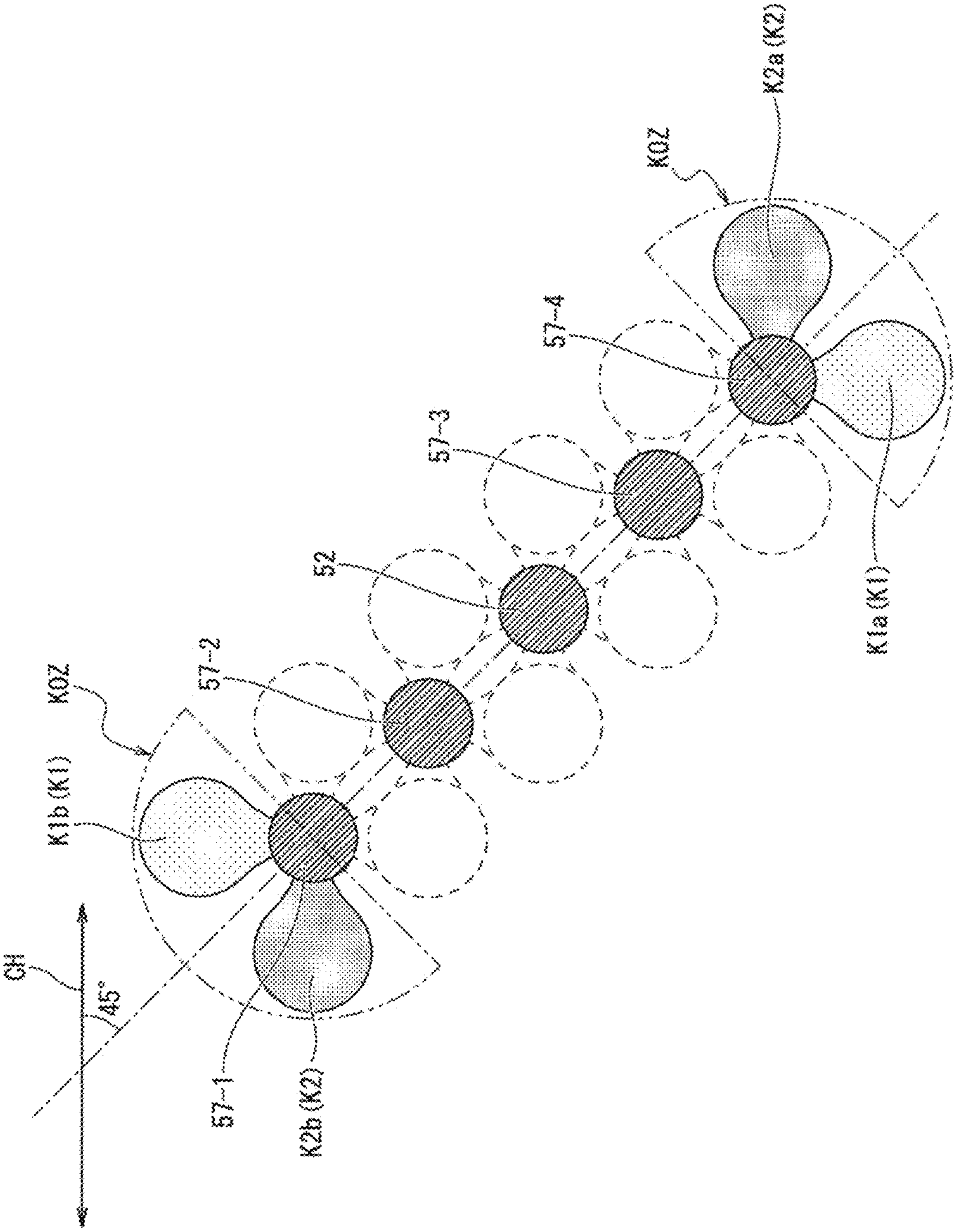

FIG. 62 is a plan diagram depicting an array of one second conductor and a plurality of third conductors.

Figure 63A:
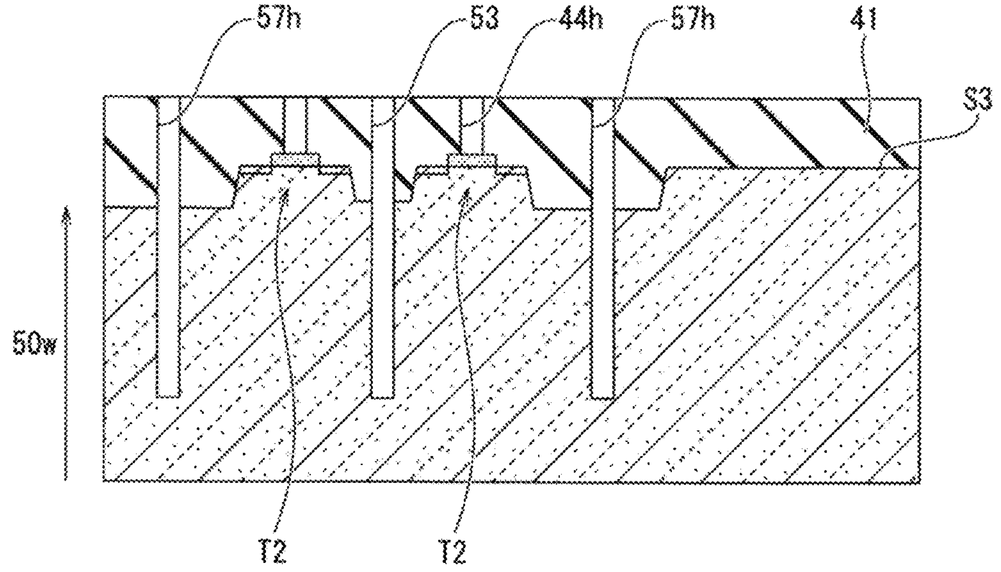

FIG. 63A is a step cross-sectional diagram depicting a manufacturing method of the optical detection device according to the eighth embodiment of the present technology.

Figure 63B:
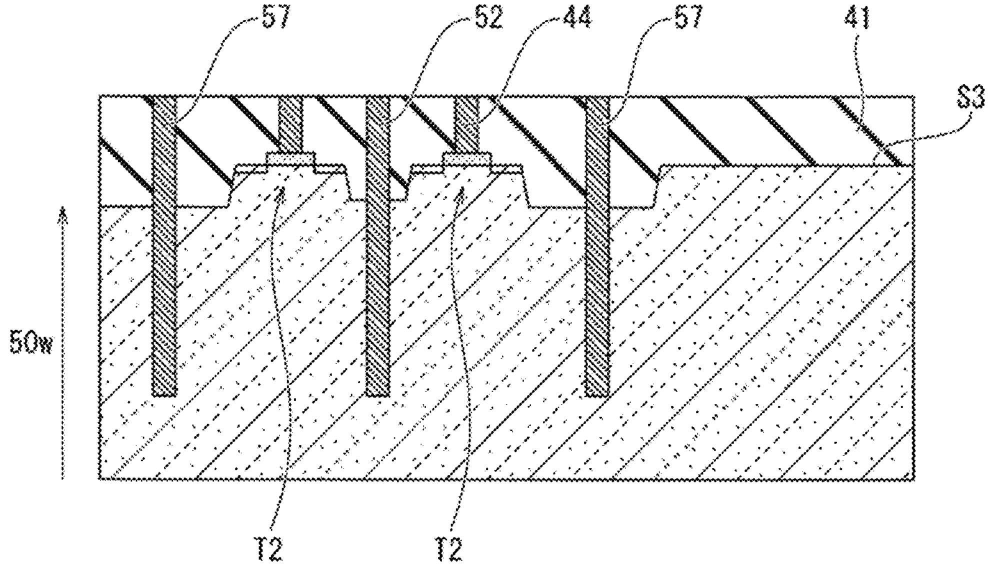

FIG. 63B is a step cross-sectional diagram continuing from FIG. 63A.

Figure 64:
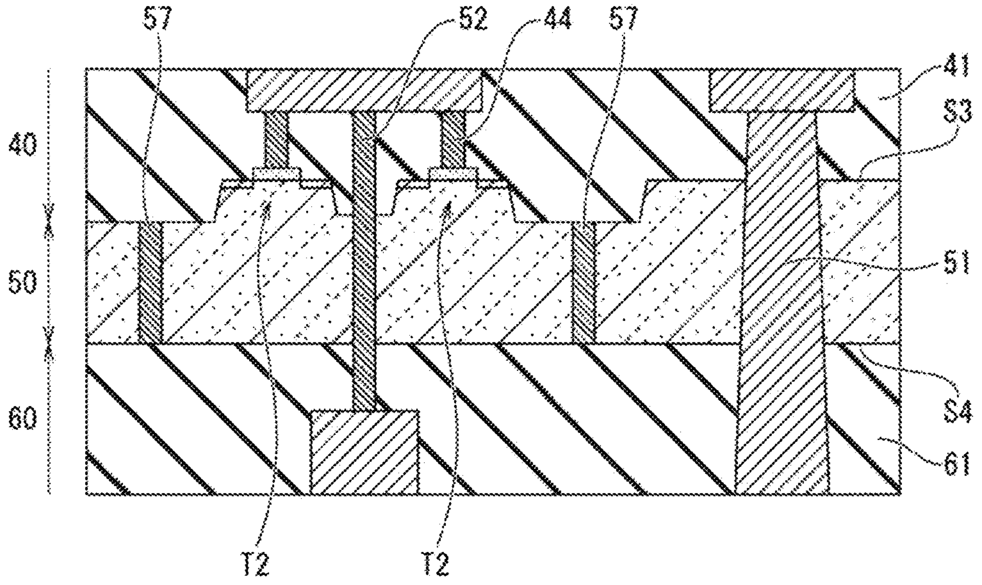

FIG. 64 is a longitudinal cross-sectional diagram depicting a main part of an optical detection device according to modification 1 of the eighth embodiment of the present technology.

Figure 65:
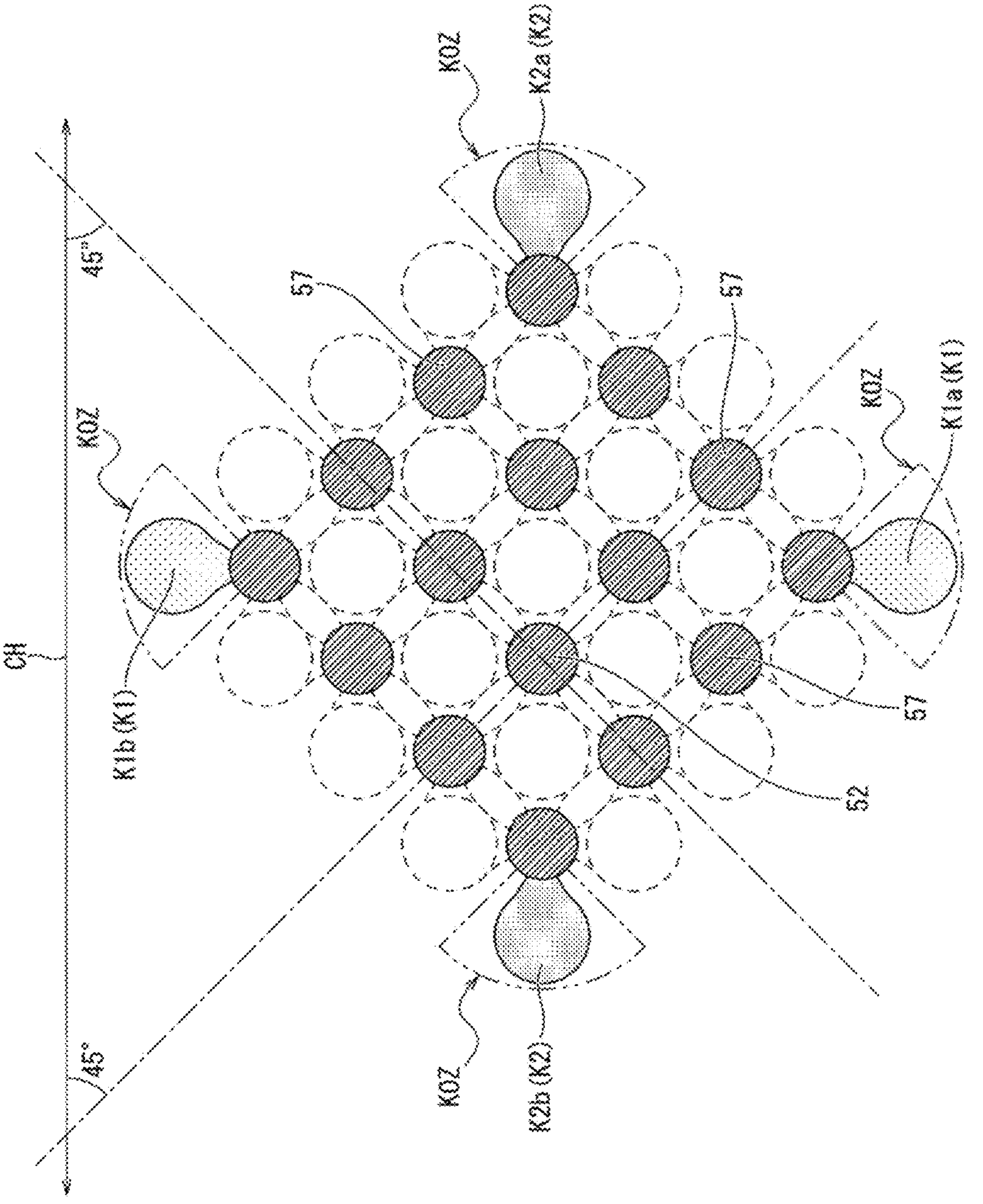

FIG. 65 is a plan diagram depicting an array of one second conductor and a plurality of third conductors of an optical detection device according to modification 2 of the eighth embodiment of the present technology.

Figure 66:
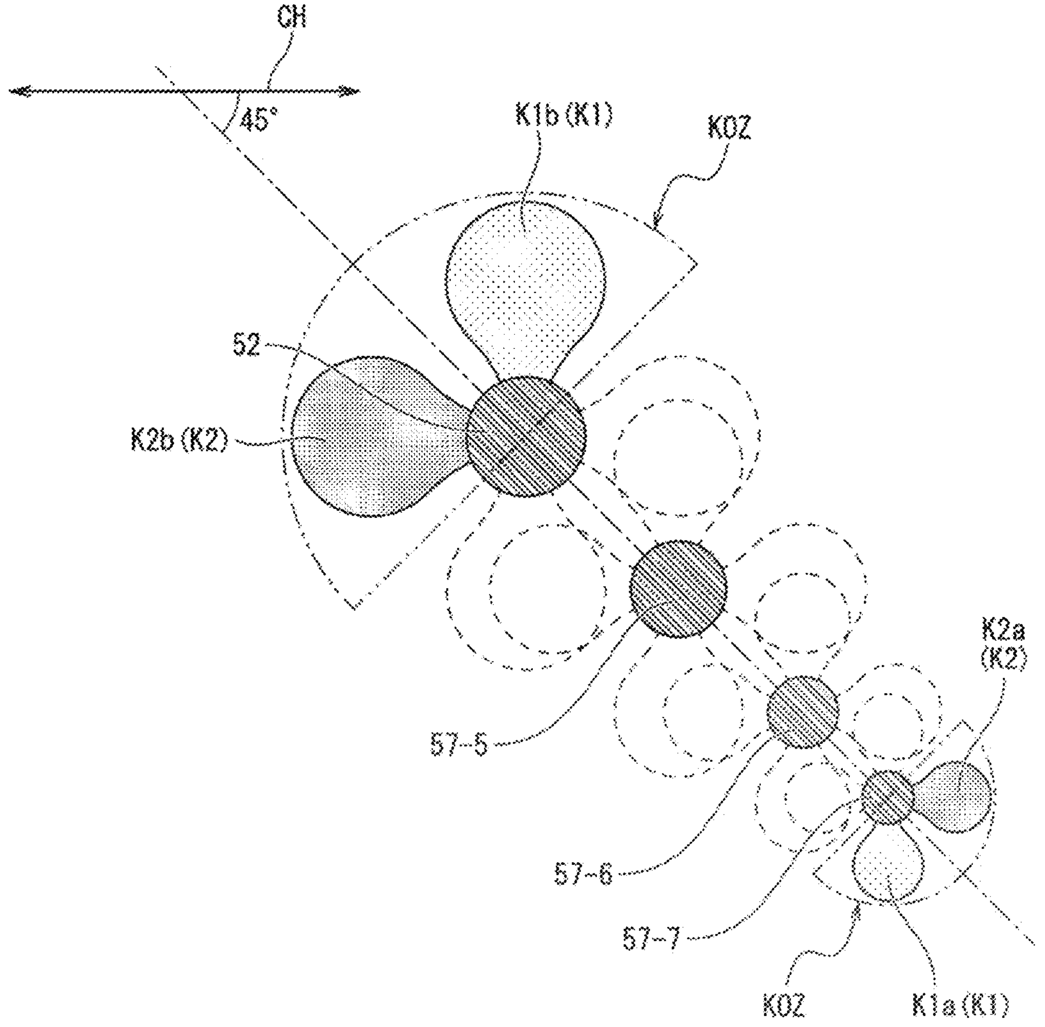

FIG. 66 is a plan diagram depicting an array of one second conductor and a plurality of third conductors of an optical detection device according to modification 3 of the eighth embodiment of the present technology.

Figure 67:
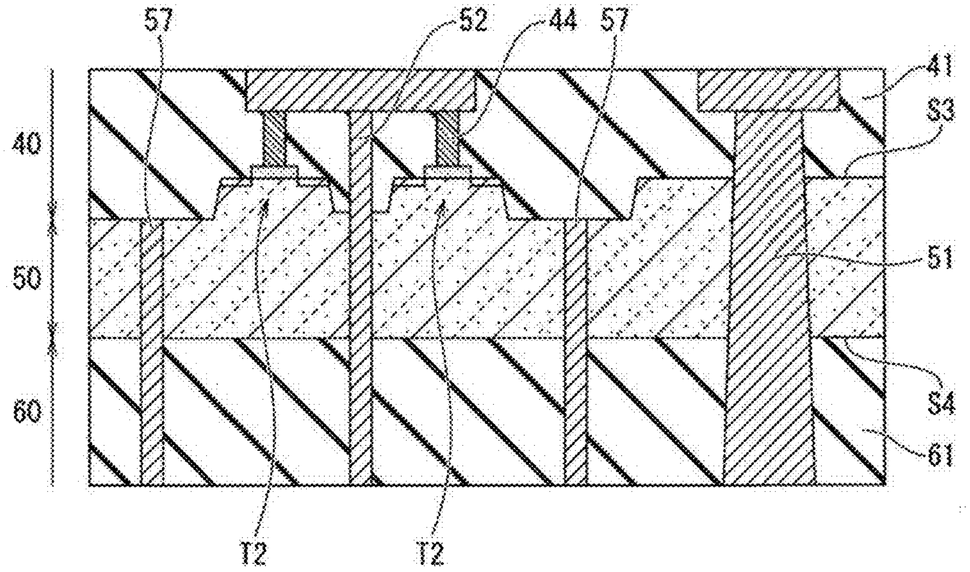

FIG. 67 is a longitudinal cross-sectional diagram depicting a main part of an optical detection device according to modification 4 of the eighth embodiment of the present technology.

Figure 68:
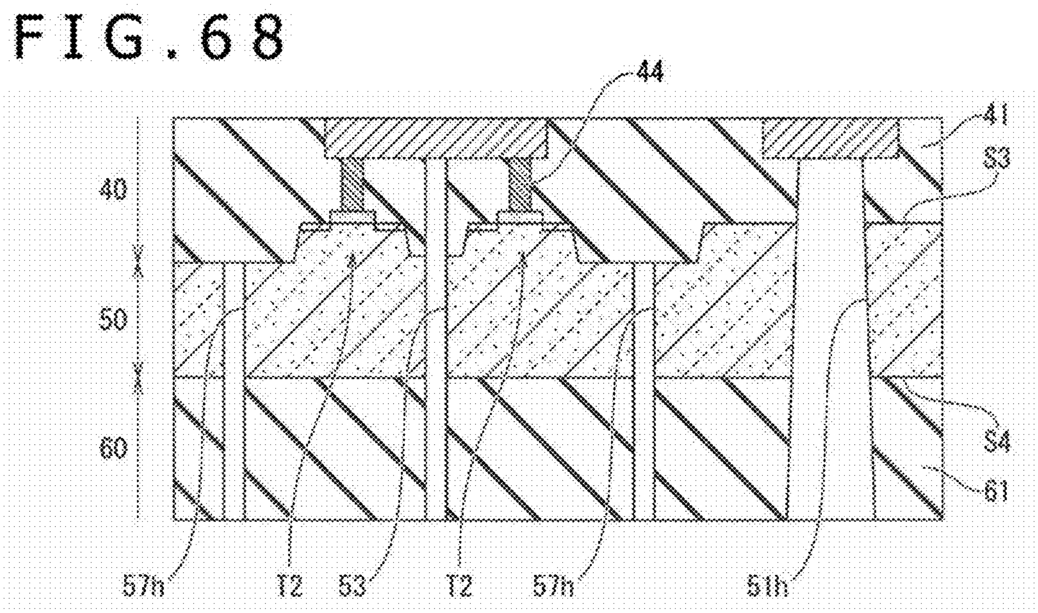

FIG. 68 is a step cross-sectional diagram depicting a manufacturing method of the optical detection device according to modification 4 of the eighth embodiment of the present technology.

Figure 69:
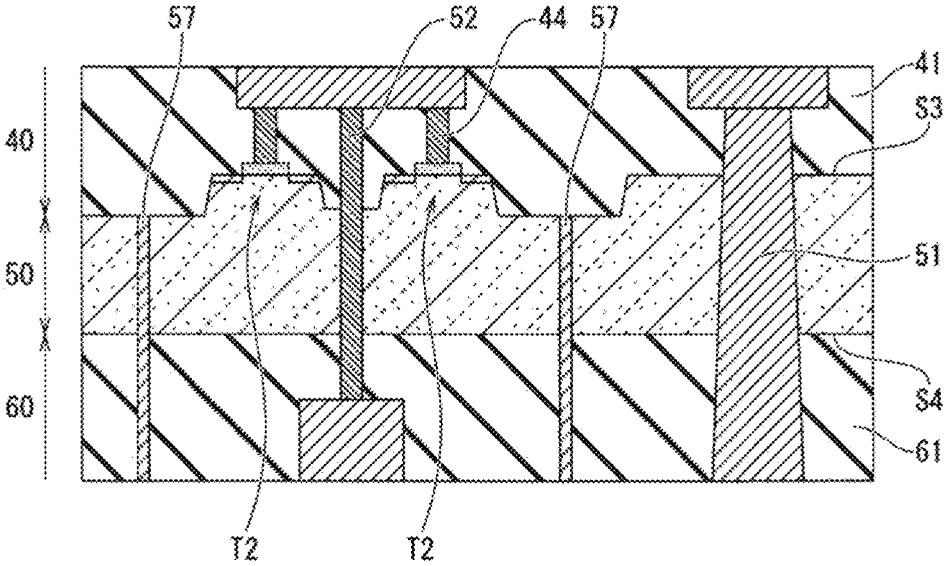

FIG. 69 is a longitudinal cross-sectional diagram depicting a main part of an optical detection device according to modification 5 of the eighth embodiment of the present technology.

Figure 70:
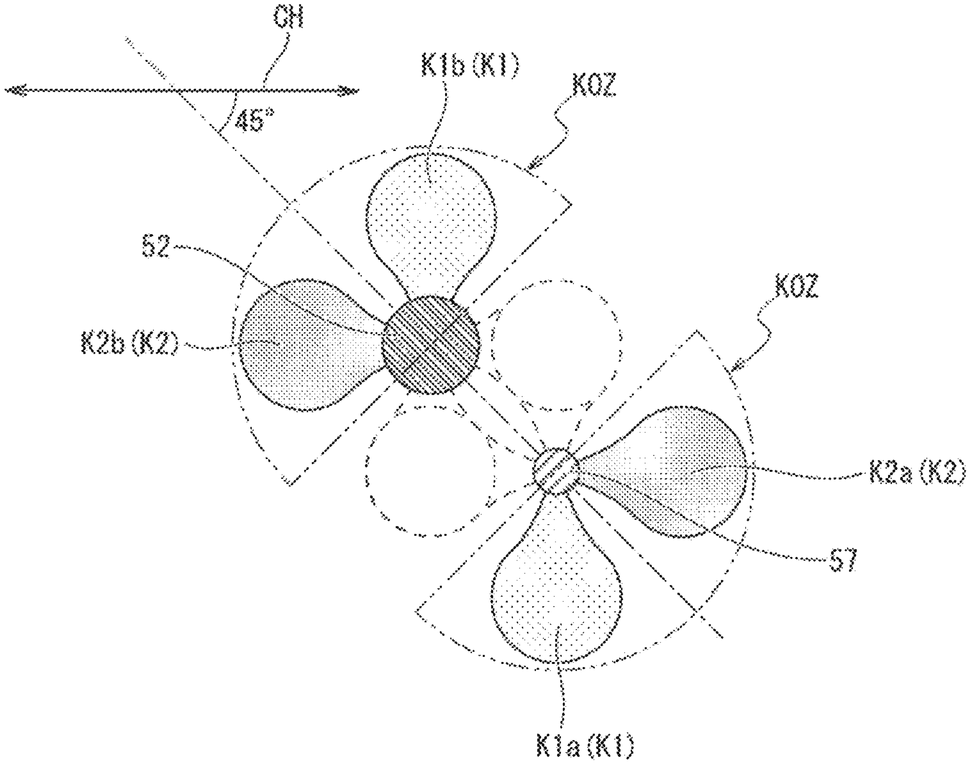

FIG. 70 is a plan diagram depicting an array of one second conductor and third conductors of the optical detection device according to modification 5 of the eighth embodiment of the present technology.

Figure 71A:
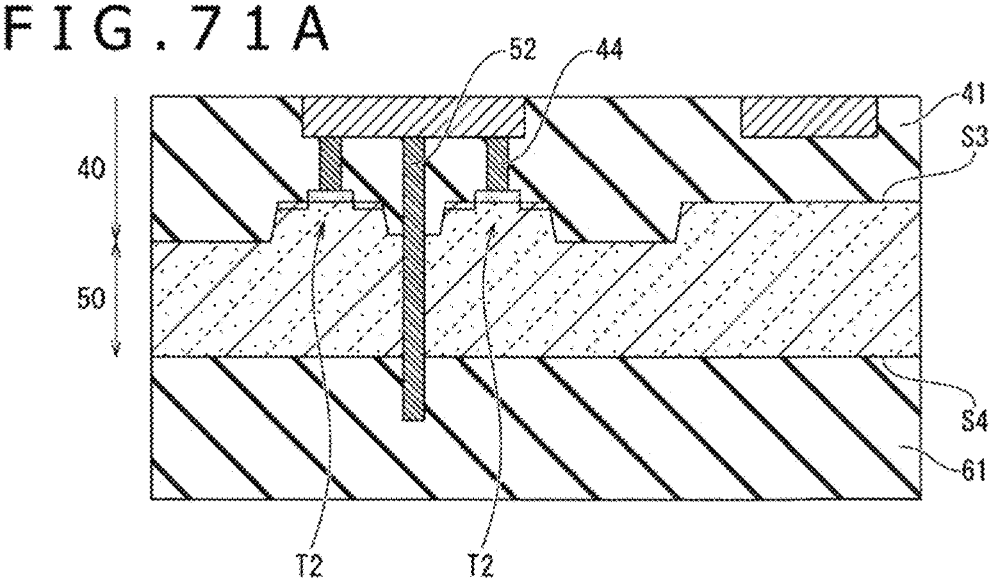

FIG. 71A is a step cross-sectional diagram depicting a manufacturing method of the optical detection device according to modification 5 of the eighth embodiment of the present technology.

Figure 71B:
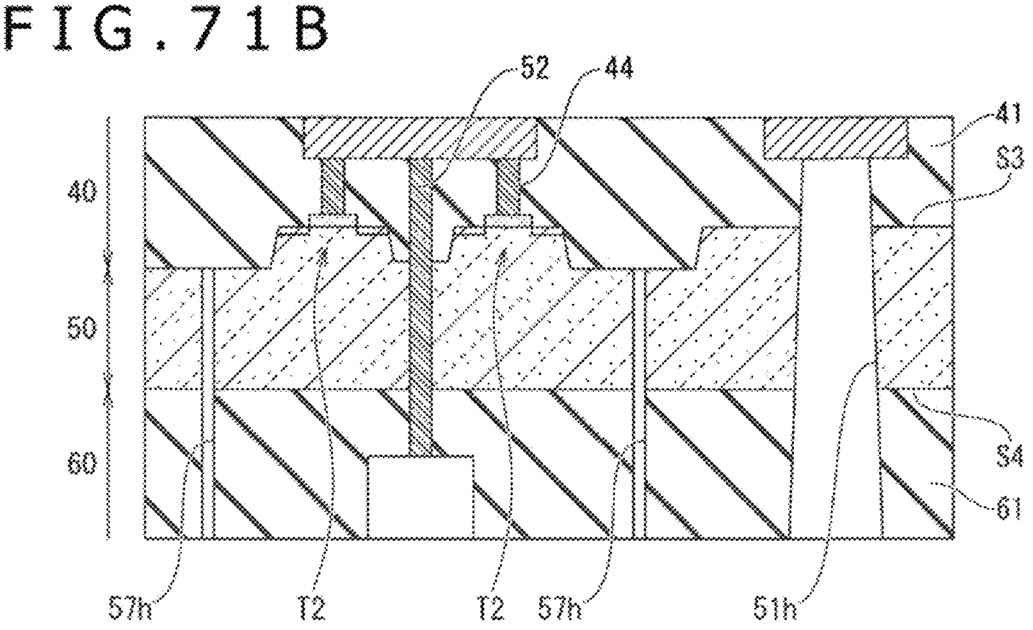

FIG. 71B is a step cross-sectional diagram continuing from FIG. 71A.

Figure 72:
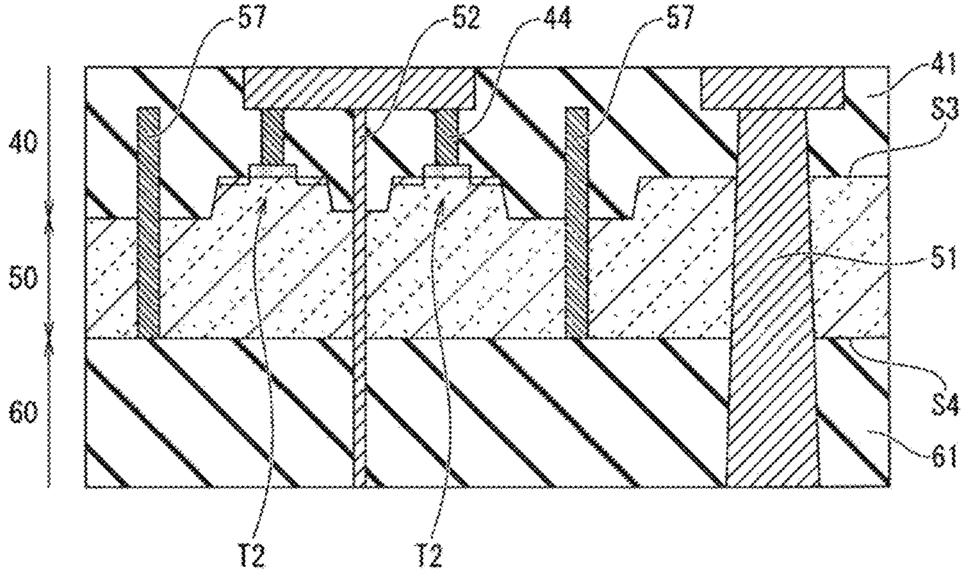

FIG. 72 is a longitudinal cross-sectional diagram depicting a main part of an optical detection device according to modification 6 of the eighth embodiment of the present technology.

Figure 73A:
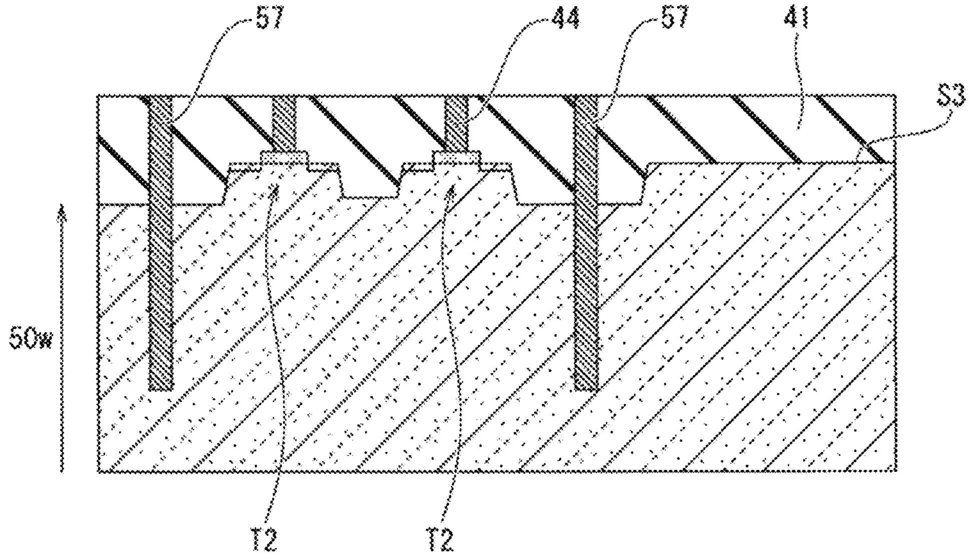

FIG. 73A is a step cross-sectional diagram depicting a manufacturing method of the optical detection device according to modification 6 of the eighth embodiment of the present technology.

Figure 73B:
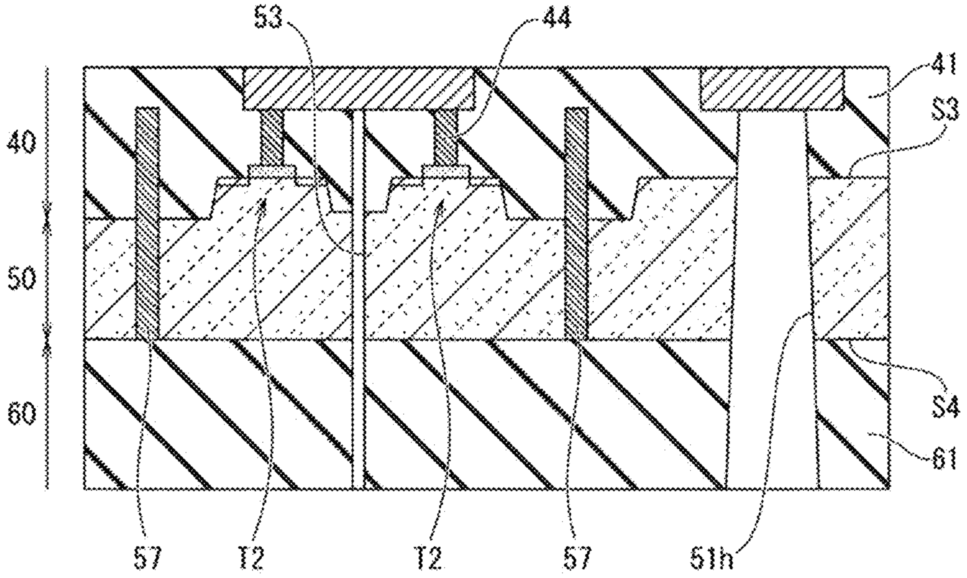

FIG. 73B is a step cross-sectional diagram continuing from FIG. 73A.

Figure 74A:
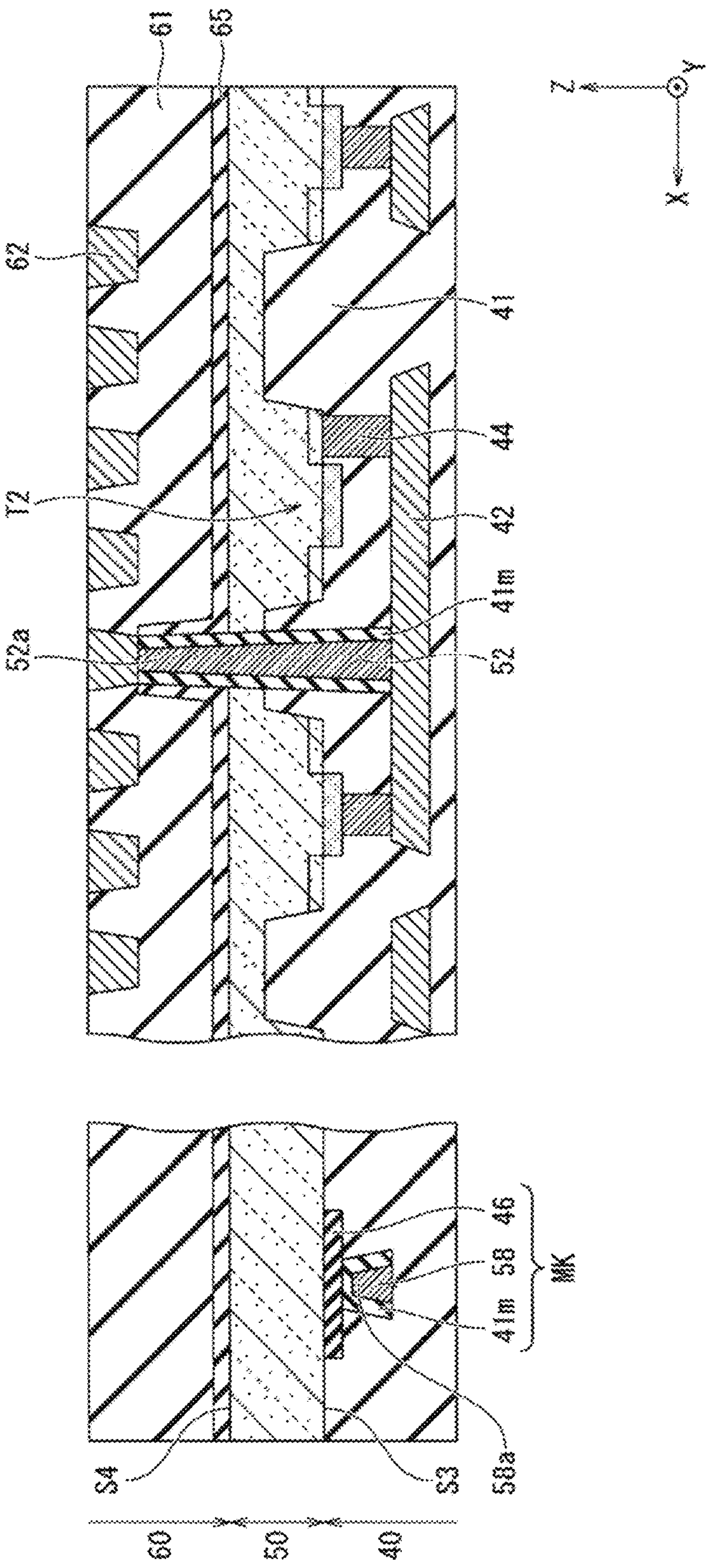

FIG. 74A is a longitudinal cross-sectional diagram depicting a cross-sectional structure of a mark and a second conductor included in an optical detection device according to a ninth embodiment of the present technology.

Figure 74B:
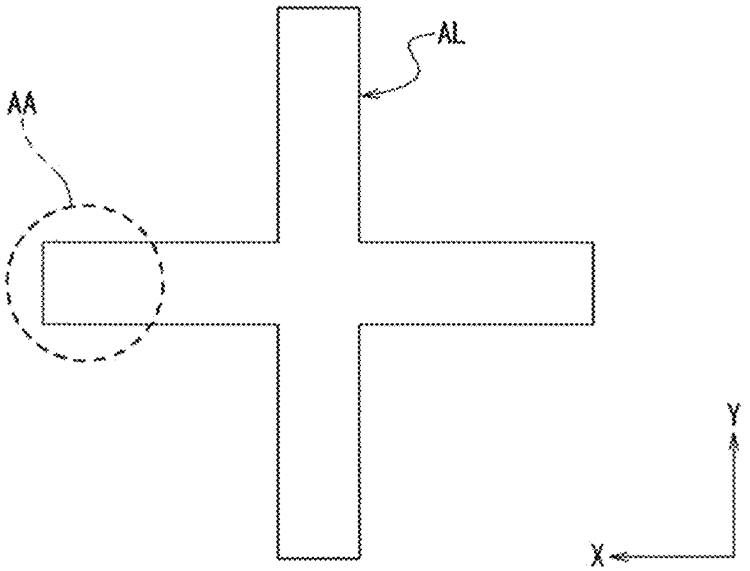

FIG. 74B is a plan diagram of an alignment mark included in the optical detection device in a planar view according to the ninth embodiment of the present technology.

Figure 74C:
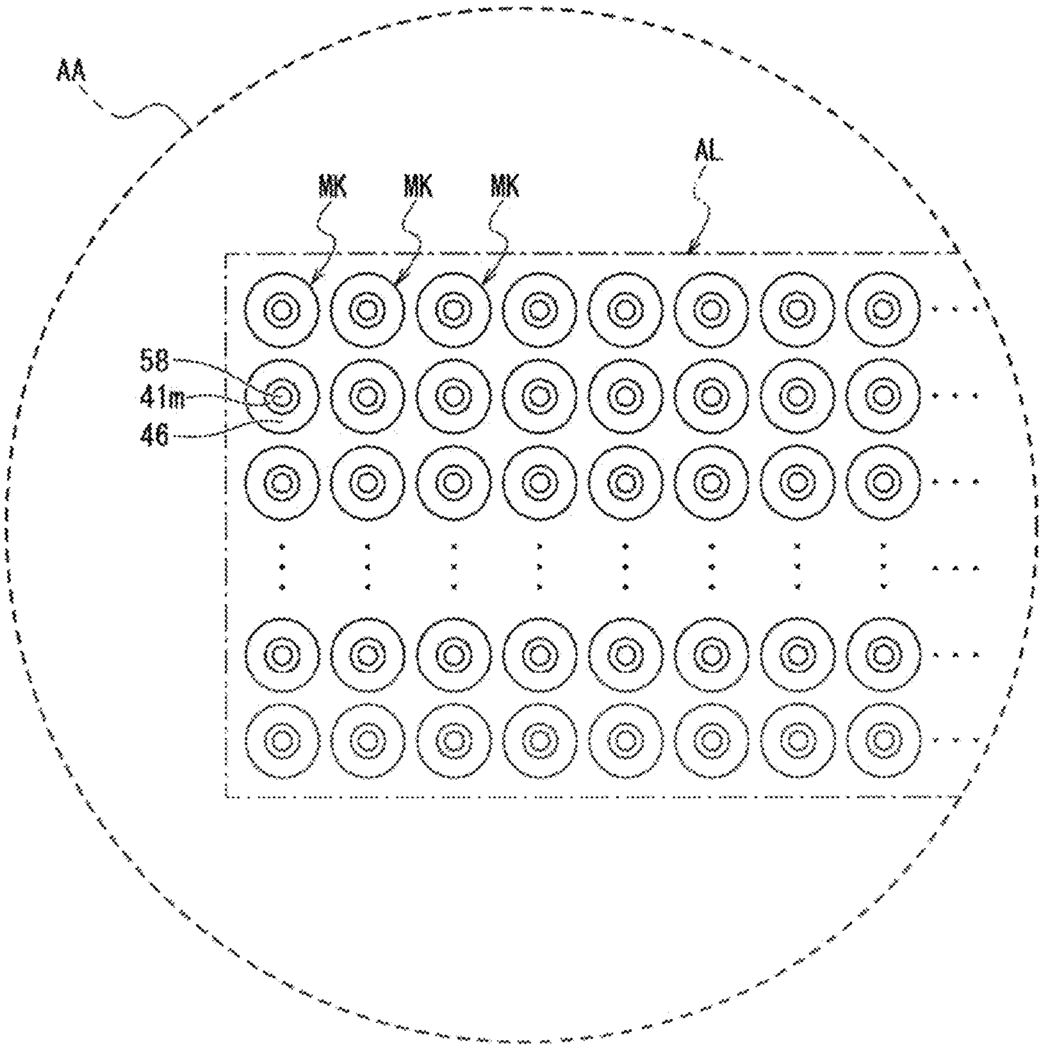

FIG. 74C is a partially enlarged plan diagram depicting an enlarged area AA in FIG. 74B.

Figure 75A:
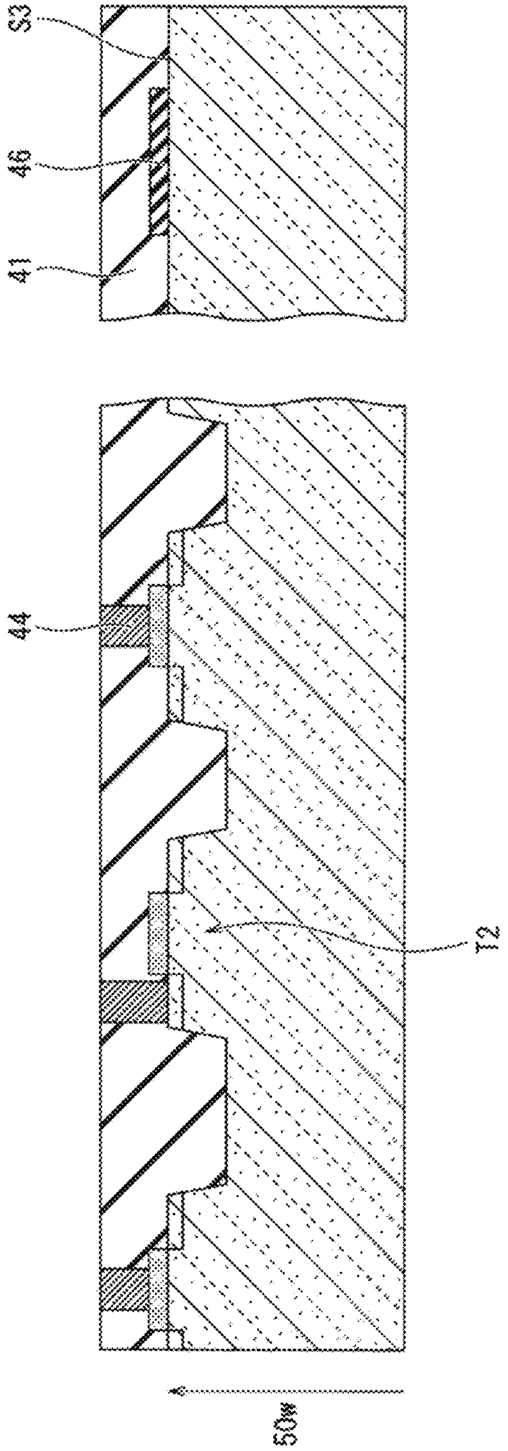

FIG. 75A is a step cross-sectional diagram depicting a manufacturing method of the optical detection device according to the ninth embodiment of the present technology.

Figure 75B:
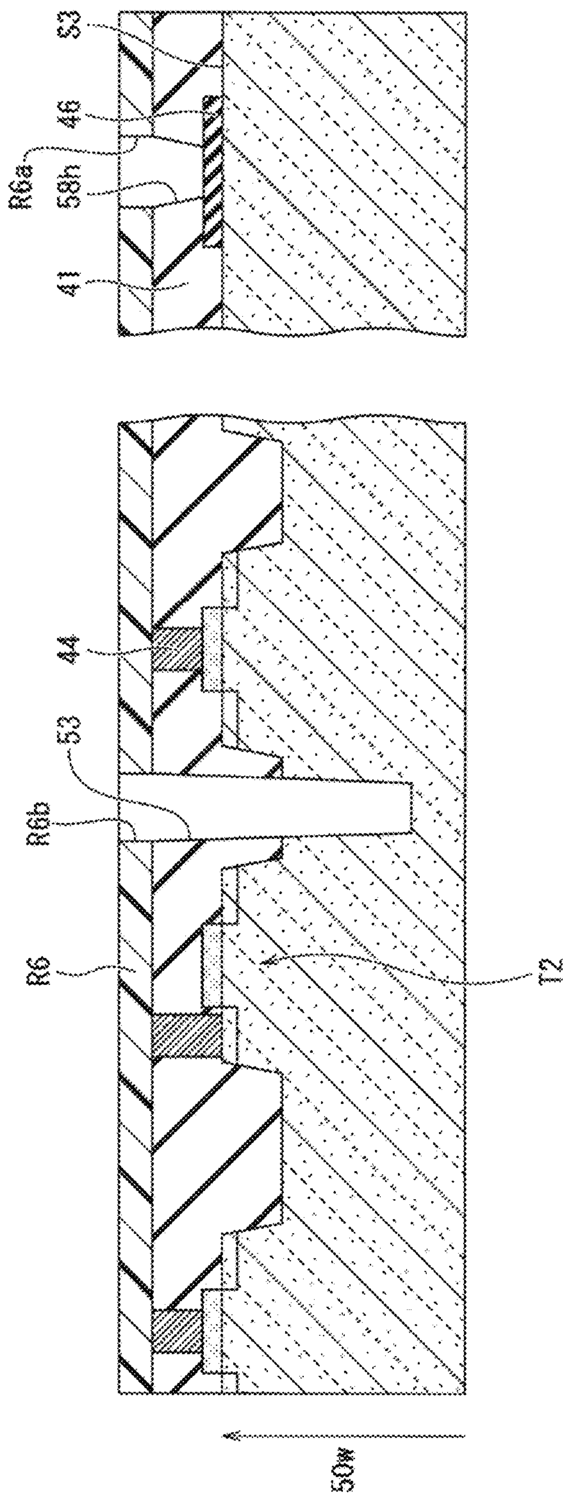

FIG. 75B is a step cross-sectional diagram continuing from FIG. 75A.

Figure 75C:
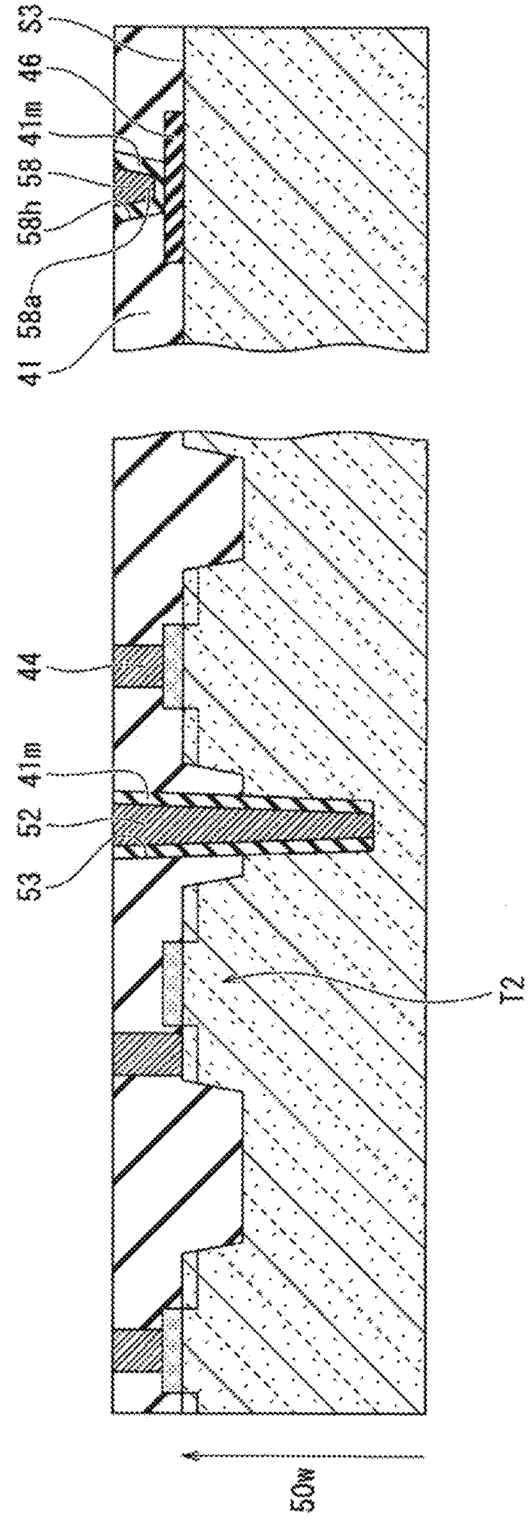

FIG. 75C is a step cross-sectional diagram continuing from FIG. 75B.

Figure 75D:
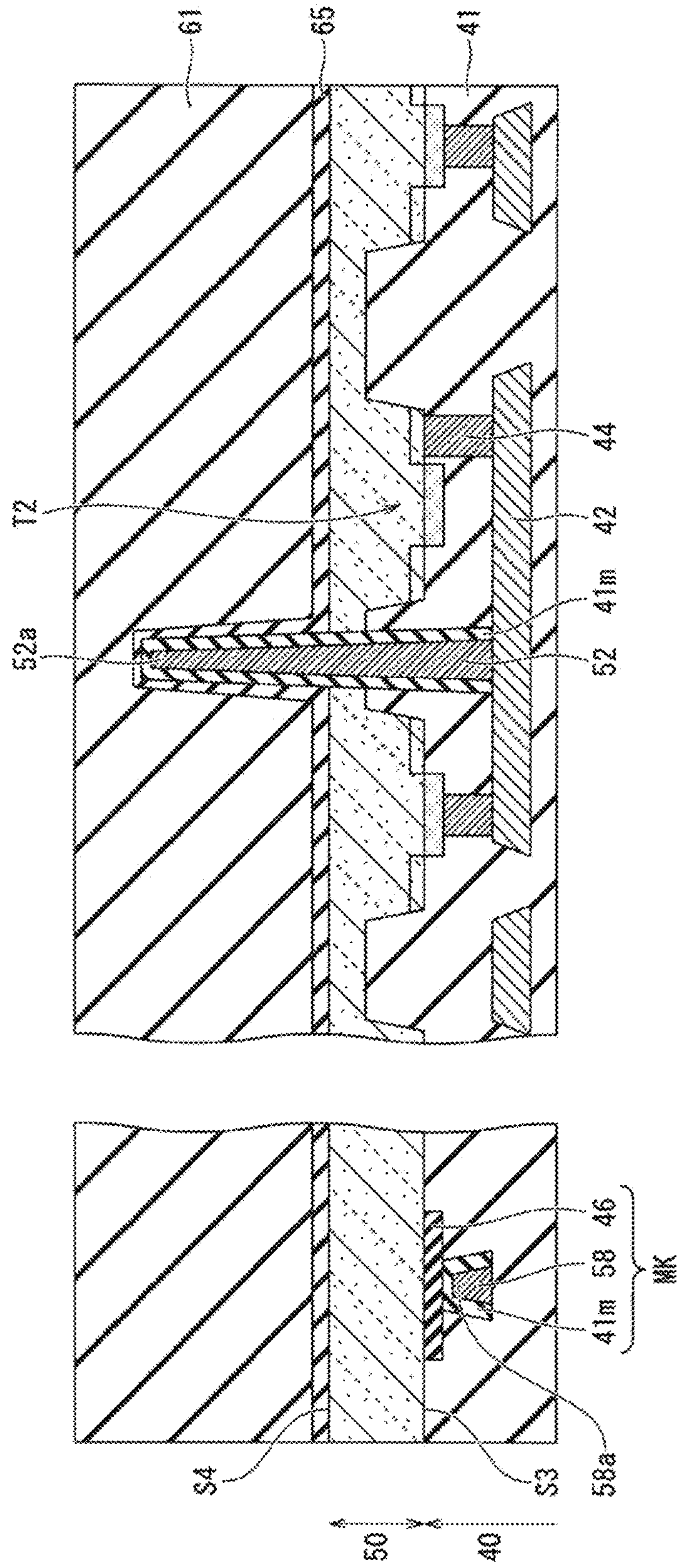

FIG. 75D is a step cross-sectional diagram continuing from FIG. 75C.

Figure 75E:
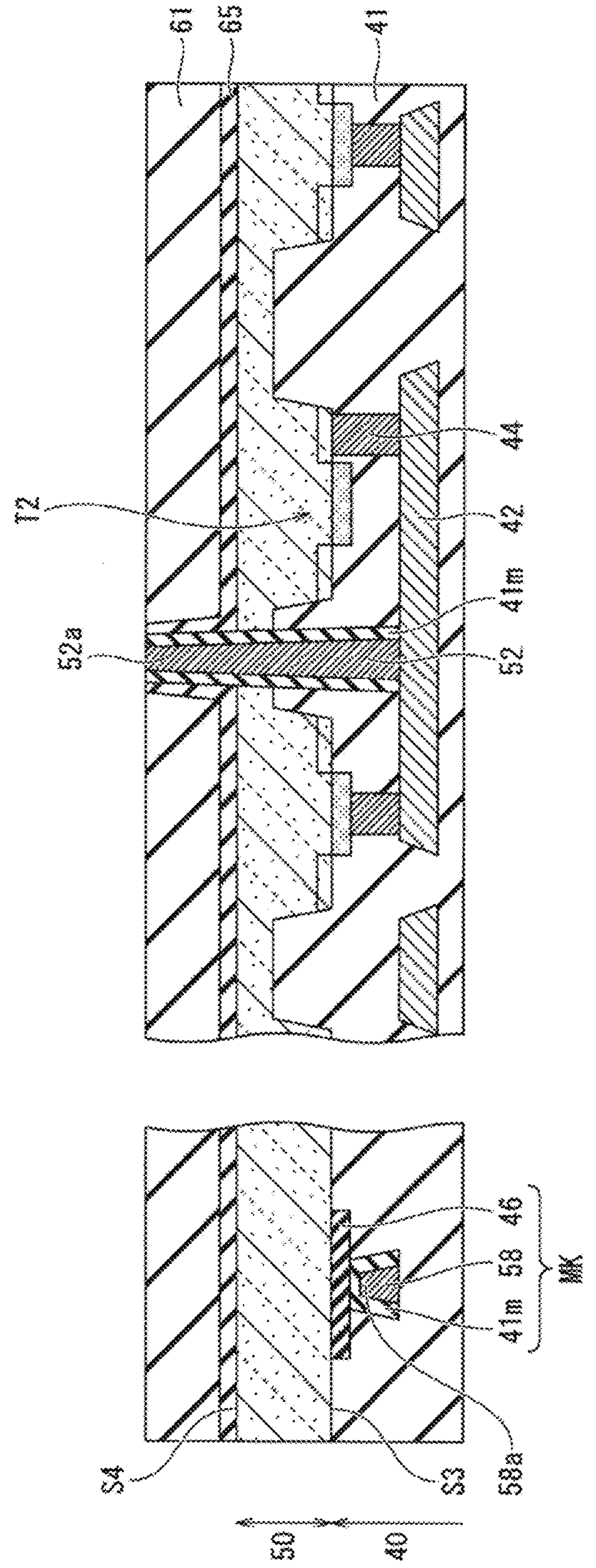

FIG. 75E is a step cross-sectional diagram continuing from FIG. 75D.

Figure 76:
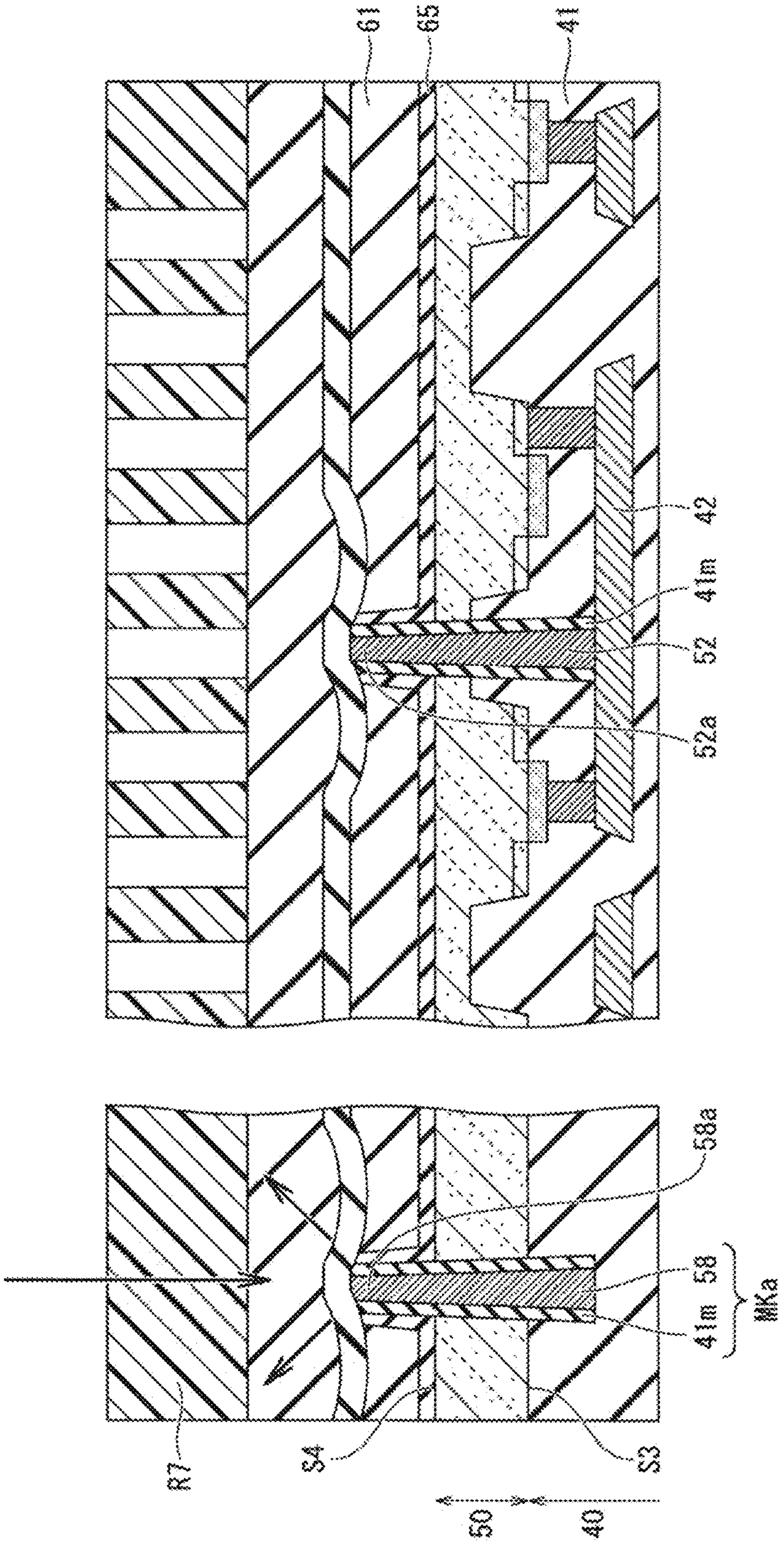

FIG. 76 is a longitudinal cross-sectional diagram depicting a cross-sectional structure depicting a mark and a second conductor included in a conventional optical detection device.

Figure 77:
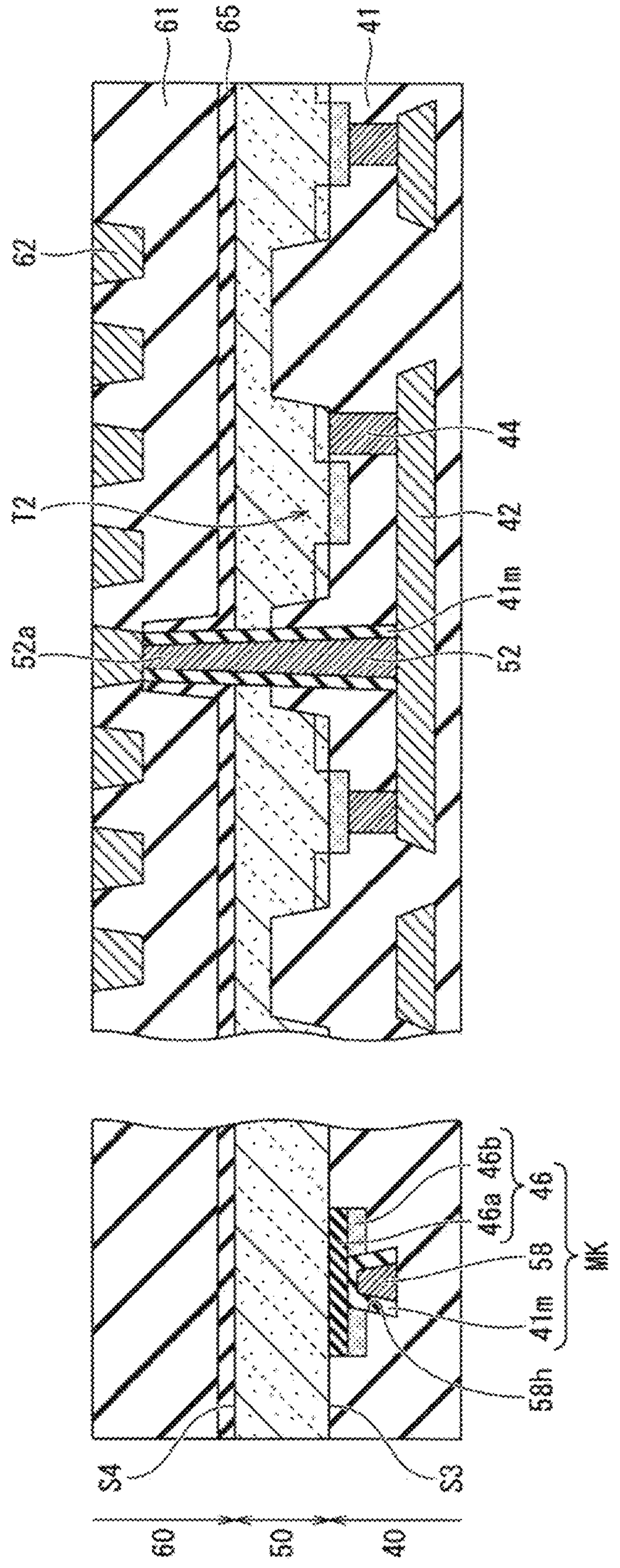

FIG. 77 is a longitudinal cross-sectional diagram depicting a cross-sectional structure of a mark and a second conductor included in an optical detection device according to modification 1 of the ninth embodiment of the present technology.

Figure 78A:
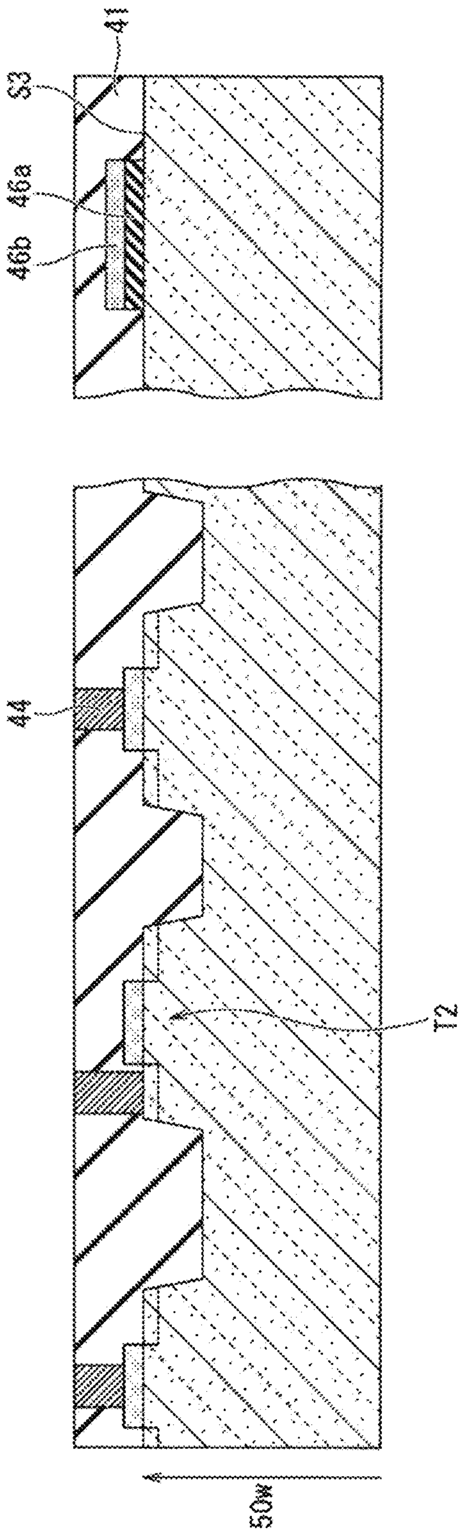

FIG. 78A is a step cross-sectional diagram depicting a manufacturing method of the optical detection device according to modification 1 of the ninth embodiment of the present technology.

Figure 78B:
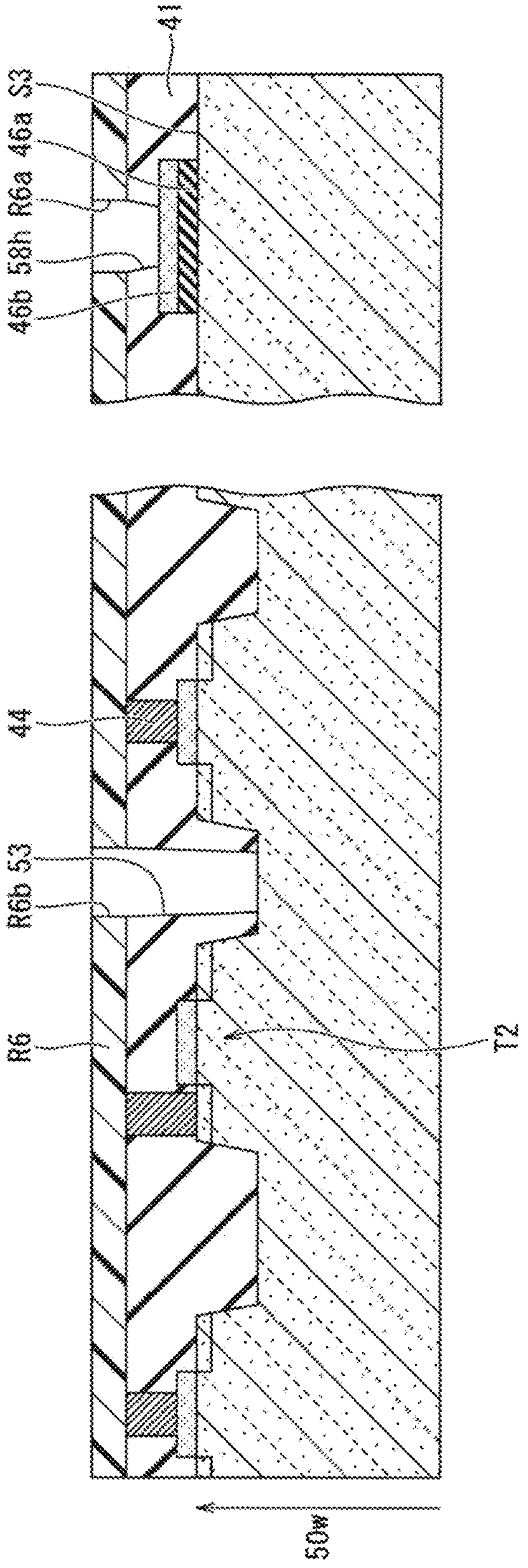

FIG. 78B is a step cross-sectional diagram continuing from FIG. 78A.

Figure 78C:
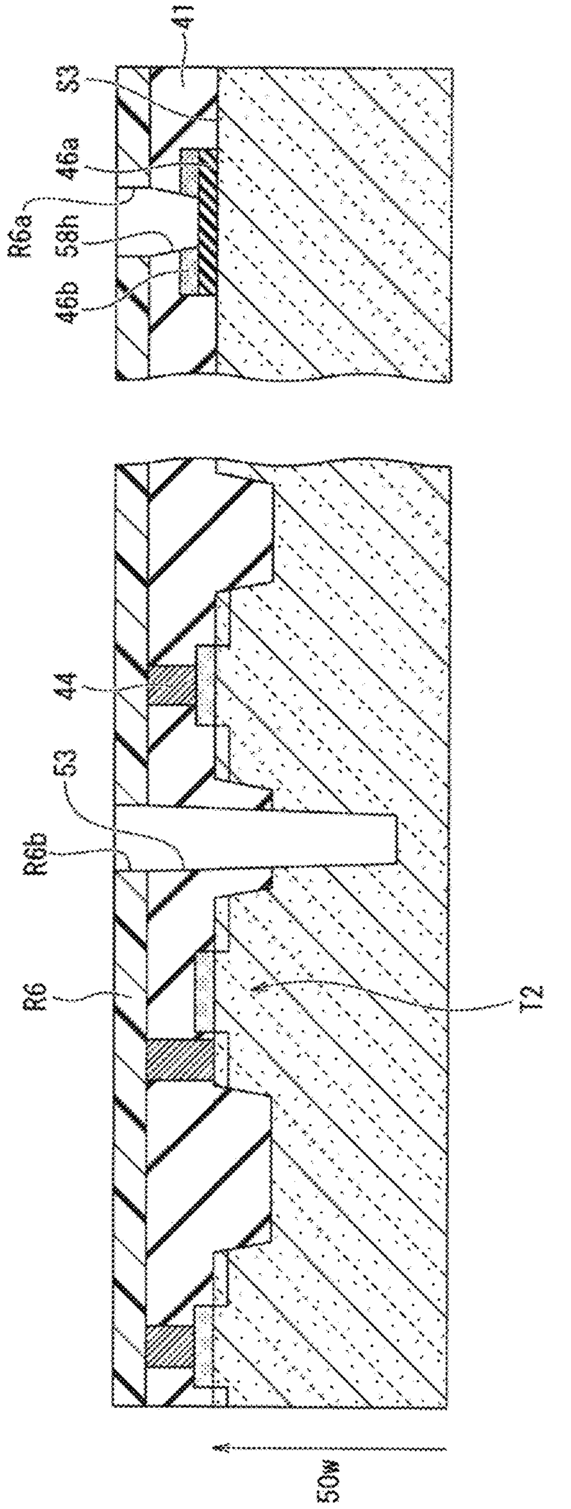

FIG. 78C is a step cross-sectional diagram continuing from FIG. 78B.

Figure 79:
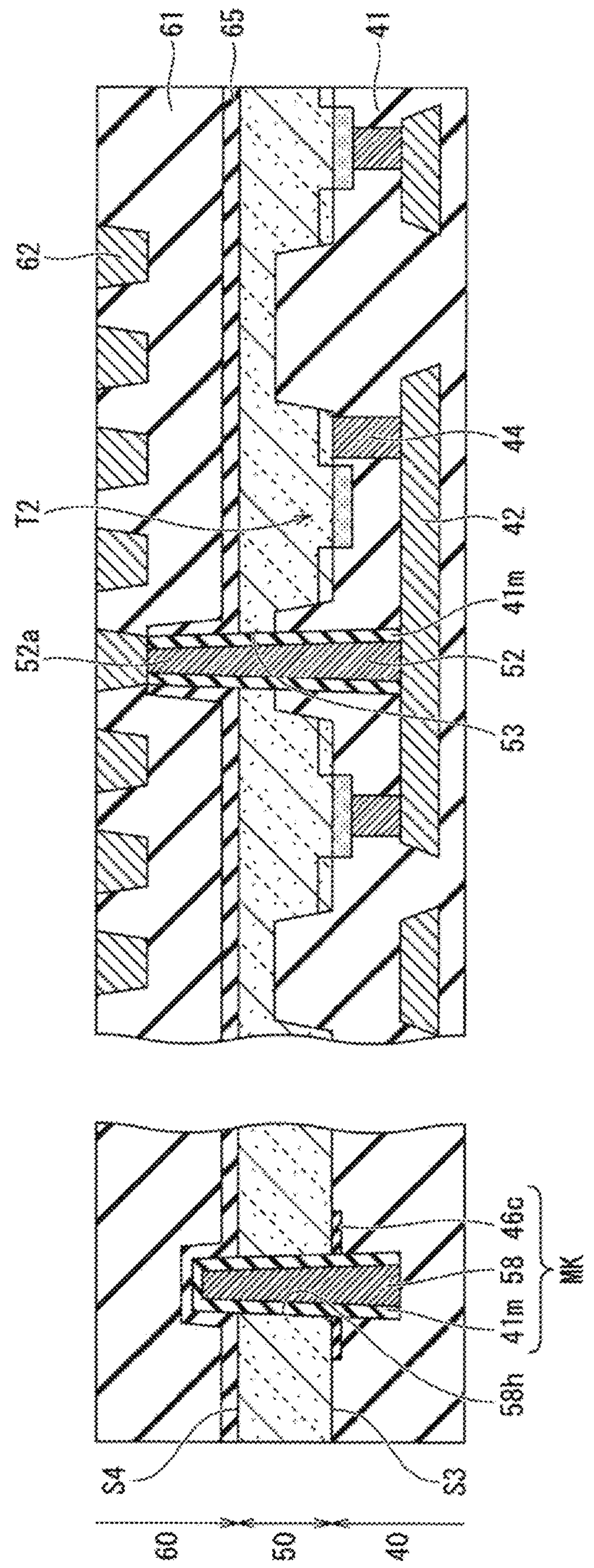

FIG. 79 is a longitudinal cross-sectional diagram depicting a cross-sectional structure of a mark and a second conductor included in an optical detection device according to modification 2 of the ninth embodiment of the present technology.

Figure 80A:
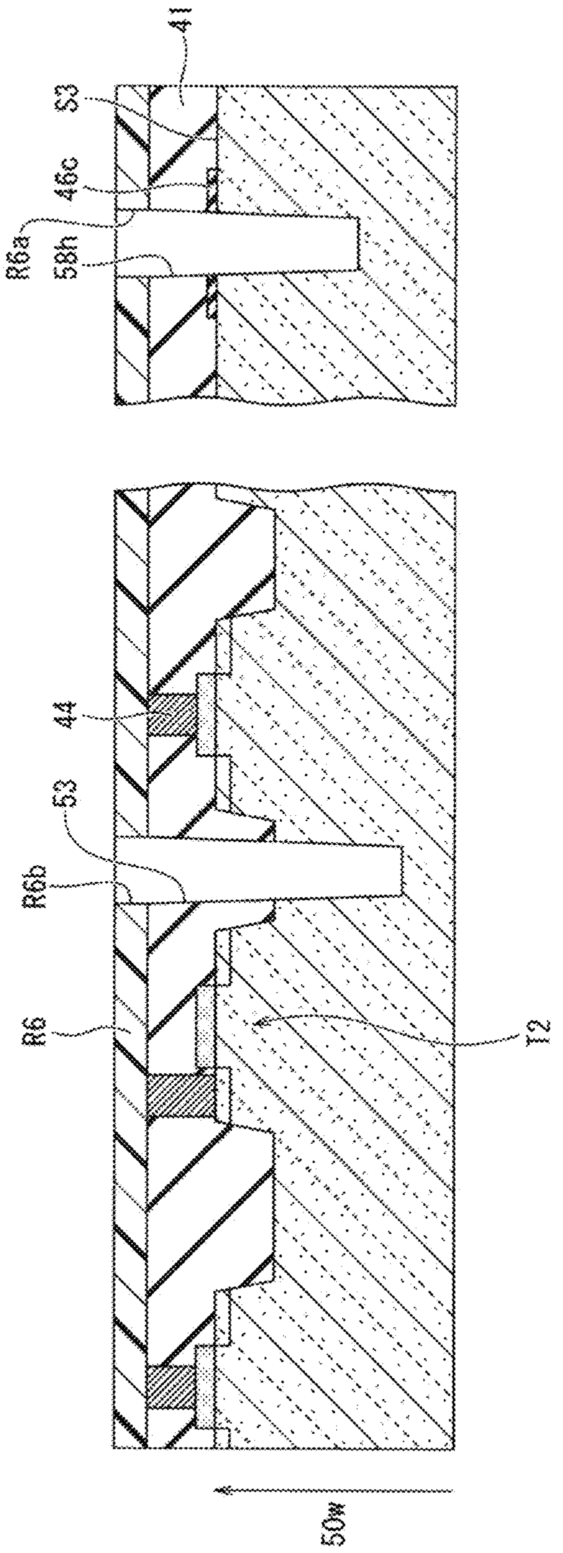

FIG. 80A is a step cross-sectional diagram depicting a manufacturing method of the optical detection device according to modification 2 of the ninth embodiment of the present technology.

Figure 80B:
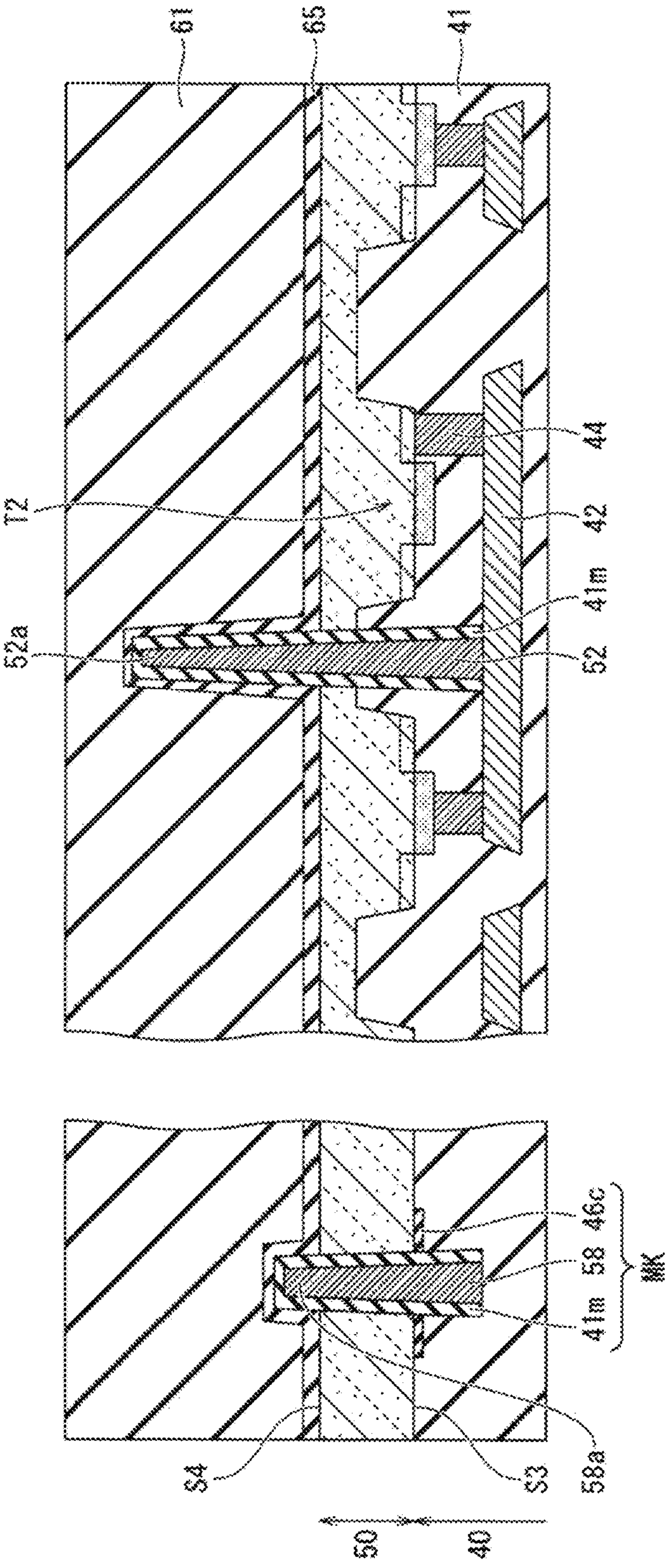

FIG. 80B is a step cross-sectional diagram continuing from FIG. 80A.

Figure 80C:
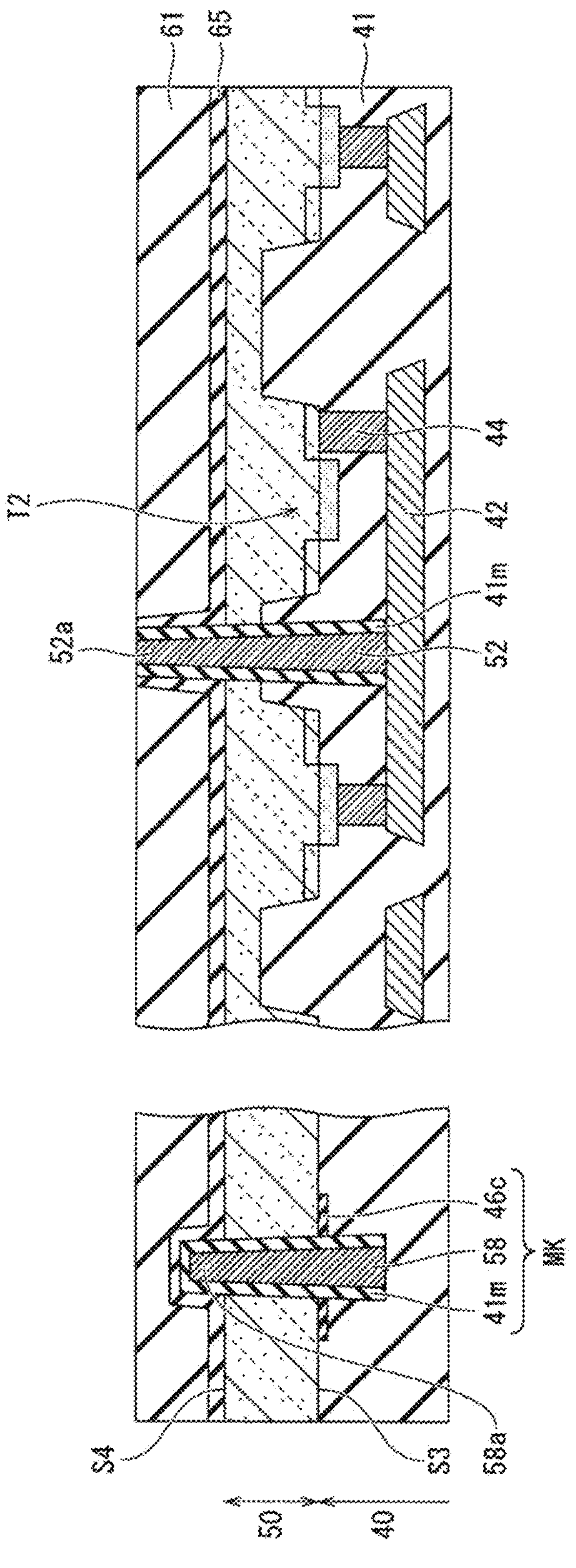

FIG. 80C is a step cross-sectional diagram continuing from FIG. 80B.

Figure 81:
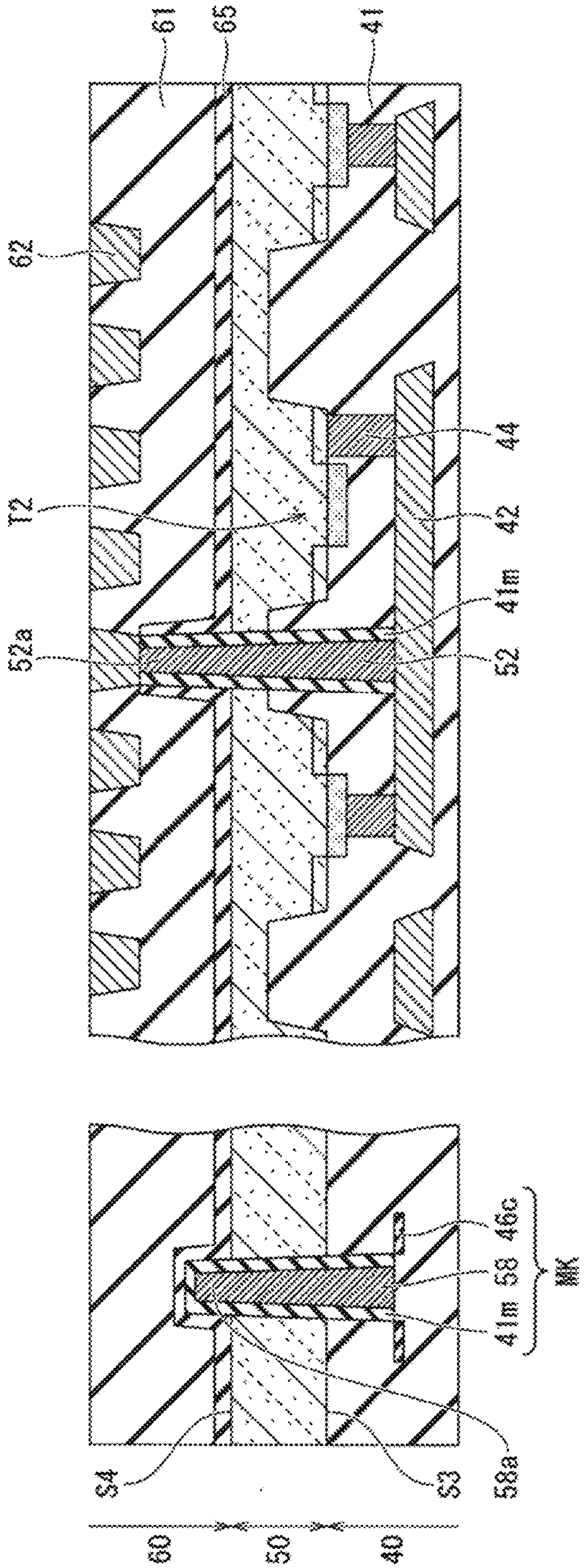

FIG. 81 is a longitudinal cross-sectional diagram depicting a cross-sectional structure of a mark and a second conductor included in an optical detection device according to modification 3 of the ninth embodiment of the present technology.

Figure 82:
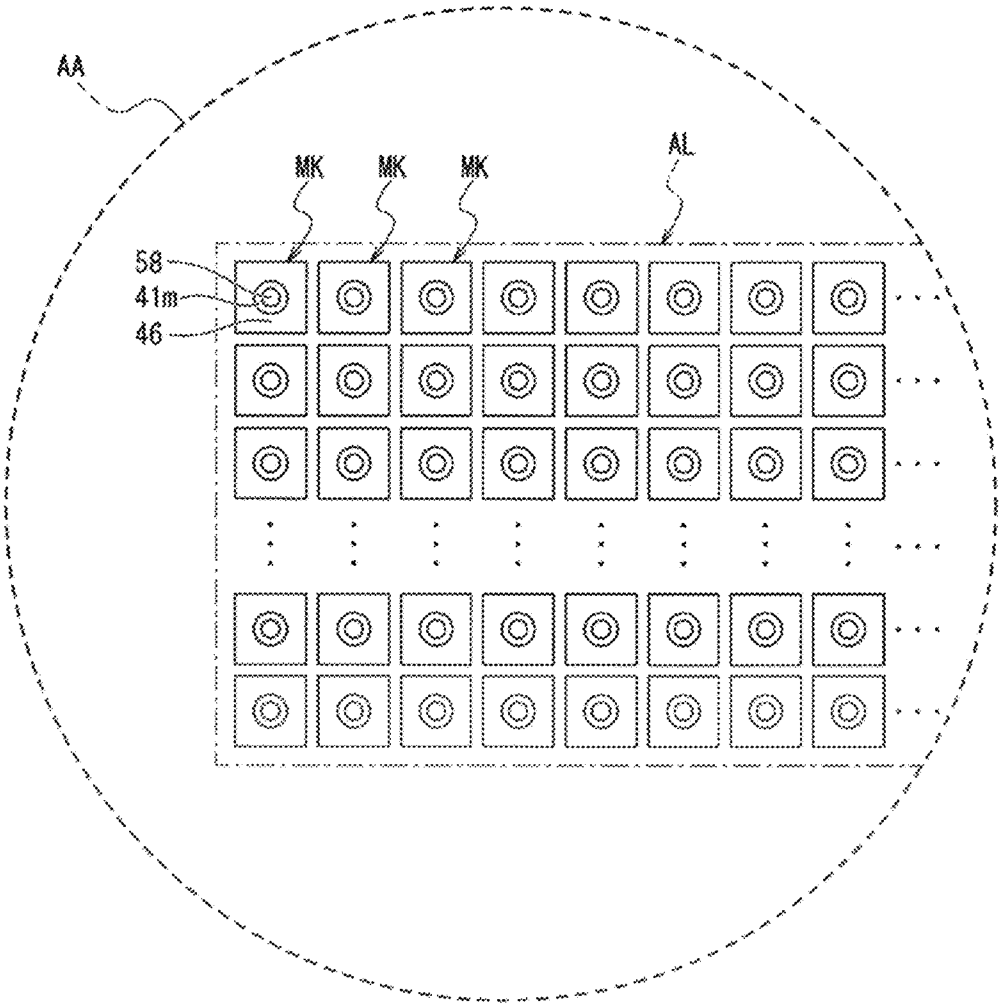

FIG. 82 is a partially enlarged plan diagram depicting an enlarged area AA of an alignment mark included in an optical detection device according to modification 4 of the ninth embodiment of the present technology.

Figure 83:
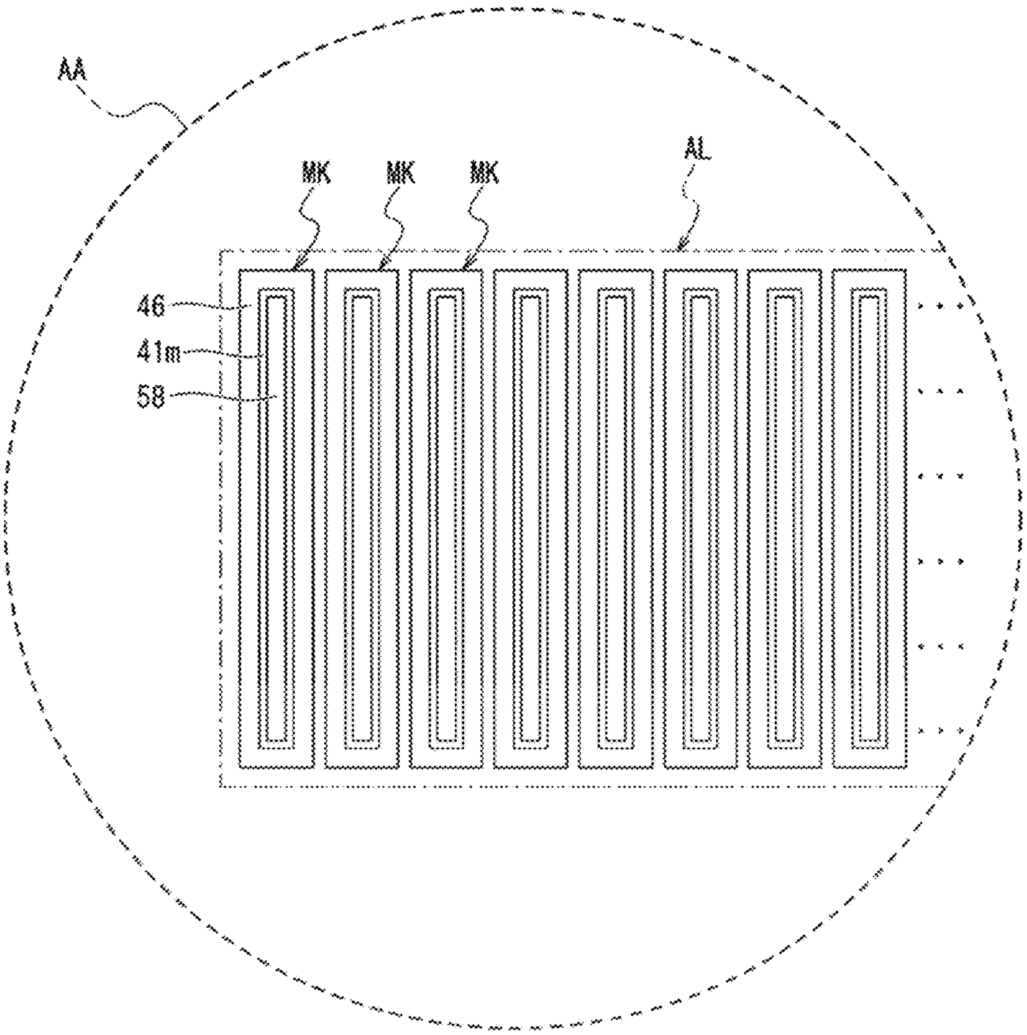

FIG. 83 is a partially enlarged plan diagram depicting an enlarged area AA of an alignment mark included in an optical detection device according to modification 5 of the ninth embodiment of the present technology.

Figure 84:
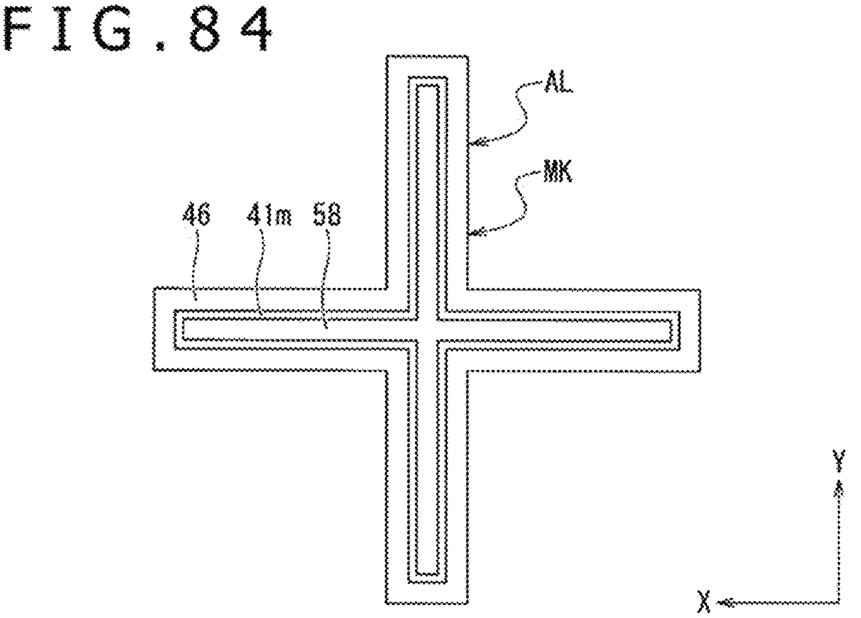

FIG. 84 is a plan diagram of an alignment mark included in an optical detection device in a planar view according to modification 6 of the ninth embodiment of the present technology.

Figure 85:
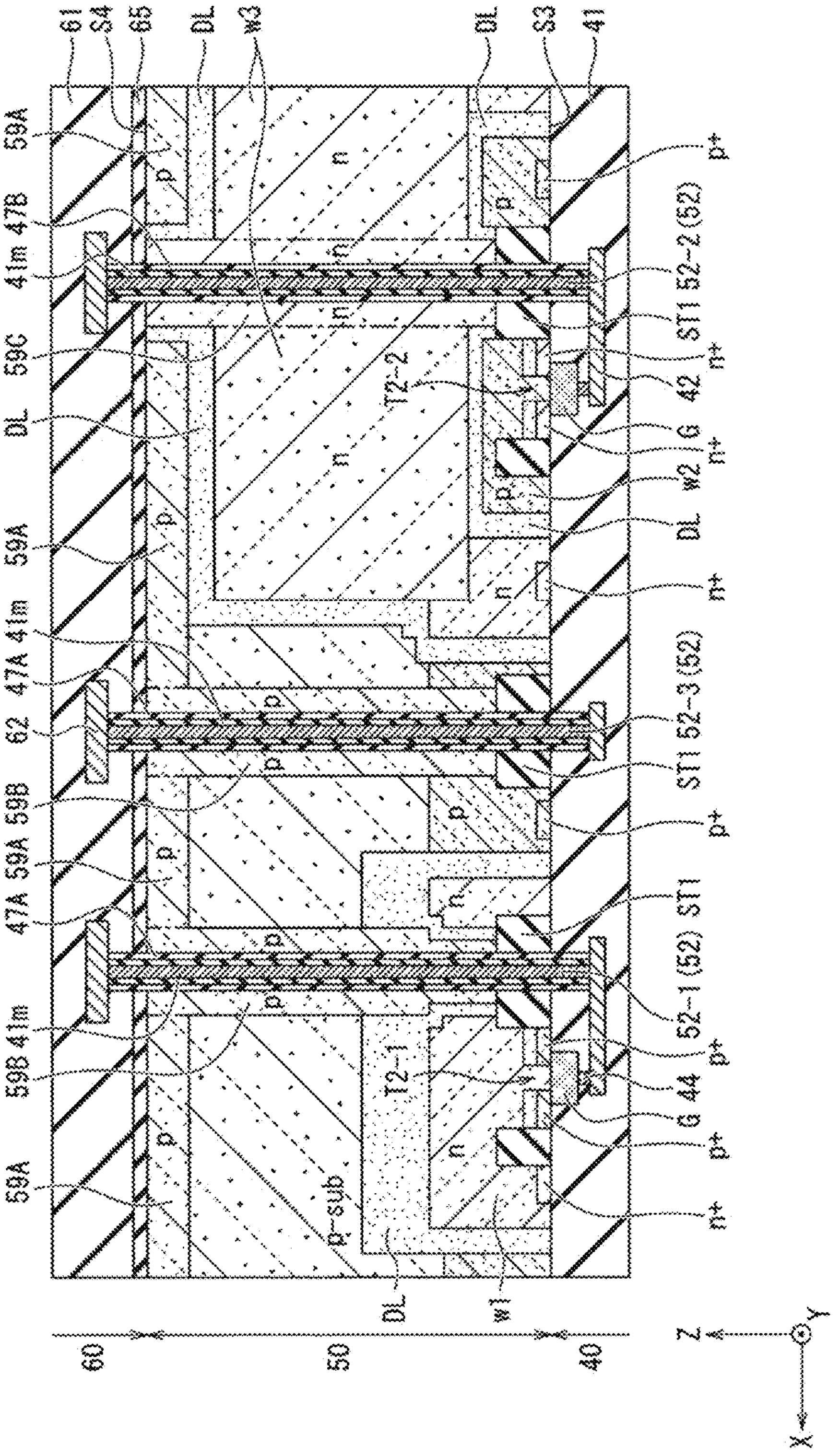

FIG. 85 is a longitudinal cross-sectional diagram depicting a main part of an optical detection device according to a tenth embodiment of the present technology.

Figure 86A:
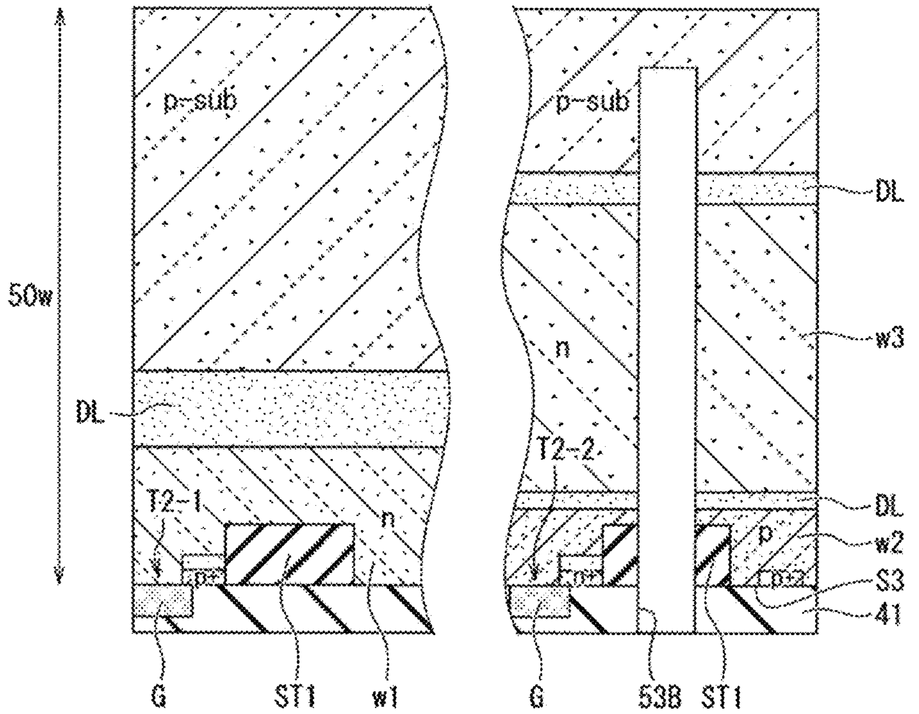

FIG. 86A is a step cross-sectional diagram depicting a manufacturing method of the optical detection device according to the tenth embodiment of the present technology.

Figure 86B:
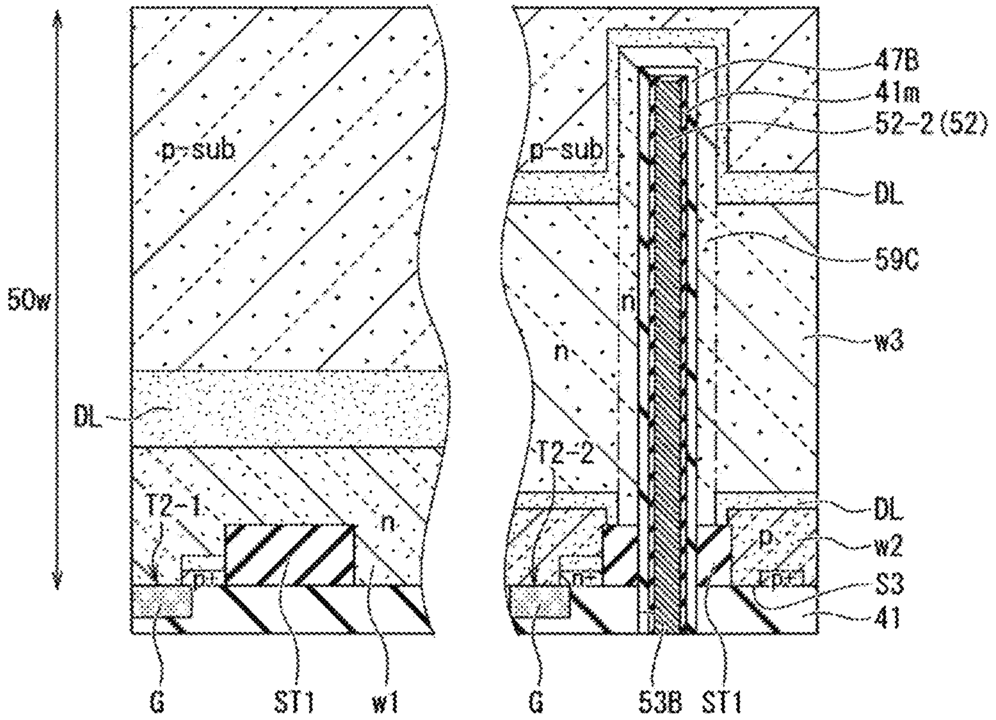

FIG. 86B is a step cross-sectional diagram continuing from FIG. 86A.

Figure 86C:
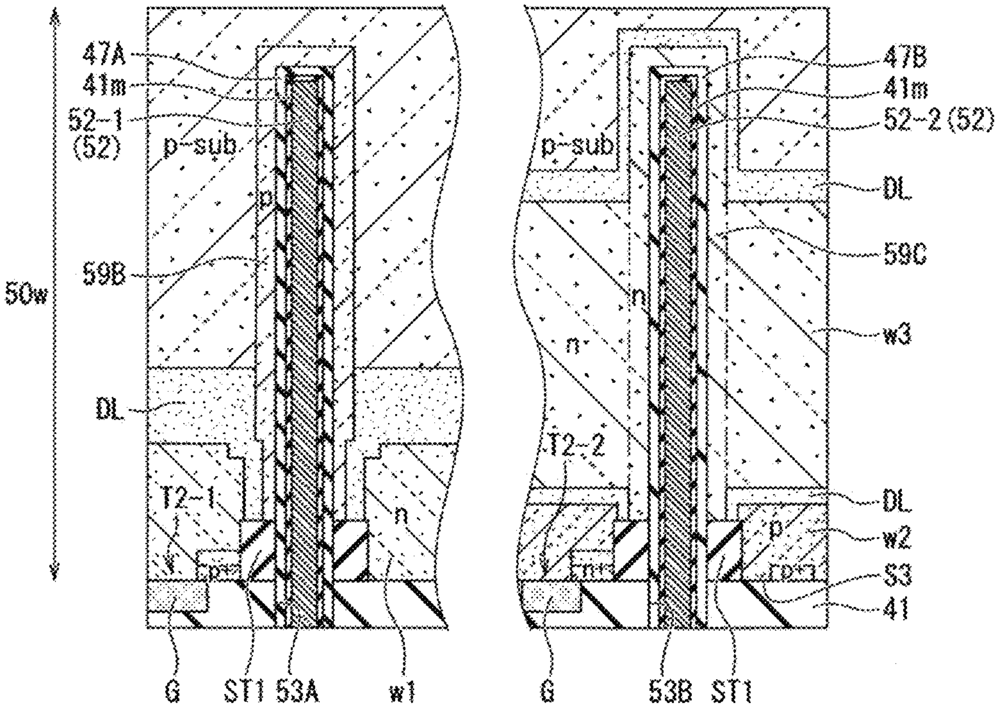

FIG. 86C is a step cross-sectional diagram continuing from FIG. 86B.

Figure 86D:
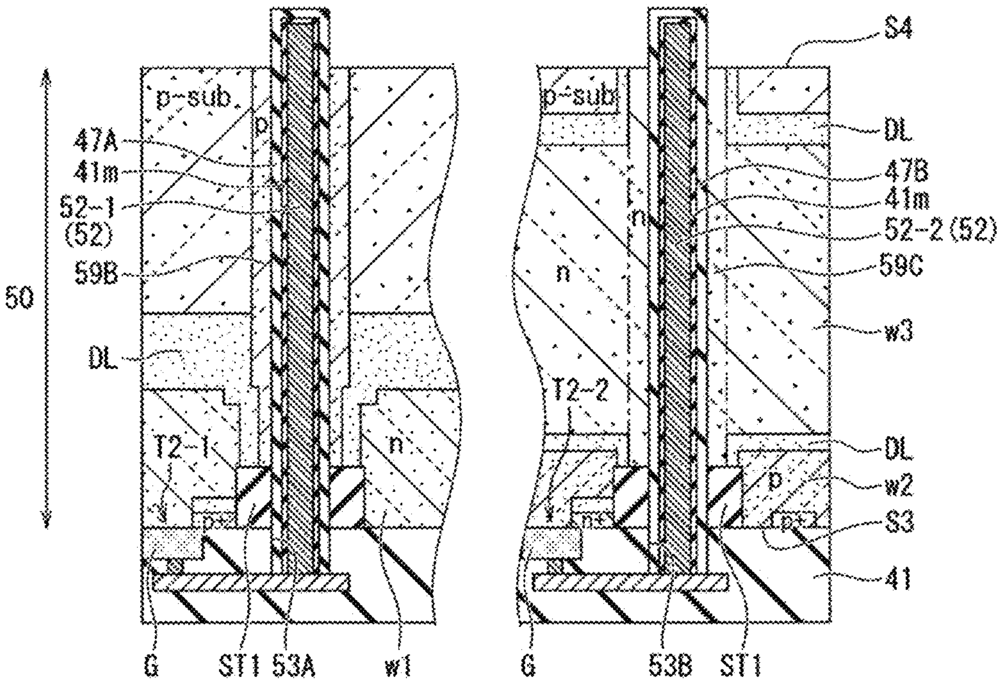

FIG. 86D is a step cross-sectional diagram continuing from FIG. 86C.

Figure 86E:
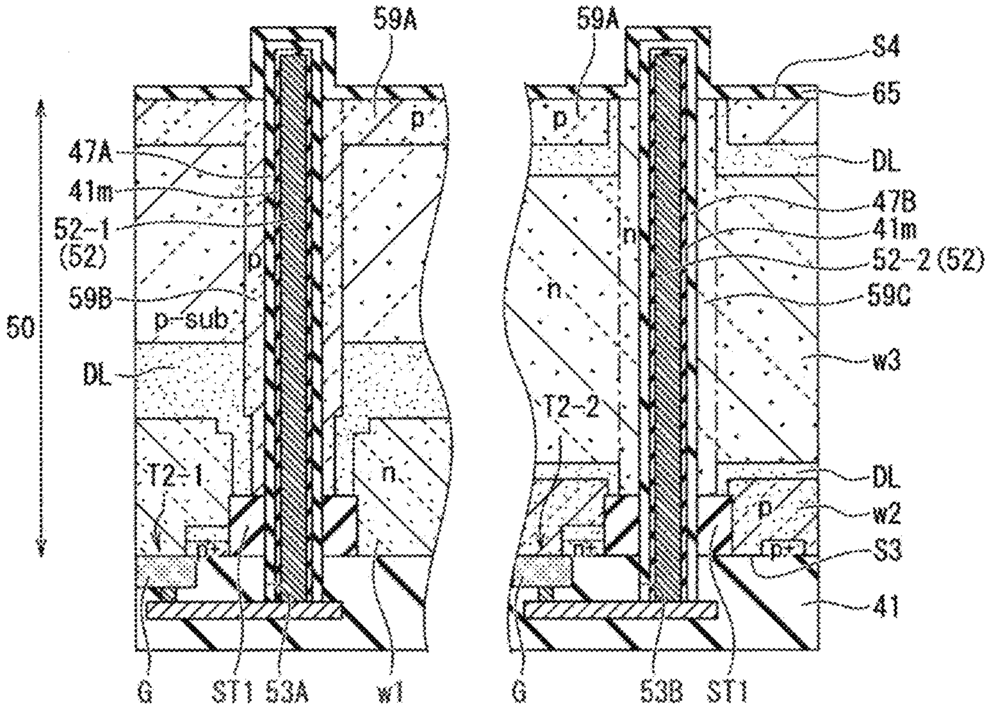

FIG. 86E is a step cross-sectional diagram continuing from FIG. 86D.

Figure 87:
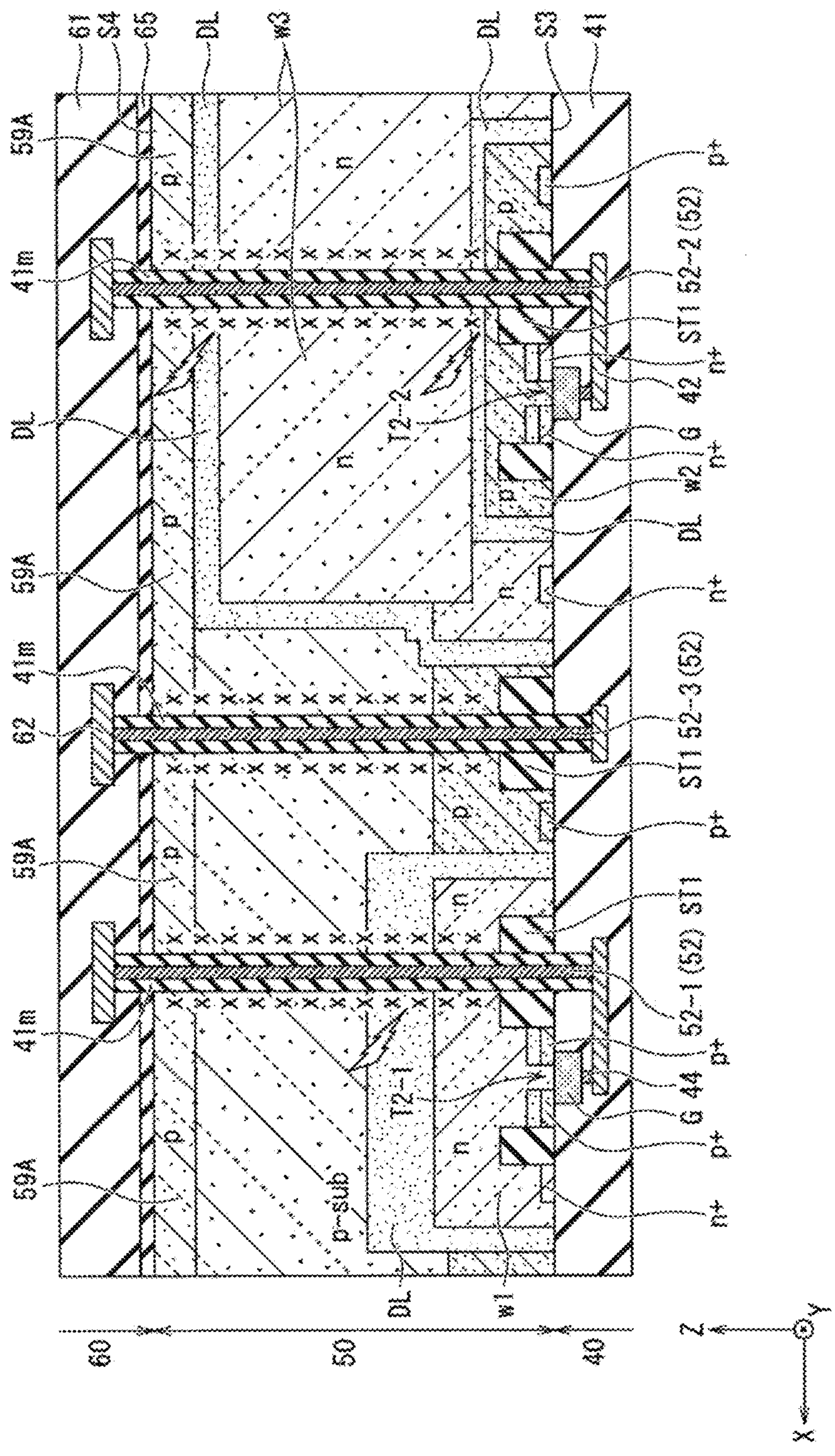

FIG. 87 is a longitudinal cross-sectional diagram depicting a main part of a conventional optical detection device.

Figure 88:
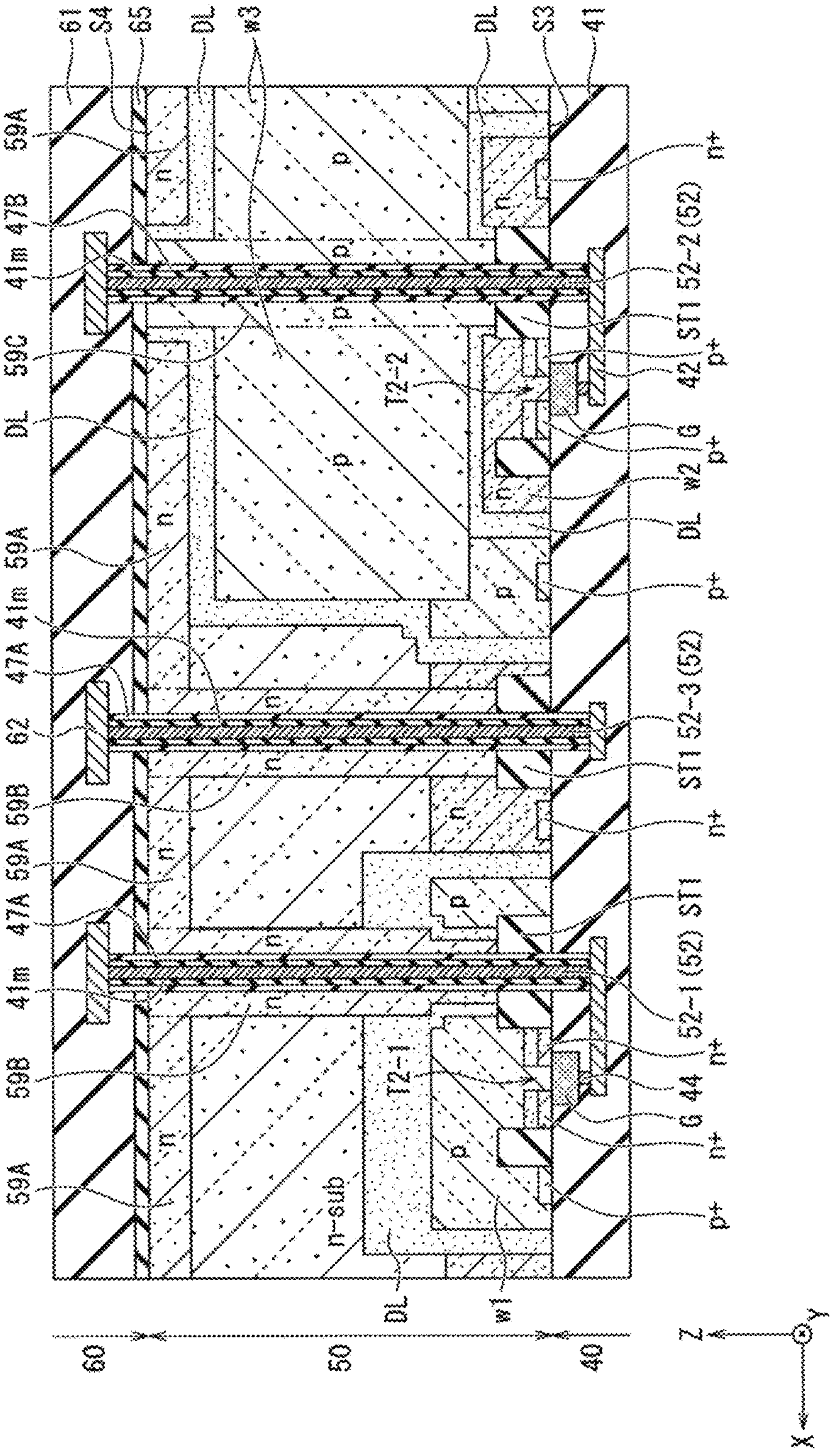

FIG. 88 is a longitudinal cross-sectional diagram depicting a main part of an optical detection device according to modification 1 of the tenth embodiment of the present technology.

Figure 89:
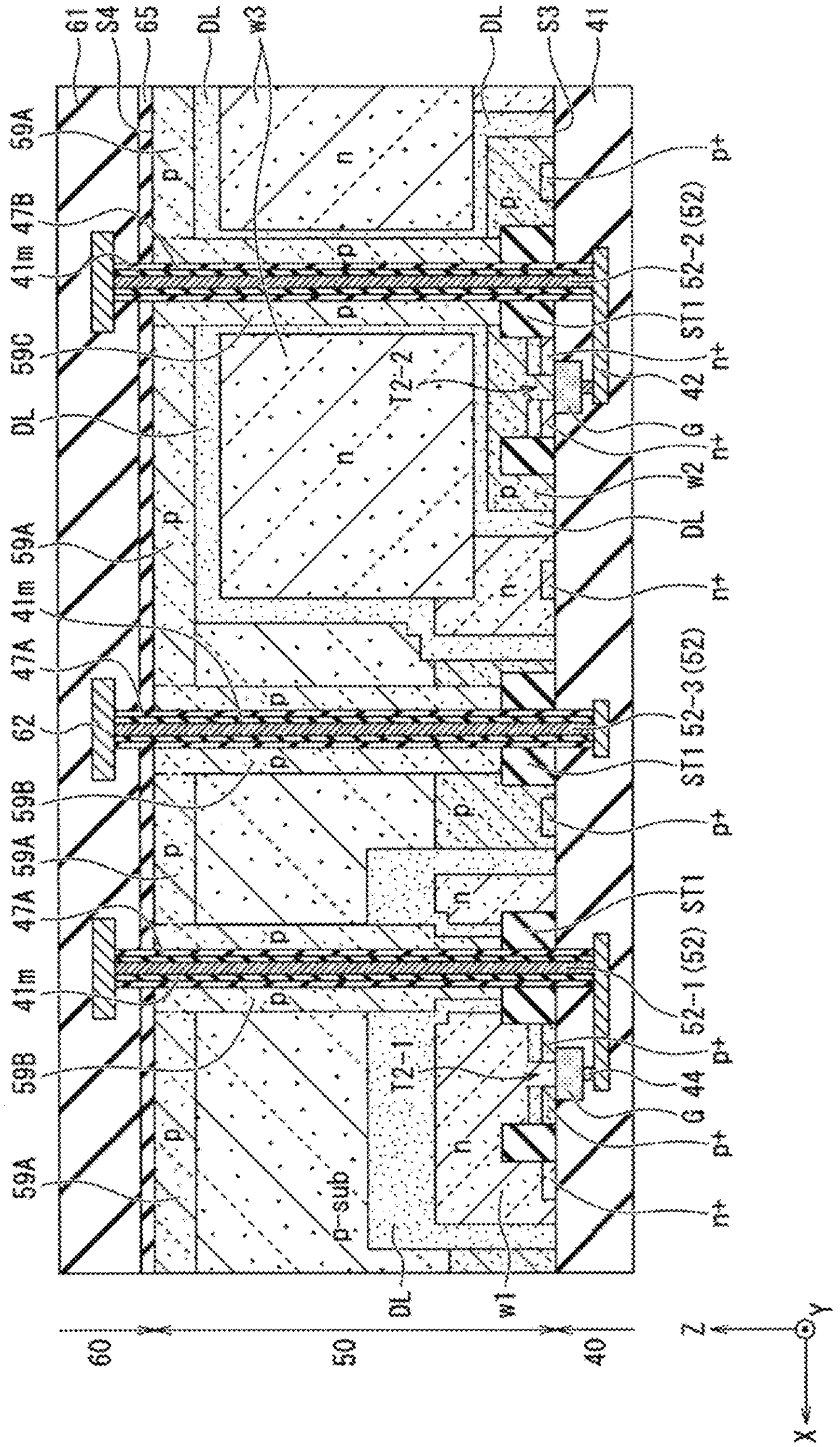

FIG. 89 is a longitudinal cross-sectional diagram depicting a main part of an optical detection device according to modification 2 of the tenth embodiment of the present technology.

Figure 90A:
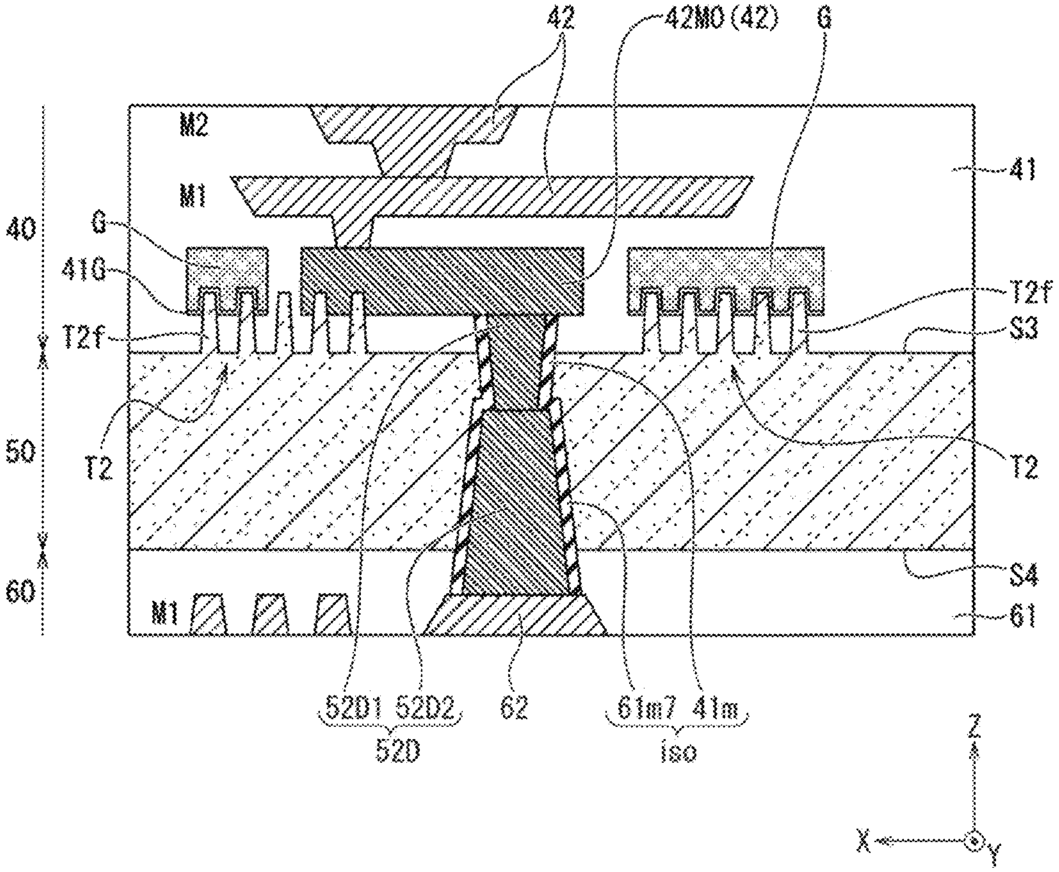

FIG. 90A is a longitudinal cross-sectional diagram depicting a main part of an optical detection device according to an eleventh embodiment of the present technology.

Figure 90B:
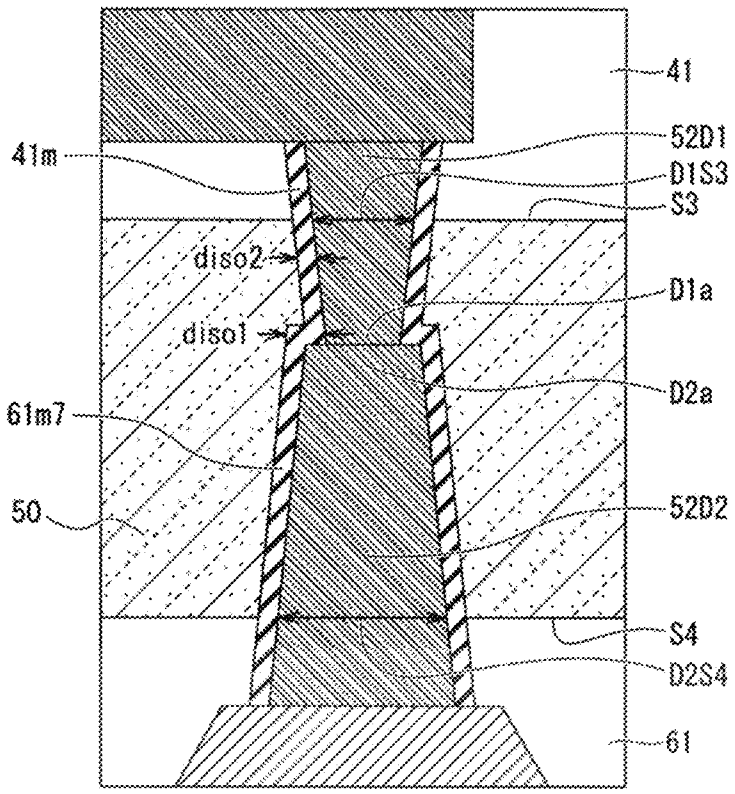

FIG. 90B is a longitudinal cross-sectional diagram depicting a main part of the optical detection device according to the eleventh embodiment of the present technology.

Figure 90C:
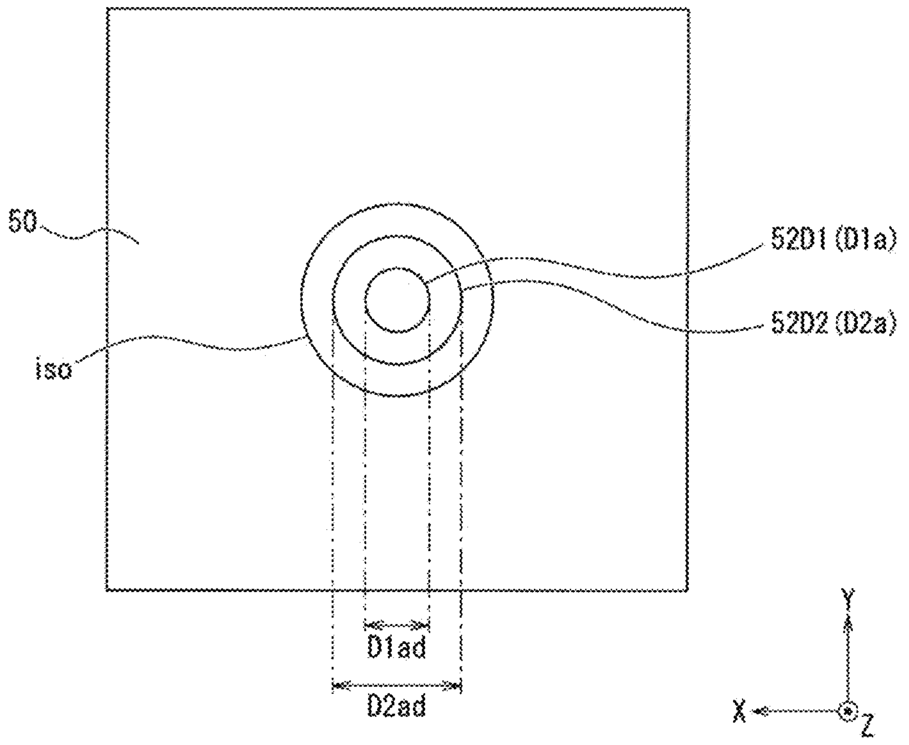

FIG. 90C is an explanatory diagram depicting a size relation between a seventh conductor, an eighth conductor, and an insulation film depicted in FIG. 90A, at a junction position in a planar view.

Figure 91A:
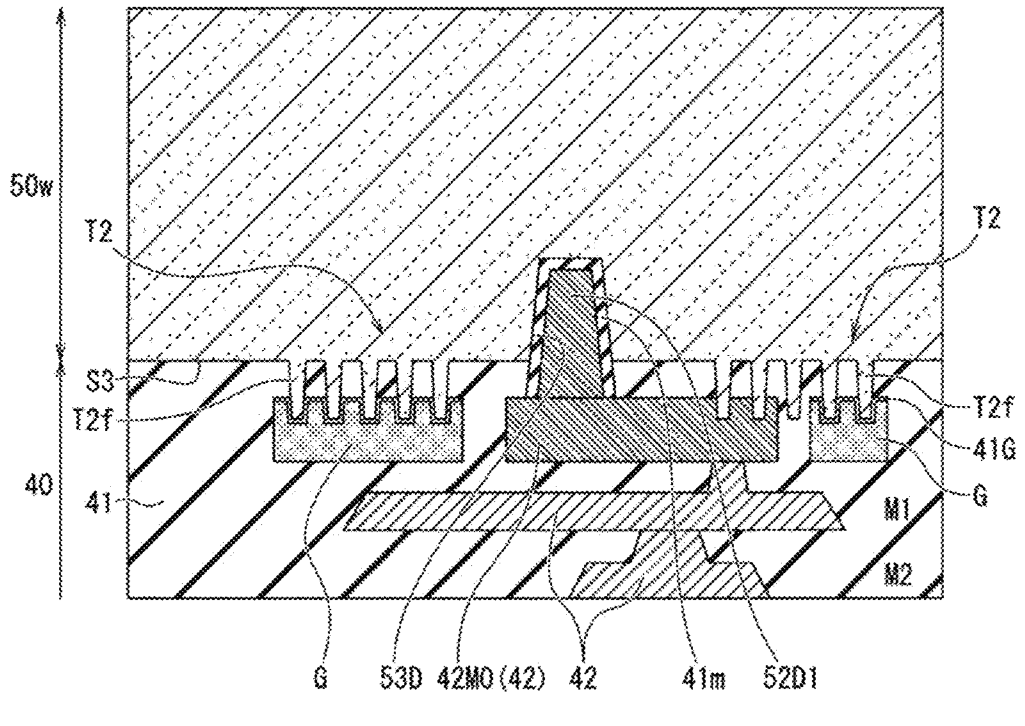

FIG. 91A is a step cross-sectional diagram depicting a manufacturing method of the optical detection device according to the eleventh embodiment of the present technology.

Figure 91B:
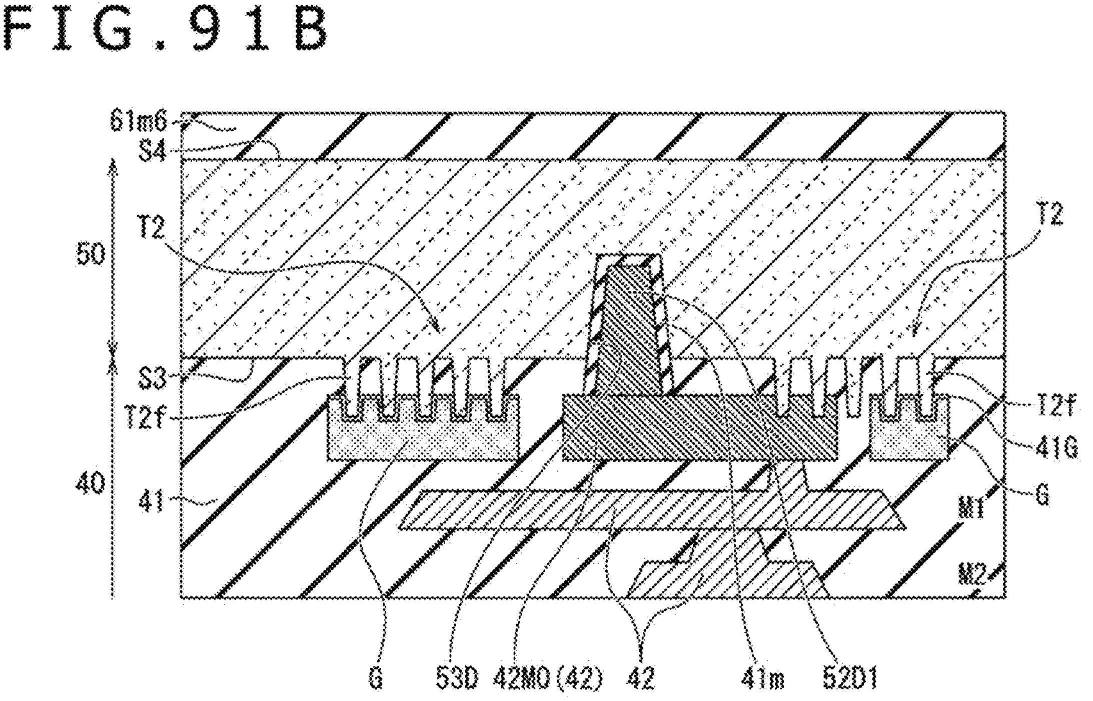

FIG. 91B is a step cross-sectional diagram continuing from FIG. 91A.

Figure 91C:
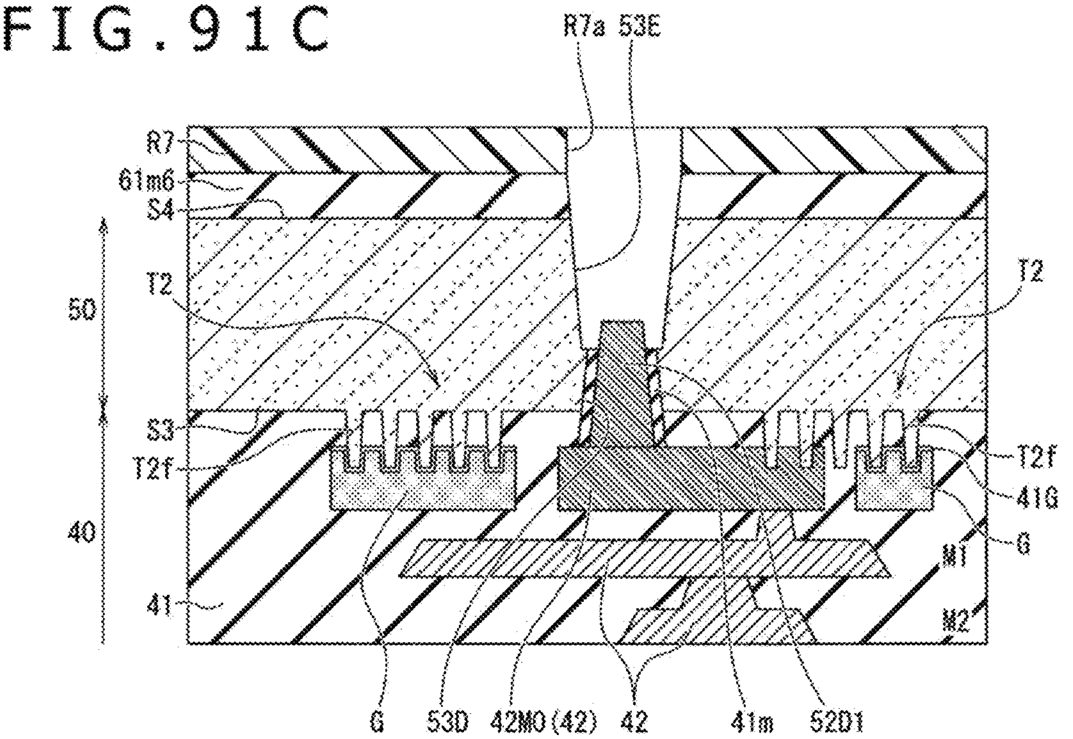

FIG. 91C is a step cross-sectional diagram continuing from FIG. 91B.

Figure 91D:
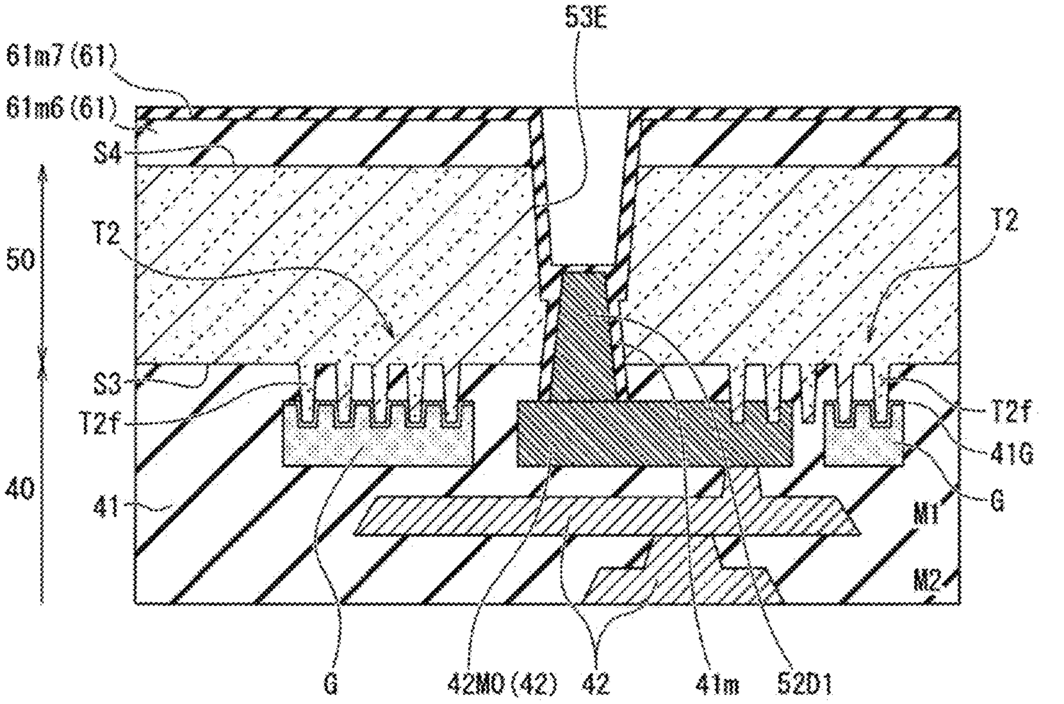

FIG. 91D is a step cross-sectional diagram continuing from FIG. 91C.

Figure 91E:
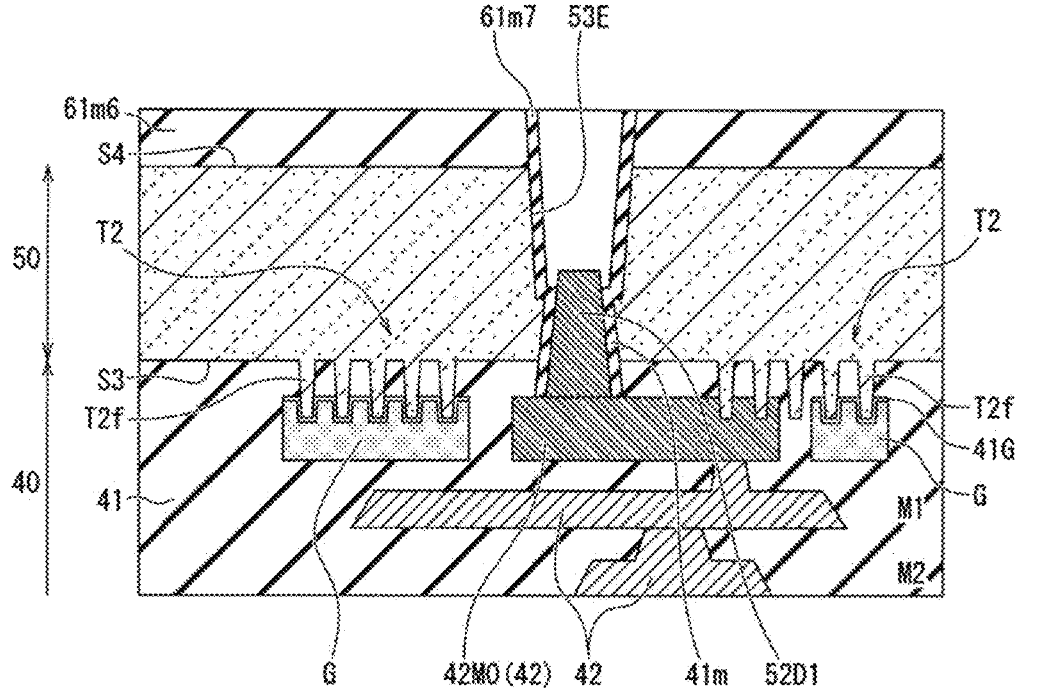

FIG. 91E is a step cross-sectional diagram continuing from FIG. 91D.

Figure 91F:
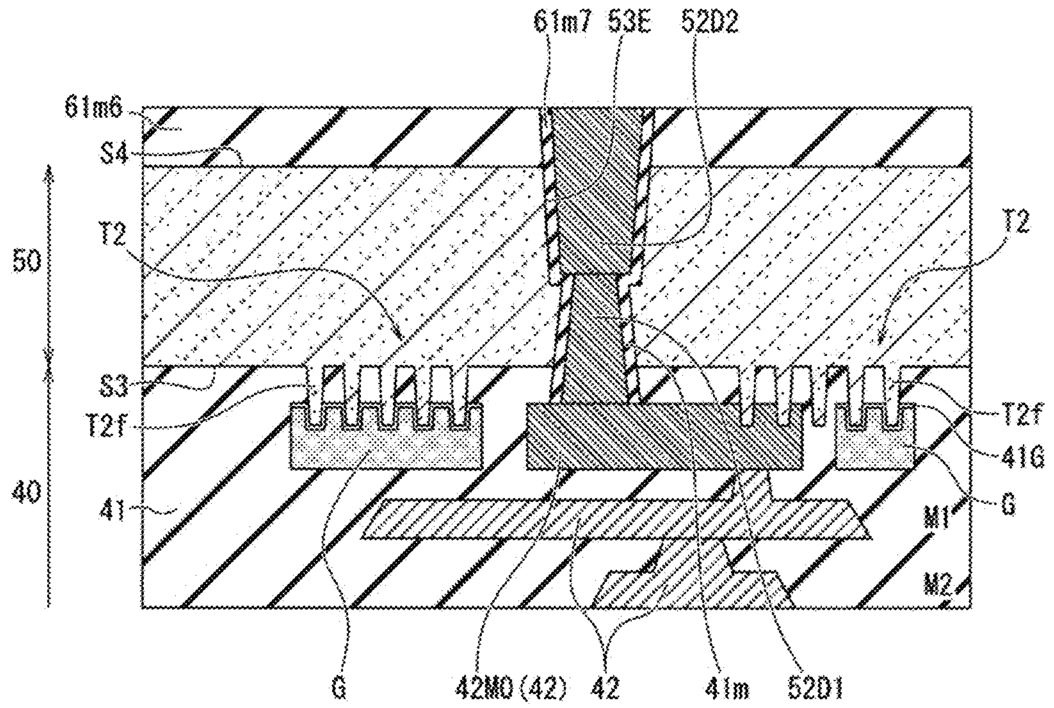

FIG. 91F is a step cross-sectional diagram continuing from FIG. 91E.

Figure 92A:
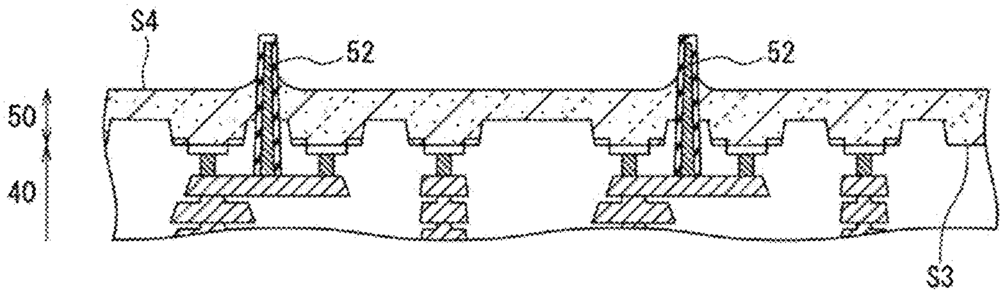

FIG. 92A is a step cross-sectional diagram depicting a manufacturing method of a conventional optical detection device.

Figure 92B:
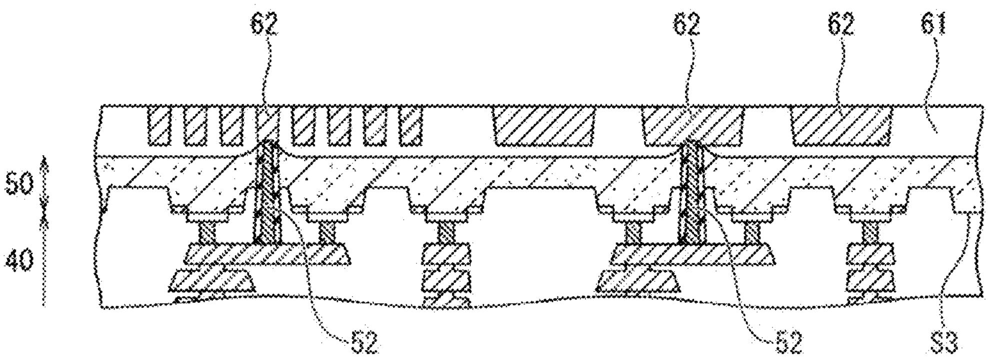

FIG. 92B is a step cross-sectional diagram continuing from FIG. 92A.

Figure 93A:
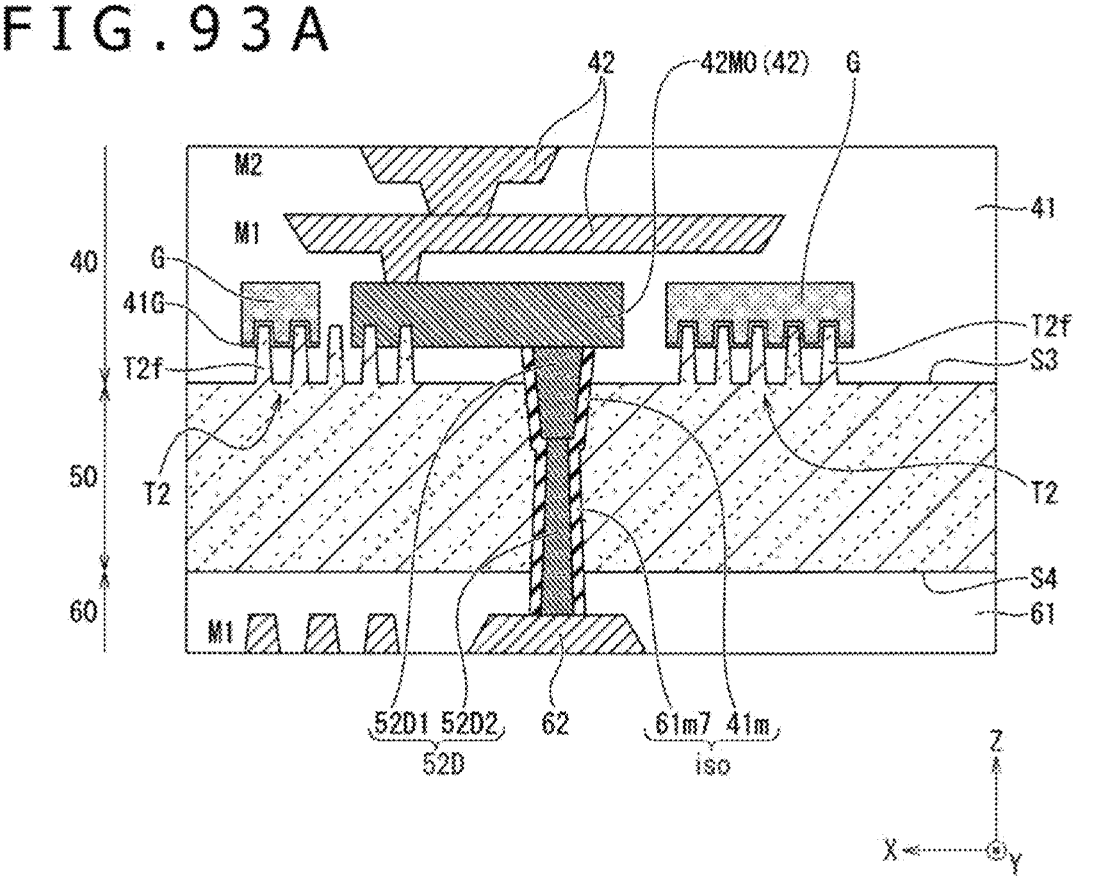

FIG. 93A is a longitudinal cross-sectional diagram depicting a main part of an optical detection device according to modification 1 of the eleventh embodiment of the present technology.

Figure 93B:
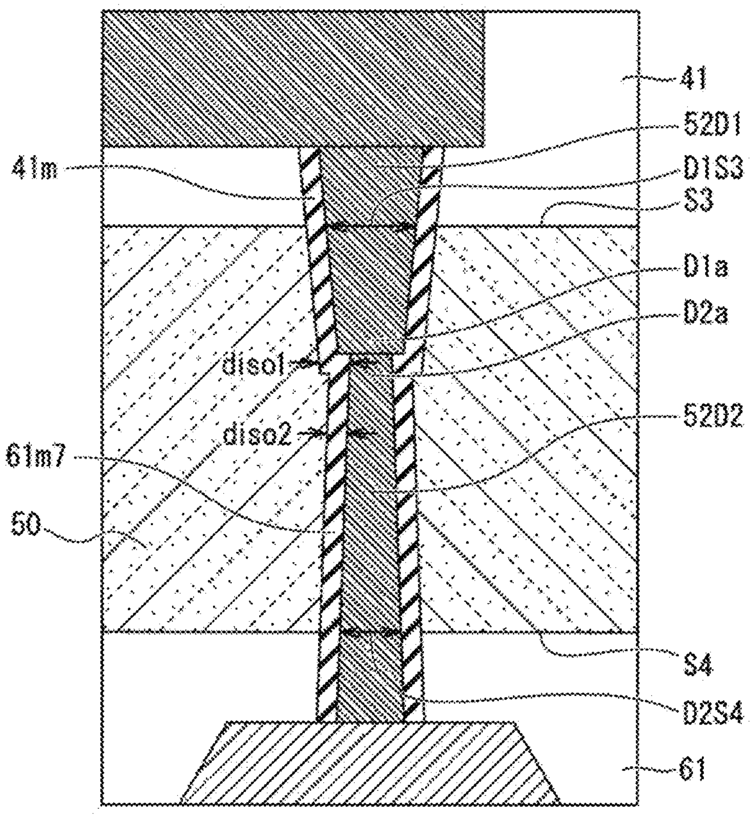

FIG. 93B is a longitudinal cross-sectional diagram depicting a main part of the optical detection device according to modification 1 of the eleventh embodiment of the present technology.

Figure 93C:
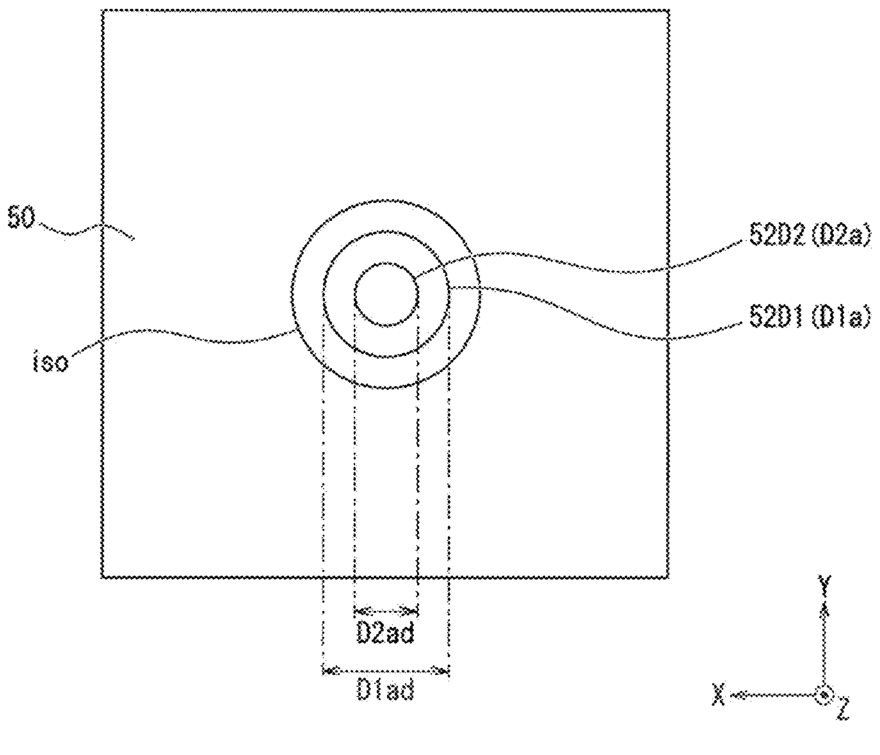

FIG. 93C is an explanatory diagram depicting a size relation between a seventh conductor, an eighth conductor, and an insulation film depicted in FIG. 93A, at a junction position in a planar view.

Figure 94A:
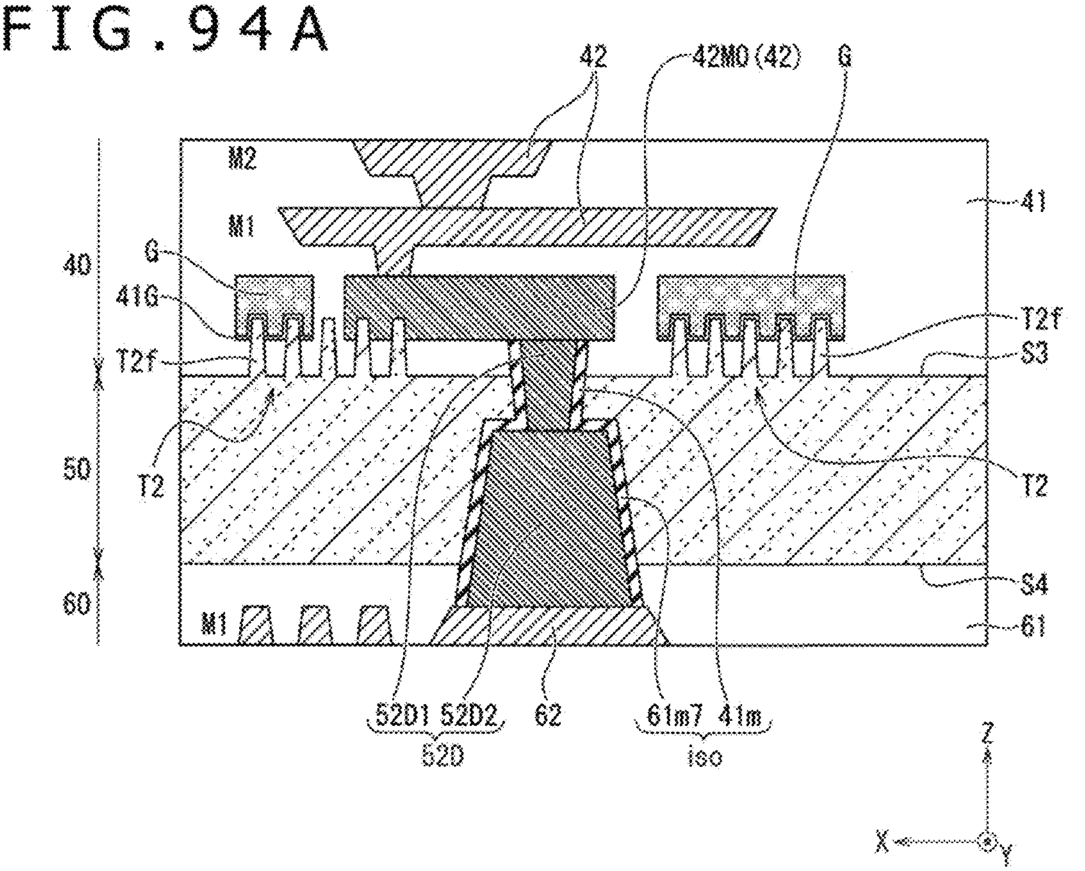

FIG. 94A is a longitudinal cross-sectional diagram depicting a main part of an optical detection device according to modification 2 of the eleventh embodiment of the present technology.

Figure 94B:
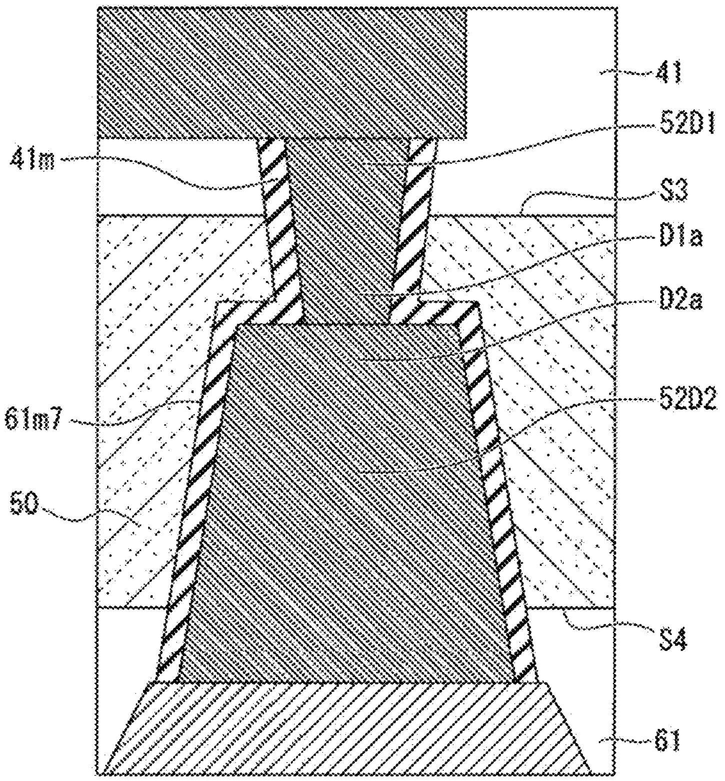

FIG. 94B is a longitudinal cross-sectional diagram depicting a main part of the optical detection device according to modification 2 of the eleventh embodiment of the present technology.

Figure 94C:
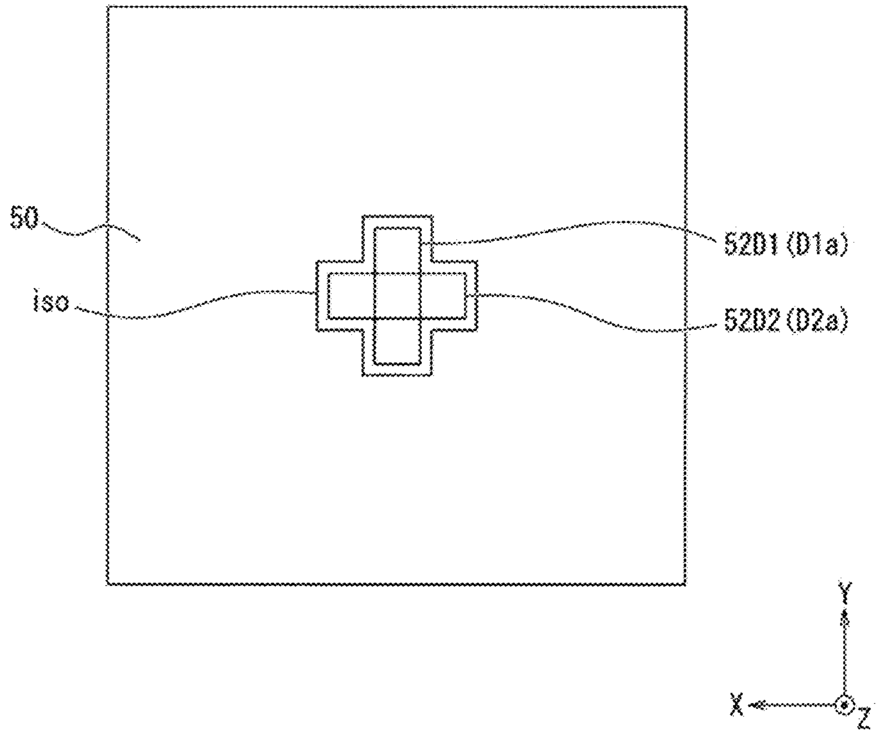

FIG. 94C is an explanatory diagram depicting a size relation between a seventh conductor, an eighth conductor, and an insulation film depicted in FIG. 94A, at a junction position in a planar view.

Figure 95:
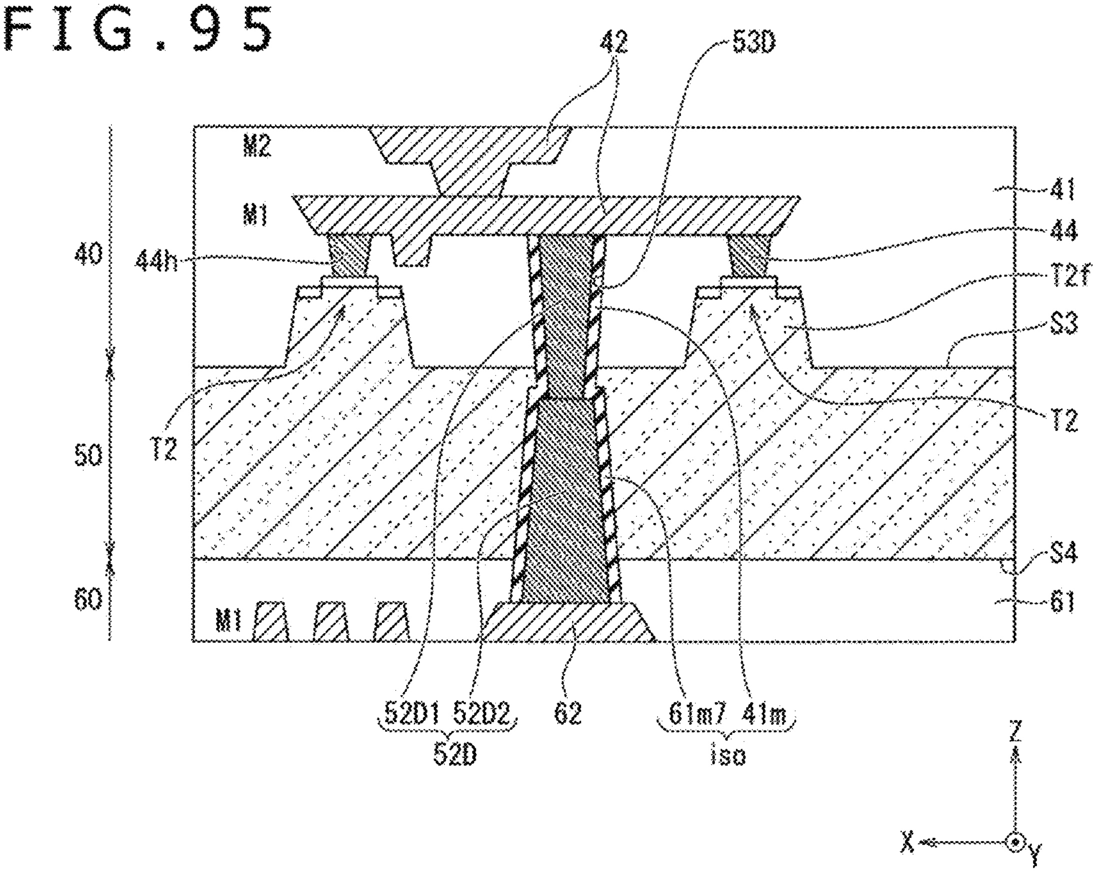

FIG. 95 is a longitudinal cross-sectional diagram depicting a main part of an optical detection device according to modification 3 of the eleventh embodiment of the present technology.

Figure 96:
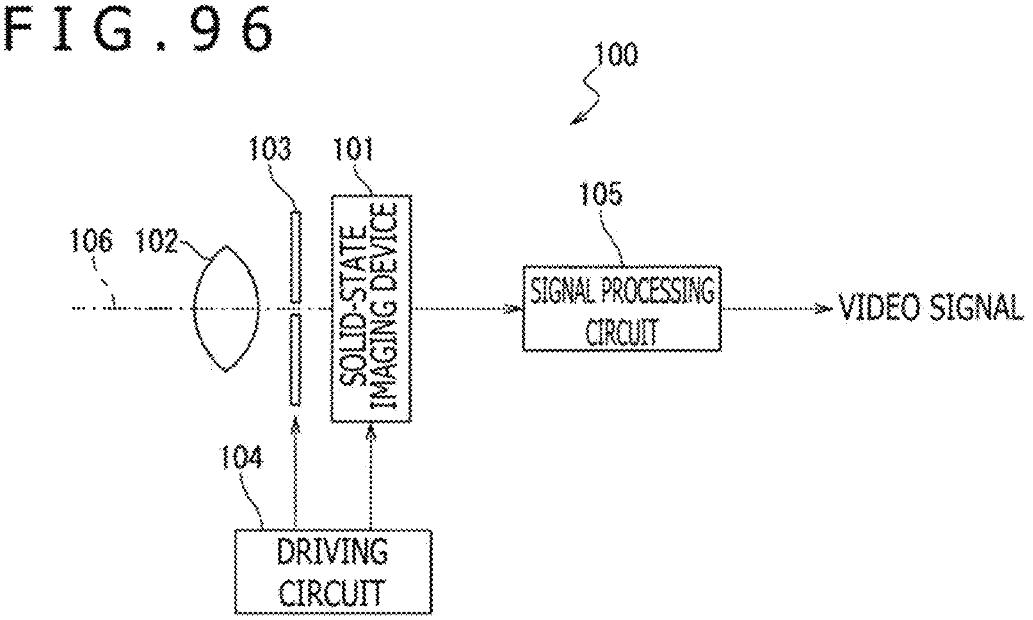

FIG. 96 is a diagram depicting a schematic configuration of an electronic apparatus according to a twelfth embodiment of the present technology.

Figure 97:
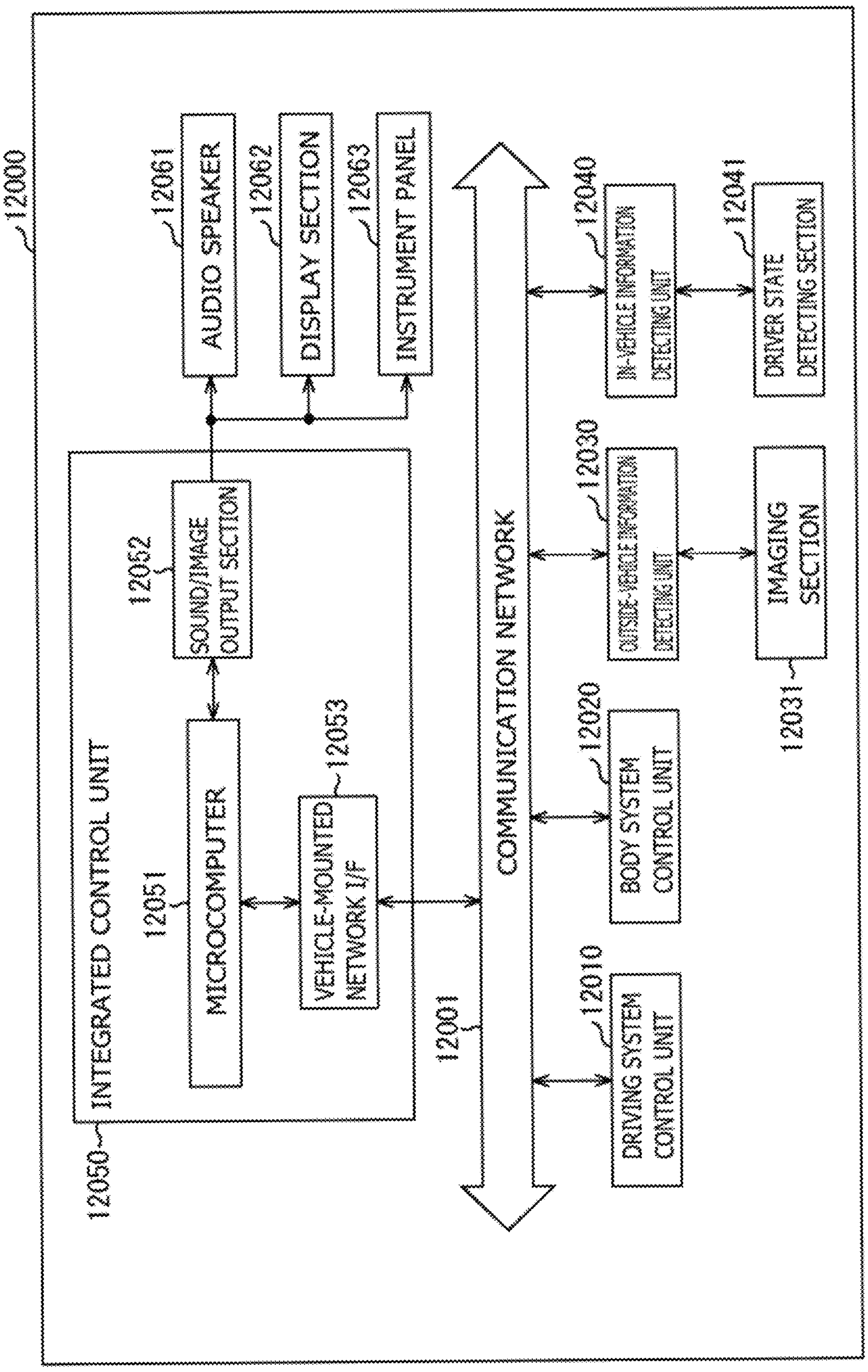

FIG. 97 is a block diagram depicting an example of schematic configuration of a vehicle control system.

Figure 98:
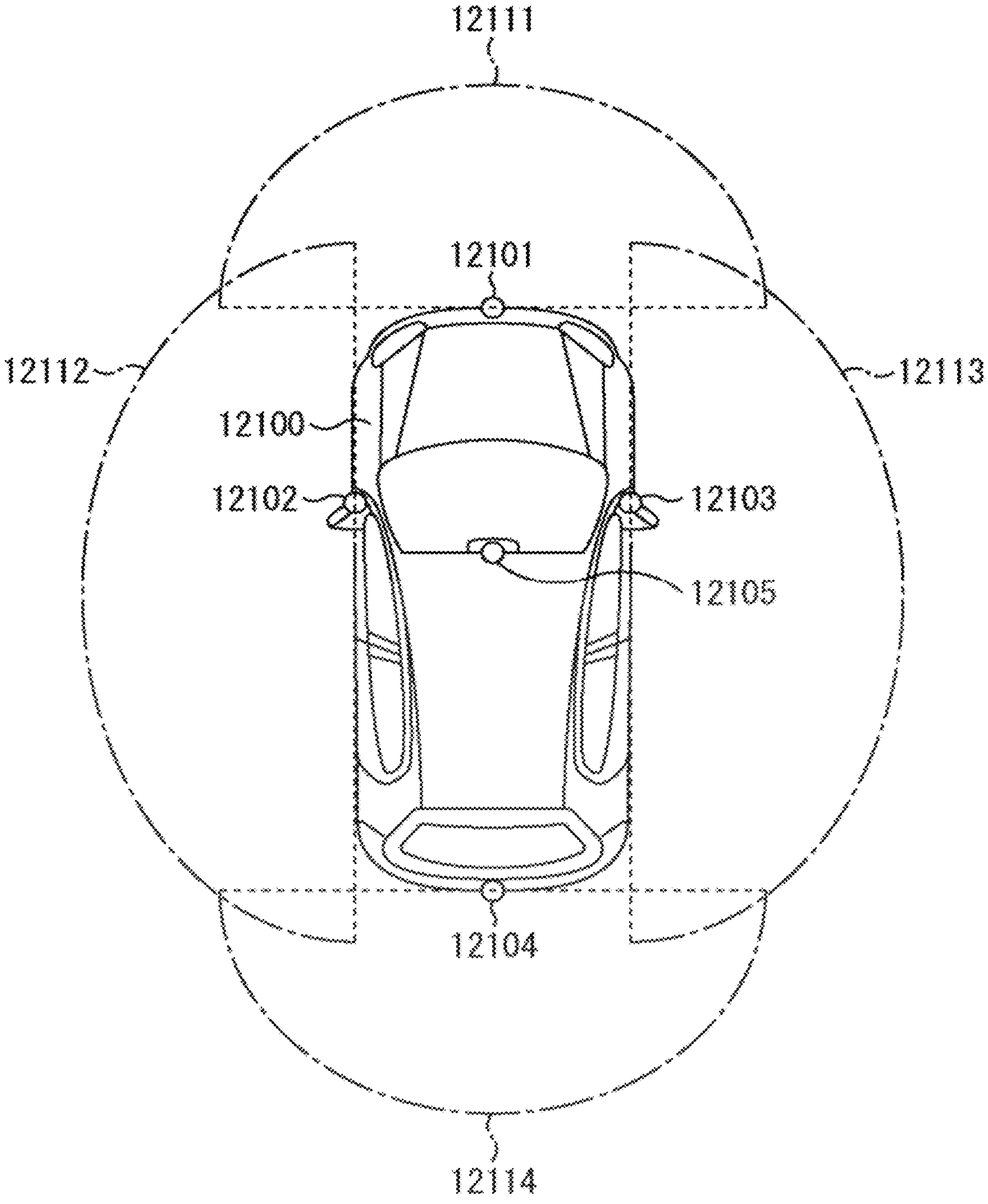

FIG. 98 is a diagram of assistance in explaining an example of installation positions of an outside-vehicle information detecting section and an imaging section.

Figure 99:
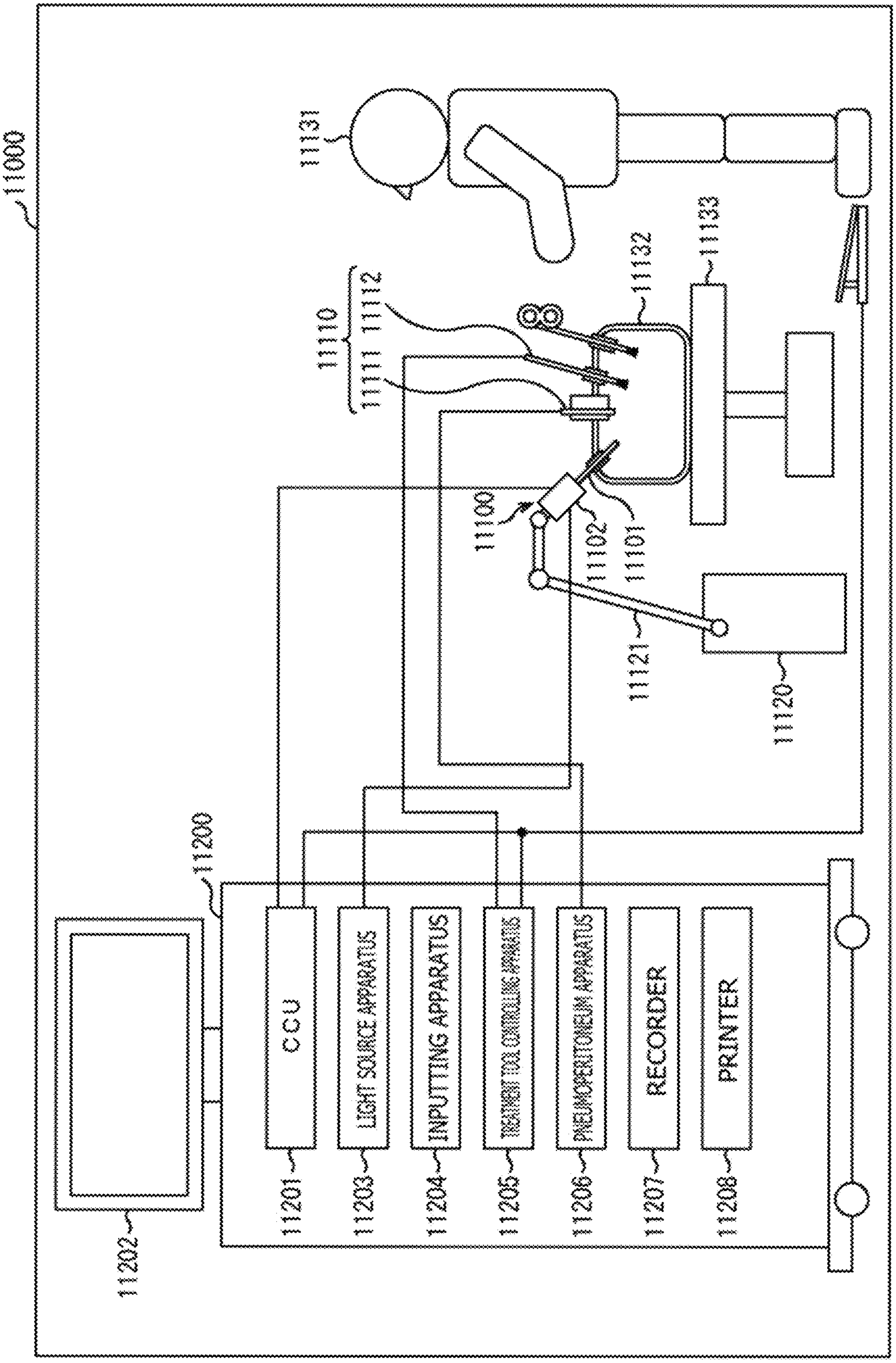

FIG. 99 is a view depicting an example of a schematic configuration of an endoscopic surgery system.

Figure 100:
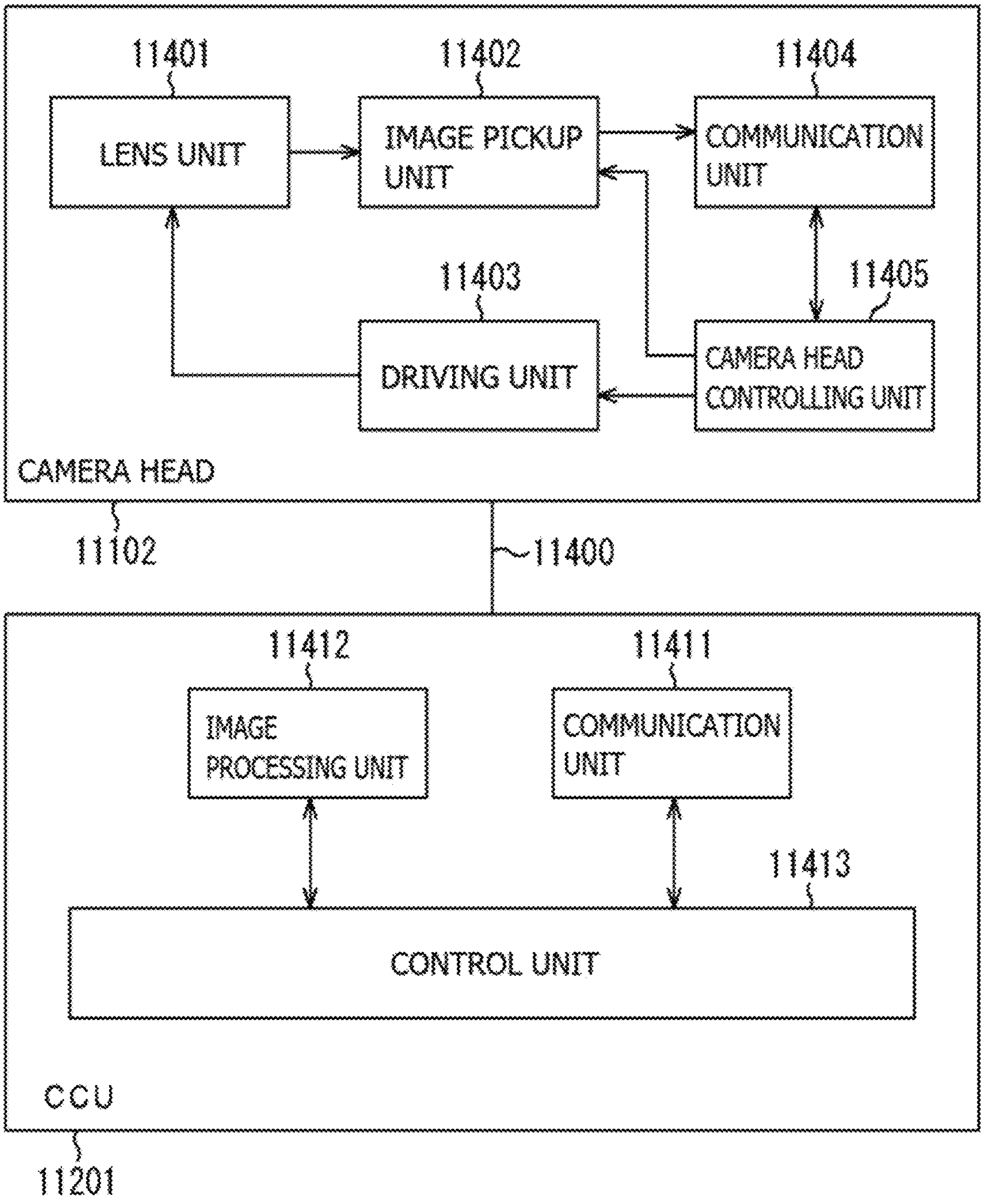

FIG. 100 is a block diagram depicting an example of a functional configuration of a camera head and a camera control unit (CCU).

Figure 101A:
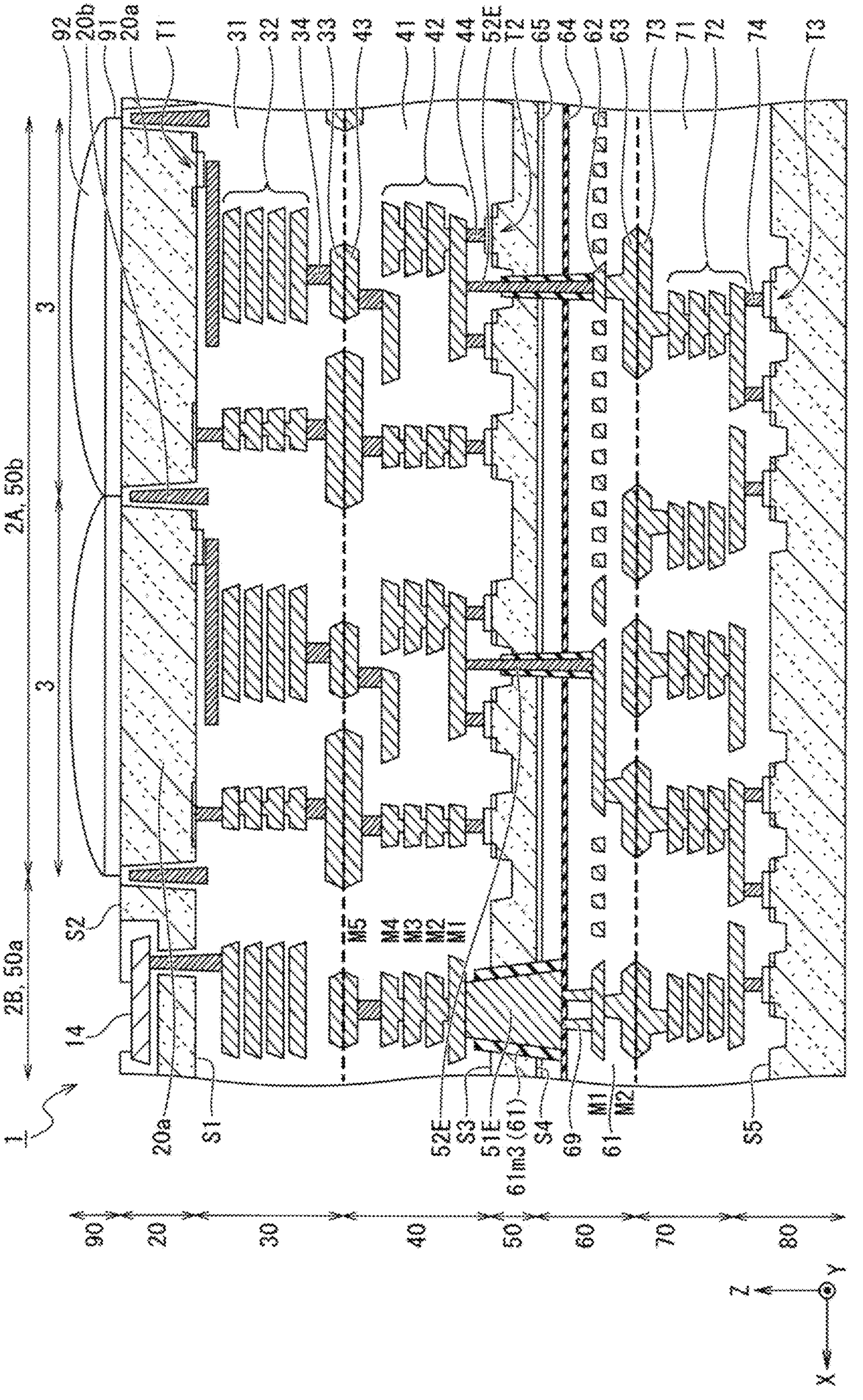

FIG. 101A is a longitudinal cross-sectional diagram depicting a main part of an optical detection device according to a thirteenth embodiment of the present technology.

Figure 101B:
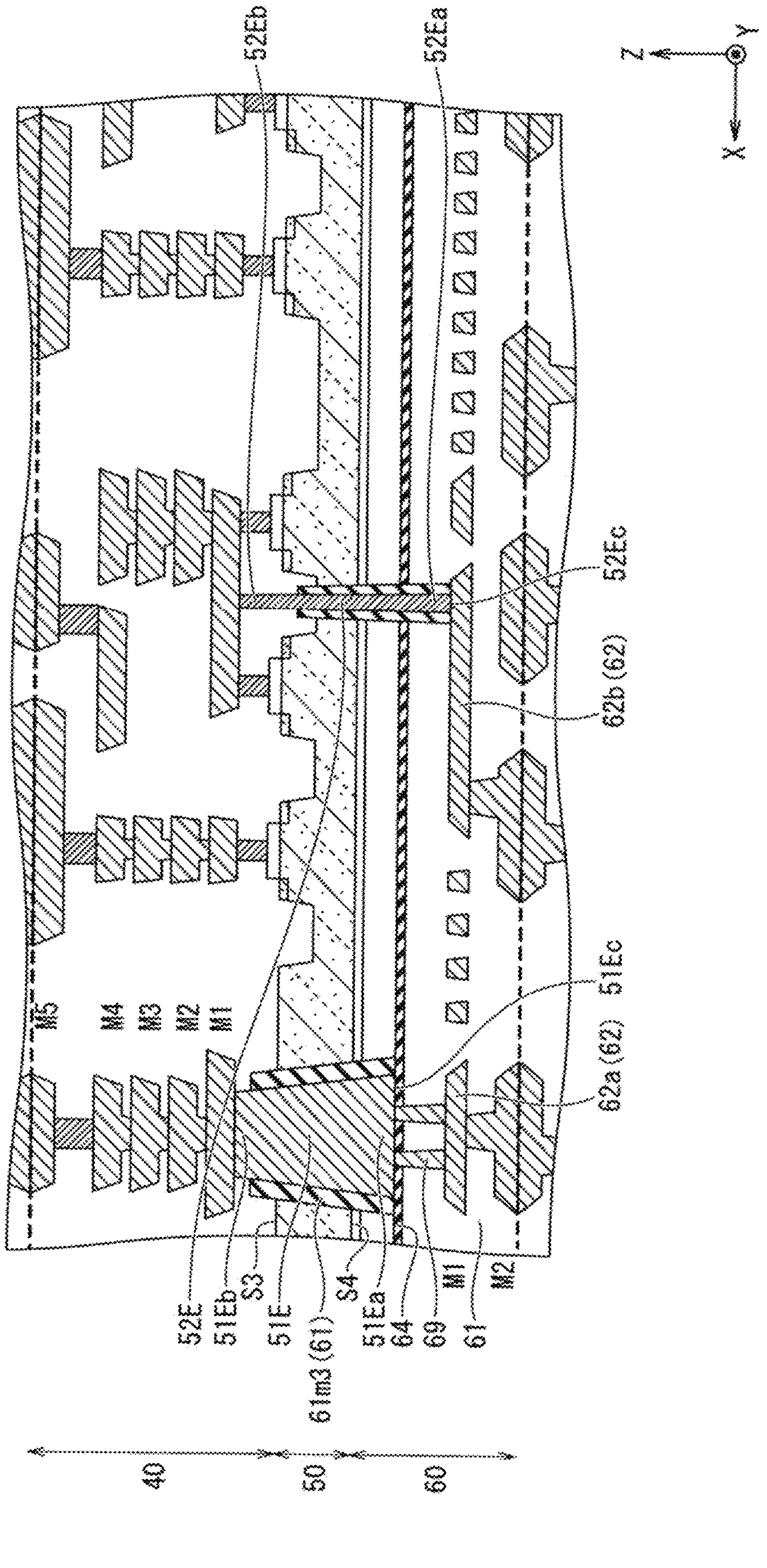

FIG. 101B is a partially enlarged diagram depicting an enlarged part of FIG. 101A.

Figure 101C:
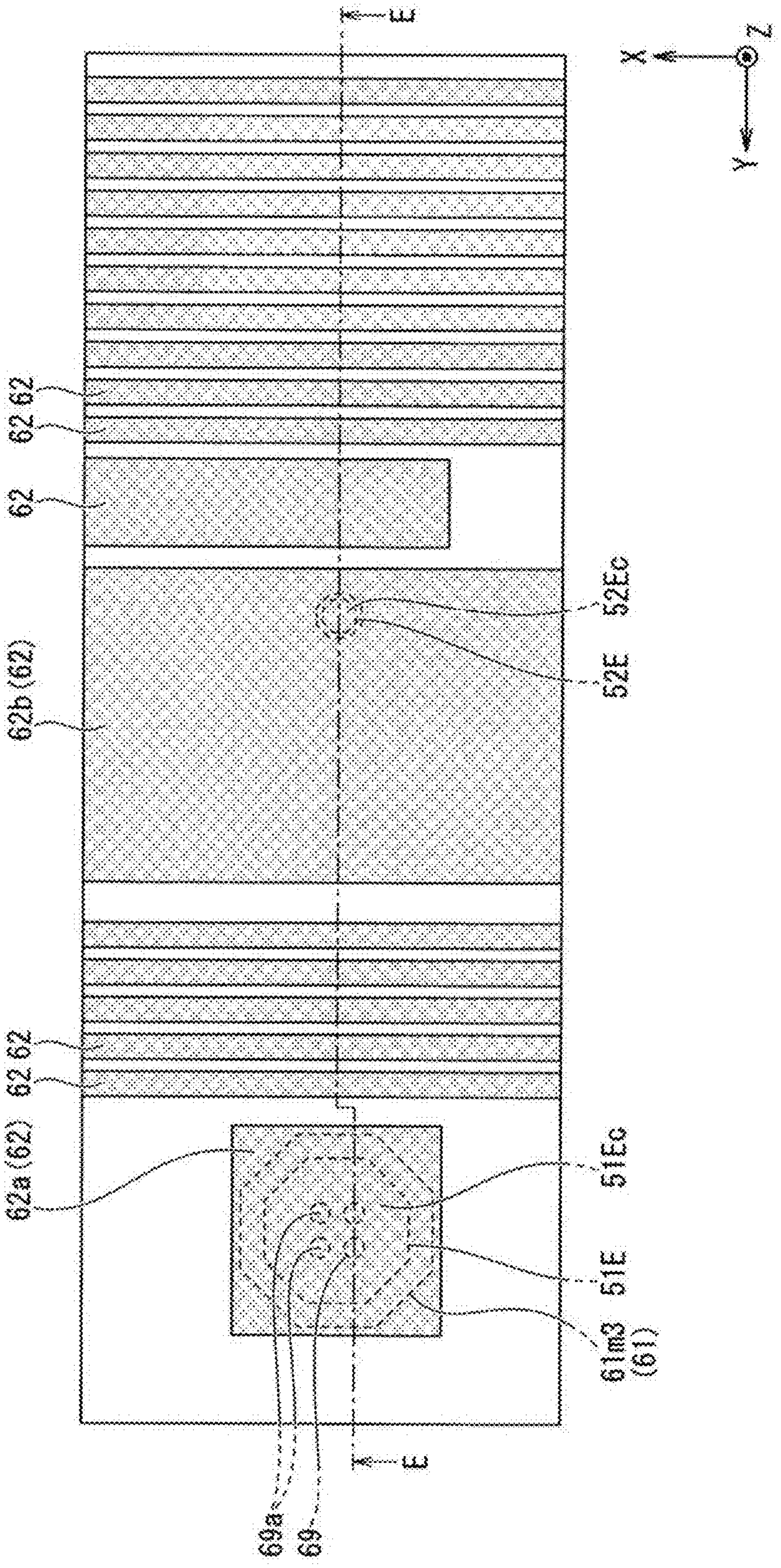

FIG. 101C is a plan diagram depicting one example of a positional relation between wires, a connection portion, a first conductor, and a second conductor of the optical detection device according to the thirteenth embodiment of the present technology.

Figure 101D:
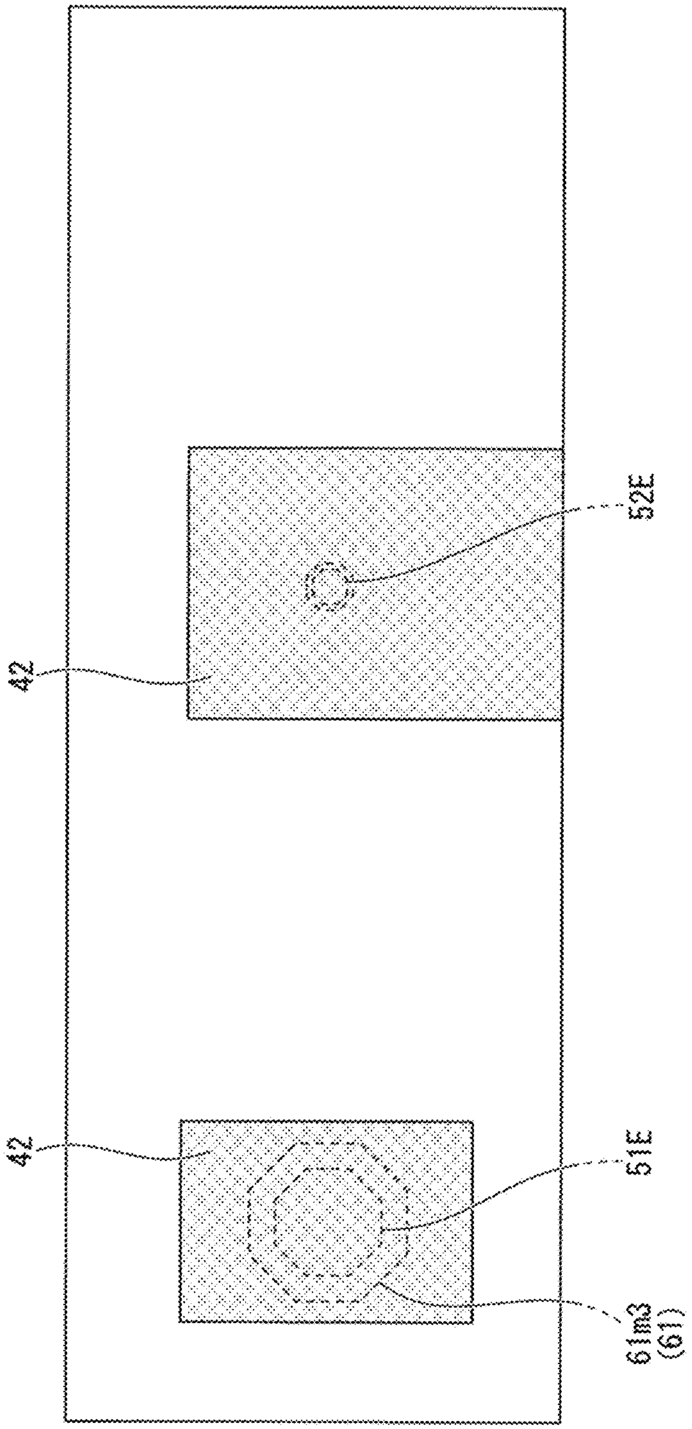

FIG. 101D is a plan diagram depicting one example of a positional relation between wires, the first conductor, and the second conductor of the optical detection device according to the thirteenth embodiment of the present technology.

Figure 102A:
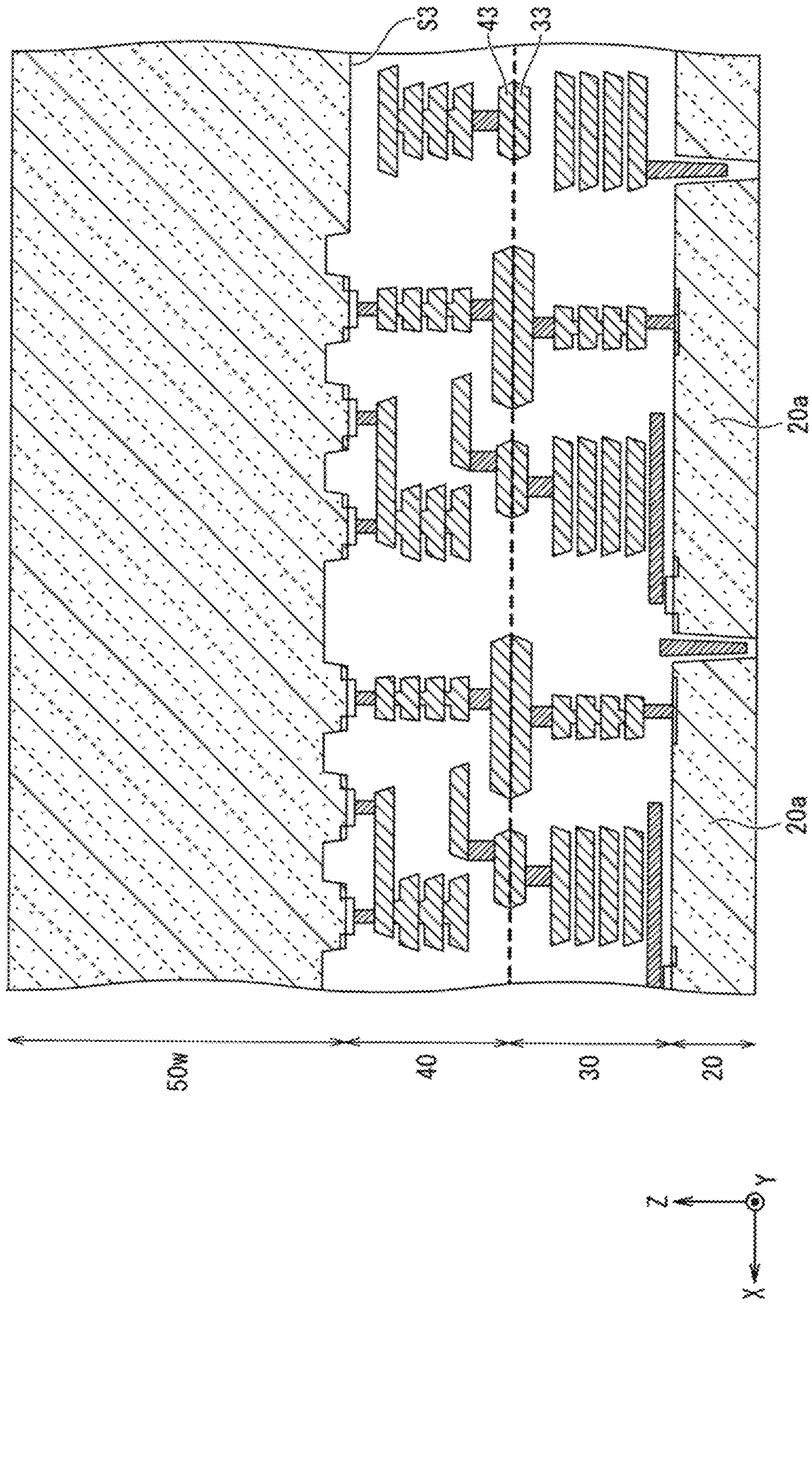

FIG. 102A is a step cross-sectional diagram depicting a manufacturing method of the optical detection device according to the thirteenth embodiment of the present technology.

Figure 102B:
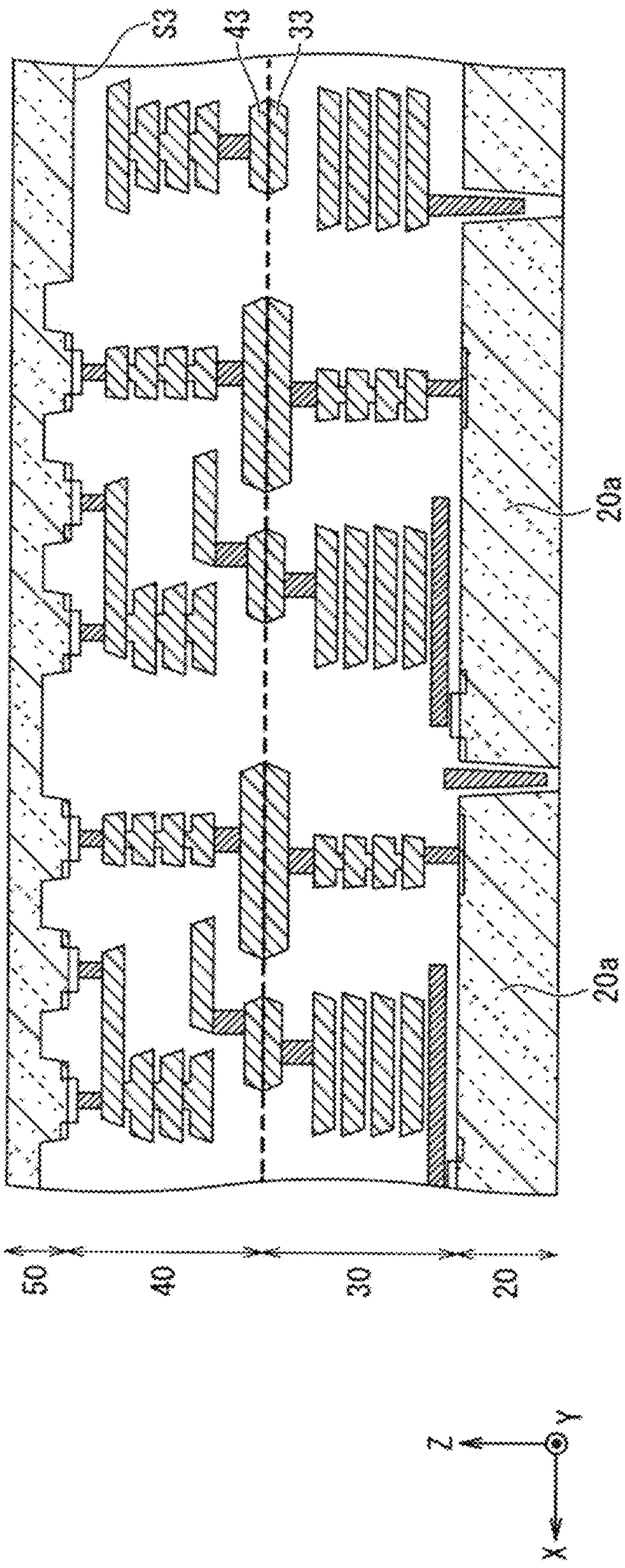

FIG. 102B is a step cross-sectional diagram continuing from FIG. 102A.

Figure 102C:
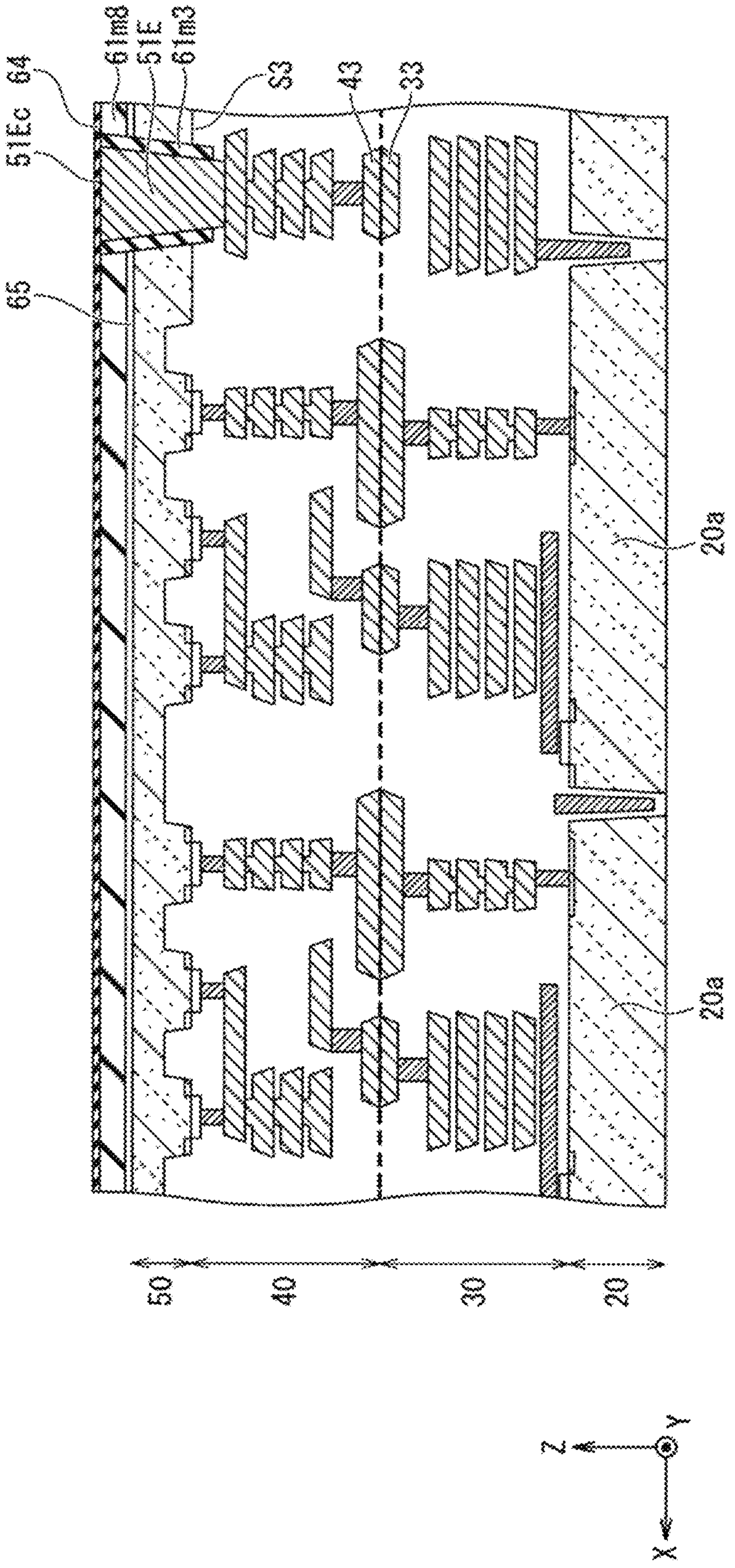

FIG. 102C is a step cross-sectional diagram continuing from FIG. 102B.

Figure 102D:
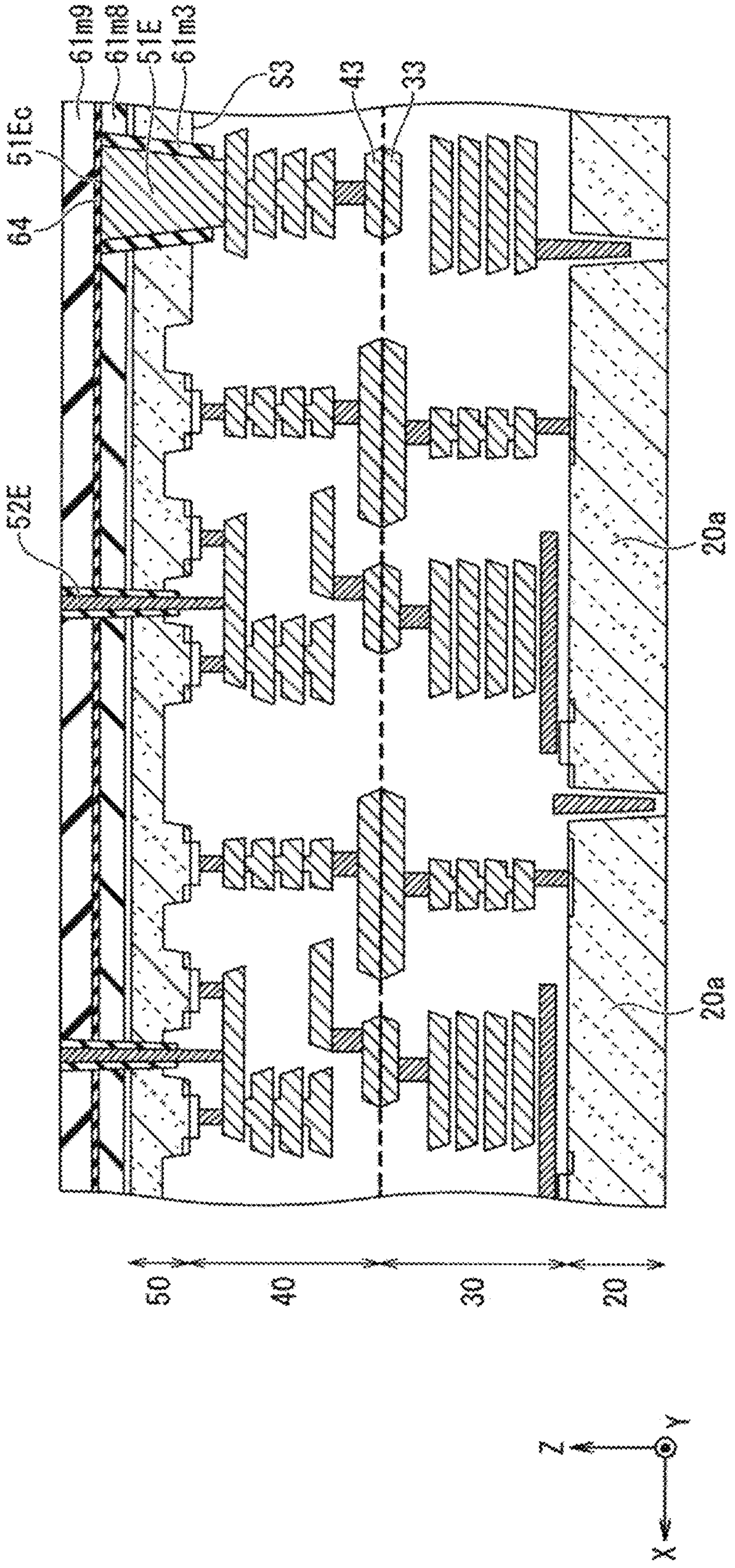

FIG. 102D is a step cross-sectional diagram continuing from FIG. 102C.

Figure 102E:
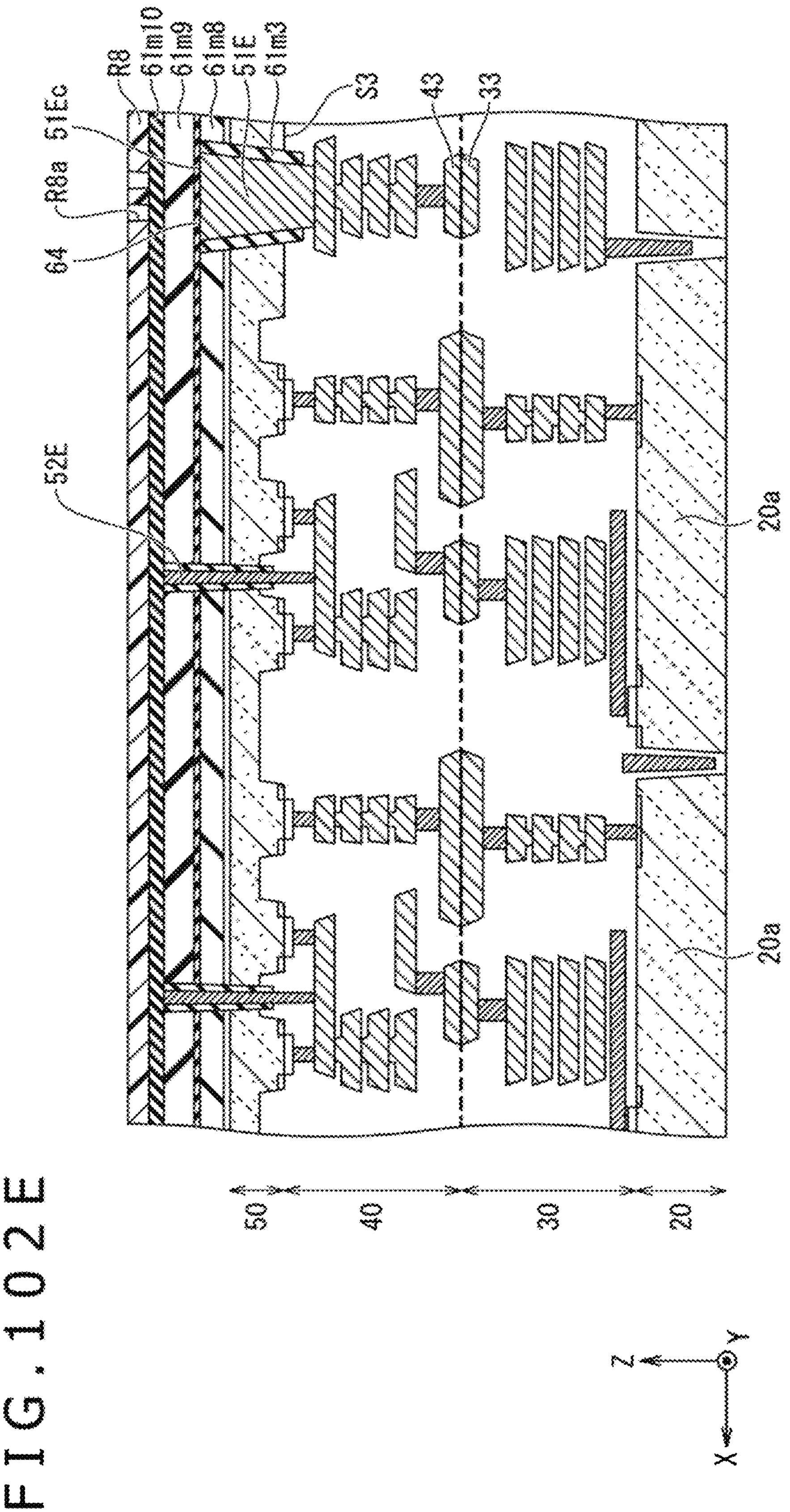

FIG. 102E is a step cross-sectional diagram continuing from FIG. 102D.

Figure 102F:
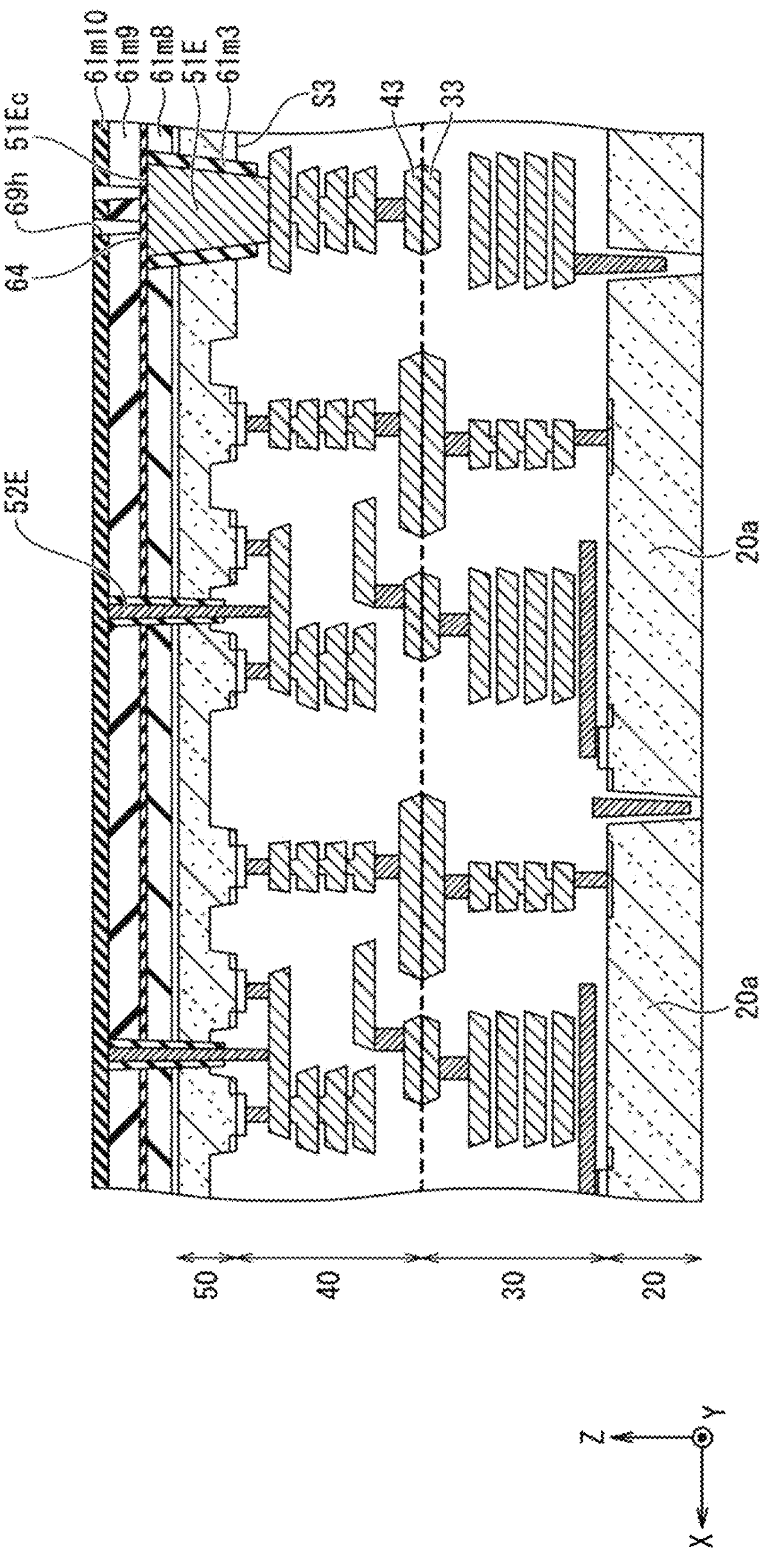

FIG. 102F is a step cross-sectional diagram continuing from FIG. 102E.

Figure 102G:
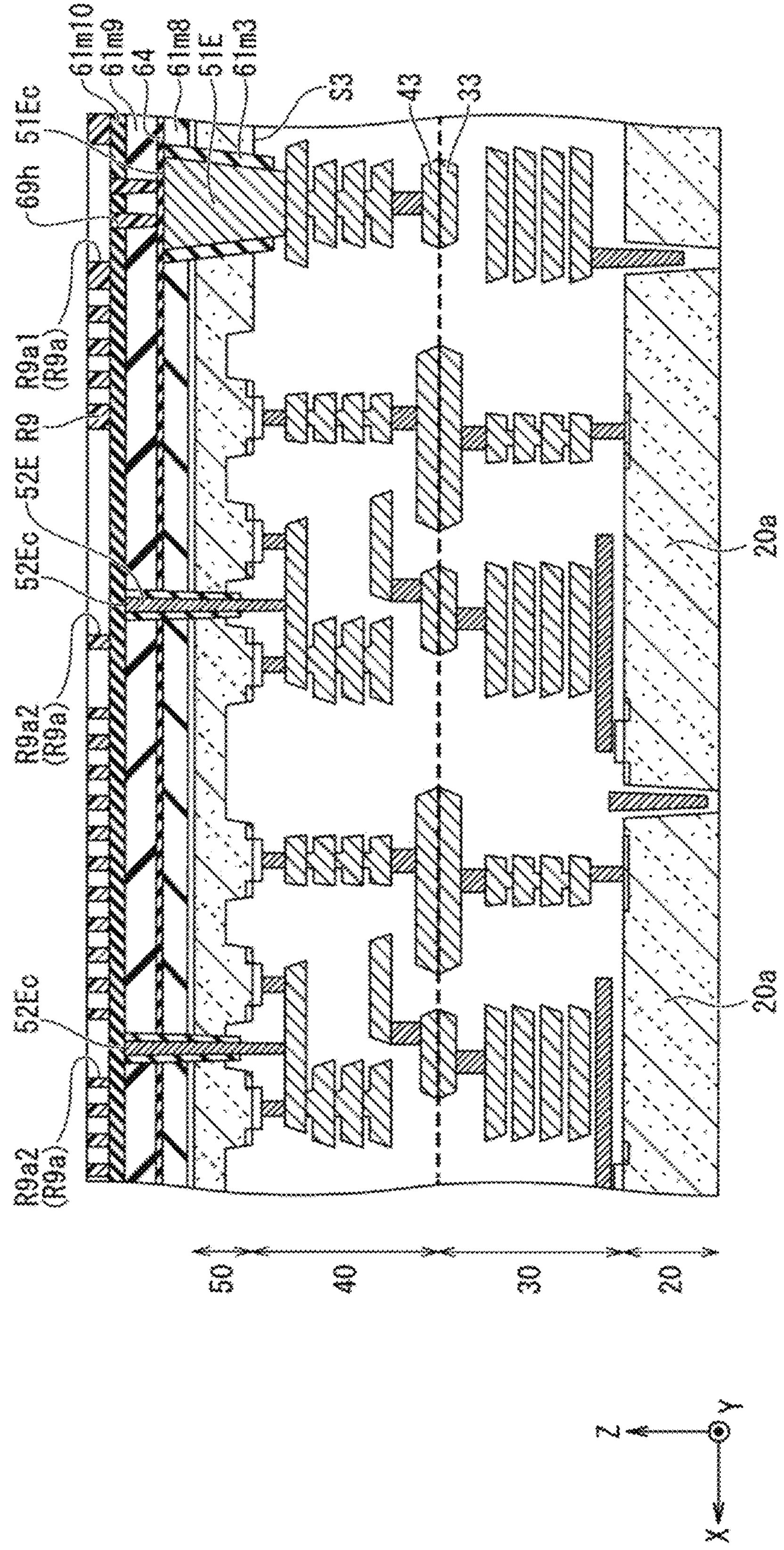

FIG. 102G is a step cross-sectional diagram continuing from FIG. 102F.

Figure 102H:
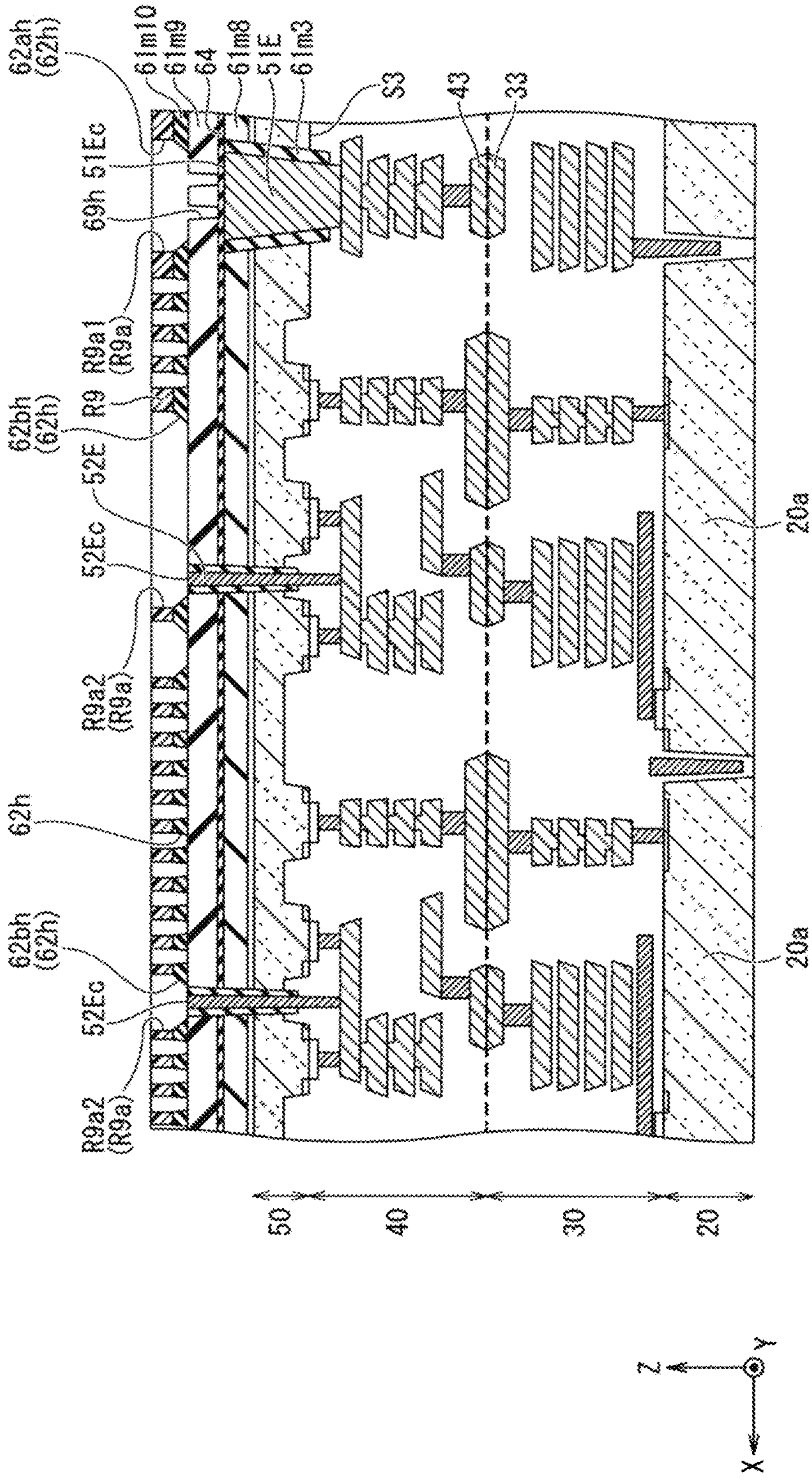

FIG. 102H is a step cross-sectional diagram continuing from FIG. 102G.

Figure 102I:
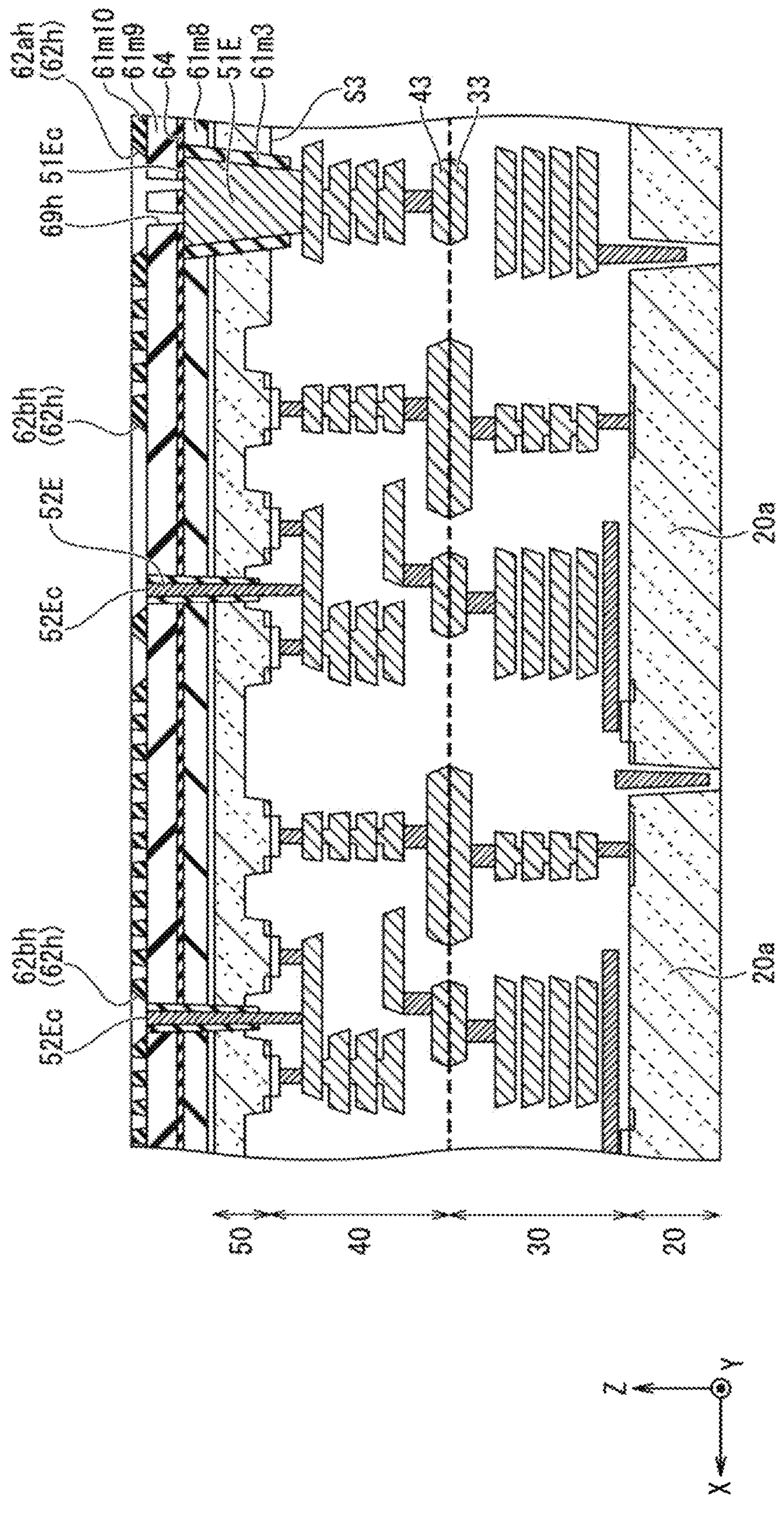

FIG. 102I is a step cross-sectional diagram continuing from FIG. 102H.

Figure 102J:
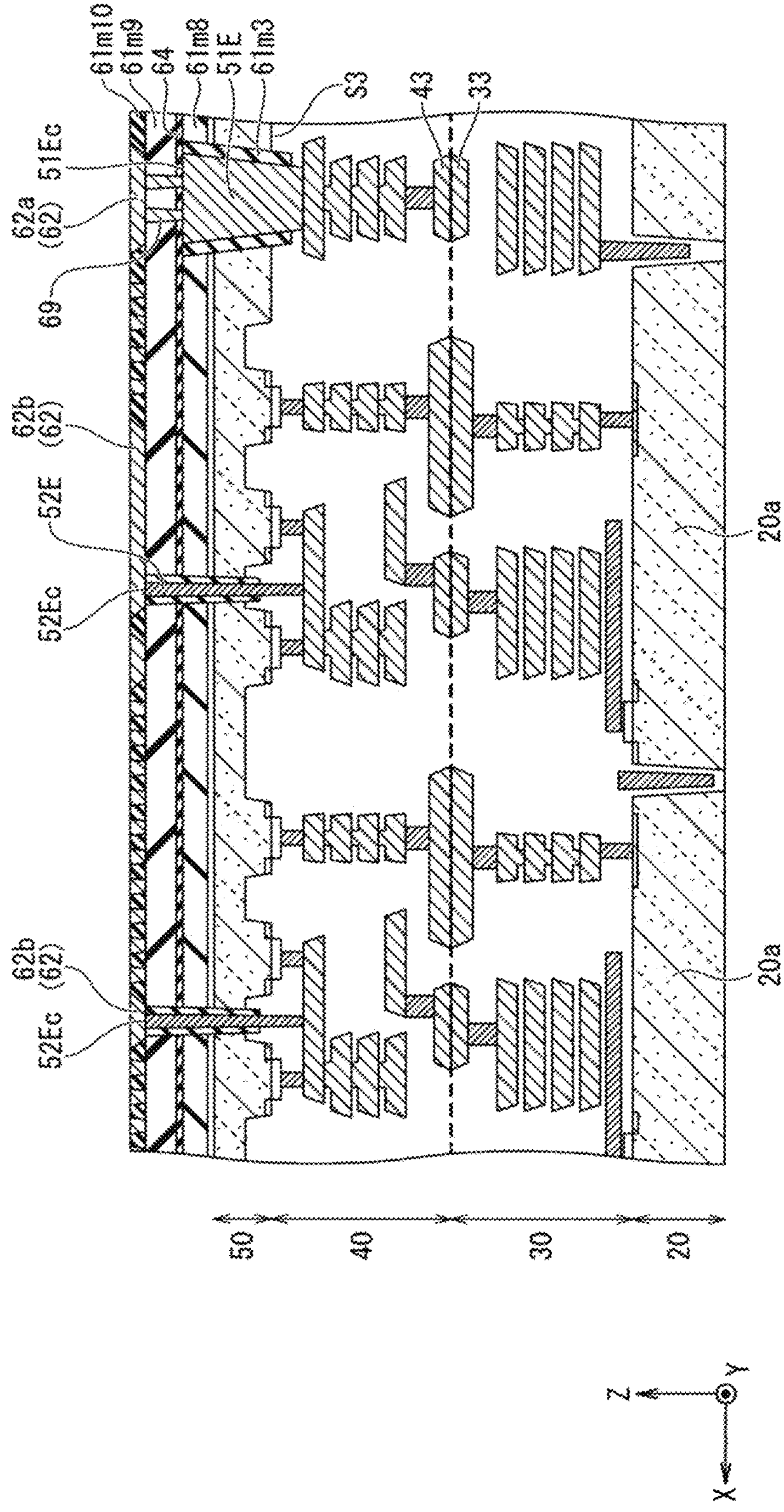

FIG. 102J is a step cross-sectional diagram continuing from FIG. 102I.

Figure 103A:
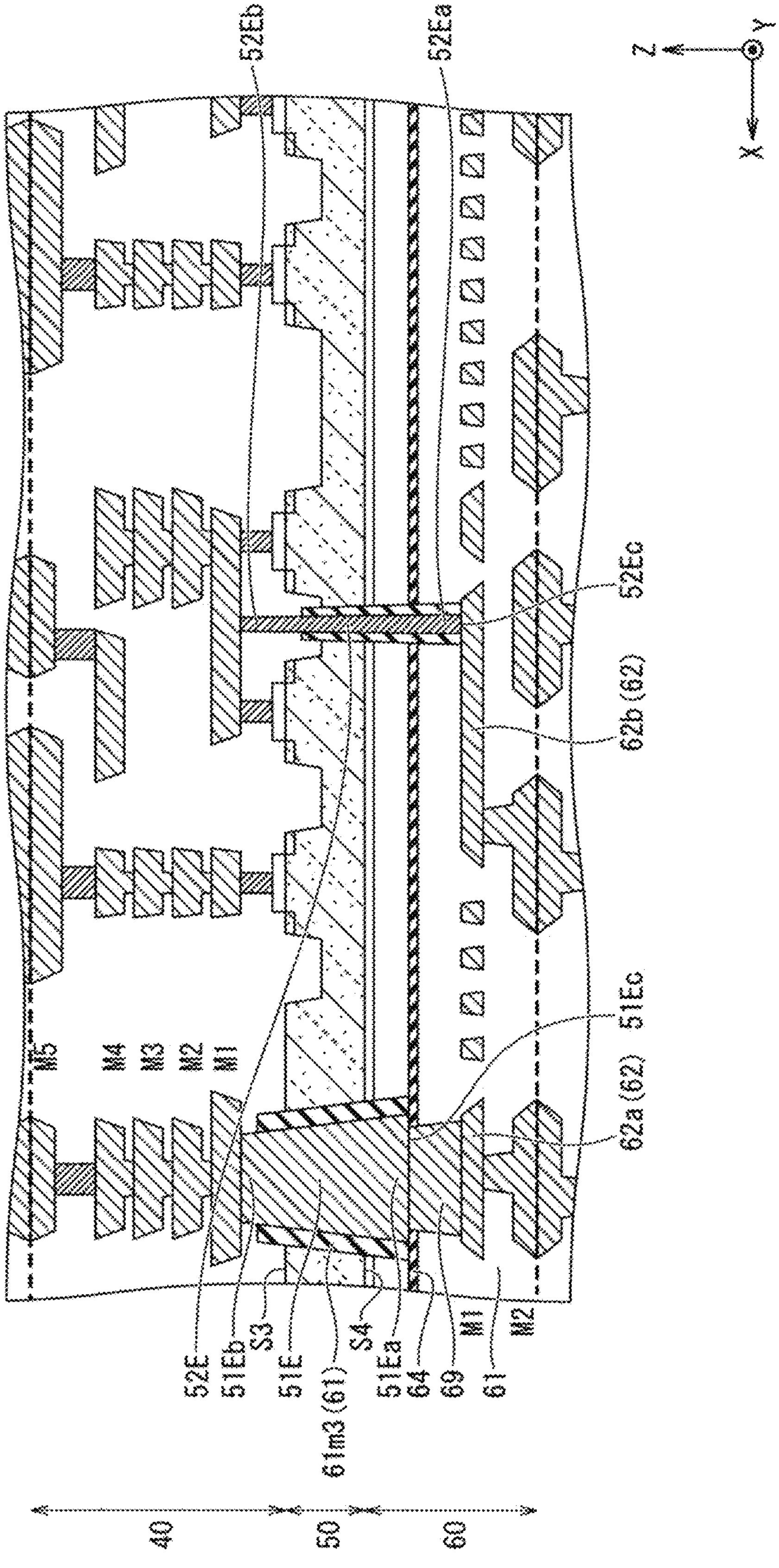

FIG. 103A is a longitudinal cross-sectional diagram depicting a main part of an optical detection device according to modification 1 of the thirteenth embodiment of the present technology.

Figure 103B:
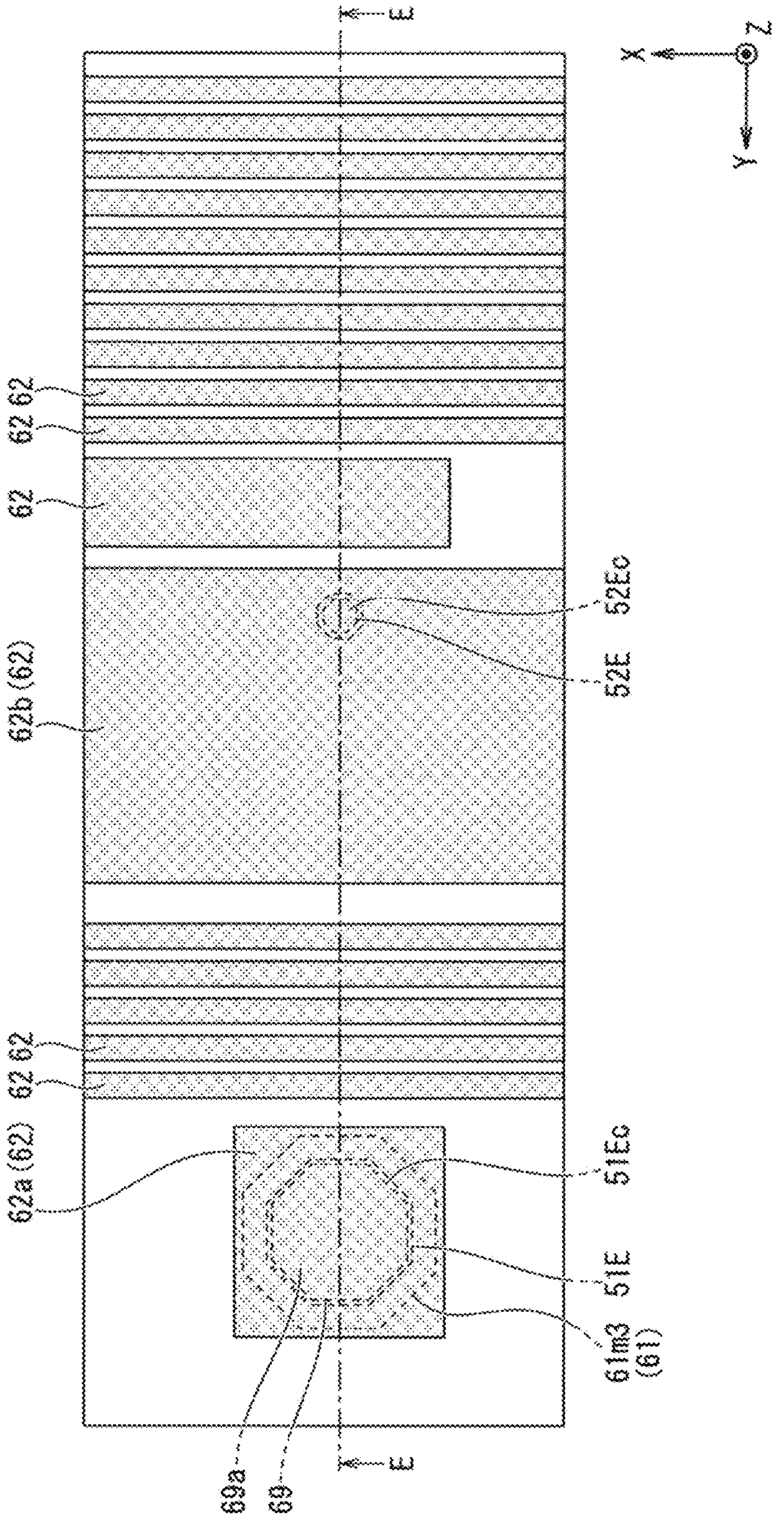

FIG. 103B is a plan diagram depicting one example of a positional relation between wires, a connection portion, a first conductor, and a second conductor of the optical detection device according to modification 1 of the thirteenth embodiment of the present technology.

Figure 104A:
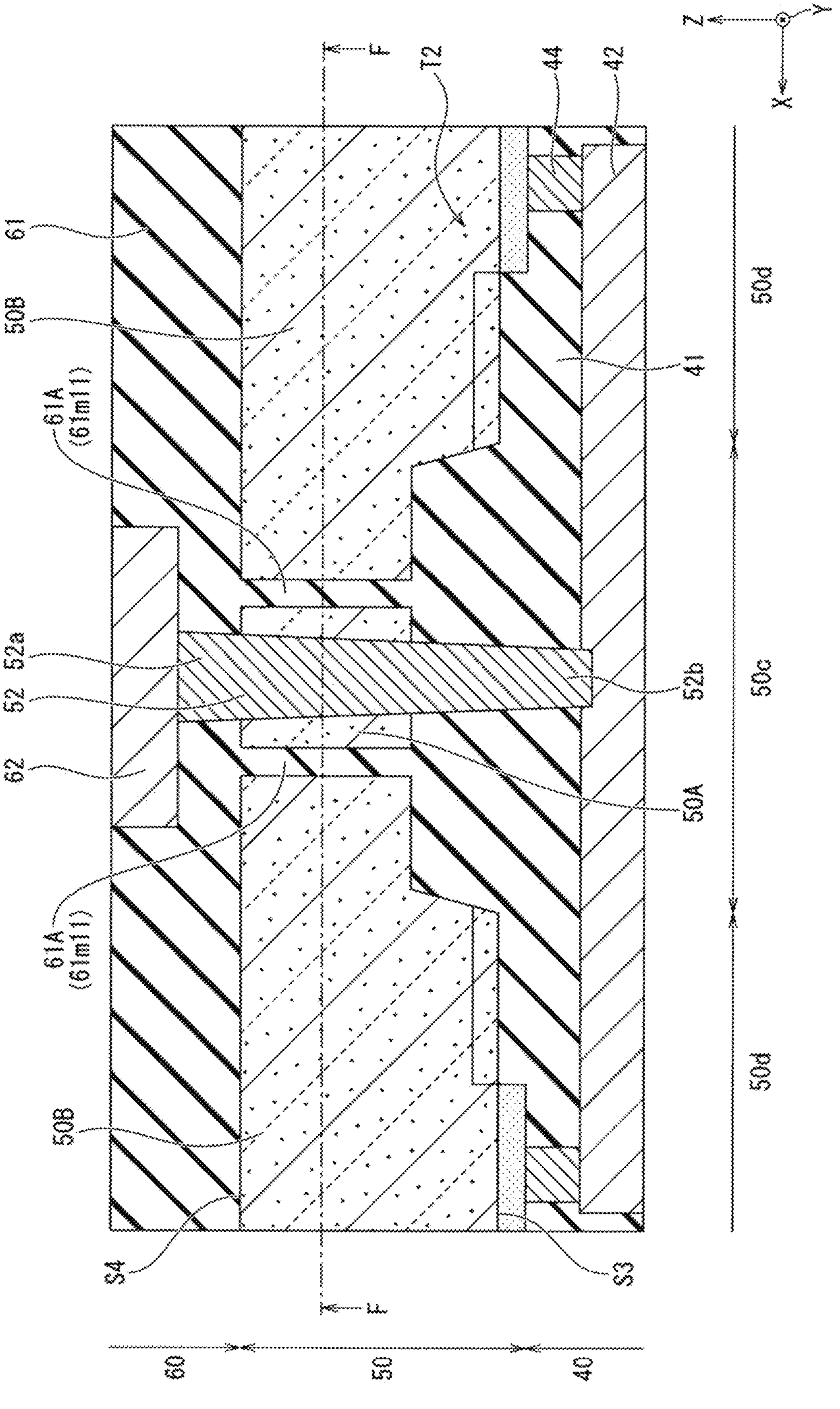

FIG. 104A is a longitudinal cross-sectional diagram depicting a cross-sectional structure of a second conductor included in an optical detection device according to a fourteenth embodiment of the present technology.

Figure 104B:
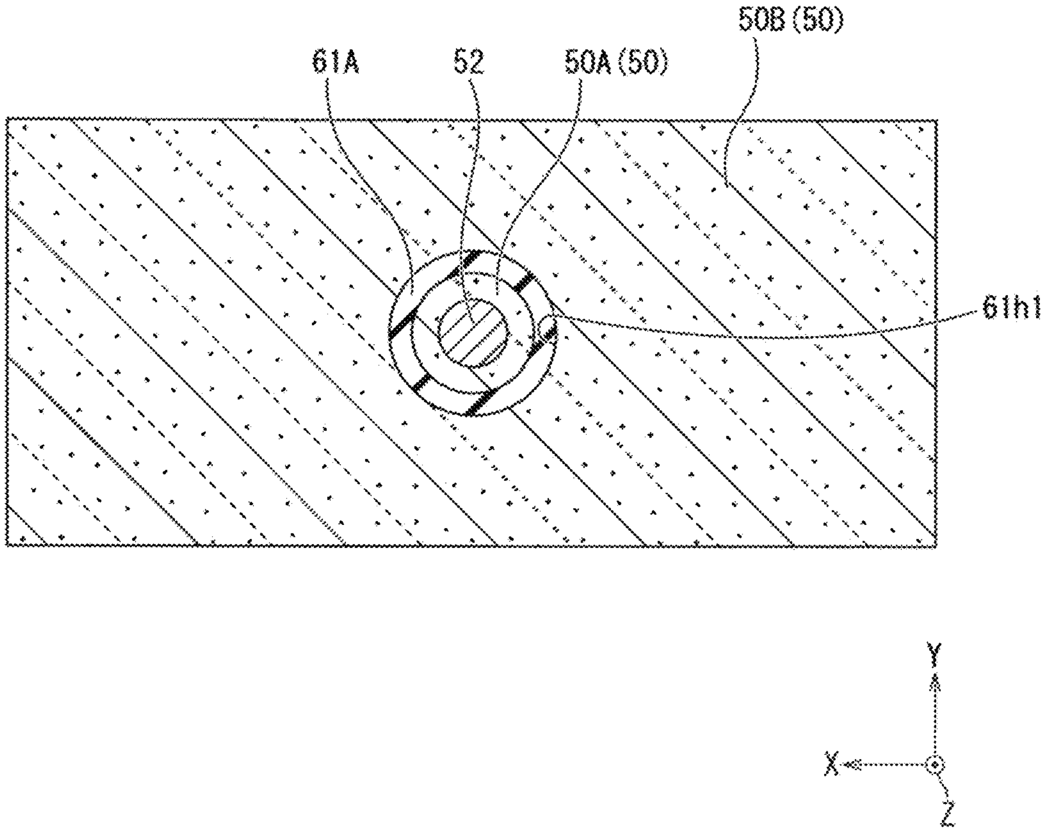

FIG. 104B is a lateral cross-sectional diagram depicting a cross-sectional structure in a cross-sectional view taken along a section line F-F in FIG. 104A.

Figure 105A:
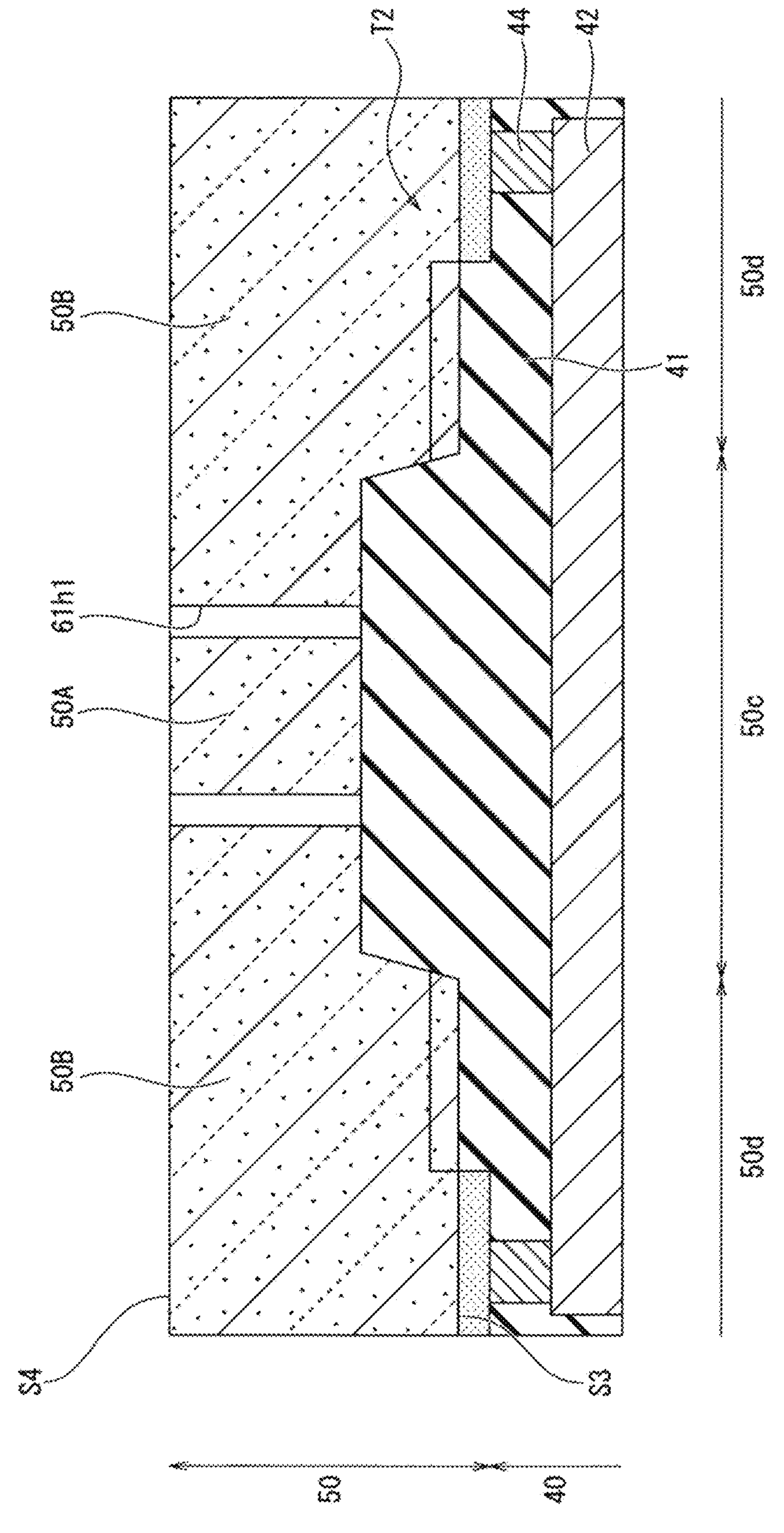

FIG. 105A is a step cross-sectional diagram depicting a manufacturing method of the optical detection device according to the fourteenth embodiment of the present technology.

Figure 105B:
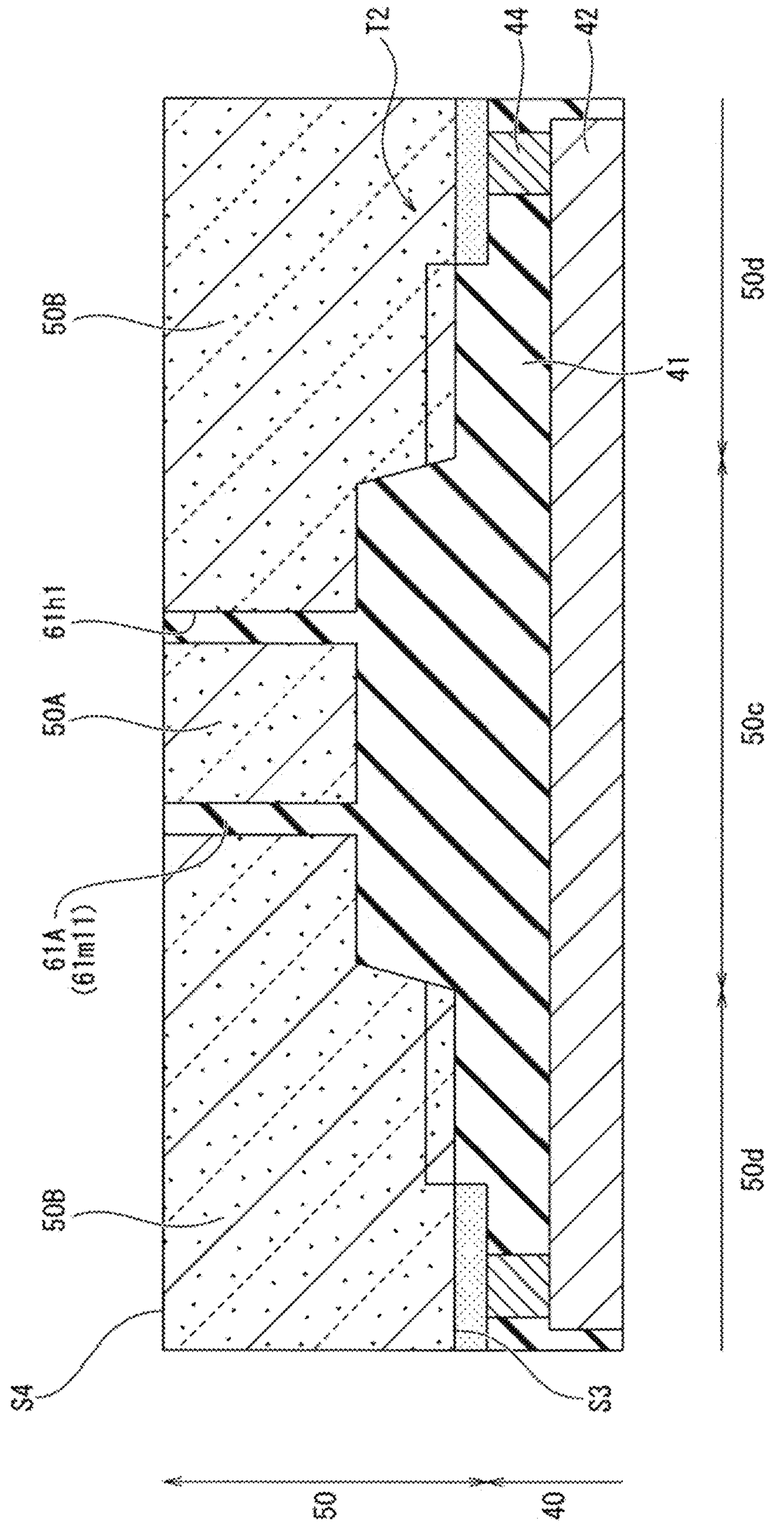

FIG. 105B is a step cross-sectional diagram continuing from FIG. 105A.

Figure 105C:
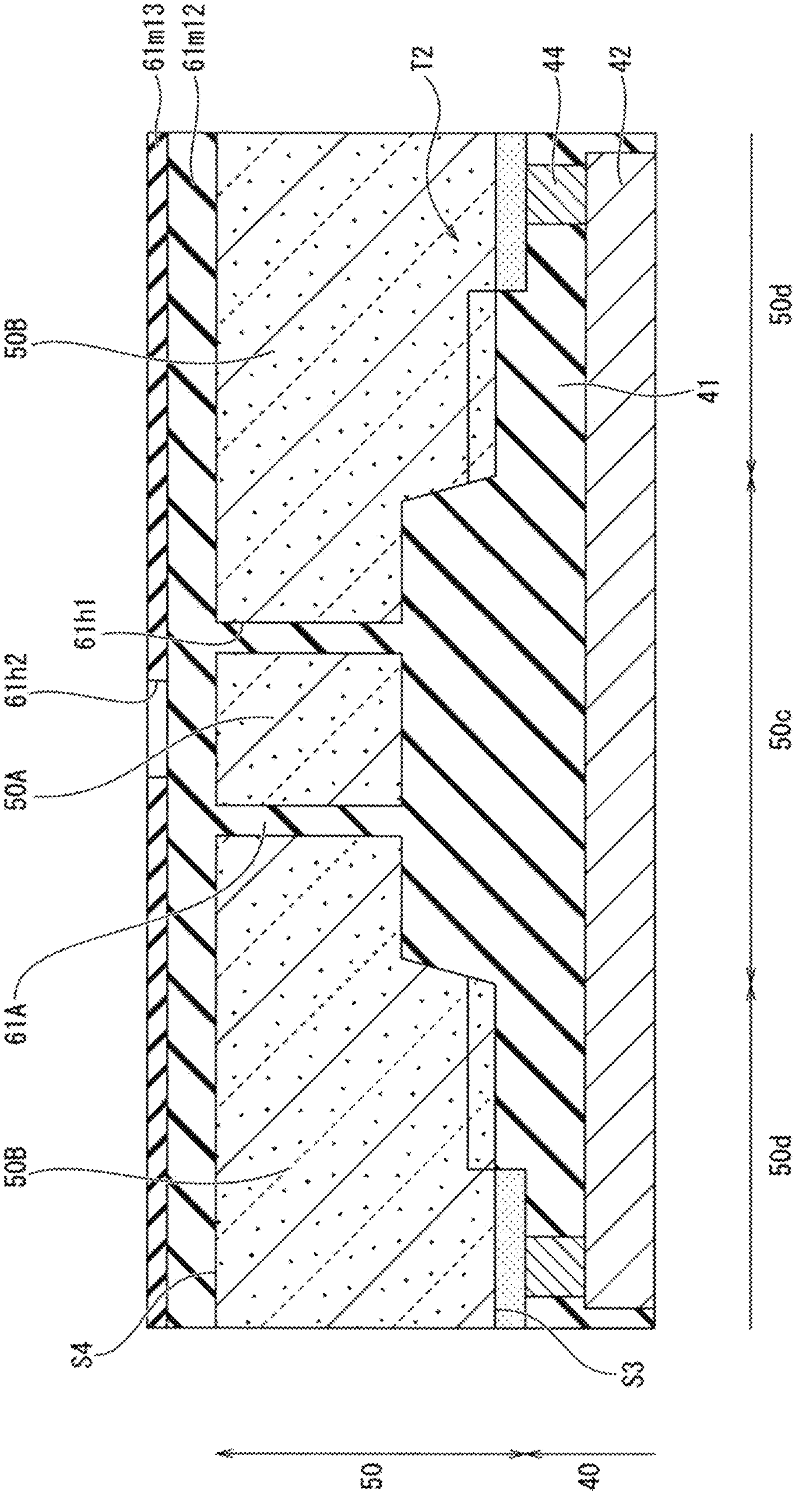

FIG. 105C is a step cross-sectional diagram continuing from FIG. 105B.

Figure 105D:
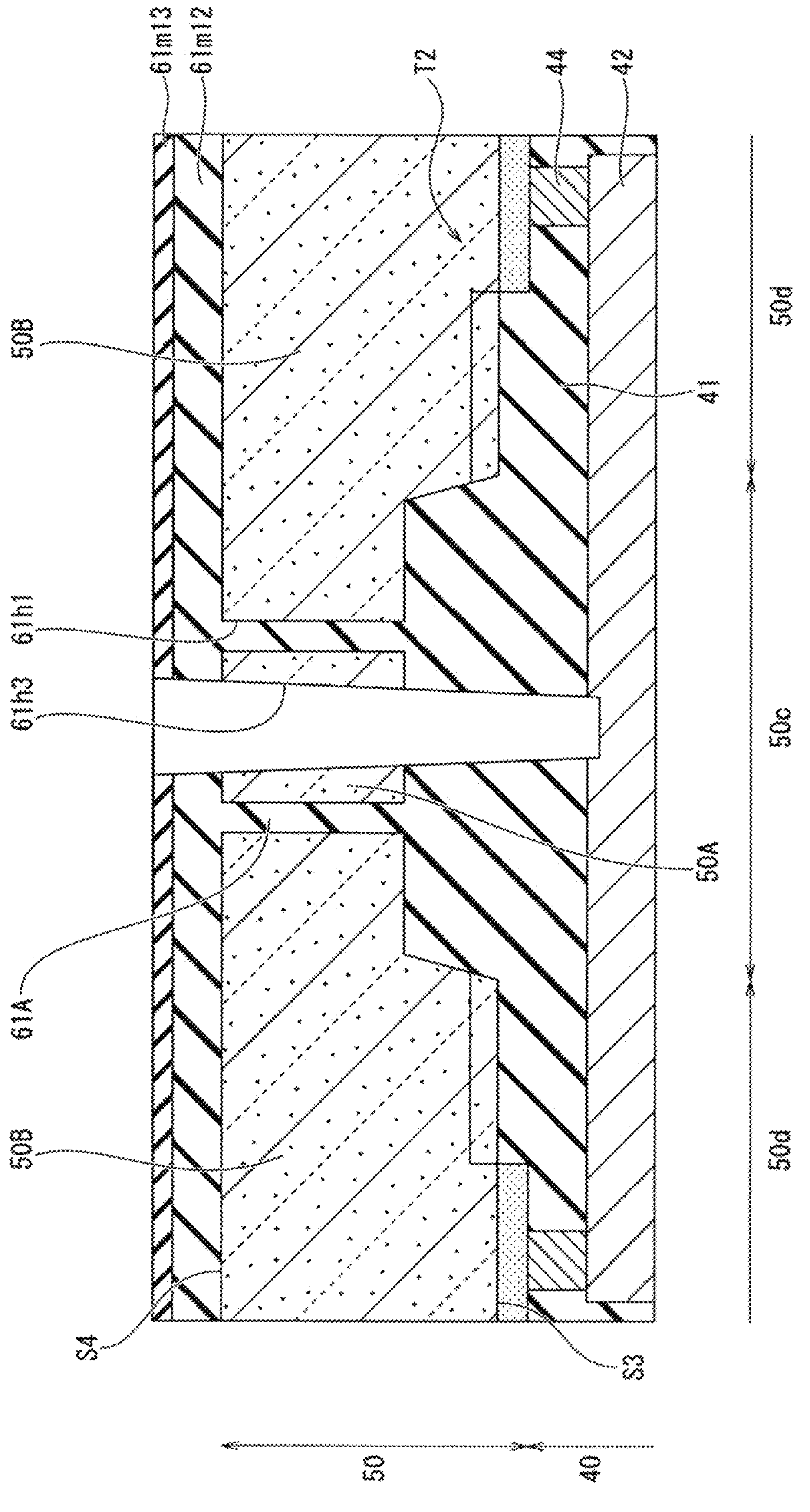

FIG. 105D is a step cross-sectional diagram continuing from FIG. 105C.

Figure 105E:
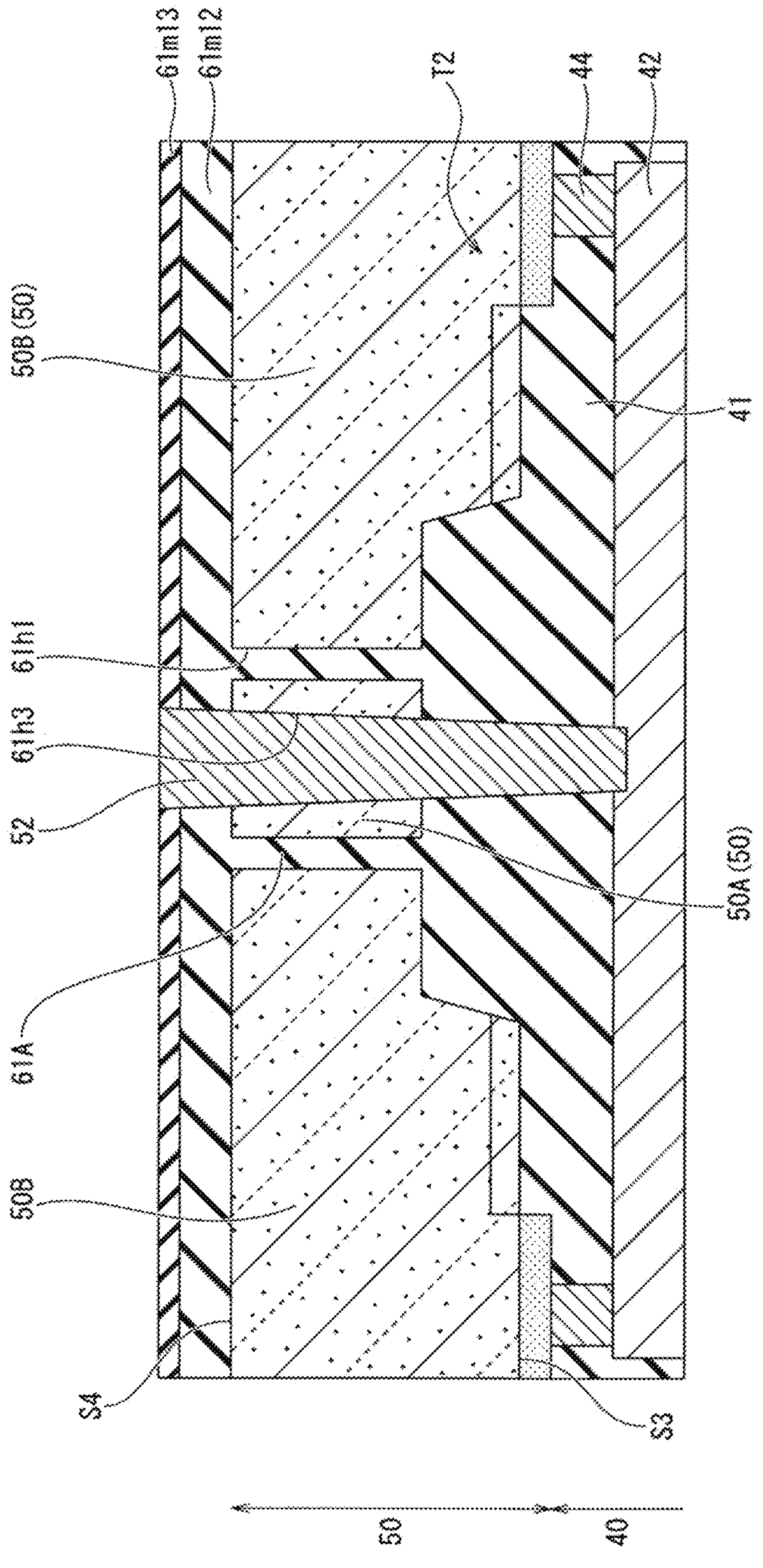

FIG. 105E is a step cross-sectional diagram continuing from FIG. 105D.

Figure 106:
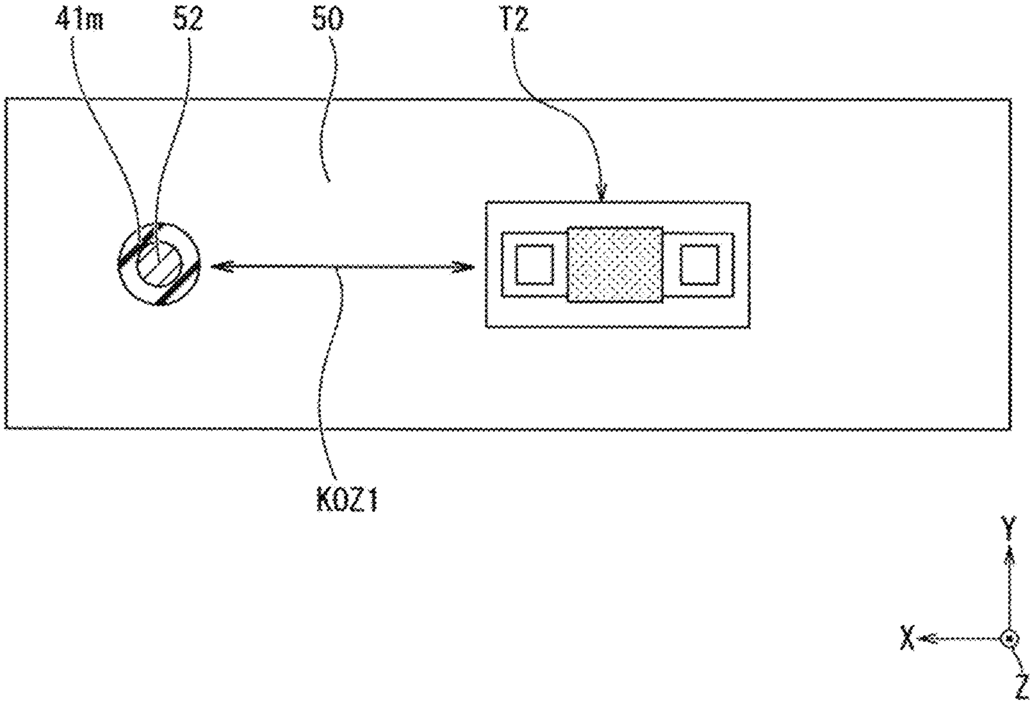

FIG. 106 is a plan diagram depicting a conventional arrangement relation between a second conductor and a transistor.

Figure 107:
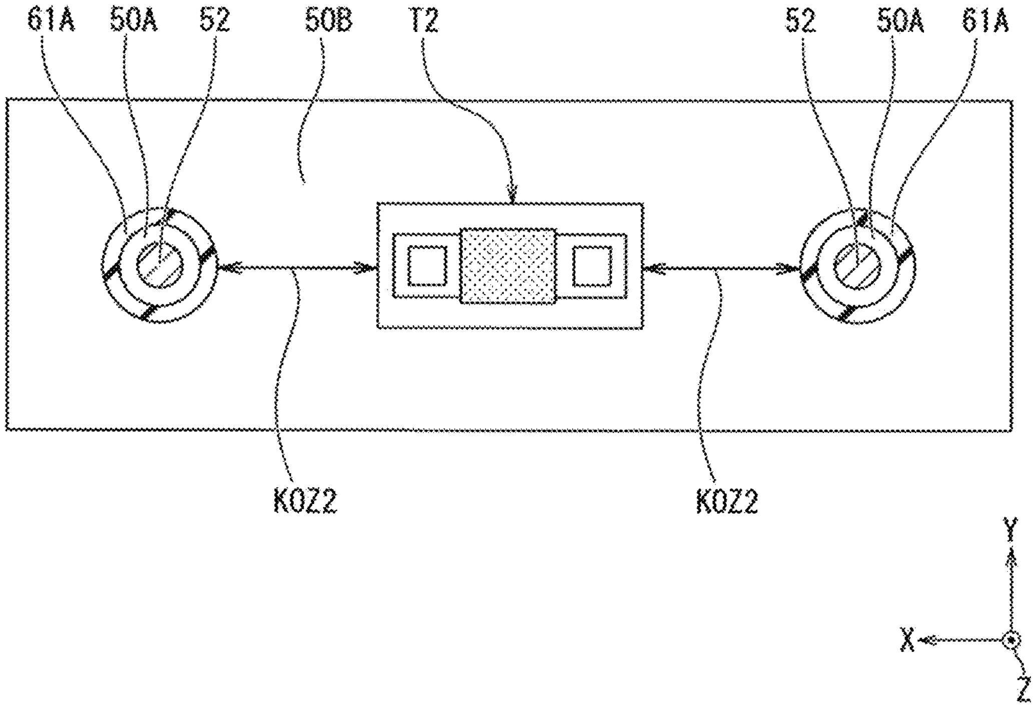

FIG. 107 is a plan diagram depicting an arrangement relation between the second conductor and a transistor of the optical detection device according to the fourteenth embodiment of the present technology.

Figure 108:
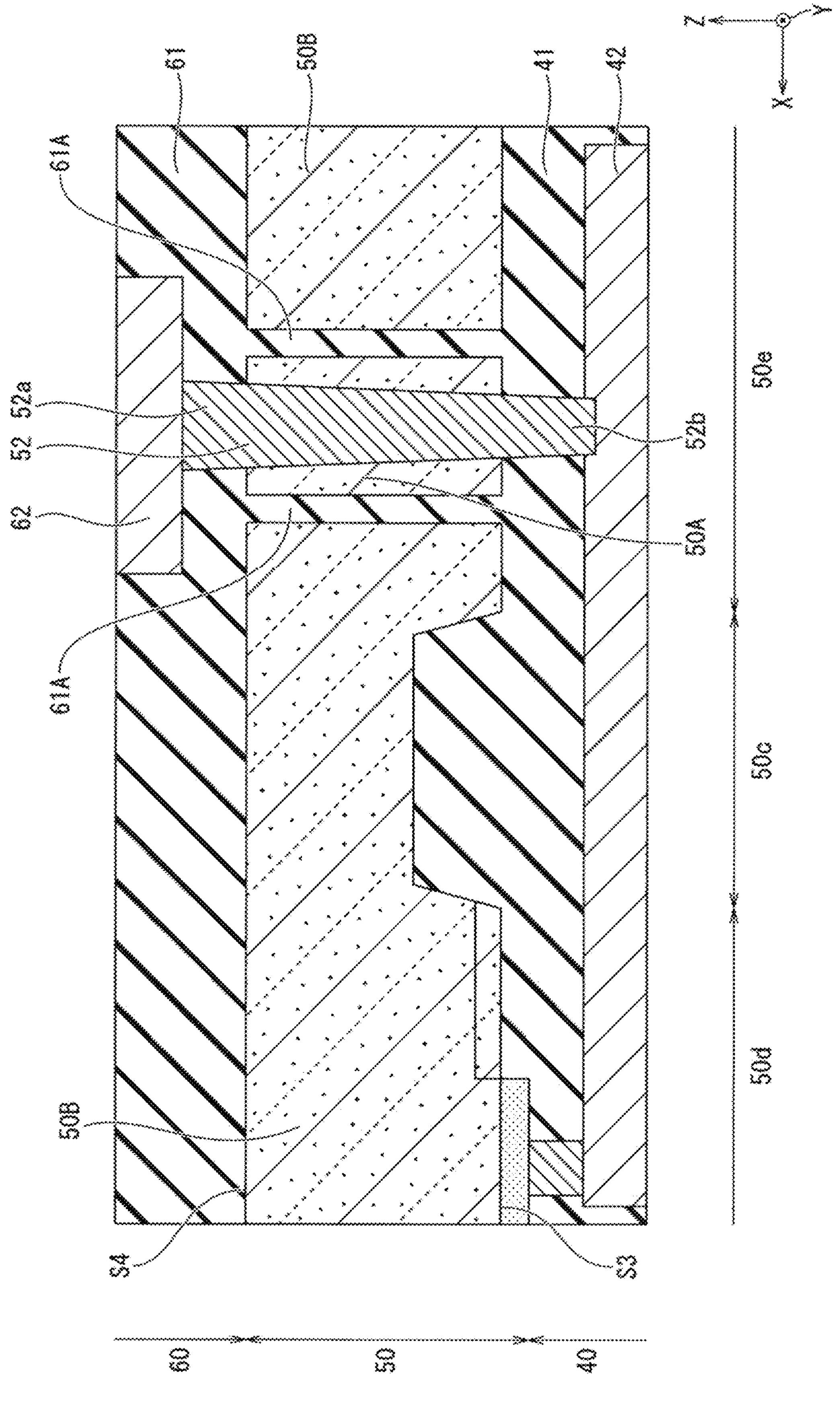

FIG. 108 is a longitudinal cross-sectional diagram depicting a cross-sectional structure of a second conductor included in an optical detection device according to modification 1 of the fourteenth embodiment of the present technology.

Figure 109A:
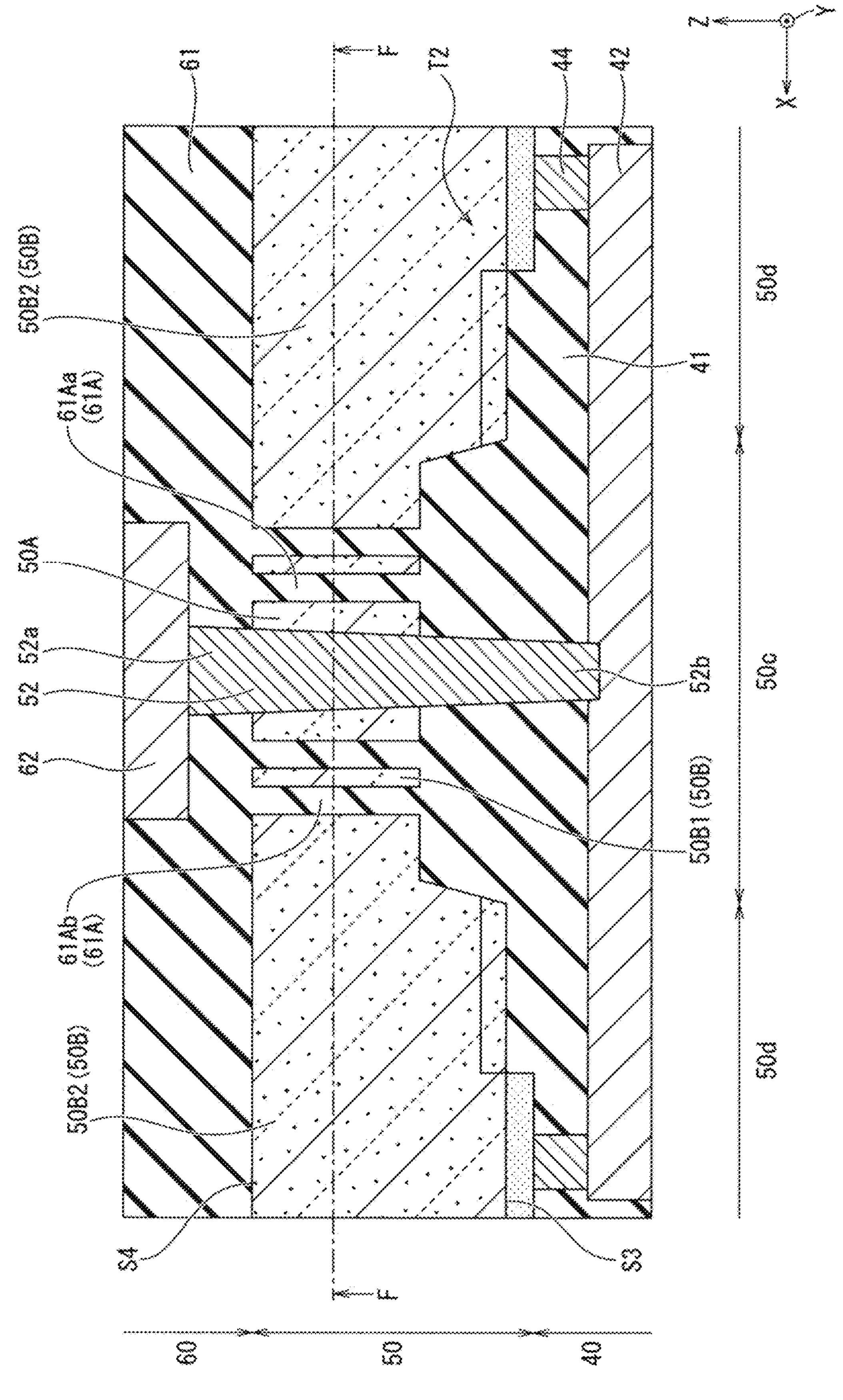

FIG. 109A is a longitudinal cross-sectional diagram depicting a cross-sectional structure of a second conductor included in an optical detection device according to modification 2 of the fourteenth embodiment of the present technology.

Figure 109B:
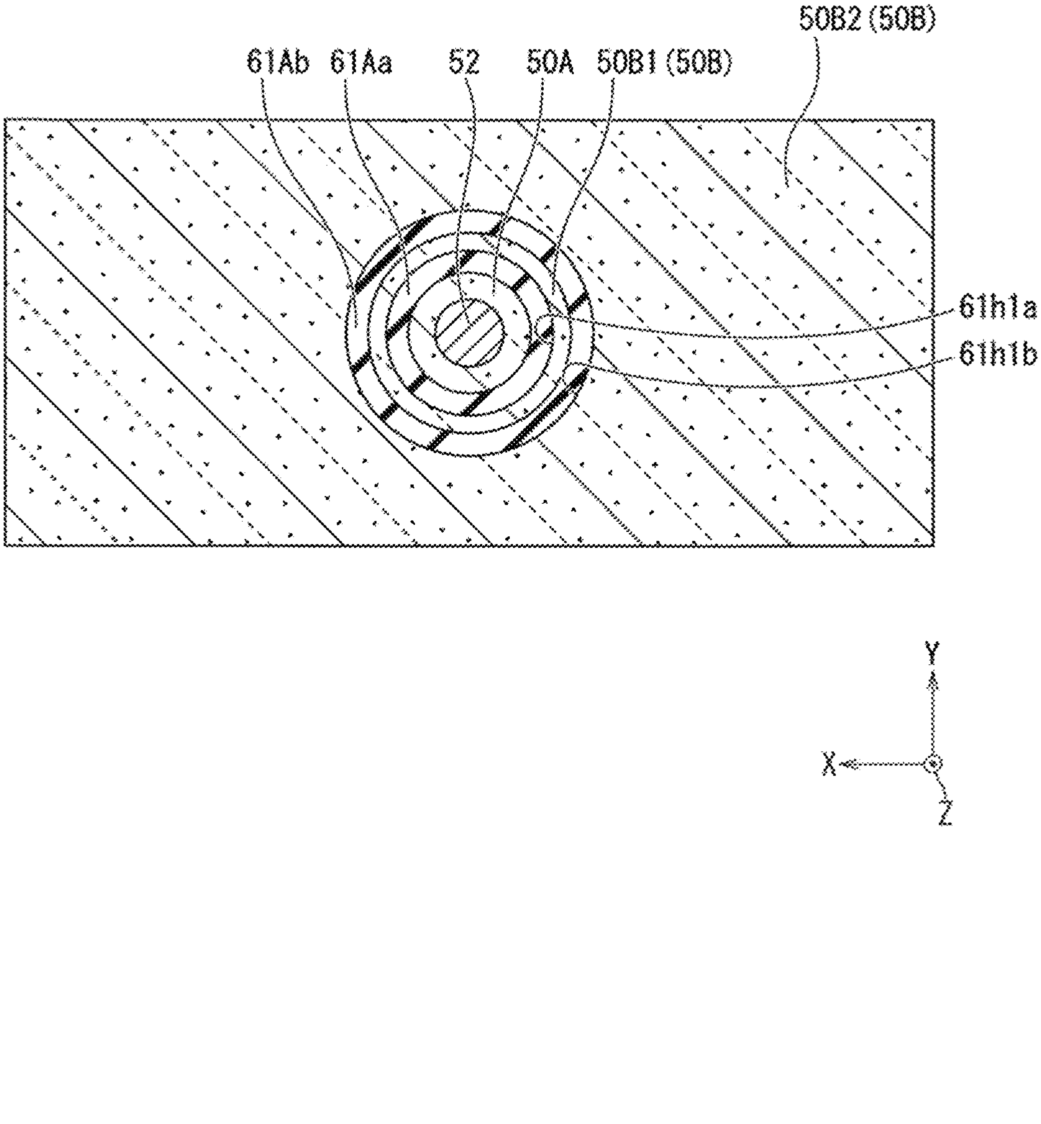

FIG. 109B is a lateral cross-sectional diagram depicting a cross-sectional structure in a cross-sectional view taken along a section line F-F in FIG. 109A.

Figure 110:
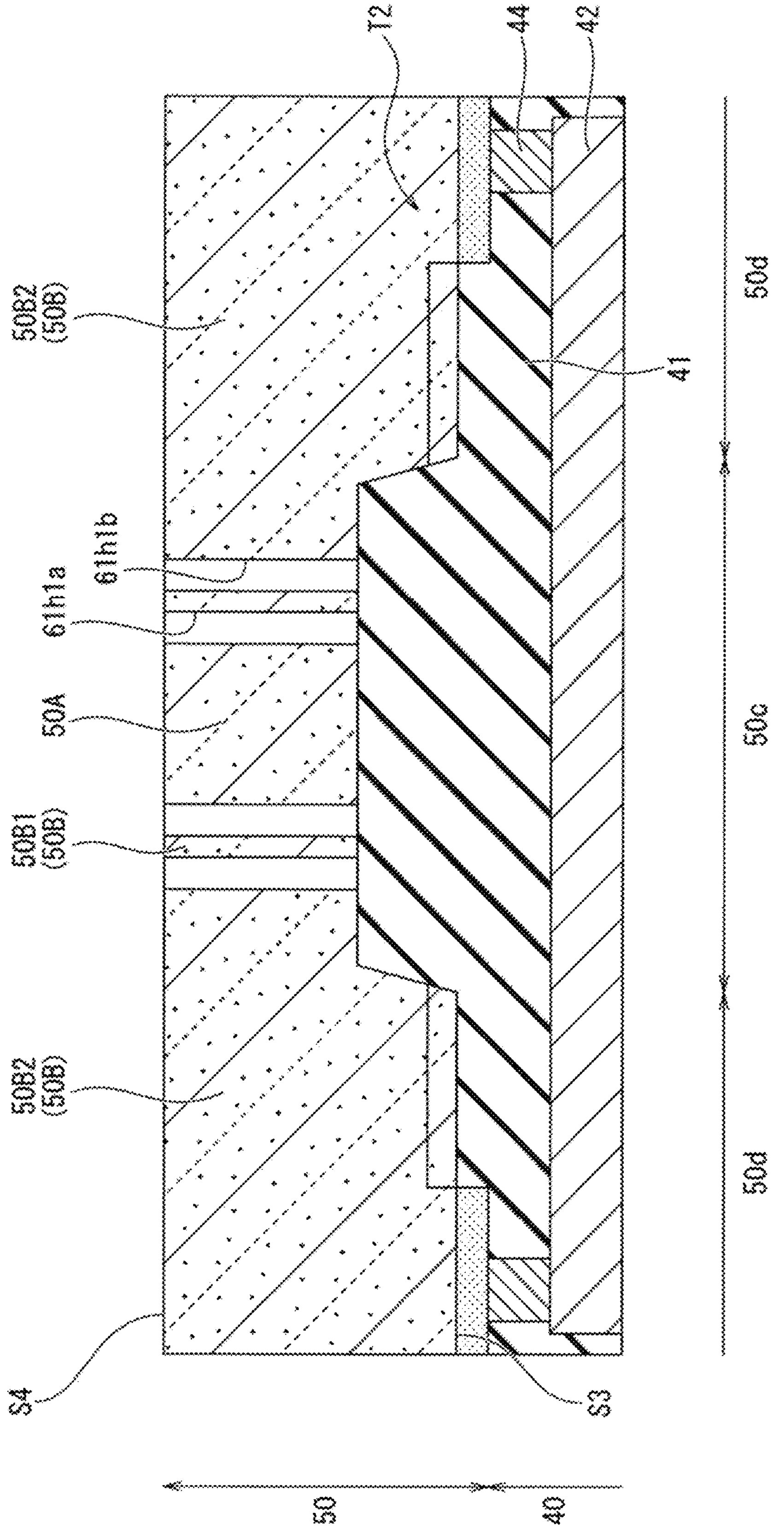

FIG. 110 is a step cross-sectional diagram depicting a manufacturing method of the optical detection device according to modification 2 of the fourteenth embodiment of the present technology.

Figure 111A:
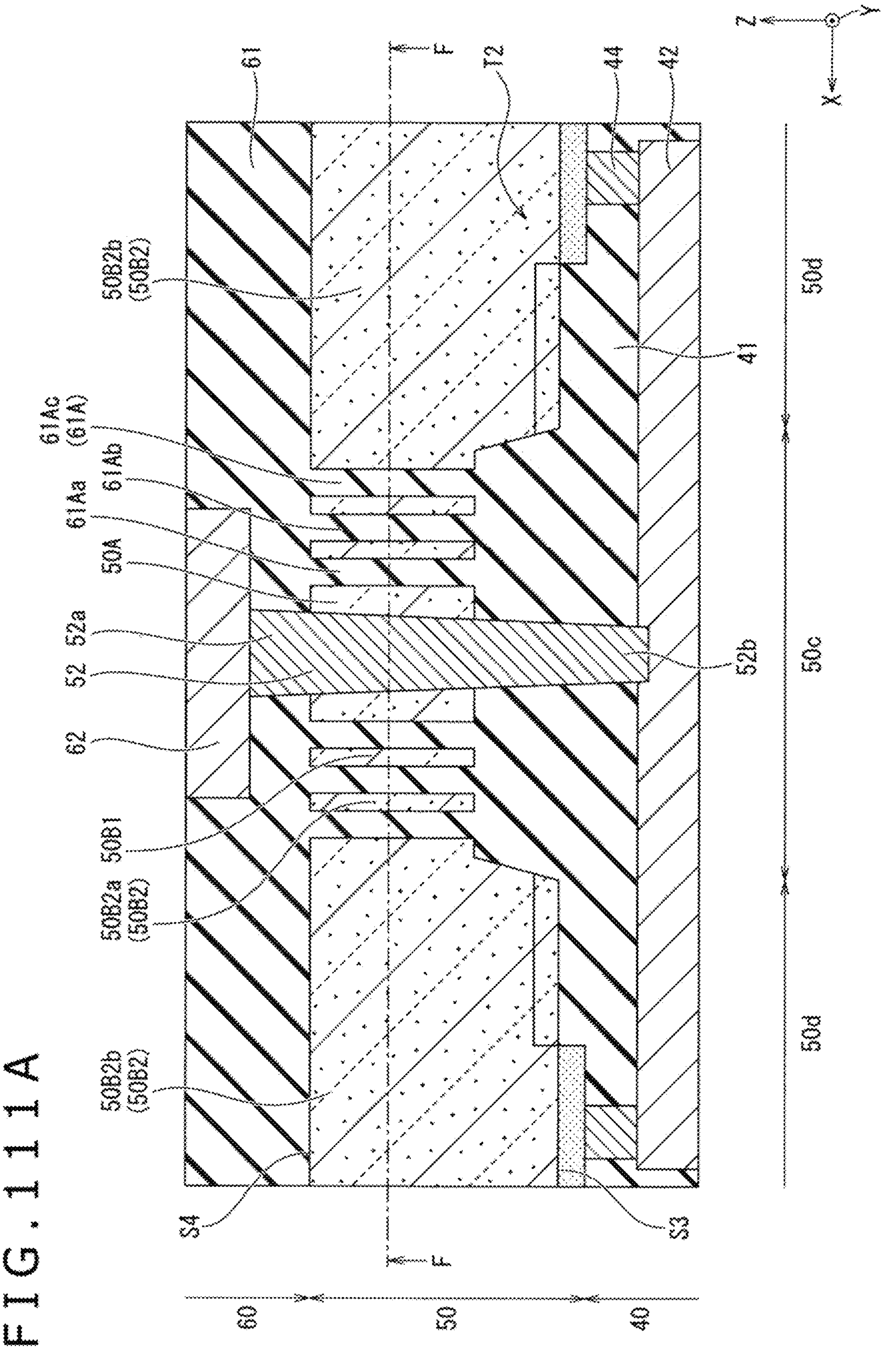

FIG. 111A is a longitudinal cross-sectional diagram depicting a cross-sectional structure of a second conductor included in an optical detection device according to modification 3 of the fourteenth embodiment of the present technology.

Figure 111B:
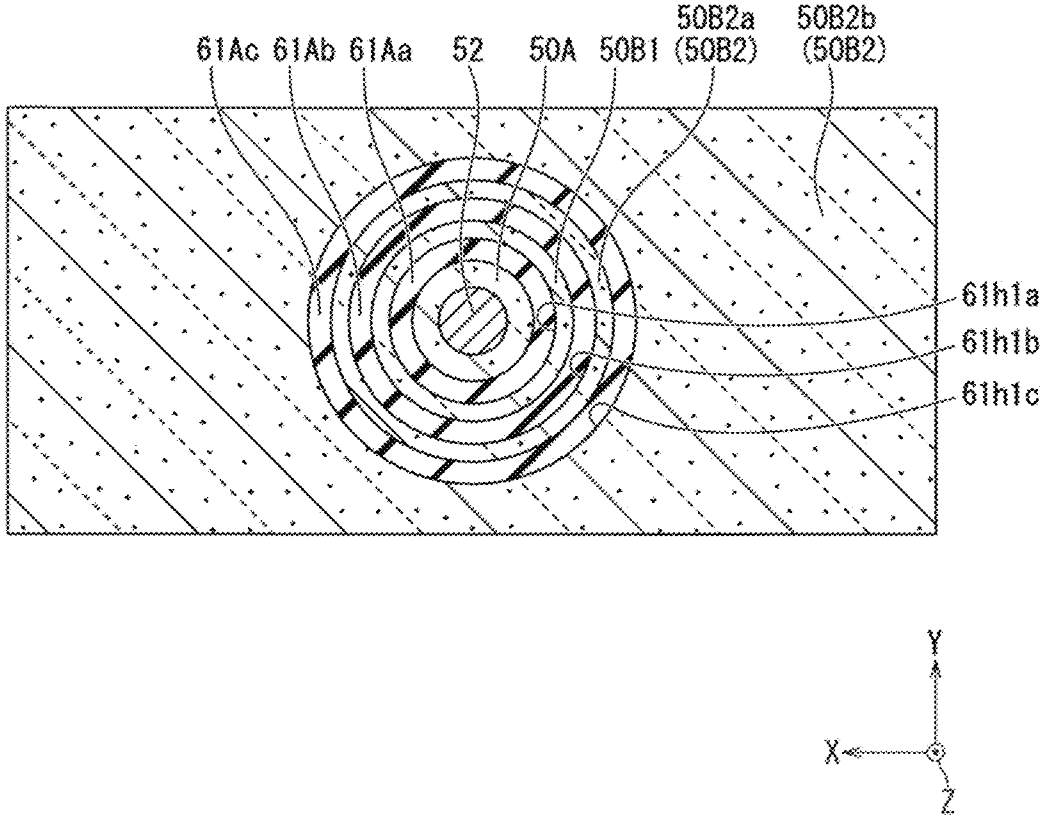

FIG. 111B is a lateral cross-sectional diagram depicting a cross-sectional structure in a cross-sectional view taken along a section line F-F in FIG. 111A.

Figure 112:
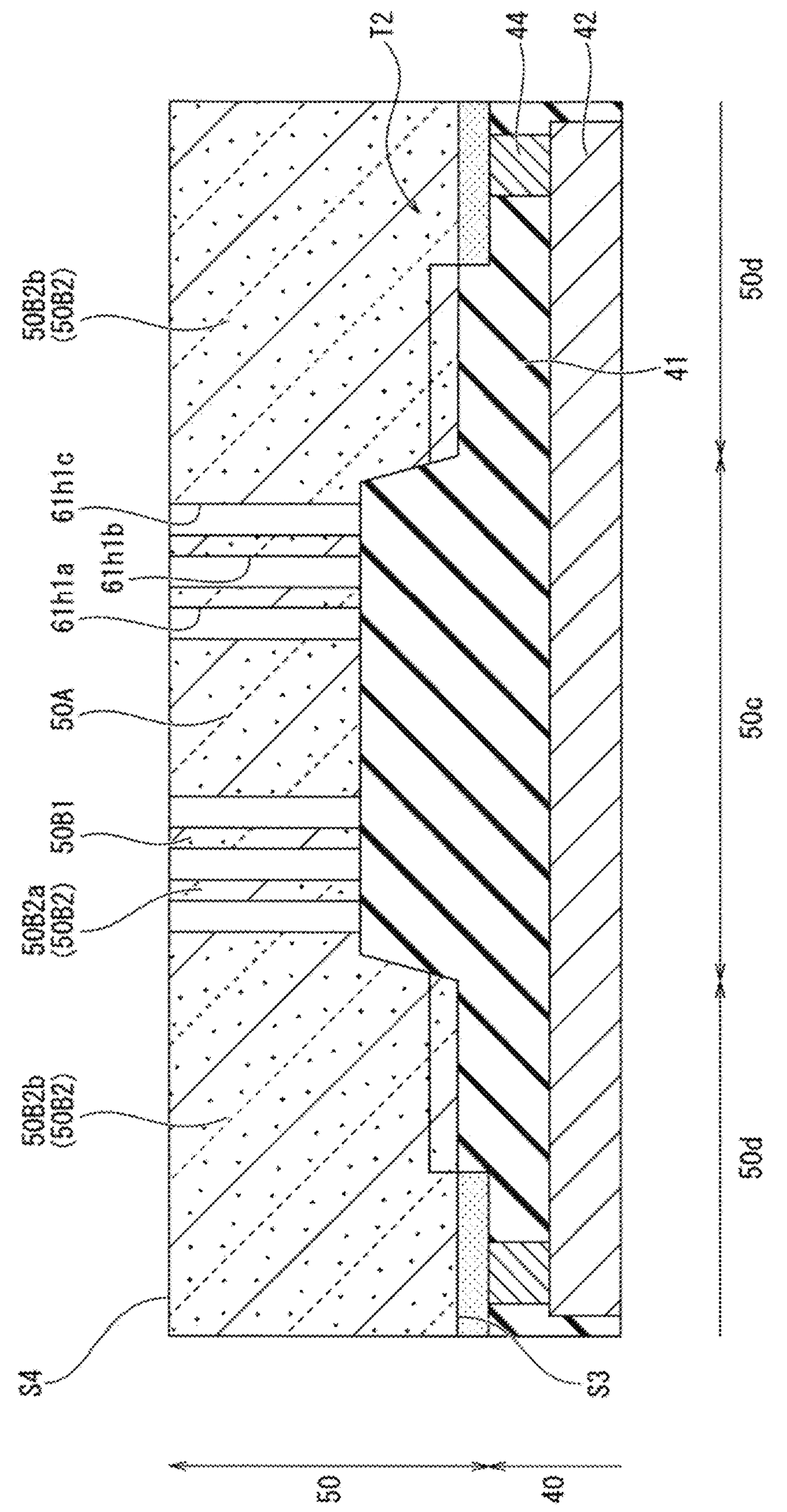

FIG. 112 is a step cross-sectional diagram depicting a manufacturing method of the optical detection device according to modification 3 of the fourteenth embodiment of the present technology.

Figure 113:
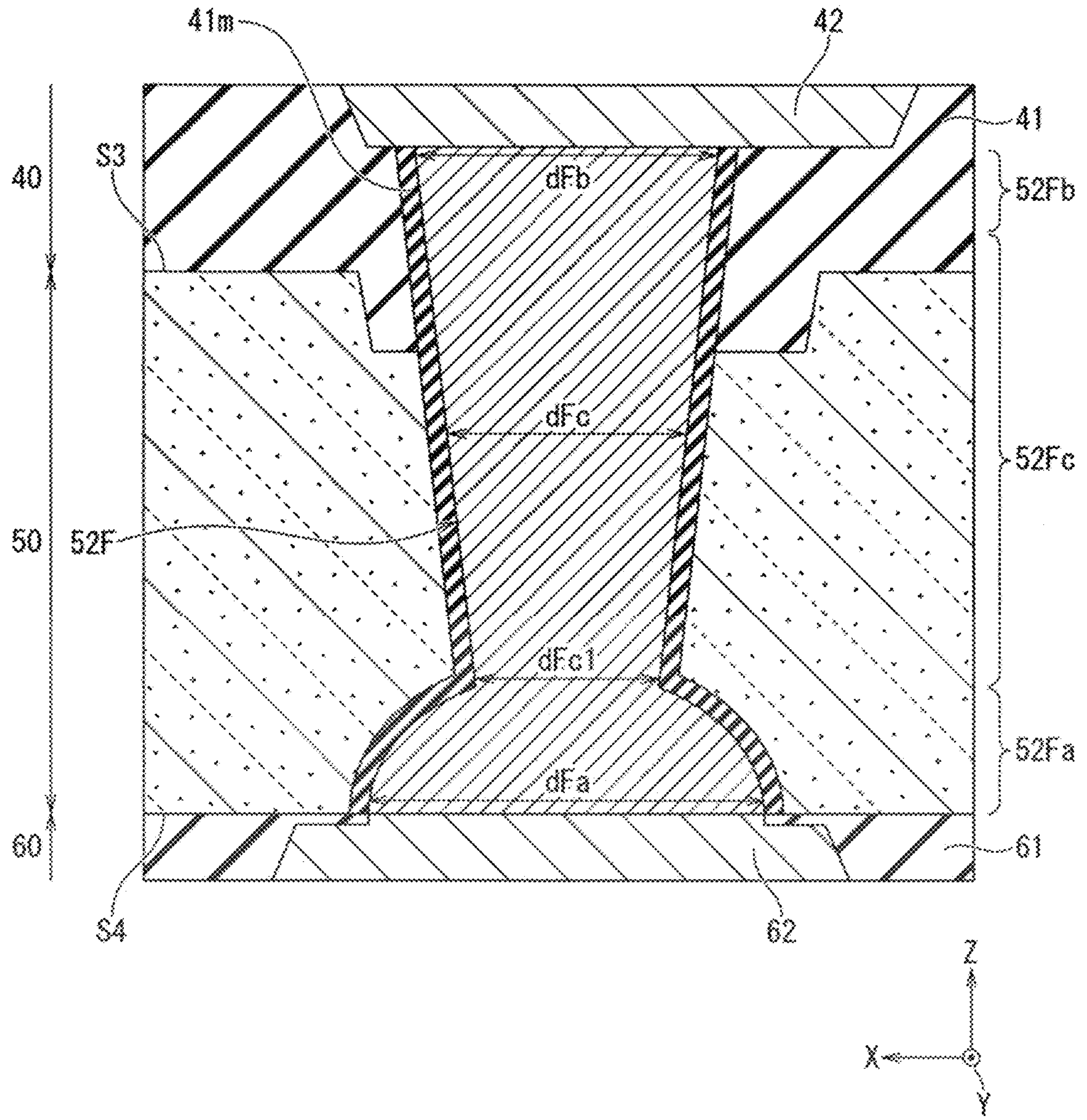

FIG. 113 is a longitudinal cross-sectional diagram depicting a cross-sectional structure of a second conductor included in an optical detection device according to a fifteenth embodiment of the present technology.

Figure 114A:
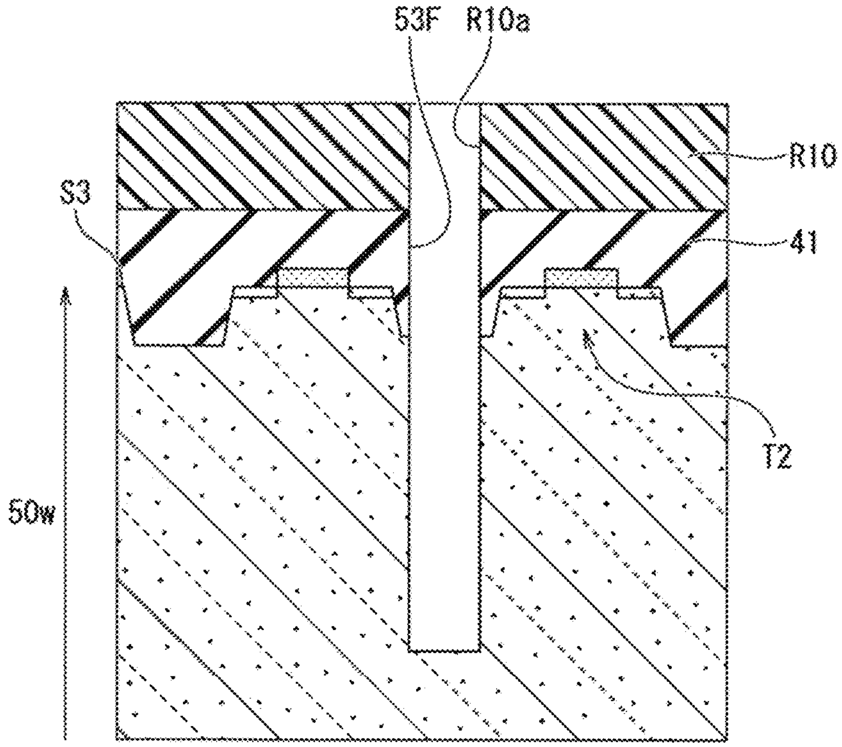

FIG. 114A is a step cross-sectional diagram depicting a manufacturing method of the optical detection device according to the fifteenth embodiment of the present technology.

Figure 114B:
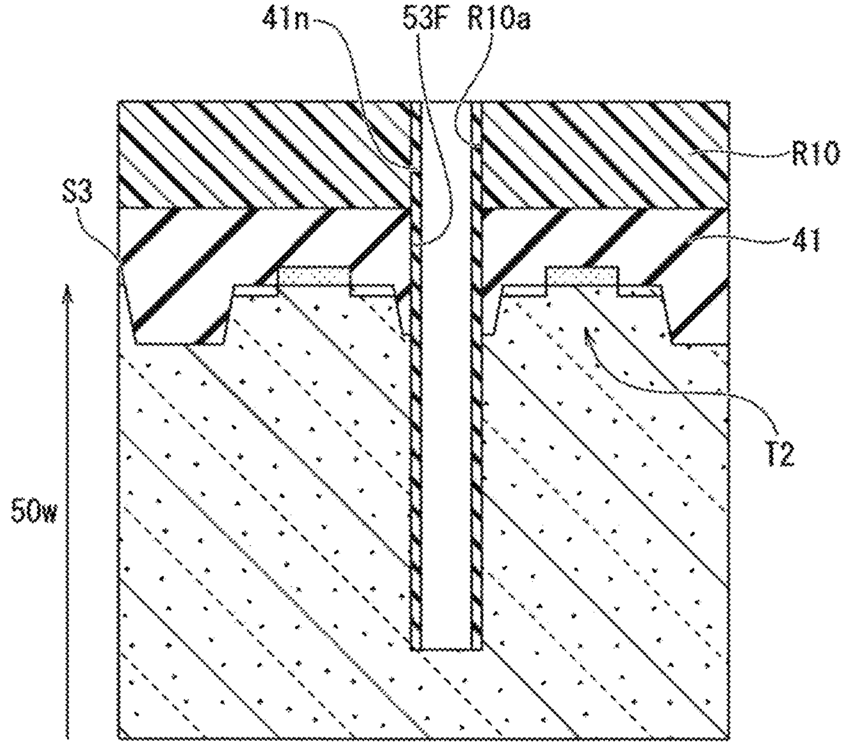

FIG. 114B is a step cross-sectional diagram continuing from FIG. 114A.

Figure 114C:
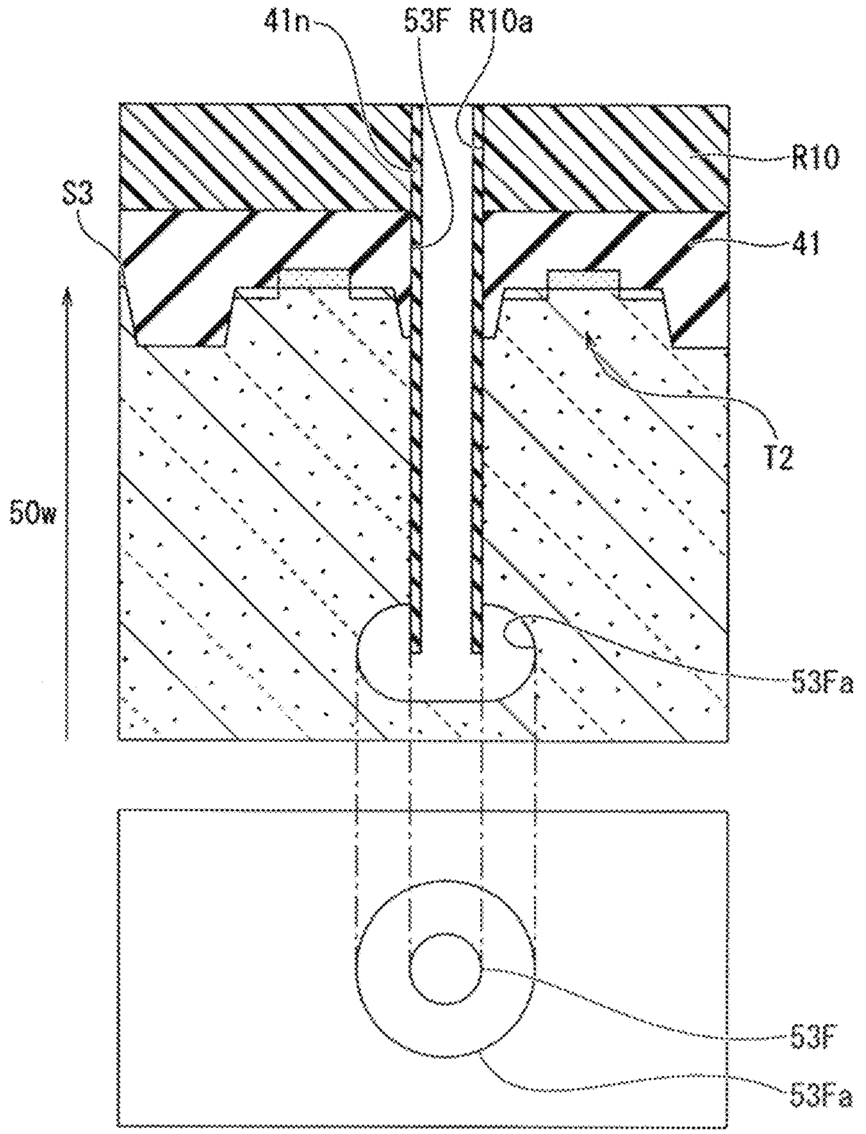

FIG. 114C is a step cross-sectional diagram continuing from FIG. 114B.

Figure 114D:
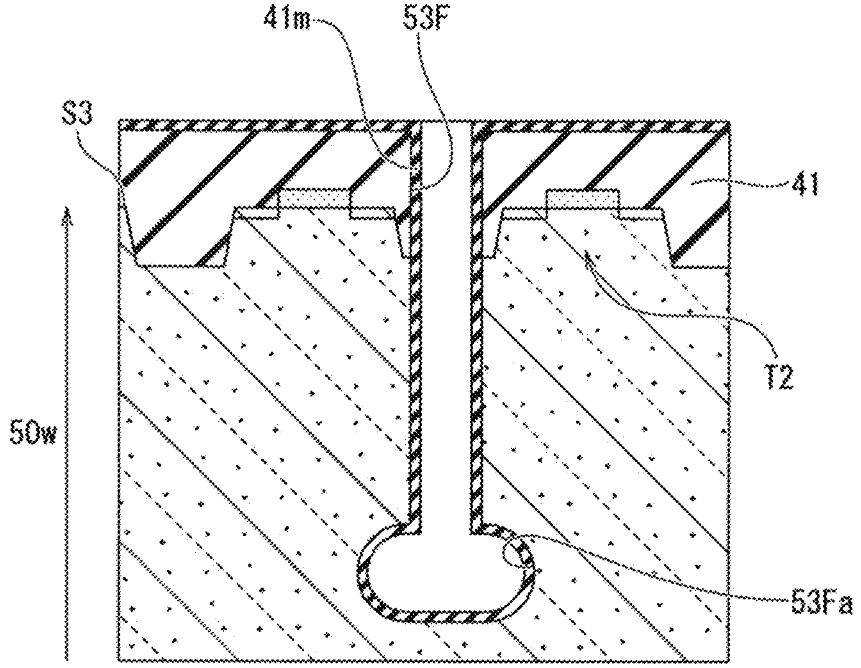

FIG. 114D is a step cross-sectional diagram continuing from FIG. 114C.

Figure 114E:
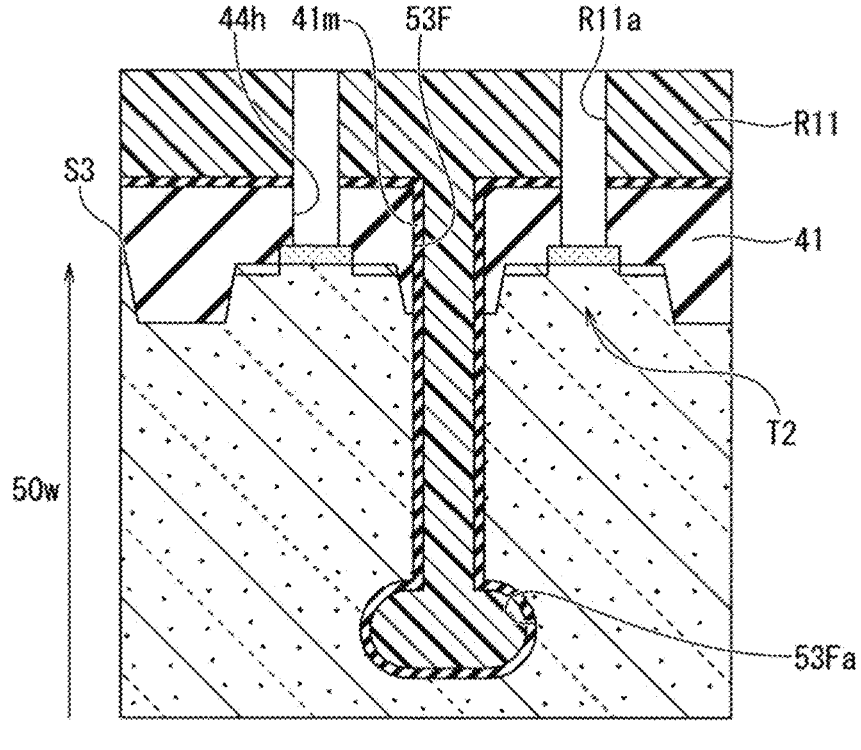

FIG. 114E is a step cross-sectional diagram continuing from FIG. 114D.

Figure 114F:
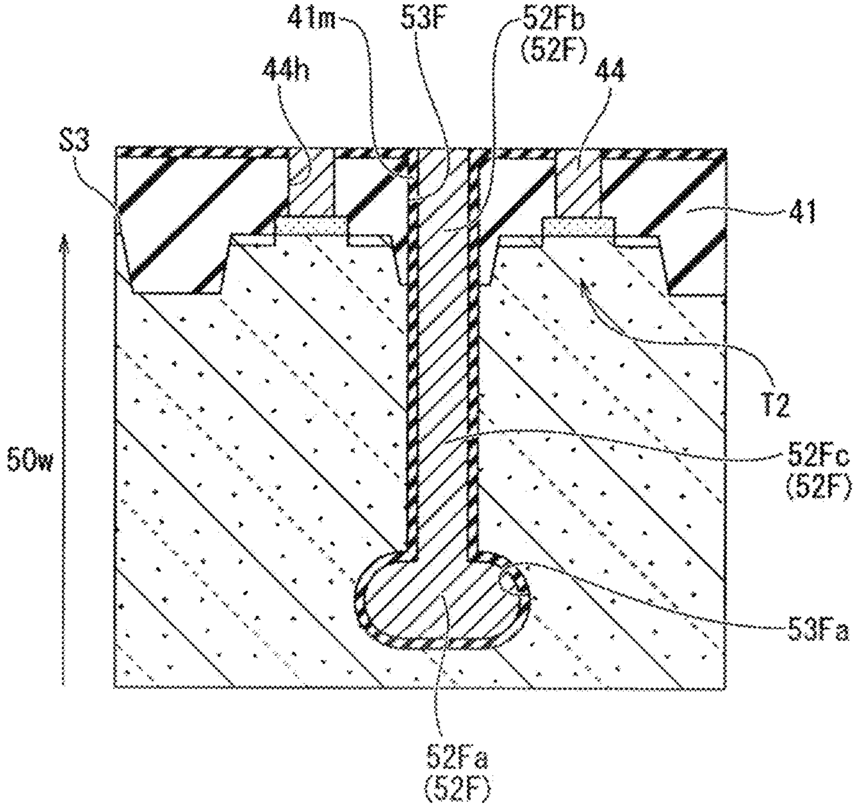

FIG. 114F is a step cross-sectional diagram continuing from FIG. 114E.

Figure 114G:
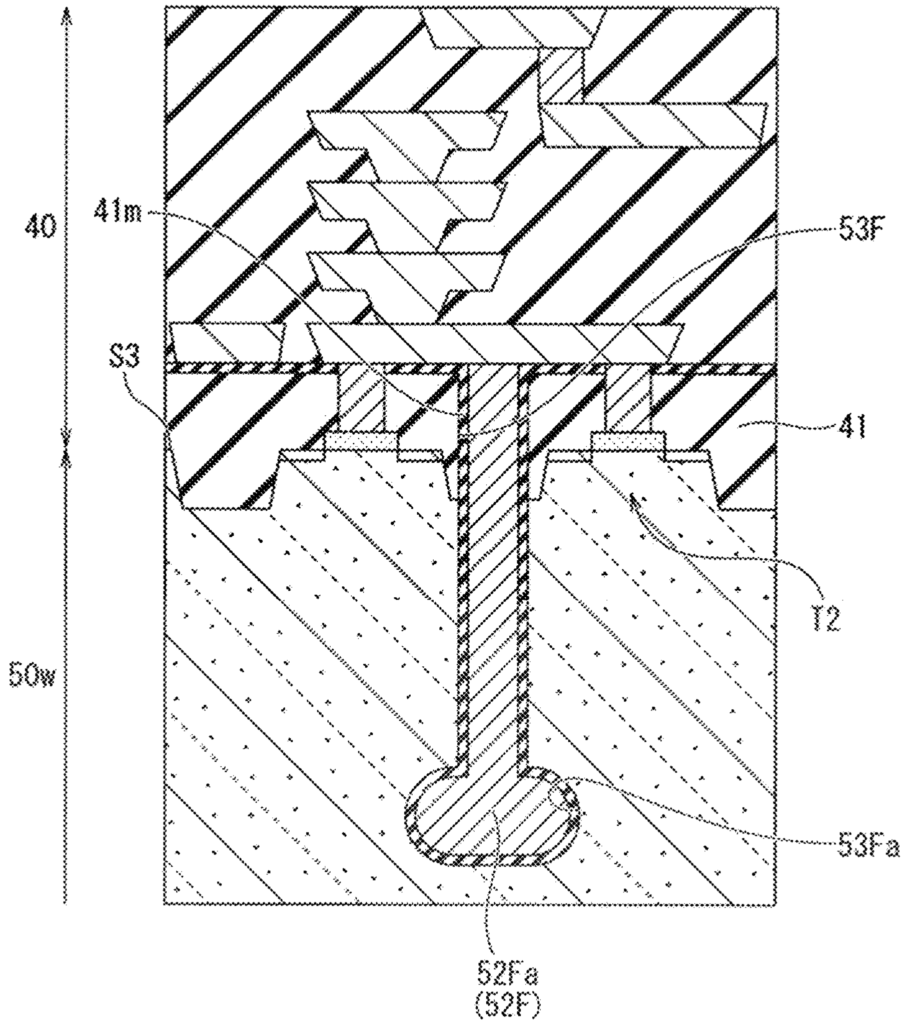

FIG. 114G is a step cross-sectional diagram continuing from FIG. 114F.

Figure 114H:
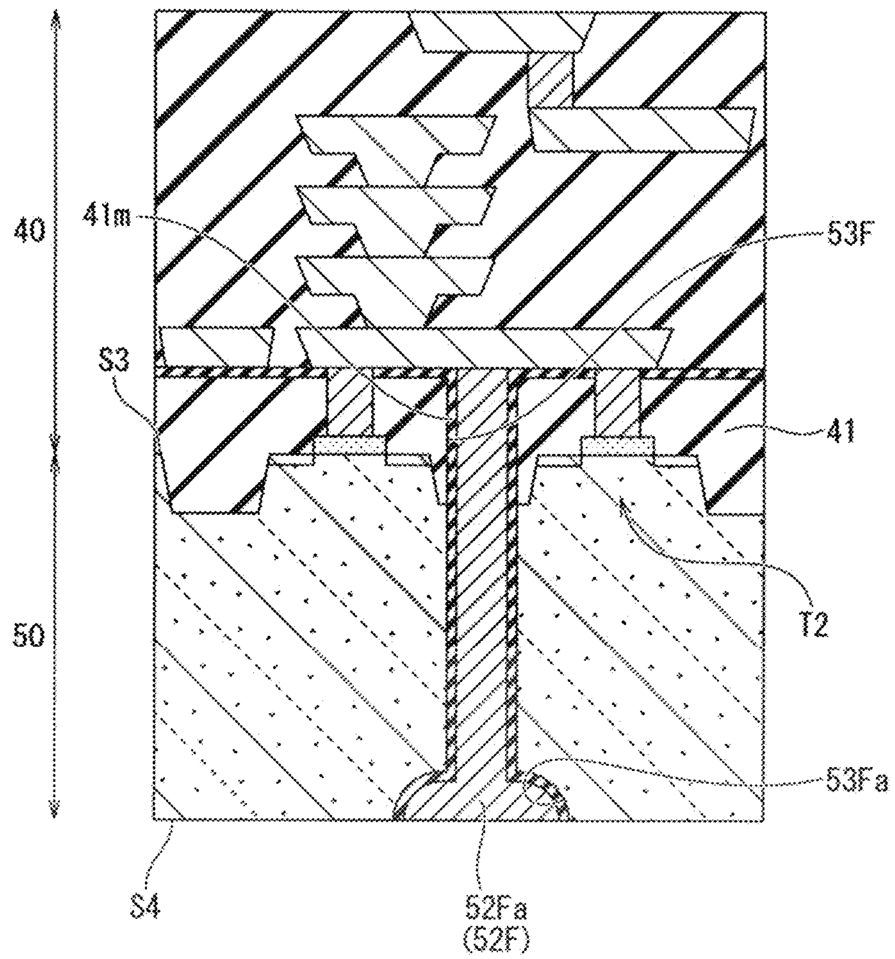

FIG. 114H is a step cross-sectional diagram continuing from FIG. 114G.

Figure 114I:
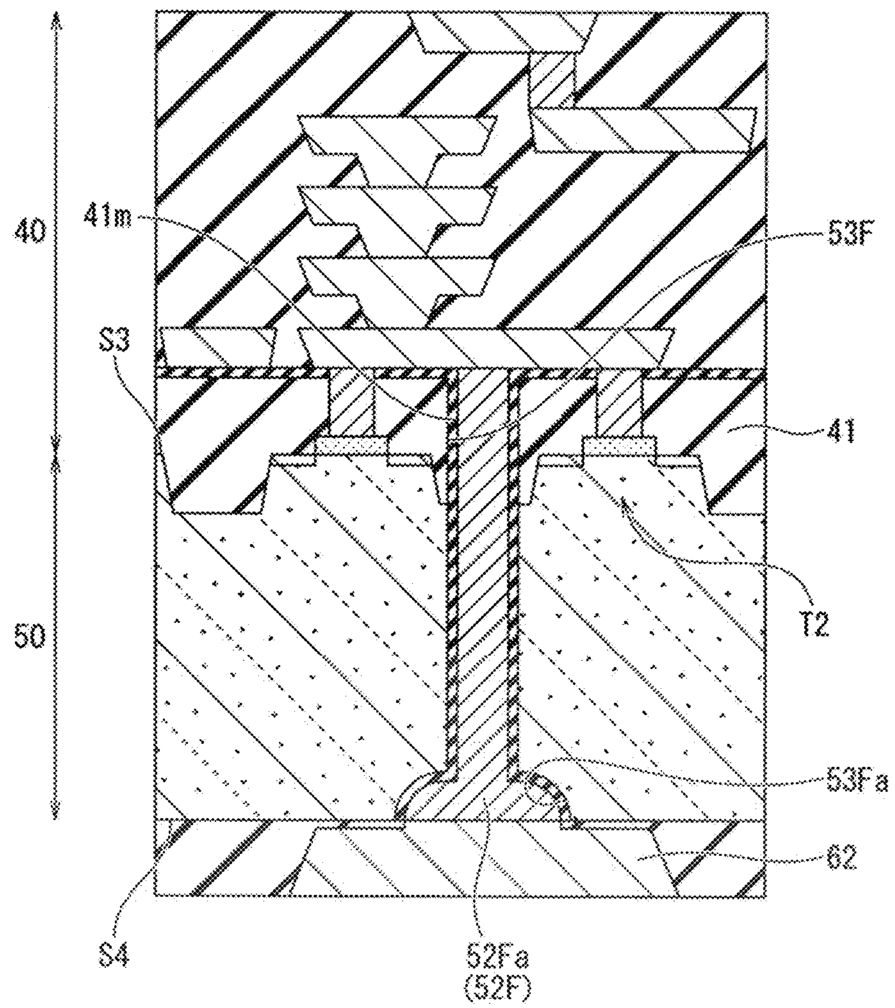

FIG. 114I is a step cross-sectional diagram continuing from FIG. 114H.

Figure 115:
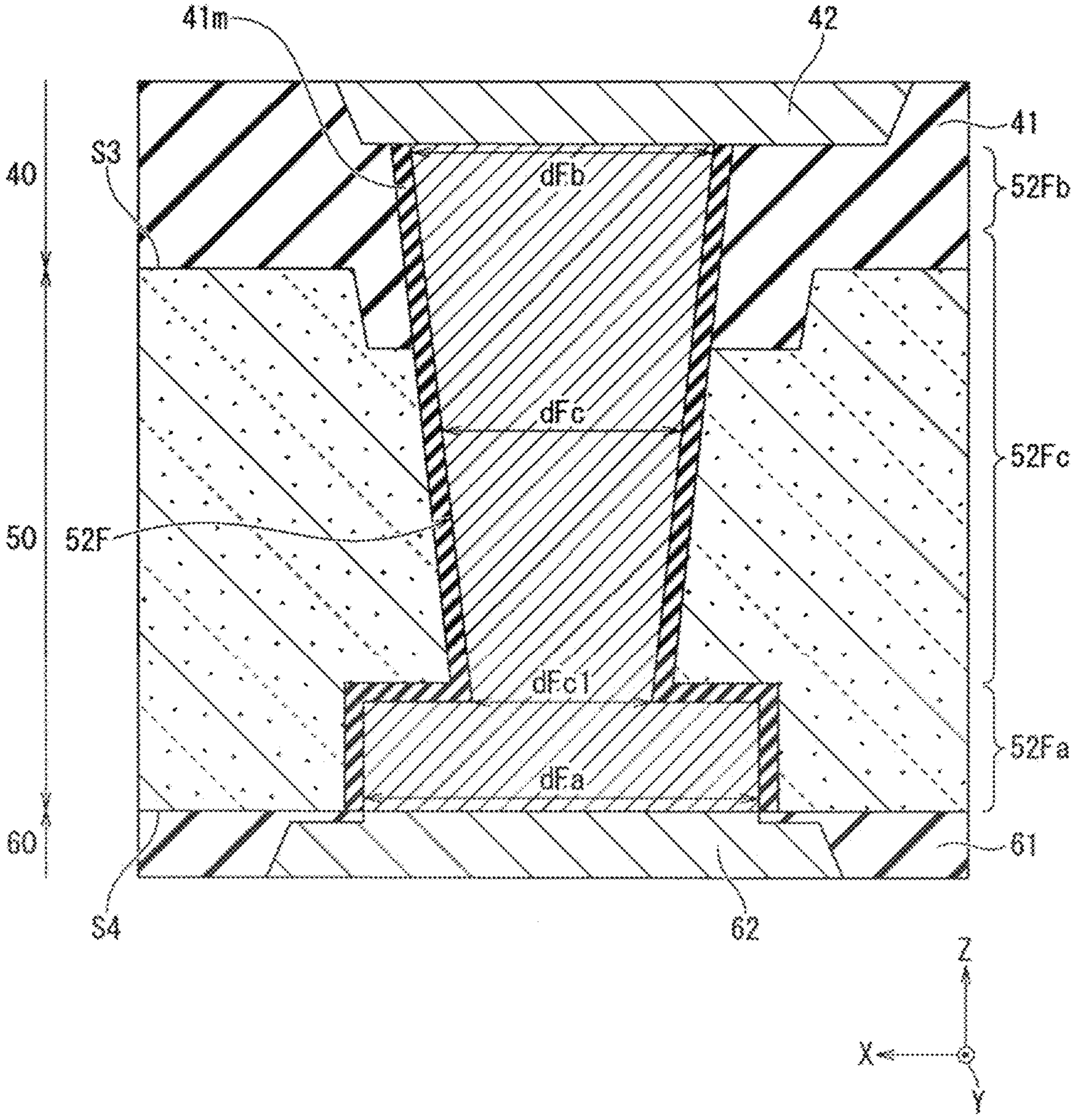

FIG. 115 is a longitudinal cross-sectional diagram depicting a cross-sectional structure of a second conductor included in an optical detection device according to modification 1 of the fifteenth embodiment of the present technology.

Figure 116:
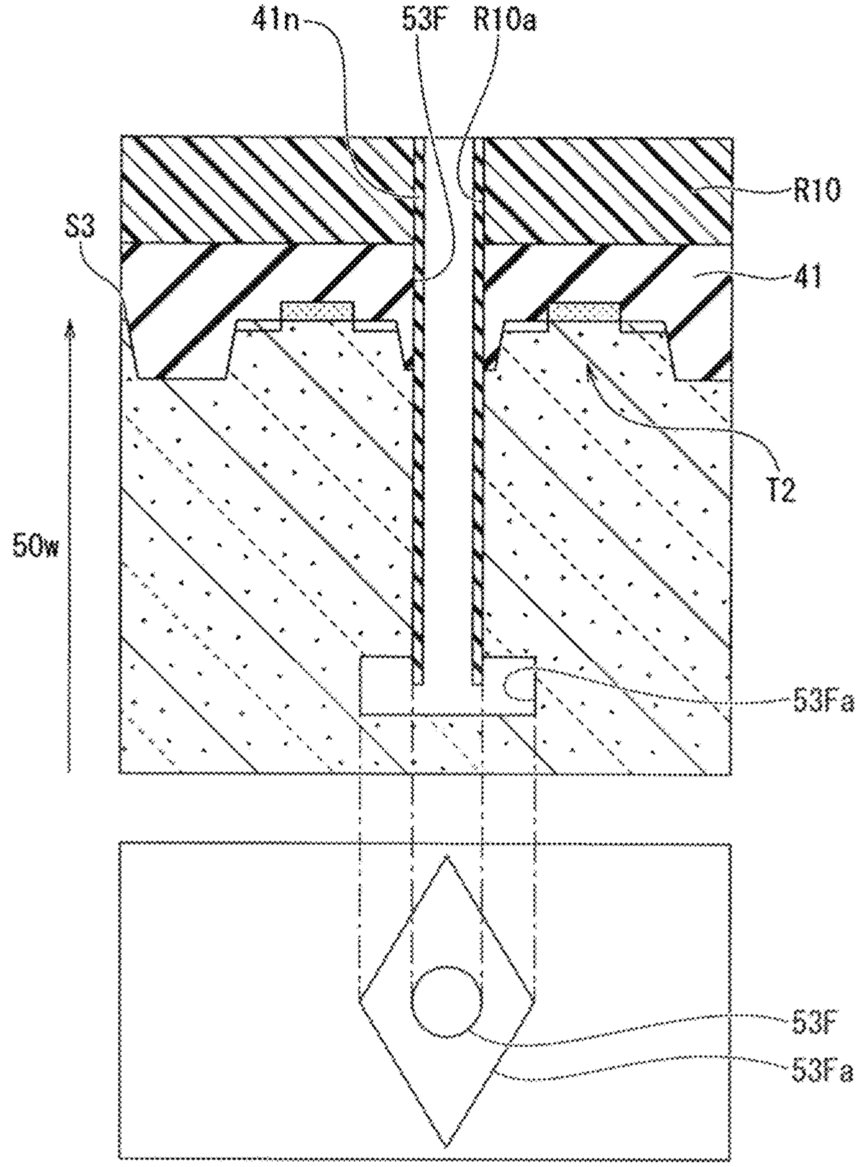

FIG. 116 is a step cross-sectional diagram depicting a manufacturing method of the optical detection device according to modification 1 of the fifteenth embodiment of the present technology.

Figure 117A:
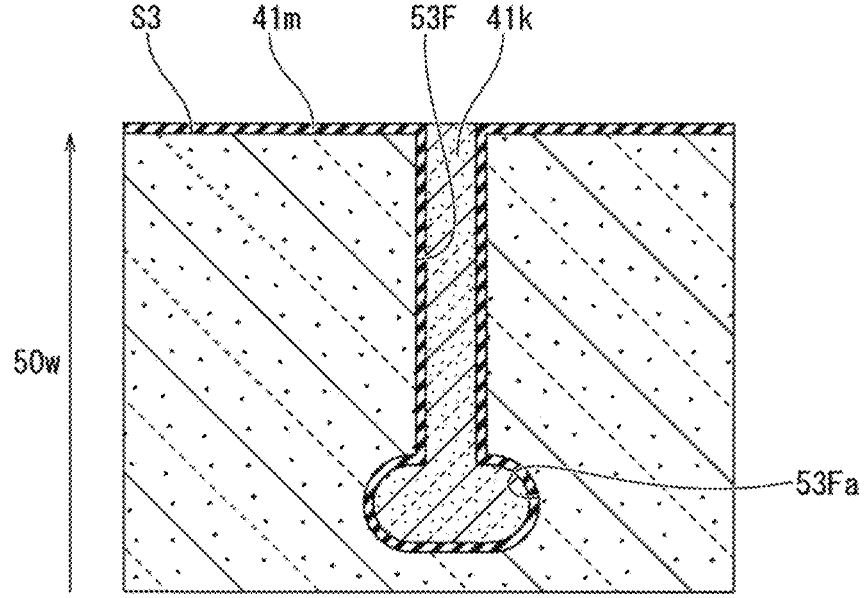

FIG. 117A is a step cross-sectional diagram depicting a manufacturing method of an optical detection device according to modification 2 of the fifteenth embodiment of the present technology.

Figure 117B:
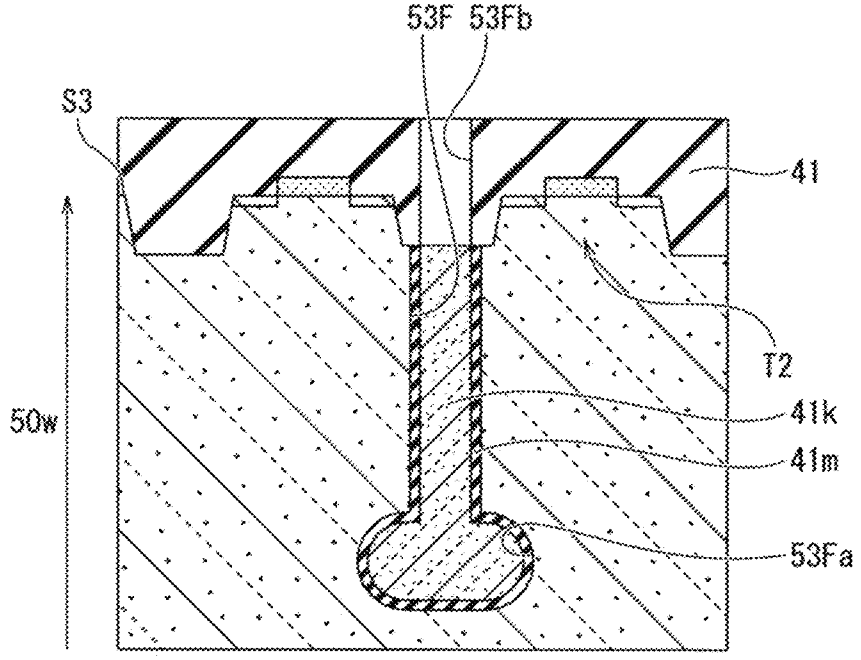

FIG. 117B is a step cross-sectional diagram continuing from FIG. 117A.

Figure 118:
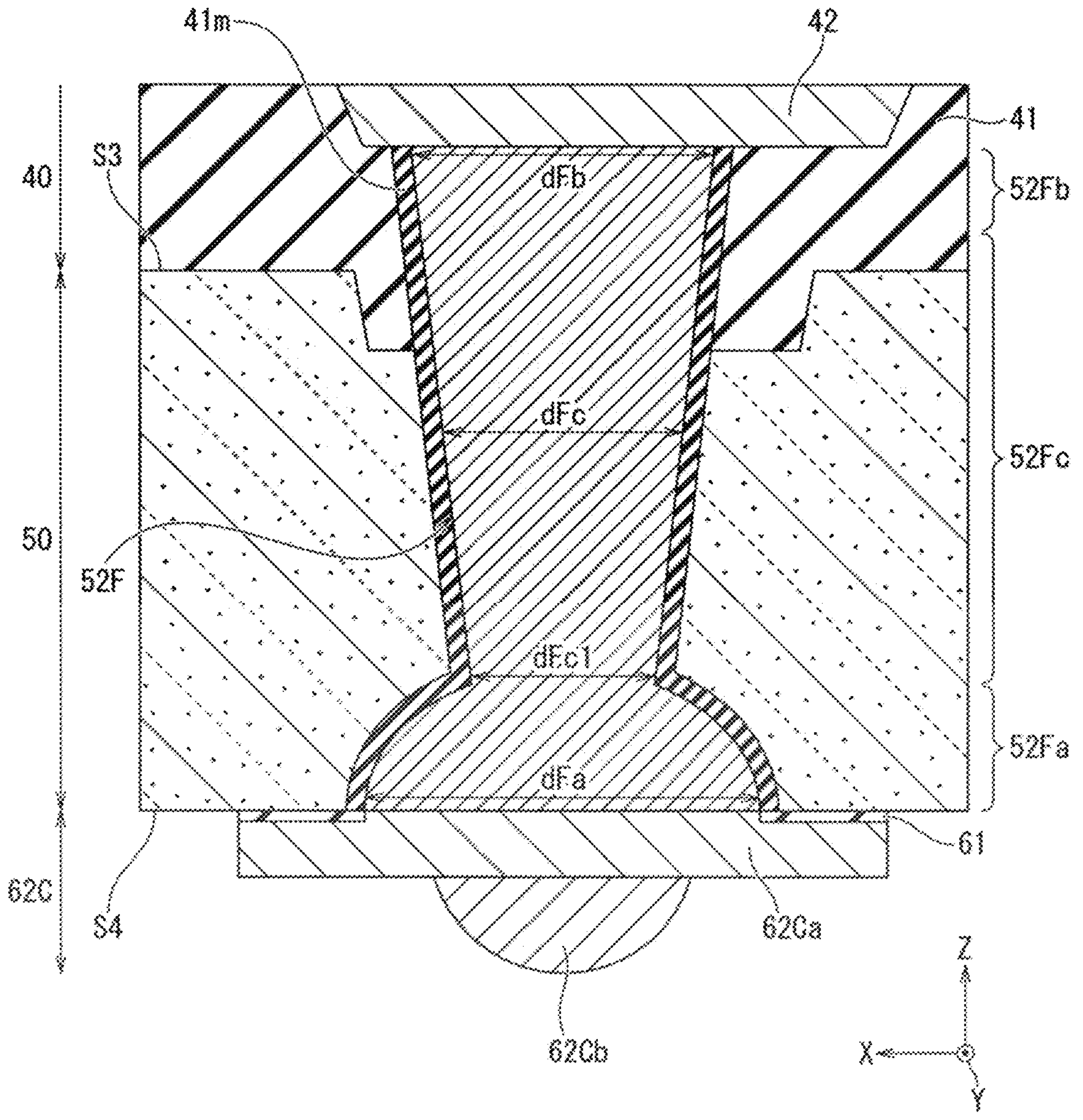

FIG. 118 is a longitudinal cross-sectional diagram depicting a main part of an optical detection device according to modification 3 of the fifteenth embodiment of the present technology.

Figure 119A:
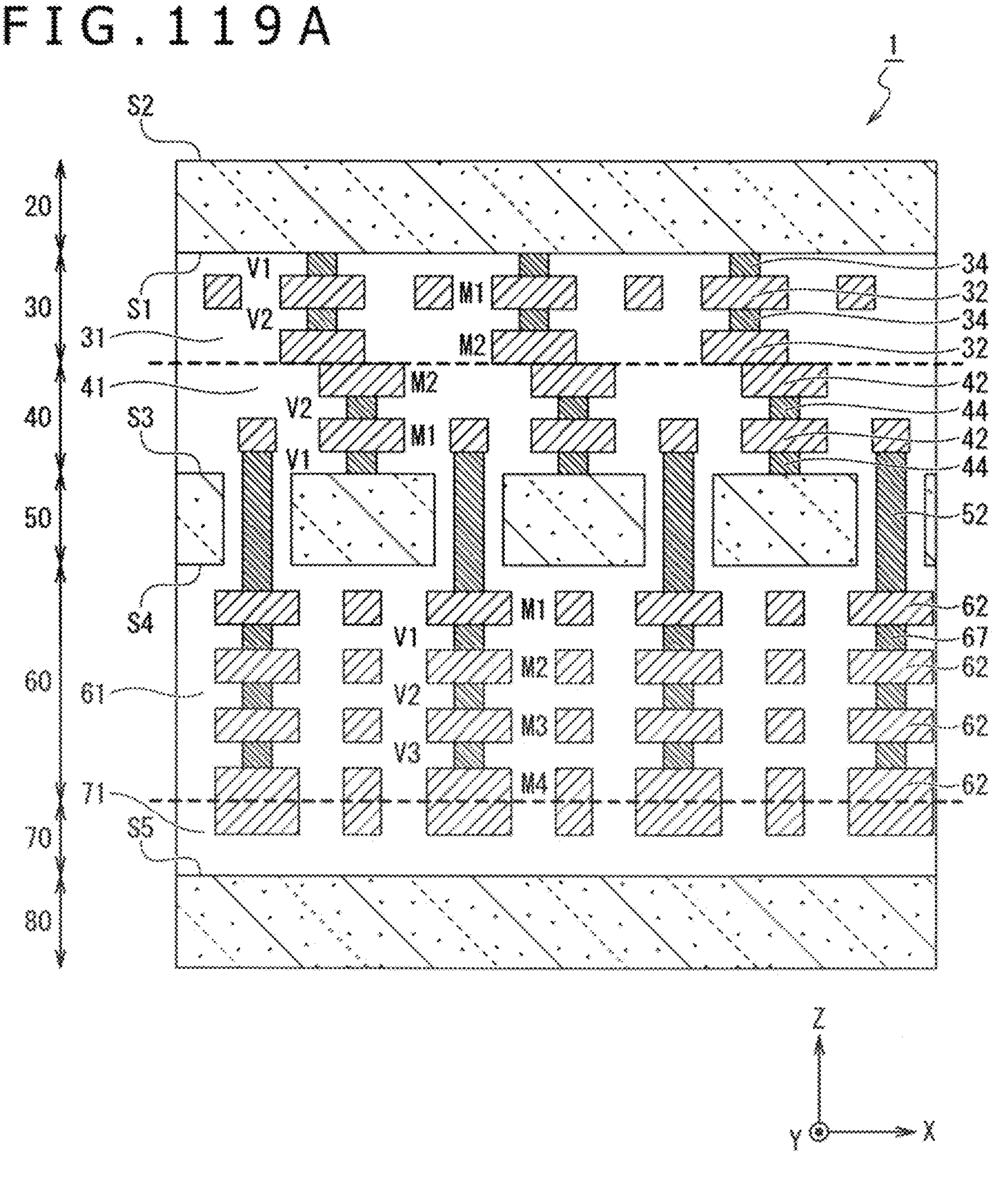

FIG. 119A is a longitudinal cross-sectional diagram depicting a part of a pixel region of an optical detection device according to a sixteenth embodiment of the present technology.

Figure 119B:
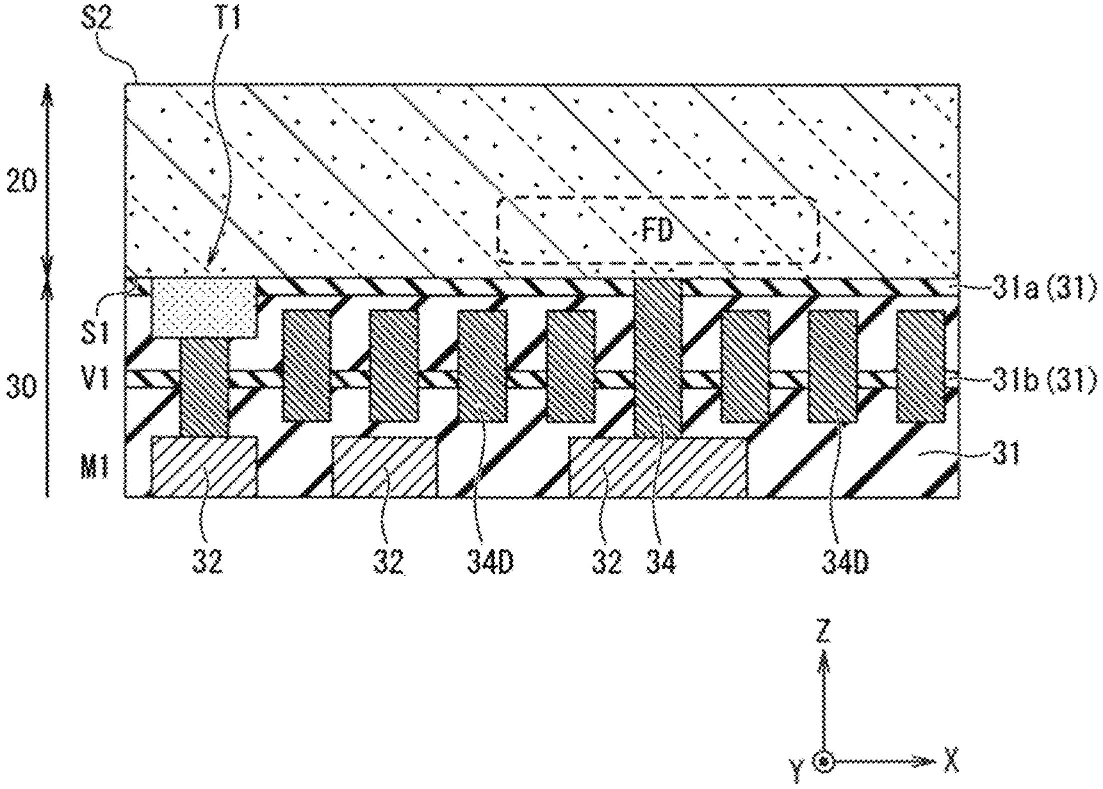

FIG. 119B is a longitudinal cross-sectional diagram depicting an enlarged part of a via layer included in a first wiring layer of the optical detection device depicted in FIG. 119A.

Figure 119C:
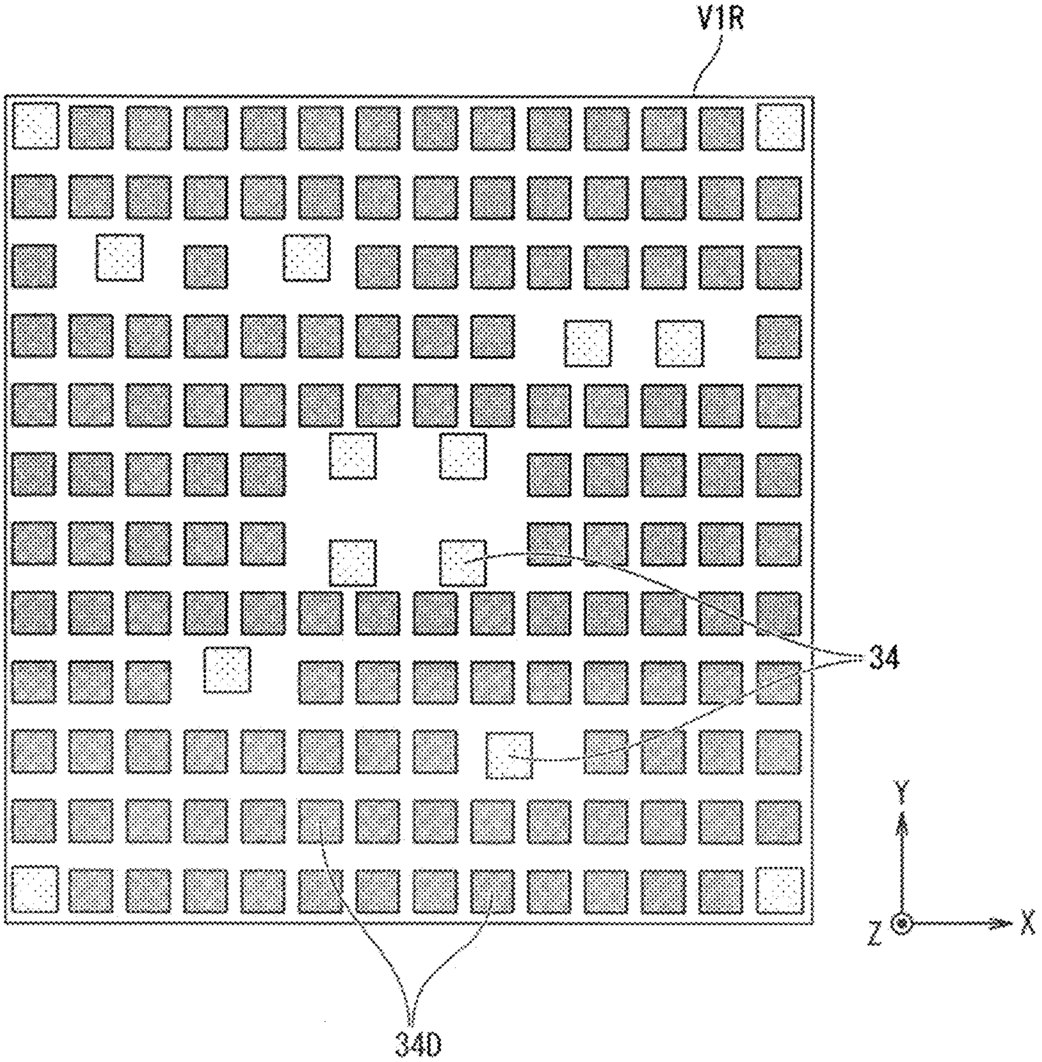

FIG. 119C is a plan diagram depicting a planar configuration of a part of the via layer included in the first wiring layer of the optical detection device depicted in FIG. 119A.

Figure 119D:
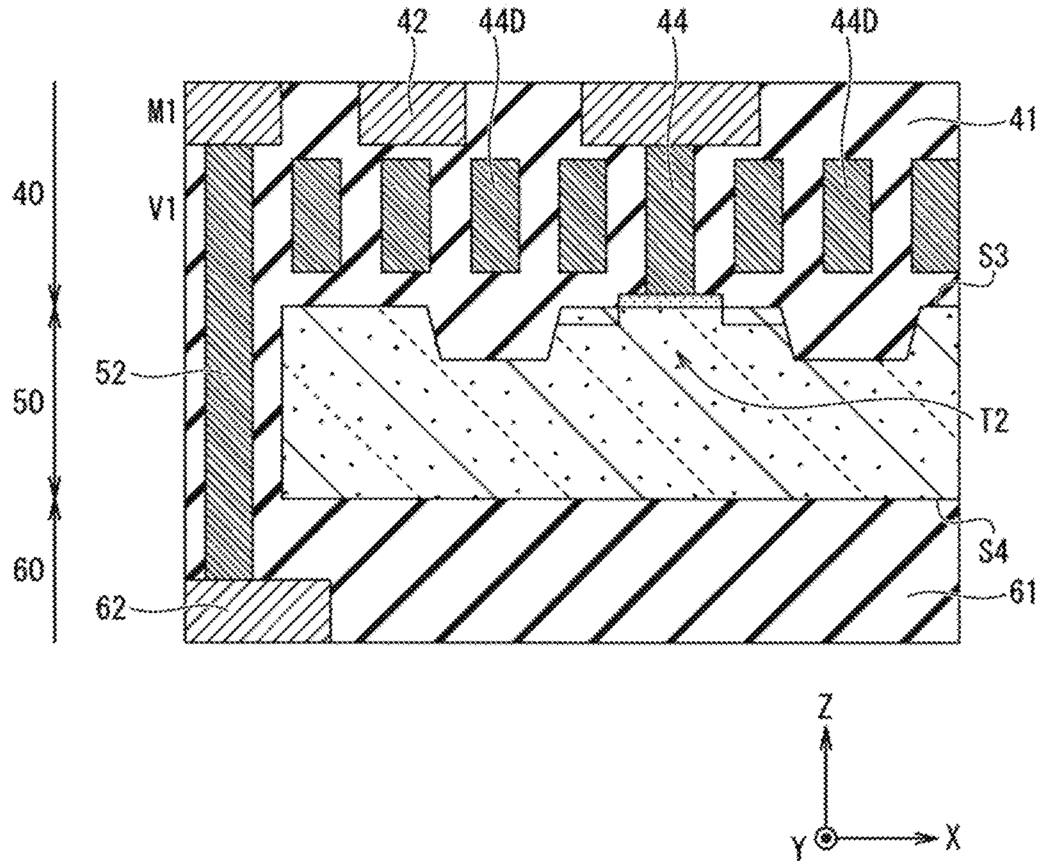

FIG. 119D is a longitudinal cross-sectional diagram depicting an enlarged part of a via layer included in a second wiring layer of the optical detection device depicted in FIG. 119A.

Figure 120A:
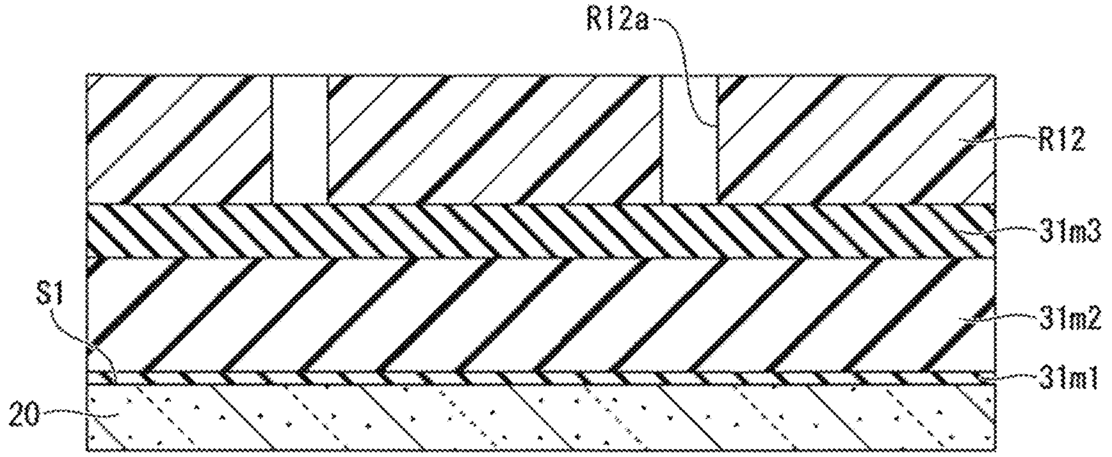

FIG. 120A is a step cross-sectional diagram depicting a manufacturing method of the optical detection device according to the sixteenth embodiment of the present technology.

Figure 120B:
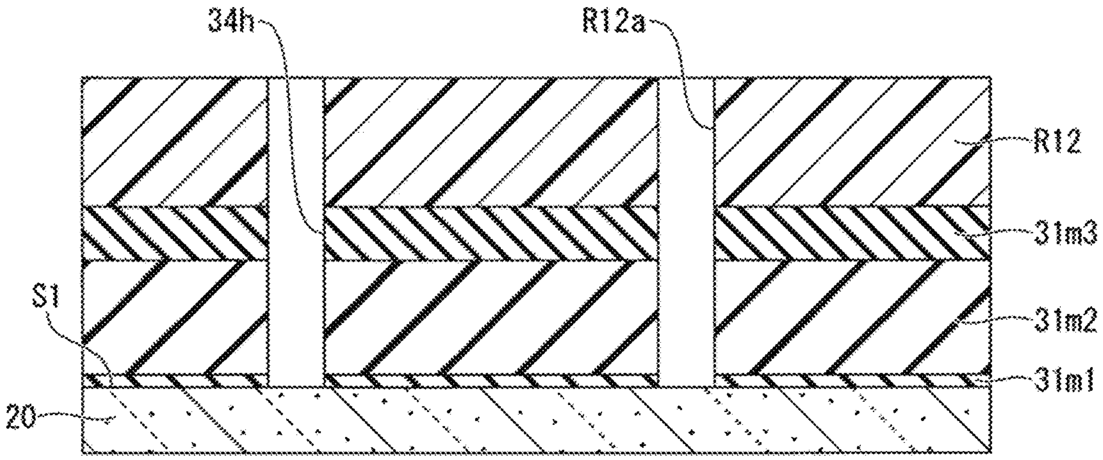

FIG. 120B is a step cross-sectional diagram continuing from FIG. 120A.

Figure 120C:
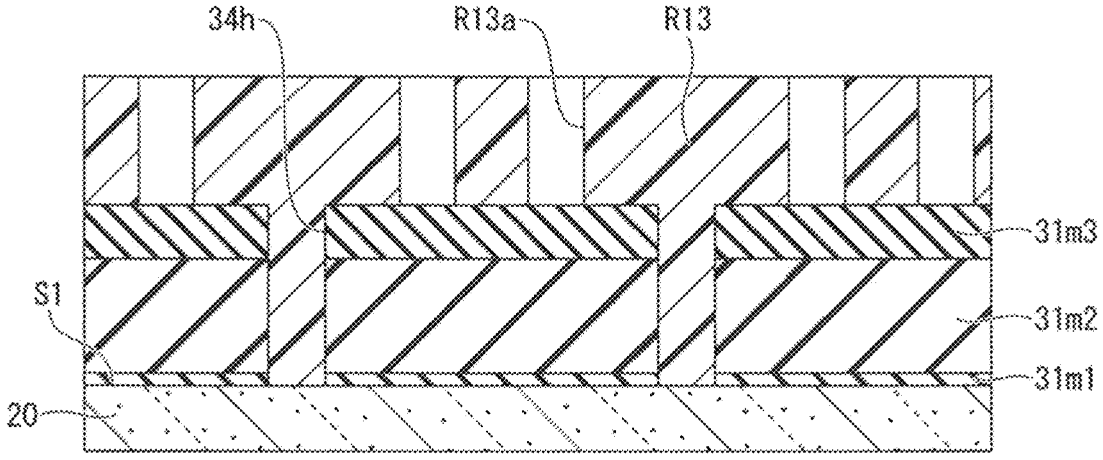

FIG. 120C is a step cross-sectional diagram continuing from FIG. 120B.

Figure 120D:
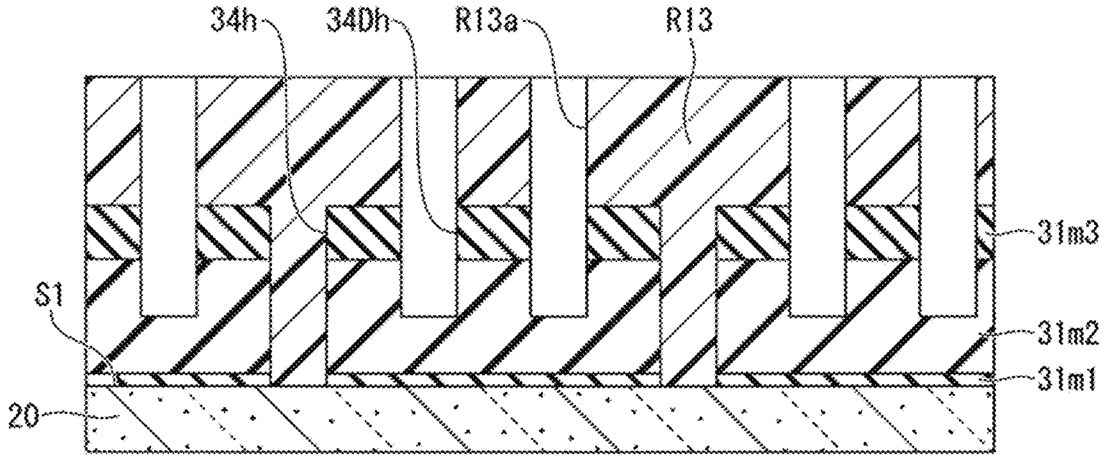

FIG. 120D is a step cross-sectional diagram continuing from FIG. 120C.

Figure 120E:
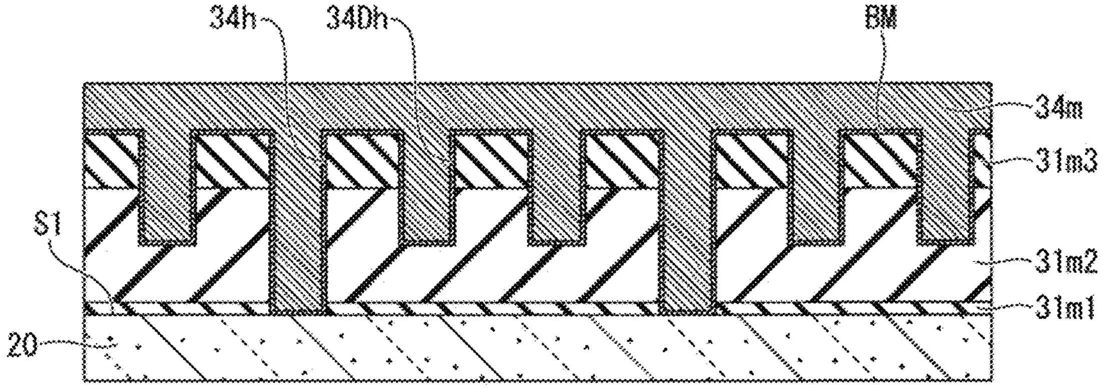

FIG. 120E is a step cross-sectional diagram continuing from FIG. 120D.

Figure 120F:
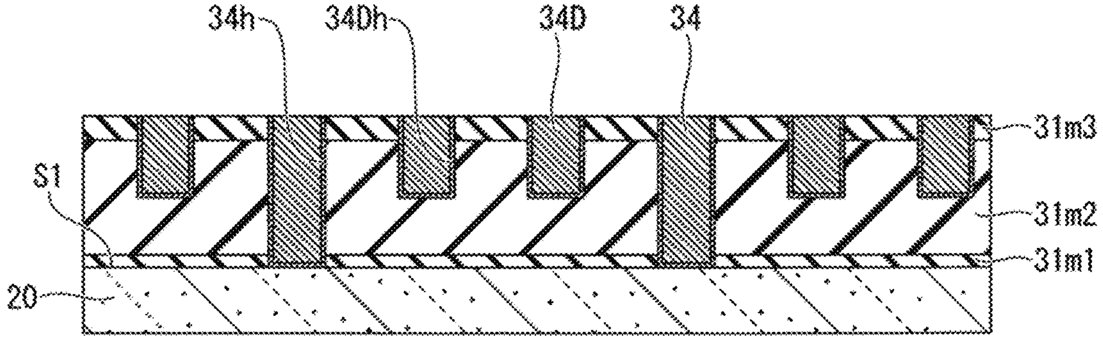

FIG. 120F is a step cross-sectional diagram continuing from FIG. 120E.

Figure 120G:
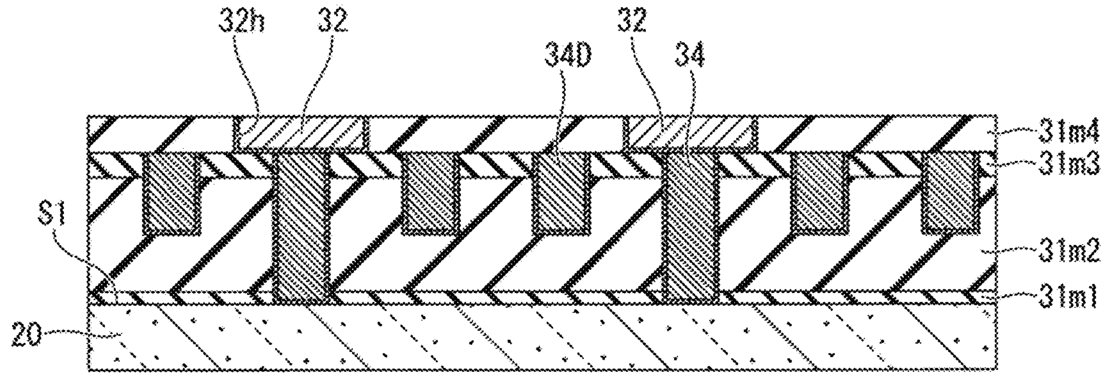

FIG. 120G is a step cross-sectional diagram continuing from FIG. 120F.

Figure 121A:
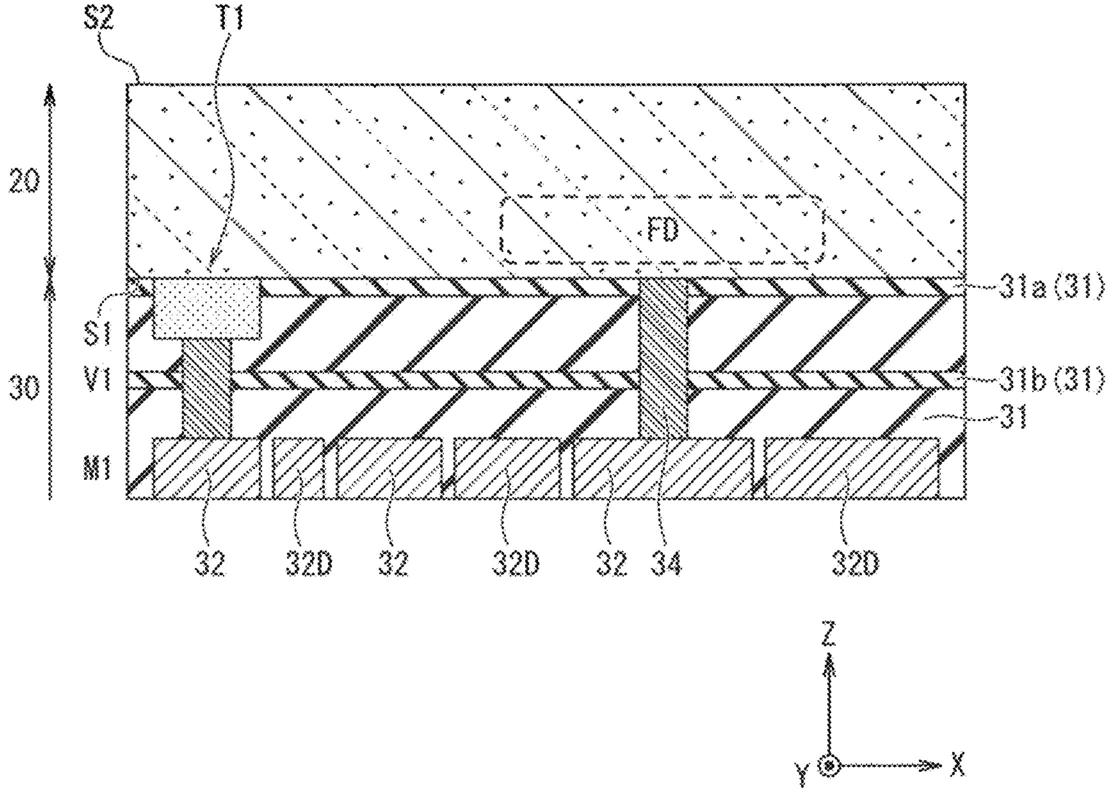

FIG. 121A is a longitudinal cross-sectional diagram depicting an enlarged part of a metal layer included in a first wiring layer of an optical detection device according to modification 2 of the sixteenth embodiment of the present technology.

Figure 121B:
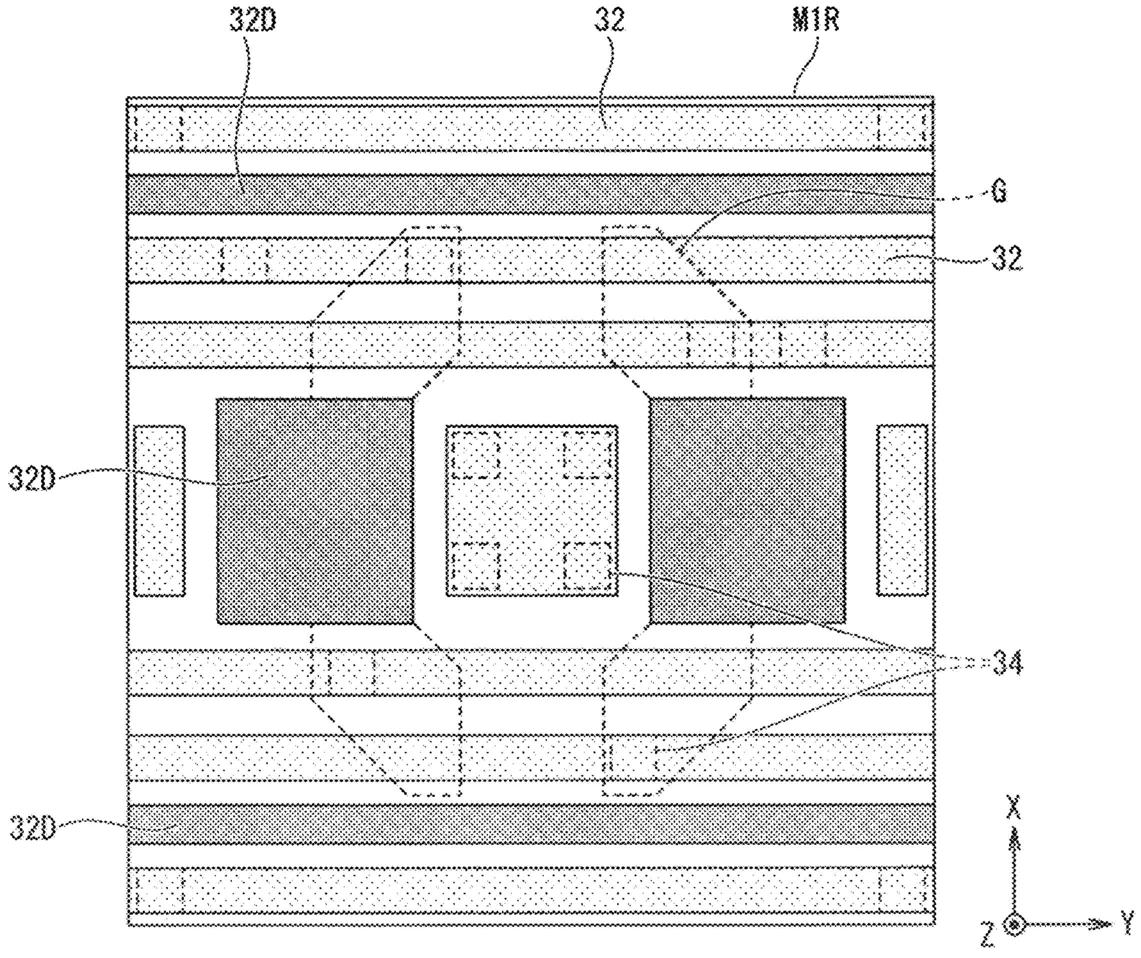

FIG. 121B is a plan diagram depicting a planar structure of a part of the metal layer included in the first wiring layer of the optical detection device according to modification 2 of the sixteenth embodiment of the present technology.

Figure 122:
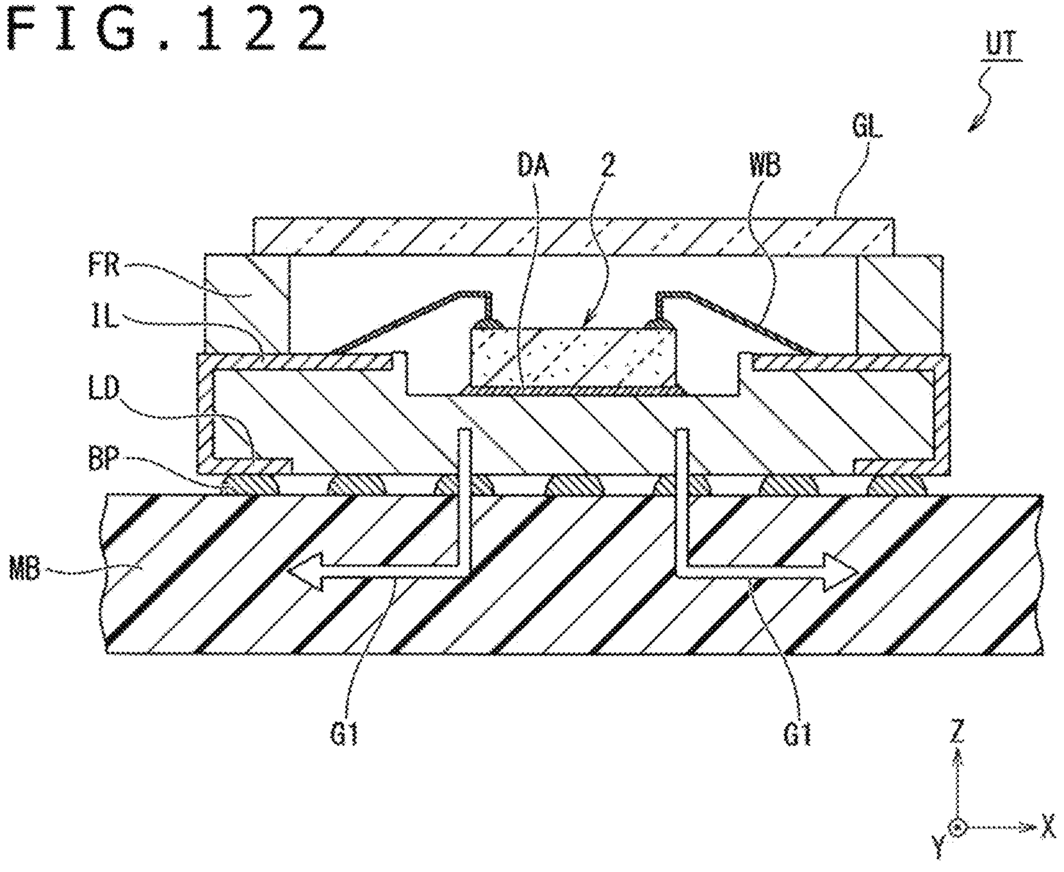

FIG. 122 is a longitudinal cross-sectional diagram depicting a cross-sectional structure of an optical detection unit according to a seventeenth embodiment of the present technology.

Figure 123A:
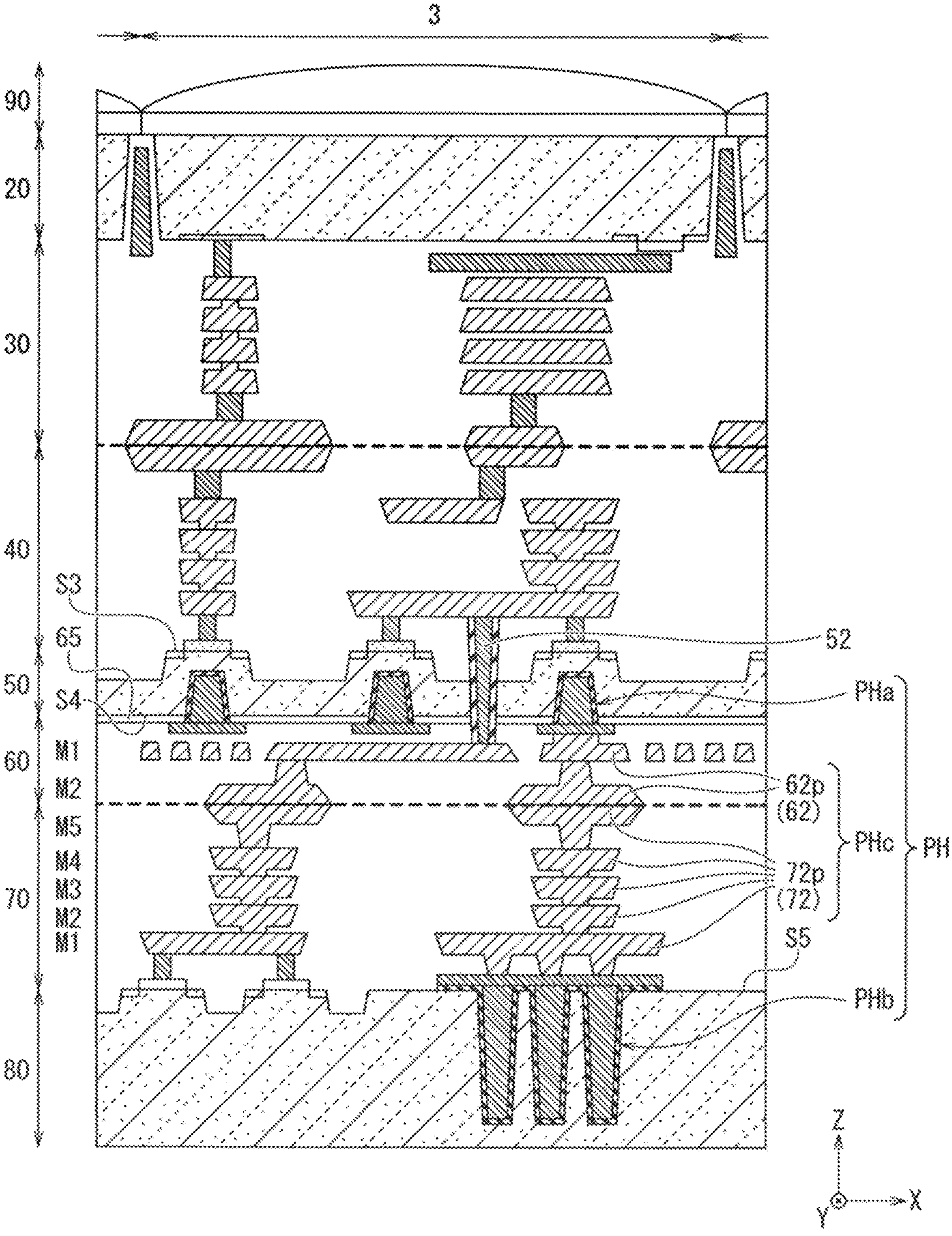

FIG. 123A is a longitudinal cross-sectional diagram depicting a part of a pixel region of the optical detection device according to the seventeenth embodiment of the present technology.

Figure 123B:
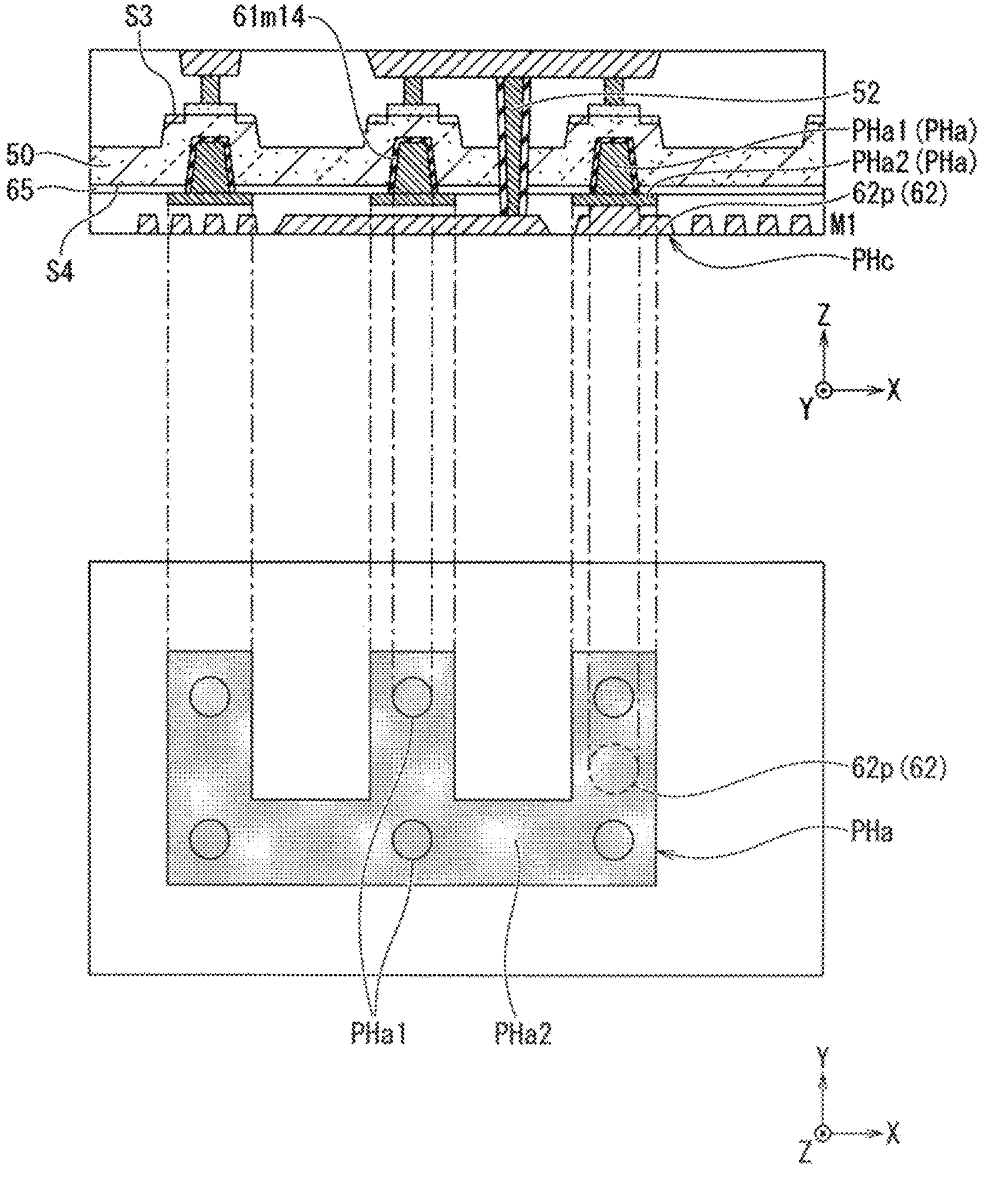

FIG. 123B is a diagram depicting a longitudinal cross-sectional structure and a planar structure of a heat collection portion included in the optical detection device according to the seventeenth embodiment of the present technology.

Figure 123C:
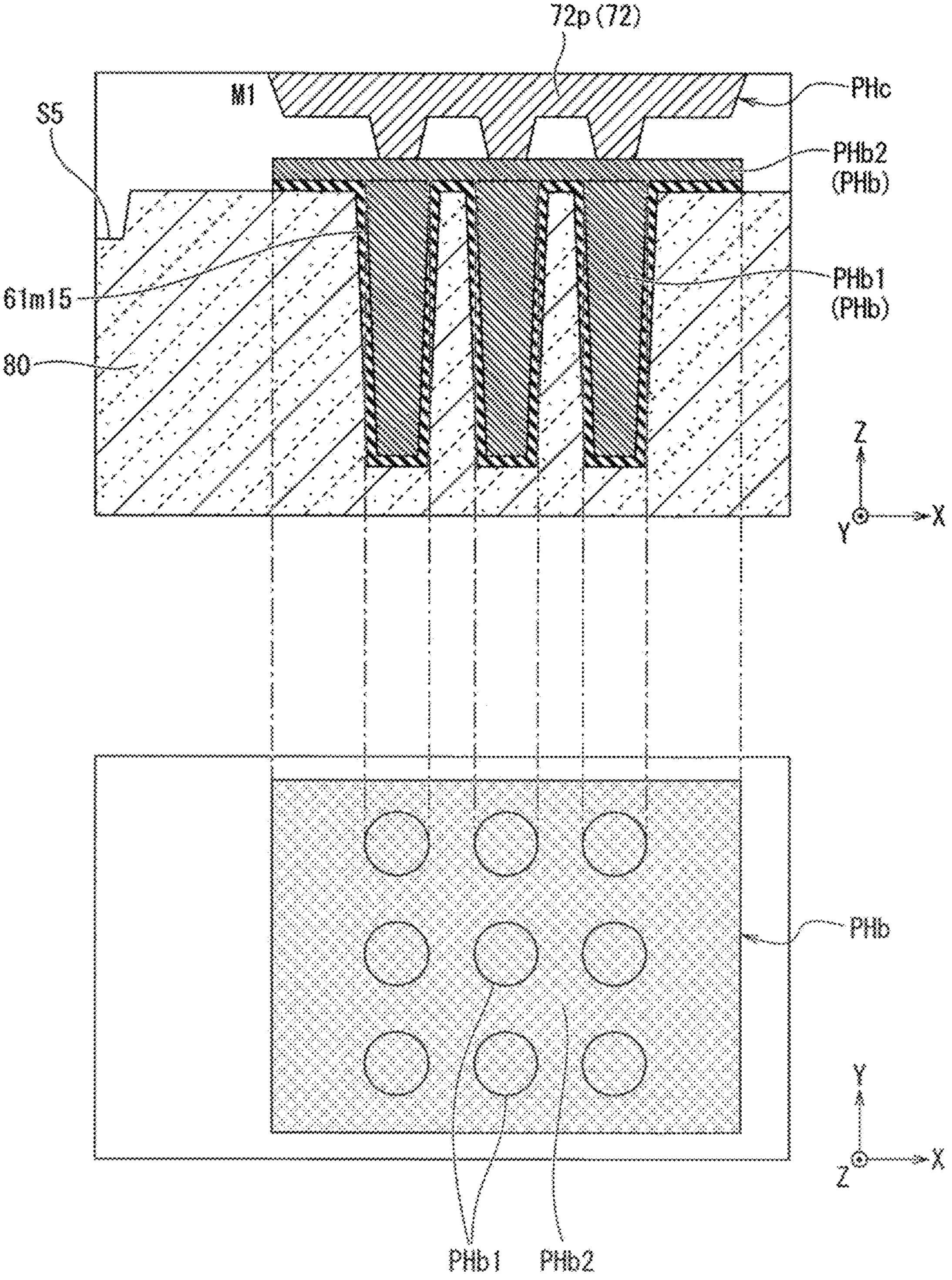

FIG. 123C is a diagram depicting a longitudinal cross-sectional structure and a planar structure of a heat dissipation portion included in the optical detection device according to the seventeenth embodiment of the present technology.

DESCRIPTION OF EMBODIMENTS

Preferred modes for carrying out the present technology will hereinafter be described with reference to the drawings. Note that each of the embodiments described below will be one example of typical embodiments of the present technology. Accordingly, it is not intended that interpretation of the scope of the present technology be narrowed by the embodiments.

In the following description associated with the drawings, identical or similar parts will be given identical or similar reference signs. Note that the drawings are presented only as schematic illustrations. It should hence be taken into consideration that relations between thicknesses and planar sizes, ratios of respective layers, and the like are different from actual ones. Accordingly, specific thicknesses and sizes should be determined in light of the following description. Moreover, needless to say, size relations and ratios included in any one of the drawings may be different from corresponding size relations and ratios included in the other drawings.

Furthermore, a first embodiment to a twelfth embodiment described below present examples of devices and methods for embodying technical ideas of the present technology. Materials, shapes, structures, arrangements, and the like of constituent parts of the technical ideas of the present technology are not limited to the examples described below. The technical ideas of the present technology may be modified in various manners within a technical scope specified by the appended claims.

The description will be given in the following order.

1. First Embodiment
2. Second Embodiment
3. Third Embodiment
4. Fourth Embodiment
5. Fifth Embodiment
6. Sixth Embodiment
7. Seventh Embodiment
8. Eighth Embodiment
9. Ninth Embodiment
10. Tenth Embodiment
11. Eleventh Embodiment
12. Twelfth Embodiment
    - Example of application to electronic apparatus
    - Example of application to mobile body
    - Example of application to endoscopic surgery system
13. Thirteenth Embodiment
14. Fourteenth Embodiment
15. Fifteenth Embodiment
16. Sixteenth Embodiment
17. Seventeenth Embodiment

First Embodiment

Described in the first embodiment here will be an example of the present technology applied to an optical detection device which is a back-illuminated CMOS (Complementary Metal Oxide Semiconductor) image sensor.

<<Overall Configuration of Optical Detection Device>>

Figure 1:
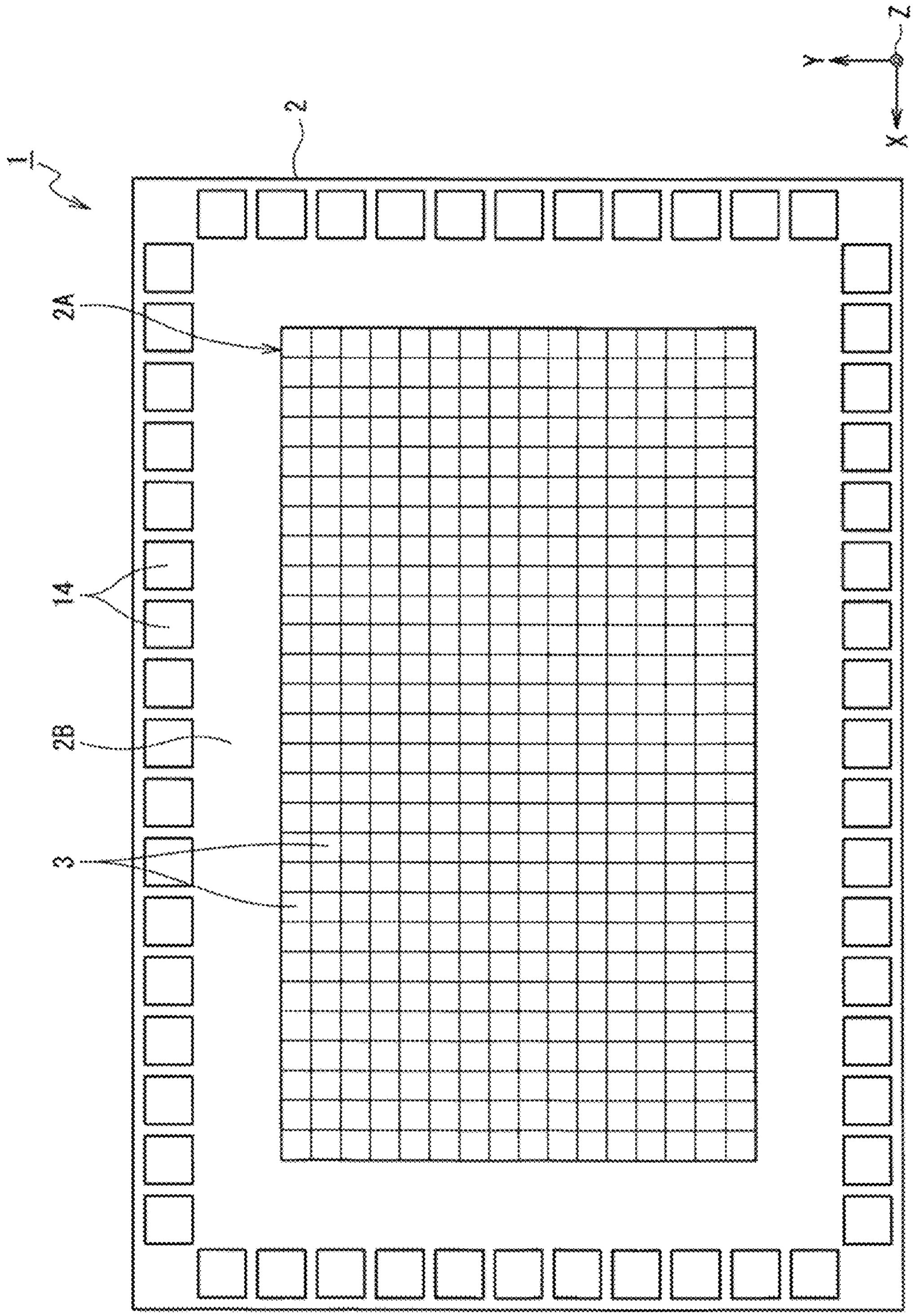
FIG. 1 is a chip layout diagram depicting one configuration example of an optical detection device according to a first embodiment of the present technology.

An overall configuration of an optical detection device 1 will first be described. As depicted in FIG. 1, the optical detection device 1 according to the first embodiment of the present technology has a semiconductor chip 2 which has a square two-dimensional planar shape in a planar view as a main component. Specifically, the optical detection device 1 is mounted on the semiconductor chip 2. As depicted in FIG. 96, the optical detection device 1 thus configured introduces image light (incident light 106) coming from a subject via an optical system (optical lens) 102, converts a light amount of an image of the incident light 106 formed on an imaging surface into an electric signal for each pixel, and outputs the electric signal as a pixel signal.

As depicted in FIG. 1, the semiconductor chip 2 on which the optical detection device 1 is mounted includes a pixel region 2A which is square and formed in a central portion and a peripheral region 2B that is formed outside the pixel region 2A and that surrounds the pixel region 2A in a two-dimensional plane containing an X-direction and a Y-direction crossing each other.

For example, the pixel region 2A is a light receiving surface which receives light collected by the optical system 102 depicted in FIG. 96. In addition, the pixel region 2A includes a plurality of pixels 3 arranged in a matrix in the two-dimensional plane containing the X-direction and the Y-direction. In other words, the pixels 3 are repetitively arranged in each of the X-direction and the Y-direction crossing each other within the two-dimensional plane. Note that the X-direction and the Y-direction cross each other at right angles in the present embodiment by way of example. Moreover, a Z-direction (thickness direction) is a direction crossing both the X-direction and the Y-direction at right angles.

As depicted in FIG. 1, a plurality of bonding pads 14 are disposed in the peripheral region 2B. For example, each of the plurality of bonding pads 14 is arrayed along a corresponding side of four sides of the two-dimensional plane of the semiconductor chip 2. Each of the plurality of bonding pads 14 is an input/output terminal used when the semiconductor chip 2 is electrically connected to an external device.

<Logic Circuit>

Figure 2:
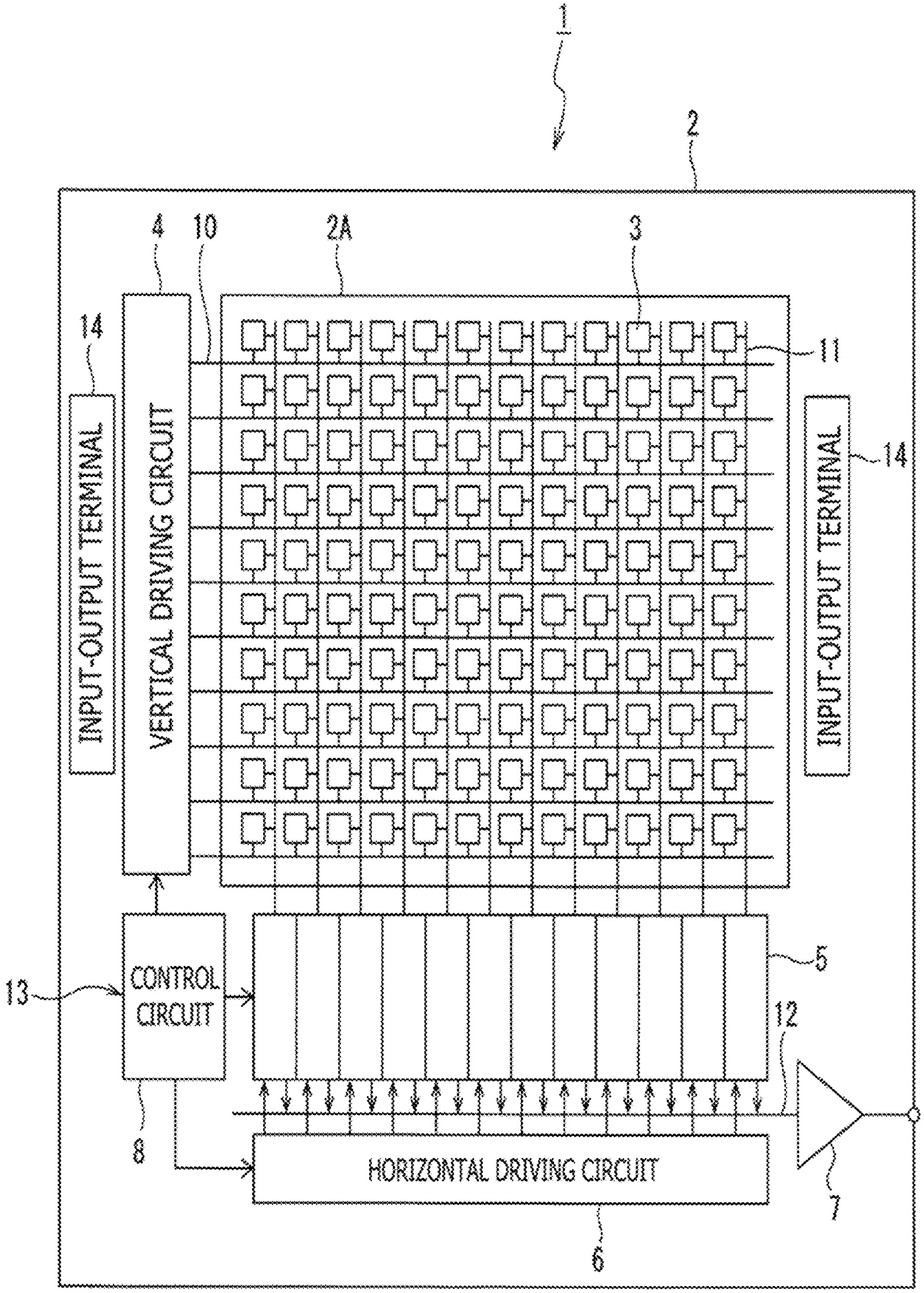
FIG. 2 is a block diagram depicting one configuration example of the optical detection device according to the first embodiment of the present technology.

As depicted in FIG. 2, the semiconductor chip 2 includes a logic circuit 13 including a vertical driving circuit 4, column signal processing circuits 5, a horizontal driving circuit 6, an output circuit 7, a control circuit 8, and others. The logic circuit 13 functions as a field effect transistor which includes a CMOS (Complementary MOS) circuit having n-channel conductivity-type MOSFETs (Metal Oxide Semiconductor Field Effect Transistors) and p-channel conductivity-type MOSFETs, for example.

For example, the vertical driving circuit 4 includes a shift register. The vertical driving circuit 4 sequentially selects a desired pixel drive line 10, and supplies a pulse for driving the pixels 3 to the selected pixel drive line 10 to drive the respective pixels 3 for each row. Specifically, the vertical driving circuit 4 selectively scans the respective pixels 3 in the pixel region 2A for each row sequentially in the vertical direction, and supplies a pixel signal received from each of the pixels 3 corresponding to a signal charge and generated by a photoelectric conversion element of the corresponding pixel 3 according to an amount of received light to the corresponding column signal processing circuit 5 via a corresponding vertical signal line 11.

For example, the column signal processing circuits 5 are provided for the pixels 3 one for each column, and achieve such signal processing as noise removal for signals output from one row of the pixels 3 for each of pixel columns. For example, each of the column signal processing circuits 5 performs such signal processing as CDS (Correlated Double Sampling: corelated double sampling) for removing fixed pattern noise unique to each pixel and AD (Analog Digital) conversion. A horizontal selection switch (not depicted) is connected and provided between each output stage of the column signal processing circuits 5 and a horizontal signal line 12.

For example, the horizontal driving circuit 6 includes a shift register. The horizontal driving circuit 6 sequentially outputs a horizontal scanning pulse to each of the column signal processing circuits 5 to sequentially select each of the column signal processing circuits 5, and causes each of the selected column signal processing circuits 5 to output a pixel signal subjected to signal processing to the horizontal signal line 12.

The output circuit 7 performs signal processing for the pixel signals sequentially supplied from the respective column signal processing circuits 5 via the horizontal signal line 12, and outputs the processed pixel signals. For example, this signal processing may include buffering, black level adjustment, column variation correction, and various types of digital signal processing.

The control circuit 8 generates a clock signal and a control signal as operation references for each of the vertical driving circuit 4, the column signal processing circuits 5, the horizontal driving circuit 6, and the like according to a vertical synchronized signal, a horizontal synchronized signal, and a master clock signal. Thereafter, the control circuit 8 outputs the clock signal and the control signal thus generated to each of the vertical driving circuit 4, the column signal processing circuits 5, the horizontal driving circuit 6, and the like.

<Pixel>

Figure 3:
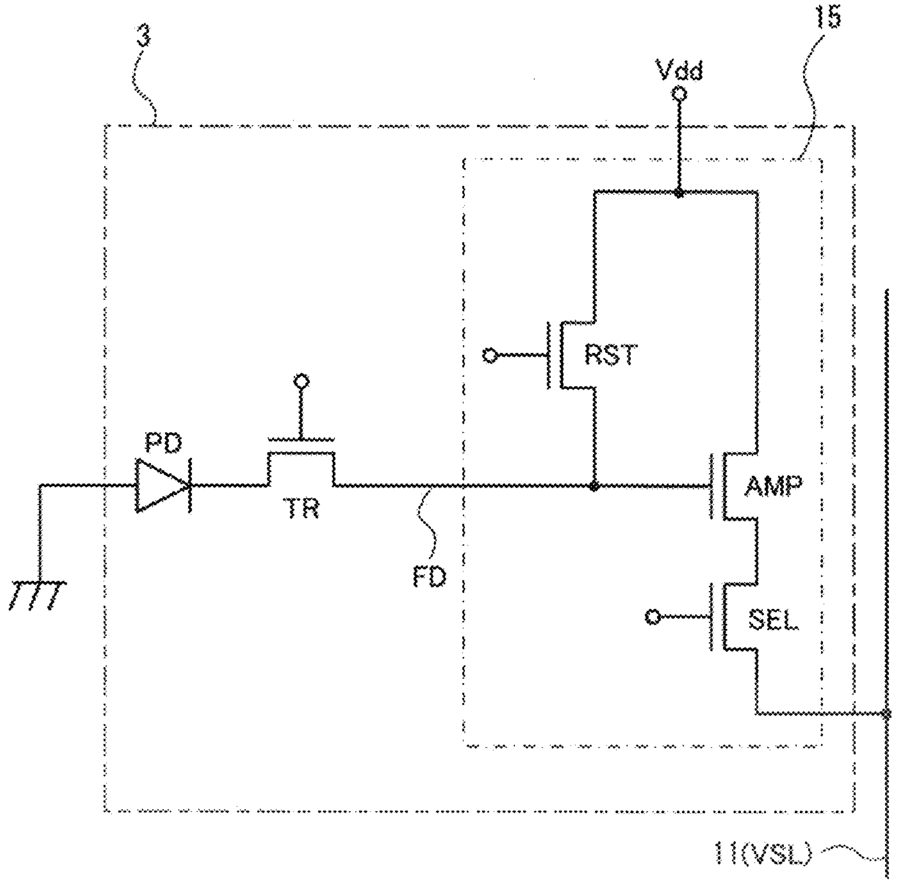
FIG. 3 is an equivalent circuit diagram of a pixel of the optical detection device according to the first embodiment of the present technology.

FIG. 3 is an equivalent circuit diagram depicting one configuration example of each of the pixels 3. The pixel 3 in the figure includes a photoelectric conversion element PD, a charge accumulation region (floating diffusion: Floating Diffusion) FD for accumulating (retaining) a signal charge photoelectrically converted by the photoelectric conversion element PD, and a transfer transistor TR for transferring the signal charge photoelectrically converted by the photoelectric conversion element PD to the charge accumulation region FD. The pixel 3 further includes a readout circuit 15 electrically connected to the charge accumulation region FD.

The photoelectric conversion element PD generates a signal charge corresponding to an amount of received light. Moreover, the photoelectric conversion element PD temporarily accumulates (retains) the generated signal charge. A cathode side of the photoelectric conversion element PD is electrically connected to a source region of the transfer transistor TR, while an anode side of the photoelectric conversion element PD is electrically connected to a reference potential line (e.g., ground). For example, the photoelectric conversion element PD includes a photodiode.

A drain region of the transfer transistor TR is electrically connected to the charge accumulation region FD. A gate electrode of the transfer transistor TR is electrically connected to a transfer transistor drive line included in the pixel drive line 10 (see FIG. 2).

The charge accumulation region FD temporarily accumulates and retains the signal charge transferred from the photoelectric conversion element PD via the transfer transistor TR.

The readout circuit 15 reads the signal charge accumulated in the charge accumulation region FD, and outputs a pixel signal corresponding to the signal charge. For example, the readout circuit 15 includes an amplification transistor AMP, a selection transistor SEL, and a reset transistor RST as pixel transistors. However, this configuration is not required to be adopted. For example, each of these transistors (AMP, SEL, RST) includes a MOSFET which has a gate insulation film including a silicon oxide film ($SiO_2$ film), a gate electrode, and a pair of main electrode regions functioning as a source region and a drain region. Alternatively, each of these transistors may include a MISFET (Metal Insulator Semiconductor FET) which has a gate insulation film including a silicon nitride film ($Si_3N_4$ film), or a laminated film such as a silicon nitride film and a silicon oxide film.

A source region of the amplification transistor AMP is electrically connected to a drain region the selection transistor SEL, while a drain region of the amplification transistor AMP is electrically connected to a power source line Vdd and a drain region of the reset transistor. In addition, a gate electrode of the amplification transistor AMP is electrically connected to the charge accumulation region FD and a source region of the reset transistor RST.

A source region of the selection transistor SEL is electrically connected to the vertical signal line 11 (VSL), while the drain of the selection transistor SEL is electrically connected to the source region of the amplification transistor AMP. In addition, a gate electrode of the selection transistor SEL is electrically connected to a selection transistor drive line included in the pixel drive line 10 (see FIG. 2).

The source region of the reset transistor RST is electrically connected to the charge accumulation region FD and the gate electrode of the amplification transistor AMP, while the drain region of the reset transistor RST is electrically connected to the power source line Vdd and the drain region of the amplification transistor AMP. A gate electrode of the reset transistor RST is electrically connected to a reset transistor drive line included in the pixel drive line 10 (see FIG. 2).

<<Specific Configuration of Optical Detection Device>>

A specific configuration of the optical detection device 1 will next be described with reference to FIGS. 4A and 4B.

<Laminated Structure of Optical Detection Device>

Figure 4A:
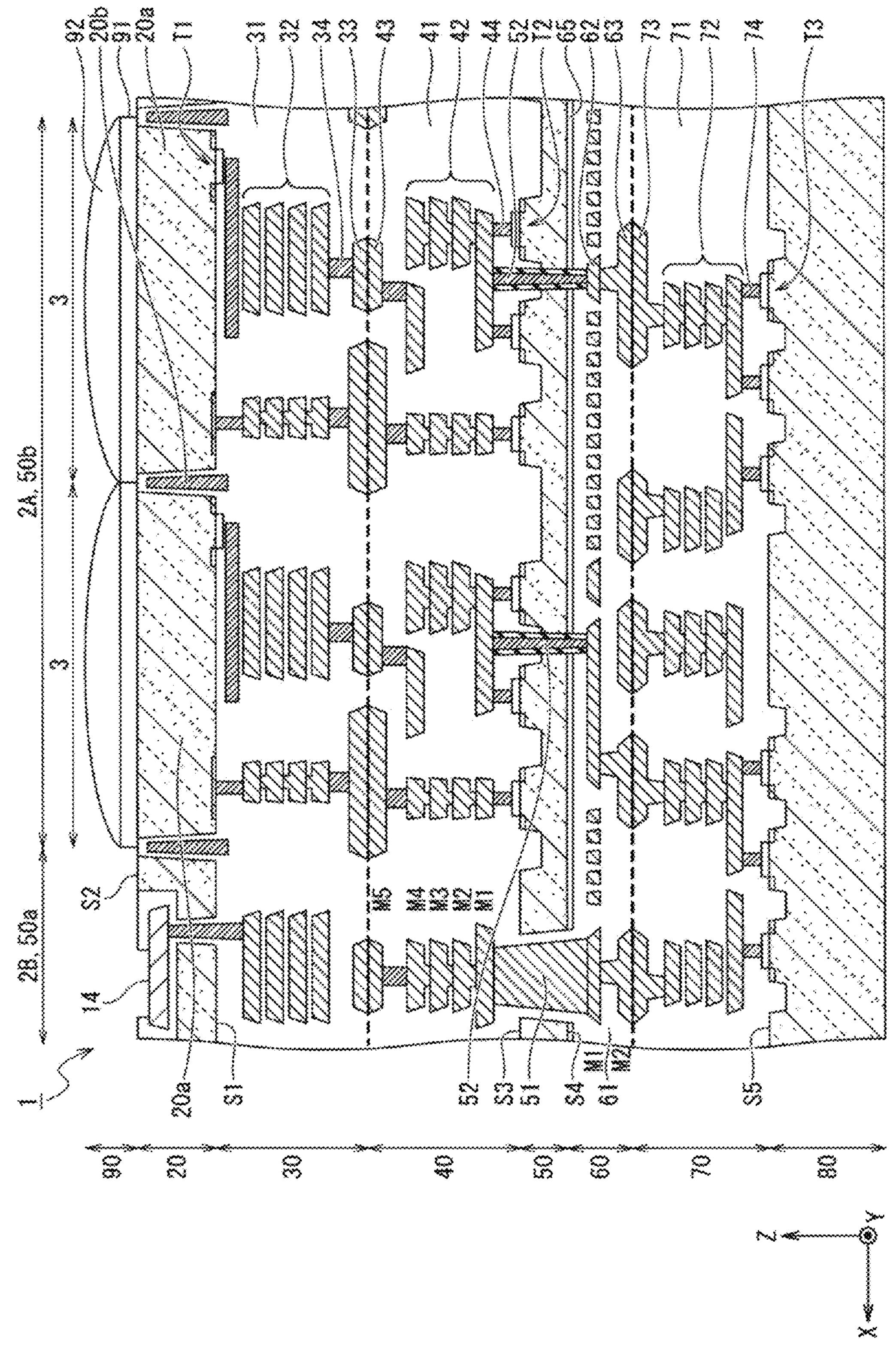
FIG. 4A is a longitudinal cross-sectional diagram of the optical detection device according to the first embodiment of the present technology.

As depicted in FIG. 4A, the optical detection device 1 (semiconductor chip 2) has a laminated structure formed by a light collection layer 90, a first semiconductor layer 20, a first wiring layer 30, a second wiring layer 40, a second semiconductor layer 50, a third wiring layer 60, a fourth wiring layer 70, and a third semiconductor layer 80 being laminated in this order.

For example, the light collection layer 90 has a laminated structure formed by color filters 91 and on-chip lenses 92 being laminated in this order from a second surface S2 side of the first semiconductor layer 20. However, this configuration is not required to be adopted. The first semiconductor layer 20 has a photoelectric conversion region described below, and has a first surface S1 as one surface and the second surface S2 as another surface corresponding to a light entrance surface. The first wiring layer 30 is overlapped with the first surface S1 of the first semiconductor layer 20. The second wiring layer 40 is overlapped with a surface of the first wiring layer 30 on the side opposite to the first semiconductor layer 20 side surface. The second semiconductor layer 50 includes a plurality of transistors, and has a third surface S3 as one surface and a fourth surface S4 as another surface. The third surface S3 is overlapped with a surface of the second wiring layer 40 on the side opposite to the first wiring layer 30 side surface. The third wiring layer 60 is overlapped with the fourth surface S4 of the second semiconductor layer 50. The fourth wiring layer 70 is overlapped with a surface of the third wiring layer 60 on the side opposite to the second semiconductor layer 50 side surface. A fifth surface S5 of the third semiconductor layer 80 is overlapped with a surface of the fourth wiring layer 70 on the side opposite to the third wiring layer 60 side surface.

Note that the first surface S1 of the first semiconductor layer 20 will also be referred to as an element forming surface or a main surface and that the second surface S2 of the first semiconductor layer 20 will also be referred to as a light entrance surface or a back surface. Moreover, the third surface S3 of the second semiconductor layer 50 will also be referred to as an element forming surface or a main surface, and the fourth surface S4 of the second semiconductor layer 50 will also be referred to as a back surface. Further, the fifth surface S5 of the third semiconductor layer 80 will be also referred to as an element forming surface or a main surface, and a surface opposite to the fifth surface S5 will be also referred to as a back surface.

In addition, the first semiconductor layer 20 and the second semiconductor layer 50 are joined to each other by F2F (Face to Face), i.e., such that the respective element forming surfaces face each other, via the first wiring layer 30 and the second wiring layer 40. Besides, the second semiconductor layer 50 and the third semiconductor layer 80 are joined to each other by B2F (Back to Face), i.e., such that the back surface and the element forming surface face each other, via the third wiring layer 60 and the fourth wiring layer 70.

<First Semiconductor Layer>

The first semiconductor layer 20 includes a semiconductor substrate. The first semiconductor layer 20 includes a first conductivity-type, such as a p-type, monocrystal silicon substrate. Moreover, for example, the bonding pad 14 is provided in a region included in the first semiconductor layer 20 and overlapping with the peripheral region 2B in the planar view. Further, a photoelectric conversion region 20*a* is provided for each of the pixels 3 in a region included in the first semiconductor layer 20 and overlapping with the pixel region 2A in the planar view. For example, the photoelectric conversion region 20*a* having an island shape and being sectioned by separation regions 20*b* is provided for each of the pixels 3. Note that the number of the pixels 3 is not limited to the number depicted in FIG. 4A.

While not depicted in the figure, the photoelectric conversion region 20*a* includes a first conductivity-type, such as a p-type, well region, and a second conductivity-type, such as an n-type, semiconductor region (photoelectric conversion portion) embedded inside the well region. The photoelectric conversion element PD depicted in FIG. 3 is formed in the photoelectric conversion region 20*a* including the well region and the photoelectric conversion portion of the first semiconductor layer 20. Moreover, an unillustrated charge accumulation region, which is a second conductivity-type, such as an n-type, semiconductor region, and a transistor T1 may be formed in the photoelectric conversion region 20*a*. However, this configuration is not required to be adopted. For example, the transistor T1 is the transfer transistor TR depicted in FIG. 3.

For example, each of the separation regions 20*b* has a separation groove in the first semiconductor layer 20 to constitute a trench structure which has an insulation film embedded into this separation groove. However, this configuration is not required to be adopted. According to the example depicted in FIG. 4A, an insulation film and metal are embedded inside the separation groove.

<First Wiring Layer>

The first wiring layer 30 includes an insulation film 31, wires 32, first connection pads 33, and vias (contacts) 34. As depicted in the figure, the wires 32 and the first connection pads 33 are laminated via the insulation film 31. Each of the first connection pads 33 faces the surface of the first wiring layer 30 on the side opposite to the first semiconductor layer 20 side. Each of the vias 34 achieves connection between the first semiconductor layer 20 and the wires 32, between the respective wires 32, and between the wires 32 and the first connection pad 33, for example. Moreover, each of the wires 32 and the first connection pads 33 may include copper, for example, and formed by damascene processing. However, this configuration is not required to be adopted.

<Second Wiring Layer>

The second wiring layer 40 includes an insulation film 41, wires 42, second connection pads 43, and vias (contacts) 44. As depicted in the figure, the wires 42 and the second connection pads 43 are laminated via the insulation film 41. Each of the second connection pads 43 faces the surface of the second wiring layer 40 on the side opposite to the second semiconductor layer 50 side, and is connected to the first connection pad 33. Each of the vias 44 achieves connection between the second semiconductor layer 50 and the wires 42, between the respective wires 42, and between the wires 42 and the second connection pad 43, for example. Moreover, each of the wires 42 and the second connection pads 43 may include copper, for example, and formed by damascene processing. However, this configuration is not required to be adopted.

<Second Semiconductor Layer>

The second semiconductor layer 50 includes a semiconductor substrate. The second semiconductor layer 50 includes a monocrystal silicon substrate. However, this configuration is not required to be adopted. The second semiconductor layer 50 exhibits a first conductivity-type, such as a p-type. A plurality of transistors T2 are provided in the second semiconductor layer 50. More specifically, the transistors T2 are provided in a region included in the second semiconductor layer 50 and overlapping with the pixel region 2A in the planar view. For example, each of the transistors T2 is a transistor constituting the readout circuit 15 depicted in FIG. 3. Note that a region included in the second semiconductor layer 50 and overlapping with the peripheral region 2B in the planar view will be referred to as a first region 50*a* and that a region included in the second semiconductor layer 50 and overlapping with the pixel region 2A in the planar view will be referred to as a second region 50*b* to make distinction between the region overlapping with the pixel region 2A and the region overlapping with the peripheral region 2B in the second semiconductor layer 50.

(First Conductor and Second Conductor)

The second semiconductor layer 50 includes first conductors 51 and second conductors 52. More specifically, the first region 50*a* includes the first conductors 51 each of which has a first width, includes a first material, and penetrates the second semiconductor layer 50 in a thickness direction. In addition, the second region 50*b* includes the second conductors 52 each of which has a second width smaller than the first width, includes a second material different from the first material, and penetrates the second semiconductor layer 50 in the thickness direction. Each of the first conductors 51 and the second conductors 52 is a conductor (electrode) that penetrates the semiconductor layer. According to the present embodiment, the semiconductor layer includes silicon. Accordingly, each of the first conductors 51 and the second conductors 52 is a silicon through electrode (TVS, Through-Silicon Via).

For example, each of the first conductors 51 is a conductor provided as a power source line, but is not limited to this example. Accordingly, it is preferable that the first conductors 51 be electrically low resistant. It is hence preferable that the first material constituting each of the first conductors 51 be a conductive material having low electrical resistivity. In the example presented here, copper is employed as one example of such type of conductive material constituting the first material. In addition, the resistance of the first conductors 51 can be reduced by increasing the first width. The first region 50*a* including the first conductors 51 has low layout density of elements and wires. Accordingly, the first width is allowed to be made larger.

The second conductors 52 are provided in the second region 50*b* including the plurality of transistors T2. In this case, the second conductors 52 may be required to be formed in narrow regions between the respective transistors T2. Accordingly, the second width needs to be reduced. When the second width is reduced, the second conductors 52 each have a higher aspect ratio. For example, the aspect ratio of the second conductors 52 reaches 5 or higher, but is not limited to this example. If such an aspect ratio is given, the same material as the material of the first material (e.g., copper in this example) may be difficult to embed. It is hence preferable that the second material constituting each of the second conductors 52 include a conductive material that can easily be embedded into a hole having a high aspect ratio. For example, high melting metal may be adopted as such a type of conductive material. For example, tungsten (W), cobalt (Co), ruthenium (Ru), or a metal material containing at least any one of these materials may be adopted as the high melting metal. In this example, tungsten is employed as the second material.

Figure 4B:
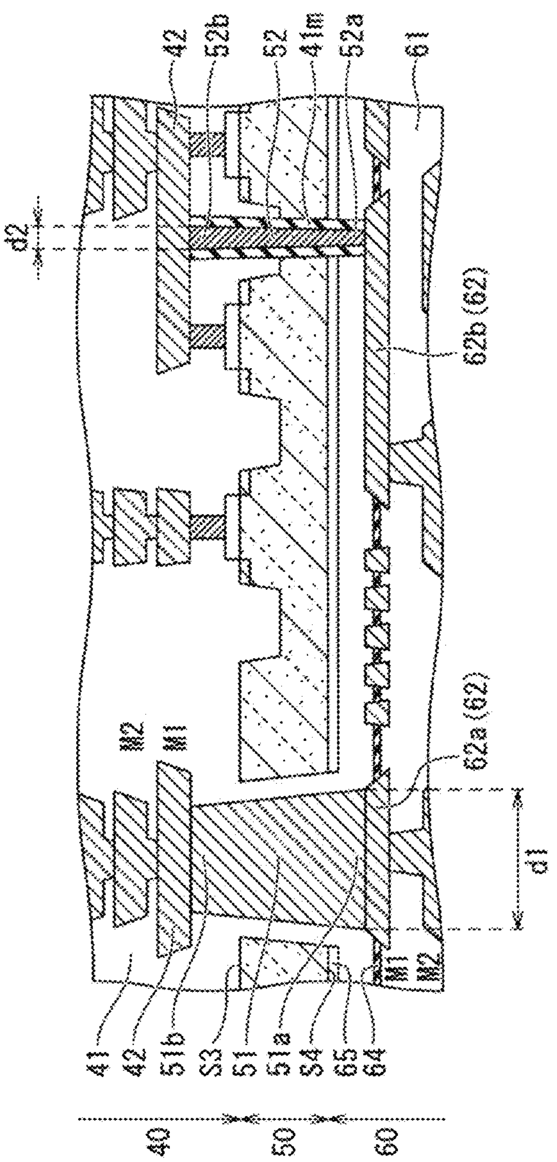
FIG. 4B is a partially enlarged diagram depicting a main part of FIG. 4A.

As depicted in FIG. 4B, the first conductor 51 has an end 51*a* and an end 51*b* in a penetration direction. The penetration direction is a direction where the first conductor 51 penetrates the second semiconductor layer 50, and is also a thickness direction of the second semiconductor layer 50. The end 51*a* of the first conductor 51 is located within the third wiring layer 60, while the end 51*b* is located within the second wiring layer 40. The first conductor 51 has a tapered shape in the penetration direction. Accordingly, a diameter of the end 51*a* is larger than a diameter of the end 51*b*. In addition, for example, the first width described above corresponds to the size of the larger end of the first conductor 51 in the penetration direction. More specifically, the first width corresponds to the larger one of the size (diameter here) of the end 51*a* and the size (diameter here) of the end 51*b*, i.e., the size (diameter here) of the end 51*a*. Note that the diameter refers to a distance between side surfaces of any planar shape of the first conductor 51. In addition, the diameter of the end 51*a* will be expressed as a diameter d1 here.

Similarly, the second conductor 52 has an end 52*a* and an end 52*b* in a penetration direction. The penetration direction is a direction where the second conductor 52 penetrates the second semiconductor layer 50, and is also a thickness direction of the second semiconductor layer 50. The end 52*a* of the second conductor 52 is located within the third wiring layer 60, while the end 52*b* is located within the second wiring layer 40. The second conductor 52 has a tapered shape in the penetration direction. Accordingly, a diameter of the end 52*b* is larger than a diameter of the end 52*a*. In addition, for example, the second width described above corresponds to the size of the larger end of the second conductor 52 in the penetration direction. More specifically, the second width described above corresponds to the larger one of the size (diameter here) of the end 52*a* and the size (diameter here) of the end 52*b*, i.e., the size (diameter here) of the end 52*b*. Note that the diameter refers to a distance between side surfaces of any planar shape of the second conductor 52. In addition, the diameter of the end 52*b* will be expressed as a diameter d2 here. Further, the diameter d2 of the end 52*b* is smaller than the diameter d1 of the end 51*a* (d2<d1).

In addition, one of the end 51*a* that is included in the first conductor 51 and that has the first width and the end 52*b* that is included in the second conductor 52 and that has the second width described above is located in the second wiring layer 40, while the other is located in the third wiring layer 60. According to the example depicted in FIG. 4A, the end 52*b* is located in the second wiring layer 40, while the end 51*a* is located in the third wiring layer 60.

The end of the first conductor 51 on one side and the end of the second conductor 52 on one side are respectively connected to different wires belonging to one metal layer provided in the wiring layer on the same side as the side of the ends. More specifically, the end 51*a* of the first conductor 51 on the third wiring layer 60 side (one side) and the end 52*a* of the second conductor 52 on the third wiring layer 60 side (one side) are connected to wires formed by dividing one metal film provided in the third wiring layer 60 described below, or wires formed by embedding a metal film in grooves and removing unnecessary portions of the metal film. More specifically, the one metal film is a metal film M1*m* of the third wiring layer 60 which will be explained in a manufacturing method described below. The metal film M1*m* is further divided into a plurality of wires 62 belonging to a metal layer M1. Here, the wire to which the end 51*a* is connected will be referred to as a wire 62*a* for distinction from other wires, and the wire to which the end 52*a* is connected will be referred to as a wire 62*b* for distinction from other wires. In addition, the one metal layer is a metal layer closest to the second semiconductor layer 50 in the wiring layer located on the same side as the one side of the ends.

The end 51*b* of the first conductor 51 on the second wiring layer 40 side (the other side) and the end 52*b* of the second conductor 52 on the second wiring layer 40 side (the other side) are connected to the wires 42 belonging to the metal layer M1 of the second wiring layer 40.

<Third Wiring Layer>

As depicted in FIGS. 4A and 4B, the third wiring layer 60 includes an insulation film 61, wires 62, third connection pads 63, a barrier insulation film 64, and a silicon cover film 65. As depicted in the figure, the wires 62 and the third connection pads 63 are laminated on each other via the insulation film 61. Each of the third connection pads 63 faces the surface of the third wiring layer 60 on the side opposite to the second semiconductor layer 50 side. Each of the wires 62 and the third connection pads 63 may include copper, for example, and formed by damascene processing. However, this configuration is not required to be adopted.

As depicted in FIG. 4B, the third wiring layer 60 has the barrier insulation film 64 formed at a position overlapping with the wires 62 belonging to the metal layer M1 in the thickness direction. The barrier insulation film 64 has a function of preventing diffusion of metal from the barrier insulation film 64 on the side opposite to the second semiconductor layer 50 side toward the second semiconductor layer 50 side of the barrier insulation film 64. More specifically, for example, the barrier insulation film 64 prevents diffusion of metal (copper here) of the wires formed on the side of the barrier insulation film 64 opposite to the second semiconductor layer 50 side toward the second semiconductor layer 50 side of the barrier insulation film 64. However, this configuration is not required to be adopted. The barrier insulation film 64 is a film having insulation properties, and may be a film containing silicon (Si) and nitrogen (N), a film containing silicon and carbon (C), or an SiCN film containing silicon, carbon, and nitrogen, for example, but is not limited to these examples. The description will be presented here on an assumption that the barrier insulation film 64 is an SiCN film.

The silicon cover film 65 is provided for the purpose of prevention of element reflection caused by light emission, and includes a high melting point oxide.

<Fourth Wiring Layer>

As depicted in FIG. 4A, the fourth wiring layer 70 includes an insulation film 71, wires 72, fourth connection pads 73, and vias (contacts) 74. As depicted in the figure, the wires 72 and the fourth connection pads 73 are laminated on each other via the insulation film 71. Each of the fourth connection pads 73 faces the surface of the fourth wiring layer 70 on the side opposite to the third semiconductor layer 80 side, and is connected to the third connection pad 63. Each of the vias 74 achieves connection between the third semiconductor layer 80 and the wires 72, between the respective wires 72, and between the wires 72 and the fourth connection pad 73, for example. Moreover, each of the wires 72 and the fourth connection pads 73 may include copper, for example, and formed by damascene processing. However, this configuration is not required to be adopted.

<Third Semiconductor Layer>

The third semiconductor layer 80 includes a semiconductor substrate. The third semiconductor layer 80 includes a first conductivity-type, such as a p-type, monocrystal silicon substrate. A plurality of transistors T3 are provided in the third semiconductor layer 80. More specifically, the transistors T3 are provided in a region included in the third semiconductor layer 80 and overlapping with the pixel region 2A and the peripheral region 2B in the planar view. For example, each of the transistors T3 is the transistor constituting the logic circuit 13 depicted in FIG. 2.

<<Manufacturing Method of Optical Detection Device>>

Figure 5A:
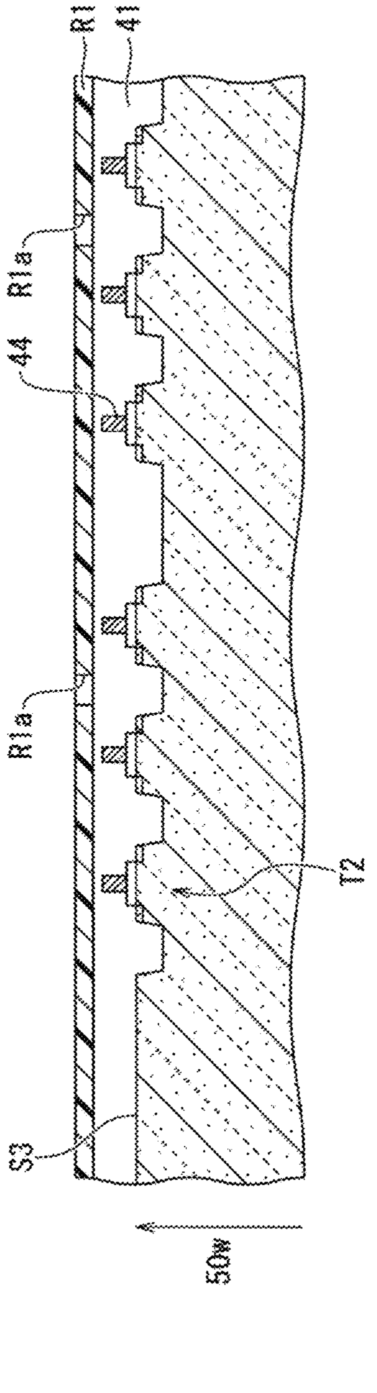
FIG. 5A is a step cross-sectional diagram depicting a manufacturing method of the optical detection device according to the first embodiment of the present technology.
Figure 5B:
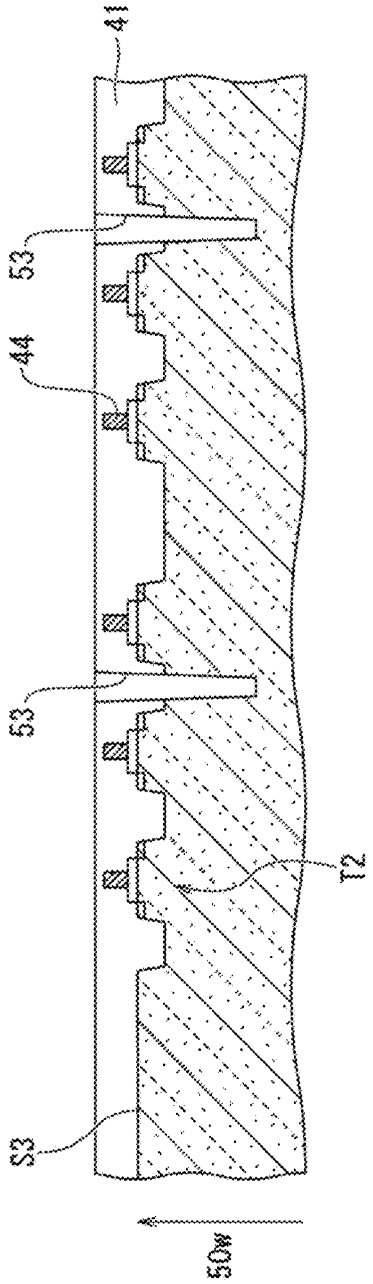
FIG. 5B is a step cross-sectional diagram continuing from FIG. 5A.

A manufacturing method of the optical detection device 1 will hereinafter be described with reference to FIGS. 5A to 5V. Note that some of constituent elements depicted in FIGS. 5A to 5V have scales and shapes different from those of the corresponding configuration elements depicted in FIGS. 4A and 4B, to describe the manufacturing method of the optical detection device 1 in a more easy-to-understand manner. Moreover, a cross section of the optical detection device 1 depicted in each of FIGS. 5A to 5V may also be considered as a cross section different from each of the cross sections depicted in FIGS. 4A and 4B.

The second conductors 52 are formed by a via middle (Via Middle) method. First, as depicted in FIG. 5A, elements such as the transistors T2 are formed on the third surface S3 side of a second semiconductor layer 50*w* of a first conductivity type such as a p-type. Next, some of layers of the second wiring layer 40 is formed on the third surface S3. More specifically, the vias 44 and the insulation film 41 covering the vias 44 are formed on the third surface S3. Thereafter, a resist pattern R1 is formed on an exposed surface of the insulation film 41 by a known lithography technology.

Subsequently, etching is carried out with use of a mask of the resist pattern R1 by a known etching technology. More specifically, a portion exposed through openings R1*a* of the resist pattern R1 is etched to reach an interior of the second semiconductor layer 50*w* and form holes 53 as depicted in FIG. 5B. For example, each of the holes 53 has a size ranging from 40 to 300 nm inclusive, but is not required to have this size. Each of the second conductors 52 formed in the holes 53 has a size substantially similar to the size of the holes 53. Accordingly, the second width is in the range from 40 to 300 nm inclusive. Thereafter, the resist pattern R1 is removed. For example, the holes 53 are formed in a region where the transistors T2 are densely provided in a certain case. However, this configuration is not required to be adopted. For example, the holes 53 are formed in a narrow region in the planar view in a certain case, such as a space between the respective transistors T2. However, this configuration is not required to be adopted. In these cases, the diameter of the holes 53 needs to be reduced, and the aspect ratio of the holes 53 needs to be raised.

Figure 5C:
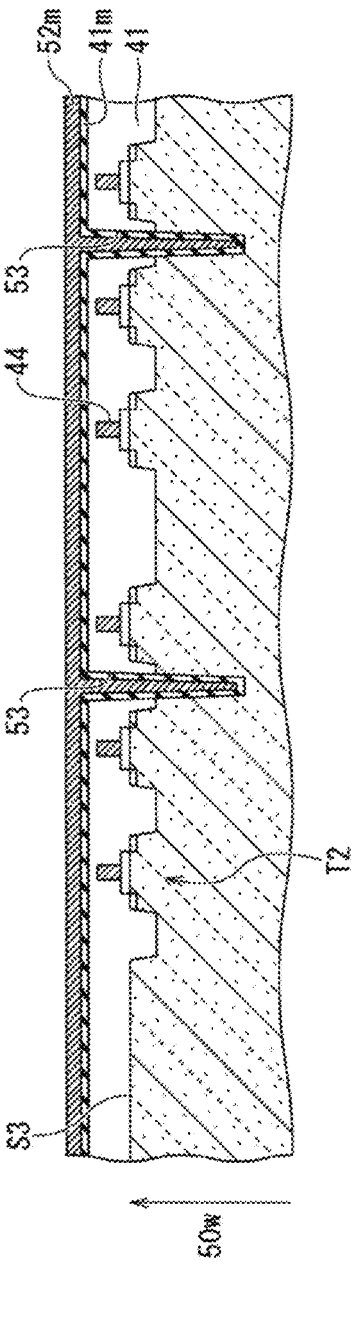
FIG. 5C is a step cross-sectional diagram continuing from FIG. 5B.

Next, as depicted in FIG. 5C, an insulation film 41*m* and a film 52*m* are sequentially laminated in this order on an exposed surface including inner walls of the holes 53. For example, the insulation film 41*m* includes silicon oxide ($SiO_2$). The film 52*m* includes the second material constituting the second conductors 52, and is a tungsten film in this example. The insulation film 41*m* is provided for insulation between silicon constituting the second semiconductor layer 50*w* and tungsten corresponding to the second material. In addition, each of the holes 53 has a high aspect ratio. Accordingly, it is preferable that the insulation film 41*m* be laminated by a forming method achieving a high coverage, such as atomic layer deposition (ALD, Atomic Layer Deposition). For example, the insulation film 41*m* is laminated with a film thickness of approximately 20 nm. However, this configuration is not required to be adopted. The film 52 including the second material is laminated by chemical vapor deposition (CVD, Chemical Vapor Deposition). As already described above, tungsten has preferable embeddability, and hence exhibits preferable embeddability for the holes 53 having a high aspect ratio.

Figure 5D:
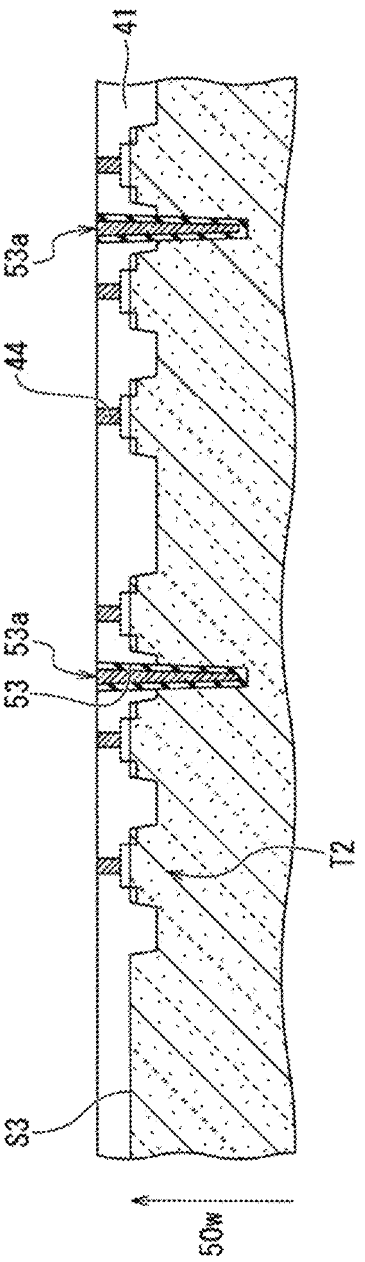
FIG. 5D is a step cross-sectional diagram continuing from FIG. 5C.
Figure 5E:
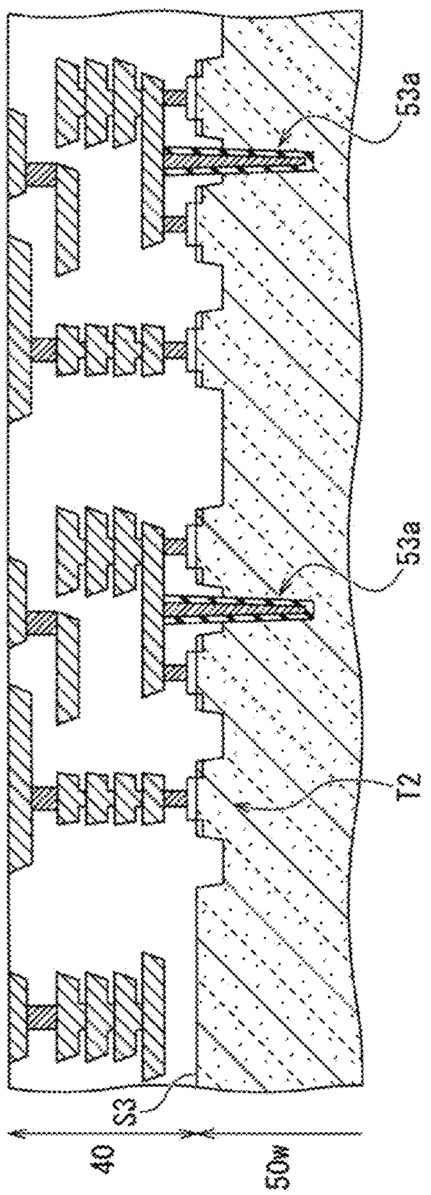
FIG. 5E is a step cross-sectional diagram continuing from FIG. 5D.

Thereafter, as depicted in FIG. 5D, unnecessary portions of the insulation film 41*m* and the film 52*m* are removed by etching back and CMP (Chemical Mechanical Polishing). Moreover, the insulation film 41 is ground until the vias 44 are exposed. In addition, a content embedded in each of the holes 53 will here be referred to as a column 53*a*. The column 53*a* has a double layer structure including the insulation film 41*m* in an outer part and tungsten in an inner part. Then, as depicted in FIG. 5E, respective remaining layers of the second wiring layer 40 are formed to complete the second wiring layer 40.

Figure 5F:
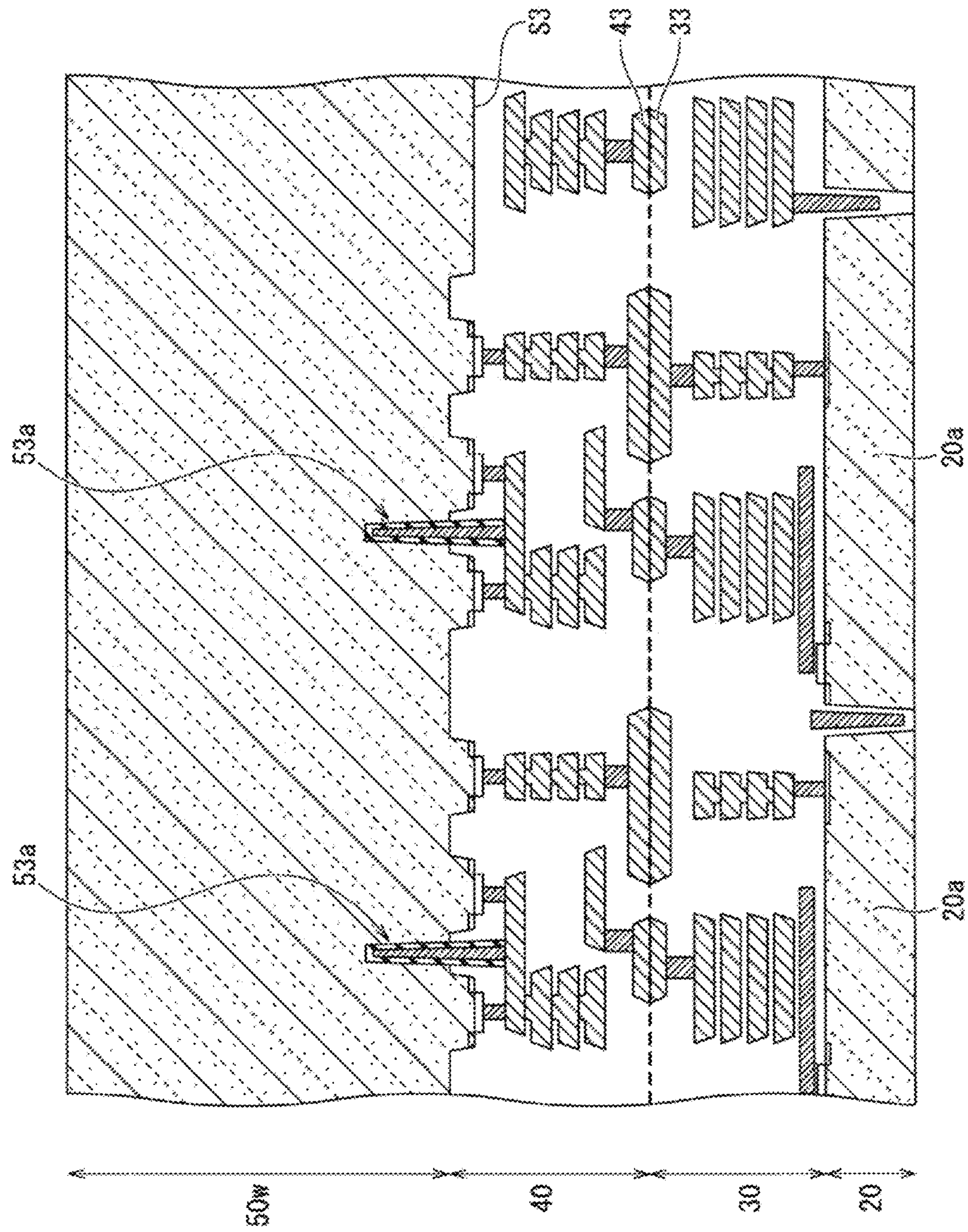
FIG. 5F is a step cross-sectional diagram continuing from FIG. 5E.
Figure 5G:
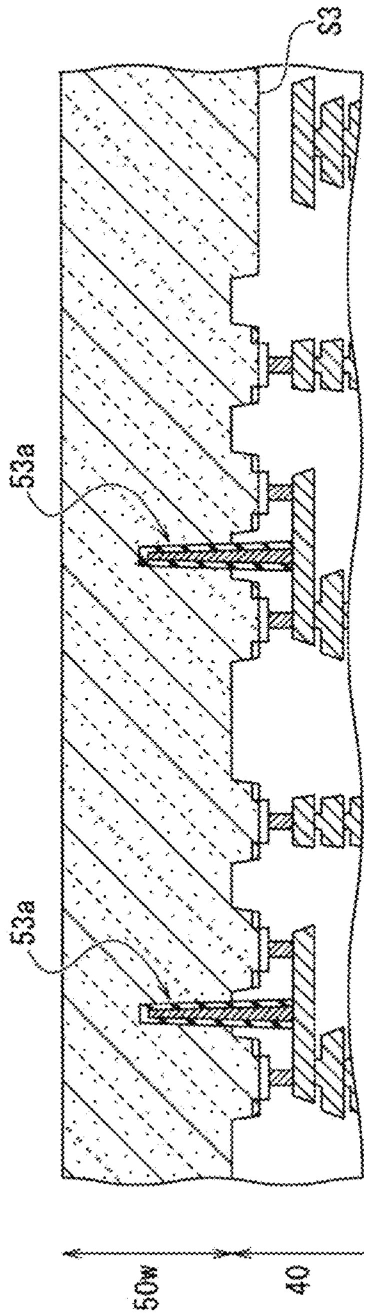
FIG. 5G is a step cross-sectional diagram continuing from FIG. 5F.

Subsequently, as depicted in FIG. 5F, the second semiconductor layer 50*w* on which the second wiring layer 40 is laminated and the first semiconductor layer 20 as a separately prepared layer on which the first wiring layer 30 is laminated are joined to each other by F2F. Thereafter, as depicted in FIG. 5G, the back surface side of the second semiconductor layer 50*w* is ground by back grinding to reduce the thickness of the second semiconductor layer 50*w*.

Figure 5H:
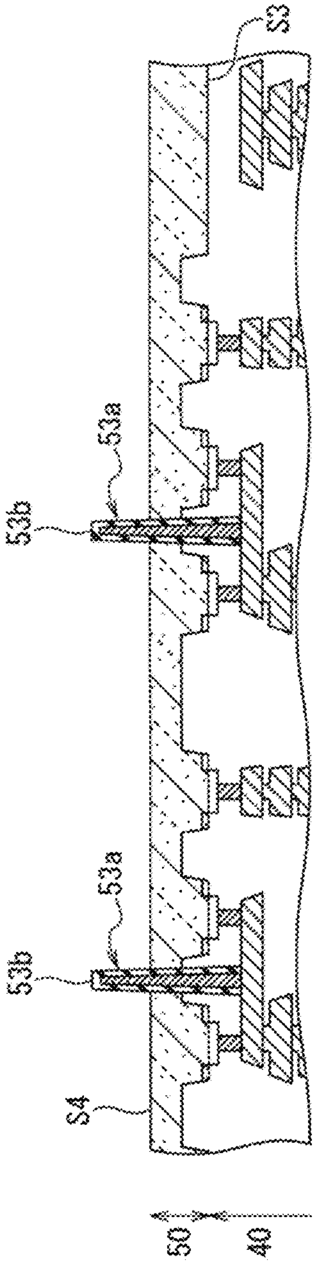
FIG. 5H is a step cross-sectional diagram continuing from FIG. 5G.

Moreover, as depicted in FIG. 5H, silicon constituting the second semiconductor layer 50*w* is selectively etched by known dry etching to leave a portion constituting the second semiconductor layer 50. More specifically, the silicon constituting the second semiconductor layer 50*w* is selectively etched by utilizing a difference in etching rate for selected etchant between the silicon constituting the second semiconductor layer 50*w* and silicon oxide constituting the insulation film 41*m*. An outer circumference of each of the columns 53*a* includes the insulation film 41*m* including silicon oxide. Accordingly, the columns 53*a* are not etched but left, and a part of each of the columns 53*a* is projected from the fourth surface S4 of the second semiconductor layer 50. Thereafter, each of the columns 53*a*, more specifically, the second material of each of the columns 53*a*, is formed into one conductor that penetrates the second semiconductor layer 50. In other words, one conductor that penetrates the second semiconductor layer 50 is formed in the second semiconductor layer 50.

Figure 5I:
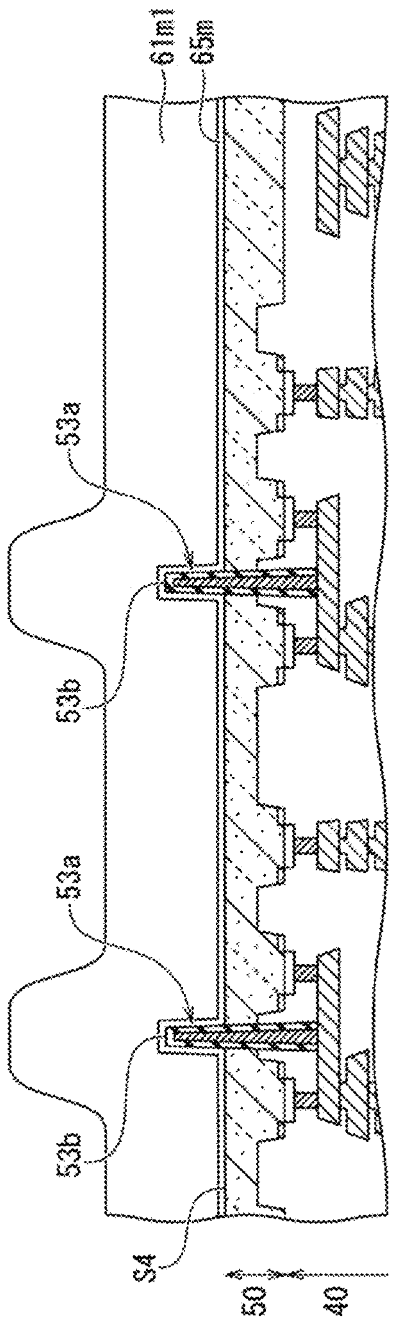
FIG. 5I is a step cross-sectional diagram continuing from FIG. 5H.

Subsequently, the third wiring layer 60 is formed on the fourth surface S4 of the second semiconductor layer 50. As depicted in FIG. 5I, a film 65*m* and an insulation film 61*m*1 of the third wiring layer 60 are laminated in this order on the exposed surfaces of the columns 53*a* and the fourth surface S4. The film 65*m* is a film including high melting point oxide constituting the silicon cover film 65, while the insulation film 61*m*1 is a film including silicon oxide, for example. More specifically, the film 65*m* and the insulation film 61*m*1 are laminated in this order on the fourth surface S4 in such a manner as to cover ends 53*b* which each correspond to one end of the column 53*a*. The ends 53*b* of the columns 53*a* are no longer exposed after being covered by the insulation film 61*m*1. The one end of each of the columns 53*a* refers to an end located near the fourth surface S4 in a penetration direction where the column 53*a* penetrates the second semiconductor layer 50.

Figure 5J:
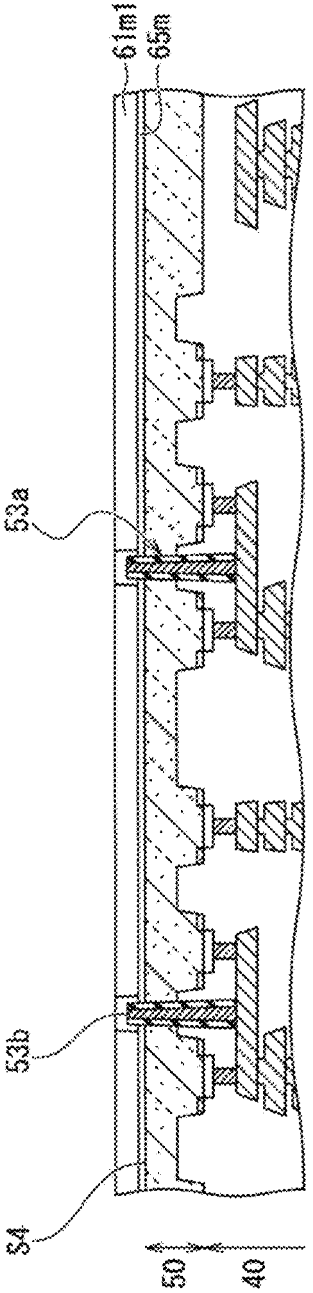
FIG. 5J is a step cross-sectional diagram continuing from FIG. 5I.

Next, as depicted in FIG. 5J, an exposed surface of the insulation film 61*m*1 is flattened by CMP. At this time, tungsten of the columns 53*a* may be exposed by grinding the ends 53*b* and causing the ends 53*b* to be recessed with use of CMP. Moreover, portions included in the film 65*m* and laminated around the columns 53*a* are removed by cleaning with a chemical solution. In such a manner, the silicon cover film 65 depicted in FIG. 4A is formed.

Figure 5K:
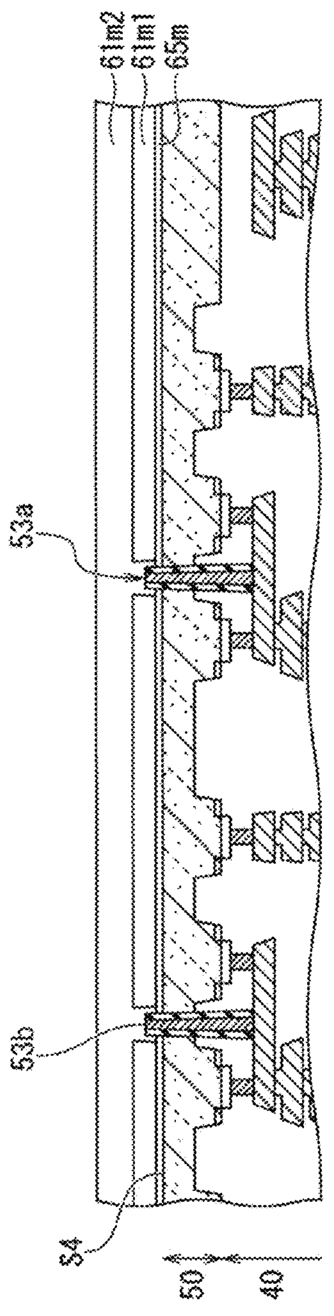
FIG. 5K is a step cross-sectional diagram continuing from FIG. 5J.

Subsequently, as depicted in FIG. 5K, an insulation film 61*m*2 is laminated in such a manner as to cover the ends 53*b* of the columns 53*a*. The ends 53*b* of the columns 53*a* are no longer exposed after being covered by the insulation film 61*m*2.

Figure 5L:
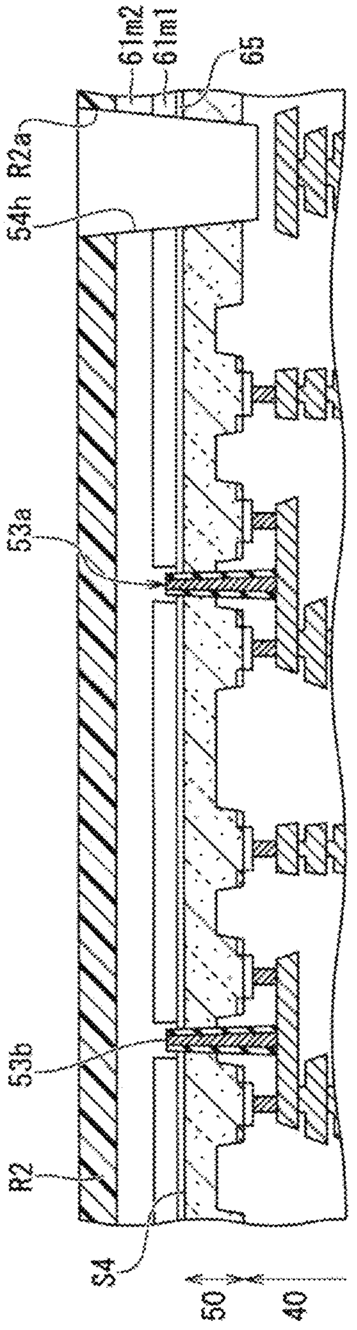
FIG. 5L is a step cross-sectional diagram continuing from FIG. 5K.

Subsequently, as depicted in FIG. 5L, a resist pattern R2 is formed on an exposed surface of the insulation film 61*m*2 by a known lithography technology, and etching is carried out with use of a mask of the resist pattern R2 by a known etching technology. More specifically, a portion exposed through an opening R2*a* of the resist pattern R2 is etched to form a hole 54*h* penetrating the second semiconductor layer 50 and reaching the second wiring layer 40 from the insulation film 61*m*2.

Figure 5M:
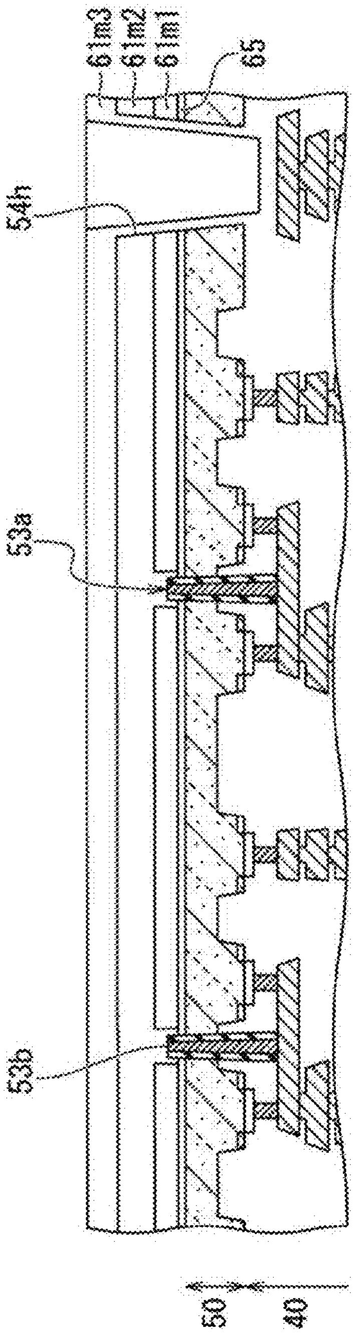
FIG. 5M is a step cross-sectional diagram continuing from FIG. 5L.
Figure 5N:
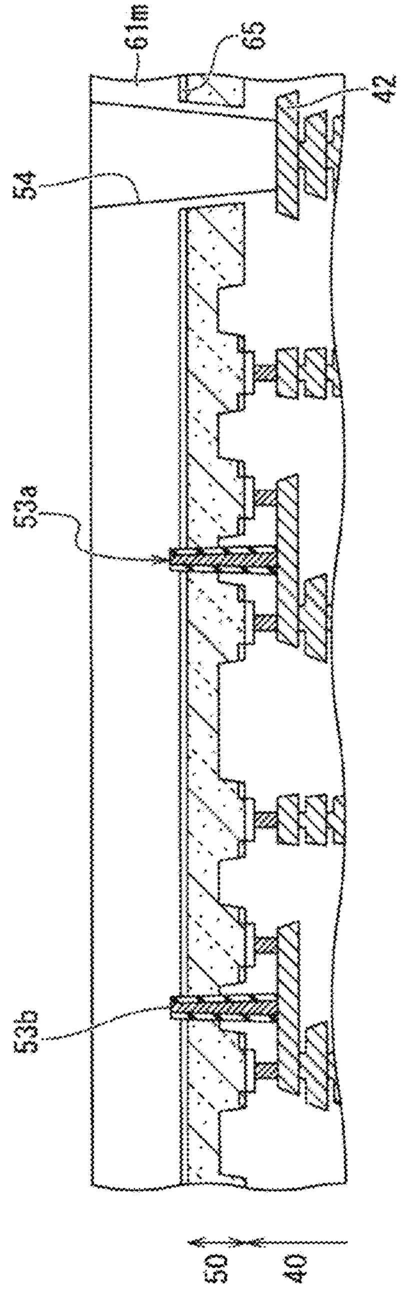
FIG. 5N is a step cross-sectional diagram continuing from FIG. 5M.
Figure 50:
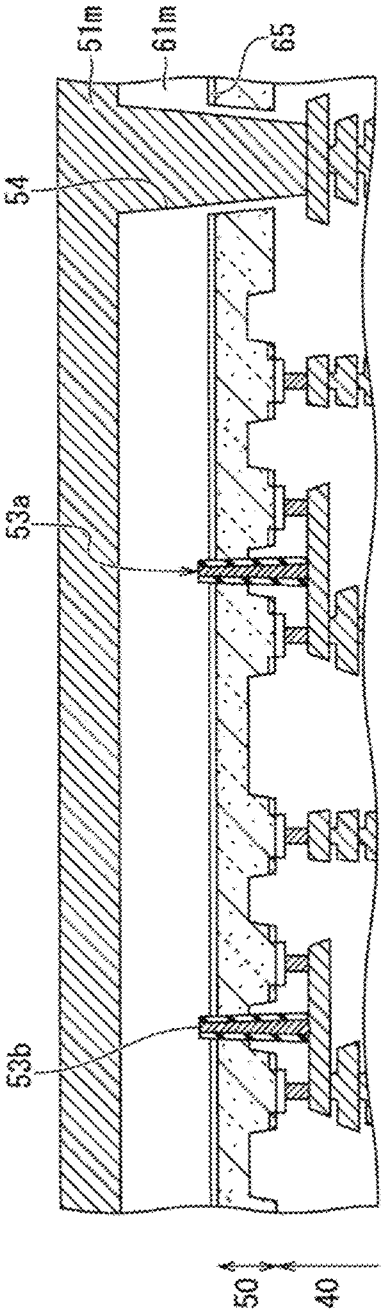

Thereafter, as depicted in FIG. 5M, an insulation film 61*m*3 including silicon oxide, for example, is laminated on an inner wall of the hole 54*h* and an exposed surface of the insulation film 61*m*2. Then, as depicted in FIG. 5N, the insulation film at the bottom of the hole 54*h* is removed by etching back until etching reaches the wire 42. In this manner, a hole 54 is produced. For example, the hole 54 has a diameter ranging of 1 to 5 μm inclusive, but is not required to have this size. The first conductor 51 formed in the hole 54 thus configured has a size substantially similar to the size of the hole 54. Accordingly, the first width is in the range of 1 to 5 μm inclusive. Note that each of the insulation films 61*m*1, 61*m*2, and 61*m*3 will hereinafter simply be referred to as an insulation film 61*m* without distinction between these films.

Subsequently, as depicted in FIG. 5O, an insulation film 51*m* including the first material, i.e., copper, is laminated on an exposed surface of the insulation film 61*m*. The film 51*m* is laminated in such a manner as to fill an interior of the hole 54. The hole 54 has a sufficiently large diameter and a low aspect ratio in comparison with those of the holes 53 depicted in FIG. 5B. Accordingly, even copper having lower embeddability than tungsten can be embedded into the hole 54.

Figure 5P:
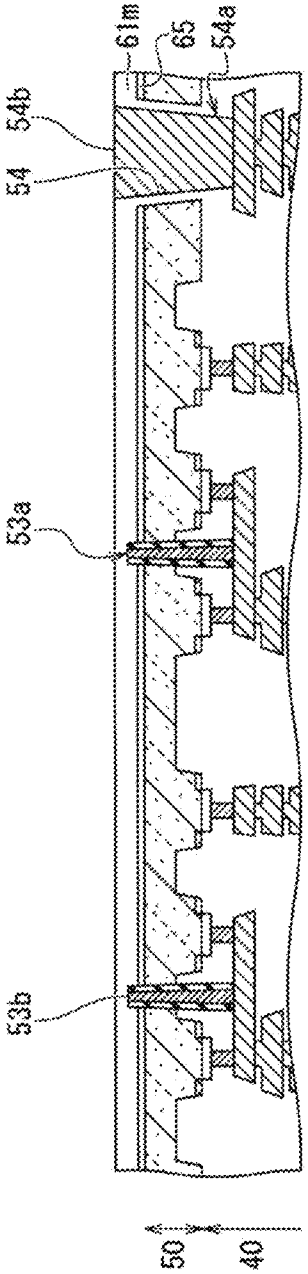
FIG. 5P is a step cross-sectional diagram continuing from FIG. 5O.

Then, an unnecessary portion of the film 51*m* depicted in FIG. 5O is removed by CMP. The ends 53*b* of the columns 53*a* in this example are covered by the insulation film 61*m*. Accordingly, the columns 53*a* and the ends 53*b* thereof are difficult to grind by grinding with CMP. In other words, exposure of cross sections of the columns 53*a* is allowed to decrease. This configuration hence reduces simultaneous grinding of copper of the film 51*m* and tungsten of the columns 53*a*. After removal of the unnecessary portion of the film 51*m* depicted in FIG. 5O by CMP, a state depicted in FIG. 5P is produced. Here, a content embedded in the hole 54 will be referred to as a column 54*a*. In addition, by completion of this step, the first material constituting the column 54*a* becomes a different conductor penetrating the second semiconductor layer 50. In other words, the different conductor penetrating the second semiconductor layer 50 is formed in the second semiconductor layer 50. In addition, an exposed end of the column 54*a* will be referred to as an end 53*b*. Because the hole 54 has a low aspect ratio, the column 54*a* also has a low aspect ratio.

Figure 5Q:
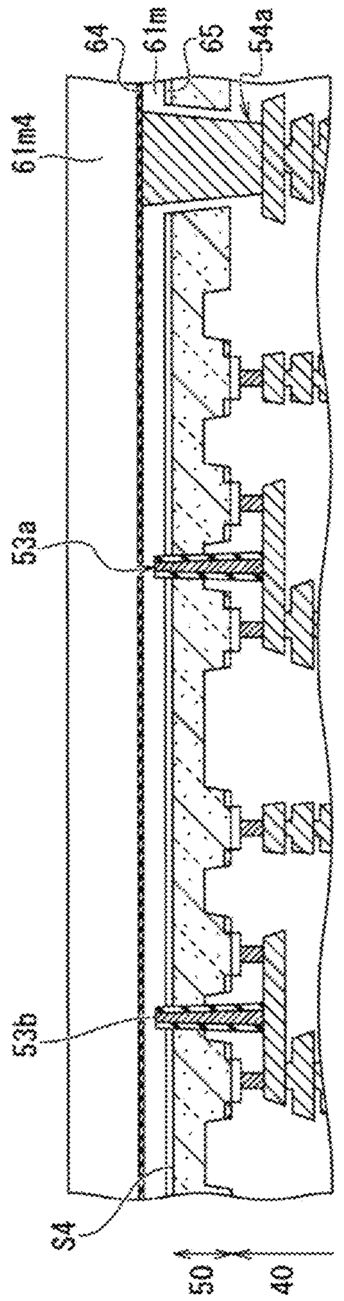
FIG. 5Q is a step cross-sectional diagram continuing from FIG. 5P.

Subsequently, as depicted in FIG. 5Q, the barrier insulation film 64 and an insulation film 61*m*4 of the third wiring layer 60 are laminated in this order on an exposed surface of the insulation film 61*m*. More specifically, the barrier insulation film 64 and the insulation film 61*m*4 are laminated in such a manner as to cover one end of the column 54*a*, i.e., the end 54*b*. The one end of the column 54*a* refers to an end located near the fourth surface S4 in a penetration direction where the column 54*a* penetrates the second semiconductor layer 50. Note that each of the insulation film 61*m* and the insulation film 61*m*4 will simply be referred to as the insulation film 61 in a case where no distinction is necessary between these films.

Figure 5R:
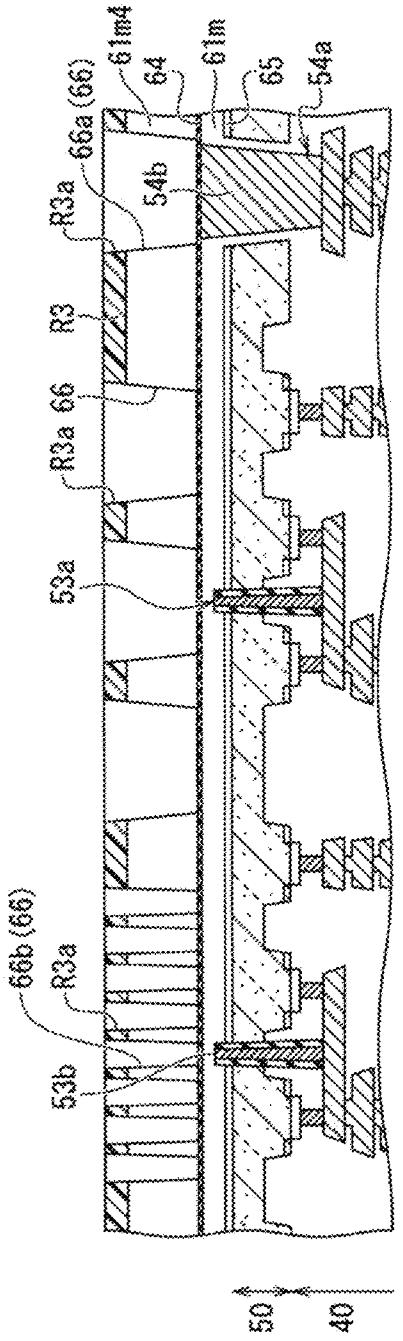
FIG. 5R is a step cross-sectional diagram continuing from FIG. 5Q.

Next, as depicted in FIG. 5R, a resist pattern R3 is formed on an exposed surface of the insulation film 61*m*4 by a known lithography technology, and etching is carried out with use of a mask of the resist pattern R3 by a known etching technology. More specifically, the insulation film 61*m*4 exposed through openings R3*a* of the resist pattern R3 is etched until etching reaches the barrier insulation film 64. In this manner, a plurality of openings 66 are formed as openings where wires 62 are provided. In other words, the barrier insulation film 64 also functions as an etching stop layer. Thereafter, the resist pattern R3 is removed.

Note here that each aspect ratio of the openings 66 formed by etching decreases with an increase in the size of the openings R3*a* of the resist pattern R3, and increases with a decrease in the size of the openings R3*a*. Moreover, typically, a speed for etching the openings 66 lowers with an increase in the aspect ratio of the openings 66, and rises with a decrease in the aspect ratio of the openings 66. For example, an opening 66*a* which is an opening so formed as to overlap with the column 54*a* in the planar view has a lower aspect ratio than an opening 66*b* which is an opening so formed as to overlap with one of the columns 53*a* in the planar view. However, this configuration is not required to be adopted. In this configuration, etching of the opening 66*a* proceeds more rapidly than etching of the opening 66*b*. According to this example, etching of all the openings 66 is temporarily stopped at the barrier insulation film 64 to cancel a difference in etching proceeding speed produced by a difference in width of the openings 66. This temporal stop of etching of the opening 66*a* with use of the barrier insulation film 64 functioning as an etching stop layer can prevent etching of the column 54*a* including copper before the opening 66*b* and the other openings 66 reach the barrier insulation film 64. In such a manner, an increase in an etching volume of the column 54*a* including copper can be reduced. Moreover, the barrier insulation film 64 has a function of protecting the column 54*a* during the step of removing the resist pattern R3.

Figure 5S:
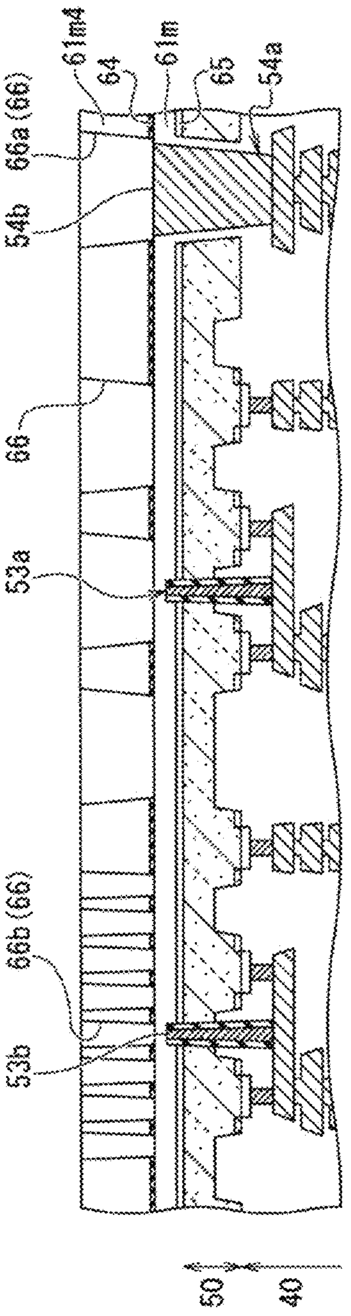
FIG. 5S is a step cross-sectional diagram continuing from FIG. 5R.
Figure 5T:
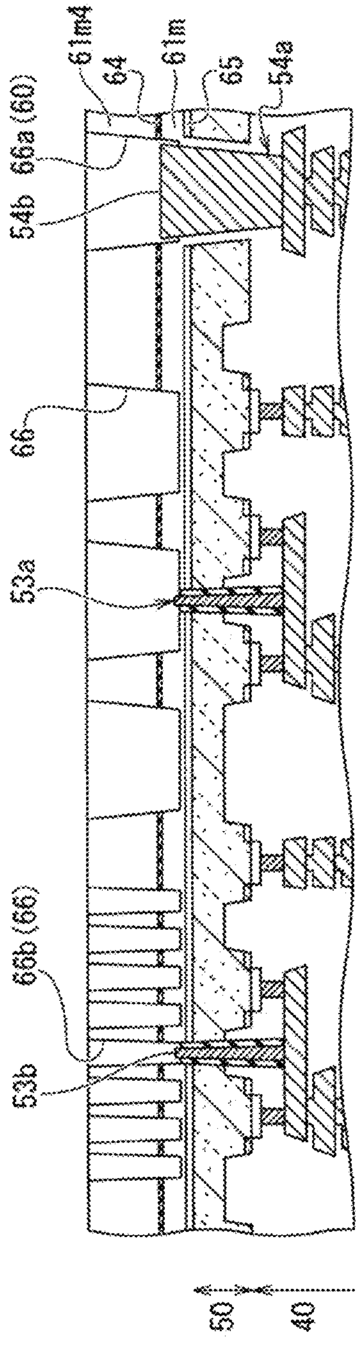
FIG. 5T is a step cross-sectional diagram continuing from FIG. 5S.

Subsequently, as depicted in FIG. 5S, exposed portions of the barrier insulation film 64 at all the openings 66, i.e., portions functioning as the etching stop layer, are removed by etching. Thereafter, as depicted in FIG. 5T, the insulation film 61*m* is etched from all of the openings 66. As described above, all etching is temporarily stopped by the barrier insulation film 64. Accordingly, etching of the insulation film 61*m* is allowed to be started substantially at the same time for all the openings 66. Moreover, the etching in FIG. 5T is carried out until the ends 53*b* of the columns 53*a* are exposed. In addition, a portion included in the barrier insulation film 64 and remaining without being removed functions as a barrier insulation film.

Note that the ends 53*b* of the columns 53*a* and the end 54*b* of the column 54*a* may project from the bottoms of the openings 66 as depicted in FIG. 5T. Such a configuration of the ends 53*b* and the end 54*b* increases a contact area with the wires 62 embedded in the openings 66, and thus improves adhesion with the wires 62.

Figure 5U:
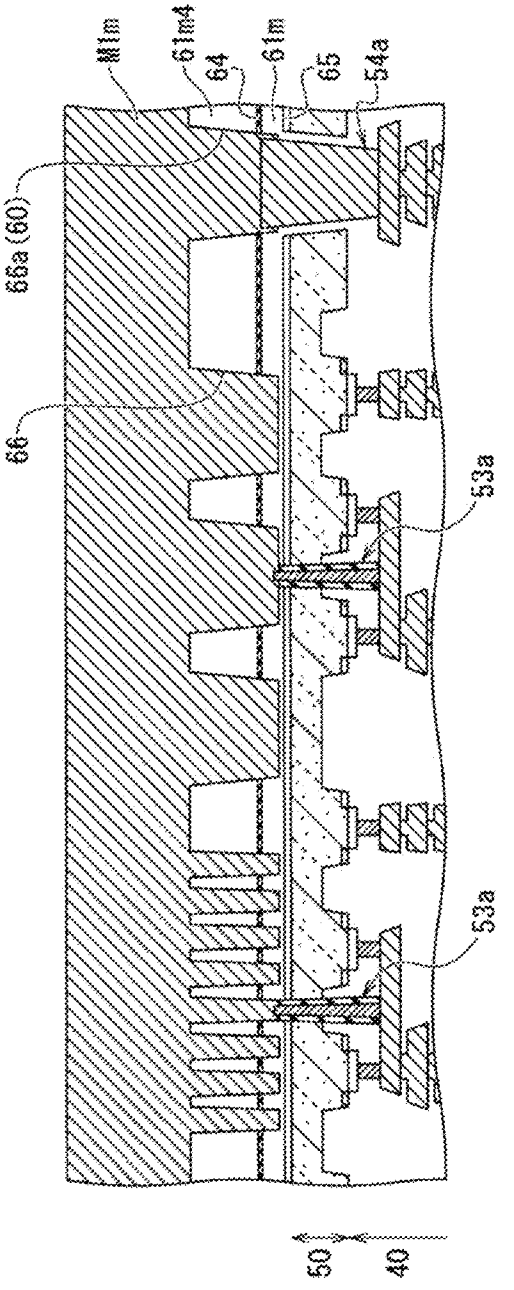
FIG. 5U is a step cross-sectional diagram continuing from FIG. 5T.
Figure 5V:
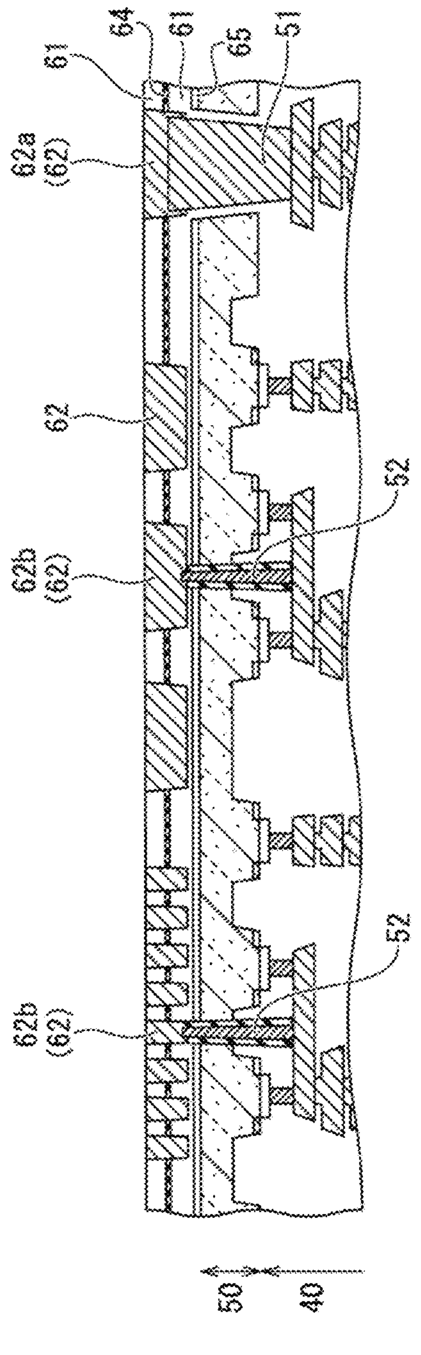
FIG. 5V is a step cross-sectional diagram continuing from FIG. 5U.

Next, as depicted in FIG. 5U, the metal film M1*m* is laminated on inner walls of the openings 66 and an exposed surface of the insulation film 61*m*4. Thereafter, as depicted in FIG. 5V, an unnecessary portion of the metal film M1*m* is removed by CMP. In such a manner, the metal film M1*m* is divided to form the wires 62 belonging to the metal layer M1. In addition, portions connected to the wires 62*b* and including tungsten of the columns 53*a* correspond to the second conductors 52, while the column 54*a* connected to the wire 62*a* corresponds to the first conductor 51.

Subsequently, while not depicted in the figure, remaining layers of the third wiring layer 60 are formed. Thereafter, the second semiconductor layer 50 on which the third wiring layer 60 is laminated and the third semiconductor layer 80 separately prepared as a layer on which the fourth wiring layer 70 is laminated are subsequently joined to each other by B2F. However, the step order is not limited to this example. Then, the light collection layer 90 is formed on the light entrance surface side. As a result, the optical detection device 1 reaches a substantially completed state. The optical detection device 1 is provided on each of a plurality of chip forming regions sectioned by scribe lines (dicing lines) on a semiconductor substrate. Thereafter, the plurality of chip forming regions are divided into discrete pieces along the scribe lines to produce semiconductor chips 2 each carrying the optical detection device 1.

<<Operation>>

An operation of the optical detection device 1 will hereinafter be described. As depicted in FIG. 4B, the first conductor 51 electrically connects the wire 42 formed in the second wiring layer 40 and the wire 62*a* formed in the third wiring layer 60. Meanwhile, the second conductor 52 electrically connects the wire 42 formed in the second wiring layer 40 and the wire 62*b* formed in the third wiring layer 60.

<<Main Advantageous Effects of First Embodiment>>

Main advantageous effects of the first embodiment will hereinafter be described. Before the description of these effects, galvanic corrosion will be touched upon. In a case of exposure of a plurality of different types of metal in electrolyte solution, a base metal is selectively corroded. This phenomenon is called galvanic corrosion. For example, when different types of metal are exposed in liquid during CMP, metal having a higher ionization tendency is eluted by galvanic corrosion. For example, in a case where copper and cobalt are exposed in liquid, cobalt is eluted. Accordingly, a TSV including copper (including noble metal) and a TSV including cobalt (including base metal) both penetrating one semiconductor layer are difficult to form in a mixed state.

Meanwhile, the optical detection device 1 according to the first embodiment of the present technology has the following configuration. One conductor penetrating the second semiconductor layer 50 is formed in the second semiconductor layer 50. The insulation film 61 is laminated in such a manner as to cover one end of the one conductor. A different conductor including a material different from a material constituting the one conductor and having a diameter larger than the one conductor is formed from the insulation film 61 side in such a manner as to penetrate the second semiconductor layer 50. The wire 62*b* connected to the one conductor and the wire 62*a* connected to the different conductor are formed from the insulation film 61 side. This configuration reduces a state of exposure of both the one conductor and the different conductor into solution, and thus reduces galvanic corrosion. Accordingly, the first conductor 51 and the second conductor 52 including different materials are allowed to be provided.

Moreover, according to the optical detection device 1 capable of reducing galvanic corrosion in the first embodiment of the present technology, the first conductor 51, which is required to have low resistance, is allowed to include copper and have a large diameter, and the second conductor 52 provided in a narrow region is allowed to include metal, such as tungsten, which exhibits preferable embeddability even in a portion having a small diameter where copper is difficult to embed.

Further, according to the optical detection device 1 in the first embodiment of the present technology, the first conductor 51 having a large diameter and low resistance is provided in the first region 50*a* that is included in the second semiconductor layer 50 and that is overlapping with the peripheral region 2B in the planar view. Accordingly, reduction of power consumption and further speeding-up of the optical detection device 1 are achievable.

In addition, according to the optical detection device 1 in the first embodiment of the present technology, the second conductor 52 has a high aspect ratio and a small diameter. Accordingly, the second conductor 52 is allowed to be provided in a narrow region in the planar view, and hence is allowed to be provided in the second region 50*b* that is included in the second semiconductor layer 50 and that is overlapping with the pixel region 2A in the planar view, for example. More specifically, the second conductor 52 is allowed to be formed in the second region 50*b* in a narrow space between the respective transistors T2. In other words, small TSVs are allowed to be disposed within the pixels 3. Accordingly, the degree of freedom in design of the optical detection device 1 increases.

Moreover, according to the optical detection device 1 in the first embodiment of the present technology, the second conductor 52 having a high aspect ratio is allowed to be provided. Accordingly, even in a case where the second semiconductor layer 50 has a relatively large thickness, the second conductor 52 penetrating the second semiconductor layer 50 can be formed. For example, even in a case where the thickness of the second semiconductor layer 50 exceeds one micron though not limited to this example, the second conductor 52 is allowed to be formed in the second semiconductor layer 50.

Further, according to the optical detection device 1 in the first embodiment of the present technology, the second conductor 52 is allowed to have a small diameter. Accordingly, an increase in the sizes of the optical detection device 1 and the pixels 3 can be reduced. In addition, the configuration of the second conductor 52 having a small diameter can reduce effects of the second conductor 52 on the transistor T2, and also reduce an increase in a keep-out distance between the second conductor 52 and the transistor T2. The keep-out distance refers to a distance sufficient for reducing effects of the second conductor 52 on the transistor T2 to a certain level or lower.

In addition, according to the optical detection device 1 in the first embodiment of the present technology, the first conductor 51 used as a power source line having high voltage, for example, and the second conductor 52 having a small size are provided in different regions of the second semiconductor layer 50, i.e., provided separately from each other. Accordingly, this configuration can reduce effects of the first conductor 51 on the second conductor 52, and thus increase reliability of the optical detection device 1.

While each of the columns 53*a* has the double layered structure including the insulation film 41*m* in the outer part and tungsten in the inner part according to the first embodiment described above, this configuration is not required to be adopted. A different layer such as a barrier metal layer may be provided between the insulation film 41*m* and the film 52*m*. In addition, a different layer such as a barrier metal layer may be provided between the column 54*a* and the insulation film 61. The barrier metal is titanium nitride (TiN), for example, but is not limited to this example, and functions as an adhesive layer for bringing the insulation film and tungsten into close contact with each other.

Moreover, according to the first embodiment described above, the end 51*b* of the first conductor 51 on the second wiring layer 40 side (the other side) and the end 52*b* of the second conductor 52 on the second wiring layer 40 side (the other side) are both connected to the wires 42 belonging to the same metal layer (metal layer M1) of the second wiring layer 40. However, this configuration is not required to be adopted. The end 51*b* and the end 52*b* may be connected to the wires 42 belonging to different meta layers (e.g., metal layer M1 and metal layer M2).

Note that all elements of the circuit of the pixel 3 depicted in FIG. 3 may be provided in the first semiconductor layer 20. In that case, the transistor T1 may be the transistor constituting the circuit of the pixel 3 depicted in FIG. 3. Moreover, a capacitor, an analog circuit, a logic circuit, a memory circuit, and the like may appropriately be combined and arranged in each of the second semiconductor layer 50 and the third semiconductor layer 80 as a signal processing circuit disposed in a following stage of the circuit depicted in FIG. 3. In that case, each of the transistors T2 and T3 may be a transistor constituting these circuits.

Further, while the first conductor 51 is used as the power source line in the first embodiment described above, this configuration is not required to be adopted. The first conductor 51 may be a path such as a signal output line to the outside of the semiconductor chip 2, a drive line of each transistor within the semiconductor chip 2, and a reference potential line. In addition, the second conductor 52 may function as a vertical signal line in a case where the readout circuit 15 is provided in the second semiconductor layer 50, or may function as a path for connection from the circuit formed in the second semiconductor layer 20 to the circuit formed in the third semiconductor layer 80 in a case where the readout circuit 15 is provided in the first semiconductor layer 20.

Note that the first conductor 51 and the second conductor 52 may include a material of the same type as long as the first conductor 51 and the second conductor 52 have different sizes (diameters in this example). In addition, the first conductor 51 and the second conductor 52 may have the same size (diameter in this example) as long as the first conductor 51 and the second conductor 52 include different materials.

[Modification 1 of First Embodiment]

Hereinafter described will be modification 1 of the first embodiment of the present technology depicted in FIG. 6. The optical detection device 1 according to the present modification 1 of the first embodiment is different from the optical detection device 1 according to the first embodiment described above in a junction method for the respective semiconductor layers. Other configurations of the optical detection device 1 are basically similar to the corresponding configurations of the optical detection device 1 according to the first embodiment described above. Note that the constituent elements already described will be given the same reference signs, and will not be repeatedly explained.

The first semiconductor layer 20 and the second semiconductor layer 50 are joined to each other by F2B (Back to Face), i.e., such that the element forming surface and the back surface face each other, via the first wiring layer 30 and the third wiring layer 60. In addition, the second semiconductor layer 50 and the third semiconductor layer 80 are joined to each other by F2F (Back to Face), i.e., such that the respective element forming surfaces face each other, via the second wiring layer 40 and the fourth wiring layer 70.

<<Main Advantageous Effects of Modification 1 of First Embodiment>>

Advantageous effects similar to those of the optical detection device 1 of the first embodiment described above can be offered by the optical detection device 1 according to modification 1 of the first embodiment described here.

[Modification 2 of First Embodiment]

Figure 7:
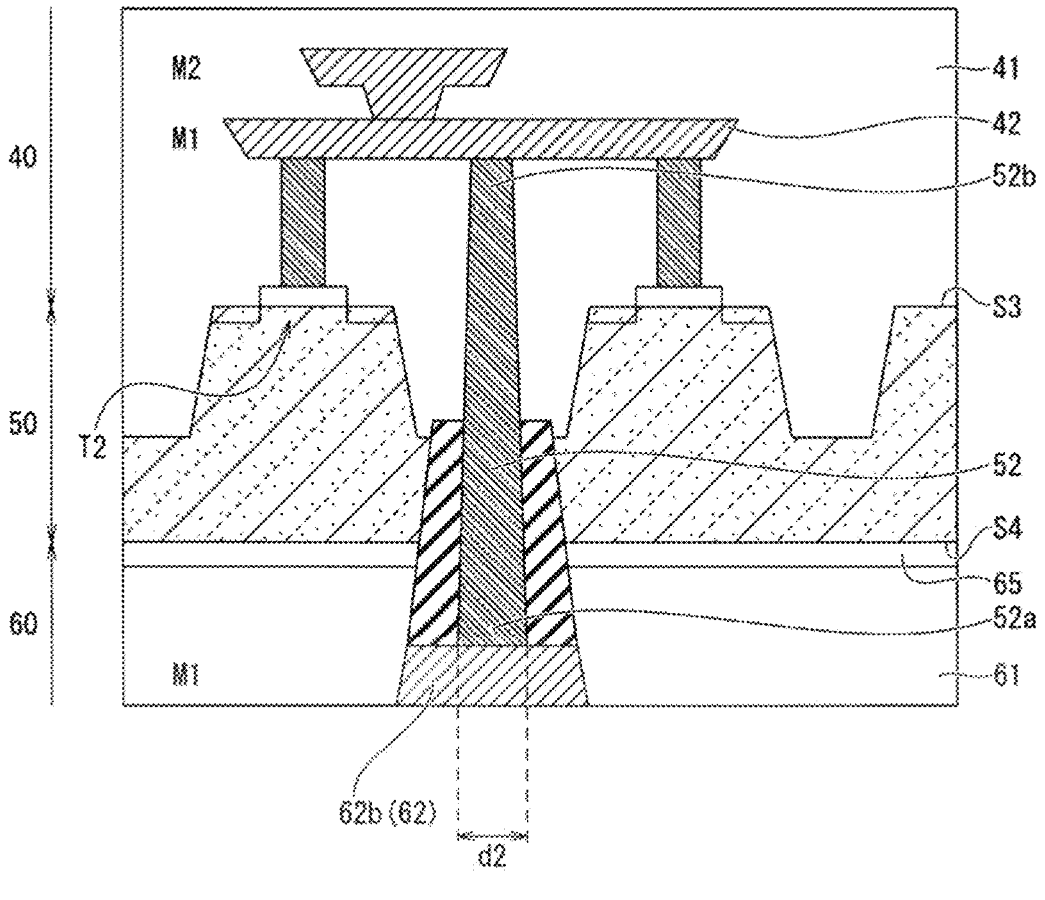
FIG. 7 is a partially enlarged diagram depicting a main part of a longitudinal cross section of an optical detection device according to modification 2 of the first embodiment of the present technology.

Hereinafter described will be modification 2 of the first embodiment of the present technology depicted in FIG. 7. The optical detection device 1 according to the present modification 2 of the first embodiment is different from the optical detection device 1 according to the first embodiment described above in that the second conductor 52 is formed by a via last (Via Last) method. Other configurations of the optical detection device 1 are basically similar to the corresponding configurations of the optical detection device 1 according to the first embodiment described above. Note that the constituent elements already described will be given the same reference signs, and will not repeatedly be explained.

<Second Conductor>

The second conductor 52 which is formed by via last has a shape tapered in the direction opposite to the tapered direction of the first embodiment described above in the penetration direction. Accordingly, the diameter of the end 52*a* is larger than the diameter of the end 52*b*. In addition, for example, the second width described above corresponds to the size of the larger end of the second conductor 52 in the penetration direction. More specifically, the second width described above corresponds to the larger one of the size (diameter here) of the end 52*a* and the size (diameter here) of the end 52*b*, i.e., the size (diameter here) of the end 52*a*. Note that the diameter refers to a distance between side surfaces of any planar shape of the second conductor 52. Moreover, the diameter of the end 52*a* is expressed as a diameter d2 here. In addition, both the end 51*a* that is included in the first conductor 51 and that has the first width and the end 52*a* that is included in the second conductor 52 and that has the second width are located in the same wiring layer which is the second wiring layer 40 or the third wiring layer 60. According to this example, both the end 51*a* depicted in FIG. 4A and the end 52*a* depicted in FIG. 7 are located in the third wiring layer 60.

<<Manufacturing Method of Optical Detection Device>>

A manufacturing method of the optical detection device 1 will hereinafter be described with reference to FIGS. 8A and 8B. Note that only a part different from the manufacturing method of the optical detection device 1 described above in the first embodiment will be explained here.

The manufacturing method of the optical detection device 1 according to modification 2 of the first embodiment is different from the manufacturing method of the optical detection device 1 of the first embodiment described above in the order of the steps for forming the second conductor 52. Accordingly, the resist pattern R1 is not formed in the step depicted in FIG. 5A. In addition, the second wiring layer 40 is first completed on the third surface S3 side of the second semiconductor layer 50*w*. Thereafter, the second semiconductor layer 50*w* on which the second wiring layer 40 is laminated and the first semiconductor layer 20 as a separately prepared layer on which the first wiring layer 30 is laminated are joined to each other by F2F. Then, the second semiconductor layer 50*w* is ground by back grinding to leave a portion constituting the second semiconductor layer 50.

Figure 8A:
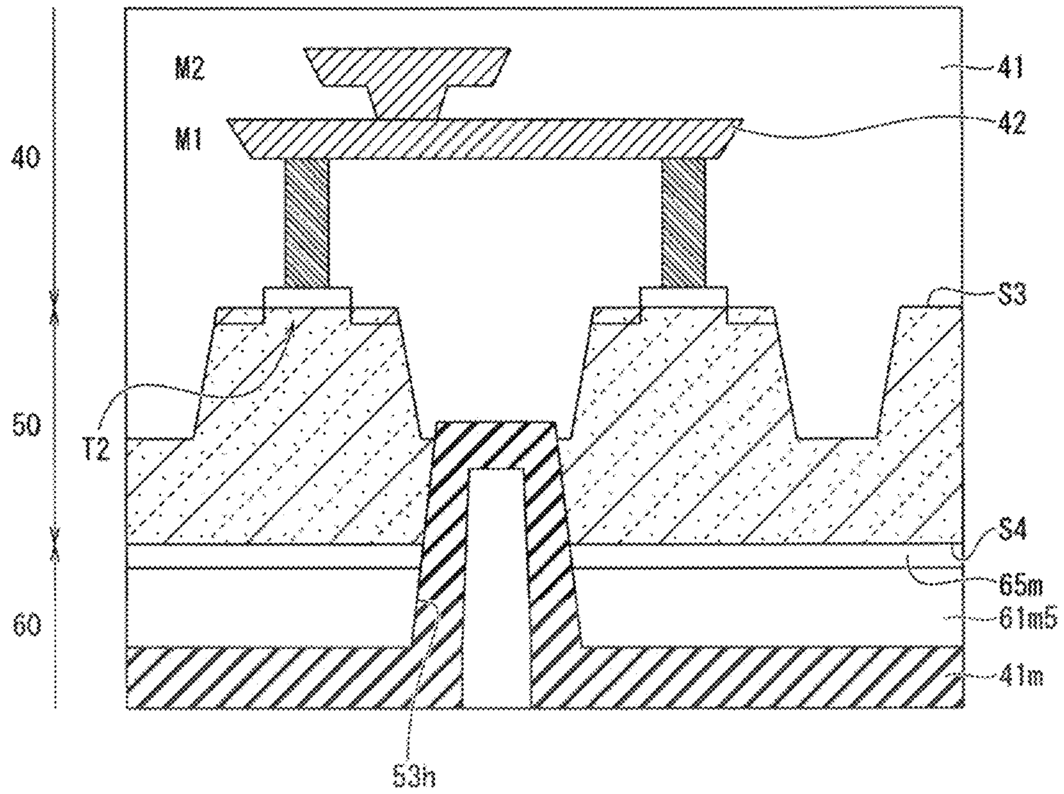
FIG. 8A is a step cross-sectional diagram depicting a manufacturing method of the optical detection device according to modification 2 of the first embodiment of the present technology.

Subsequently, as depicted in FIG. 8A, the film 65*m* constituting the silicon cover film 65 and an insulation film 61*m*5 are laminated in this order on the fourth surface S4 of the second semiconductor layer 50. Thereafter, a hole 53*h* penetrating the second semiconductor layer 50 is formed from the insulation film 61*m*5 side. Then, the insulation film 41*m* is laminated on an inner wall of the hole 53*h* and an exposed surface of the insulation film 61*m*5 by atomic layer deposition. Note that the insulation film 61*m*5 may be laminated in such a manner as to fill an inside space of the hole 53*h* at this time.

Figure 8B:
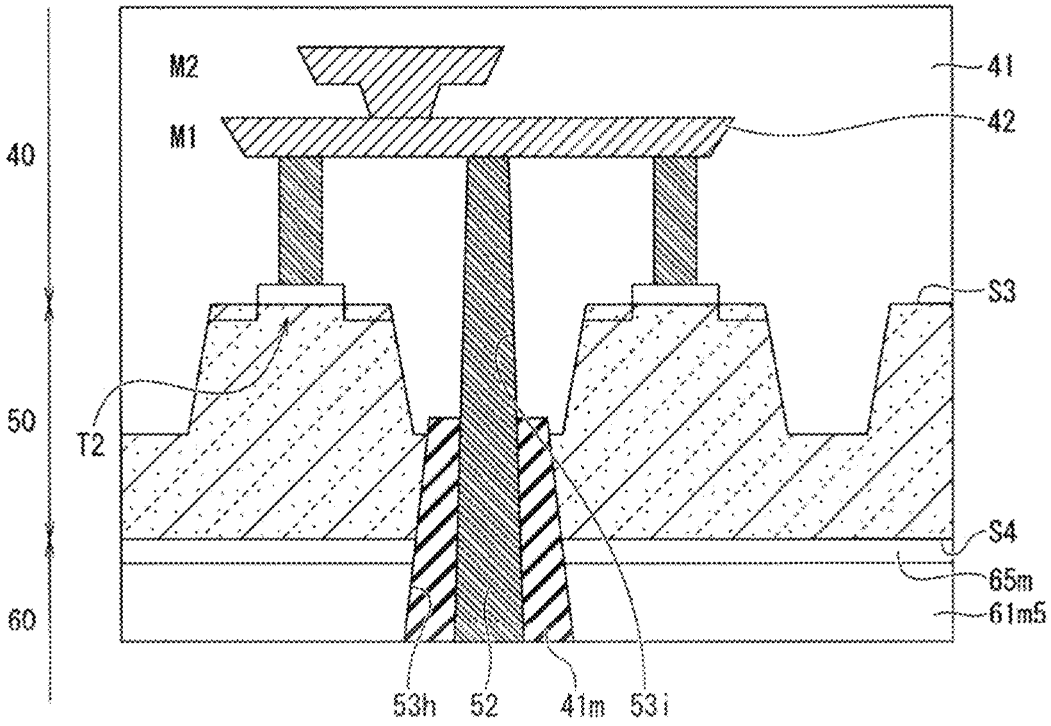
FIG. 8B is a step cross-sectional diagram continuing from FIG. 8A.

Next, as depicted in FIG. 8B, a hole 53*i* penetrating the second semiconductor layer 50 and reaching the wire 42 in the second wiring layer 40 is formed by a known etching technology, a combination of a lithography technology and an etching technology, or other methods. Thereafter, tungsten is embedded into the hole 53*i*. In such a manner, formation of the second conductor 52 (one conductor) is completed. Then, an insulation film is laminated in such a manner as to cover exposed surfaces of the second conductor 52 and the insulation film 61*m*5, and the step depicted in FIG. 5L and the following steps are performed as in the first embodiment.

<<Main Advantageous Effects of Modification 2 of First Embodiment>>

Advantageous effects similar to those of the optical detection device 1 of the first embodiment described above can be offered by the optical detection device 1 according to modification 2 of the first embodiment described here.

[Modification 3 of First Embodiment]

Hereinafter described will be modification 3 of the first embodiment of the present technology depicted in FIG. 9. The optical detection device 1 according to the present modification 3 of the first embodiment is different from the optical detection device 1 according to the first embodiment described above in that each of the transistors T2 is a fin-type MOSFET. Other configurations of the optical detection device 1 are basically similar to the corresponding configurations of the optical detection device 1 according to the first embodiment described above. Note that the constituent elements already described will be given the same reference signs, and will not repeatedly be explained.

Each of the transistors T2 is a fin-type MOSFET (hereinafter also referred to as a "FinFET"), and has a plurality of fins T2*f*. Each of the fins T2*f* is a protruded portion of the third surface S3 side of the second semiconductor layer, and can form a channel. A gate electrode TG of each of the transistors T2 is so provided as to cover distal ends of the fins T2*f* via a gate insulation film 41G. In addition, while not depicted in the figure, a source region of each of the transistors T2 is provided at one end of each of the fins T2*f* in a vertical direction with respect to the sheet surface of FIG. 9, while a drain region of each of the transistors T2 is provided at the other end. Accordingly, channels of each of the transistors T2 extend in the vertical direction with respect to the sheet surface.

Figure 9:
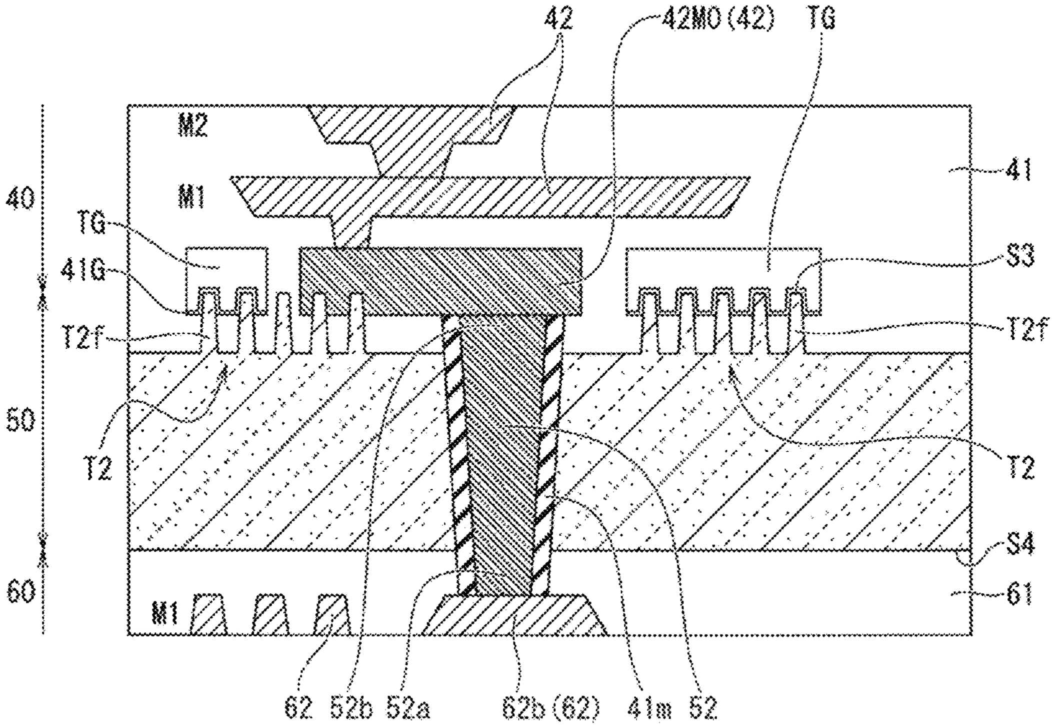
FIG. 9 is a partially enlarged diagram depicting a main part of a longitudinal cross section of an optical detection device according to modification 3 of the first embodiment of the present technology.

As depicted in FIG. 9, the second conductor 52 penetrates a region between the respective transistors T2 as FinFETs in the second semiconductor layer 50. In addition, the end 52*b* of the second conductor 52 is connected to a wire 42M0. For example, the wire 42M0 includes tungsten, but is not limited to this example. In addition, the wire 42M0 is connected to the wires 42.

<<Main Advantageous Effects of Modification 3 of First Embodiment>>

Advantageous effects similar to those of the optical detection device 1 of the first embodiment described above can be offered by the optical detection device 1 according to modification 3 of the first embodiment described here.

Figure 10:
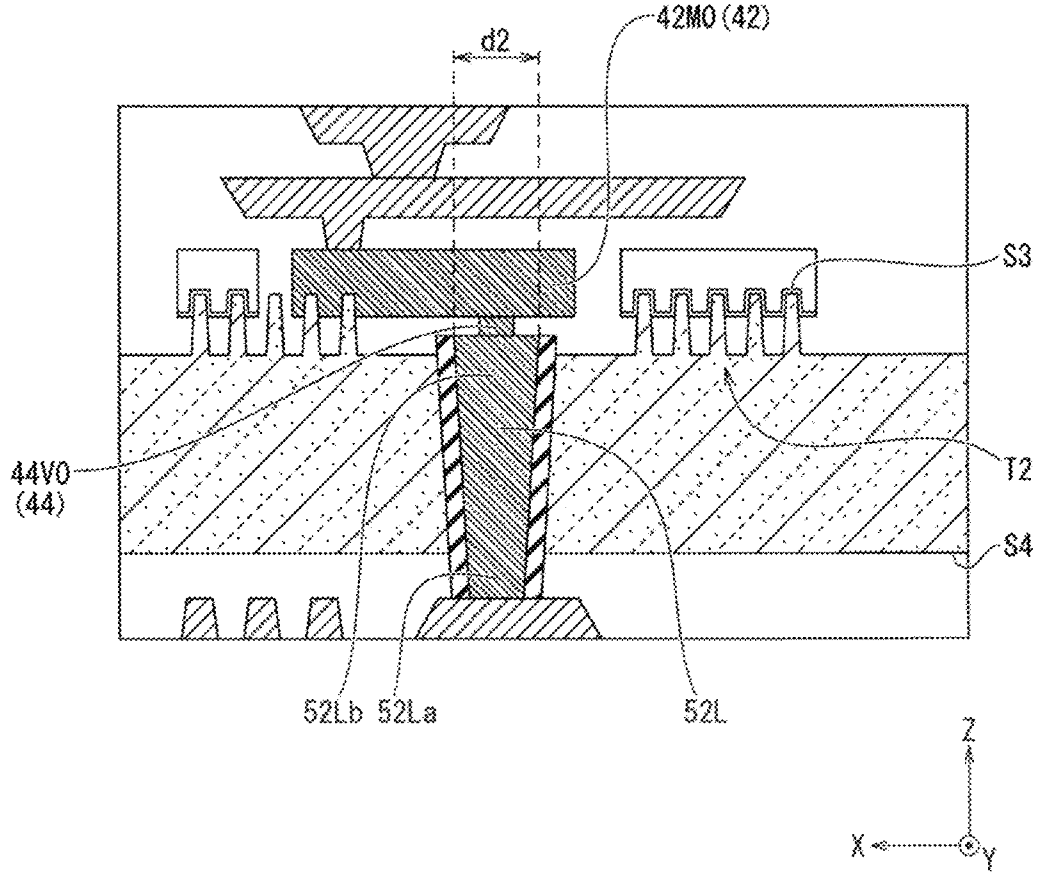
FIG. 10 is a partially enlarged diagram depicting a main part of a longitudinal cross section of an optical detection device according to a different mode of modification 3 of the first embodiment of the present technology.

While the second conductor 52 described above has a columnar shape, the shape of the second conductor 52 is not limited to this shape. A second conductor 52L depicted in FIG. 10 may be adopted instead of the second conductor 52. The second conductor 52L is a wall-shaped conductor extending in the vertical direction with respect to the sheet surface of FIG. 10.

Hereinafter, a thickness of the second conductor 52L will represent a thickness of the wall-shaped conductor. More specifically, the thickness of the second conductor 52L refers to a thickness perpendicular to both the penetration direction and the vertical direction with respect to the sheet surface of FIG. 10. The second conductor 52L has an end 52La and an end 52Lb in the penetration direction. The end 52Lb is connected to the wire 42M0 via a via 44V0. The penetration direction is a direction where the second conductor 52L penetrates the second semiconductor layer 50, and is also a thickness direction of the second semiconductor layer 50. The end 52La of the second conductor 52 is located within the third wiring layer 60, while the end 52Lb is located within the second wiring layer 40.

In addition, for example, the second width of the second conductor 52L corresponds to the size of the larger end of the second conductor 52L in the penetration direction. More specifically, the second width described above corresponds to the larger one of the size (thickness here) of the end 52La and the size (thickness here) of the end 52Lb, i.e., the size (thickness here) of the end 52Lb. Moreover, the thickness of the end 52Lb is expressed as a thickness d2 here. Further, the thickness d2 of the end 52Lb is smaller than the diameter d1 of the end 51*a* of the first conductor 51 described above (d2<d1). In addition, advantageous effects similar to those of the second conductor 52 of modification 3 of the first embodiment can be offered by the second conductor 52L configured as above.

[Modification 4 of First Embodiment]

Figure 4C:
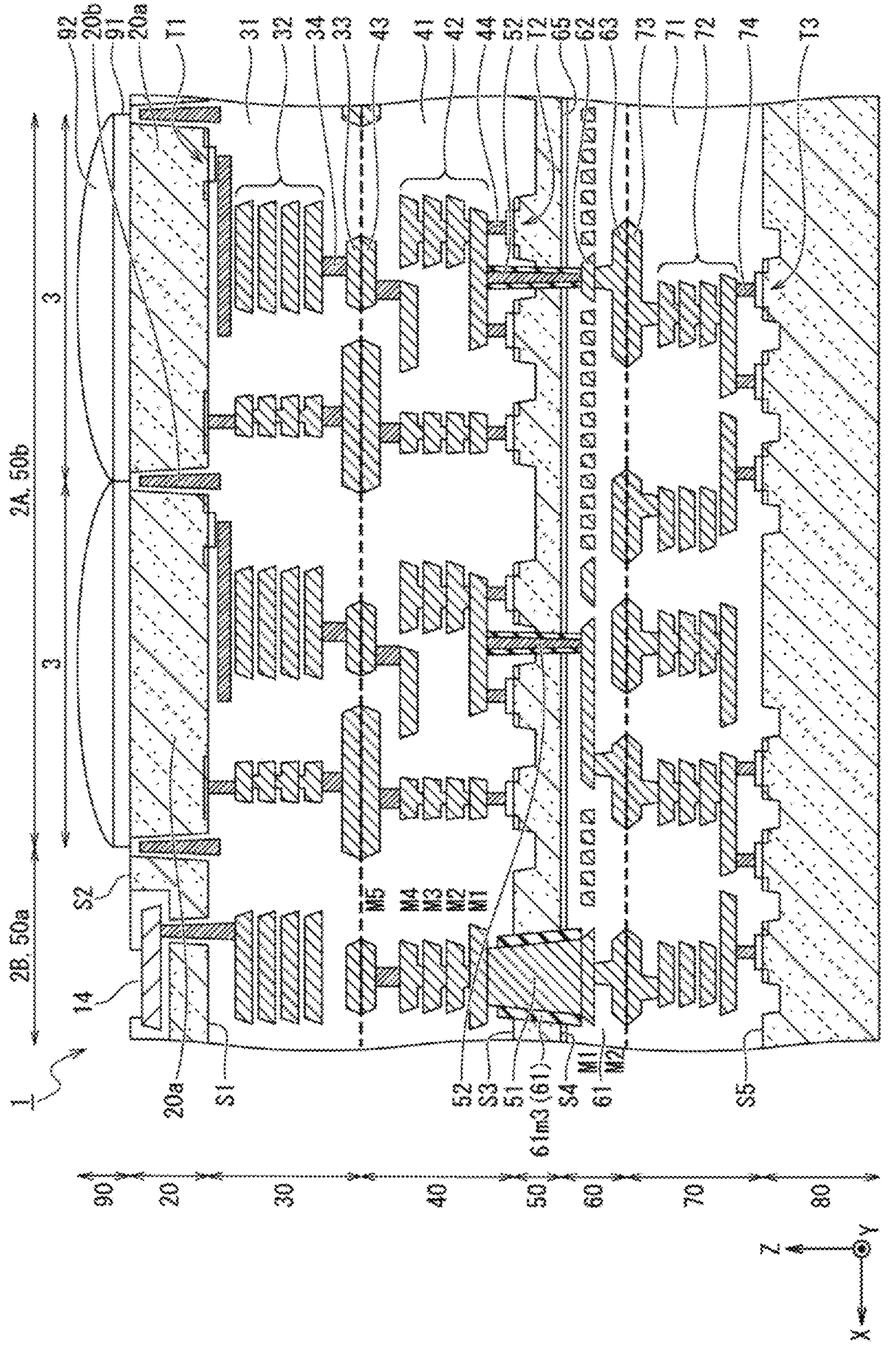
FIG. 4C is a longitudinal cross-sectional diagram of the optical detection device according to modification 4 of the first embodiment of the present technology.

Hereinafter described will be modification 4 of the first embodiment of the present technology depicted in FIG. 4C. An insulation film 61*m*3 is provided between the first conductor 51 and the second semiconductor layer 50 in the optical detection device 1 according to the present modification 4 of the first embodiment. Other configurations of the optical detection device 1 are basically similar to the corresponding configurations of the optical detection device 1 according to the first embodiment described above. Note that the constituent elements already described will be given the same reference signs, and will not be repeatedly explained. Moreover, the insulation film 61*m*3 will also be referred to as the insulation film 61 in a case where distinction between the insulation film 61*m*3 and the other insulation films 61 is unnecessary.

Figure 5W:
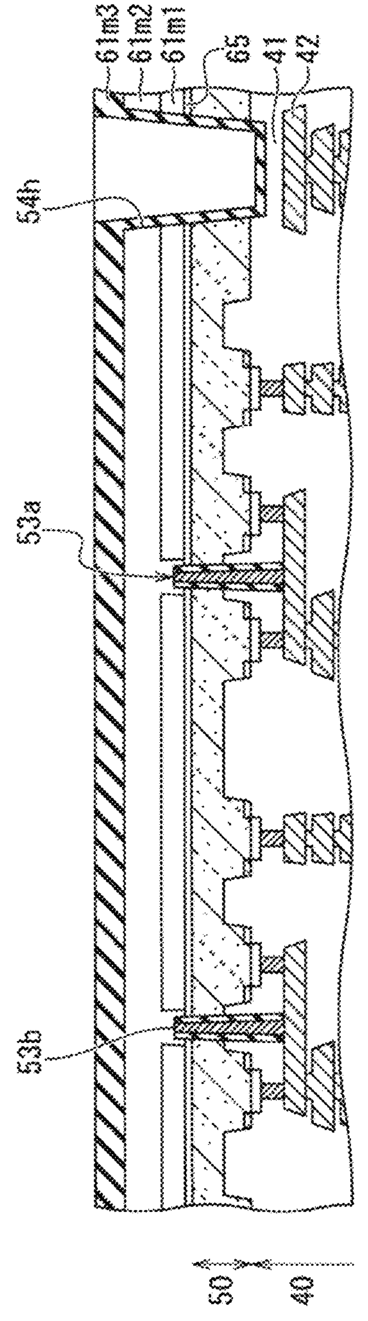
FIG. 5W is a step cross-sectional diagram depicting a manufacturing method of the optical detection device according to modification 4 of the first embodiment of the present technology.

A manufacturing method of the optical detection device 1 according to modification 4 of the first embodiment of the present technology will hereinafter be described with reference to FIGS. 5L, 5W, and 5X. First, as depicted in FIG. 5L, a portion exposed through the opening R2*a* of the resist pattern R2 is etched to form the hole 54*h* into which the first conductor 51 is embedded. The hole 54*h* penetrates the second semiconductor layer 50. Thereafter, as depicted in FIG. 5W, the insulation film 61*m*3 including silicon oxide, for example, is laminated in such a manner as to cover a bottom surface and a side wall of the hole 54*h*.

The hole 54*h* formed here has a smaller depth than the first conductor 51 embedded into the hole 54*h*. More specifically, as depicted in FIG. 5W, the insulation film 41 is left between the bottom surface of the hole 54*h* and the wire 42, and the wire 42 that includes copper and that is included in the second wiring layer 40 is not exposed on the bottom surface of the hole 54*h*. This configuration is adopted to prevent scattering of copper caused by etching of the wire 42 including copper during etching for forming the hole 54*h*. In addition, the insulation film 61*m*3 is further deposited on the bottom surface of the hole 54*h*.

Figure 5X:
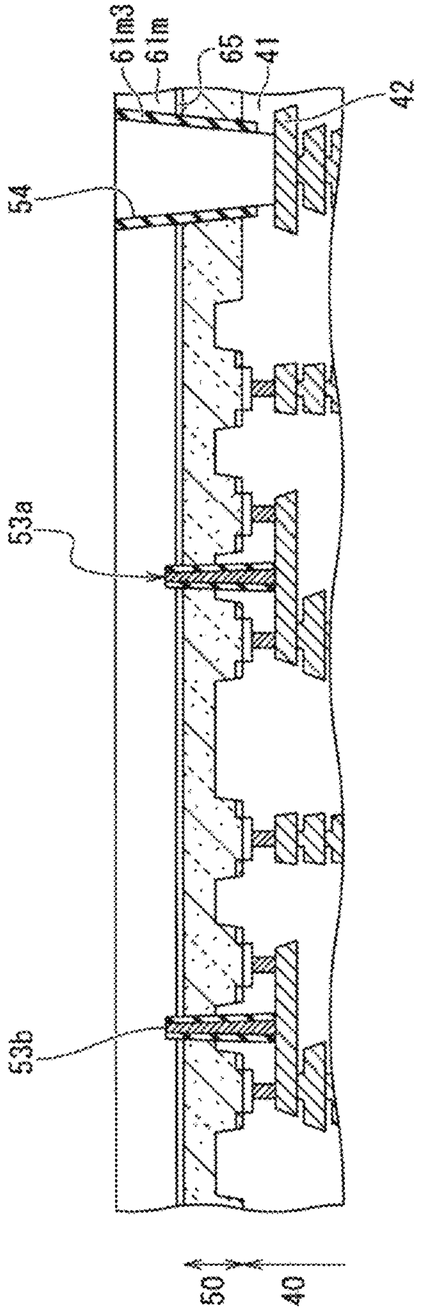
FIG. 5X is a step cross-sectional diagram continuing from FIG. 5W.

Subsequently, as depicted in FIG. 5X, the insulation film 61*m*3 deposited on the bottom surface of the hole 54*h* and the insulation film 41 left on the bottom surface of the hole 54*h* are etched to form the hole 54 reaching the wire 42. As a result, the first conductor 51 embedded in the hole 54 is electrically connected to the wire 42. The insulation film 61*m*3 left on the side wall of the hole 54 functions as a side wall for electric insulation between the first conductor 51 and the second semiconductor layer 50. In addition, the insulation film 61*m*3 functioning as a side wall is laminated within the hole 54*h*, and thus does not reach the wire 42. Steps following this step in the manufacturing method are similar to the corresponding steps in the first embodiment, and hence are not repeatedly explained.

Advantageous effects similar to those of the optical detection device 1 of the first embodiment described above can be offered by the optical detection device 1 according to modification 4 of the first embodiment described here.

Moreover, according to the optical detection device 1 in modification 4 of the first embodiment described here, the insulation film 41 is left between the bottom surface of the hole 54*h* and the wire 42 at the time of formation of the hole 54*h*. Accordingly, exposure of copper constituting the wire 42 is allowed to decrease.

Note that the barrier insulation film 64 in the first embodiment described above functions as an etching stop layer when the opening 66 is formed by etching the insulation film 61*m*4 (61). Accordingly, the barrier insulation film 64 includes a material having a higher etching rate for selected etchant than the material constituting the insulation film 61*m*4 (61). Moreover, the barrier insulation film 64 has a function of reducing diffusion of metal from the barrier insulation film 64 on the side opposite to the second semiconductor layer 50 side toward the barrier insulation film 64 on the second semiconductor layer 50 side.

Further, it is only required that at least a partial region of the photoelectric conversion region 20*a* have a function of photoelectrically converting incident light.

Figure 6:
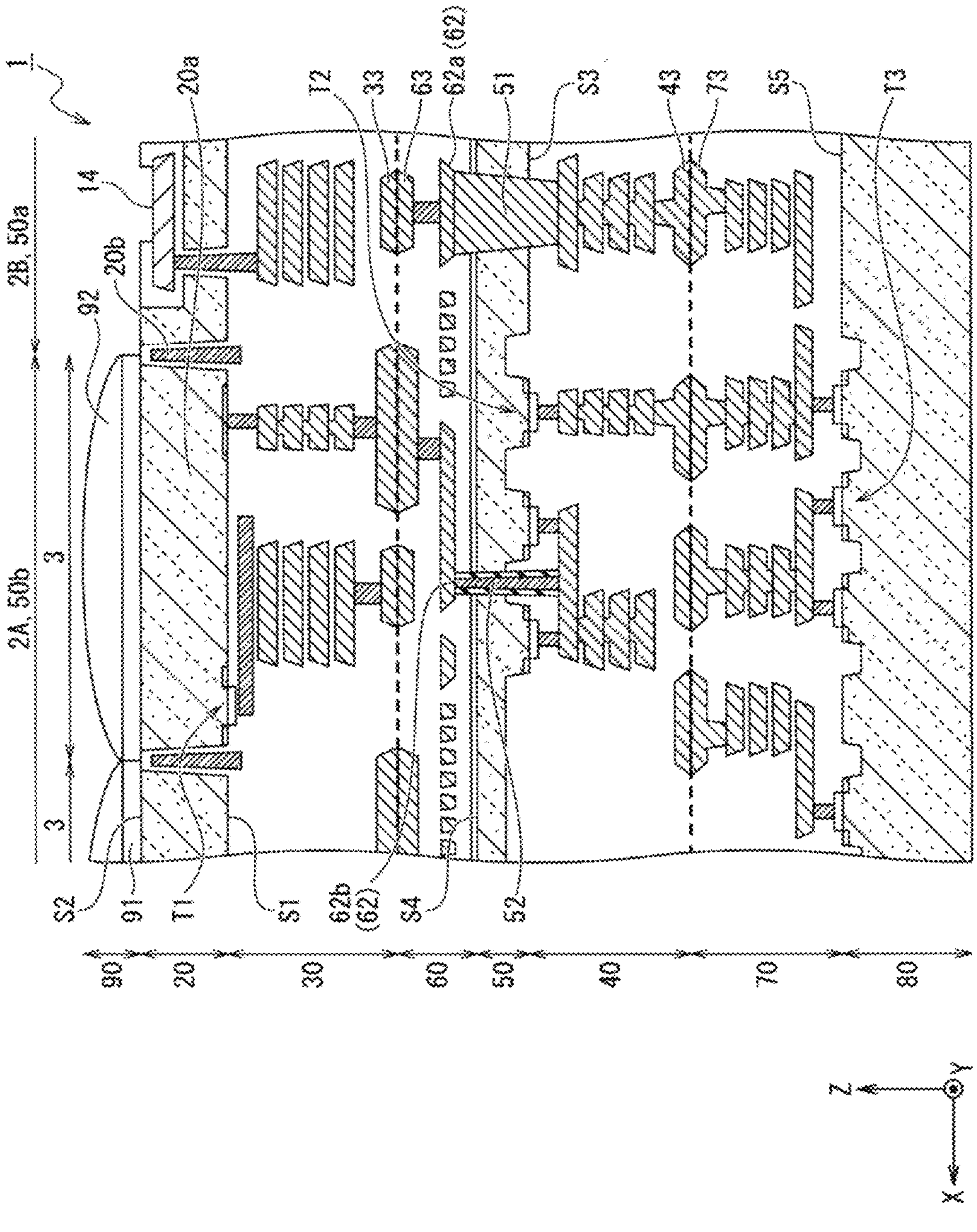
FIG. 6 is a longitudinal cross-sectional diagram of an optical detection device according to modification 1 of the first embodiment of the present technology.

In addition, according to the optical detection device 1 depicted in FIG. 6, one of surfaces of the first wiring layer 30 is overlapped with the first surface S1 of the first semiconductor layer 20, while the other surface is overlapped with the third wiring layer 60. More specifically, the other surface of the first wiring layer 30 is overlapped with the surface of the third wiring layer 60 on the side opposite to the second semiconductor layer 50 side. In addition, the first connection pads 33 are joined to the third connection pads 63. Similarly, one of surfaces of the fourth wiring layer 70 is overlapped with the third semiconductor layer 80, while the other surface is overlapped with the second wiring layer 40. More specifically, the other surface of the fourth wiring layer 70 is overlapped with the surface of the second wiring layer 40 on the side opposite to the second semiconductor layer 50 side. In addition, the second connection pads 43 are joined to the fourth connection pads 73. The configuration of the optical detection device depicted in FIG. 6 is also applicable to optical detection devices according to the second embodiment to the eleventh embodiment described below.

Second Embodiment

Hereinafter described will be the second embodiment of the present technology depicted in FIG. 11 and FIGS. 12A to 12D. The optical detection device 1 according to the present second embodiment is different from the optical detection device 1 according to the first embodiment described above in that a second conductor 52A is provided in place of the second conductor 52. Other configurations of the optical detection device 1 are basically similar to the corresponding configurations of the optical detection device 1 according to the first embodiment described above. Note that the constituent elements already described will be given the same reference signs, and will not be repeatedly explained.

<<Configuration of Optical Detection Device>>

The configuration of the optical detection device 1 according to the second embodiment of the present technology will hereinafter be described while focus is placed on a part different from the configuration of the optical detection device 1 according to the first embodiment described above. Note that scales of constituent elements depicted in some of the figures associated with the present second embodiment are different from scales of the same constituent elements in the other figures describing the second embodiment. Moreover, the barrier metal layer is not depicted in the figures explaining the present second embodiment.

<Second Wiring Layer>

Figure 11:
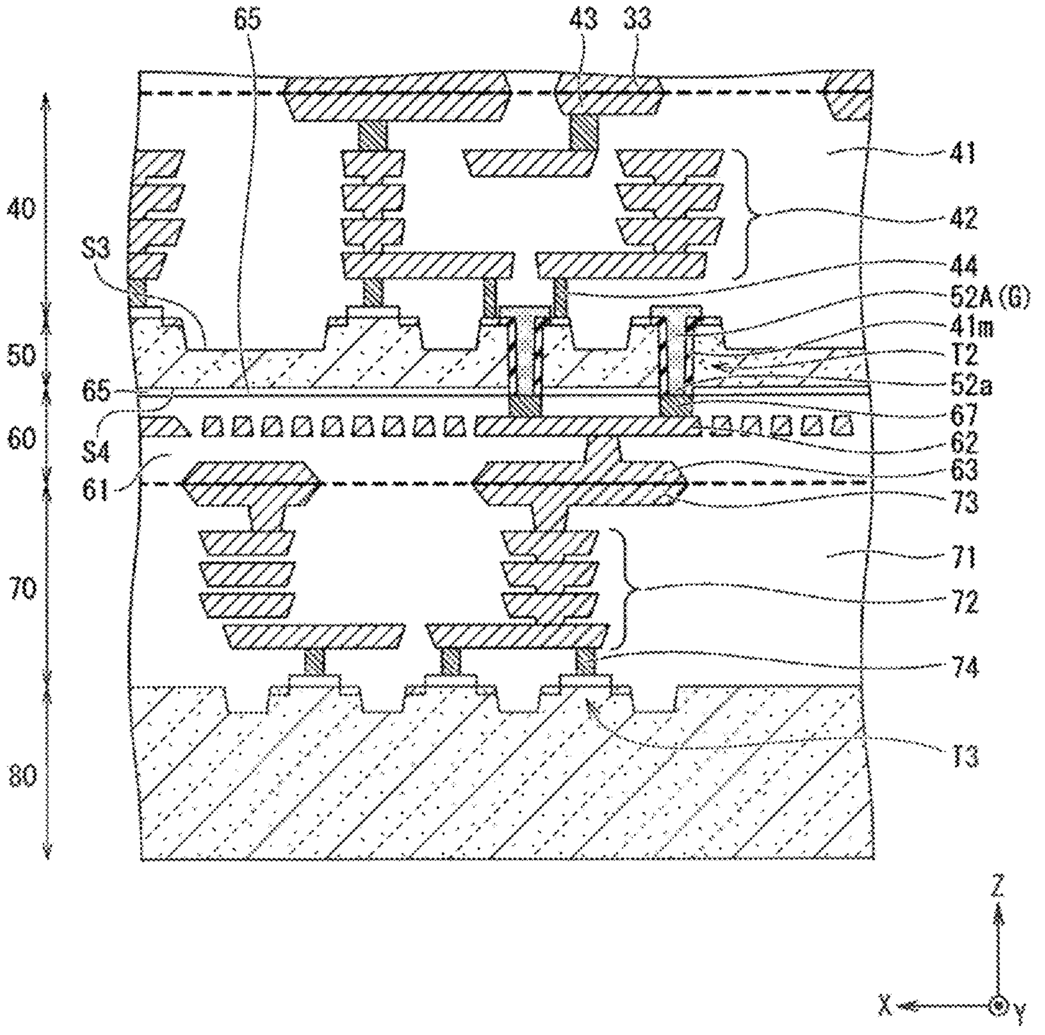
FIG. 11 is a longitudinal cross-sectional diagram depicting a main part of an optical detection device according to a second embodiment of the present technology.

As depicted in FIG. 11, each of the wires 42, the second connection pads 43, and the vias 44 in the second wiring layer 40 is a conductor provided in the second wiring layer 40. These conductors are connected according to design to constitute an electric path within the second wiring layer 40. For example, the electric route may be a path where electricity such as a signal charge flows, or a path for supplying voltage, but is not limited to these examples. Note that the electric path depicted in FIG. 11 is presented only by way of example. The present technology is not limited to this example.

<Third Wiring Layer>

The third wiring layer 60 includes the insulation film 61, the wires 62, the third connection pads 63, the silicon cover film 65, and vias (contacts) 67. Each of the wires 62, the third connection pads 63, and the vias 67 is a conductor provided in the third wiring layer 60. These conductors are connected according to design to constitute an electric path within the third wiring layer 60. For example, the electric route may be a path where electricity such as a signal charge flows, or a path for supplying voltage, but is not limited to these examples. Note that the electric path depicted in FIG. 11 is presented only by way of example. The present technology is not limited to this example.

<Second Conductor>

The second conductor 52A is provided at a position different from the position of the second conductor 52 depicted in FIG. 4A. More specifically, the second conductor 52A is provided at a position where a channel is allowed to be formed between the source and the drain of each of the transistors T2. The second conductor 52A penetrates the second semiconductor layer 50 in the Z-direction, and functions as a gate electrode G of the transistor T2 (first transistor) included in the second semiconductor layer 50. Moreover, the insulation film 41*m* provided between a side surface of the second conductor 52A and the second semiconductor layer 50 functions as a gate insulation film for the transistor T2 (first transistor). In addition, the transistor T2 turns on and off according to values of voltage supplied to the second conductor 52A. The transistor T2 is a normally-off transistor, for example, but may be a normally-on transistor. When the transistor T2 is in an on-state, a portion located adjacent to the side surface of the second semiconductor layer 50 via the insulation film 41*m* in the second semiconductor layer 50 is modulated. As a result, a channel is formed between a source S and a drain D, and a signal charge flows in the channel. Note that the second conductor 52A will also be referred to as the gate electrode G in the following description. Note that the transistor T2 is a planar transistor, and is a transistor constituting a circuit in a stage following the pixel 3, for example.

Description will hereinafter be presented with reference to FIGS. 12A to 12D. Note that the insulation film 41*m* is not depicted in some figures of FIG. 12A and following figures associated with the present second embodiment. Moreover, the source S, the drain D, the gate electrode G, and the vias depicted in some figures of FIG. 12A and the following figures are viewed through the insulation film for convenience of easy understanding of the description of a relation between these components in the present second embodiment. However, it is not intended in these figures that the insulation film is absent.

Figure 12A:
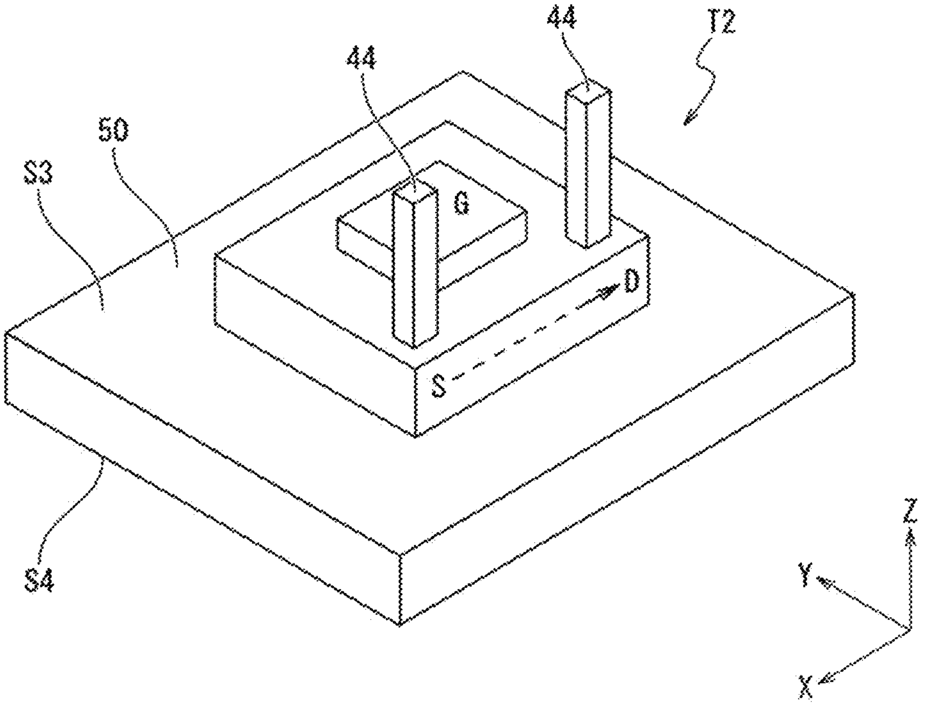
FIG. 12A is a perspective diagram of a transistor included in the optical detection device according to the second embodiment of the present technology.
Figure 12B:
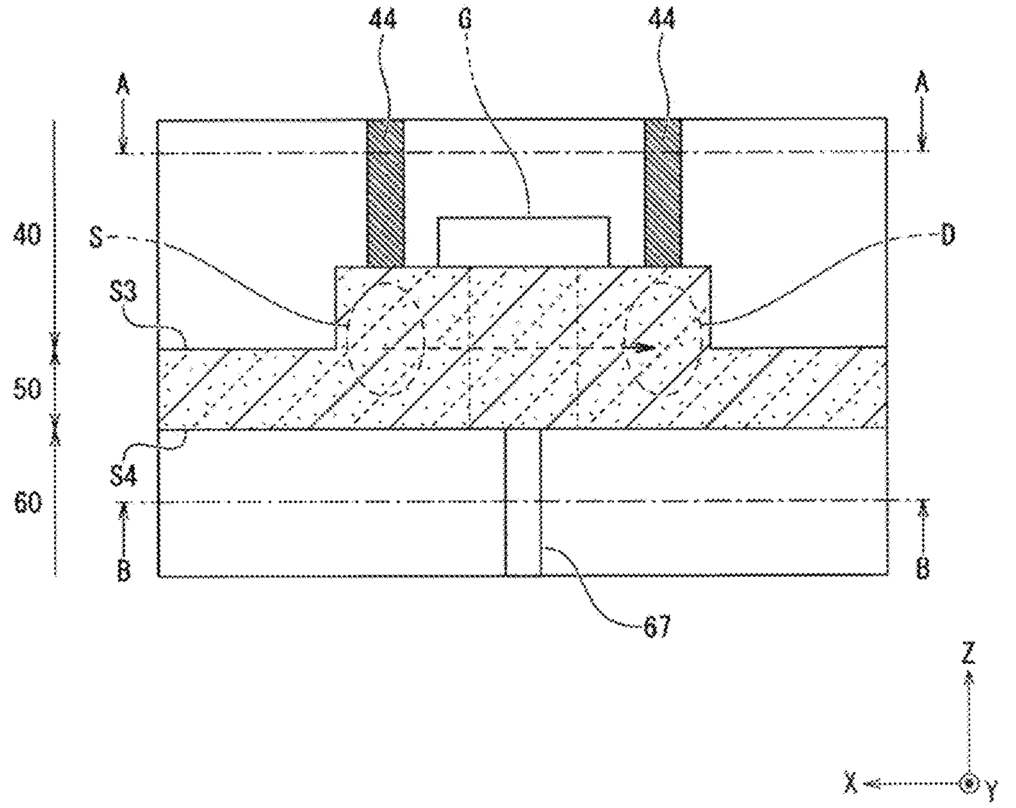
FIG. 12B is a longitudinal cross-sectional diagram of the transistor depicted in FIG. 12A.
Figure 12C:
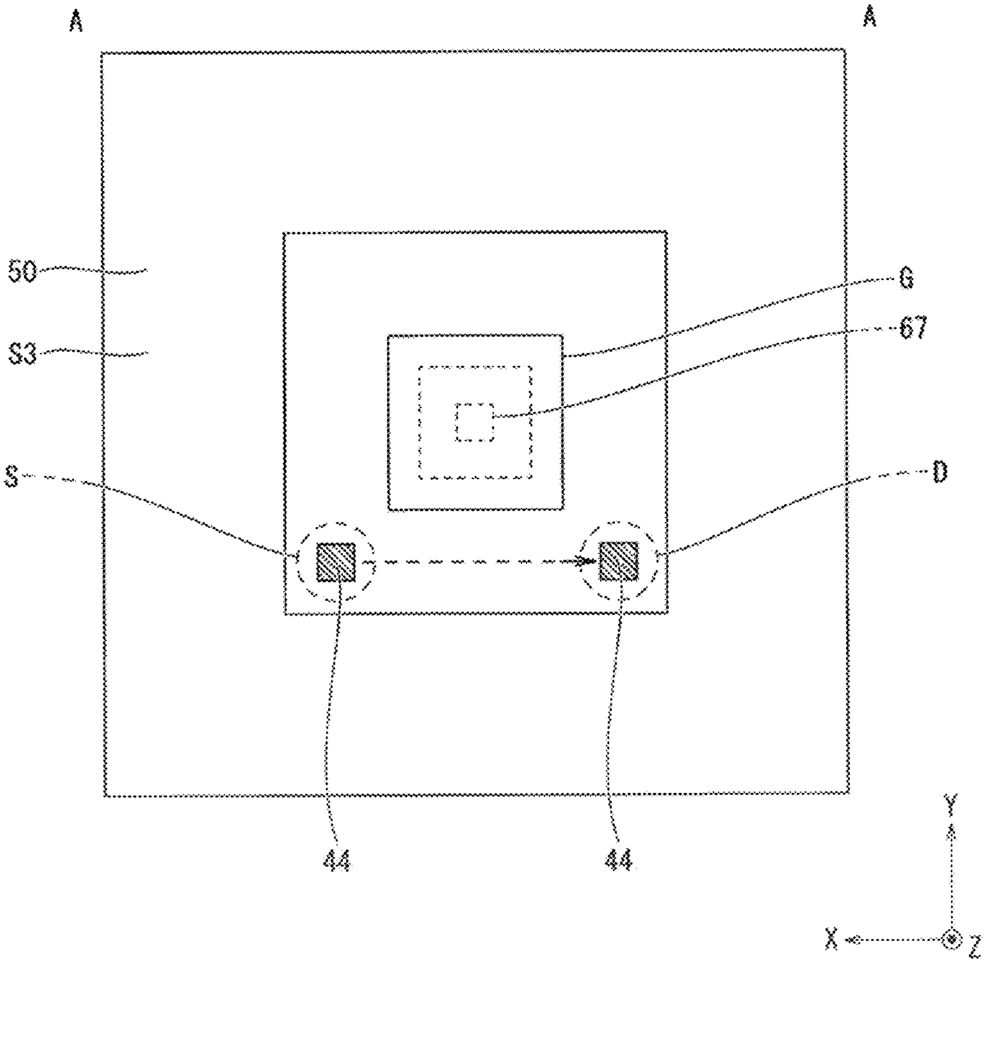
FIG. 12C is a lateral cross-sectional diagram depicting a cross-sectional structure in a cross-sectional view taken along a section line A-A in FIG. 12A.
Figure 12D:
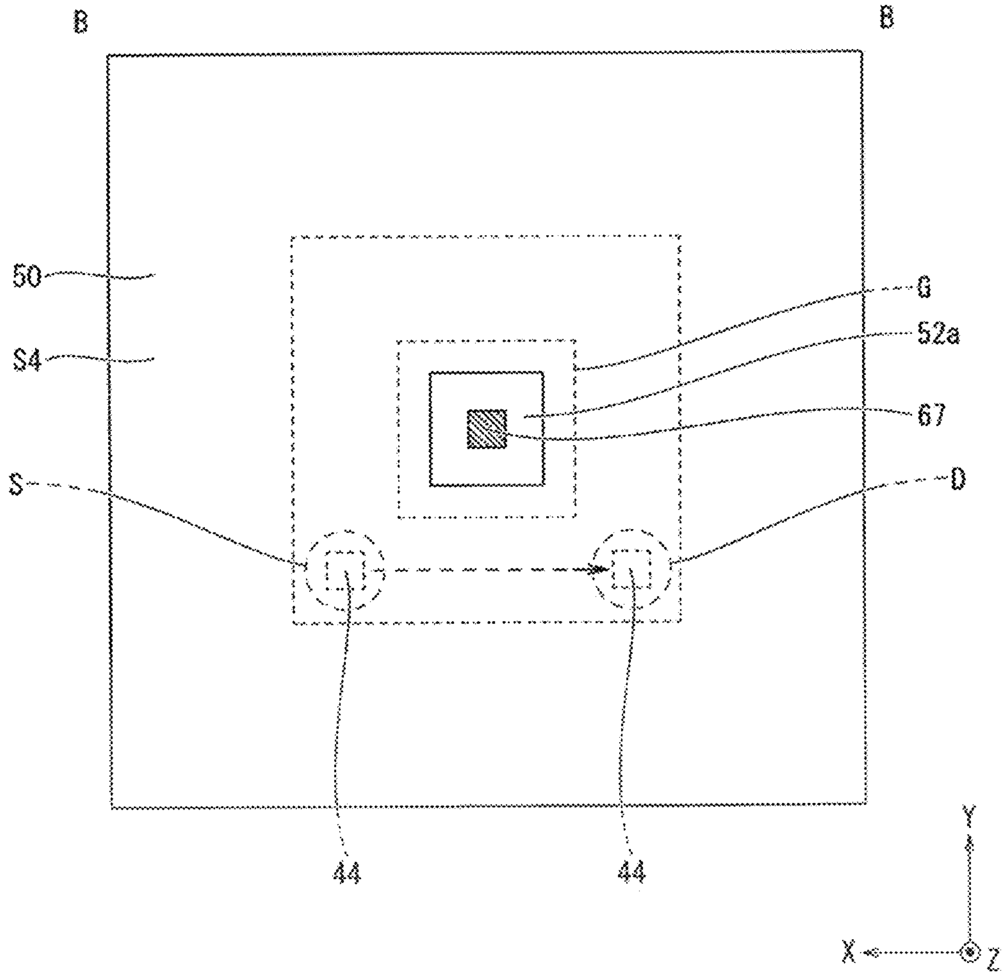
FIG. 12D is a lateral cross-sectional diagram depicting a cross-sectional structure in a cross-sectional view taken along a section line B-B in FIG. 12A.

As depicted in FIGS. 12A to 12D, the gate electrode G is capable of forming a channel between the source S and the drain D of the transistor T2. Each of the source S and the drain D is a second conductivity-type, such as an n-type, semiconductor region (diffusion region) formed within the second semiconductor layer 50. As depicted in FIGS. 12C and 12D, the gate electrode G is not disposed on a straight line connecting the source S and the drain D, but is disposed at a position offset from this straight line.

As depicted in FIGS. 11 and 12D, the end 52*a* of the second conductor 52A (gate electrode G) on the third wiring layer 60 side is connected to the via 67. In such a manner, the gate electrode G is connected to the electric path provided within the third wiring layer 60. For example, the electric path connected to the gate electrode G is a path through which voltage is suppliable to the gate electrode G. More specifically, of the electric path provided within the second wiring layer 40 and the electric path provided within the third wiring layer 60, the gate electrode G is electrically connected to only the electric path provided within the third wiring layer 60. Accordingly, the electric path connected to the gate electrode G includes only either the conductor provided in the second wiring layer 40 or the conductor provided in the third wiring layer 60 (i.e., the conductor provided in the third wiring layer 60), and does not include the other conductor (i.e., the conductor provided in the second wiring layer 40). In such a manner, the electric path through which voltage is suppliable to the second conductor 52A passes through only one of the two wiring layers overlapped with the second semiconductor layer 50, and does not pass through the other wiring layer.

As depicted in FIGS. 11, 12B, and 12C, the source S is connected to the one via 44. Specifically, the source S is connected to the electric path provided within the second wiring layer 40. Similarly, the drain D is connected to the other via 44. Specifically, the drain D is connected to the electric path provided within the second wiring layer 40. Accordingly, of the one conductor provided in the third wiring layer 60 and the other conductor provided in the second wiring layer 40, each of the source S and the drain D is electrically connected to the other conductor (the conductor provided in the second wiring layer 40), but is not connected to the one conductor (the conductor provided in the third wiring layer 60).

For example, the second material constituting the second conductor 52A is polysilicon (Poly-Si), but is not limited to this example. Moreover, in a case where the transistor T2 is a p-type transistor, the second material to be adopted may be any one of hafnium, zirconium, titanium, tantalum, aluminum, and a metal carbide including these elements, such as titanium carbide, zirconium carbide, tantalum carbide, hafnium carbide, and aluminum carbide. Further, in a case where the transistor T2 is an n-type transistor, the second material to be adopted may be any one of ruthenium, palladium, platinum, cobalt, nickel, and a conductive metallic oxide such as ruthenium oxide and tungsten. The present embodiment will be described on an assumption that the second material is polysilicon.

<<Manufacturing Method of Optical Detection Device>>

A manufacturing method of the optical detection device 1 will hereinafter be described with reference to FIGS. 13A to 13E. Note that some of constituent elements depicted in FIGS. 13A to 13E may have scales and shapes different from those of the corresponding configuration elements depicted in FIG. 11 to describe the manufacturing method of the optical detection device 1 in a more easy-to-understand manner. Moreover, a cross section of the optical detection device 1 depicted in each of FIGS. 13A to 13E may also be considered as a cross section different from the cross section depicted in FIG. 11. In addition, the manufacturing method of the optical detection device 1 according to the second embodiment of the present technology will be described while focus is placed on a part different from the manufacturing method of the optical detection device 1 according to the first embodiment described above.

Figure 13A:
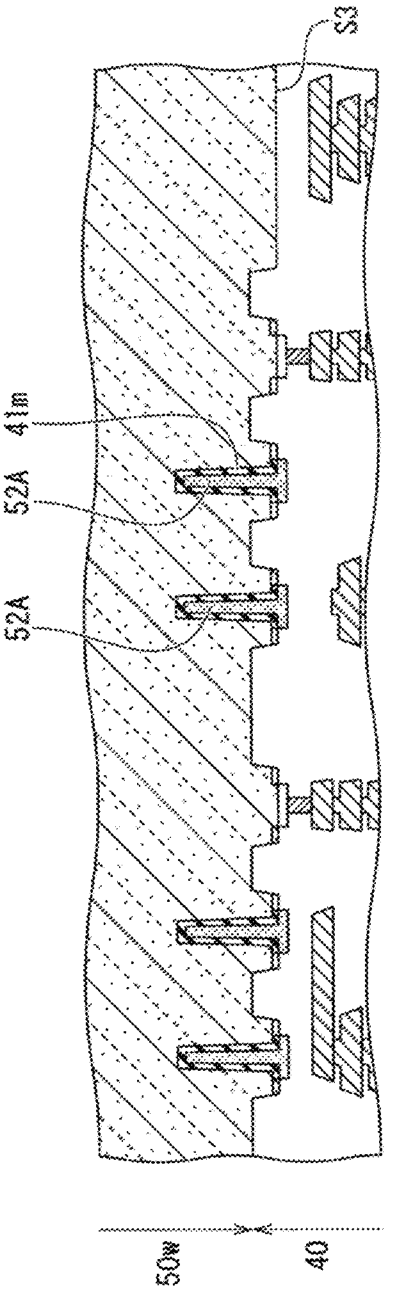
FIG. 13A is a step cross-sectional diagram depicting a manufacturing method of the optical detection device according to the second embodiment of the present technology.

First, as depicted in FIG. 13A, the second conductors 52A and the insulation films 41*m* are formed in the second semiconductor layer 50*w*, and the second wiring layer 40 is formed on the third surface S3 of the second semiconductor layer 50*w*. The manufacturing method in the present embodiment is different from the manufacturing method described above in the first embodiment in that polysilicon is employed as the material constituting the second conductors 52A and that the second conductors 52A are provided at different positions. Other points are similar to the corresponding points in the first embodiment, and hence will not be repeatedly described here. Thereafter, the second semiconductor layer 50*w* on which the second wiring layer 40 is laminated and the first semiconductor layer 20 as a separately prepared layer on which the first wiring layer 30 is laminated are joined to each other by F2F.

Figure 13B:
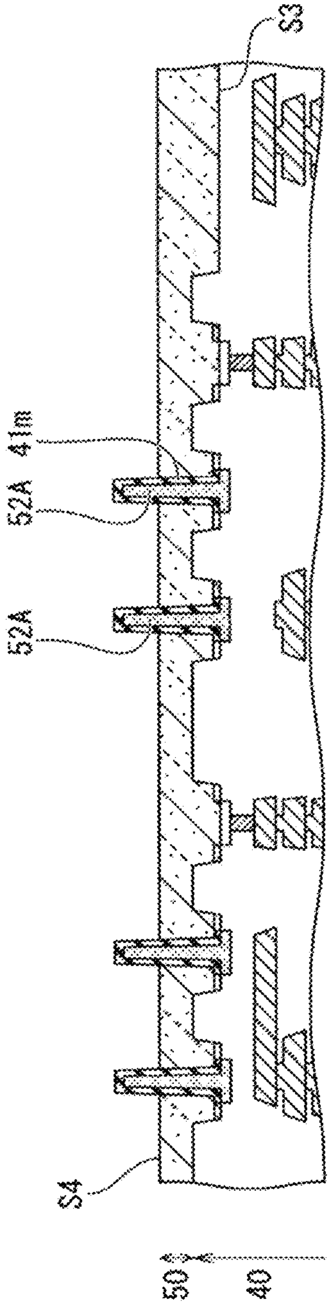
FIG. 13B is a step cross-sectional diagram continuing from FIG. 13A.

Next, as depicted in FIG. 13B, the back surface side of the second semiconductor layer 50*w* is ground by back grinding and known dry etching to expose ends of the second conductors 52A and the insulation films 41*m*. At this time, each of the insulation films 41*m* functions as a stopper for dry etching.

Figure 13C:
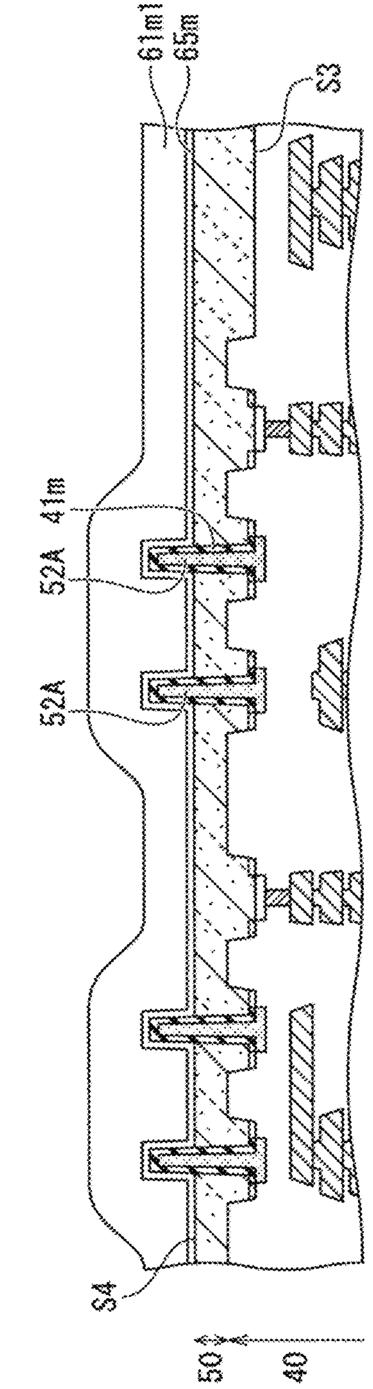
FIG. 13C is a step cross-sectional diagram continuing from FIG. 13B.
Figure 13D:
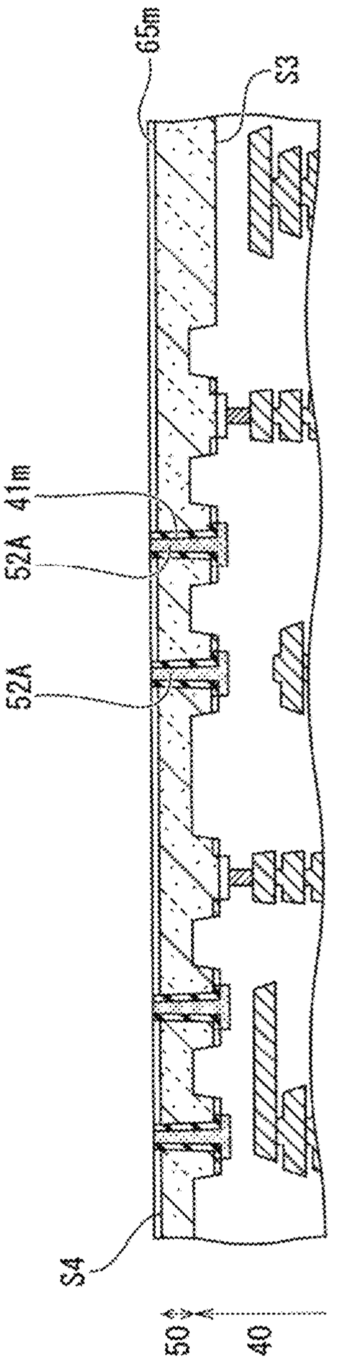
FIG. 13D is a step cross-sectional diagram continuing from FIG. 13C.

Subsequently, as depicted in FIG. 13C, the film 65*m* and the insulation film 61*m*1 of the third wiring layer 60 are laminated in this order on exposed surfaces of the insulation films 41*m* and the fourth surface S4. Thereafter, as depicted in FIG. 13D, the third wiring layer 60 side is flattened with use of CMP. At this time, unnecessary parts of the insulation film 61*m*1 and the second conductors 52A are removed.

Figure 13E:
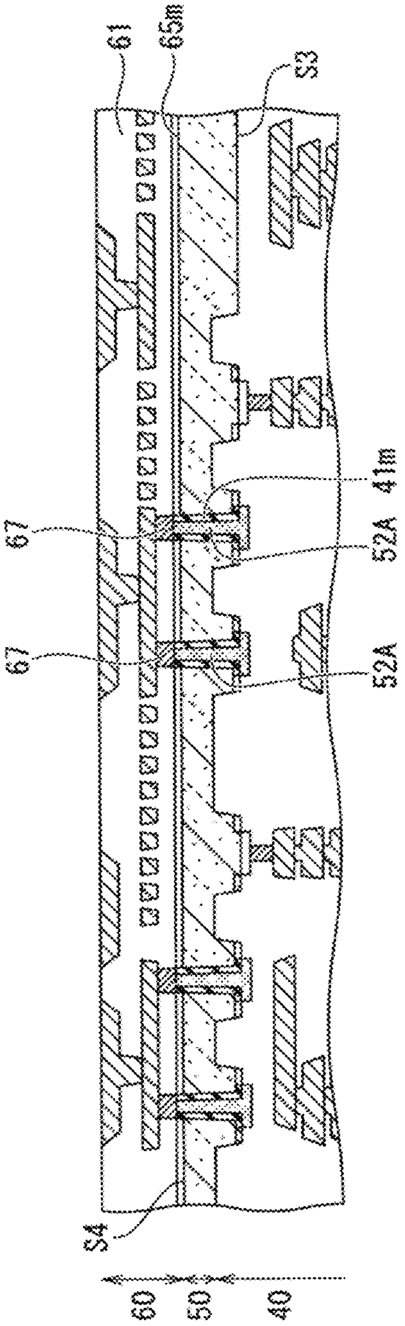
FIG. 13E is a step cross-sectional diagram continuing from FIG. 13D.

Then, as depicted in FIG. 13E, the vias 67 are formed in positions overlapping with the ends of the second conductors 52A. Thereafter, the third wiring layer 60 is completed. Steps following this step are similar to the corresponding steps described in the first embodiment, and hence are not repeatedly explained.

<<Main Advantageous Effects of Second Embodiment>>

Main advantageous effects of the second embodiment will hereinafter be described. Before the description of these effects, the configuration of the transistors T2 depicted in FIG. 4A according to the first embodiment will first be touched upon. The gate electrode of each of the transistors T2 depicted in FIG. 4A is connected to the via 44 of the second wiring layer 40. In a stage following the via 44, the wires 42, the second conductor 52, and the wire 62 of the third wiring layer 60 are connected in this order. Specifically, the electric path connected to the gate electrode of each of the transistors T2 is first wired within the second wiring layer 40 located on the first semiconductor layer 20 side, and then passes through the second conductor 52 and connects to the wire 62 in the third wiring layer 60 located on the third semiconductor layer 80 side. Accordingly, the electric path is wired in such a manner as to go back and forth within the second wiring layer 40.

In addition, in the case of the electric path so wired as to go back and forth within the second wiring layer 40, the via connected to the gate electrode and the second conductor 52 need to be disposed side by side in the horizontal direction. In such a layout, a space between the via connected to the gate electrode and the second conductor 52 is difficult to reduce.

Moreover, there is a possibility that characteristics of the transistors T2 are variable due to stress given from the second conductor 52 to the second semiconductor layer 50.

Meanwhile, according to the transistors T2 included in the optical detection device 1 in the second embodiment of the present technology, the second conductor 52A penetrating the second semiconductor layer 50 in the thickness direction is provided as the gate electrode G, and the insulation film provided between the side surface of the second conductor 52A and the second semiconductor layer 50 is provided as the gate insulation film. In the configuration where the gate electrode G penetrates the second semiconductor layer 50 in the thickness direction as described here, the end 52*a* of the gate electrode G is exposed on the third wiring layer 60 (fourth surface S4). In this case, the electric path is directly connectable to the gate electrode G on the third wiring layer 60 side without the necessity of being caused to go back and forth within the second wiring layer 40. Accordingly, this configuration can reduce elongation of the electric path, and thus can reduce an increase in parasitic capacitance.

Moreover, according to the transistors T2 included in the optical detection device 1 in the second embodiment of the present technology, the second conductor 52A itself functions as the gate electrode G. Accordingly, space saving is achievable, and hence, enlargement of pixels is avoidable.

Further, according to the transistors T2 included in the optical detection device 1 in the second embodiment of the present technology, the second conductor 52A itself functions as the gate electrode G. Accordingly, reduction of a characteristic variation of the transistors T2 is achievable.

As obvious from above, the optical detection device 1 according to the second embodiment of the present technology improves the structure of the transistors T2, and thus achieves reduction of deterioration of connectivity between the first semiconductor layer 20 side and the third semiconductor layer 80 side.

<<Modifications of Second Embodiment>>

Hereinafter described will be modifications of the second embodiment.

<Modification 1>

According to the transistors T2 included in the optical detection device 1 in the second embodiment, the gate electrode G is connected to the via 67 in the third wiring layer 60, i.e., connected to the electric path provided within the third wiring layer 60. However, the present technology is not limited to this example. According to modification 1 of the second embodiment, the gate electrode G may be connected to the via 44 in the second wiring layer 40 in a case where the gate electrode G is desired to be connected to the electric path provided within the second wiring layer 40. Similarly, according to the second embodiment described above, each of the source S and the drain D is connected to the via 44 in the second wiring layer 40, i.e., connected to the electric path provided within the second wiring layer 40. However, the present technology is not limited to this example. According to the present modification 1 of the second embodiment, at least either the source S or the drain D may be connected to the via 67 in the third wiring layer 60 in a case where at least either the source S or the drain D is desired to be connected to the electric path provided within the third wiring layer 60. More specifically, of the conductor included in the second wiring layer 40 and the conductor included in the third wiring layer 60, at least either the diffusion region constituting the source S or the diffusion region constituting the drain D may be connected to only the conductor included in the third wiring layer 60. In a case of connecting to the via 67, each of the diffusion region constituting the source S and the diffusion region constituting the drain D is provided in such a position that a signal charge is movable toward the third wiring layer 60 in the thickness direction of the second semiconductor layer 50. Hereinafter described will be a modification of the electric path to which the gate electrode G, the source S, and the drain D are connected.

(Modification 1-1)

Figure 14A:
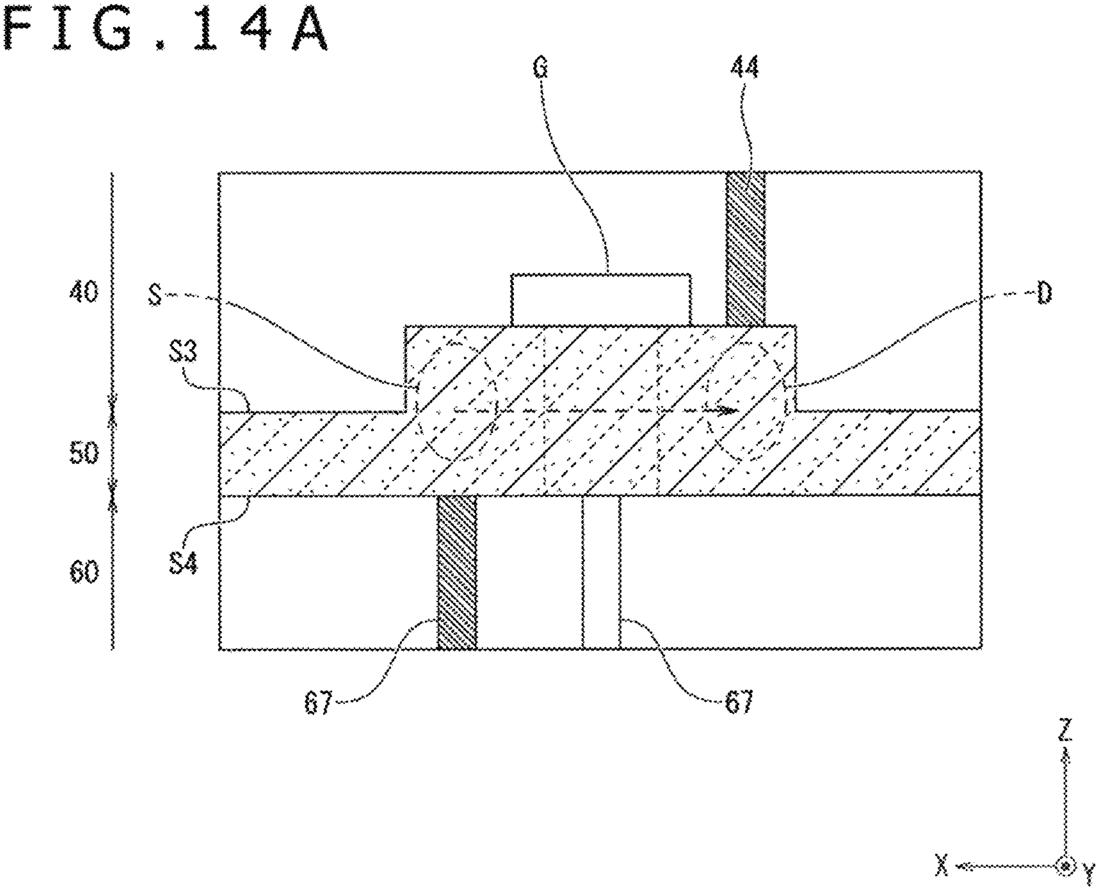
FIG. 14A is a longitudinal cross-sectional diagram of a transistor included in an optical detection device according to modification 1-1 of the second embodiment of the present technology.

As depicted in FIG. 14A, the gate electrode G and the source S are connected to the vias 67 in the third wiring layer 60, while the drain D is connected to the via 44 in the second wiring layer 40.

(Modification 1-2)

Figure 14B:
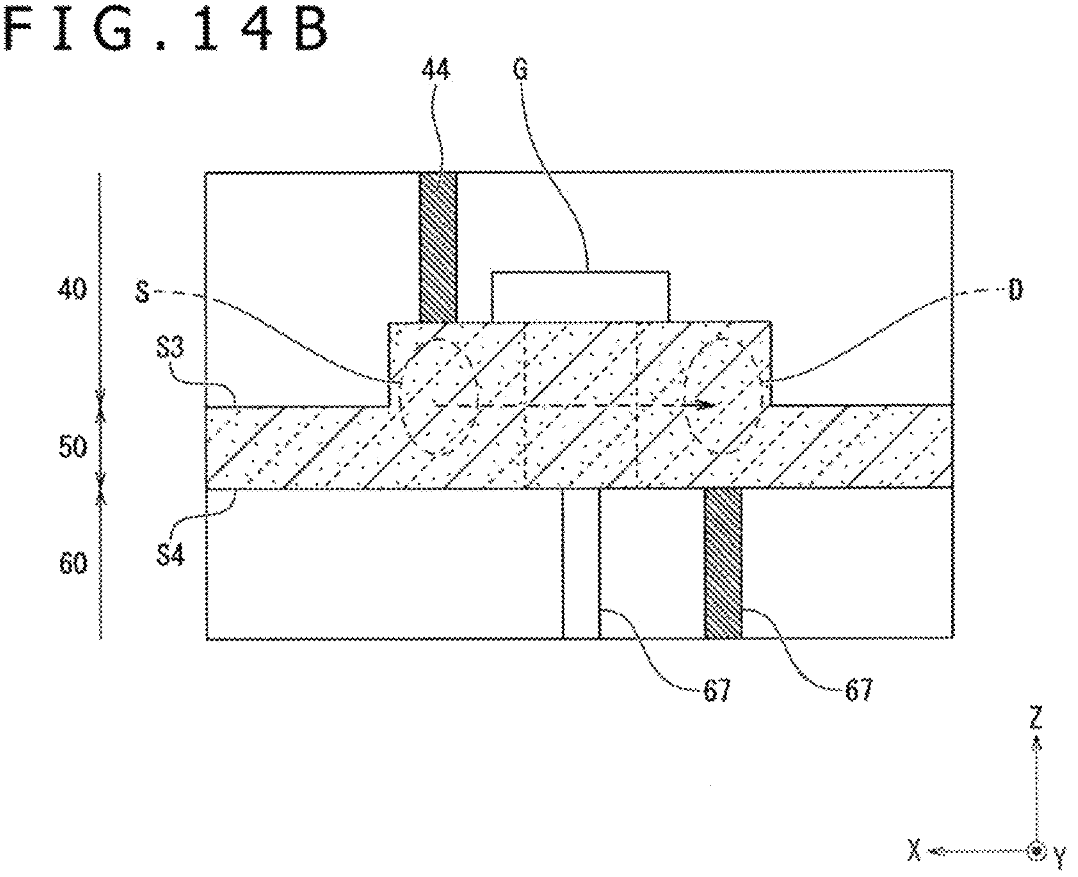
FIG. 14B is a longitudinal cross-sectional diagram of a transistor included in an optical detection device according to modification 1-2 of the second embodiment of the present technology.

As depicted in FIG. 14B, the gate electrode G and the drain D are connected to the vias 67 in the third wiring layer 60, while the source S is connected to the via 44 in the second wiring layer 40.

(Modification 1-3)

Figure 14C:
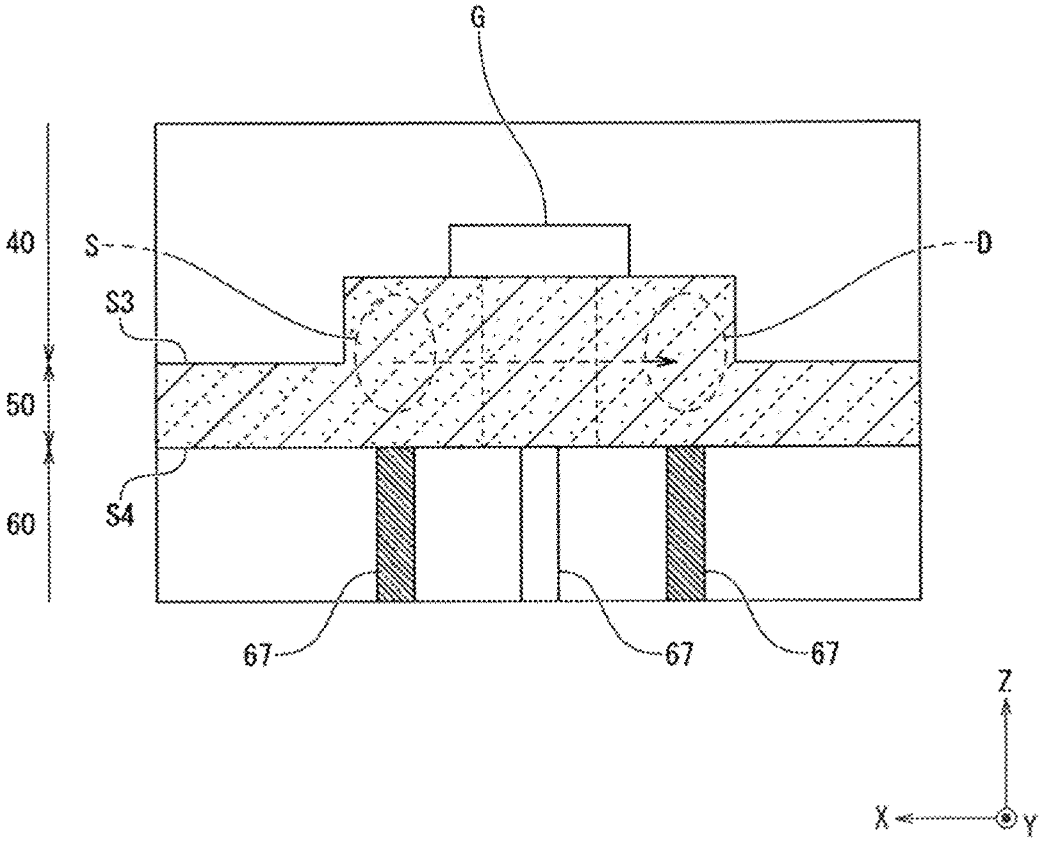
FIG. 14C is a longitudinal cross-sectional diagram of a transistor included in an optical detection device according to modification 1-3 of the second embodiment of the present technology.

As depicted in FIG. 14C, all of the gate electrode G, the source S, and the drain D are connected to the vias 67 in the third wiring layer 60.

(Modification 1-4)

Figure 14D:
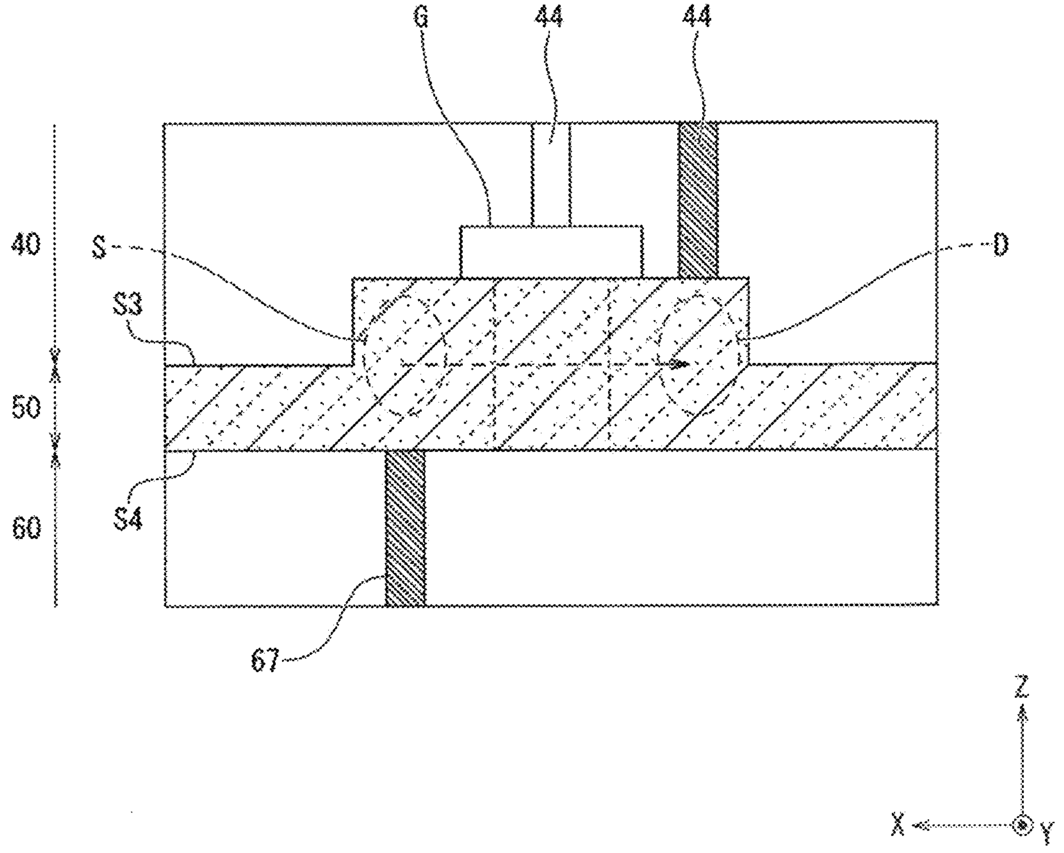
FIG. 14D is a longitudinal cross-sectional diagram of a transistor included in an optical detection device according to modification 1-4 of the second embodiment of the present technology.

As depicted in FIG. 14D, the source S is connected to the via 67 in the third wiring layer 60, while the gate electrode G and the drain D are connected to the vias 44 in the second wiring layer 40.

(Modification 1-5)

Figure 14E:
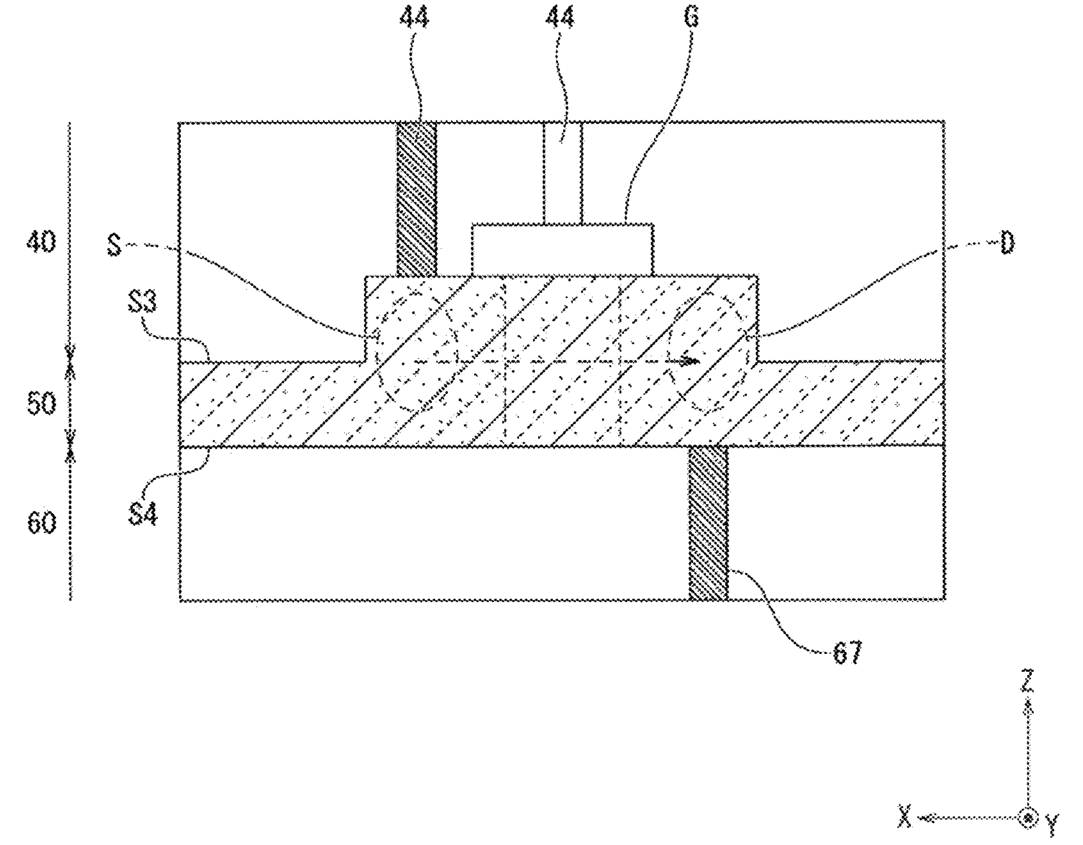
FIG. 14E is a longitudinal cross-sectional diagram of a transistor included in an optical detection device according to modification 1-5 of the second embodiment of the present technology.

As depicted in FIG. 14E, the drain D is connected to the via 67 in the third wiring layer 60, while the gate electrode G and the source S are connected to the vias 44 in the second wiring layer 40.

(Modification 1-6)

Figure 14F:
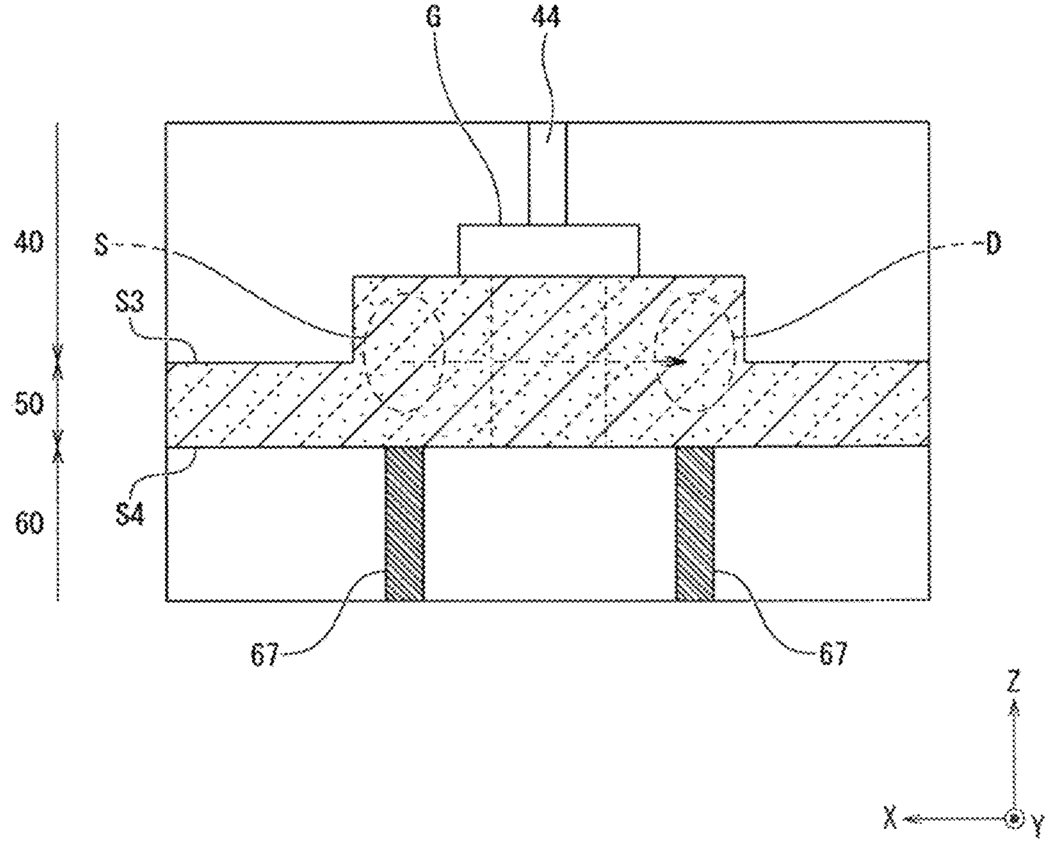
FIG. 14F is a longitudinal cross-sectional diagram of a transistor included in an optical detection device according to modification 1-6 of the second embodiment of the present technology.

As depicted in FIG. 14F, the drain D and the source S are connected to the vias 67 in the third wiring layer 60, while the gate electrode G is connected to the via 44 in the second wiring layer 40.

(Main Advantageous Effects of Modification 1 of Second Embodiment)

Advantageous effects similar to those of the optical detection device 1 of the second embodiment described above can be offered by the optical detection device 1 according to modification 1 of the second embodiment described here.

Moreover, according to the optical detection device 1 in modification 1 of the second embodiment described here, each of the gate electrode G, the source S, and the drain D is connectable to the via 67 in the third wiring layer 60 or the via 44 in the second wiring layer 40. Accordingly, the degree of freedom in design improves.

<Modification 2>

Modification 2 of the second embodiment described here is different from the second embodiment in the manufacturing method of the optical detection device 1. The manufacturing method of the optical detection device 1 of modification 2 of the second embodiment will hereinafter be described with reference to FIGS. 15A to 15C while focus is placed on a different part of the manufacturing method.

Figure 15A:
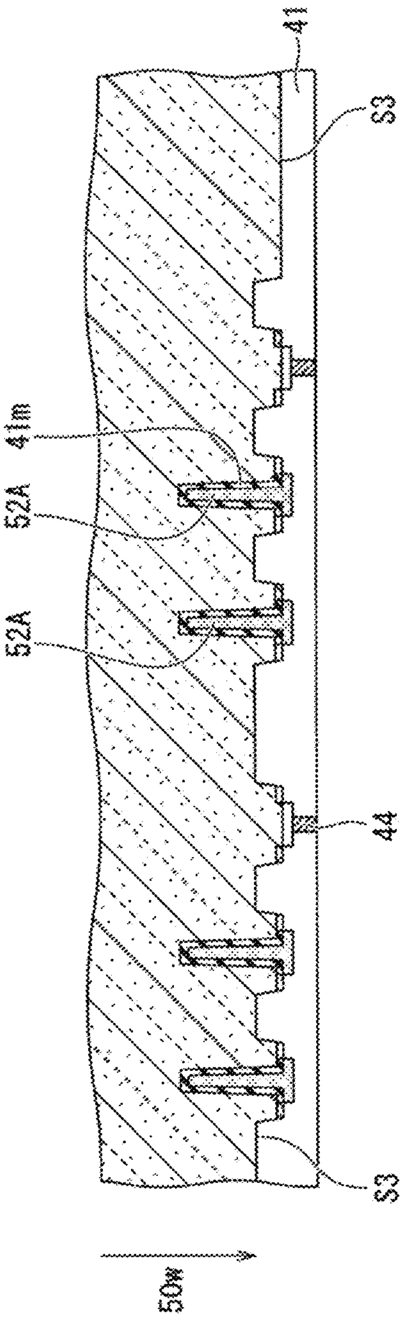
FIG. 15A is a step cross-sectional diagram depicting a manufacturing method of an optical detection device according to modification 2 of the second embodiment of the present technology.

As depicted in FIG. 15A, the second conductors 52A and the insulation films 41*m* are formed in the second semiconductor layer 50*w*. Thereafter, the vias 44 of the second wiring layer 40 are formed on the third surface S3 of the second semiconductor layer 50*w*. Formation of the second wiring layer 40 is temporarily stopped in the state depicted in FIG. 15A. More specifically, formation of the second wiring layer 40 is temporarily stopped before a layer including metal such as copper and aluminum, for example, is formed on the second wiring layer 40.

Figure 15B:
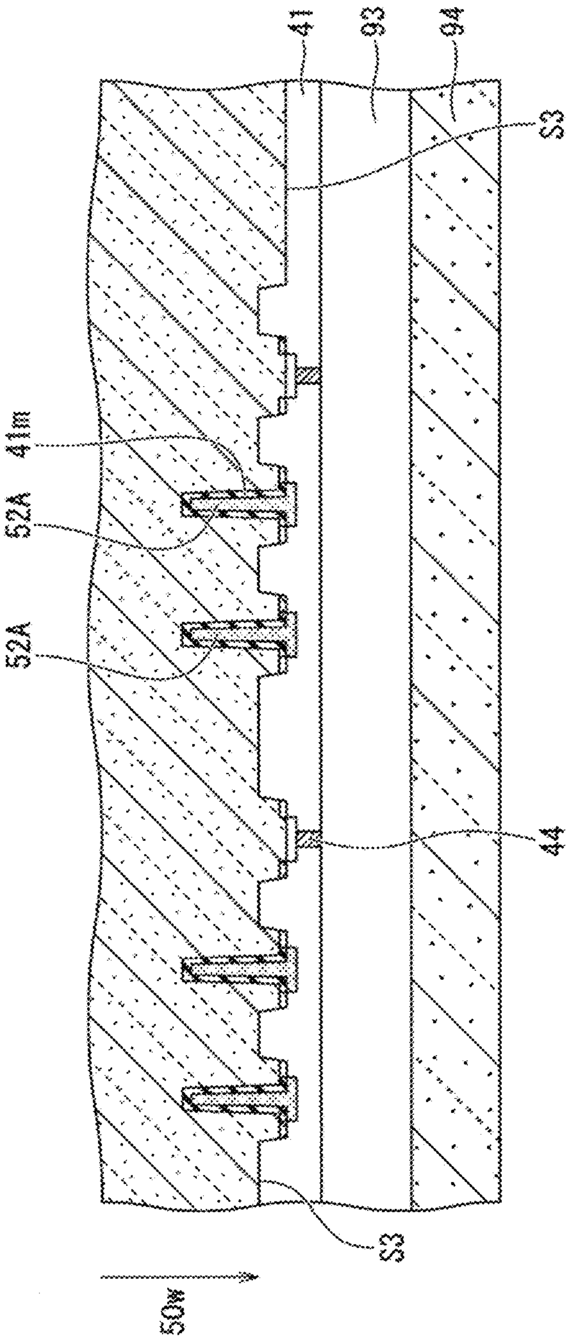
FIG. 15B is a step cross-sectional diagram continuing from FIG. 15A.

Subsequently, as depicted in FIG. 15B, a support substrate 94 where an insulation film 93 is formed is joined to the third surface S3 side of the second semiconductor layer 50*w* where the vias 44 are formed. In such a manner, the support substrate 94, which is a temporary substrate, is joined to the third surface S3 side of the second semiconductor layer 50*w* before the first wiring layer 30 containing a layer including metal such as copper and aluminum, for example, is joined.

A wafer depicted in FIG. 15B is a wafer in a state not containing a layer including metal such as copper and aluminum, for example.

Figure 15C:
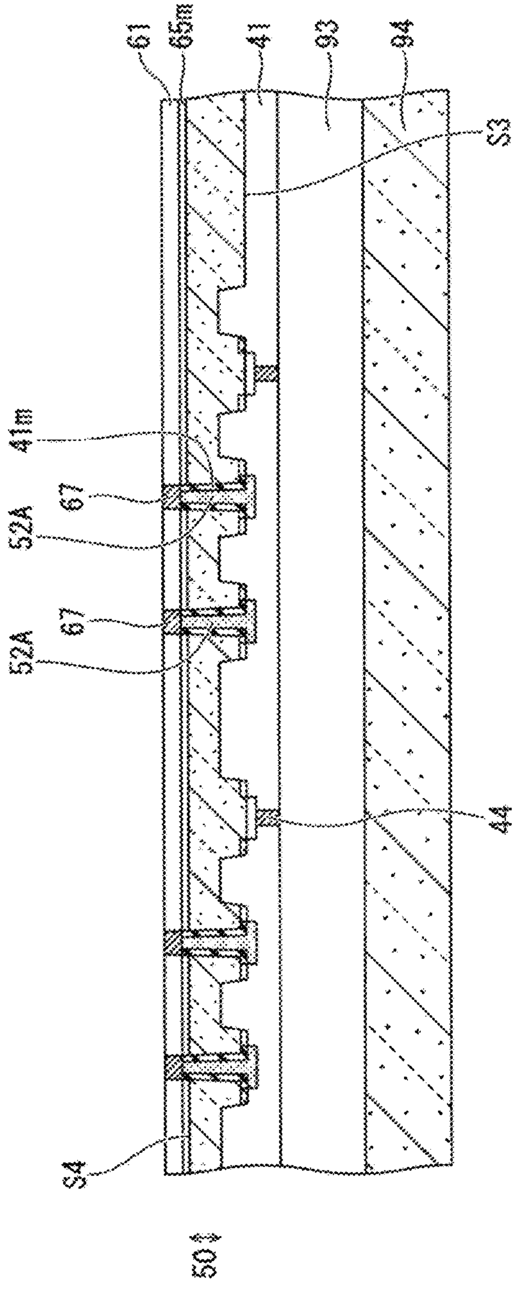
FIG. 15C is a step cross-sectional diagram continuing from FIG. 15B.

Next, the steps described in the second embodiment and depicted in FIGS. 13B to 13D are carried out. Thereafter, as depicted in FIG. 15C, the vias 67 are formed on the fourth surface S4 side of the second semiconductor layer 50. Heat treatment is executed in the step for forming the vias 67 here. At the time of execution of this heat treatment, the wafer does not contain a layer including metal such as copper and aluminum, for example. Accordingly, the heat treatment is allowed to be performed at a higher temperature than in a case where the wafer contains a layer including metal. Thereafter, the third wiring layer 60 is completed.

Subsequently, the second semiconductor layer 50 on which the third wiring layer 60 is laminated and the third semiconductor layer 80 as a separately prepared layer on which the fourth wiring layer 70 is laminated are joined to each other by B2F. Then, the insulation film 93 and the support substrate 94 are removed. Thereafter, the third wiring layer 60 is completed, and the second semiconductor layer 50 and the first semiconductor layer 20 are joined to each other by F2F (Face to Face). Steps following this step are similar to the corresponding steps described in the second embodiment, and hence are not repeatedly explained here.

Advantageous effects similar to those of the optical detection device 1 of the second embodiment described above can be offered by the optical detection device 1 according to modification 2 of the second embodiment described here.

Moreover, according to the optical detection device 1 in modification 2 of the second embodiment, the heat treatment is executed at a higher temperature at the time of formation of the vias 67. Accordingly, an increase in a resistance value of the vias 67 can be reduced.

<Modification 3>

The optical detection device 1 of the present modification 3 of the second embodiment is different from the optical detection device 1 of the second embodiment in that wires and connection pads included in the first wiring layer 30 and the second wiring layer 40 include polysilicon. Moreover, the manufacturing method of the optical detection device 1 of the present modification 3 of the second embodiment is different from the manufacturing method of the optical detection device 1 of the second embodiment. The manufacturing method of the optical detection device 1 of modification 3 of the second embodiment will hereinafter be described with reference to FIGS. 16A to 16B while focus is placed on a different part of the manufacturing method.

Figure 16A:
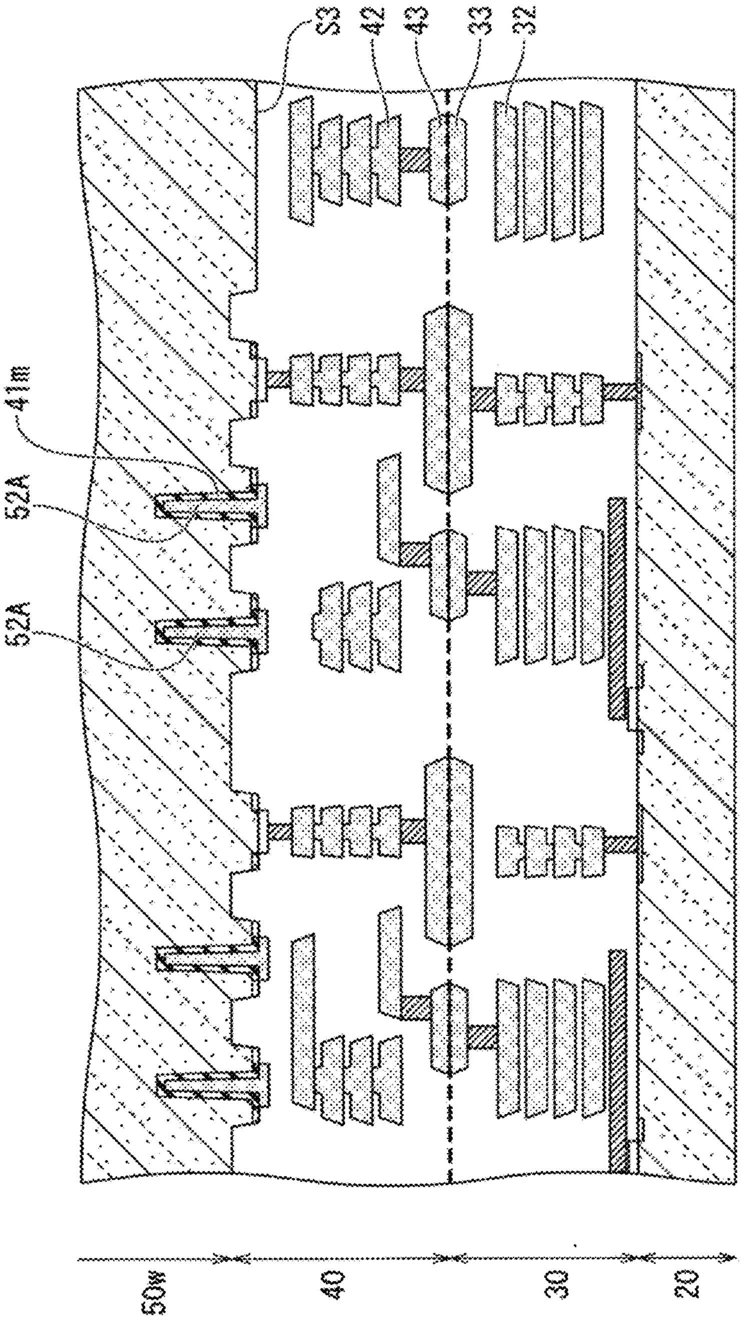
FIG. 16A is a step cross-sectional diagram depicting a manufacturing method of an optical detection device according to modification 3 of the second embodiment of the present technology.

FIG. 16A depicts a state where the second semiconductor layer 50 and the first semiconductor layer 20 are joined to each other prior to exposure of the ends of the second conductors 52A and the insulation films 41*m*. All of the wires 32, the first connection pads 33, the wires 42, and the second connection pads 43 depicted in FIG. 16A include polysilicon, but not metal such as copper and aluminum.

Figure 16B:
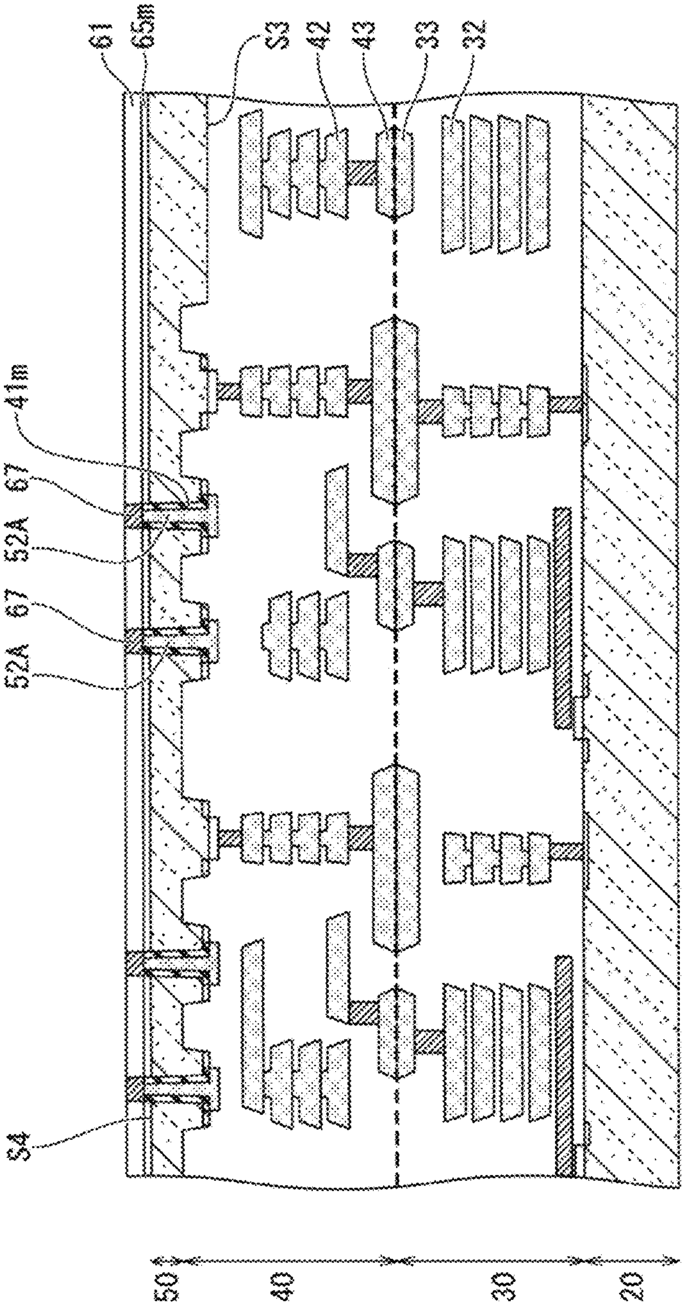
FIG. 16B is a step cross-sectional diagram continuing from FIG. 16A.

Next, the steps described in the second embodiment and depicted in FIGS. 13B to 13D are carried out. Thereafter, as depicted in FIG. 16B, the vias 67 are formed on the fourth surface S4 side of the second semiconductor layer 50. At the time of execution of heat treatment for the vias 67, the wafer does not contain a layer including metal such as copper and aluminum, for example. Accordingly, the heat treatment is allowed to be performed at a higher temperature than in a case where the wafer contains a layer including metal. Thereafter, the third wiring layer 60 is completed. Steps following this step are similar to the corresponding steps described above in the second embodiment, and hence are not repeatedly explained here.

Advantageous effects similar to those of the optical detection device 1 of the second embodiment described above can be offered by the optical detection device 1 according to modification 3 of the second embodiment described here.

Moreover, according to the optical detection device 1 in modification 3 of the second embodiment, the heat treatment is executed at a higher temperature at the time of formation of the vias 67. Accordingly, an increase in a resistance value of the vias 67 can be reduced.

<Modification 4>

Figure 17:
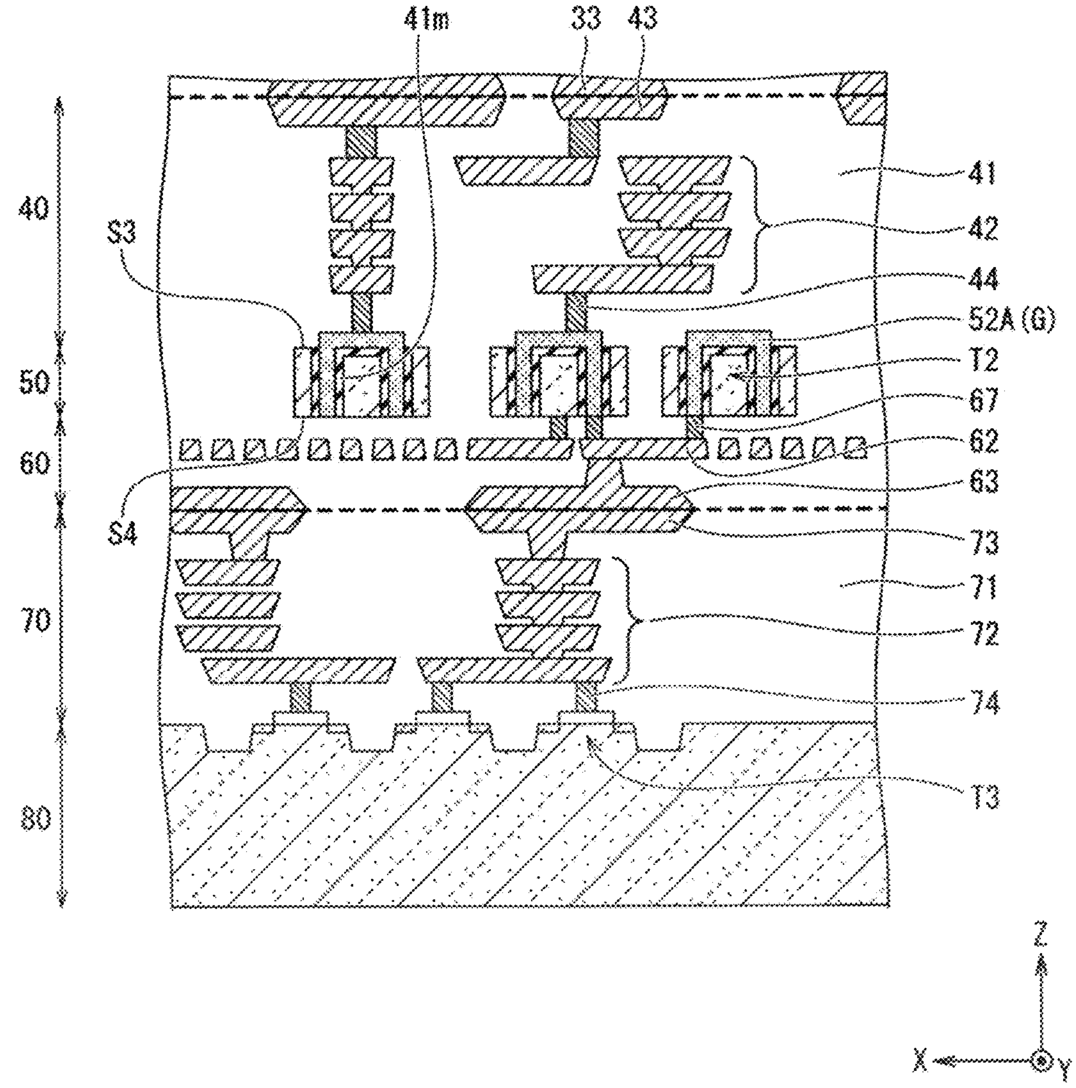
FIG. 17 is a longitudinal cross-sectional diagram depicting a main part of an optical detection device according to modification 4 of the second embodiment of the present technology.

While the transistors T2 included in the optical detection device 1 according to the second embodiment are planar-type transistors, the present technology is not limited to this example. As depicted in FIG. 17, the transistors T2 according to modification 4 of the second embodiment are FIN-FET-type transistors. More specifically, the transistors T2 are SOI-FINFET-type transistors formed with use of an SOI wafer.

<Second Conductor>

Figure 18A:
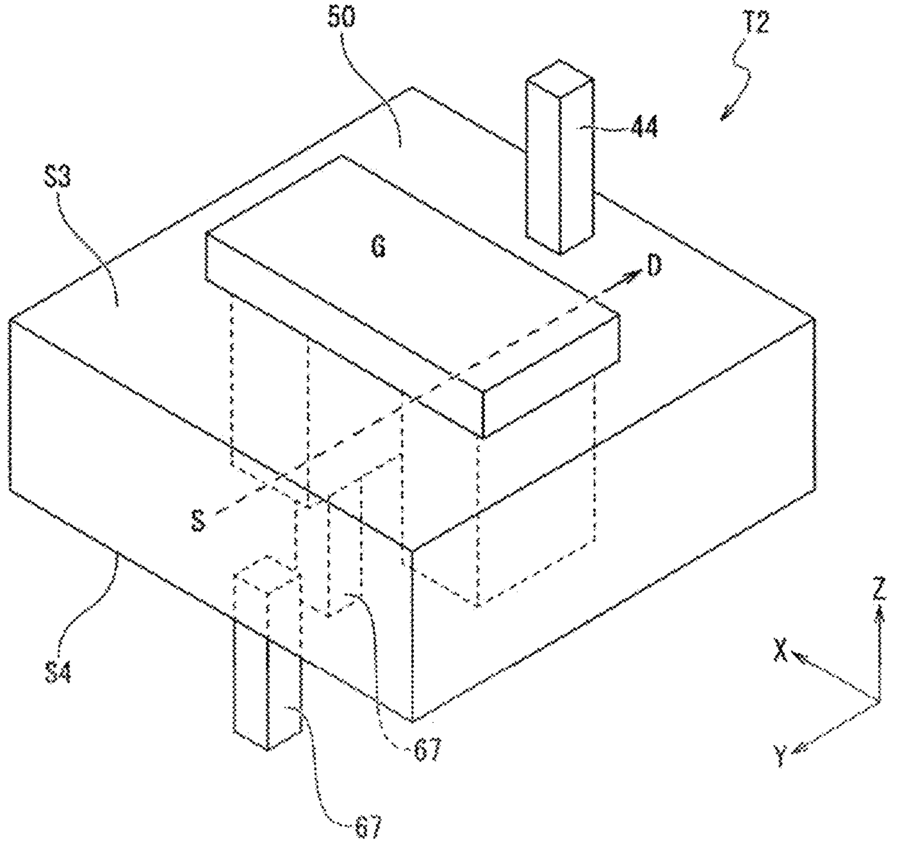
FIG. 18A is a perspective diagram of a transistor included in an optical detection device according to modification 4-1 of the second embodiment of the present technology.
Figure 18B:
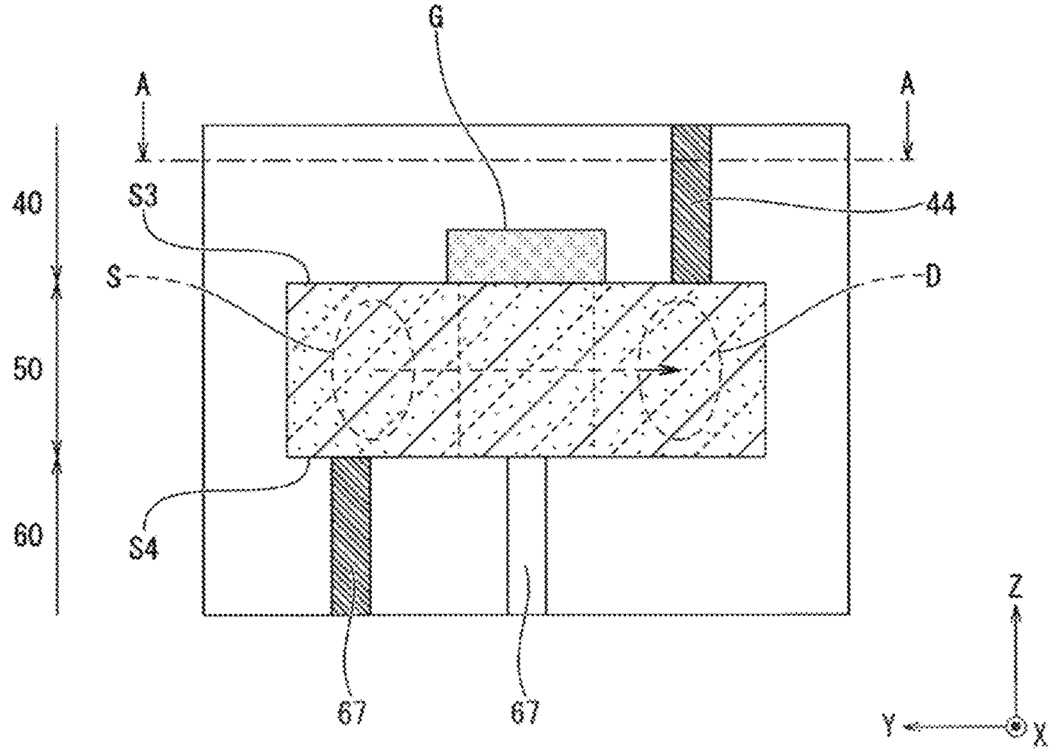
FIG. 18B is a longitudinal cross-sectional diagram of the transistor depicted in FIG. 18A.
Figure 18C:
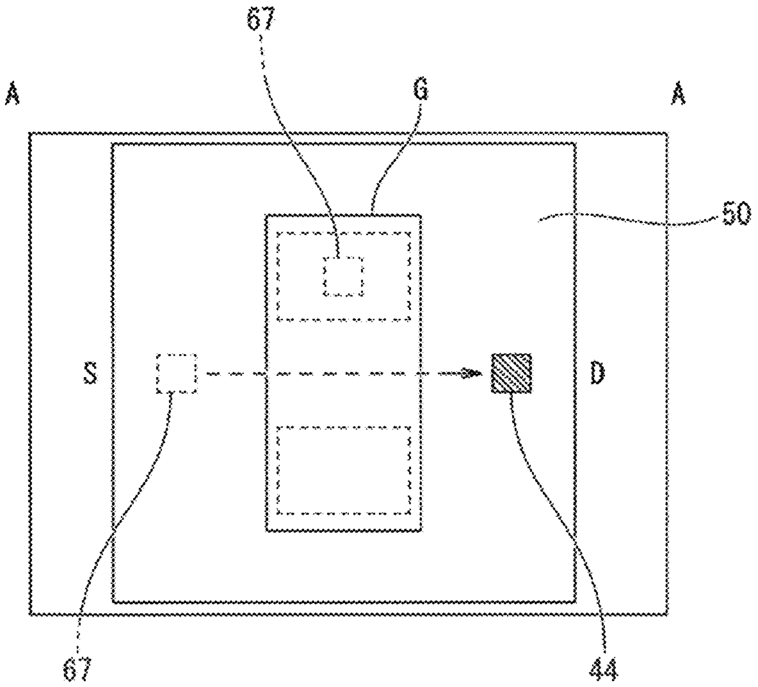
FIG. 18C is a lateral cross-sectional diagram depicting a cross-sectional structure in a cross-sectional view taken along a section line A-A in FIG. 18B.

Each of the second conductors 52A depicted in FIG. 17 functions as the gate electrode G of the transistor T2 (first transistor). Each of the second conductors 52A depicted in FIG. 17 has a plurality of vertical portions penetrating the second semiconductor layer 50 in the Z-direction. Moreover, each of the second conductors 52A has a horizontal portion connecting the respective vertical portions. According to the example depicted in FIG. 17, each of the second conductors 52A connects respective ends of the two vertical portions on the third surface S3 side. Moreover, each of the insulation films 41*m* provided between the second conductor 52A and the second semiconductor layer 50 functions as a gate insulation film. The source S and the drain D of each of the transistors T2 are provided in the vertical direction with respect to the sheet surface of FIG. 17. As depicted in FIGS. 18A to 18C, the channel of each of the transistors T2 is formed in a portion located between the respective vertical portions of the second conductor 52A in the second semiconductor layer 50. In other words, the channel is formed between respective side surfaces included in the vertical portions of the second conductor 52A and facing each other. Hereinafter described will be a modification of the transistors T2.

<Modification 4-1>

According to modification 4-1 depicted in FIGS. 18A to 18C, the gate electrode G and the source S are connected to the vias 67 in the third wiring layer 60, while the drain Dis connected to the via 44 in the second wiring layer 40.

<Modification 4-2>

Figure 19A:
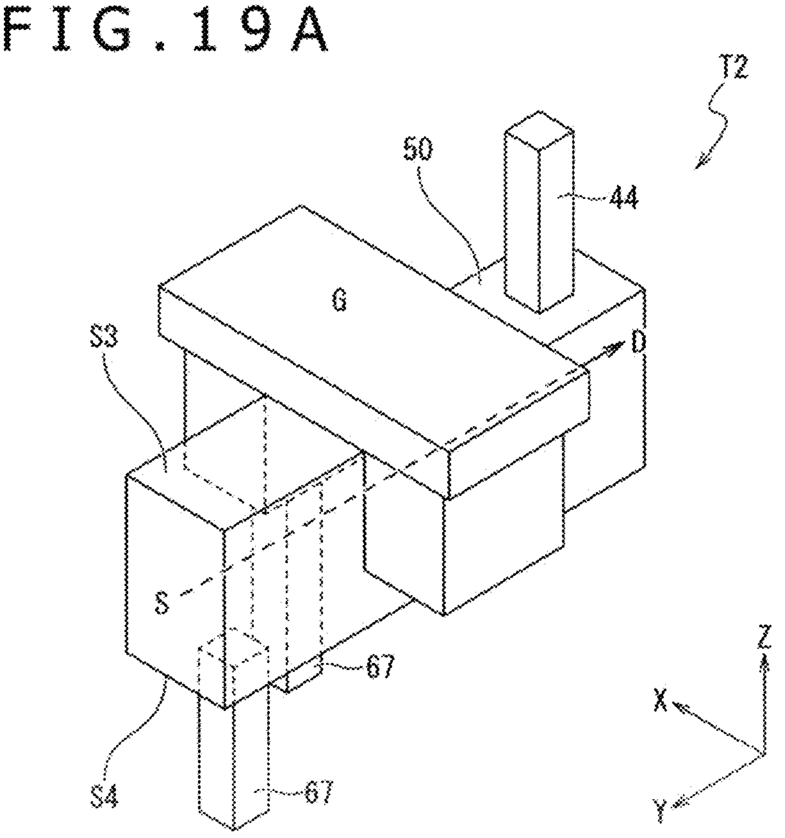
FIG. 19A is a perspective diagram of a transistor included in an optical detection device according to modification 4-2 of the second embodiment of the present technology.
Figure 19B:
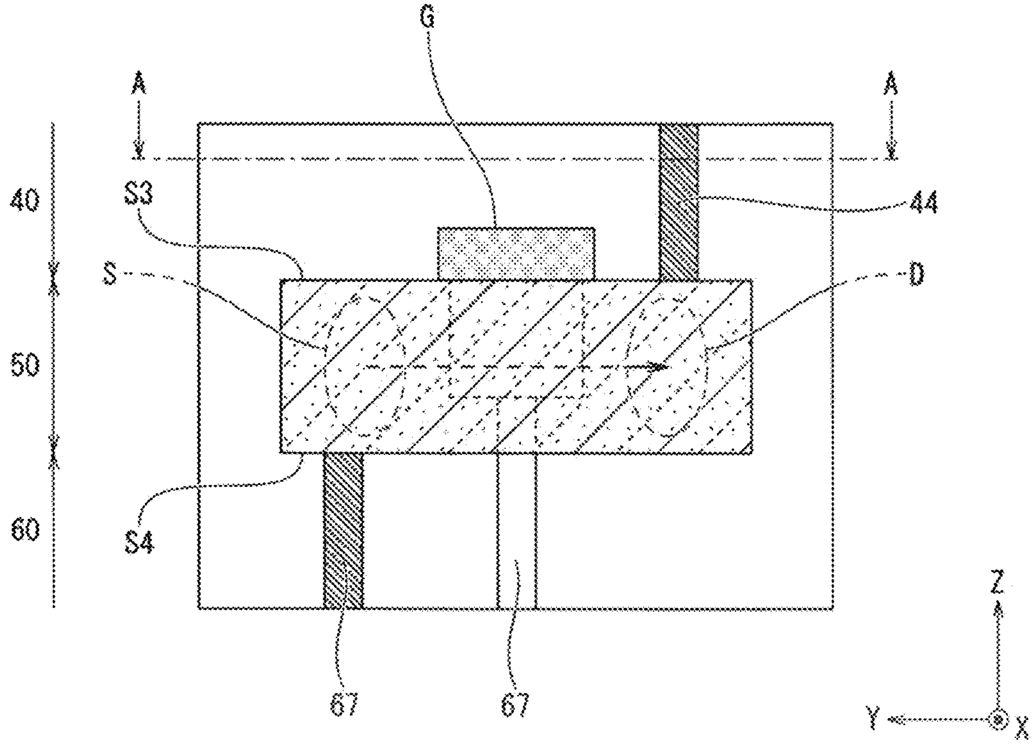
FIG. 19B is a longitudinal cross-sectional diagram of the transistor depicted in FIG. 19A.
Figure 19C:
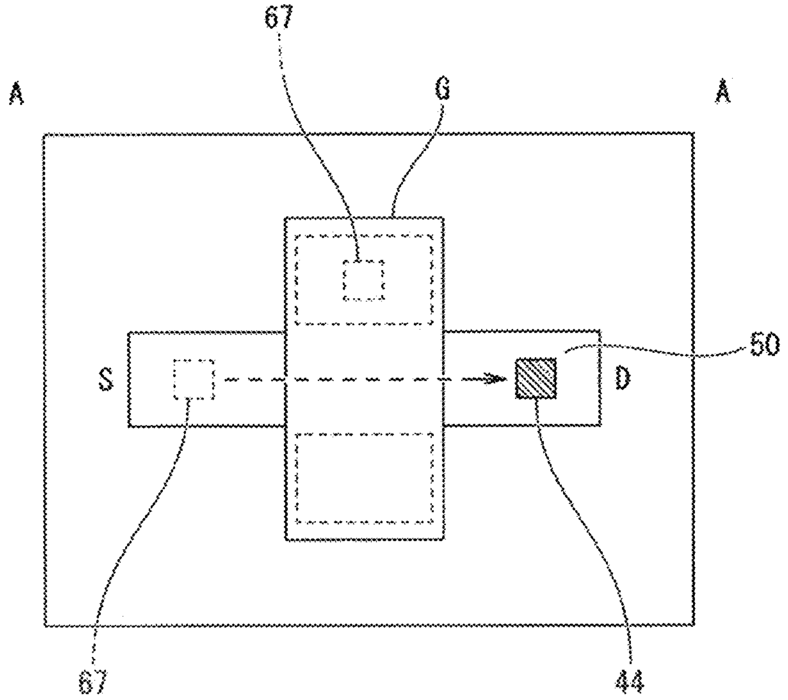
FIG. 19C is a lateral cross-sectional diagram depicting a cross-sectional structure in a cross-sectional view taken along a section line A-A in FIG. 19B.

While the second semiconductor layer 50 is provided in such a manner as to surround the vertical portions of the gate electrode G in modification 4-1, the present technology is not limited to this example. According to modification 4-2, the second semiconductor layer 50 is not required to exist on the side of the vertical portions of the gate electrode G opposite to the side where the channel is formed as depicted in FIGS. 19A to 19C.

Moreover, while the vertical portions of the gate electrode G reach the fourth surface S4 of the second semiconductor layer 50 according to the transistor T2 in modification 4-1, the present technology is not limited to this example. As depicted in FIGS. 19A and 19B, the vertical portions are not required to reach the fourth surface S4 of the second semiconductor layer 50. In that case, the vias 67 in the third wiring layer 60 are extended to reach the vertical portions as depicted in FIG. 19B. In such a manner, connection between the vias 67 and the vertical portions is achievable.

<Modification 4-3>

Figure 20:
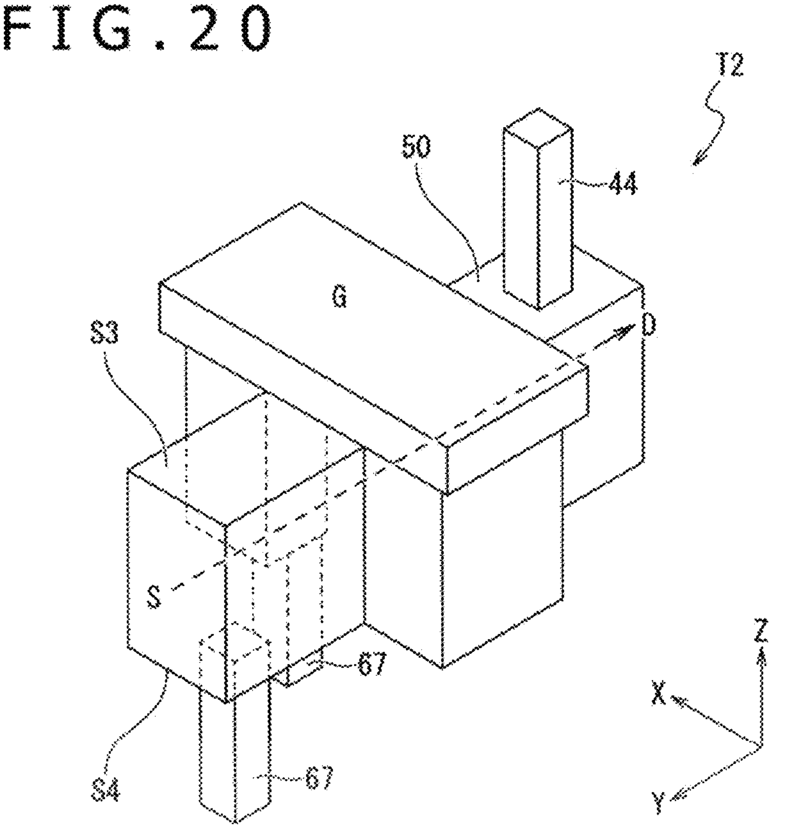
FIG. 20 is a perspective diagram of a transistor included in an optical detection device according to modification 4-3 of the second embodiment of the present technology.

While the vertical portions do not reach the fourth surface S4 of the second semiconductor layer 50 according to the transistor T2 in modification 4-2, the present technology is not limited to this example. According to modification 4-3, the vertical portions may reach the fourth surface S4 of the second semiconductor layer 50 as depicted in FIG. 20.

<Modification 4-4>

According to the transistors T2 presented in modifications 4-1 to 4-3, the gate electrode G and the source S are connected to the vias 67 in the third wiring layer 60, while the drain D is connected to the via 44 in the second wiring layer 40. However, this configuration is not required to be adopted. According to modification 4-4, each of the gate electrode G, the source S, and the drain D is only required to be connected to either the via 44 or the via 67. The relation between the gate electrode G, the source S, the drain D, and the via may be any relation of the configurations depicted in FIG. 12B and FIGS. 14A to 14F.

(Main Advantageous Effects of Modification 4 of Second Embodiment)

Advantageous effects similar to those of the optical detection device 1 of the second embodiment described above can be offered by the optical detection device 1 according to modification 4 of the second embodiment described here.

<Modification 5>

Figure 21:
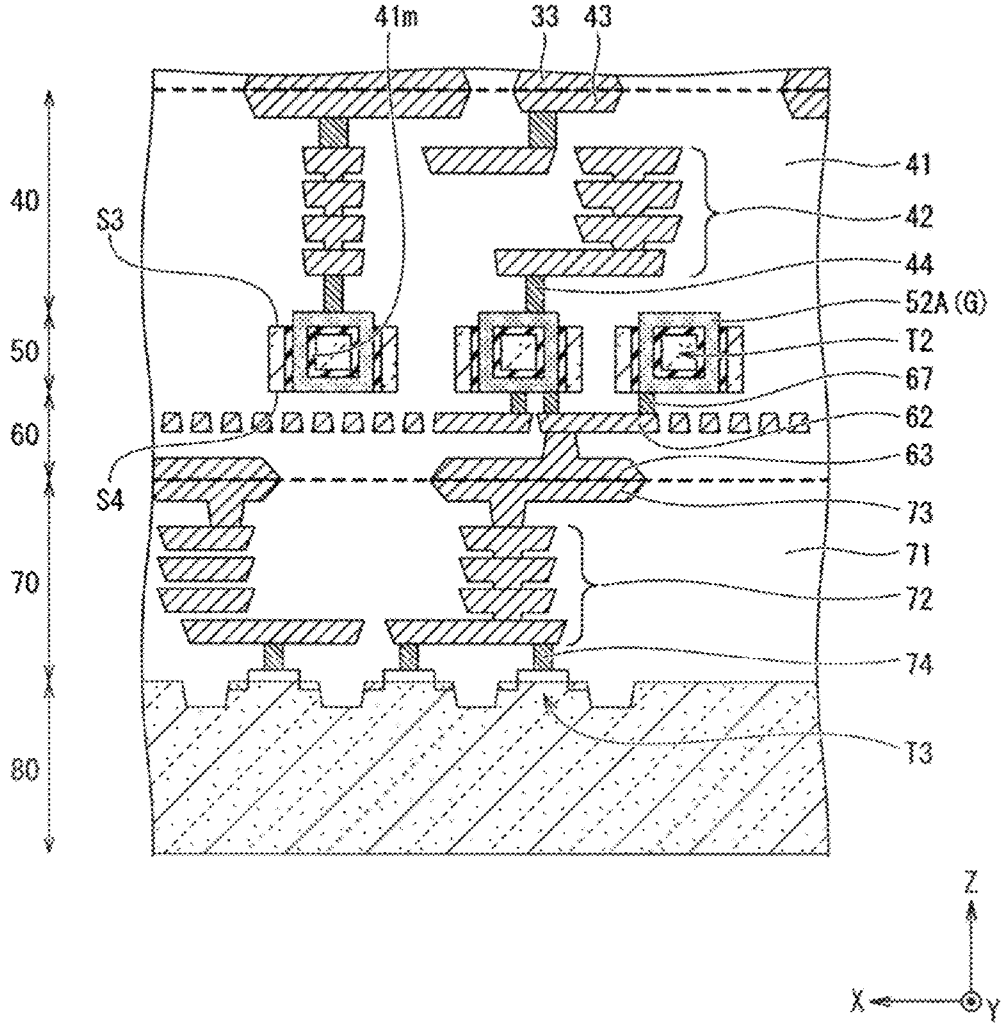
FIG. 21 is a longitudinal cross-sectional diagram depicting a main part of an optical detection device according to modification 5 of the second embodiment of the present technology.
Figure 22A:
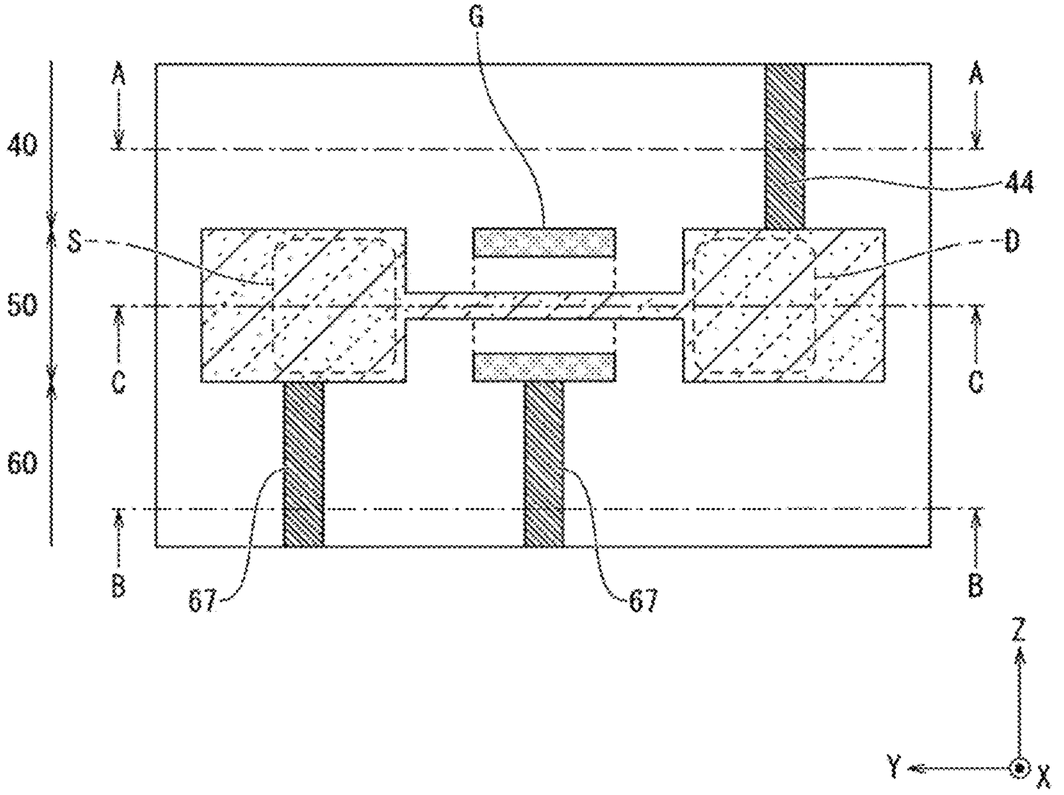
FIG. 22A is a longitudinal cross-sectional diagram of a transistor included in an optical detection device according to modification 5-1 of the second embodiment of the present technology.
Figure 22B:
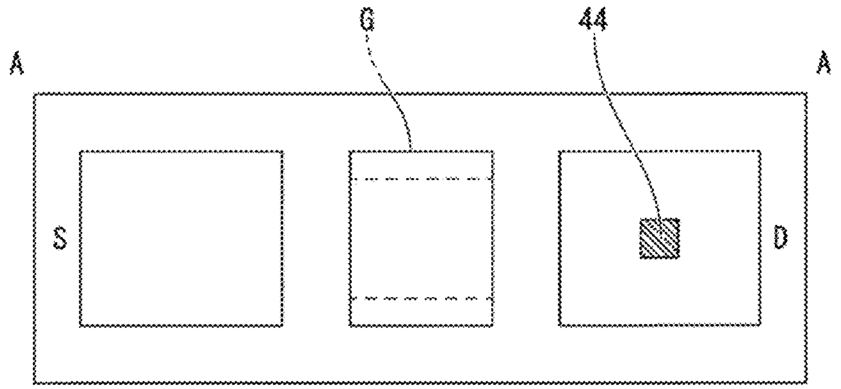
FIG. 22B is a lateral cross-sectional diagram depicting a cross-sectional structure in a cross-sectional view taken along a section line A-A in FIG. 22A.
Figure 22C:
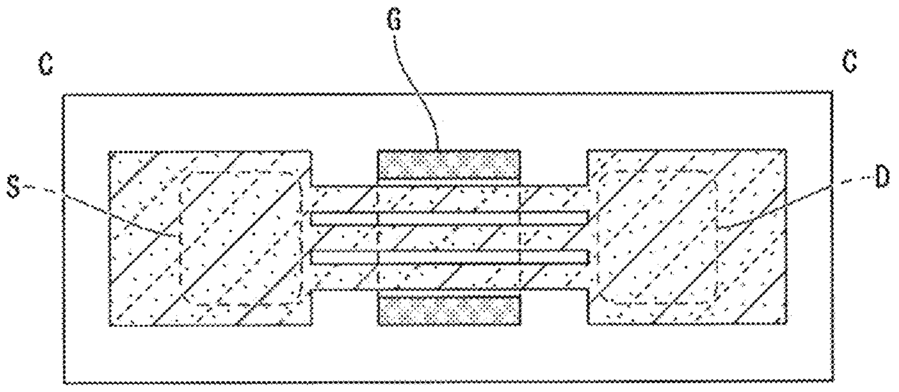
FIG. 22C is a lateral cross-sectional diagram depicting a cross-sectional structure in a cross-sectional view taken along a section line C-C in FIG. 22A.
Figure 22D:
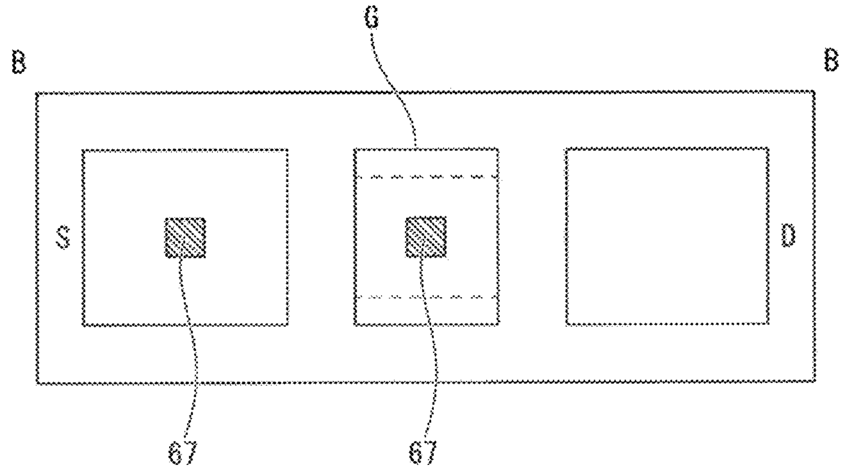
FIG. 22D is a lateral cross-sectional diagram depicting a cross-sectional structure in a cross-sectional view taken along a section line B-B in FIG. 22A.

As depicted in FIG. 21, the transistors T2 according to modification 5 of the second embodiment are GAA (Gate All Around) FET-type transistors. More specifically, the transistors T2 are SOI-GAAFET-type transistors formed with use of an SOI wafer.

<Second Conductor>

Each of the second conductors 52A functions as the gate electrode G of the transistor T2 (first transistor). According to the example depicted in FIG. 21, each of the second conductors 52A has a horizontal portion connecting respective ends of vertical portions on the third surface S3 side and a horizontal portion connecting respective ends of the vertical portions on the fourth surface S4 side. Many points other than this point are similar to the corresponding points of the transistors T2 according to modification 4 of the second embodiment. Accordingly, these similar points will not be repeatedly described in detail. Hereinafter described will be a modification of the transistors T2.

(Modification 5-1)

According to modification 5-1 depicted in FIG. 22A to FIG. 22D, a plurality of channels of the transistor T2 are arrayed in the horizontal direction (the direction perpendicular to the Z-direction).

(Modification 5-2)

Figure 23A:
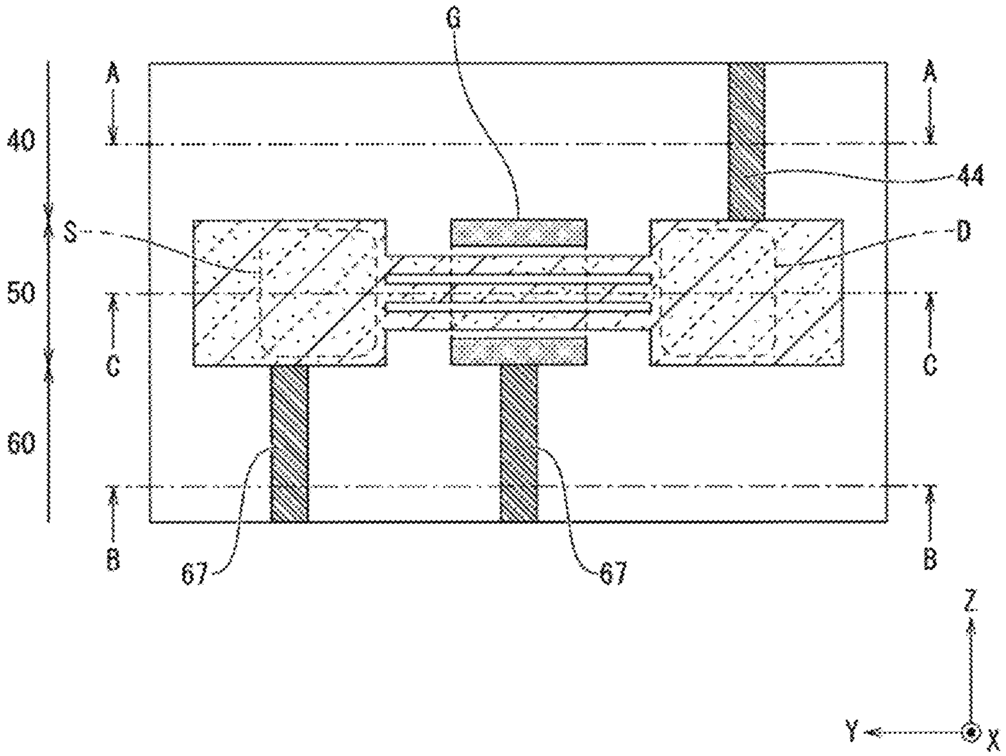
FIG. 23A is a longitudinal cross-sectional diagram of a transistor included in an optical detection device according to modification 5-2 of the second embodiment of the present technology.
Figure 23B:
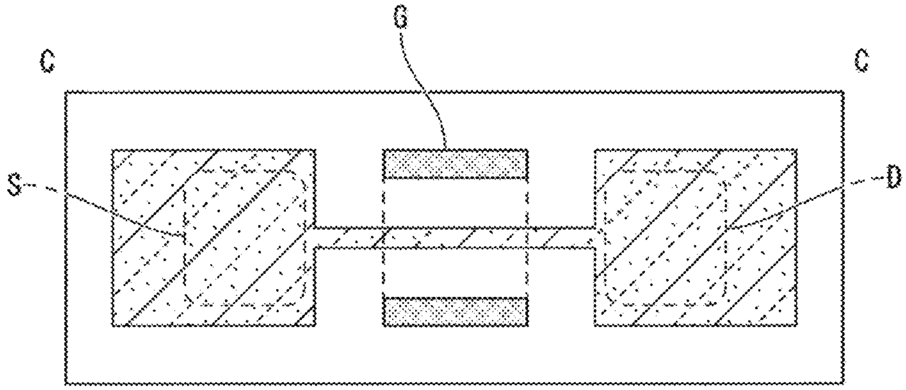
FIG. 23B is a lateral cross-sectional diagram depicting a cross-sectional structure in a cross-sectional view taken along a section line C-C in FIG. 23A.

According to modification 5-2 depicted in FIG. 23A and FIG. 23B, a plurality of channels of the transistor T2 are arrayed in the Z-direction. Note that cross-sectional views taken along A-A and B-B in FIG. 23A are similar to the cross-sectional views in FIG. 22B and FIG. 22D.

(Modification 5-3)

Figure 24A:
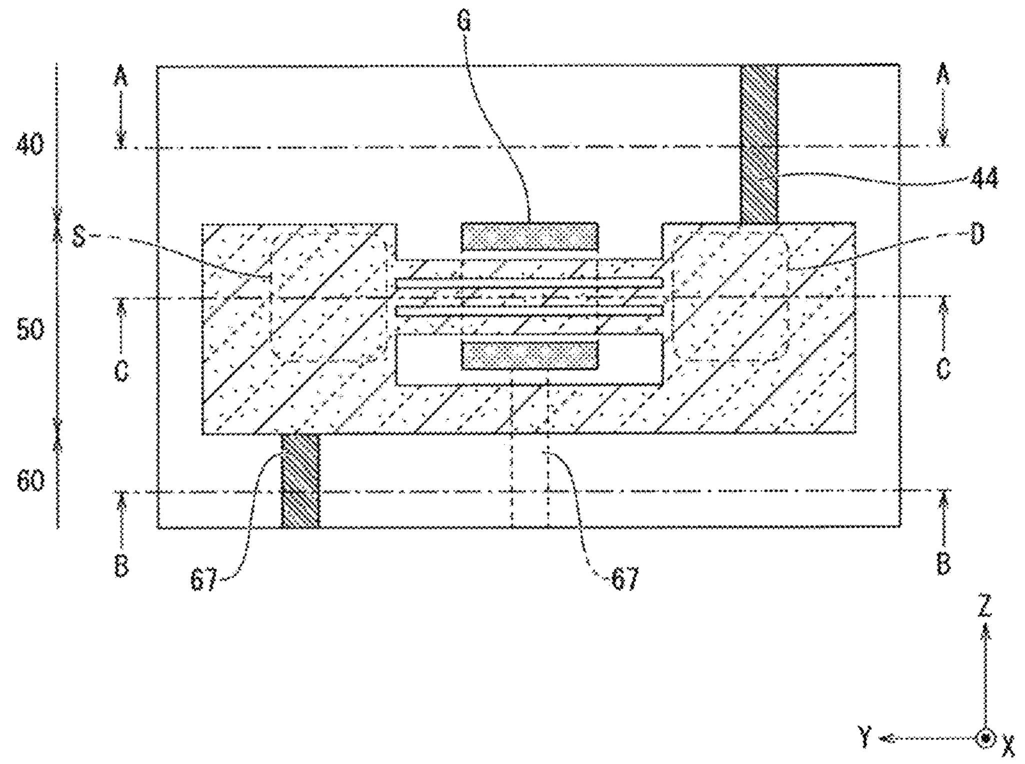
FIG. 24A is a longitudinal cross-sectional diagram of a transistor included in an optical detection device according to modification 5-3 of the second embodiment of the present technology.
Figure 24B:
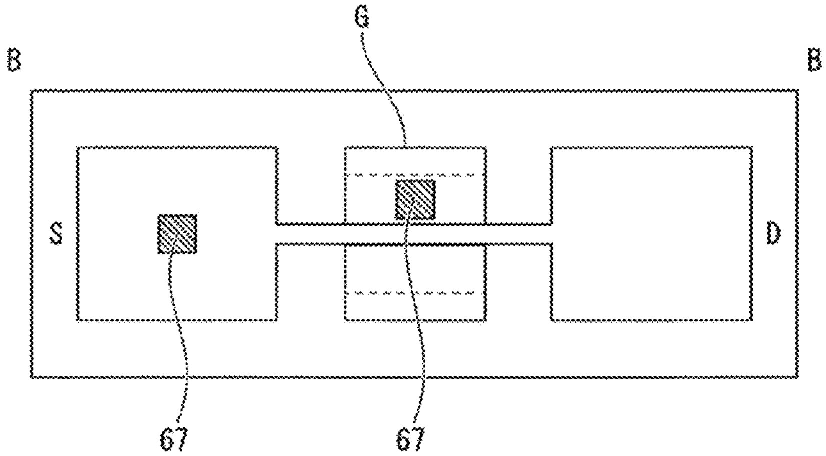
FIG. 24B is a lateral cross-sectional diagram depicting a cross-sectional structure in a cross-sectional view taken along a section line B-B in FIG. 24A.

According to modification 5-3 depicted in FIG. 24A and FIG. 24B, a plurality of channels of the transistor T2 are arrayed in the thickness direction as in modification 5-2, and also the second semiconductor layer 50 is provided at a position closer to the third wiring layer 60 than the gate electrode G. Note that cross-sectional views taken along A-A and C-C in FIG. 24A are similar to the cross-sectional views in FIG. 22B and FIG. 23B.

(Modification 5-4)

Figure 25:
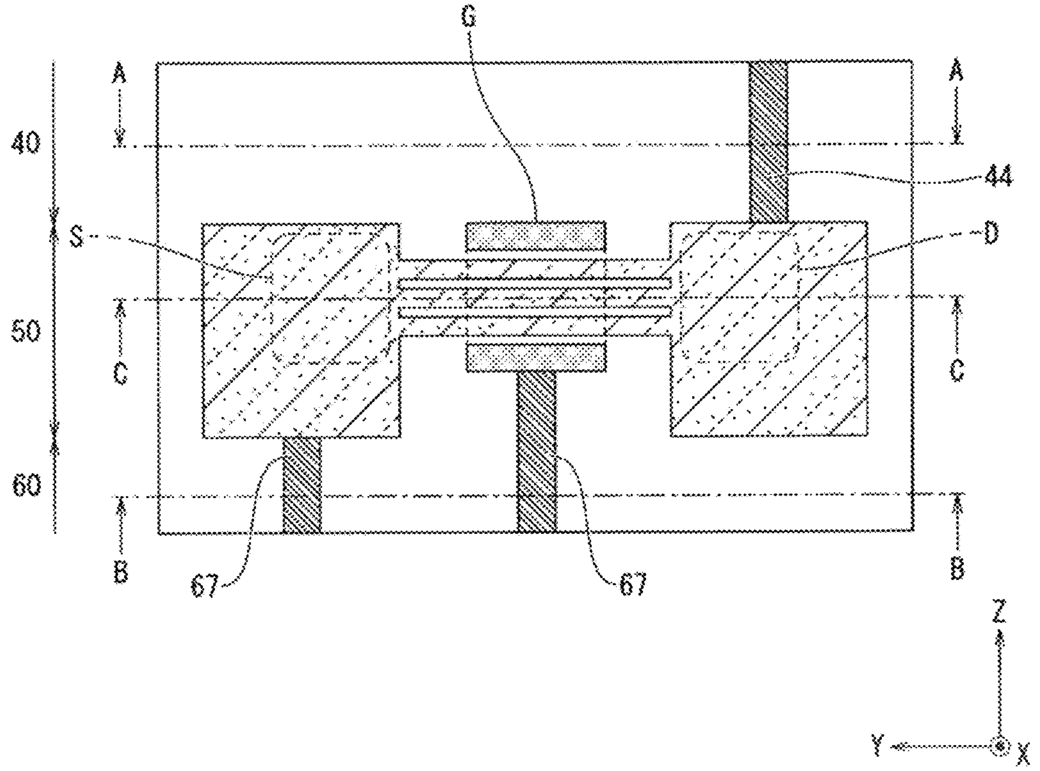
FIG. 25 is a longitudinal cross-sectional diagram of a transistor included in an optical detection device according to modification 5-4 of the second embodiment of the present technology.

According to modification 5-4 depicted in FIG. 25, each size of the gate electrode G, the source S, and the drain D of the transistor T2 in the thickness direction is different from the corresponding size in modification 5-2. Note that cross-sectional views taken along A-A, B-B, and C-C in FIG. 25 are similar to the cross-sectional views in FIGS. 22B, 22D, and 23B.

(Modification 5-5)

Figure 26:
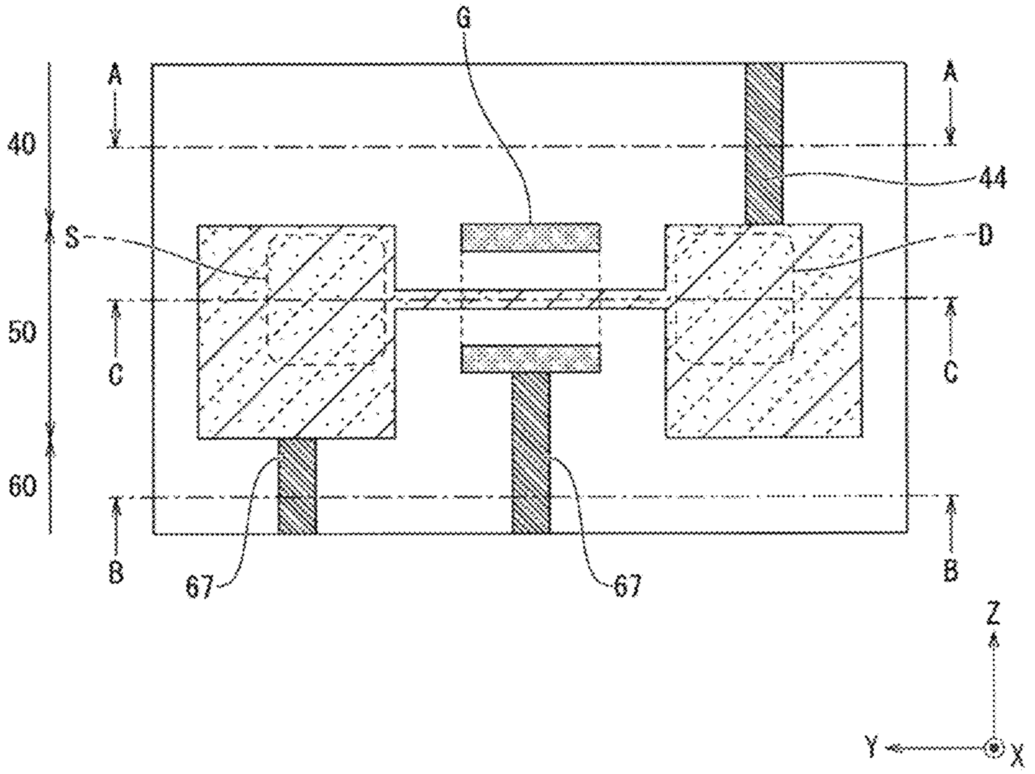
FIG. 26 is a longitudinal cross-sectional diagram of a transistor included in an optical detection device according to modification 5-5 of the second embodiment of the present technology.

According to modification 5-5 depicted in FIG. 26, each size of the gate electrode G, the source S, and the drain D of the transistor T2 in the thickness direction is different from the corresponding size in modification 5-1. Note that cross-sectional views taken along A-A, B-B, and C-C in FIG. 26 are similar to the cross-sectional views in FIGS. 22B, 22D, and 22C.

(Modification 5-6)

According to the transistors T2 presented in modifications 5-1 to 5-5, the gate electrode G and the source S are connected to the vias 67 in the third wiring layer 60, while the drain D is connected to the via 44 in the second wiring layer 40. However, this configuration is not required to be adopted. According to modification 5-6, each of the gate electrode G, the source S, and the drain D is only required to be connected to either the via 44 or the via 67. The relation between the gate electrode G, the source S, the drain D, and the via may be any relation of the configurations depicted in FIG. 12B and FIGS. 14A to 14F.

(Main Advantageous Effects of Modification 5 of Second Embodiment)

Advantageous effects similar to those of the optical detection device 1 of the second embodiment described above can be offered by the optical detection device 1 according to modification 5 of the second embodiment described here.

<Modification 6>

Figure 27:
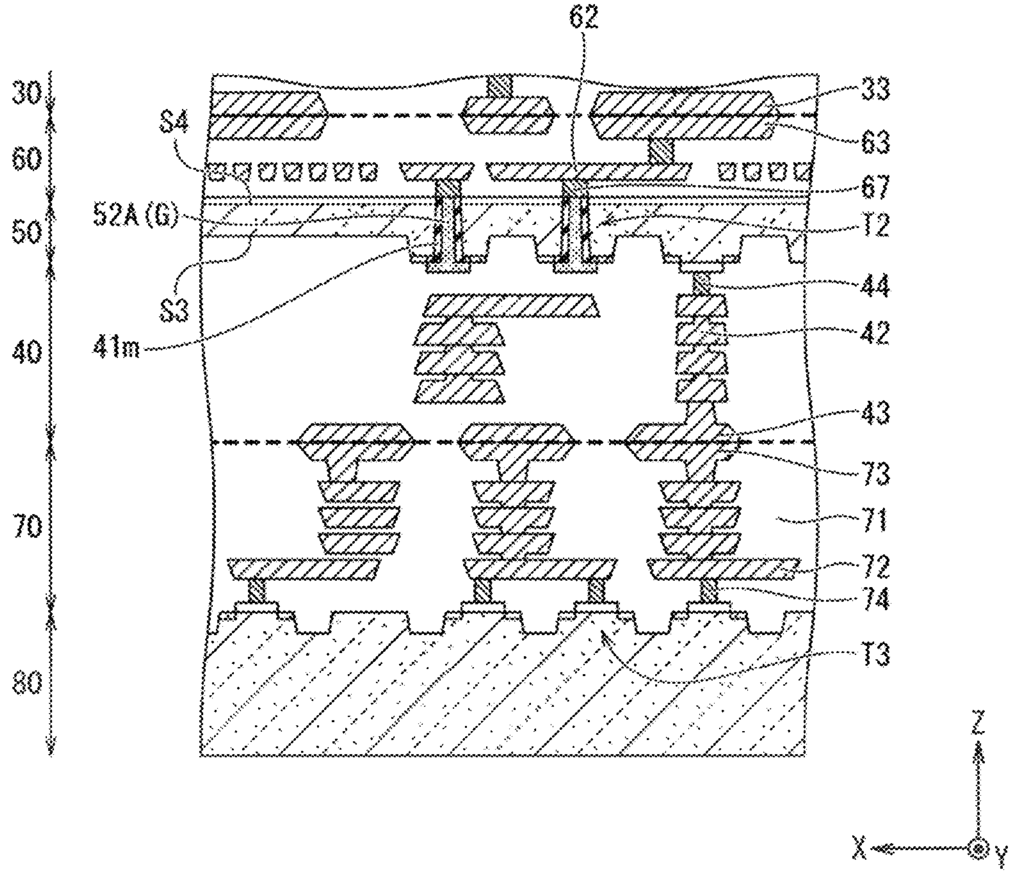
FIG. 27 is a longitudinal cross-sectional diagram depicting a main part of an optical detection device according to modification 6 of the second embodiment of the present technology.

While the second semiconductor layer 50 and the third semiconductor layer 80 are joined to each other by B2F in the second embodiment, the present technology is not limited to this example. As depicted in FIG. 27, the second semiconductor layer 50 and the third semiconductor layer 80 may be joined to each other by F2F. In addition, while not depicted in the figure, the first semiconductor layer 20 and the second semiconductor layer 50 may be joined to each other by F2B. In this case, the third wiring layer 60 corresponds to the second wiring layer, and the second wiring layer 40 corresponds to the third wiring layer.

Advantageous effects similar to those of the optical detection device 1 of the second embodiment described above can be offered by the optical detection device 1 according to modification 6 of the second embodiment described here.

Moreover, in a case where junction is made between the second semiconductor layer 50 and the third semiconductor layer 80 by F2F and between the first semiconductor layer 20 and the second semiconductor layer 50 by F2B, it has conventionally been difficult to achieve electric conduction between a photodiode and the transistor T2. Meanwhile, according to the optical detection device 1 in modification 6 of the second embodiment of the present technology, the gate electrode G penetrates the second semiconductor layer 50 in the thickness direction. In this case, a wire is allowed to be formed directly from the back surface (fourth surface S4) side of the transistor T2 toward the photoelectric conversion element PD provided in the photoelectric conversion region 20*a*. Accordingly, an increase in parasitic capacitance can be reduced.

<Modification 7>

Figure 28A:
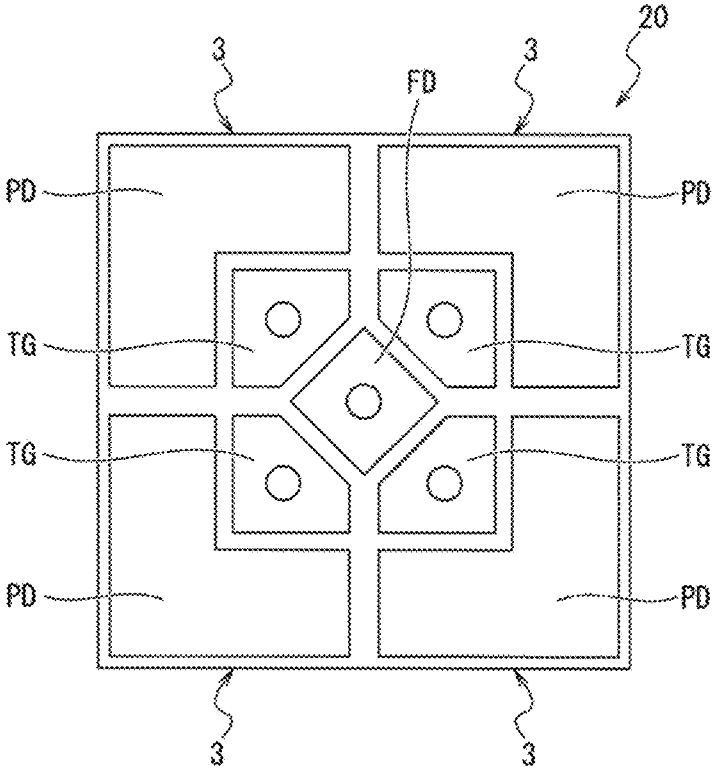
FIG. 28A is a diagram depicting an element layout of a first semiconductor layer included in the optical detection device according to the second embodiment of the present technology.
Figure 28B:
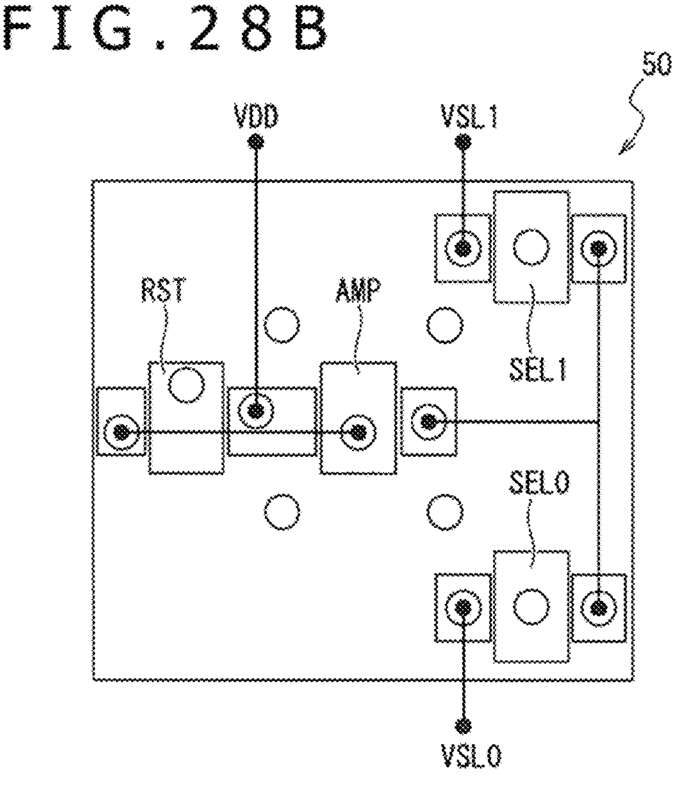
FIG. 28B is a diagram depicting an element layout of a second semiconductor layer included in the optical detection device according to the second embodiment of the present technology.

As depicted in FIG. 28A, the transfer gates TG of the transfer transistors TR and the charge accumulation region FD are disposed in the first semiconductor layer 20 where the photoelectric conversion elements PD are formed. The one charge accumulation region FD is shared by a plurality of pixels 3, such as the four pixels 3, in the first semiconductor layer 20. Moreover, as depicted in FIG. 28B, an amplification transistor AMP, selection transistors SEL0 and SEL1, and a reset transistor RST are disposed in the second semiconductor layer 50. Further, a gate electrode G of the amplification transistor AMP is electrically connected to the charge accumulation region FD and a source region of the reset transistor RST.

Suppose here a case where the gate electrode G of the amplification transistor AMP is the second conductor 52A. The second conductor 52A penetrates the second semiconductor layer 50, and is thus capable of connecting an electric path on the third surface S3 side with an electric path on the fourth surface S4 side. Accordingly, one of the third surface S3 side end and the fourth surface S4 side end of the gate electrode G is connectable to the charge accumulation region FD, while the other end is connectable to the source region of the reset transistor RST.

For example, as described above in modification 6, suppose a case where the first semiconductor layer 20 and the second semiconductor layer 50 are joined to each other by F2B (FIG. 27). Elongation of a wire formed from the gate electrode G to the charge accumulation region FD and a wire formed from the gate electrode G to the source region of the reset transistor RST can be reduced by connecting the fourth surface S4 side end of the gate electrode G of the amplification transistor AMP and the charge accumulation region FD and connecting the third surface S3 side end and the source region of the reset transistor RST.

Advantageous effects similar to those of the optical detection device 1 of the second embodiment described above can be offered by the optical detection device 1 according to modification 7 of the second embodiment described here.

Third Embodiment

Hereinafter described will be the third embodiment of the present technology depicted in FIGS. 29, 30A, and 30B. The optical detection device 1 according to the present third embodiment is different from the optical detection device 1 according to the first embodiment described above in that third connection pads 63A are provided in place of the third connection pads 63. Other configurations of the optical detection device 1 are basically similar to the corresponding configurations of the optical detection device 1 according to the first embodiment described above. Note that the constituent elements already described will be given the same reference signs, and will not be repeatedly explained.

<<Configuration of Optical Detection Device>

The configuration of the optical detection device 1 according to the third embodiment of the present technology will hereinafter be described while focus is placed on a part different from the configuration of the optical detection device according to the first embodiment described above. Note that scales of constituent elements depicted in some of the figures associated with the present third embodiment are different from scales of the same constituent elements in the other figures describing the third embodiment. Moreover, the barrier metal layer is not depicted in the figures explaining the present third embodiment. Furthermore, each of FIGS. 30A and 30B is a diagram schematically depicting the third connection pads 63A depicted in FIG. 29.

<Third Wiring Layer>

Figure 29:
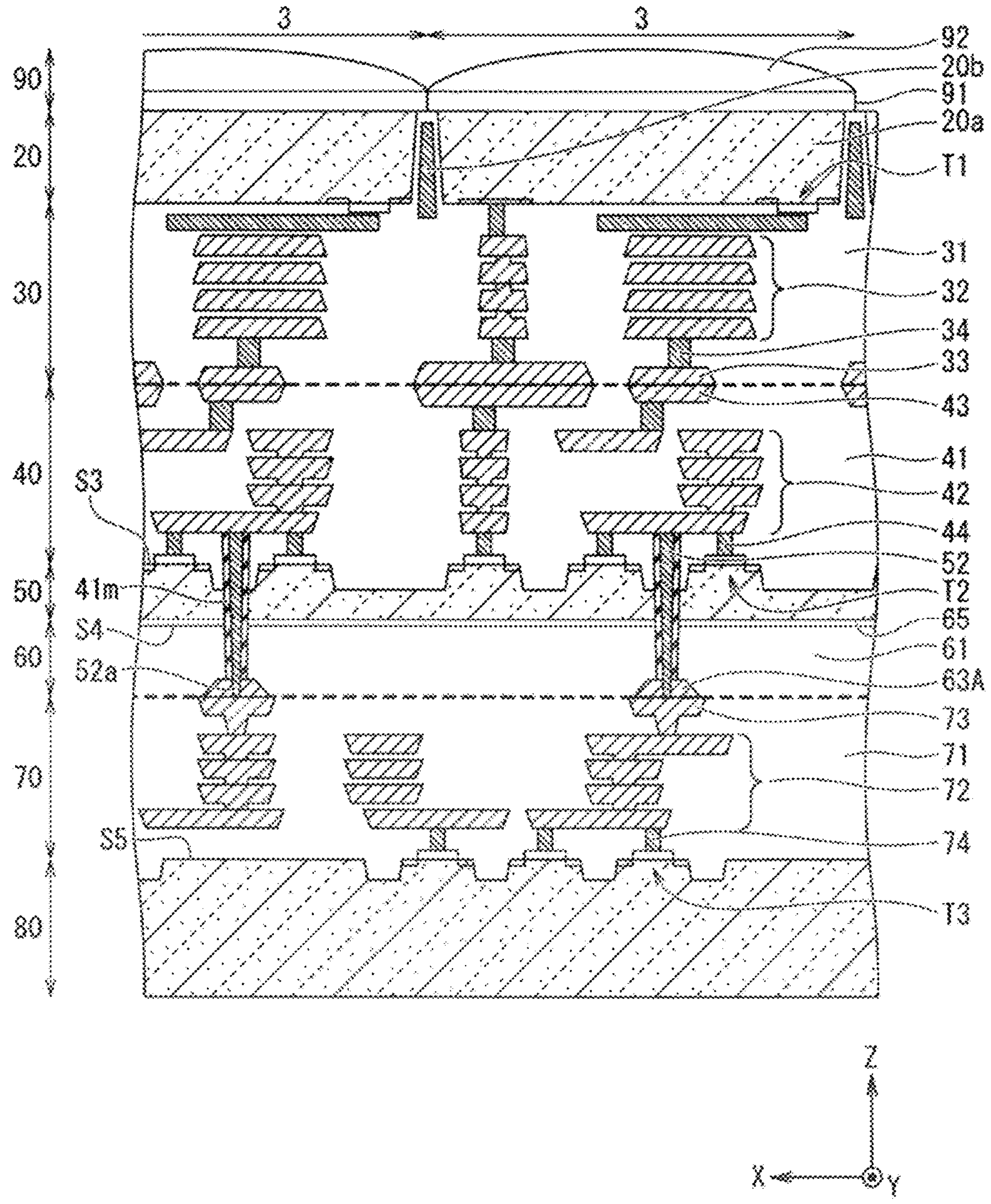
FIG. 29 is a longitudinal cross-sectional diagram depicting a main part of an optical detection device according to a third embodiment of the present technology.

As depicted in FIG. 29, the third wiring layer 60 includes the insulation film 61 and the third connection pads 63 each being provided in the insulation film 61 and having one surface corresponding to a bottom surface and the other surface corresponding to a junction surface. The fourth surface S4 side end of each of the second conductors 52 is extended to the third connection pad 63, and connected to the third connection pad 63. As depicted in FIG. 30A, the insulation film 61 includes an insulation film 61*a* and an insulation film 61*b*. Note that, each of the insulation film 611*a* and the insulation film 61*b* will simply be referred to as the insulation film 61 in a case where no distinction is necessary between these films. The junction surface of each of the third connection pads 63A is connected to the third wiring layer 60 side surface of the fourth connection pad 73 included in the fourth wiring layer 70.

<Third Connection Pad>

Figure 30A:
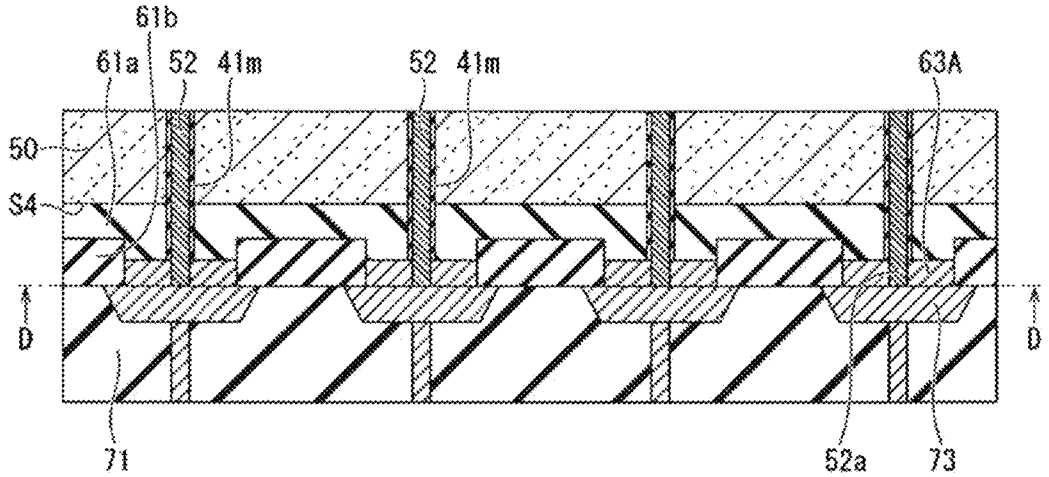
FIG. 30A is an explanatory diagram schematically depicting a longitudinal cross-sectional structure of second conductors included in the optical detection device according to the third embodiment of the present technology.
Figure 30B:
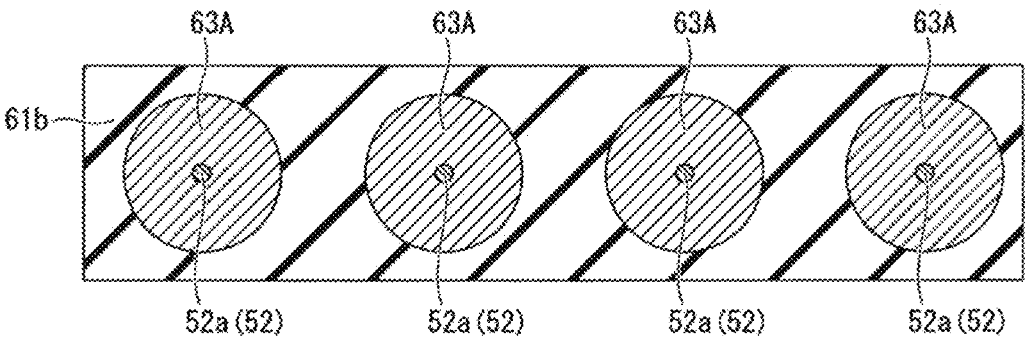
FIG. 30B is a lateral cross-sectional diagram depicting a cross-sectional structure in a cross-sectional view taken along a section line D-D in FIG. 30A.

As depicted in FIG. 30A, each of the third connection pads 63A is provided at the fourth surface S4 side end of the second conductor 52, i.e., at the end 52*a*. The bottom surface of the third connection pad 63A corresponds to a second semiconductor layer 50 side surface. The junction surface of the third connection pad 63A is a surface on the side opposite to the bottom surface, more specifically, a fourth wiring layer 70 side surface. In addition, a side surface of the third connection pad 63A corresponds to a surface connecting the bottom surface and the junction surface. Each of the third connection pads 63A is conformally provided around the second conductor 52. In other words, the third connection pad 63A is provided within a range of an equal distance around the second conductor 52. Moreover, the end 52*a* of the second conductor 52 on the fourth surface S4 side faces the junction surface of the third connection pad 63A. For example, the third connection pad 63A includes copper. However, this configuration is not required to be adopted. In addition, for example, the second conductor 52 includes tungsten. However, this configuration is not required to be adopted.

Further, the third connection pad 63A is in contact with the insulation film 61*a* and the insulation film 61*b*. More specifically, the bottom surface of the third connection pad 63A is in contact with the insulation film 61*a*. In addition, the side surface of the third connection pad 63A is in contact with the insulation film 61*b*. The insulation film 61*a* includes a material having a higher etching rate for selected etchant (selected etching condition) than a material constituting the insulation film 61*b*. For example, the following combinations are adoptable as a combination of the material constituting the insulation film 61*a* and the material constituting the insulation film 61*b*.

- insulation film 61*a*/insulation film 61*b*
- silicon oxide/silicon nitride
- silicon oxide/silicon oxynitride (SiON)
- silicon oxide having first density/silicon oxide having second density (first density<second density)
- silicon oxide/Low-K insulation film having lower permittivity than silicon oxide
- Low-K insulation film/silicon oxide Similarly, the insulation film 41*m* includes a material having a higher etching rate for selected etchant (selected etching condition) than the material constituting the insulation film 61*b*. The insulation film 41*m* may include either the same material as or a different material from the material constituting the insulation film 61*a* as long as the etching rate of the material of the insulation film 41*m* for selected etchant (selected etching condition) is higher than the etching rate of the material constituting the insulation film 61*b*.

<<Manufacturing Method of Optical Detection Device>>

A manufacturing method of the optical detection device 1 will hereinafter be described with reference to FIGS. 31A to 31E. Note that only a part associated with a manufacturing method of the third connection pads 63A will be explained here.

Figure 31A:
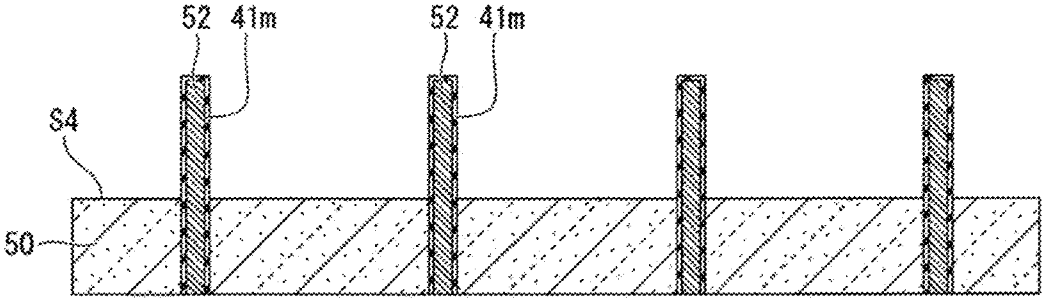
FIG. 31A is a step cross-sectional diagram depicting a manufacturing method of the second conductors according to the third embodiment of the present technology.
Figure 31B:
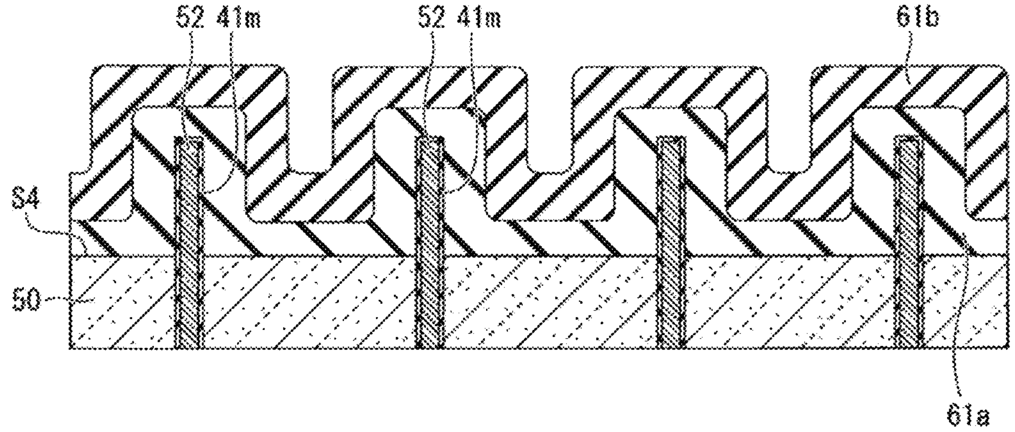
FIG. 31B is a step cross-sectional diagram continuing from FIG. 31A.
Figure 31C:
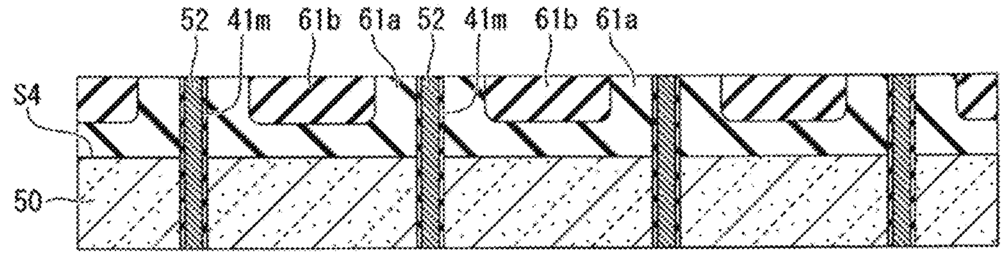
FIG. 31C is a step cross-sectional diagram continuing from FIG. 31B.

As depicted in FIG. 31A, ends of the second conductors 52 and the insulation films 41*m* are first exposed from the fourth surface S4 side of the second semiconductor layer 50. Thereafter, as depicted in FIG. 31B, the insulation film 61*a* and the insulation film 61*b* are laminated in this order on the fourth surface S4 side in such a manner as to cover the exposed ends of the second conductors 52 and the insulation films 41*m*. Note that the insulation film 61*a* is uniformly laminated on surfaces of the exposed ends of the second conductors 52 via the insulation films 41*m*. Then, as depicted in FIG. 31C, a wafer surface where the insulation film 61*a* and the insulation film 61*b* are laminated is ground by CMP and flattened. In addition, the insulation film 61*a*, the insulation film 61*b*, a material constituting the second conductors 52, and the insulation films 41*m* face the flattened exposed surface.

Figure 31D:
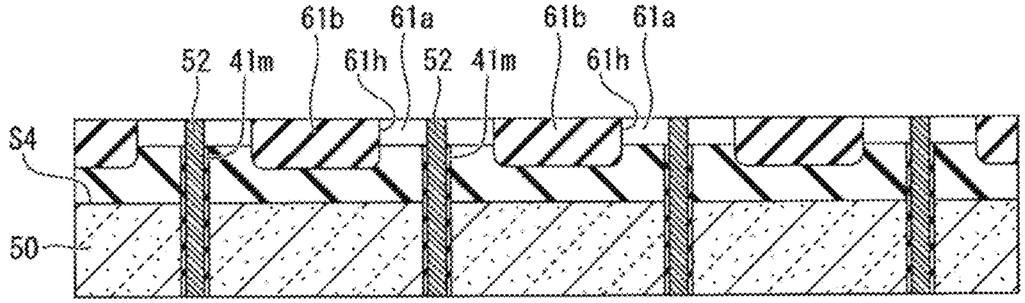
FIG. 31D is a step cross-sectional diagram continuing from FIG. 31C.

Next, the flattened exposed surface is etched using selected etchant. As a result, among the insulation film 61*a*, the insulation film 61*b*, the second conductors 52, and the insulation films 41*m*, the insulation film 61*a* and the insulation films 41*m* are selectively etched as depicted in FIG. 31D. More specifically, each of the material constituting the insulation film 61*a* and the material constituting the insulation films 41*m* has a higher etching rate for the selected etchant than the material constituting the insulation film 61*b* and the material constituting the second conductors 52, and is hence selectively etched. If any part of the insulation film 61*b* is etched, this etched part is only a small portion.

In such a manner, a hole 61*h* having an annular shape is formed around each of the second conductors 52 in the planar view. More specifically, in the state where the insulation film 61*a* is uniformly laminated on each of the surfaces of the exposed ends of the second conductors 52 via the insulation film 41*m*, a region in a range of an equal distance around each of the second conductor 52 is recessed to form the hole 61*h* having an annular shape after removal of the insulation film 61*a* laminated in such a state. According to the third embodiment, thus, the holes 61*h* each having an annular shape are formed for the second conductors 52 by self-alignment without a necessity of use of a lithography technology. Moreover, etching is stopped before the bottoms of the holes 61*h* reach the second semiconductor layer 50. In such a manner, contact between metal embedded later and the second semiconductor layer 50 can be reduced.

Figure 31E:
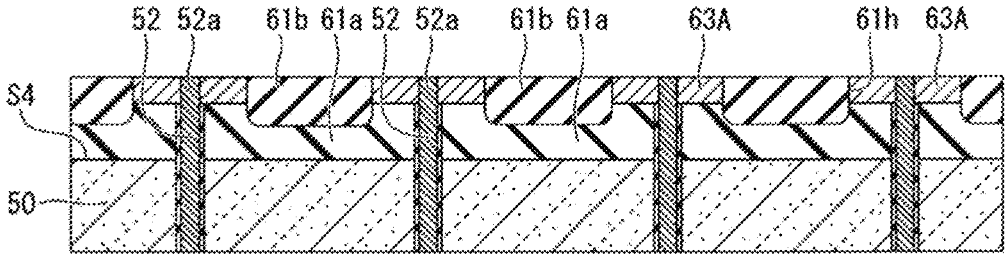
FIG. 31E is a step cross-sectional diagram continuing from FIG. 31D.

Thereafter, an unillustrated barrier metal layer is laminated in each of the holes 61*h*, and then, a metal film constituting the third connection pads 63A is deposited by plating in such a manner as to fill the holes 61*h* formed by self-alignment, as depicted in FIG. 31E. Subsequently, an unnecessary portion of the deposited metal film is removed by CMP. In such a manner, the third connection pads 63A are formed by self-alignment.

<<Main Advantageous Effects of Third Embodiment>>

Main advantageous effects of the third embodiment will hereinafter be described. Before the description of these effects, a conventional optical detection device and conventional connection pads will be touched upon.

Generally, for manufacturing an optical detection device which has three or more semiconductor layers overlapped and connected with each other, it is necessary to perform hybrid junction for one semiconductor layer a plurality of times. For example, in a case of hybrid junction between the first semiconductor layer 20, the second semiconductor layer 50, and the third semiconductor layer 80, the first semiconductor layer 20 and the second semiconductor layer 50 are first joined to each other by hybrid junction, and then the third semiconductor layer 80 is further joined by hybrid junction to the first semiconductor layer 20 and the second semiconductor layer 50 joined to each other by hybrid junction.

During hybrid junction, pressing force is applied to wafers overlapped with each other. In this case, local distortion may be caused in the wafers. In addition, some of vias such as the second conductor 52 may be positionally misaligned in the horizontal direction by the local distortion caused in the wafers. When some of the vias are positionally misaligned as described above, overlap accuracy between the positionally misaligned via and a connection pad to be formed in the subsequent step may be deteriorated. Note here that holes into which the connection pads are embedded are typically formed by a lithography technology or an etching technology. However, in a case where the via itself is positionally misaligned, it may be difficult to follow the positionally misaligned via even if alignment is appropriately achieved in a lithography step. Accordingly, overlap accuracy between some of the vias and the connection pads may be deteriorated. In addition, larger sizes of the connection pads may be required in consideration of a margin of the overlap accuracy between the vias and the connection pads.

Moreover, if the size of each of the connection pads is determined in consideration of the overlap accuracy between the vias and the connection pad as described above, the connection pad having a large size may come into contact with a connection pad which is included in connection pads in a subsequent wafer and with which the relevant connection pad is not originally intended to be in contact. In addition, tolerance of the overlap accuracy between the vias and the connection pads is also lowered by reduction of a pixel size.

Meanwhile, according to the optical detection device 1 of the third embodiment of the present technology, the insulation film 61*a* and the insulation film 61*b* are laminated in this order around the end of each of the second conductors 52 exposed through the semiconductor layer, and the hole 61*h* having an annular shape is formed around each of the second conductors 52 in the planar view with use of etching rates of the material constituting the insulation film 61*a* and the material constituting the insulation film 61*b* for selected etchant. Thereafter, the third connection pad 63A is formed by embedding the material constituting the third connection pad 63A into each of the holes 61*h*. Accordingly, the third connection pads 63A can be formed without use of a lithography technology.

Moreover, the holes 61*h* are formed around the second conductors 52 by self-alignment. Accordingly, even in a case where the second conductor 52 is positionally misaligned due to local distortion caused in the wafer, the hole 61*h* having an annular shape can be formed around the positionally misaligned second conductor 52. In this case, deterioration of the overlap accuracy between the second conductor 52 and the third connection pad 63A can be reduced within a wafer surface. Accordingly, even in a case where the second conductor 52 is positionally misaligned, the third connection pad 63A can be formed in line with this positional misalignment.

Further, according to the optical detection device 1 of the third embodiment of the present technology, each of the third connection pads 63A can be formed by self-alignment within a range of an equal distance around the second conductor 52. Accordingly, the necessity of designing a large size of the third connection pads 63A for securely achieving overlapping between the third connection pads 63A and the second conductors 52 can be reduced. In addition, this configuration can reduce a size increase in the third connection pads 63A, and thus can reduce contact between each of the third connection pads 63A and the connection pad included in the fourth connection pads 73 and not originally intended to come into contact with the third connection pad 63A during hybrid junction between the second semiconductor layer 50 side and the third semiconductor layer 80 side.

While the side surface of each of the third connection pads 63A depicted in FIG. 29 has a forward tapered shape, this shape may be an inverse tapered shape.

<<Modifications of Third Embodiment>>

Hereinafter described will be modifications of the third embodiment.

<Modification 1>

Figure 32A:
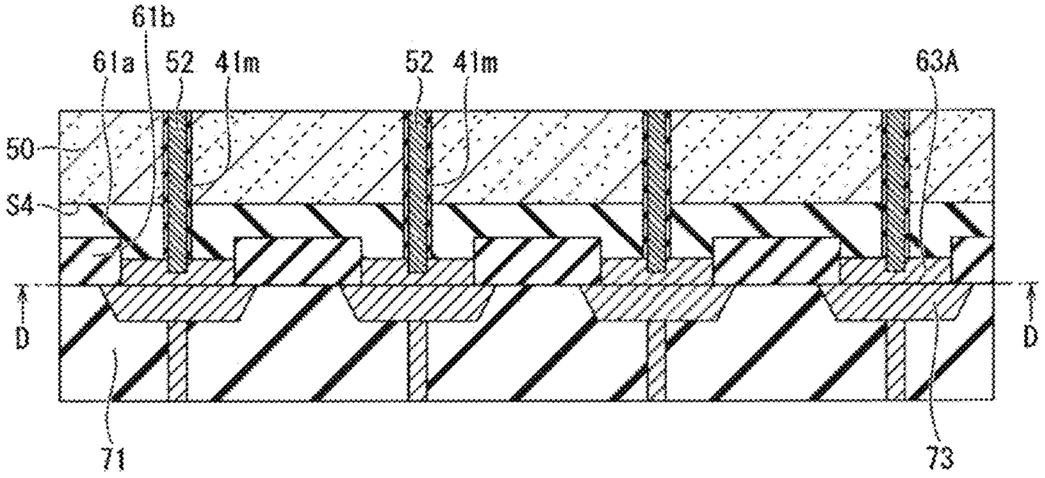
FIG. 32A is an explanatory diagram schematically depicting a longitudinal cross-sectional structure of second conductors included in an optical detection device according to modification 1 of the third embodiment of the present technology.
Figure 32B:
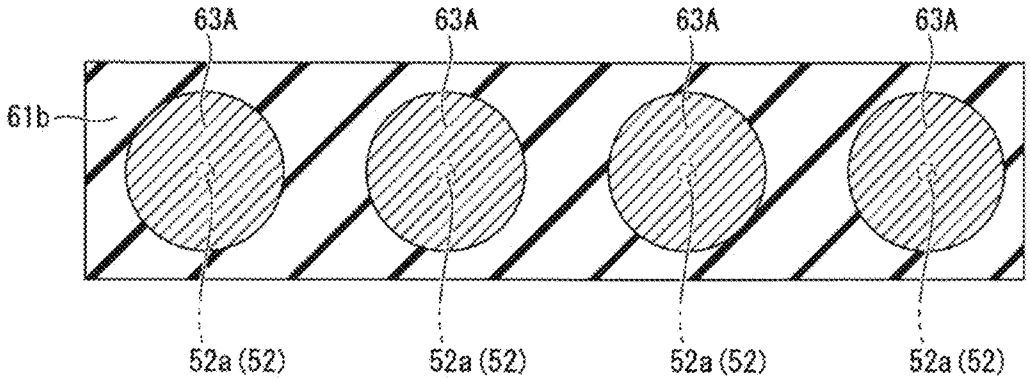
FIG. 32B is a lateral cross-sectional diagram depicting a cross-sectional structure in a cross-sectional view taken along a section line D-D in FIG. 32A.

While the end 52$a$ of each of the second conductors 52 faces the junction surface which is the fourth wiring layer 70 side surface of the third connection pad 63A in the optical detection device 1 according to the third embodiment, the present technology is not limited to this example. According to modification 1 of the third embodiment, the end 52$a$ of each of the second conductors 52 is located within the third connection pad 63A and does not face the junction surface as depicted in FIGS. 32A and 32B.

Figure 33A:
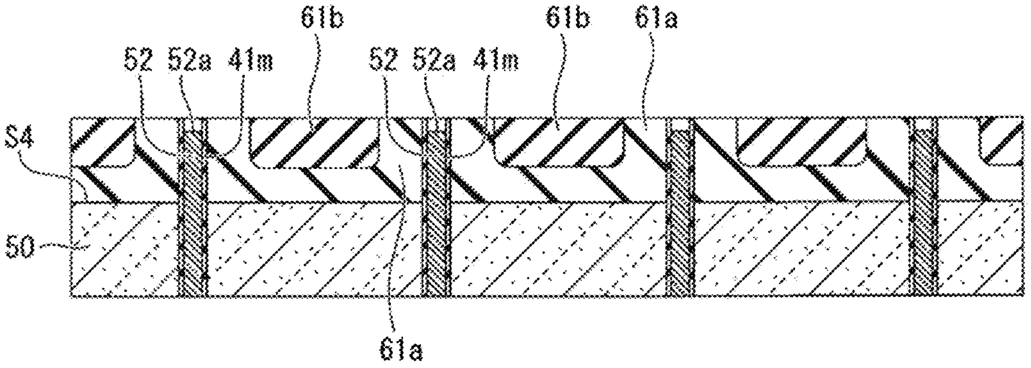
FIG. 33A is a step cross-sectional diagram depicting a manufacturing method of second conductors according to modification 1 of the third embodiment of the present technology.
Figure 33B:
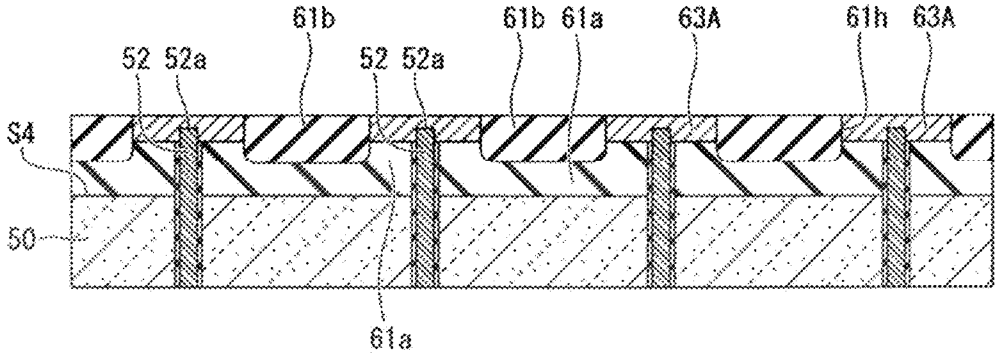
FIG. 33B is a step cross-sectional diagram continuing from FIG. 33A.

A manufacturing method of the optical detection device 1 according to modification 1 of the third embodiment will hereinafter be described with reference to FIGS. 33A and 33B. Note that only a part different from the steps described above in the third embodiment will be described here.

First, an exposed surface of a wafer is flattened by CMP as depicted in FIG. 31C associated with the third embodiment. Thereafter, only the second conductors 52 are etched back as depicted in FIG. 33A. More specifically, the exposed portions of the second conductors 52 are etched, and the ends 52$a$ of the second conductors 52 are recessed from the flattened surface.

Thereafter, a step similar to the step depicted in FIG. 31D is performed to form the holes 61$h$. Then, an unillustrated barrier metal layer is laminated within each of the holes 61$h$, and a metal film constituting the third connection pad 63A is deposited by plating in such a manner as to fill the holes 61$h$ formed by self-alignment, as depicted in FIG. 33B. Thereafter, an unnecessary portion of the deposited metal film is removed by CMP. In such a manner, the third connection pads 63A are formed by self-alignment.

Advantageous effects similar to those of the optical detection device 1 of the third embodiment described above can be offered by the optical detection device 1 according to modification 1 of the third embodiment described here.

<Modification 2>

While the optical detection device 1 is manufactured by a WoW (Wafer on Wafer) method in the third embodiment, the present technology is not limited to this example. For example, a semiconductor device 1A such as the optical detection device 1 may be manufactured by a CoW (Chip on Wafer) method or a CoC (Chip on Chip) method. The semiconductor device 1A manufactured by the CoW (Chip on Wafer) method will be described in modification 2 of the third embodiment.

(Semiconductor Device)

Figure 34:
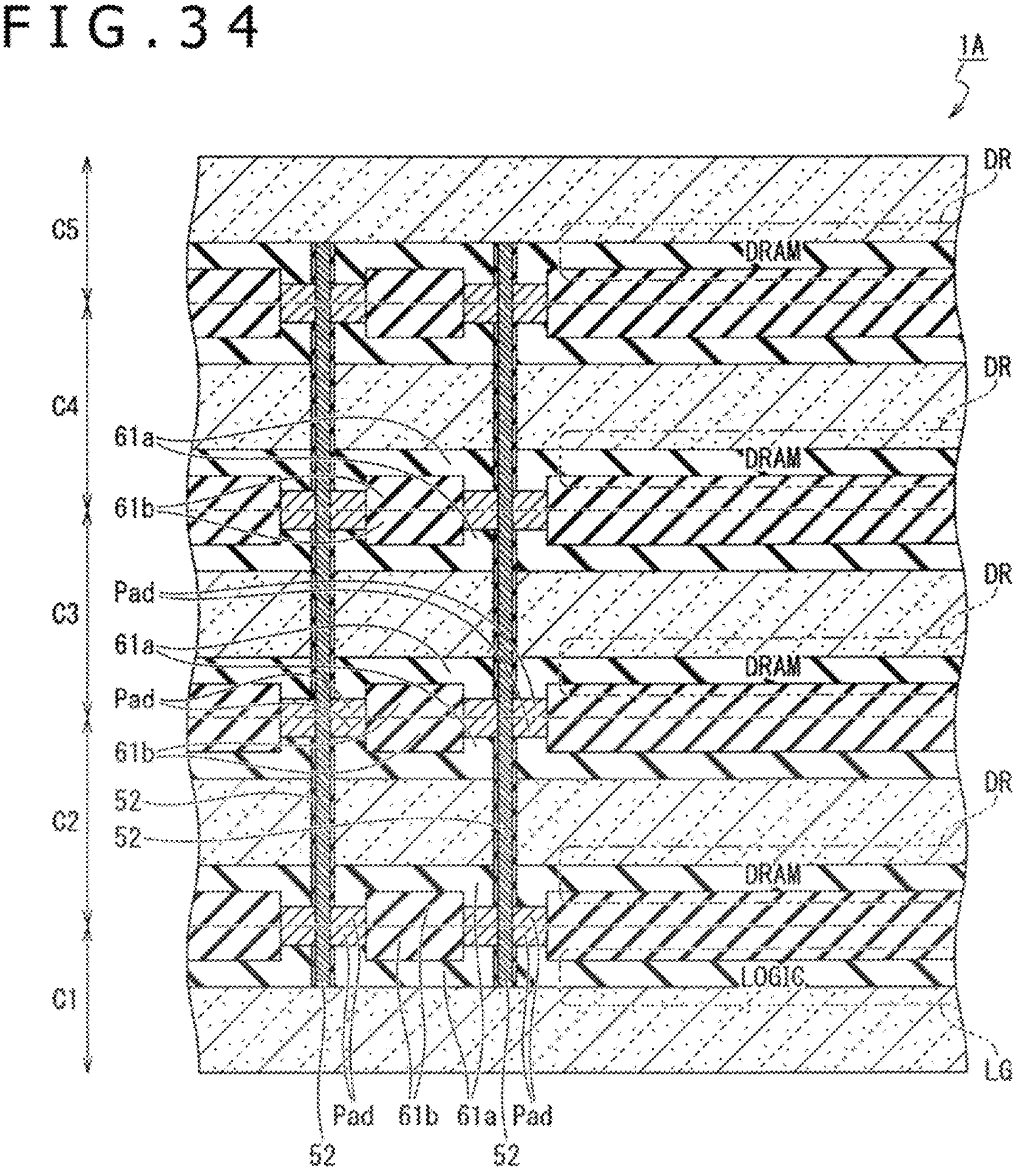
FIG. 34 is a longitudinal cross-sectional diagram depicting a main part of a semiconductor device according to modification 2 of the third embodiment of the present technology.

The semiconductor device 1A is a high bandwidth memory (HBM, High Bandwidth Memory). The semiconductor device 1A has a laminated structure where a plurality of layers of chips are laminated. For example, as depicted in FIG. 34, the semiconductor device 1A has a laminated structure where five layers of chips including a chip C1 to a chip C5 are laminated. Each of the chips ranging from the chip C2 to the chip C5 has a cell region DR, which is a region where memory cells of a DRAM (Dynamic Random Access Memory) are formed, and unillustrated word lines and bit lines. Moreover, the chip C1 has a logic region LG which is a region containing a driving logic circuit for driving the memory cells of the respective chips ranging from the chip C2 to the chip C5.

Each of the chips ranging from the chip C1 to the chip C5 includes a semiconductor layer, the insulation films 61$a$, and the insulation films 61$b$. Moreover, each of the chips C1 and C5 has the second conductors 52 and connection pads Pad each provided at one end of the corresponding second conductor 52. Further, each of the chips C2 to C4 has the second conductors 52 and the connection pads Pad provided at both ends of the second conductors 52. Each of the connection pads Pad has a configuration similar to that of the third connection pads 63A described above, and is formed by a method similar to the method for forming the third connection pads 63A. The respective connection pads Pad overlapped with each other are connected to each other. This configuration achieves connection between the second conductors 52 of the chip C1 to the chip C5 in one line in a lamination direction of the chips.

The second conductors 52 connected to each other in one line achieve connection between the word lines of the respective chips, or between the bit lines of the respective chips. In addition, the second conductors 52 connected in one line are connected to the driving logic circuit provided in the logic region LG of the chip C1. The driving logic circuit drives the memory cells of the respective chips ranging from the chip C2 to the chip C5 via the second conductors 52 connected in one line.

Advantageous effects similar to those of the optical detection device 1 of the third embodiment described above can be offered by the semiconductor device 1A according to modification 2 of the third embodiment described here.

Moreover, in a case of manufacturing the semiconductor device 1A with use of a lithography technology, junction between the respective chips, formation of a resist pattern by lithography, etching, and formation of the connection pads Pad need to be repeatedly performed. This necessity complicates manufacturing steps. According to modification 2 of the third embodiment, however, formation of the connection pads Pad is achieved without use of a lithography technology. This method can therefore decrease the number of steps, and reduce complication of the manufacturing steps.

Fourth Embodiment

Figure 35:
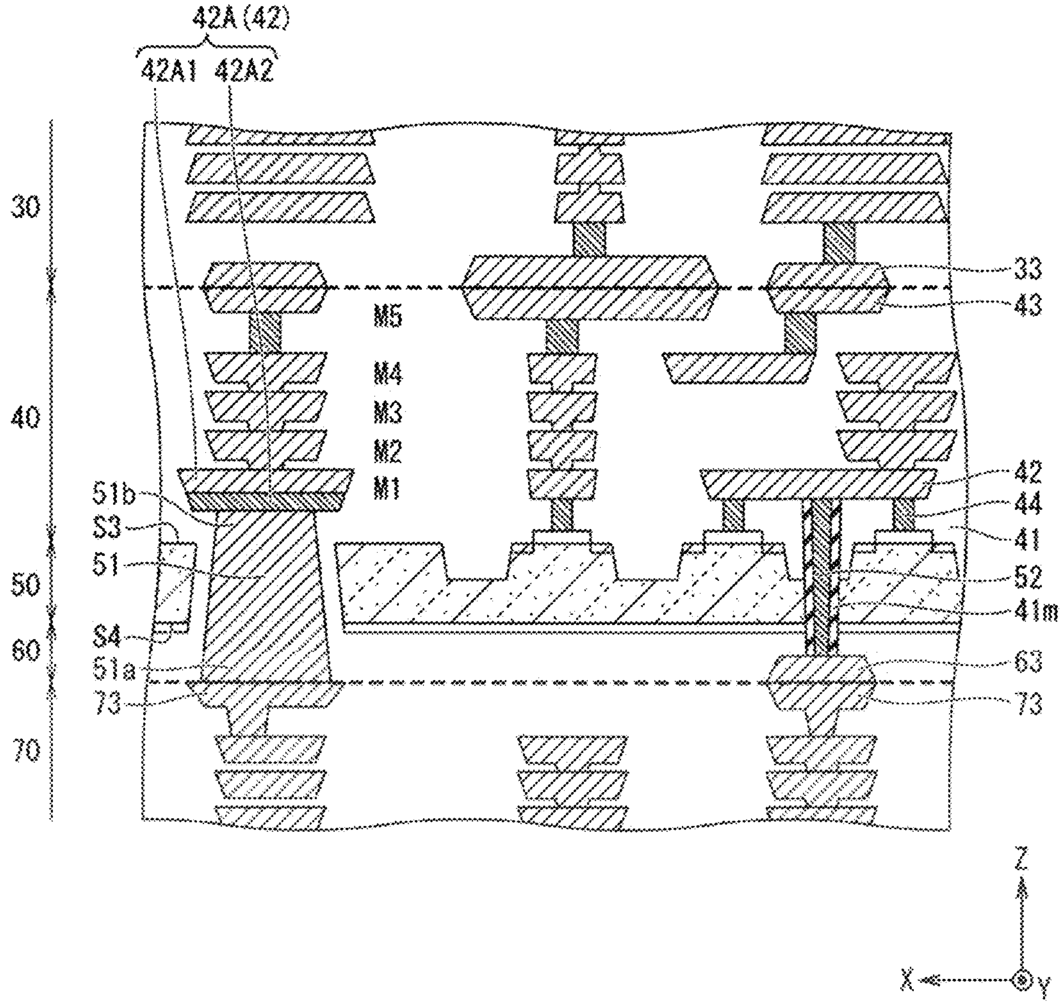
FIG. 35 is a longitudinal cross-sectional diagram depicting a main part of an optical detection device according to a fourth embodiment of the present technology.

Hereinafter described will be the fourth embodiment of the present technology depicted in FIG. 35. The optical detection device 1 according to the present fourth embodiment is different from the optical detection device 1 according to the first embodiment described above in that the end 51$b$ of the first conductor 51 is connected to a wire 42A. Other configurations of the optical detection device 1 are basically similar to the corresponding configurations of the optical detection device 1 according to the first embodiment described above. Note that the constituent elements already described will be given the same reference signs, and will not be repeatedly explained.

<<Configuration of Optical Detection Device>>

The configuration of the optical detection device 1 according to the fourth embodiment of the present technology will hereinafter be described while focus is placed on a part different from the configuration of the optical detection device 1 according to the first embodiment associated with the present fourth embodiment are different from scales of the same constituent elements in the other figures describing the fourth embodiment. Moreover, the barrier metal layer is not depicted in the figures explaining the present fourth embodiment.

<Second Wiring Layer>

The wires 42 included in the second wiring layer 40 are provided in the insulation film 41. The wire 42 that is among the wires 42 of the second wiring layer 40 and corresponds to the wire 42 to which the end 51*b*, which is the third surface S3 side end of the first conductor 51, is connected will also be referred to as the wire 42A for distinction from the other wires 42. The wire 42A is a pad to which the first conductor 51 is connected, and corresponds to one wire. The first conductor 51 penetrates the second semiconductor layer 50. The end 51*b*, which is the third surface S3 side end of the first conductor 51, extends to the wire 42A included in the second wiring layer 40, and connects to the wire 42A. For example, the end 51*a*, which is the fourth surface S4 side end of the first conductor 51, extends to the fourth connection pad 73 included in the fourth wiring layer 70, and connects to the fourth connection pad 73, as depicted in FIG. 35. However, this configuration is not required to be adopted.

The wire 42A has a laminated structure which includes a first layer 42A1 including a first conductive material and a second layer 42A2 including a second conductive material not containing the first conductive material and being located between the first layer 42A1 and the third surface S3 side end 51*b* of the first conductor 51. More specifically, the end 51*b* is connected to the second layer 42A2, while the second layer 42A2 is connected to the first layer 42A1. Accordingly, the end 51*b* and the first layer 42A1 are not directly connected, and are connected via the second layer 42A2. For example, the first conductive material constituting the first layer 42A1 is a material containing copper, but is not limited to this example. Described in the present embodiment will be an example where the first layer 42A1 includes copper. Moreover, the second conductive material constituting the second layer 42A2 is a material not containing the first conductive material, more specifically, a material not containing copper. The second conductive material adopted to constitute the second layer 42A2 is a material less likely to affect operations of transistors even if the second conductive material diffuses within the semiconductor layer. It is preferable to adopt, as the second conductive material of this type, such materials conventionally employed near a semiconductor layer. Examples adoptable as the second conductive material constituting the second layer 42A2 include tungsten, ruthenium, titanium, tantalum, tantalum nitride, aluminum, cobalt, and silicon. Described in the present embodiment will be an example where the second layer 42A2 includes tungsten.

For example, the second conductor 52 is configured such that the third surface S3 side end is connected to the wire 42 and that the fourth surface S4 side end is connected to the third connection pad 63. However, this configuration is not required to be adopted.

<<Manufacturing Method of Optical Detection Device>>

A manufacturing method of the optical detection device 1 will hereinafter be described with reference to FIGS. 36A to 36F. Only a part associated with a manufacturing method of the first conductor 51 and the wire 42A will be explained here. In addition, in the figures referred to hereinafter, the first conductor 51 and the second conductor 52 are disposed side by side for easy understanding of the description of the manufacturing method of the first conductor 51 and the wire 42A. In addition, according to the present fourth embodiment, the insulation film provided between the first conductor 51 and the second semiconductor layer 50, the insulation film provided between the second conductor 52 and the second semiconductor layer 50, and methods for forming these insulation films are not depicted in some figures of FIG. 36A and the following figures.

Figure 36A:
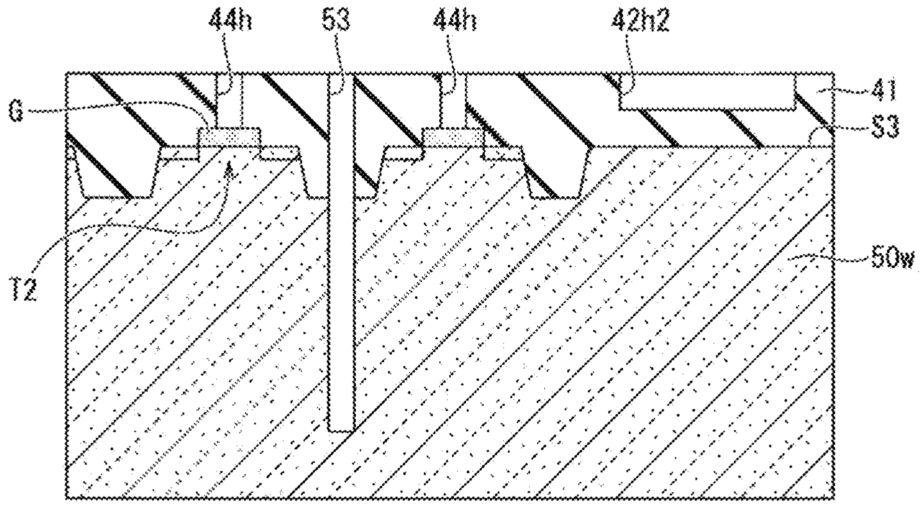
FIG. 36A is a step cross-sectional diagram depicting a manufacturing method of the optical detection device according to the fourth embodiment of the present technology.

First, as depicted in FIG. 36A, elements such as the transistors T2 are formed on the third surface S3 side of the second semiconductor layer 50*w*, and the insulation film 41 is deposited on the third surface S3 side. Thereafter, holes 44*h*, the hole 53, and a hole 42*h*2 are formed from an exposed surface of the insulation film 41 by a known lithography technology and a known etching technology. For example, each of the holes 44*h* is a hole for forming the via 44 connected to the gate electrode G of the transistor T2, but is not limited to this example. The hole 53 is a hole for forming the second conductor 52. The hole 42*h*2 is a hole for forming the second layer 42A2 of the wire 42A. The holes 44*h*, the hole 53, and the hole 42*h*2 have different depths in the thickness direction of the second semiconductor layer 50. In these three types of holes, the hole 53 has the largest depth, each of the holes 44*h* has the largest depth next to the hole 53, and the hole 42*h*2 has the smallest depth.

Figure 36B:
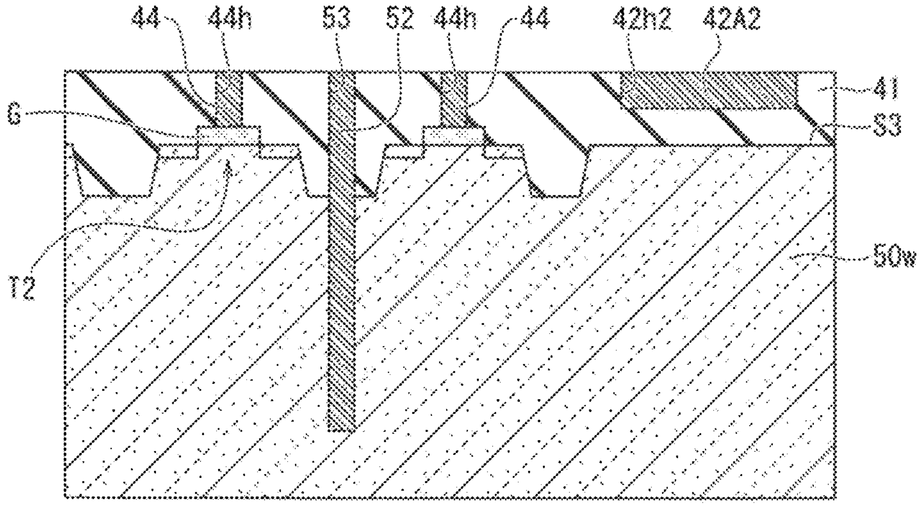
FIG. 36B is a step cross-sectional diagram continuing from FIG. 36A.

Subsequently, as depicted in FIG. 36B, a tungsten film is laminated on the exposed surface of the insulation film 41 in such a manner as to fill interiors of the holes 44*h*, the hole 53, and the hole 42*h*2. Thereafter, an unnecessary portion of the tungsten film is removed by CMP. In such a manner, the vias 44, the second conductor 52, and the second layer 42A2 each including tungsten are produced. The second layer 42A2 thus formed is configured to have a thickness sufficient for preventing penetration by etching during dry etching of the hole 51*h* and for exhibiting the lowest possible resistance. Moreover, a size relation between the vias 44, the second conductor 52, and the second layer 42A2 in the thickness direction of the second semiconductor layer 50 is similar to the depth relation between the holes 44*h*, the hole 53, and the hole 42*h*2.

Figure 36C:
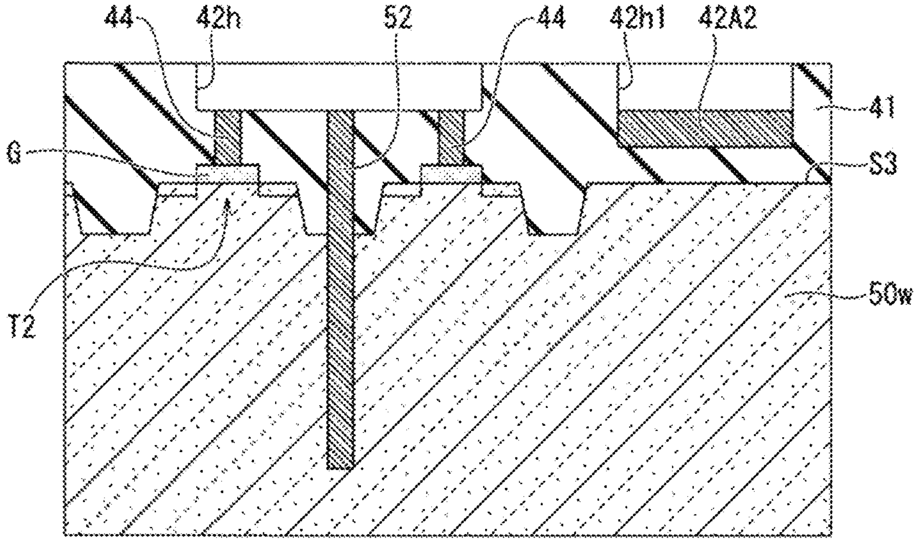
FIG. 36C is a step cross-sectional diagram continuing from FIG. 36B.

Next, as depicted in FIG. 36C, the insulation film 41 is further laminated, and holes for forming the wires 42 are formed in the laminated insulation film 41 by a known lithography technology and a known etching technology. More specifically, a hole 42*h* and a hole 42*h*1 are formed. The hole 42*h*1 is a hole for forming the first layer 42A1, while the hole 42*h* is a hole for forming the wires 42 other than the wire 42A.

Figure 36D:
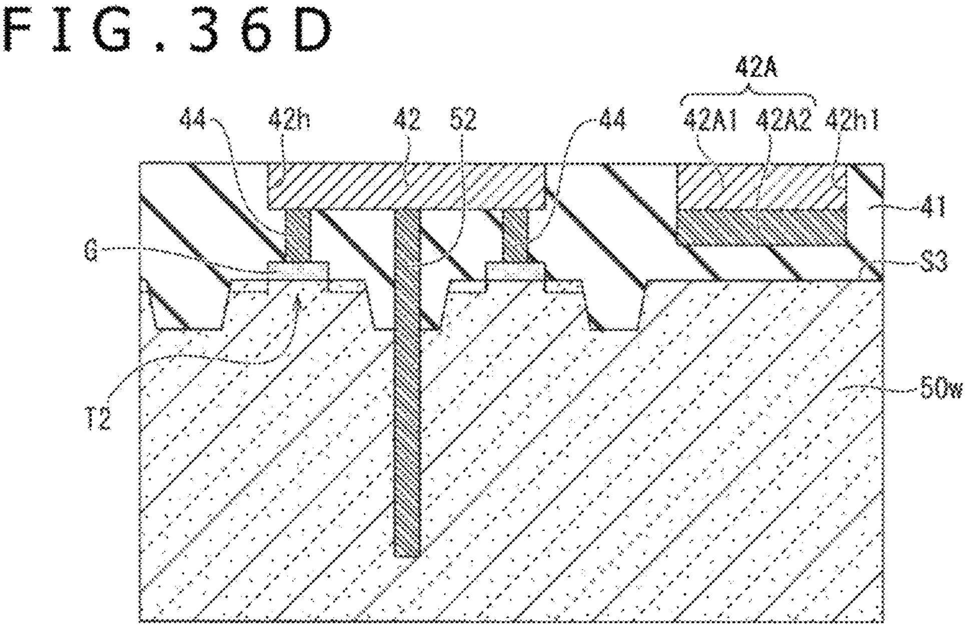
FIG. 36D is a step cross-sectional diagram continuing from FIG. 36C.

Then, as depicted in FIG. 36D, copper is laminated by plating on an exposed surface of the insulation film 41 in such a manner as to fill interiors of the holes 42*h* and 42*h*1. Thereafter, an unnecessary portion of the copper is removed by CMP. In such a manner, the wires 42 and the first layer 42A1 both including copper are produced. In addition, the wire 42A including the first layer 42A1 and the second layer 42A2 is thus produced.

Subsequently, the several steps already explained in the first embodiment are performed. The second wiring layer 40 is completed on the third surface S3 side. The second semiconductor layer 50*w* side and the first semiconductor layer 20 side are joined to each other by F2F. The second semiconductor layer 50*w* is ground from the surface on the side opposite to the third surface S3 to reduce the thickness of the second semiconductor layer 50*w* and expose the second conductor 52. The insulation film 61 is laminated on the fourth surface S4 of the second semiconductor layer 50. These steps are already explained in detail in the first embodiment, and hence are not repeatedly depicted nor explained in detail.

Figure 36E:
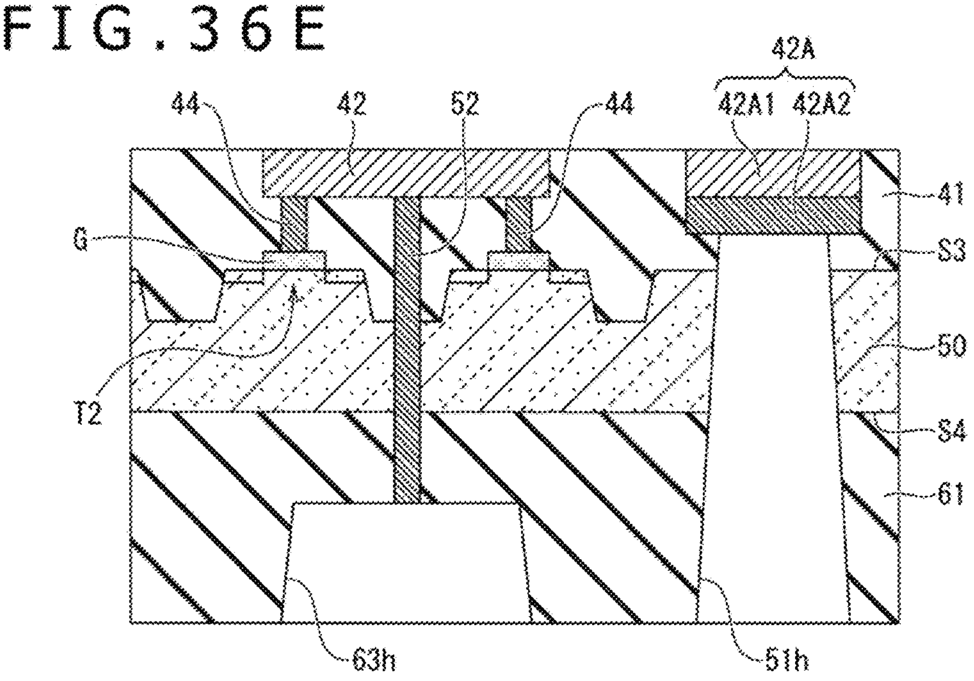
FIG. 36E is a step cross-sectional diagram continuing from FIG. 36D.

Next, as depicted in FIG. 36E, a hole 63*h* and a hole 51*h* are formed from the insulation film 61 side by a known lithography technology and a known etching technology. The hole 63*h* is a hole for forming the third connection pad 63 connected to the second conductor 52. In addition, the hole 51*h* is a hole for forming the first conductor 51. More specifically, the hole 51*h* is a hole in which a material constituting the first conductor 51 (e.g., copper) is embedded. For forming the hole 51*h*, the insulation film 61 is first etched. Subsequently, the second semiconductor layer 50 is etched, and then the insulation film 41 is etched. Thereafter, the hole 51*h* reaches the second layer 42A2 as a result of etching for forming the hole 51*h*. Moreover, it is preferable to perform the etching for forming the hole 51*h* until the hole 51*h* located at a different position in the wafer surface reaches the second layer 42A2. Further, a difference in etching progress may occur between the respective holes 51*h* depending on the positions of the holes 51*h* in the wafer surface. Accordingly, over-etching is carried in some cases to reduce defective opening of the holes 51*h* produced locally in the wafer surface. The second layer 42A2 therefore has a thickness sufficient for avoiding exposure of the first layer 42A1 even at the time of over-etching.

Figure 36F:
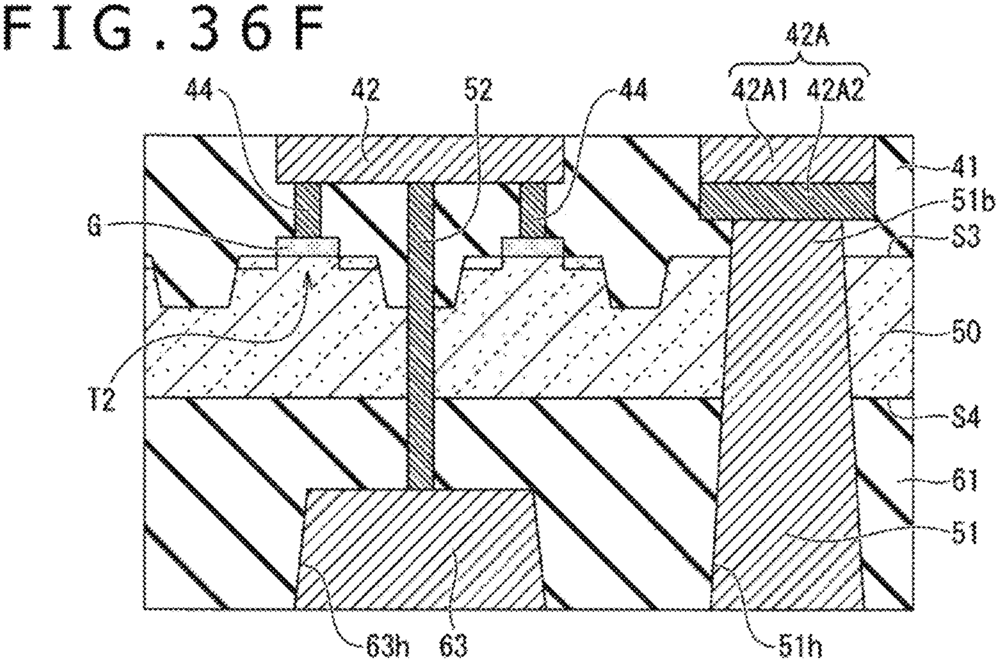
FIG. 36F is a step cross-sectional diagram continuing from FIG. 36E.

Subsequently, as depicted in FIG. 36F, copper is laminated by plating on the insulation film 61 side exposed surface in such a manner as to fill interiors of the holes 63*h* and 51*h*. Thereafter, an unnecessary portion of the copper is removed by CMP. In such a manner, the third connection pad 63 and the first conductor 51 both including copper are produced.

<<Main Advantageous Effects of Fourth Embodiment>>

Main advantageous effects of the fourth embodiment will hereinafter be described. Before the description of these effects, a conventional technology will be touched upon. A possibility of exposure of copper constituting the wire 42 during formation of the hole 51*h* has been a conventional problem. There is further a possibility that the exposed copper scatters when plasma of etching collides with the copper. Particularly in a case of an optical detection device including laminated pixel transistors and having a triple structure of semiconductor layers, each distance between the transistors T2 and through electrodes such as the first conductors 51 is short. In this case, scattered copper may enter the inside of the semiconductor layers, and affect the characteristics of the transistors T2.

Moreover, etching sufficient for penetrating the second semiconductor layer 50 having a thickness in microns is required at the time of formation of the hole 51*h*. In a case of formation of the hole 51*h* that penetrates the thick semiconductor layer as described above, a difference in etching progress occurs between a central part and an edge part of a wafer. Accordingly, for reducing defective opening of the hole 51*h* produced locally in the wafer surface, etching needs to continue until the hole 51*h* reaches the wire 42 at a portion of relatively slow etching progress in the wafer surface, i.e., over-etching is required.

However, when over-etching is executed, copper constituting the wire 42 is exposed at a portion corresponding to relatively high-speed etching progress in the wafer surface. In this case, plasma of etching may collide with the exposed copper and diffuse the copper.

For overcoming this problem, barrier metal is typically provided between the wire 42 and the insulation film 41. However, in comparison with the second semiconductor layer 50 having a thickness in microns, the barrier metal has a thickness in nanometers, and hence may not have a thickness sufficient for absorbing etching variations of the second semiconductor layer 50. Accordingly, the barrier metal may be etched and removed at a portion corresponding to relatively high-speed etching progress in the wafer surface during over-etching. In this case, copper constituting the wire 42 may be exposed. In addition, collision between plasma of etching and the exposed copper may diffuse the copper.

Meanwhile, according to the optical detection device 1 of the fourth embodiment of the present technology, the one wire 42A has a laminated structure including the first layer 42A1 including copper and the second layer 42A2 including the second conductive material not containing copper and being located between the first layer 42A1 and the one end 51*b* of the first conductor 51. In this case, the second layer 42A2 includes the second conductive material not containing copper is exposed when the hole 51*h* reaches the wire 42A. Accordingly, scattering of copper can be reduced.

Moreover, according to the optical detection device 1 of the fourth embodiment of the present technology, plasma of etching collides with the second layer 42A2 including the second conductive material not containing copper, even in a case where over-etching is executed at a portion corresponding to relatively high-speed etching progress in the wafer surface. Accordingly, scattering of copper can be reduced. As described above, scattering of copper can be reduced even in a case where a difference in etching progress for the hole 51*h* occurs between respective positions in the wafer surface.

Further, according to the optical detection device 1 of the fourth embodiment of the present technology, the second conductive material adopted to constitute the second layer 42A2 is a material less likely to affect operations of transistors even if the second conductive material diffuses within the semiconductor layer such as the second semiconductor layer 50. Accordingly, even if the second conductive material constituting the second layer 42A2 diffuses within the semiconductor layer such as the second semiconductor layer 50 as a result of collision between plasma of etching and the second conductive material constituting the second layer 42A2, influence on the operations of the transistors can be reduced.

In addition, according to the optical detection device 1 of the fourth embodiment of the present technology, the second layer 42A2 includes the same material as the material constituting the via 44 and the second conductor 52, more specifically, includes tungsten, for example. In this case, the second layer 42A2, the via 44, and the second conductor 52 can be formed by performing film formation of tungsten and subsequent CMP once for each. Accordingly, an increase in the number of manufacturing steps can be reduced.

Besides, according to the optical detection device 1 of the fourth embodiment of the present technology, the second layer 42A2 has such a thickness that has the lowest possible resistance and is sufficient for remaining at the bottom of the hole 51*h* after an end of etching of the hole 51*h* in the step for forming the second layer 42A2 depicted in FIG. 36B. Accordingly, reduction of an increase in resistance of the wire 42A and reduction of exposure of the first layer 42A1 are both achievable.

<<Modifications of Fourth Embodiment>>

Hereinafter described will be modifications of the fourth embodiment.

<Modification 1>

Figure 37:
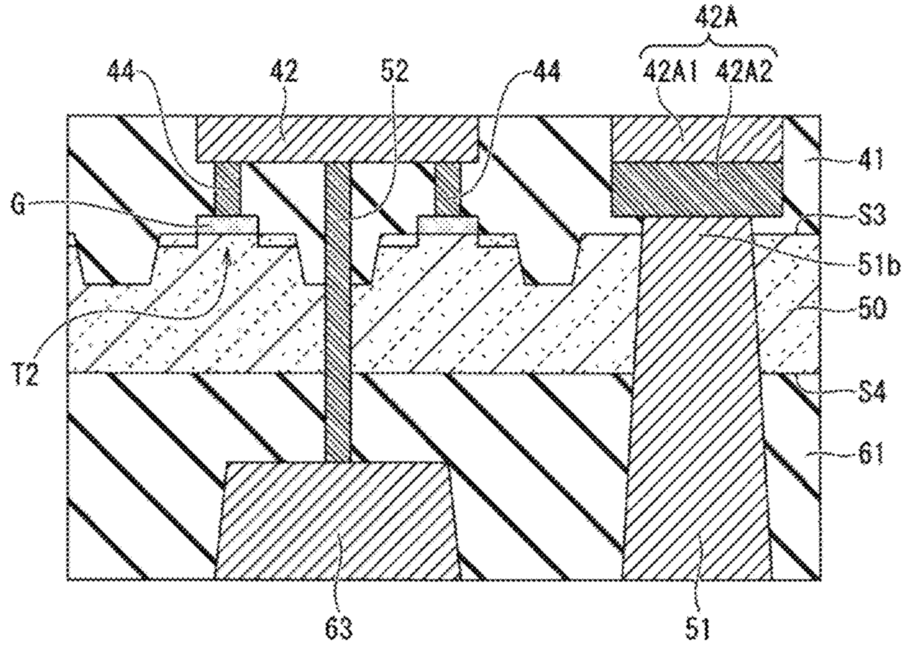
FIG. 37 is a longitudinal cross-sectional diagram depicting a main part of an optical detection device according to modification 1 of the fourth embodiment of the present technology.

According to the optical detection device 1 in the fourth embodiment, the size of the second layer 42A2 in the thickness direction of the second semiconductor layer 50 is smaller than the size of the via 44 in the thickness direction of the second semiconductor layer 50. However, the present technology is not limited to this example. According to modification 1 of the fourth embodiment, the size of the second layer 42A2 in the thickness direction of the second semiconductor layer 50 is the same as the size of the via 44 in the thickness direction of the second semiconductor layer 50 as depicted in FIG. 37. For equalizing the sizes of the via 44 and the second layer 42A2 in the thickness direction, it is only required to equalize the depths of the hole 44*h* and the hole 42*h*2 in the step in the fourth embodiment depicted in FIG. 36A. Note that the second layer 42A2 and the third surface S3 of the second semiconductor layer 50 are separated from each other by a distance corresponding to the thickness of the gate electrode G.

Advantageous effects similar to those of the optical detection device 1 of the fourth embodiment described above can be offered by the optical detection device 1 according to modification 1 of the fourth embodiment described here.

Moreover, according to the optical detection device 1 in modification 1 of the fourth embodiment, for equalizing the sizes of the via 44 and the second layer 42A2 in the thickness direction, the sizes of the hole 44*h* and the hole 42*h* are equalized in the step of the fourth embodiment depicted in FIG. 36A. In this case, the hole 44*h* and the hole 42*h* can be simultaneously formed by a photolithography step and an etching step once for each. Accordingly, an increase in the number of steps can be reduced.

Furthermore, according to the optical detection device 1 in modification 1 of the fourth embodiment, the size of the second layer 42A2 in the thickness direction is larger than that size in the fourth embodiment. Accordingly, exposure of the first layer 42A1 during formation of the hole 51*h* can be further reduced.

<Modification 2>

Figure 38:
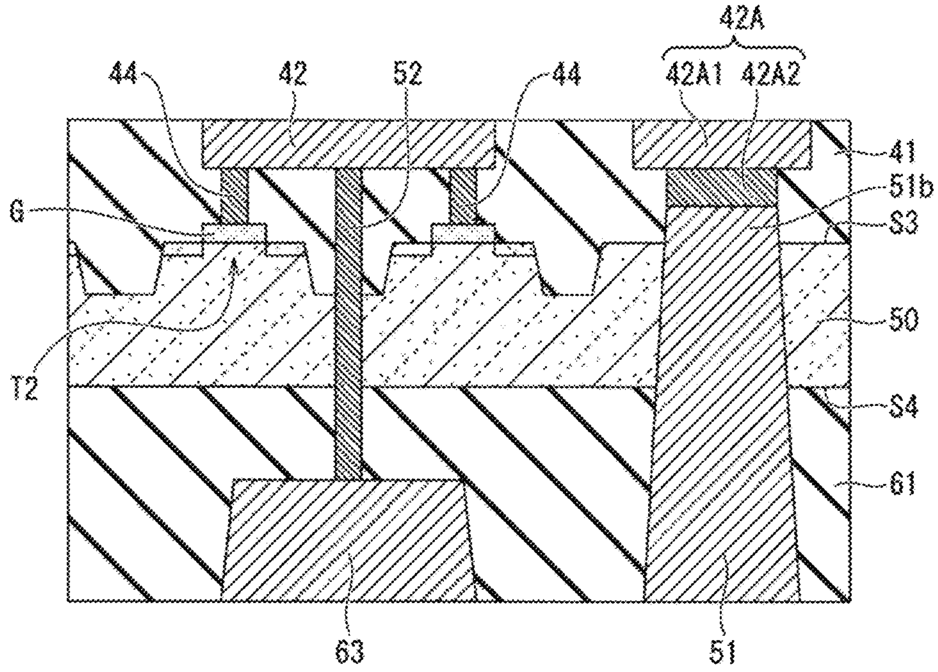
FIG. 38 is a longitudinal cross-sectional diagram depicting a main part of an optical detection device according to modification 2 of the fourth embodiment of the present technology.

According to the optical detection device 1 in the fourth embodiment, the size of the second layer 42A2 in a width direction (a direction perpendicular to the Z-direction) is the same as the size of the first layer 42A1 in the width direction. However, the present technology is not limited to this example. According to modification 2 of the fourth embodiment, as depicted in FIG. 38, the widthwise size of the second layer 42A2 may be smaller than the widthwise size of the first layer 42A1 as long as the widthwise size of the second layer 42A2 is equal to or larger than the widthwise size (horizontal size) of the end 51*b* of the first conductor 51.

Advantageous effects similar to those of the optical detection device 1 of the fourth embodiment described above can be offered by the optical detection device 1 according to modification 2 of the fourth embodiment described here.

<Modification 3>

Figure 39:
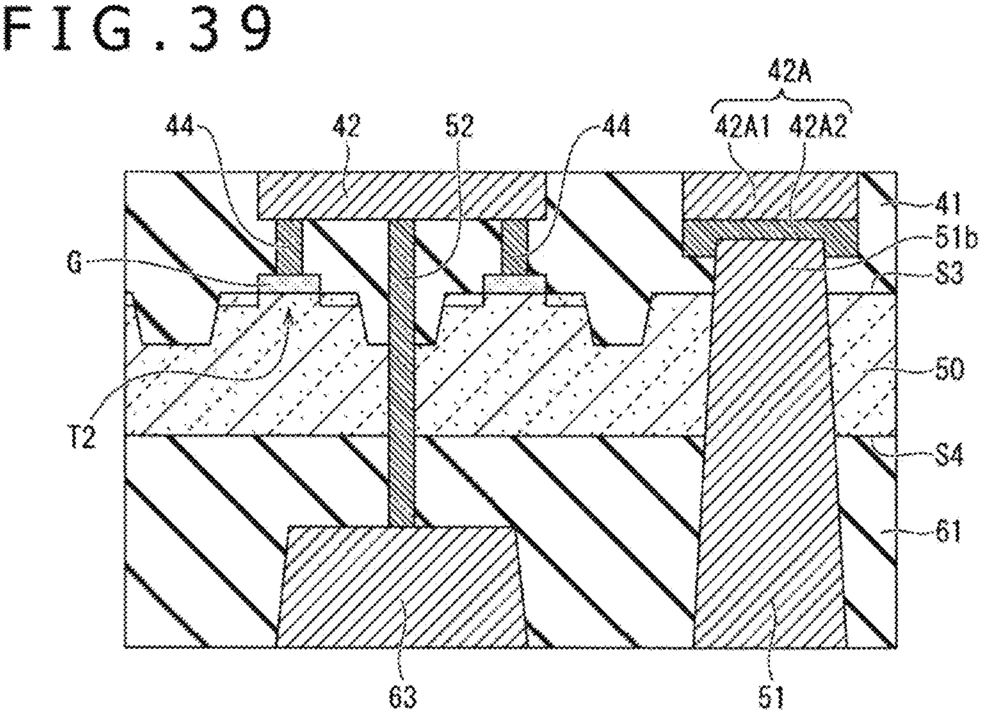
FIG. 39 is a longitudinal cross-sectional diagram depicting a main part of an optical detection device according to modification 3 of the fourth embodiment of the present technology.

According to the optical detection device 1 in modification 3 of the fourth embodiment, the first conductor 51 side surface of the second layer 42A2 is recessed toward the first layer 42A1 side as depicted in FIG. 39. This shape is produced by over-etching executed during formation of the hole 51*h* in which the first conductor 51 is embedded. A part of the second layer 42A2 is over-etched to open the hole 51*h* at a different position in the wafer surface. It is preferable that the second layer 42A2 be thick enough not to be penetrated even by over-etching.

Advantageous effects similar to those of the optical detection device 1 of the fourth embodiment described above can be offered by the optical detection device 1 according to modification 3 of the fourth embodiment described here.

<Modification 4>

Figure 40:
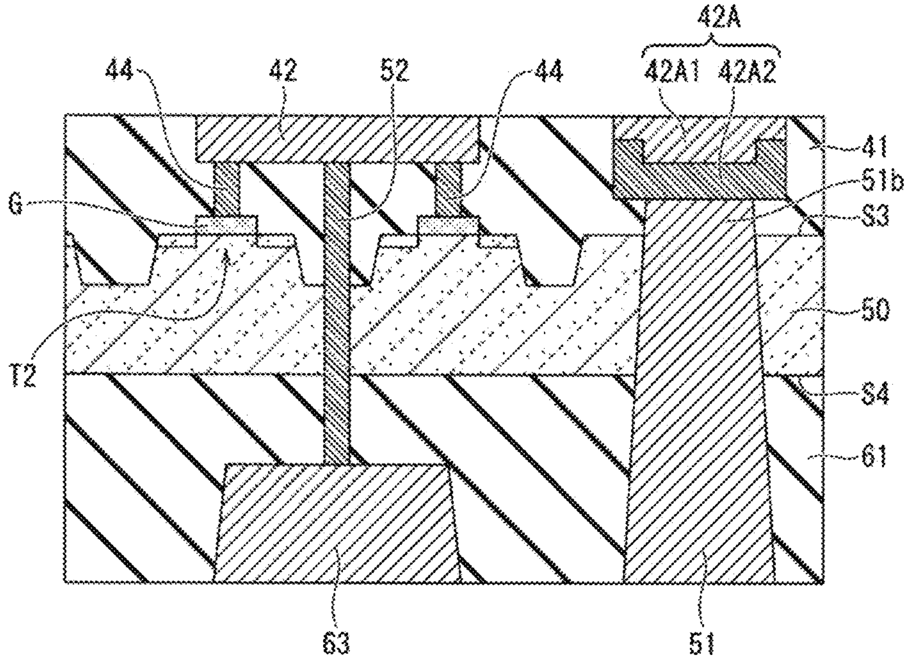
FIG. 40 is a longitudinal cross-sectional diagram depicting a main part of an optical detection device according to modification 4 of the fourth embodiment of the present technology.

According to the optical detection device 1 in modification 4 of the fourth embodiment, the first layer 42A1 side surface of the second layer 42A2 is recessed toward the end 51*b* side of the first conductor 51 as depicted in FIG. 40. This recess is formed by etching, for example.

Advantageous effects similar to those of the optical detection device 1 of the fourth embodiment described above can be offered by the optical detection device 1 according to modification 4 of the fourth embodiment described here.

<Modification 5>

Figure 41:
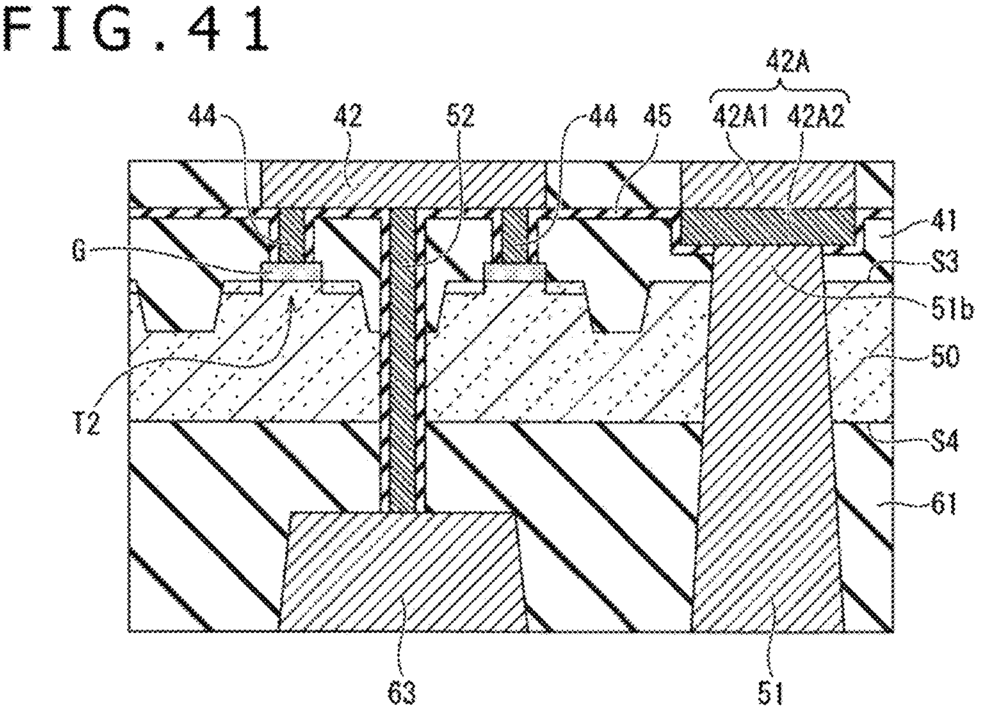
FIG. 41 is a longitudinal cross-sectional diagram depicting a main part of an optical detection device according to modification 5 of the fourth embodiment of the present technology.

According to the optical detection device 1 in modification 5 of the fourth embodiment, an insulation film 45 is provided between the second layer 42A2 and the insulation film 41 as depicted in FIG. 41. The insulation film 45, which is an insulation film of a type different from the insulation film 41, is a silicon oxynitride film, for example.

The insulation film 45 functions as an etching stop layer during formation of the hole 51*h*. More specifically, the insulation film 45 includes a material having a lower etching rate for selected etchant than the material constituting the insulation film 41. A manufacturing method of the optical detection device 1 in modification 5 of the fourth embodiment will hereinafter be described with reference to FIGS. 42A to 42C while focus is placed on a part different from the manufacturing method explained in the fourth embodiment.

Figure 42A:
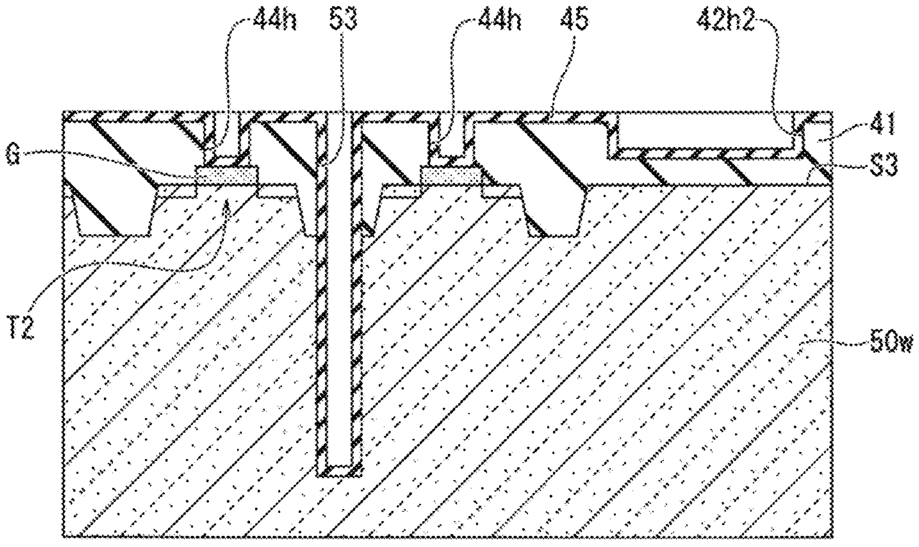
FIG. 42A is a step cross-sectional diagram depicting a manufacturing method of the optical detection device according to modification 5 of the fourth embodiment of the present technology.

As depicted in FIG. 42A, the holes 44*h*, the hole 53, and the hole 42*h*2 are formed, and then the insulation film 45 that functions as an etching stop layer is laminated in such a manner as to cover inner surfaces of the holes 44*h*, the hole 53, and the hole 42*h*2. For example, the insulation film 45 is so laminated as to have a thickness of approximately 50 nm. However, this configuration is not required to be adopted. Thereafter, the insulation film 45 at portions corresponding to the bottoms of the vias 44 is removed, and then steps similar to the corresponding steps depicted in FIGS. 36B to 36D are performed.

Figure 42B:
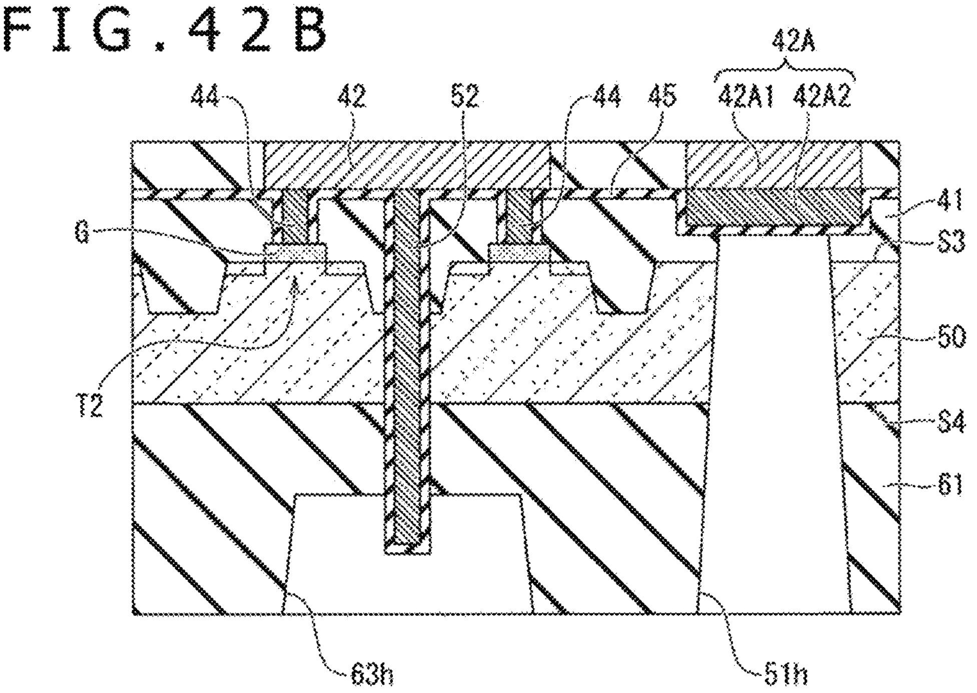
FIG. 42B is a step cross-sectional diagram continuing from FIG. 42A.

Thereafter, as depicted in FIG. 42B, the hole 63*h* and the hole 51*h* are formed. In this case, etching speed for etching the hole 51*h* decreases after the etching reaches the insulation film 45. If any part of the insulation film 45 is etched, this etched part is only a small portion. By decreasing the etching speed of the hole 51*h* with use of the insulation film 45, the etching is allowed to stop until etching for a portion corresponding to low-speed etching catches up with the other etching portion in the wafer surface. In this manner, variations in the etching speed of the hole 51*h* produced in the wafer surface can be cancelled. In other words, the insulation film 45 equalizes the degrees of etching progress of the holes 51*h* at different positions in the wafer surface.

Figure 42C:
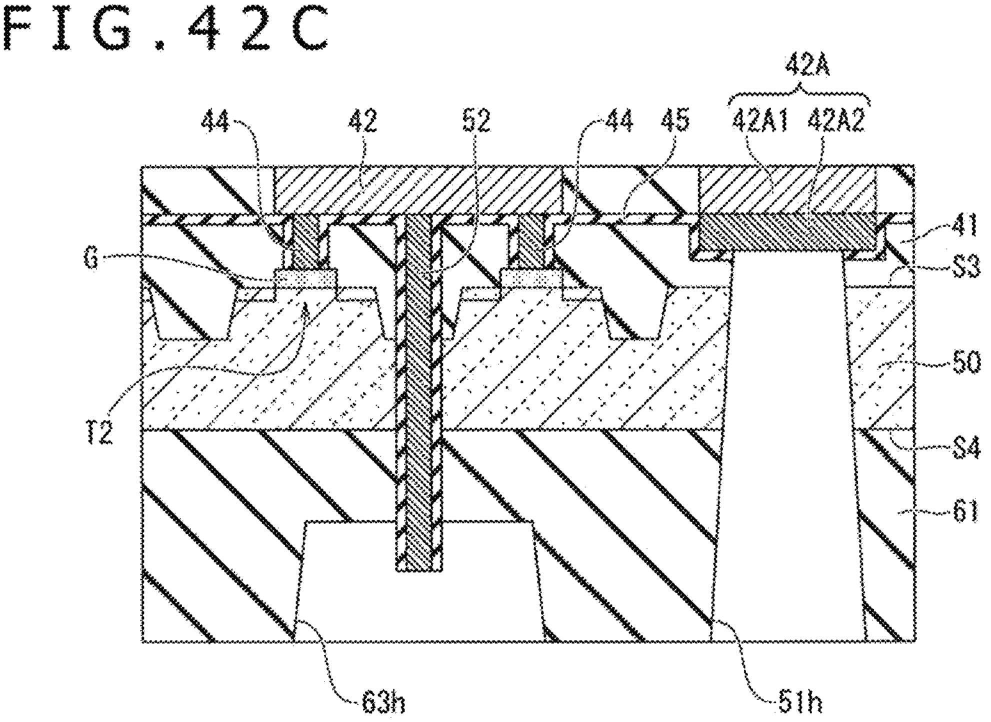
FIG. 42C is a step cross-sectional diagram continuing from FIG. 42B.

Subsequently, as depicted in FIG. 42C, the insulation film 45 located at the bottom of the hole 51*h* is etched and removed by an etching condition being changed. The etching for the insulation film 45 is simultaneously started for the holes 51*h* at different positions in the wafer surface. Moreover, the thickness of the insulation film 45 is as small as approximately 50 nm, for example, and hence, only a short etching time is required. If any variation is produced in the progress in etching in the wafer surface, this variation is only a small variation. Accordingly, an increase in the amount of over-etching of the material constituting the second layer 42A2 can be reduced. Steps after this step have already been explained in the fourth embodiment, and hence will not be repeatedly described here.

Advantageous effects similar to those of the optical detection device 1 of the fourth embodiment described above can be offered by the optical detection device 1 according to modification 5 of the fourth embodiment described here.

Moreover, according to the optical detection device 1 in modification 5 of the fourth embodiment, the insulation film 45 is provided as an etching stop layer. In this case, variations in etching progress of the holes 51*h* produced in the wafer surface can be cancelled. Accordingly, this configuration can reduce an increase in the amount of over-etching of the material constituting the second layer 42A2, and thus can reduce an increase in a scattered amount of the material constituting the second layer 42A2.

Fifth Embodiment

Hereinafter described will be the fifth embodiment of the present technology depicted in FIG. 43. The optical detection device 1 according to the present fifth embodiment is different from the optical detection device 1 according to the first embodiment described above in that a second conductor 52B is provided in place of the second conductor 52. Other configurations of the optical detection device 1 are basically similar to the corresponding configurations of the optical detection device 1 according to the first embodiment described above. Note that the constituent elements already described will be given the same reference signs, and will not be repeatedly explained.

<<Configuration of Optical Detection Device>>

The configuration of the optical detection device 1 according to the fifth embodiment of the present technology will hereinafter be described while focus is placed on a part different from the configuration of the optical detection device 1 according to the first embodiment described above. Note that scales of constituent elements depicted in some of the figures associated with the present fifth embodiment are different from scales of the same constituent elements in the other figures describing the fifth embodiment to help easy understanding of the explanation. Moreover, a part of the barrier metal layer is not be depicted in some of the figures explaining the present fifth embodiment. Furthermore, FIG. 43 is an illustration emphasizing a difference in film thickness.

Figure 43:
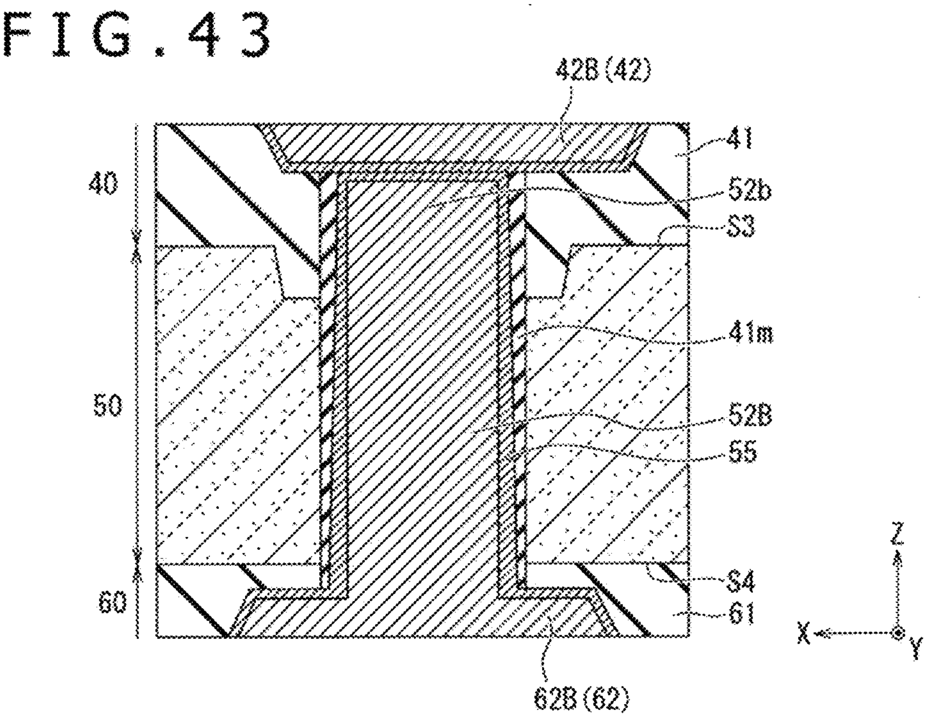
FIG. 43 is a longitudinal cross-sectional diagram depicting a main part of an optical detection device according to a fifth embodiment of the present technology.

As depicted in FIG. 43, the second conductor 52B penetrates the second semiconductor layer 50 in the thickness direction. Moreover, the second conductor 52B includes the same material as the material of the one wire 62 of the wires 62 included in the third wiring layer 60, and is provided integrally with the one wire 62. More specifically, the second conductor 52 and the one wire 62 include the same material and are simultaneously provided. The one wire 62 here will also be referred to as a wire 62B for distinction between the one wire 62 and the other wires 62. The second conductor 52B and the wire 62B are formed integrally with each other by the same film forming step. Accordingly, a portion from the second conductor 52B to the wire 62B includes the same material and is continuously formed with no boundary between these components. In addition, no interface between different types of materials is present between the second conductor 52B and the wire 62B. Each of the second conductor 52B and the wire 62B includes a third material. The third material is a conductive material having a low resistance value. Examples adoptable as the third material include tungsten, aluminum, copper, cobalt, and ruthenium. The present embodiment will be explained on an assumption that each of the second conductor 52B and the wire 62B includes copper.

Moreover, the optical detection device 1 includes the insulation film 41*m* (separation insulation film) between the second conductor 52B and the second semiconductor layer 50. The insulation film 41*m* projects into the insulation film 61 included in the third wiring layer 60. In addition, the insulation film 41*m* is shaped such that a third surface S3 side thickness is larger than a fourth surface S4 side thickness.

Further, the insulation film 41*m* has higher quality than the insulation film 61 included in the third wiring layer 60. More specifically, the insulation film 41*m* has higher density and contains fewer impurities than the insulation film 61 included in the third wiring layer 60. The insulation film 41*m* has these characteristics because a film forming temperature of the insulation film 41*m* is higher than a film forming temperature of the insulation film 61. This point will be described below in a chapter associated with a manufacturing method. Accordingly, the insulation film 41*m* has electrically higher voltage endurance than the insulation film 61.

The end 52*b* on the third surface S3 side of the second conductor 52B is connected to the one wire 42 of the wires 42 included in the second wiring layer 40. The one wire 42 will also be referred to as a wire 42B here for distinction from the other wires 42. Moreover, the optical detection device 1 has a barrier metal layer so provided as to cover the metal material. For example, the barrier metal layer reduces diffusion of metal constituting wires, connection pads, and vias into insulation films. According to the present embodiment, the barrier metal layer so provided as to cover the second conductor 52B and the wire 62B will be referred to as a barrier metal layer 55 for distinction from other barrier metal layers. The barrier metal layer 55 is provided between the second conductor 52B and the insulation film 41*m*, between the second conductor 52B and the wire 42B, and between the wire 62B and the insulation film 61. The barrier metal layer 55 includes a film containing high melting metal (high melting metal film). For example, the barrier metal layer 55 is a layer including titanium nitride (TiN), but is not limited to this example.

A fourth surface S4 side thickness of a portion included in the barrier metal layer 55 and provided between the second conductor 52B and the insulation film 41*m* is larger than a third surface S3 side thickness of this portion. This is a characteristic opposite to that of the insulation film 41*m*.

<<Manufacturing Method of Optical Detection Device>>

A manufacturing method of the optical detection device 1 will hereinafter be described with reference to FIGS. 44A to 44G. Only a part associated with a manufacturing method of the second conductor 52B and the wire 62B will be explained here.

Figure 44A:
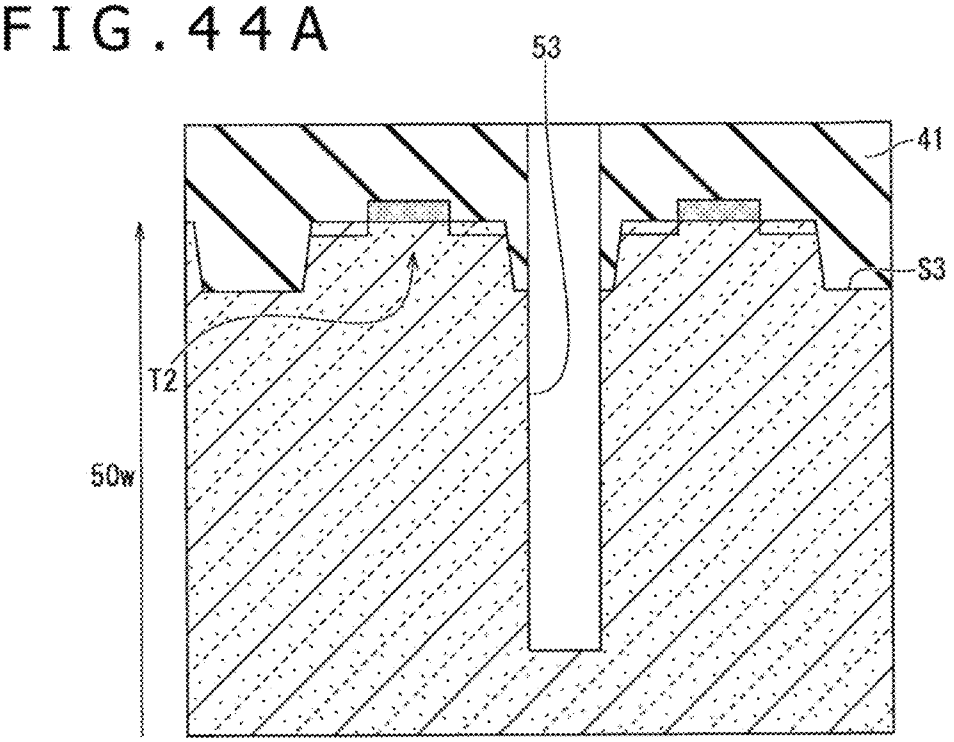
FIG. 44A is a step cross-sectional diagram depicting a manufacturing method of the optical detection device according to the fifth embodiment of the present technology.

First, as depicted in FIG. 44A, elements such as the transistors T2 are formed on the third surface S3 side of the second semiconductor layer 50*w*, and an insulation film of the second wiring layer 40 is laminated. Thereafter, the hole 53 extending into the second semiconductor layer 50*w* is formed from the third surface S3 side by a known lithography technology and a known etching technology. The hole 53 is a hole provided for forming the second conductor 52B.

Figure 44B:
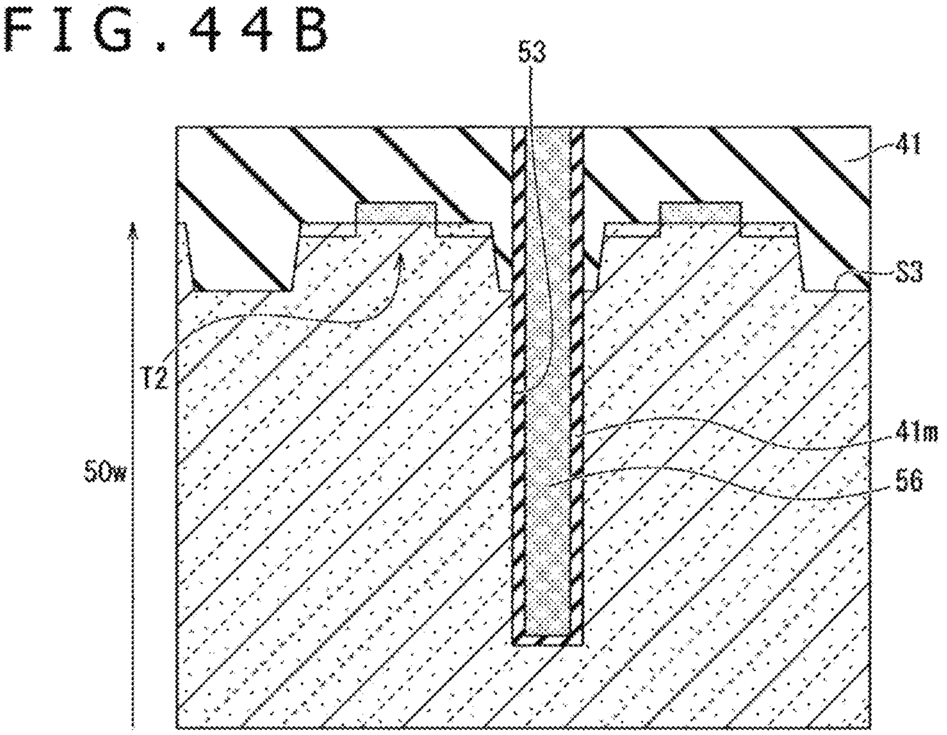
FIG. 44B is a step cross-sectional diagram continuing from FIG. 44A.

Next, as depicted in FIG. 44B, the insulation film 41*m* and a film (sacrificial layer) 56 are sequentially laminated in this order from the third surface S3 side on an exposed surface containing an inner wall (inner circumferential surface and bottom surface) of the hole 53. For example, the insulation film 41*m* includes silicon oxide ($SiO_2$). For example, the insulation film 41*m* is formed by high-temperature and low-pressure CVD. Wires including metal such as aluminum and copper are not yet formed on the third surface S3 side of the second semiconductor layer 50*w* depicted in FIGS. 44A and 44B. In this case, a temperature for forming the insulation film 41*m* is not subject to a limitation on metal such as aluminum and copper. Accordingly, the temperature for forming the insulation film 41*m* can be raised in comparison with a case where wires including metal such as aluminum and copper have been formed. This configuration can hence reduce a decrease in density of the insulation film 41*m*, and can reduce an increase in impurities. In addition, this configuration can reduce a drop of electric voltage endurance of the insulation film 41*m*. Moreover, FIG. 44B as a schematic figure of the insulation film 41*m* illustrates a uniform film thickness of the insulation film 41*m* in the Z-direction. In an actual situation, however, the film thickness of the insulation film 41*m* is large on the side where the film is formed in the Z-direction (third surface S3 side), and is small on the bottom side of the hole 53 (fourth surface S4 side).

The film 56 as a temporary material is laminated in such a manner as to fill the hole 53 via the insulation film 41*m*. The film 56 includes a sacrificial material, and is removed by a step described below. More specifically, in the pair of the film 56 and the insulation film 41*m*, only the film 56 is removed. Accordingly, the material having a higher etching rate for selected etchant than the material constituting the insulation film 41*m* is selected as the sacrificial material constituting the film 56. In other words, the material constituting the insulation film 41*m* is a material having a lower etching rate for selected etchant than the sacrificial material constituting the film 56. Examples adoptable as the sacrificial material include silicon, polysilicon, silicon nitride, and tungsten. The present embodiment will be described on an assumption that the film 56 includes polysilicon.

Figure 44C:
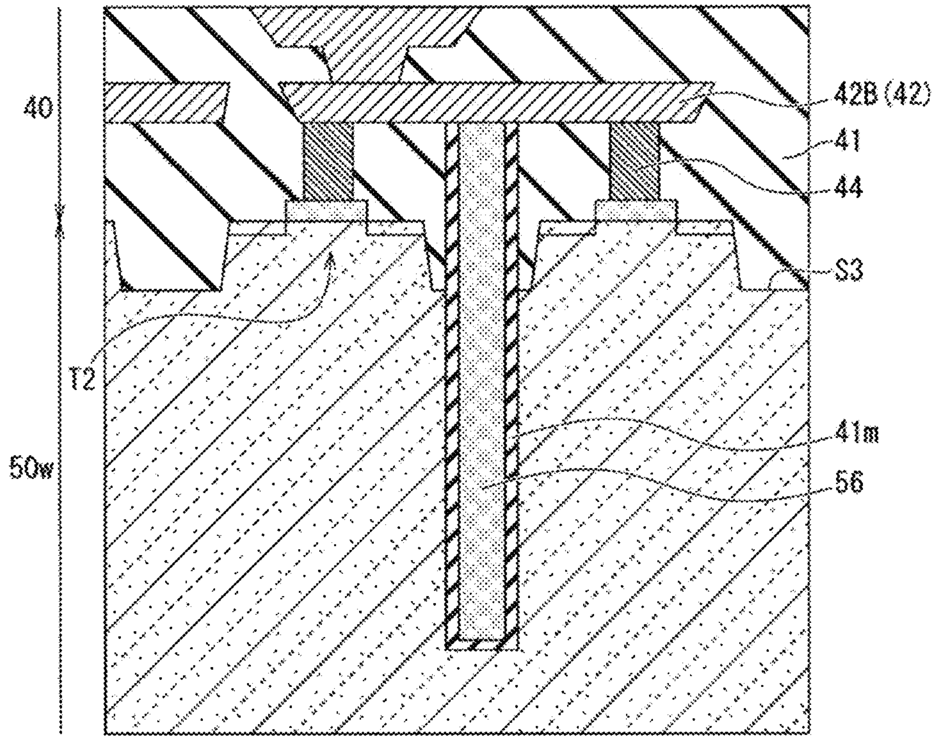
FIG. 44C is a step cross-sectional diagram continuing from FIG. 44B.
Figure 44D:
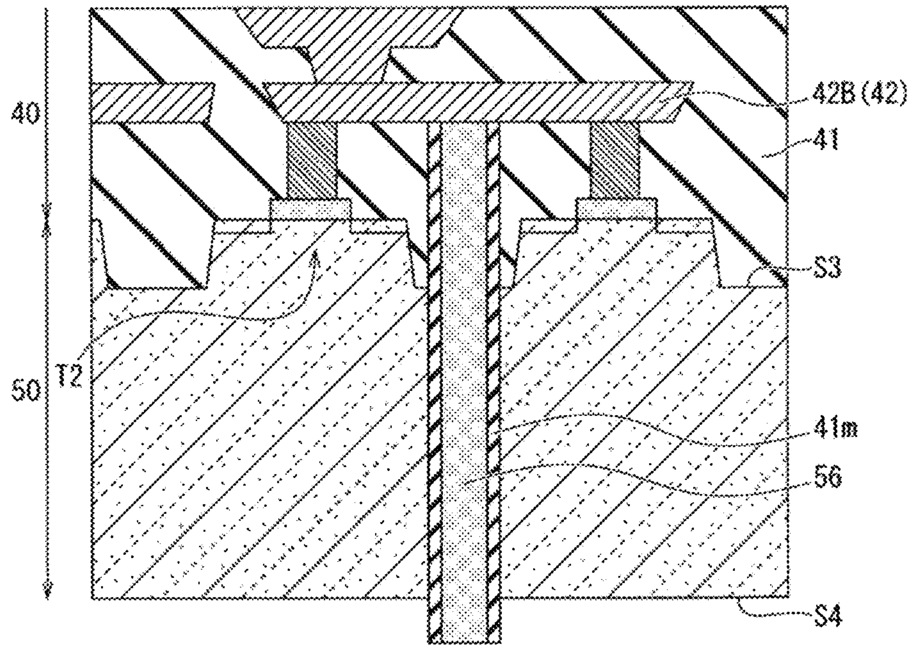
FIG. 44D is a step cross-sectional diagram continuing from FIG. 44C.
Figure 44E:
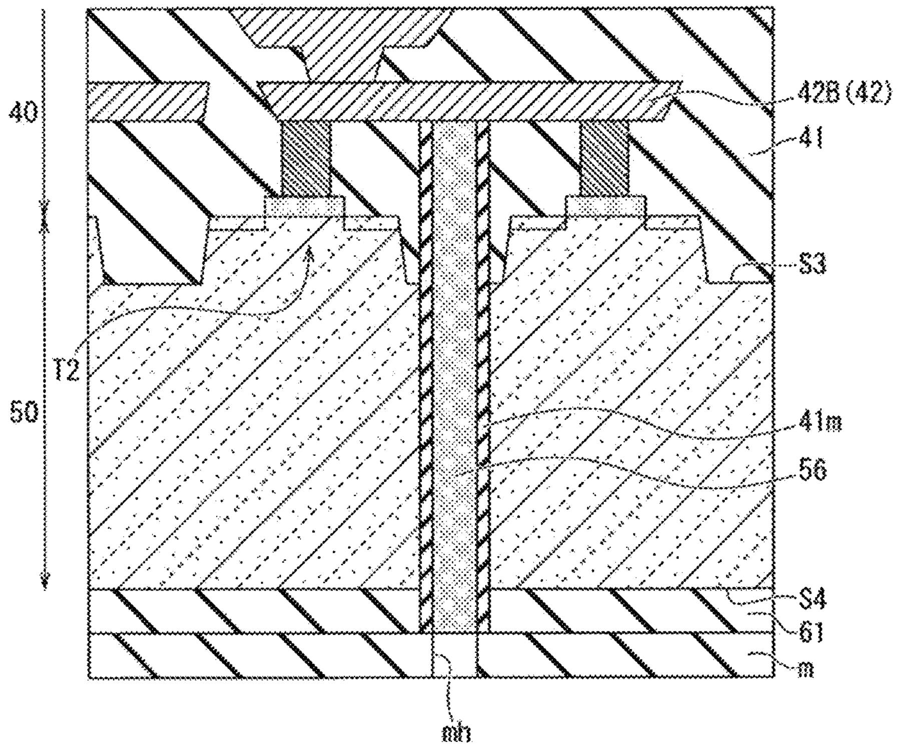
FIG. 44E is a step cross-sectional diagram continuing from FIG. 44D.

Subsequently, as depicted in FIG. 44C, the second wiring layer 40 is completed, and steps similar to the steps depicted in FIGS. 5F to 5H of the first embodiment are performed. More specifically, the thickness of the second semiconductor layer 50 is reduced from the side opposite to the third surface S3 side to expose the film 56 and the insulation film 41*m* from the fourth surface S4. More specifically, the film 56 and the insulation film 41*m* are projected from the fourth surface S4. In such a manner, the film 56 and the insulation film 41*m* whose ends are protruded from the fourth surface S4 are produced as depicted in FIG. 44D. Subsequently, the insulation film 61 and a film m functioning as a hard mask are deposited on the fourth surface S4 side as depicted in FIG. 44E. Thereafter, an opening mh is formed in the film m by a known lithography technology and a known etching technology. More specifically, the opening mh is formed in a region overlapping with the film 56 embedded in the hole 53, in the planar view.

The insulation film 61 is formed at a temperature withstandable for metal constituting the wires, such as aluminum and copper, because the second wiring layer 40 including the wires 42 and the like is already completed. Accordingly, the insulation film 61 is formed at a temperature lower than the temperature for forming the insulation film 41*m*. For example, the insulation film 61 is formed by plasma CVD, spin-on-glass (SOG, spin-on-glass), or other methods.

Figure 44F:
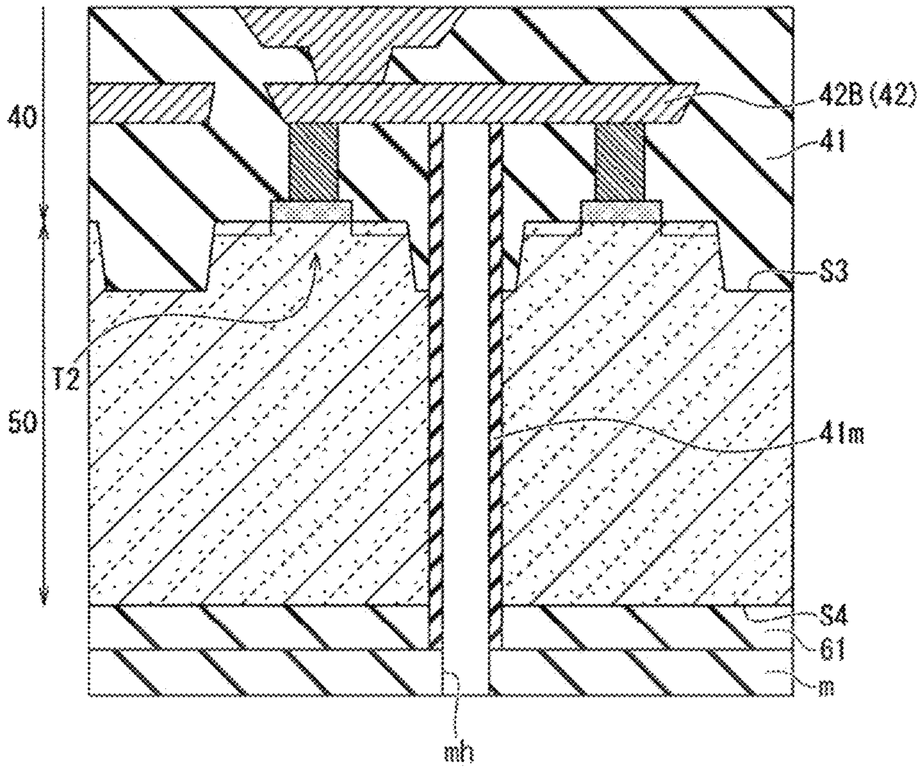
FIG. 44F is a step cross-sectional diagram continuing from FIG. 44E.

Subsequently, in the pair of the film 56 and the insulation film 41*m*, the film 56 is selectively removed via the opening mh by a known etching technology as depicted in FIG. 44F. Specifically, in the pair of the film 56 and the insulation film 41*m*, only the film 56 is removed with use of a difference in etching rate for selected etchant between the sacrificial material (polysilicon) constituting the film 56 and silicon oxide constituting the insulation film 41*m*. In such a manner, a region included in the hole 53 and occupied by the film 56 is hollowed, and the insulation film 41*m* is exposed.

Figure 44G:
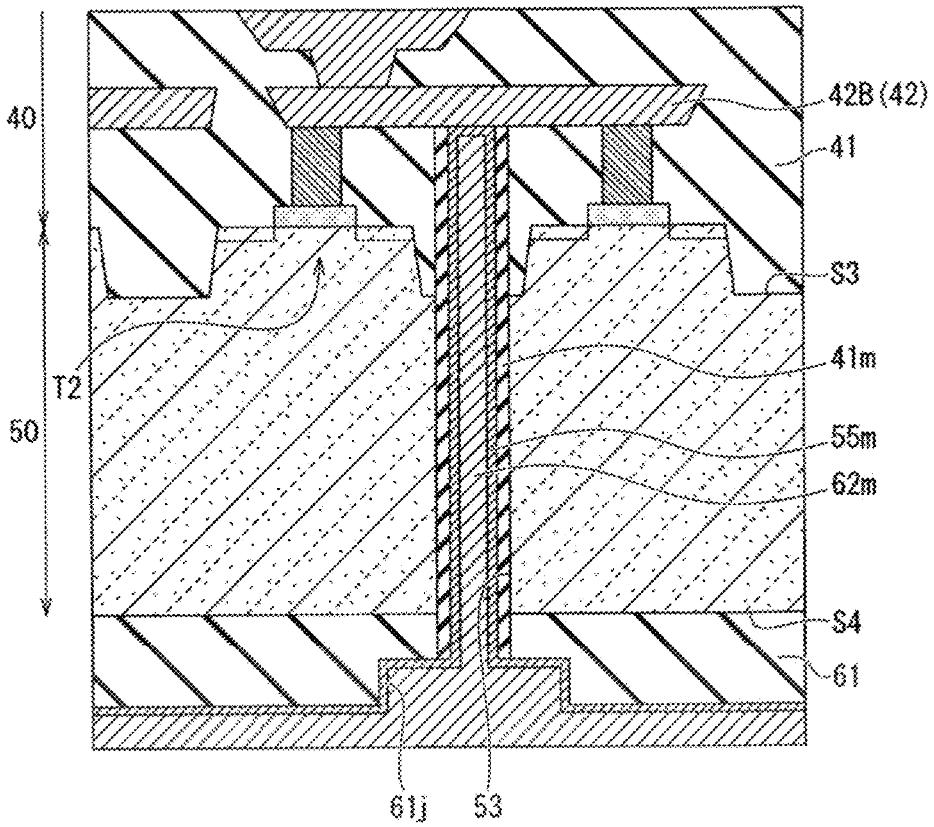
FIG. 44G is a step cross-sectional diagram continuing from FIG. 44F.

Subsequently, as depicted in FIG. 44G, an opening 61*j* in which the wire 62B is to be embedded is formed in the insulation film 61 in a region overlapping with the hole 53 in the planar view. Thereafter, the barrier metal layer 55 is laminated on exposed surfaces inside the hole 53 and inside the opening 61*j*. The barrier metal layer 55 is provided on an inner circumferential surface of the hole 53 via the insulation film 41*m* and on the bottom of the hole 53, i.e., a region where the hole 53 overlaps with the wire 42B in the planar view. Moreover, in the state where the insulation film 41*m* is laminated on the inner circumferential surface of the hole 53, the barrier metal layer 55 is deposited on an exposed surface of the insulation film 41*m* for the inner circumferential surface of the hole 53. Further, FIG. 44G as a schematic figure of the barrier metal layer 55 depicts a uniform film thickness of the barrier metal layer 55 in the Z-direction. In an actual situation, however, the film thickness of the barrier metal layer 55 is large on the side where the film is formed in the Z-direction (fourth surface S4 side), and is small on the wire 42B side (third surface S3 side). As described above, the barrier metal layer 55 is laminated from the side (fourth surface S4 side) opposite to the side where the insulation film 41*m* is laminated (third surface S3 side). Accordingly, the thickness characteristic of the barrier metal layer 55 is opposite to the thickness characteristic of the insulation film 41*m*.

Next, as depicted in FIG. 44G, a film 62*m* including a conductive material (copper in the present embodiment) is laminated by plating on the exposed surface of the barrier metal layer 55. The film 62*m* is deposited in such a manner as to fill an interior of the hole 53 and an interior of the opening 61*j*. More specifically, the film 62*m* is deposited in such a manner as to fill a hollow inside the hole 53 and the interior of the opening 61*j*. As described above, the film 62*m* including the same material is simultaneously embedded in the hole 53 and the opening 61*j* by the same step. Accordingly, a portion from the second conductor 52B to the wire 62B can be continuously formed with use of the same material, and hence, formation of a boundary between these components can be reduced. More specifically, generation of an interface between different types of materials can be reduced between these components. In more detail, the second conductor 52B is formed simultaneously with the wire 62B by the same step while the hollow inside the hole 53 is used. Thereafter, unnecessary portions of the barrier metal layer 55 and the film 62*m* are removed by CMP to produce the second conductor 52B and the wire 62B depicted in FIG. 43.

<<Main Advantageous Effects of Fifth Embodiment>>

Main advantageous effects of the fifth embodiment will hereinafter be described. Before the description of these effects, two conventional examples depicted in FIGS. 45A and 45B will be touched upon.

Figure 45A:
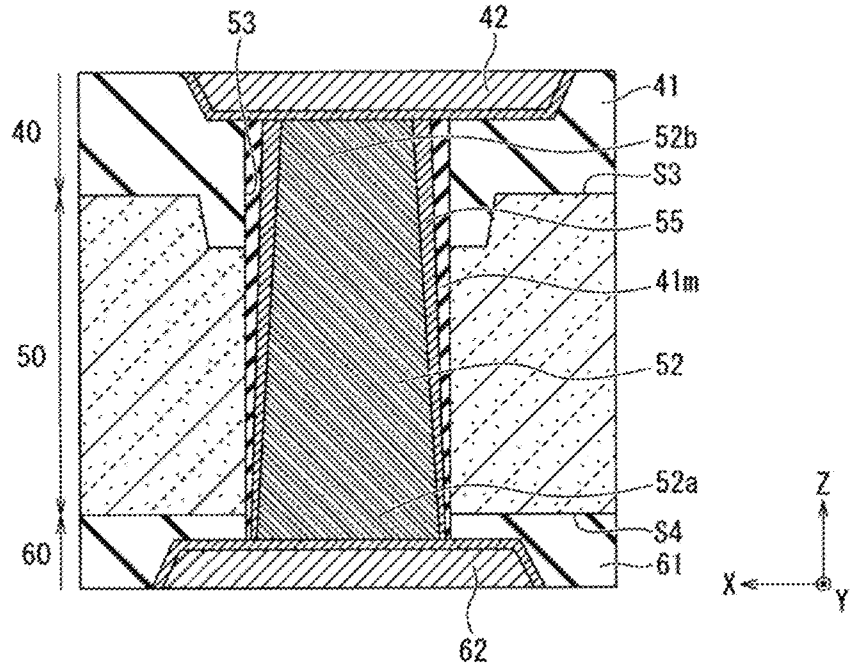
FIG. 45A is a longitudinal cross-sectional diagram depicting a main part of a conventional optical detection device.

First, for producing the conventional second conductor 52 depicted in FIG. 45A, the hole 53 is formed from the third surface S3 side. The insulation film 41*m* and the barrier metal layer 55 are formed on an inner surface of the hole 53 from the third surface S3 side. A material constituting the second conductor 52 is embedded into the hole 53 from the third surface S3 side. Thereafter, the wire 62 is formed from the fourth surface S4 side. According to the conventional second conductor 52 depicted in FIG. 45A, the insulation film 41*m* is formed from the third surface S3 side before wires including metal, such as aluminum and copper, are provided. Accordingly, a drop of electric voltage endurance of the insulation film 41*m* can be reduced. Meanwhile, the second conductor 52 including tungsten, for example, is formed from the third surface S3 side, and the wire 62 including copper, for example, is formed from the fourth surface S4 side. In this case, an interface between different types of materials is generated between the second conductor 52 and the wire 62. Accordingly, an electric resistance value between the second conductor 52 and the wire 62 is higher in comparison with a case of no interface between different types of materials. Moreover, each film thickness of the conventional insulation film 41*m* and the conventional barrier metal layer 55 is large on the side where the film is formed in the Z-direction (third surface S3 side), and is small on the bottom side of the hole 53 (fourth surface S4 side). Further, the barrier metal layer 55 is not provided between the second conductor 52 and the wire 42.

Figure 45B:
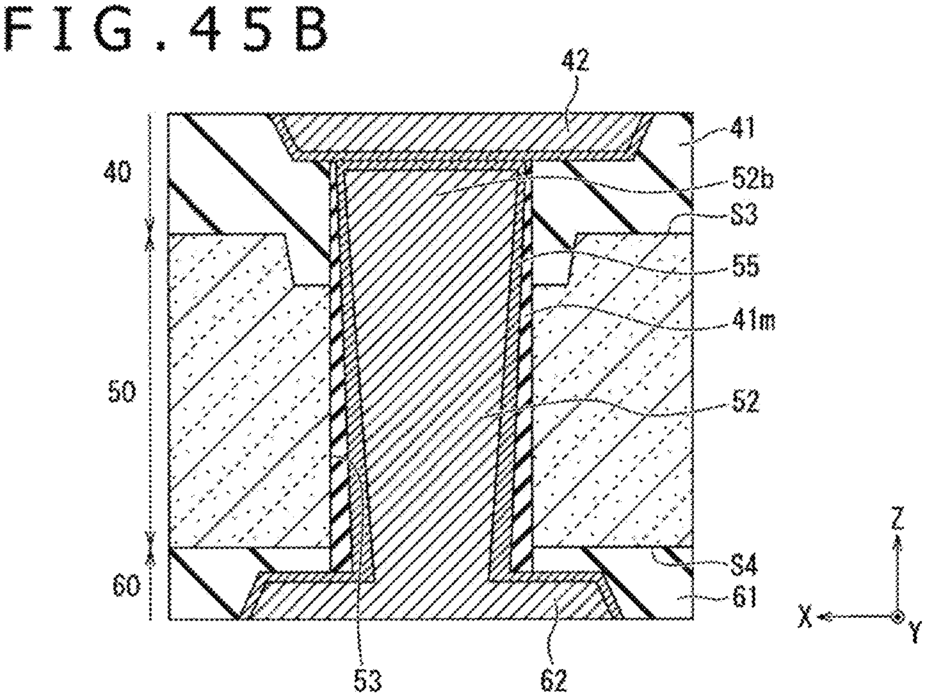
FIG. 45B is a longitudinal cross-sectional diagram depicting a main part of the conventional optical detection device.

In addition, for producing the conventional second conductor 52 depicted in FIG. 45B, the hole 53 is formed from the fourth surface S4 side. The insulation film 41*m* and the barrier metal layer 55 are formed on an inner surface of the hole 53 from the fourth surface S4 side. A material constituting the second conductor 52 and the wire 62 is embedded into the hole 53 from the fourth surface S4 side by one step. According to the conventional example depicted in FIG. 45B, the second conductor 52 and the wire 62 are simultaneously formed by the same step. In this case, no interface between different types of materials is present between the second conductor 52 and the wire 62. Accordingly, an electric resistance value between the second conductor 52 and the wire 62 can be made lower than the electric resistance value of the conventional second conductor 52 depicted in FIG. 45A. Meanwhile, wires including metal such as aluminum and copper are provided on the third surface S3 side of the second semiconductor layer 50 before the insulation film 41*m* is formed. In this case, the temperature for forming the insulation film 41*m* is subject to a limitation on metal such as aluminum and copper, and hence needs to be set to a temperature lower than that temperature in the case of the conventional example depicted in FIG. 45A. Accordingly, electric voltage endurance of the insulation film 41*m* is lower in comparison with a case of film formation at a high temperature. Moreover, each film thickness of the conventional insulation film 41*m* and the conventional barrier metal layer 55 is large on the side where the film is formed in the Z-direction (fourth surface S4 side), and is small on the bottom side of the hole 53 (third surface S3 side).

Meanwhile, according to the optical detection device 1 of the fifth embodiment of the present technology, the hole 53 for forming the second conductor 52B is formed from the third surface S3 side, and the insulation film 41*m* is laminated on the inner wall of the hole 53 before wires including metal such as aluminum and copper are formed. In this case, the insulation film 41*m* is allowed to be formed at a high temperature without a limitation imposed by wires including metal. Accordingly, a drop of electric voltage endurance of the insulation film 41*m* can be reduced.

Further, according to the optical detection device 1 of the fifth embodiment of the present technology, the hole 53 is filled with the film 56 including a sacrificial material as a temporary material from the third surface S3 side. Thereafter, in the pair of the film 56 and the insulation film 41*m*, the film 56 is selectively removed from the fourth surface S4 side. Subsequently, the second conductor 52B and the wire 62B are simultaneously formed from the fourth surface S4 side by the same step while a hollow produced by removal of the film 56 is used. In such a manner, a portion from the second conductor 52B to the wire 62B can be continuously formed using the same material, and thus, generation of an interface between different types of materials can be reduced between these components.

In addition, according to the fifth embodiment described above, the opening mh depicted in FIG. 44E is formed for selectively removing the film 56 in the pair of the film 56 and the insulation film 41*m*. However, the present technology is not limited to this example. The opening 61*j* may be formed instead of the opening mh, and the film 56 may be selectively removed via the opening 61*j*.

<<Modifications of Fifth Embodiment>>

Hereinafter described will be modifications of the fifth embodiment.

<Modification 1>

Figure 46:
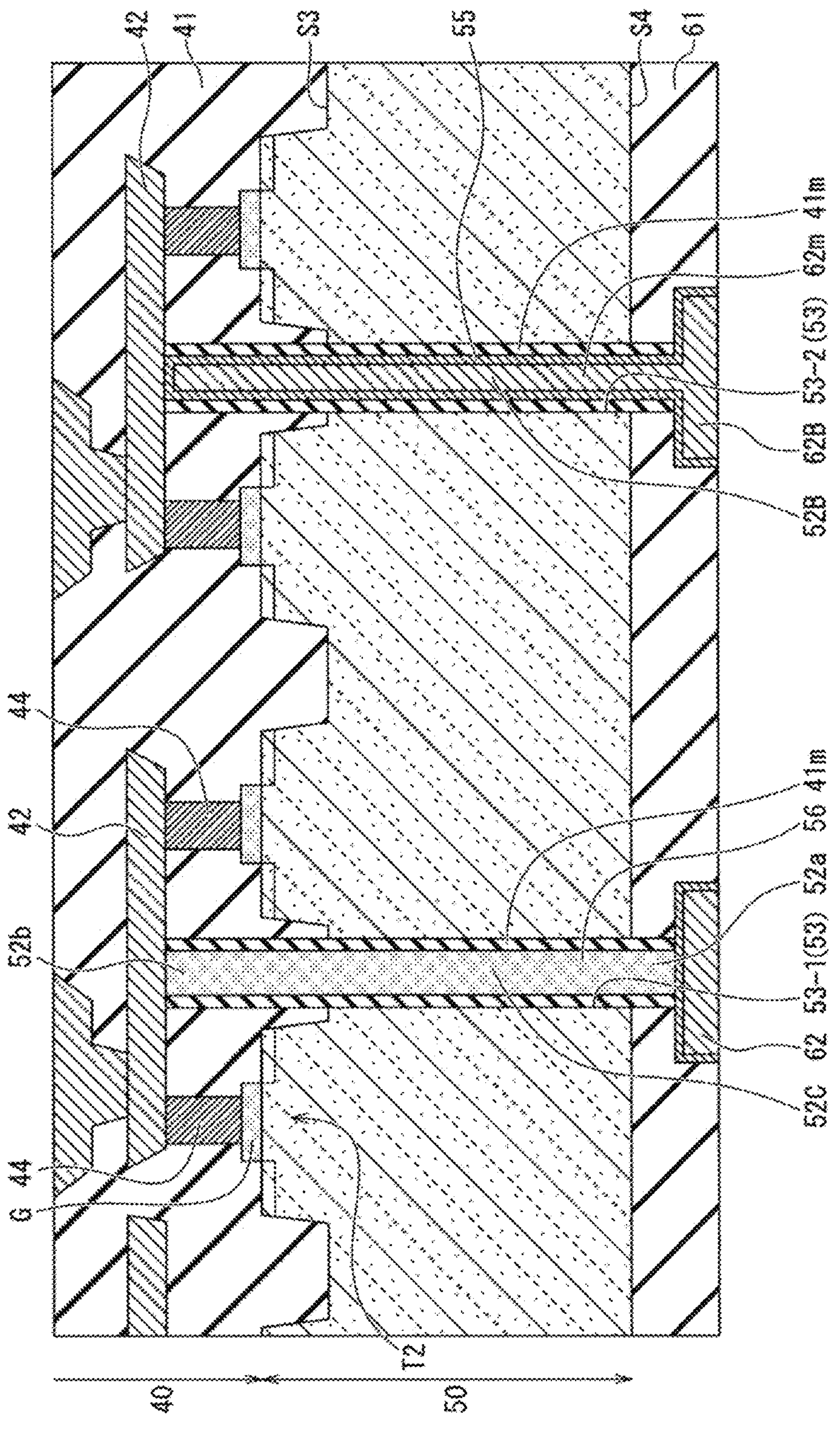
FIG. 46 is a longitudinal cross-sectional diagram depicting a main part of an optical detection device according to modification 1 of the fifth embodiment of the present technology.

As depicted in FIG. 46, the optical detection device 1 according to modification 1 of the fifth embodiment includes the second conductor 52B including the third material and a second conductor 52C including a fourth material different from the third material. The fourth material constituting the second conductor 52C is a material available as a through electrode, i.e., a conductive material, in the sacrificial materials described in the fifth embodiment. Examples adoptable as the fourth material include silicon and tungsten. Described in the present modification will be an example where the second conductor 52C includes silicon, more specifically, polysilicon. Moreover, as for the second conductor 52B, described will be an example where the second conductor 52B includes copper as in the fifth embodiment. The second conductor 52C including polysilicon has a higher electric resistance value than the second conductor 52B including copper.

The second conductor 52C is formed by embedding a film 56 including the fourth material into the hole 53. Note that a hole for forming the second conductor 52C will hereinafter also be referred to as a hole 53-1 and that a hole for forming the second conductor 52B will hereinafter also be referred to as a hole 53-2 for distinction between the hole 53 for forming the second conductor 52C and the hole 53 for forming the second conductor 52B. Moreover, the end 52*b* on the third surface S3 side of the second conductor 52C is connected to the wire 42, while the end 52*a* on the fourth surface S4 side is connected to the wire 62. The wire 62 includes the same material as the material constituting the second conductor 52B, i.e., the third material.

Figure 47A:
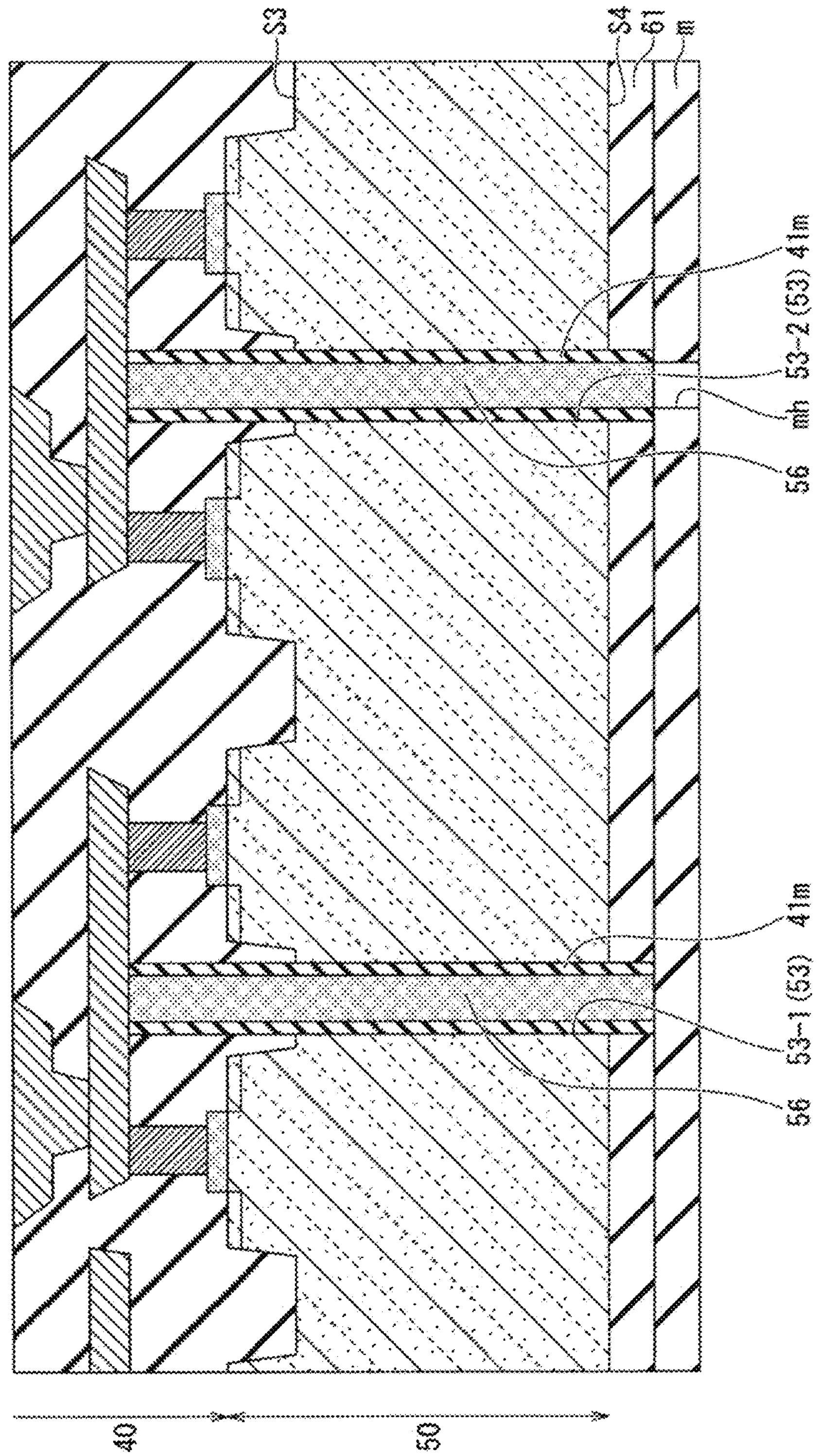
FIG. 47A is a step cross-sectional diagram depicting a manufacturing method of the optical detection device according to modification 1 of the fifth embodiment of the present technology.

A manufacturing method of the optical detection device 1 will hereinafter be described with reference to FIGS. 47A and 47B. Only a part associated with a manufacturing method of a first conductor 51B and a first conductor 51C will be explained here.

First, the steps depicted in the figures up to FIG. 44D associated with the fifth embodiment are performed. Thereafter, the insulation film 61 and the film m functioning as a hard mask are deposited on the fourth surface S4 side as depicted in FIG. 47A. Thereafter, the opening mh is formed in the film m by a known lithography technology and a known etching technology. More specifically, the opening mh is formed in a region overlapping with the film 56 embedded in the hole 53-2, in the planar view. Meanwhile, the opening mh is not formed in a region overlapping with the film 56 embedded, in the hole 53-1 in the planar view. In such a manner, the opening mh is provided for only the hole 53-2, in the pair of the holes 53-1 and 53-2. Accordingly, in the pair of the film 56 embedded in the hole 53-1 and the film 56 embedded in the hole 53-2, only the film 56 embedded in the hole 53-2 is removed by etching in the subsequent step. In such a manner, the film 56 embedded in the hole 53-1 is selectively left.

Figure 47B:
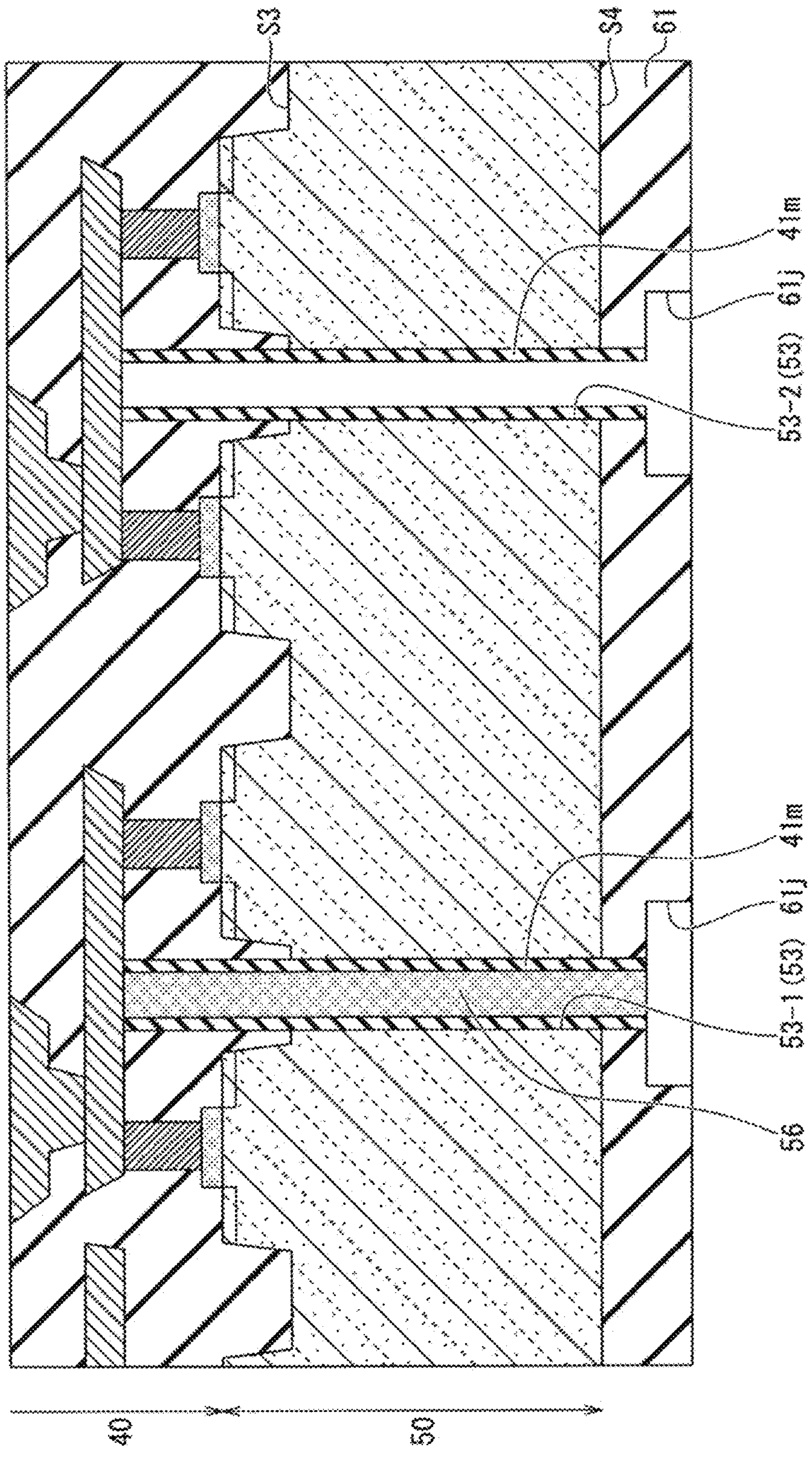

Subsequently, as depicted in FIG. 47B, the openings 61*j* are formed for both the hole 53-1 and the hole 53-2 as openings in which the wire 62 and the wire 62B are to be embedded. Thereafter, the step in FIG. 44G and the following steps of the fifth embodiment are performed.

Advantageous effects similar to those of the optical detection device 1 of the fifth embodiment described above can be offered by the optical detection device 1 according to modification 1 of the fifth embodiment described here.

Moreover, according to the optical detection device 1 in modification 1 of the fifth embodiment, both the second conductor 52B and the second conductor 52C having higher resistance than the second conductor 52B are provided by selectively leaving the film 56 embedded in a part of the holes 53 (hole 53-1) without removal. In this case, a part of the second conductors is available as a high resistance element. Accordingly, the degree of freedom in circuit design can improve.

More specifically, the via 44, the wire 42, and the second conductor 52C are connected in this order to each of the gate electrodes G of the transistors T2 in FIG. 46. Voltage to be applied to each of the gate electrodes G can be varied by changing at least some of materials of these constituent elements for a change of a resistance value. According to the present modification, the material constituting the second conductors can be selectively changed. In this case, the voltage applied to the gate electrodes G can be varied by selectively changing the resistance value of the second conductors. Accordingly, the voltage to be applied to the gate electrodes G can be varied by changing the resistance value of the second conductors in addition to a change of the resistance values of the vias 44 and the wires 42. Accordingly, the degree of freedom in circuit design improves.

<Modification 2>

Figure 48A:
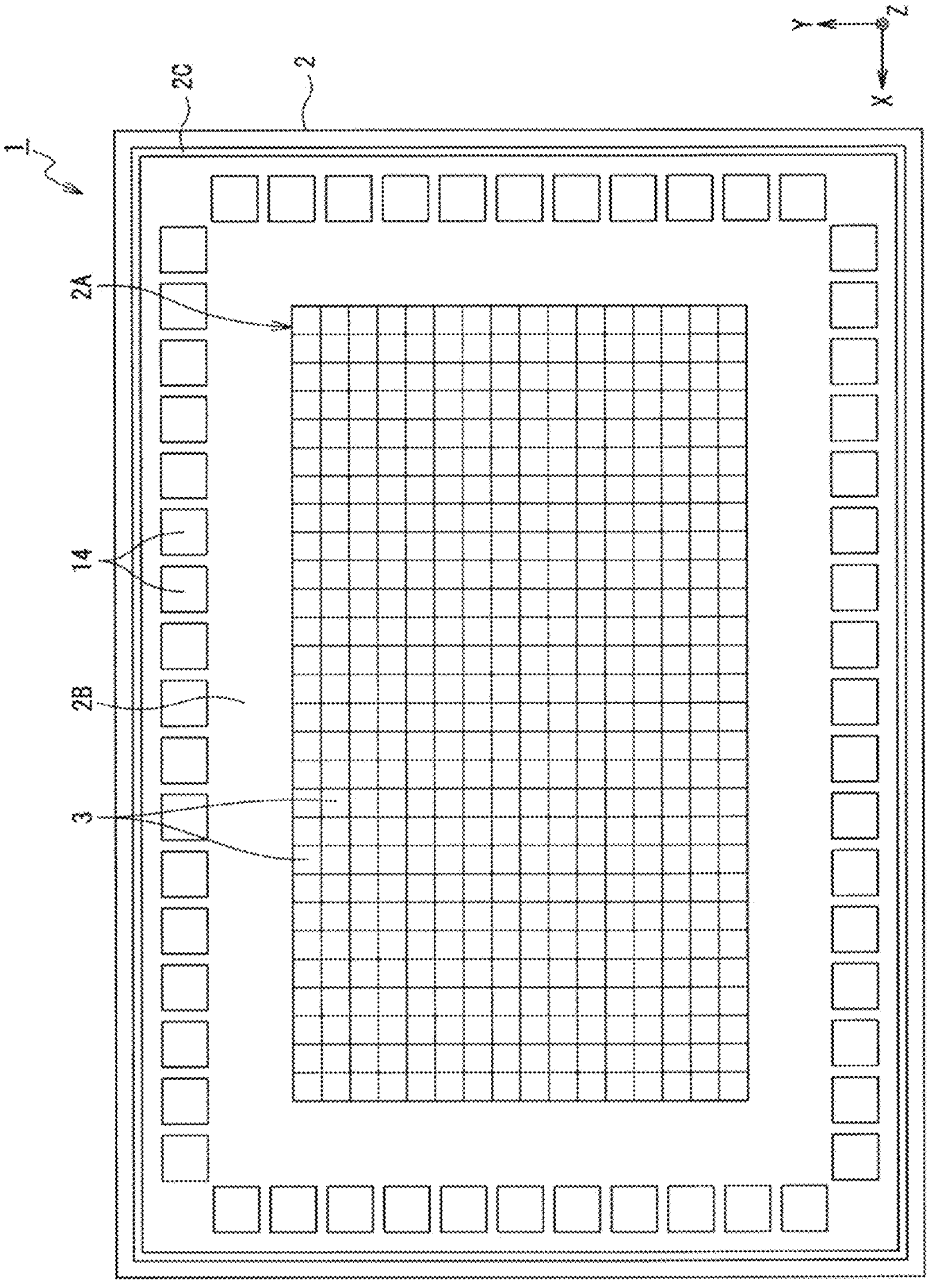
Figure 48B:
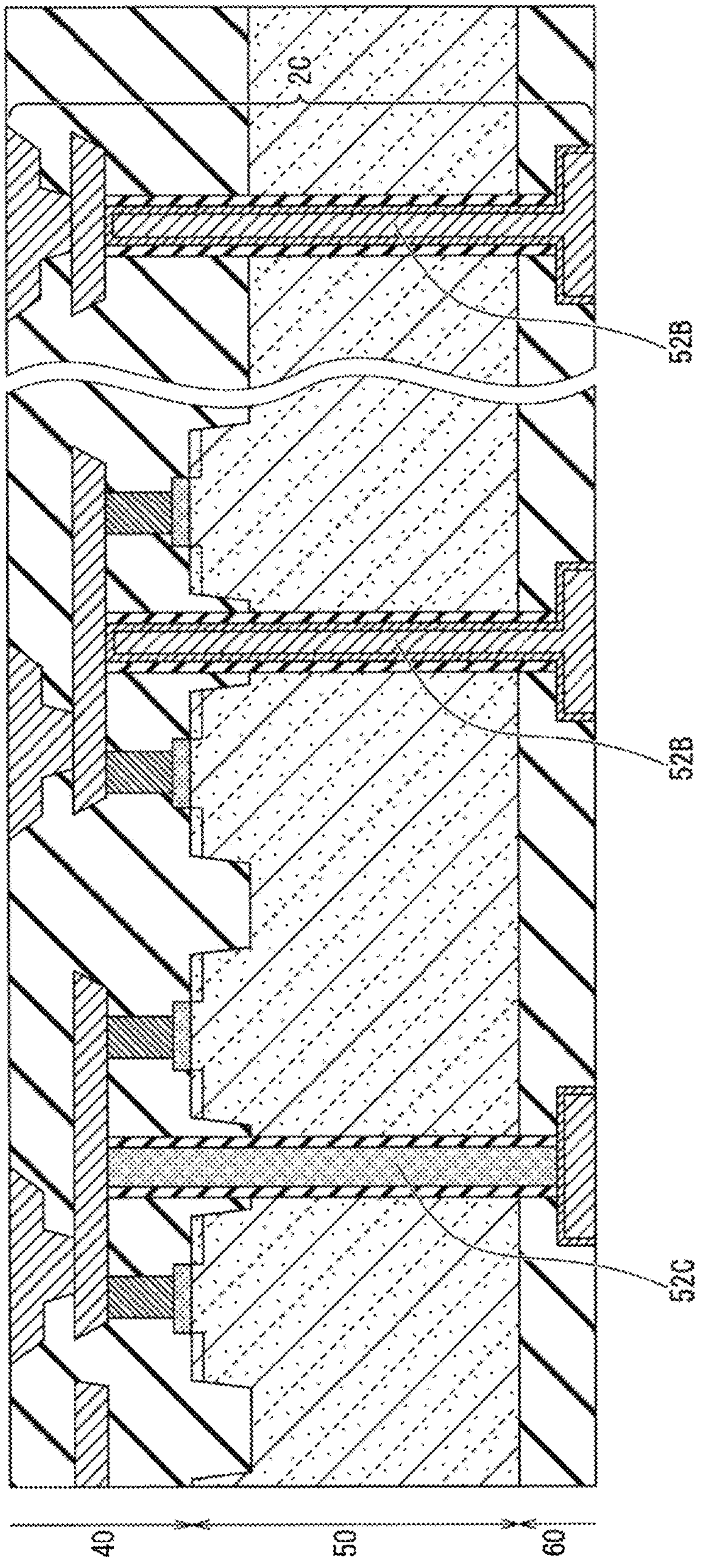

As depicted in FIGS. 48A and 48B, the optical detection device 1 according to modification 2 of the fifth embodiment includes a guard ring 2C. As depicted in FIG. 48A, the guard ring 2C is provided in the peripheral region 2B of the semiconductor chip 2. More specifically, the guard ring 2C is provided in the peripheral region 2B at a position closer to the outer circumference than the bonding pads 14. Moreover, the guard ring 2C is provided in the Z-direction of the semiconductor chip 2. The guard ring 2C prevents a split of the semiconductor chip 2 from the outer circumferential side due to a shock applied from the outside. For example, a mechanical load is applied to the semiconductor chip 2 at the time of singulation of the semiconductor chip 2. The guard ring 2C restrains cracks generated in the outer circumference of the semiconductor chip 2 from developing toward the bonding pads 14 and the pixel region 2A. Moreover, the guard ring 2C reduces entrance of moisture toward the bonding pads 14 and the pixel region 2A.

FIG. 48B depicts a part included in the guard ring 2C and located around the second semiconductor layer 50. The guard ring 2C includes the second conductor 52B penetrating the second semiconductor layer 50 in the thickness direction. While not depicted in the figure, the guard ring 2C may have a similar structure for the first semiconductor layer 20 and the third semiconductor layer 80. More specifically, the guard ring 2C may have the second conductor 52B penetrating the first semiconductor layer 20 in the thickness direction and the second conductor 52B penetrating the third semiconductor layer 80 in the thickness direction.

Advantageous effects similar to those of the optical detection device 1 of the fifth embodiment described above can be offered by the optical detection device 1 according to modification 2 of the fifth embodiment described here.

Moreover, according to the optical detection device 1 in modification 2 of the fifth embodiment described here, a part that is included in the guard ring 2C and that penetrates the semiconductor layer, such as the second semiconductor layer 50, includes the second conductor 52B. In this case, the part that is included in the guard ring 2C and that penetrates the semiconductor layer can be formed simultaneously with the second conductor 52B provided in the pixel region 2A. Accordingly, a reduction of an increase in the number of steps is achievable, and hence, a reduction of a rise of manufacturing costs is achievable.

Note that the guard ring 2C may include the second conductor 52C in place of the second conductor 52B. The material constituting the second conductor 52B or the second conductor 52C included in the guard ring 2C is only required to be an appropriate material selected according to strength and stress of the semiconductor chip 2.

Sixth Embodiment

Figure 49:
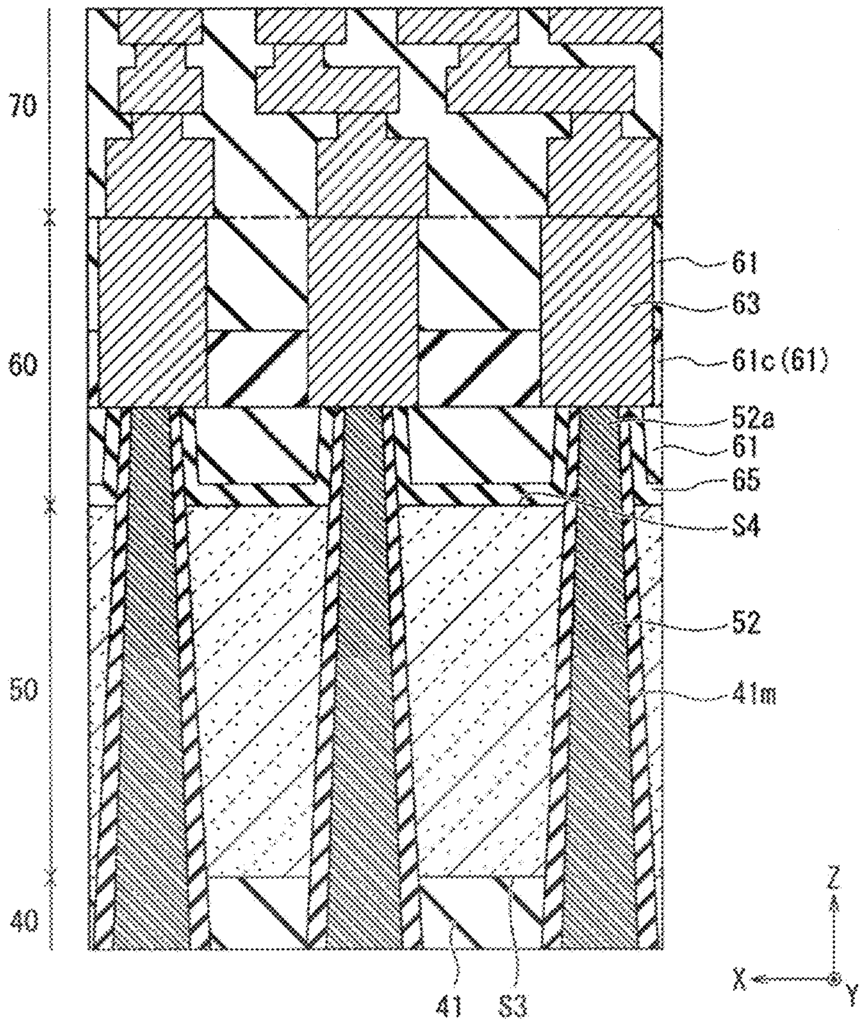

Hereinafter described will be the sixth embodiment of the present technology depicted in FIG. 49. The optical detection device 1 according to the present sixth embodiment is different from the optical detection device 1 according to the first embodiment described above in that the second semiconductor layer 50 is formed using an SOI substrate and that height positions of the ends 52*a* of the second conductors 52 are equalized. Other configurations of the optical detection device 1 are basically similar to the corresponding configurations of the optical detection device 1 according to the first embodiment described above. Note that the constituent elements already described will be given the same reference signs, and will not be repeatedly explained.

<<Configuration of Optical Detection Device>>

The configuration of the optical detection device 1 according to the sixth embodiment of the present technology will hereinafter be described while focus is placed on a part different from the configuration of the optical detection device according to the first embodiment associated with the present sixth embodiment are different from scales of the same constituent elements in the other figures describing the sixth embodiment. Moreover, the barrier metal layer is not depicted in the figures explaining the present sixth embodiment. Further, FIG. 49 is an explanatory diagram schematically depicting a longitudinal cross-sectional structure of a plurality of second conductors 52 included in the optical detection device 1, and contains a part different from the corresponding part of the actual optical detection device 1. For example, FIG. 49 does not depict the transistors T2 and the like. This omission is also applied to each figure following FIG. 49.

<Second Semiconductor Layer>

Figure 50A:
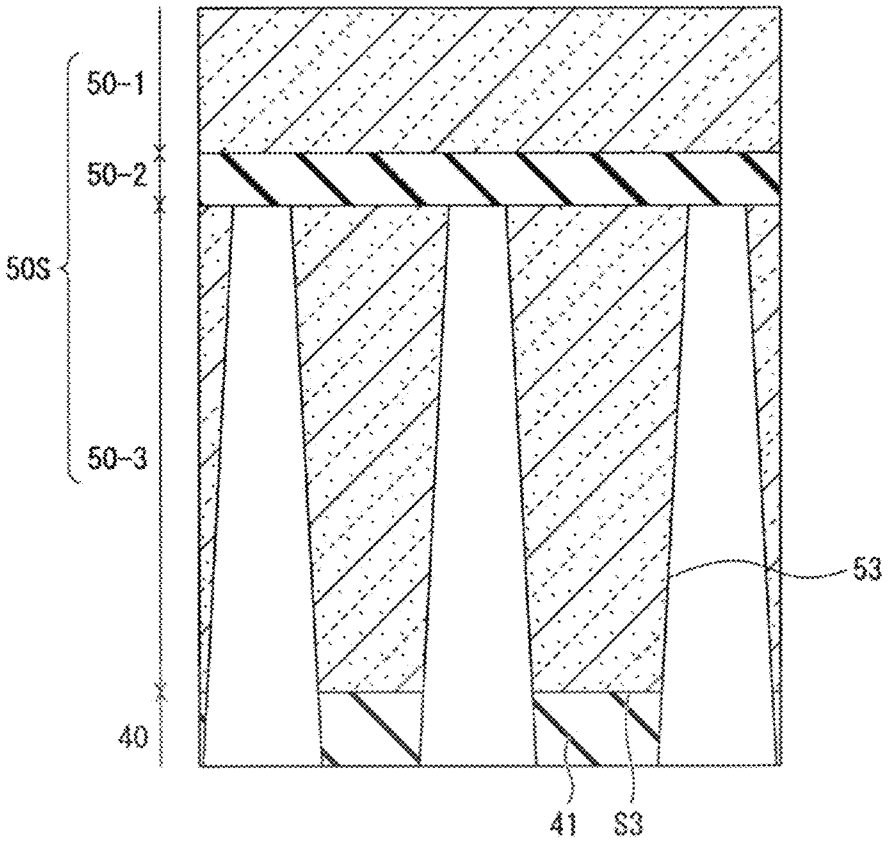

The second semiconductor layer 50 is a part of semiconductor layers included in an SOI (Silicon on Insulator) substrate. For example, the second semiconductor layer 50 includes a semiconductor layer 50-3 depicted in FIG. 50A. As depicted in FIG. 50A, an SOI substrate 50S of the second semiconductor layer 50 is a substrate produced by laminating an insulation layer 50-2 and the semiconductor layer 50-3 in this order on one surface of a base substrate 50-1 including a semiconductor material (more specifically, silicon). Note that the third surface S3 of the second semiconductor layer 50 corresponds to a surface of the semiconductor layer 50-3 on the side opposite to the insulation layer 50-2 side. For example, the insulation layer 50-2 includes silicon oxide. For example, the semiconductor layer 50-3 includes silicon.

<Second Conductor>

The optical detection device 1 includes a plurality of second conductors 52. In addition, as depicted in FIG. 49, the ends 52*a* of a plurality of second conductors 52 have the same height position in the thickness direction of the second semiconductor layer 50. In other words, the height positions of the ends 52*a* of the plurality of second conductors 52 are equalized. Each of the ends 52*a* of the second conductors 52 is connected to the third connection pad 63. The ends 52*a* are the fourth surface S4 side ends in the thickness direction of the second semiconductor layer 50.

<<Manufacturing Method of Optical Detection Device>>

A manufacturing method of the optical detection device 1 will hereinafter be described with reference to FIGS. 50A to 50H. A manufacturing method of the second conductors 52 will mainly be explained here. First, as depicted in FIG. 50A, elements such as the unillustrated transistors T2 are formed on the third surface S3 side of the semiconductor layer 50-3. Then, a part of layers included in the second wiring layer 40 is formed on the third surface S3. More specifically, for example, the insulation film 41 is formed as a part of the layers included in the second wiring layer 40 as depicted in FIG. 50A. Thereafter, while not depicted in the figure, a resist pattern is formed on an exposed surface of the insulation film 41 by a known lithography technology. Then, the holes 53 in which the second conductors 52 are to be embedded are formed from the third surface S3 side by a known etching technology.

The insulation layer 50-2 is used as an etching stop layer during formation of the holes 53. The holes 53 are formed by etching the semiconductor layer 50-3 from the third surface S3 side until the etching reaches the insulation layer 50-2. If any part of the insulation layer 50-2 is etched, this etched part is only a small portion. More specifically, the holes 53 are etched until the holes 53 located at different positions in the wafer surface reach the insulation layer 50-2. In such a manner, the bottoms of a plurality of holes 53 have the same depth position in the thickness direction of the semiconductor layer 50-3. In other words, the depth positions of the bottoms of the plurality of holes 53 are equalized.

Figure 50B:
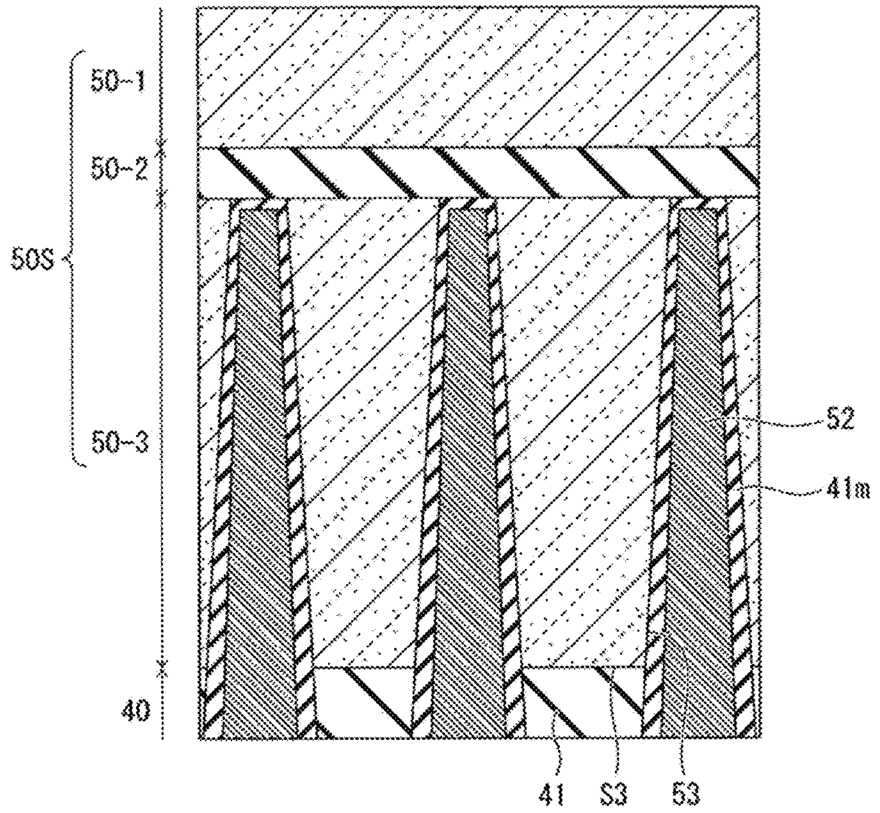

Subsequently, as depicted in FIG. 50B, the insulation film 41*m* and a material constituting the second conductors 52 are laminated in this order from the third surface S3 side, and an unnecessary part is removed to form the second conductors 52. Thereafter, steps similar to the steps depicted in FIGS. 5E and 5F of the first embodiment are performed.

Figure 50C:
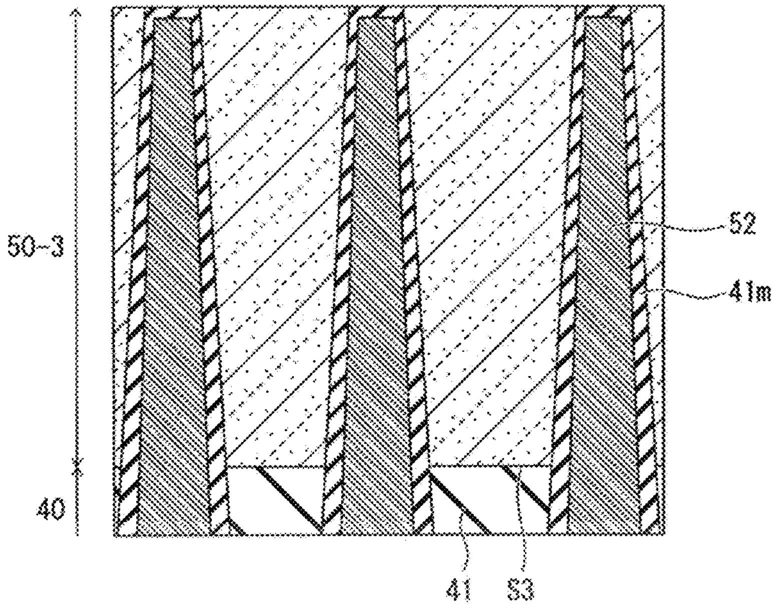

Next, as depicted in FIG. 50C, the base substrate 50-1 and the insulation layer 50-2 are ground and removed with use of CMP. An exposed surface of the semiconductor layer 50-3 obtained after removal of the base substrate 50-1 and the insulation layer 50-2 is a flattened surface.

Figure 50D:
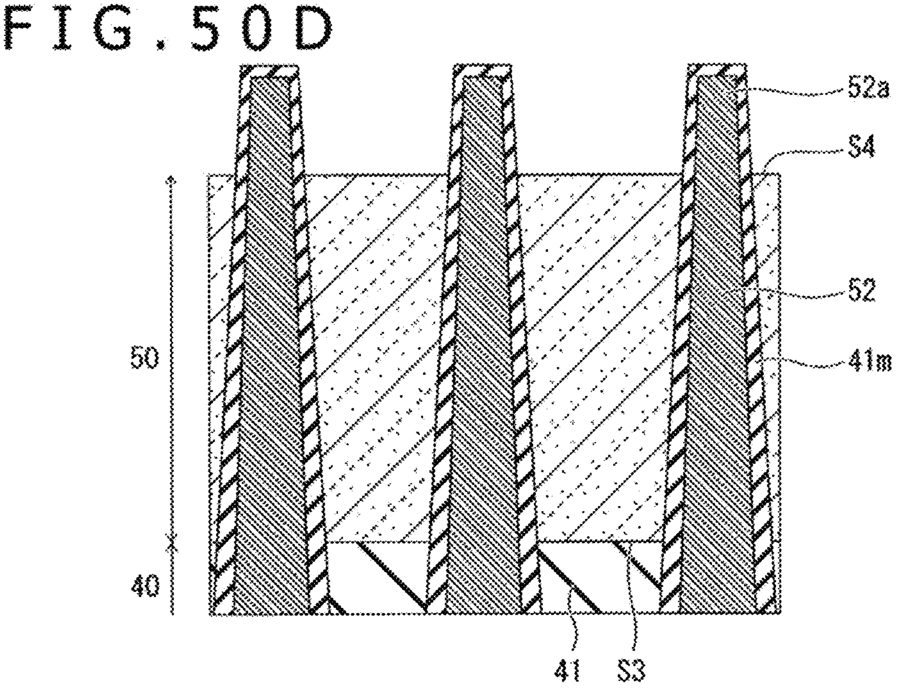

Subsequently, as depicted in FIG. 50D, a part of the semiconductor layer 50-3 is selectively etched by known dry etching. In such a manner, a part that is included in the semiconductor layer 50-3 and constitutes the second semiconductor layer 50 is left. Thereafter, ends of the second conductors 52 embedded in the holes 53 and covered by the insulation film 41*m* are protruded by this step, and a part of the protruded ends enters a state of being projected from the fourth surface S4 of the second semiconductor layer 50. Moreover, the depth positions of the bottoms of a plurality of holes 53 are equalized to the same depth position. Accordingly, the protruded ends 52*a* of a plurality of second conductors 52 have the same height position in the penetration direction. In other words, the height positions of the ends 52*a* of the plurality of second conductors 52 are equalized.

Figure 50E:
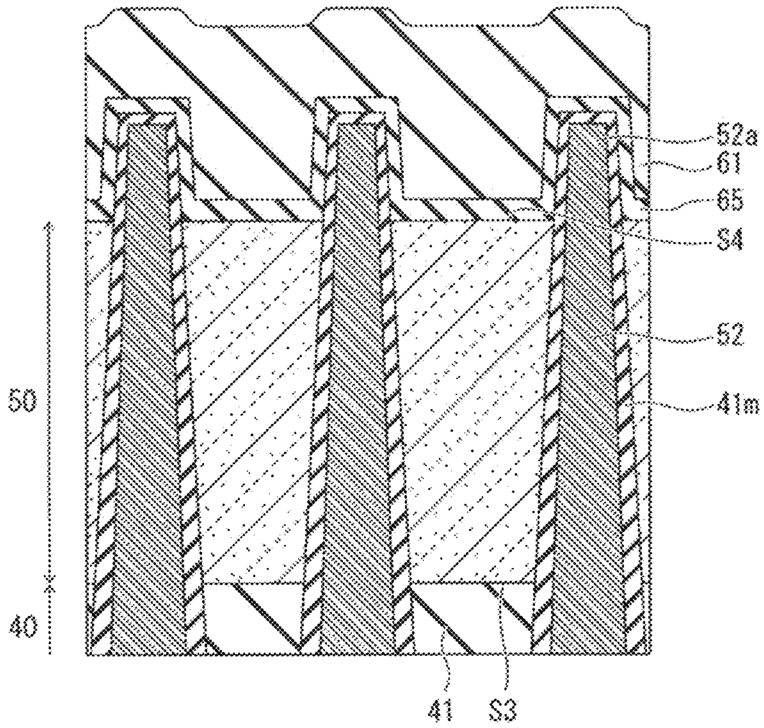

Subsequently, as depicted in FIG. 50E, the silicon cover film 65 and the insulation film 61 are laminated in this order on the fourth surface S4 in such a manner as to cover the ends 52*a*. Examples adoptable as high melting point oxide constituting the silicon cover film 65 include metallic oxide, aluminum oxide ($Al_2O_3$), hafnium oxide ($HfO_2$), and tantalum oxide ($Ta_2O_5$). Because the height positions of the ends 52*a* of the plurality of second conductors 52 are equalized, the silicon cover film 65 and the insulation film 61 are allowed to be equally laminated.

Figure 50F:
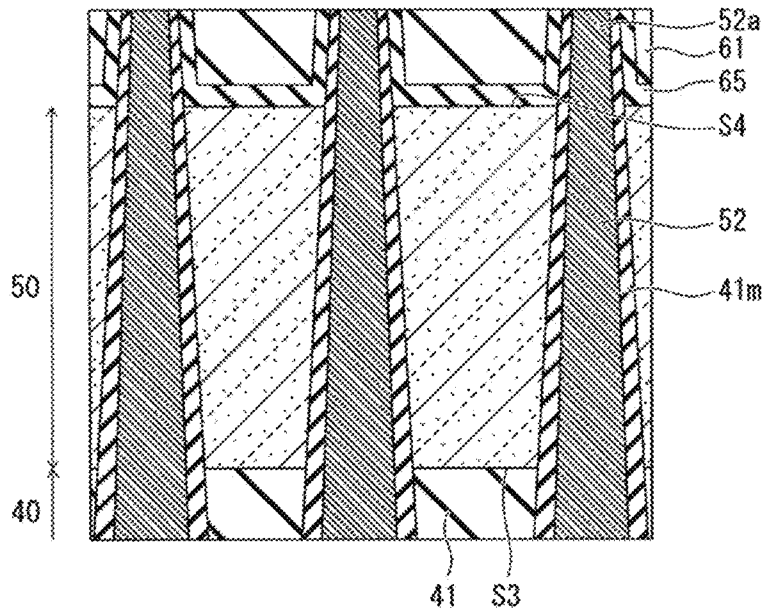

Subsequently, as depicted in FIG. 50F, a wafer side where the silicon cover film 65 and the insulation film 61 are laminated is ground and flattened by CMP, and the ends 52*a* of the second conductors 52 are exposed. At this time, the portion mainly ground is the insulation film. Accordingly, grinding conditions of CMP are set according to the insulation film. In addition, the insulation film 41*m* covering end surfaces of the ends 52*a* is also ground and removed by this grinding. As described above, the height positions of the plurality of ends 52*a* are equalized. In this case, considerable variations in grinding timing of the insulation film 41*m* covering end surfaces of the ends 52*a* between the plurality of second conductors 52 can be reduced at the time of grinding by CMP. Accordingly, an increase in unevenness of the surfaces ground by CMP can be reduced.

Figure 50G:
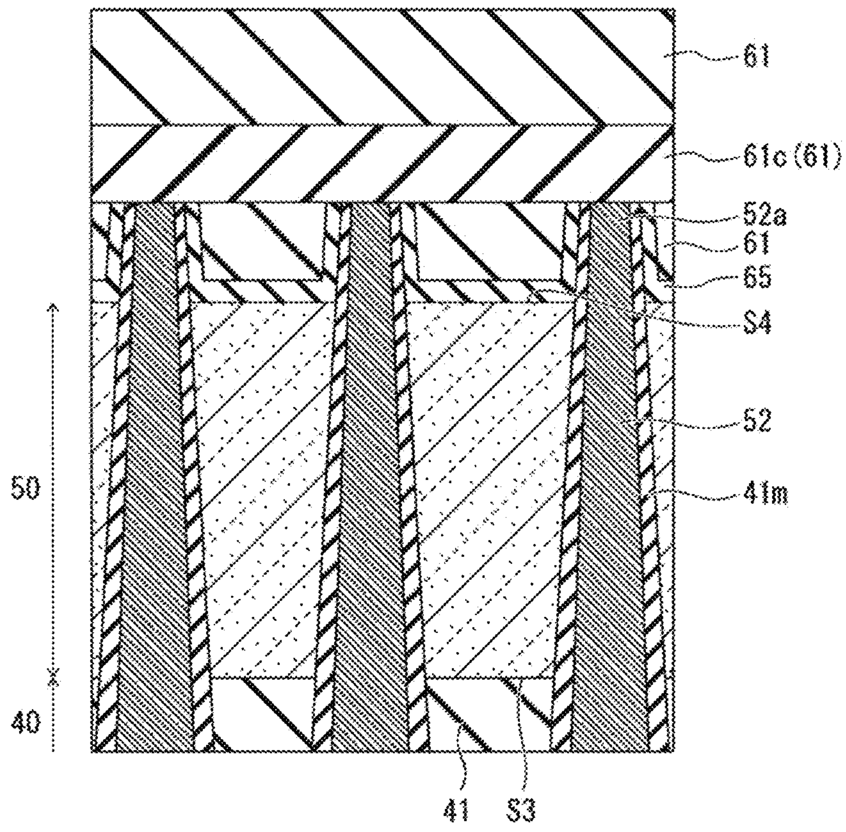

Subsequently, as depicted in FIG. 50G, an insulation film 61*c* and the insulation film 61 are laminated in this order on an exposed surface on the fourth surface S4 side. The insulation film 61*c* is a silicon carbonitride (SiCN) film. Each of the insulation film 61*c* and the insulation film 61 will simply be referred to as the insulation film 61 in a case where no distinction is necessary between these films.

Figure 50H:
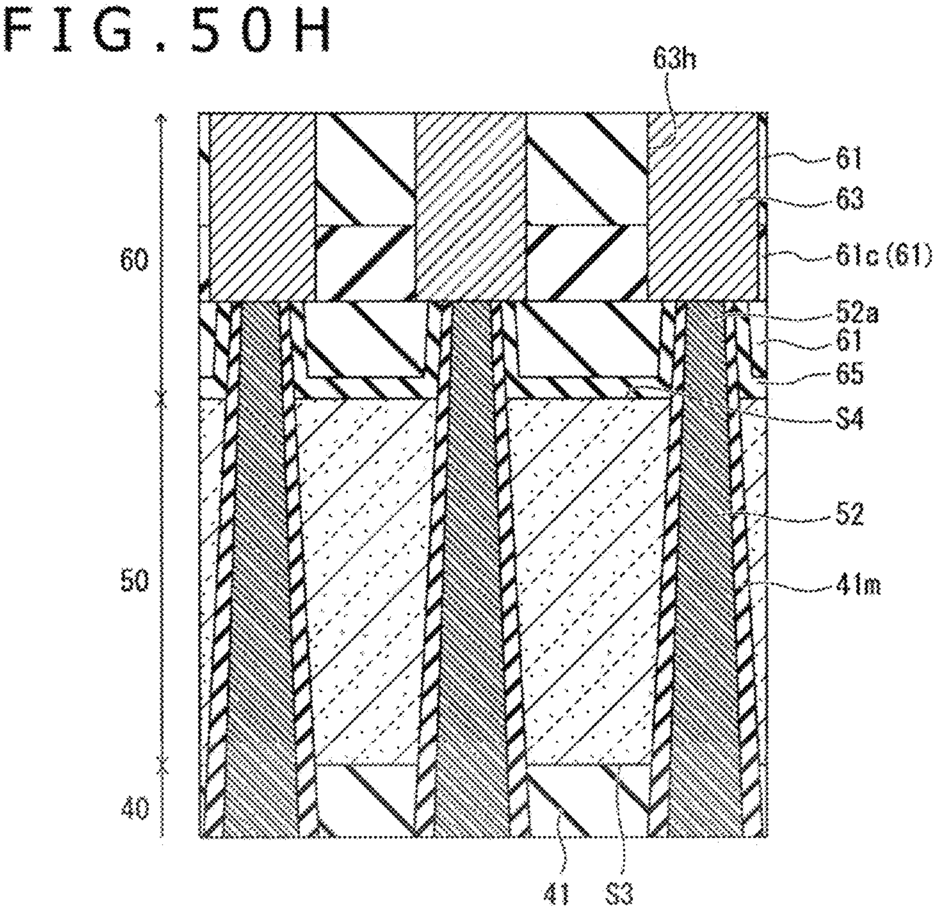

Subsequently, as depicted in FIG. 50H, the holes 63*h* extending to the second conductors 52 are formed on a flattened exposed surface from the insulation film 61 side by a known lithography technology and a known etching technology. Thereafter, the material constituting the third connection pads 63 is laminated by plating in such a manner as to fill interiors of the holes 63*h*. Then, an unnecessary portion is removed by CMP, and the exposed surface is flattened. In such a manner, the third connection pads 63 are produced. In addition, this flattened surface corresponds to a junction surface with the fourth wiring layer 70. In this case, an increase in unevenness of the exposed surface before formation of the holes 63*h* is reduced. Accordingly, an increase in unevenness of the junction surface with the fourth wiring layer 70 produced after formation of the third connection pads 63 can also be reduced.

Subsequently, while not depicted in the figure, the junction surface of the third wiring layer 60 and the third semiconductor layer 80 as a separately prepared layer on which the fourth wiring layer 70 is laminated are joined to each other.

<<Main Advantageous Effects of Sixth Embodiment>>

Main advantageous effects of the sixth embodiment will hereinafter be described. Before the description of these effects, a manufacturing method of the plurality of second conductors included in a conventional optical detection device depicted in FIGS. 51A to 51C will be touched upon.

For forming the second conductors 52, the holes 53 as deep holes need to be formed in the second semiconductor layer 50 by dry etching. During formation of the holes 53 as deep holes, a change in depth may be produced in the wafer surface. In a case where such a change is produced, the height positions of the protruded second conductors 52 may also change as depicted in FIG. 51A. Subsequently, after the insulation film 61 is laminated on the protruded second conductors 52, the insulation film is ground and flattened by CMP. Under a grinding condition for the insulation film 61, metal constituting the second conductors 52 is difficult to grind. In this case, the change of the height positions of the protruded second conductors 52 may be difficult to cancel by flattening using CMP. Accordingly, the change of the height positions of the second conductors 52 continues even in the following steps. In addition, as depicted in FIG. 51B, the heights of the third connection pads 63 also change, and hence, unevenness may also be produced in the junction surface to which the third connection pads 63 are exposed, according to the change of the height positions of the second conductors 52. When such a junction surface is subsequently connected to the fourth wiring layer 70, a void V may be produced depending on the size of the unevenness as depicted in FIG. 51C. In this case, an electric circuit may be opened, and hence, a yield may be lowered.

Meanwhile, according to the optical detection device 1 in the sixth embodiment of the present technology, the insulation layer 50-2 of the SOI substrate 50S is used as an etching stop layer during formation of the holes 53 from the third surface S3 side by etching. In this case, the depth positions of the bottoms of a plurality of holes 53 in the thickness direction of the semiconductor layer 50-3 are equalized to the same depth position. Accordingly, the height positions of the protruded ends 52*a* of a plurality of second conductors 52 from the fourth surface S4 of the second semiconductor layer 50 are equalized to the same height position in the penetration direction, and an increase in unevenness of the exposed surface can be reduced even after the subsequent CMP step. In addition, deterioration of the flatness of the exposed surface can be reduced in the following steps. Accordingly, an increase in unevenness of the junction surface obtained after formation of the third connection pads 63 and joined to the fourth wiring layer 70 can also be reduced. In such a manner, generation of the void V can be restrained, and hence, an opened state of the electric circuit can also be restrained. In addition, lowering of a yield can be reduced.

<<Modification of Sixth Embodiment>>

Hereinafter described will be a modification of the sixth embodiment.

<Modification 1>

As depicted in FIG. 52, the optical detection device 1 according to modification 1 of the sixth embodiment includes the insulation layer 50-2 of the SOI substrate 50S, and the ends 52*a* on the fourth surface S4 side of the second conductors 52 penetrate the insulation layer 50-2.

A manufacturing method of the optical detection device 1 according to modification 1 of the sixth embodiment will hereinafter be described with reference to FIGS. 53A to 53D. Note that only a part different from the steps described in the sixth embodiment will be described here.

First, the same step as the step of the sixth embodiment depicted in FIG. 50A is carried out to etch the holes 53 until reaching the insulation layer 50-2. More specifically, the holes 53 are etched until the holes 53 located at different positions in the wafer surface reach the insulation layer 50-2. Subsequently, as depicted in FIG. 53A, the insulation layer 50-2 is etched under a different etching condition to form the holes 53 penetrating the insulation layer 50-2, in addition to the semiconductor layer 50. The etching for the insulation layer 50-2 is started after equalizing the etching for forming the holes 53 at different positions in the wafer surface with use of the insulation layer 50-2. Accordingly, considerable variations in the etching start timing for the insulation layer 50-2 can be reduced between the plurality of second conductors 52. In such a manner, the bottoms of a plurality of holes 53 have the same depth position in the thickness direction of the semiconductor layer 50-3. In other words, the depth positions of the bottoms of the plurality of holes 53 are equalized.

Next, as depicted in FIG. 53B, the insulation film 41*m* and the material constituting the second conductors 52 are laminated in this order from the third surface S3 side, and an unnecessary part is removed to form the second conductors 52. Moreover, the depth positions of the bottoms of a plurality of holes 53 are equalized to the same depth position in the plurality of holes 53. Accordingly, the protruded ends 52*a* of a plurality of second conductors 52 have the same height position in the penetration direction. In other words, the height positions of the ends 52*a* of the plurality of second conductors 52 are equalized.

Subsequently, as depicted in FIG. 53C, the base substrate 50-1 is removed. First, the base substrate 50-1 is ground by CMP to be reduce in thickness by a certain amount. Thereafter, the base substrate 50-1 is selectively etched by known dry etching. As a result, the second conductors 52 covered by the insulation film 41*m* and the insulation layer 50-2 both enter an exposed state. In addition, according to modification 1, the semiconductor layer 50-3 corresponds to the second semiconductor layer 50, while the fourth surface S4 of the second semiconductor layer 50 corresponds to the insulation layer 50-2 side surface of the semiconductor layer 50-3.

Then, as depicted in FIG. 53D, the insulation film 61*c* and the insulation film 61 are laminated in this order on the fourth surface S4 in such a manner as to cover the ends 52*a* of the second conductors 52. Thereafter, as in the step of the sixth embodiment depicted in FIG. 50H, the holes 63*h* extending to the second conductors 52 are formed, and the third connection pads 63 embedded in the holes 63*h* are formed.

Advantageous effects similar to those of the optical detection device 1 of the sixth embodiment described above can be offered by the optical detection device 1 according to modification 1 of the sixth embodiment described here. Moreover, according to the optical detection device 1 in modification 1 of the sixth embodiment, the insulation layer 50-2 is left. Accordingly, the number of manufacturing steps is smaller than that number of the sixth embodiment. More specifically, the necessity of executing the CMP step for removing the insulation layer 50-2 is eliminated. Further, the insulation layer 50-2 is used as the silicon cover film 65. Accordingly, the necessity of executing the step for laminating the silicon cover film 65 is eliminated. Besides, the necessity of executing the step for laminating the insulation film 61 on the silicon cover film 65 and executing the CMP step for the laminated insulation film 61 is eliminated.

Seventh Embodiment

Hereinafter described will be the seventh embodiment of the present technology depicted in FIG. 54. The optical detection device 1 according to the present seventh embodiment is different from the optical detection device 1 according to the first embodiment described above in that a protection insulation film 68 is provided. Other configurations of the optical detection device 1 are basically similar to the corresponding configurations of the optical detection device 1 according to the first embodiment described above. Note that the constituent elements already described will be given the same reference signs, and will not be repeatedly explained.

<<Configuration of Optical Detection Device>>

The configuration of the optical detection device 1 according to the seventh embodiment of the present technology will hereinafter be described while focus is placed on a part different from the configuration of the optical detection device 1 according to the first embodiment described above. Note that scales of constituent elements depicted in some of the figures associated with the present seventh embodiment are different from scales of the same constituent elements in the other figures describing the seventh embodiment. Moreover, the barrier metal layer is not depicted in some of the figures explaining the present seventh embodiment.

<Third Wiring Layer>

As depicted in FIG. 54, the third wiring layer 60 includes the insulation film 61, the third connection pad 63, the silicon cover film 65, and the protection insulation film 68. The thickness direction of the third wiring layer 60 corresponds to the Z-direction.

The third connection pad 63 is laminated via the insulation film 61, and faces the surface of the third wiring layer 60 on the side opposite to the second semiconductor layer 50 side. The third connection pad 63 is a conductor, and includes a conductive material. The third connection pad 63 may include copper, for example, and formed by damascene processing. However, this configuration is not required to be adopted.

The silicon cover film 65 is laminated in such a manner as to cover the fourth surface S4 of the second semiconductor layer 50. The insulation film 61, the protection insulation film 68, and the insulation film 61 are laminated in this order on the surface of the silicon cover film 65 on the side opposite to the fourth surface S4 side.

The protection insulation film 68 is laminated on the fourth surface S4 side of the second semiconductor layer 50 via the insulation film 61. More specifically, the protection insulation film 68 is laminated on the fourth surface S4 side of the second semiconductor layer 50 via the silicon cover film 65 and the insulation film 61. Note that a portion included in the insulation film 61 and laminated between the protection insulation film 68 and the silicon cover film 65 may also sometimes be referred to as a first insulation film 61*d* for distinction from other portions. The first insulation film 61*d* is a part of the insulation film 61, and is overlapped with the second semiconductor layer 50 side surface of the protection insulation film 68. The protection insulation film 68 is not in contact with the third connection pad 63 to which the second conductor 52 is connected.

Moreover, as depicted in FIG. 55C, the protection insulation film 68 is so provided as to surround the second conductor 52 in the planar view. In addition, as depicted in FIGS. 54 and 55C, the protection insulation film 68 is not in contact with the second conductor 52.

The protection insulation film 68 includes a material which has a lower grinding speed for chemical mechanical polishing (CMP) under a selected condition than the material constituting the first insulation film 61*d*. Moreover, the protection insulation film 68 includes a material which has a lower grinding speed for chemical mechanical polishing under a selected condition than the material constituting the second conductor 52.

For example, the material constituting the first insulation film 61*d* is silicon oxide, but is not limited to this example. Moreover, for example, the material constituting the second conductor 52 is tungsten, but is not limited to this example. In addition, for example, the material constituting the protection insulation film 68 is silicon nitride or silicon carbonitride. The present embodiment will be described on an assumption that the protection insulation film 68 includes silicon nitride.

The end 52*a* on the fourth surface S4 side of the second conductor 52 extends in a direction away from the fourth surface S4, and is connected to the third connection pad 63 at a position not exceeding a lamination position of the protection insulation film 68. The lamination position of the protection insulation film 68 is a lamination position of the protection insulation film 68 in the third wiring layer 60, and corresponds to a lamination position in the direction away from the fourth surface S4. More specifically, the lamination position of the protection insulation film 68 is a lamination position of the surface of the protection insulation film 68 on the side opposite to the fourth surface S4 side. According to the example depicted in FIG. 54, the end 52*a* of the second conductor 52 is connected to the third connection pad 63 at the lamination position of the surface of the protection insulation film 68 on the side opposite to the fourth surface S4 side.

<<Manufacturing Method of Optical Detection Device>>

A manufacturing method of the optical detection device 1 will hereinafter be described with reference to FIGS. 55A to 55F. A manufacturing method of the second conductors 52 will mainly be explained here. First, in the state where each of the second conductors 52 is projected from the fourth surface S4 of the second semiconductor layer 50 as depicted in FIG. 5H of the first embodiment, the silicon cover film 65, the first insulation film 61*d*, and the protection insulation film 68 are laminated in this order on the fourth surface S4 as depicted in FIG. 55A. In the state where the second conductor 52 is projected from the fourth surface S4, portions included in the first insulation film 61*d* and the protection insulation film 68 and laminated in such a manner as to cover the end 52*a* of the second conductor 52 are projected more than the other portions.

Thereafter, in the state depicted in FIG. 55A, an exposed surface of a wafer on the protection insulation film 68 side is ground by chemical mechanical polishing under a selected condition. More specifically, in the pair of the protection insulation film 68 and the first insulation film 61*d*, the first insulation film 61*d* is selectively ground by chemical mechanical polishing under the selected condition. Note that pressure is applied to a portion included in the protection insulation film 68 and overlapping with the end 52*a* in the thickness direction (i.e., an upper end of a protruded portion). Accordingly, grinding is achievable in this state. After the upper end of the protection insulation film 68 is ground, grinding of the first insulation film 61*d* is initiated. In this case, a portion projected more than the other portion in the first insulation film 61*d* is ground.

In addition, the grinding is carried out until completion of exposure of the end 52*a* and flattening of the exposed surface as depicted in FIG. 55B. Accordingly, during grinding of the portion included in the first insulation film 61*d* and more projected than the other portion, if any part of the not-projected portion of the protection insulation film 68 is ground, this ground part is only a small portion. Accordingly, the protection insulation film 68 functions as a stop layer for grinding. The protection insulation film 68 functioning as a stop layer for grinding can reduce grinding of the first insulation film 61*d* overlapped with the fourth surface S4 side surface of the protection insulation film 68. Moreover, this reduction of grinding of the first insulation film 61*d* reduces grinding of the silicon cover film 65 located closer to the fourth surface S4 than the first insulation film 61*d*. Furthermore, FIG. 55C is a plan diagram of FIG. 55B as a planar view from the protection insulation film 68 side. As depicted in FIG. 55C, the protection insulation film 68 is left in such a shape as to surround the end 52*a* of the second conductor 52.

Note that the end 52*a* can be more reliably exposed by setting the lamination position of the protection insulation film 68 to a height equal to or lower than the end 52*a* of the second conductor 52 before grinding, and more preferably to a height lower than the end 52*a* of the second conductor 52 before grinding. The lamination position of the protection insulation film 68 can be defined by adjusting the film thickness of the first insulation film 61*d*.

Moreover, a plurality of second conductors 52 are included in the optical detection device 1, and a plurality of optical detection devices 1 are provided in the wafer. In other words, the second conductors 52 are provided at different positions in the wafer surface. The protection insulation film 68 is laminated for the second conductors 52 provided at the different positions in the wafer surface. For example, the protection insulation film 68 is laminated for the entire wafer surface. Grinding is carried out until completion of exposure of the ends 52*a* and flattening of the exposed surfaces at the different positions in the wafer surface. Even if high-speed grinding portions and low-speed grinding portions exist at the different positions in the wafer surface, the protection insulation film 68 functioning as a stop layer for grinding can reduce local exposure of the first insulation film 61*d* and the silicon cover film 65 overlapped with the fourth surface S4 side surface of the protection insulation film 68. It is further preferable to define the lamination position of the protection insulation film 68 for the second conductor 52 less projected in the wafer surface, to expose the plurality of second conductors 52 provided at the different positions in the wafer surface.

Next, as depicted in FIG. 55D, the insulation film 61 is laminated on the flattened exposed surface. Note that a part of the hole 51*h* is not depicted in a depth direction in FIG. 55D. Thereafter, as depicted in FIG. 55E, the hole 63*h* for forming the third connection pad 63 and the hole 51*h* for forming the first conductor 51 are sequentially formed. The hole 63*h* is formed such that the bottom of the hole 63*h* reaches the second conductor 52.

Subsequently, as depicted in FIG. 55F, a barrier metal layer is laminated for the hole 63*h* and the hole 51*h*, a material constituting the third connection pad 63 and the first conductor 51 is embedded, and an unnecessary part is removed by CMP to produce the third connection pad 63 and the first conductor 51. For example, the material constituting the third connection pad 63 and the first conductor 51 is copper, but is not limited to this example. This material is deposited within the hole 63*h* and the hole 51*h* by plating. In such a manner, the third wiring layer 60 is substantially completed. The manufacturing method after this step has already been described, and hence is not repeatedly explained.

<<Main Advantageous Effects of Seventh Embodiment>>

Main advantageous effects of the seventh embodiment will hereinafter be described. Before the description of these effects, a conventional example will be touched upon. A plurality of second conductors 52 are included in the optical detection device 1, and a plurality of optical detection devices 1 are provided in a wafer. In other words, a plurality of second conductors 52 are provided in the wafer surface. Each of the second conductors 52 enters a state of being projected from the fourth surface S4 in the middle of the manufacturing step as depicted in FIG. 55A, for example. These projections of the second conductors 52 are not uniform for all the second conductors 52, and are variable in the wafer surface. Accordingly, in the step of chemical mechanical polishing depicted in FIG. 55B, a grinding quantity considering the variations of the projections of the second conductors 52 is set in the step of chemical mechanical polishing depicted in FIG. 55B. However, the entire grinding quantity increases when exposure of the second conductor 52 less projected is attempted. In this case, variations in the grinding quantity in the wafer surface may increase according to the increase in the entire grinding quantity. For example, dishing may be caused in the wafer surface. Moreover, excessive grinding may be locally caused in the wafer surface. Furthermore, even the silicon cover film 65 may be locally ground.

Meanwhile, the optical detection device 1 according to the seventh embodiment of the present technology includes the protection insulation film 68 which includes a material having a lower grinding speed of chemical mechanical polishing under a selected condition than the material constituting the first insulation film 61*d* and the material constituting the second conductors 52. In this case, the protection insulation film 68 is difficult to grind and functions as a stop layer for grinding. Accordingly, large-scale grinding of the first insulation film 61*d* and the second conductors 52 can be reduced. Moreover, this reduction of large-scale grinding of the first insulation film 61*d* reduces grinding of the silicon cover film 65.

Further, according to the optical detection device 1 of the seventh embodiment of the present technology, the protection insulation film 68 is laminated for the second conductors 52 provided at the different positions in the wafer surface. For example, the protection insulation film 68 is laminated on the entire wafer surface. In this case, the protection insulation film 68 functions as a stop layer for grinding in the wafer surface. Accordingly, even in a case where the entire grinding quantity is increased to expose the second conductor 52 less projected in the wafer surface, excessive grinding of the second conductor 52 previously exposed and the first insulation film 61*d* around the exposed second conductor 52 can be reduced. In such a manner, excessive grinding locally caused in the wafer surface can be reduced. As a result, local grinding reaching the silicon cover film 65 can be reduced.

Note that the optical detection device 1 according to the seventh embodiment described above may include the wire 62 which is a conductor, and the second conductor 52 may be connected to the wire 62.

Moreover, according to the optical detection device 1 of the seventh embodiment described above, the end 52*a* of the second conductor 52 is connected to the third connection pad 63 at the lamination position of the surface of the protection insulation film 68 on the side opposite to the fourth surface S4 side as depicted in FIGS. 54 and 55F. However, the end 52*a* may be connected to the third connection pad 63 at a position closer to the second semiconductor layer 50 than this lamination position of the opposite surface. For example, in a case where over-etching is performed at the time of formation of the hole 63*h* depicted in FIG. 55E, the end 52*a* of the second conductor 52 is connected to the third connection pad 63 at a position closer to the third connection pad 63 than the connection position in the case depicted in FIGS. 54 and 55F. However, this configuration is not required to be adopted.

Note that the protection insulation film 68 may be a block film including silicon carbonitride. The block film refers to a film for improving controllability during formation of holes in which wires and the like are embedded.

<<Modifications of Seventh Embodiment>

Hereinafter described will be modifications of the seventh embodiment.

<Modification 1>

According to the seventh embodiment, the protection insulation film 68 is not in contact with the third connection pad 63 to which the second conductor 52 is connected. However, according to the optical detection device 1 in modification 1 of the seventh embodiment, the protection insulation film 68 is in contact with the third connection pad 63 to which the second conductor 52 is connected, as depicted in FIG. 56. Moreover, according to the optical detection device 1 of the seventh embodiment described above, the end 52*a* of the second conductor 52 is connected to the third connection pad 63 at the lamination position of the surface of the protection insulation film 68 on the side opposite to the fourth surface S4 side. However, according to the optical detection device 1 in modification 1 of the seventh embodiment, the end 52*a* is connected to the third connection pad 63 at a position closer to the second semiconductor layer 50 than this lamination position of the opposite surface.

A manufacturing method of the optical detection device 1 according to modification 1 of the seventh embodiment will hereinafter be described with reference to FIGS. 57A to 57D. Note that only a part different from the steps described above in the seventh embodiment will be described here.

First, as depicted in FIG. 57A, lamination is completed up to the protection insulation film 68. Subsequently, a resist pattern R4 is formed in such a manner as to fill a recess. Thereafter, the entire surface is etched back, and then the resist pattern R4 is removed. This etching back removes a portion included in the protection insulation film 68 and overlapping with the end 52*a* in the thickness direction (i.e., an upper end of a protrusion), as depicted in FIG. 57B.

Subsequently, chemical mechanical polishing is performed as in the case of the seventh embodiment to produce a state depicted in FIG. 57C. According to modification 1 here, the upper end of the protrusion of the protection insulation film 68 is removed beforehand. In this case, grinding speed for the protrusion is higher than that speed in the seventh embodiment. Accordingly, a larger volume of an exposed portion of the second conductor 52 is ground than in the case of the seventh embodiment, and thus, a dished state is produced.

Thereafter, as depicted in FIG. 57D, the insulation film 61 is laminated on a flattened exposed surface, and the hole 63*h* for forming the third connection pad 63 and the hole 51*h* for forming the first conductor 51 are sequentially formed. The hole 63*h* is formed such that the bottom of the hole 63*h* reaches the second conductor 52. Moreover, a width of the hole 63*h* in the horizontal direction (the direction perpendicular to the lamination direction (Z-direction)) has the same size as the size of an opening of the protection insulation film 68. Accordingly, the third connection pad 63 embedded in the hole 63*h* comes into contact with the protection insulation film 68. Moreover, the bottom of the hole 63*h* is located closer to the second semiconductor layer 50 than in the case of the seventh embodiment. Accordingly, the end 52*a* of the second conductor 52 is connected to the third connection pad 63 at a position closer to the second semiconductor layer 50 than the lamination position of the surface of the protection insulation film 68 on the side opposite to the fourth surface S4 side. Steps following this step are similar to the corresponding steps in the seventh embodiment, and hence, are not repeatedly explained.

Advantageous effects similar to those of the optical detection device 1 of the seventh embodiment described above can be offered by the optical detection device 1 according to modification 1 of the seventh embodiment described here.

<Modification 2>

According to modification 1 of the seventh embodiment, the protection insulation film 68 is in contact with the third connection pad 63 to which the second conductor 52 is connected. However, according to the optical detection device 1 in modification 2 of the seventh embodiment, the protection insulation film 68 is not in contact with the third connection pad 63 to which the second conductor 52 is connected, as depicted in FIG. 58.

A manufacturing method of the optical detection device 1 according to modification 2 of the seventh embodiment will hereinafter be described with reference to FIGS. 59A to 59D. Note that only a part different from the steps described above in modification 1 of the seventh embodiment will be described here.

First, as depicted in FIG. 59A, lamination is completed up to the protection insulation film 68. Subsequently, a resist pattern R5 is formed in such a manner as to fill a recess. Note here that the resist pattern R5 is formed around a protrusion with a space left between the resist pattern R5 and the protrusion. Thereafter, the entire surface is etched back, and then the resist pattern R5 is removed. This etching back removes a portion included in the protection insulation film 68 and overlapping with the end 52*a* in the thickness direction (i.e., un upper end of the protrusion), and a portion included in the recess and not covered by the resist pattern R5, as depicted in FIG. 59B.

Subsequently, chemical mechanical polishing is performed to produce a state depicted in FIG. 59C. According to modification 2 described here, the opening of the protection insulation film 68 is larger than that opening in modification 1. Moreover, as in modification 1, a larger volume of an exposed portion of the second conductor 52 is ground than in the case of the seventh embodiment, and a dished state is produced.

Thereafter, as depicted in FIG. 59D, the insulation film 61 is laminated on a flattened exposed surface, and the hole 63*h* for forming the third connection pad 63 and the hole 51*h* for forming the first conductor 51 are sequentially formed. The width of the hole 63*h* in the horizontal direction (the direction perpendicular to the lamination direction) is the same as the corresponding size in the second embodiment, while the opening of the protection insulation film 68 is larger than the corresponding opening in the second embodiment. In this case, the hole 63*h* is not in contact with the opening of the protection insulation film 68. Accordingly, the third connection pad 63 embedded in the hole 63*h* is not in contact with the protection insulation film 68. Steps following this step are similar to the corresponding steps in the seventh embodiment, and hence, are not repeatedly explained.

Advantageous effects similar to those of the optical detection device 1 of the seventh embodiment described above can be offered by the optical detection device 1 according to modification 2 of the seventh embodiment described here.

Eighth Embodiment

Hereinafter described will be the eighth embodiment of the present technology depicted in FIG. 60. The optical detection device 1 according to the present eighth embodiment is different from the optical detection device 1 according to the first embodiment described above in that a third conductor 57 is provided. Other configurations of the optical detection device 1 are basically similar to the corresponding configurations of the optical detection device 1 according to the first embodiment described above. Note that the constituent elements already described will be given the same reference signs, and will not be repeatedly explained.

<<Configuration of Optical Detection Device>>

The configuration of the optical detection device 1 according to the eighth embodiment of the present technology will hereinafter be described while focus is placed on a part different from the configuration of the optical detection device 1 according to the first embodiment associated with the present eighth embodiment are different from scales of the same constituent elements in the other figures describing the eighth embodiment. In addition, the figures explaining the present eighth embodiment and the description thereof do not depict an insulation film provided between the third conductor 57 and the second semiconductor layer 50 and an insulation film provided between the second conductor 52 and the second semiconductor layer 50. Moreover, the barrier metal layer is not depicted in the figures explaining the present eighth embodiment.

<Outline>

An outline of the eighth embodiment will first be described. Typically, when a through conductor that penetrates a semiconductor layer in a thickness direction is formed, the semiconductor layer located around this through conductor is attracted toward the through conductor. In other words, stress is produced in the semiconductor layer around the through conductor. In addition, the stress produced in the semiconductor layer located around the through conductor may affect characteristics of a transistor. Accordingly, some design arranges the transistor at a position away from the through conductor by a fixed distance.

Described here will be the second conductor 52 depicted in FIG. 61A as an example of a through conductor that penetrates a semiconductor layer. An arrow CH indicates a channel direction. The channel direction indicates a direction where a signal charge flows in a transistor provided in a semiconductor layer. The eighth embodiment will be described on an assumption that the channel direction is a direction parallel with the X-direction for convenience of explanation. In addition, an exposed surface (sheet surface) of the semiconductor layer is (100) surface.

If transistors are formed, regions affecting performance of the transistors, more specifically, regions where an amount of signal charge flowing in the channel increases, and regions where an amount of signal charge flowing in the channel decreases are generated in the semiconductor layer around the second conductor 52 by the stress described above. Concerning these regions, FIG. 61A indicates regions K1 and K2, each representing a region where an unignorable amount of the signal charge flowing in the channel is affected. The regions K1 are regions where the amount of signal charge flowing in the channel increases if transistors are formed, and are generated on both sides of the second conductor 52. More specifically, the regions K1 are generated in a direction (Y-direction) perpendicular to the channel direction with the second conductor 52 interposed between the regions K1. On the other hand, the regions K2 are regions where the amount of signal charge flowing in the channel decreases if transistors are formed, and are generated on both sides of the second conductor 52. More specifically, the regions K2 are generated in a direction (X-direction) parallel to the channel direction with the second conductor 52 interposed between the regions K2. The direction of generation of the regions K1 where the amount of signal charge increases and the direction of generation of the regions K2 where the amount of signal charge decreases are dependent on the channel direction. Note that the two regions K1 and the two regions K2 are generated for the one through conductor (second conductor 52). Accordingly, the regions K1 will also be referred to as regions K1*a* and K1*b*, and the regions K2 will also be referred to as K2*a* and K2*b* for distinction between the respective regions. Moreover, an enclosing circle surrounding the regions K1 and the regions K2 described here will be referred to as a keep-out zone KOZ (Keep Out Zone).

When the regions K1 and the regions K2 described above are present, a limitation may be imposed on arrangement of transistors. Accordingly, as depicted in FIG. 61B, the optical detection device 1 according to the eighth embodiment includes the third conductor 57 provided separately from the second conductor 52 and arranged such that the second conductor 52 and the keep-out zone KOZ overlap with each other in an oblique direction forming 45 degrees to the channel direction. The third conductor 57 includes the same material as the material of the second conductor 52, and has the same diameter as the diameter of the second conductor 52. The regions K1 and the regions K2 of the third conductor 57 thus configured have the same sizes as the sizes of the regions K1 and the regions K2 of the second conductor 52 in an ideal sense. In addition, the third conductor 57 is arranged side by side with the second conductor 52 in the direction forming 45 degrees to the channel direction. In the state where the third conductor 57 is disposed in this arrangement, the region K1*b* of the third conductor 57 can precisely overlap with the region K2*a* of the second conductor 52, and the region K2*b* of the third conductor 57 can precisely overlap with the region K1*a* of the second conductor 52 in an ideal sense. Accordingly, as depicted in FIG. 61C, an increase and decrease in signal charge can cancel each other out in an ideal sense in the area where the region K1*a* of the second conductor 52 and the region K2*b* of the third conductor 57 overlap with each other. Similarly, an increase and decrease in signal charge can cancel each other out in an ideal sense in the area where the region K2*a* of the second conductor 52 and the region K1*b* of the third conductor 57 overlap with each other. In such a manner, the increase and decrease in signal charge can be cancelled out by overlapping the regions having the same size and an opposite change of the increase and decrease in signal charge. Moreover, even when transistors, such as the transistors T2, are arranged in the area where the increase and decrease in signal charge is cancelled out, a considerable effect on performance of the transistors is reduced.

Moreover, each of the keep-out zones KOZ present for both the second conductor 52 and the third conductor 57 can be reduced to a half size (semicircle) by arranging the second conductor 52 and the third conductor 57 in a manner depicted in FIG. 61C.

<Third Conductor>

The optical detection device 1 includes the third conductor 57. As depicted in FIG. 60, the third conductor 57 is a conductor that penetrates the semiconductor layer. More specifically, the third conductor 57 penetrates the second semiconductor layer 50, and projects into the second wiring layer 40 and the third wiring layer 60. The third conductor 57 is formed simultaneously with formation of the second conductor 52, and has the same length as the length of the second conductor 52 in an extending direction. The third conductor 57 includes the same material as the material of the second conductor 52, and has the same diameter as the diameter of the second conductor 52. For example, each of the third conductor 57 and the second conductor 52 includes tungsten, but is not limited to this example. The third conductor 57 is included in the second semiconductor layer 50 and located at a position near the second conductor 52. In addition, the third conductor 57 thus provided cancels out an increase and decrease in signal charge in the semiconductor layer around the second conductor 52. In this case, the transistor T2 is allowed to be provided closer to the second conductor 52 than in a case where the third conductor 57 is not provided. Accordingly, a limitation to layout design of the transistors T2 can be lowered. The third conductor 57 is a dummy conductor provided to cancel out an increase and decrease in signal charge in the semiconductor layer around the second conductor 52. Accordingly, the third conductor 57 may be either in a floating state or in a state connected to a reference potential.

FIG. 62 depicts an example of arrangement where the one second conductor 52 and a plurality of third conductors 57 are arrayed in a line. Note that the number of the third conductors 57 is not limited to the number depicted in FIG. 62. In addition, the third conductors 57 will also be referred to as third conductors 57-1, 57-2, 57-3, and 57-4 for distinction between a plurality of third conductors 57. Moreover, these conductors are arrayed in a direction forming 45 degrees to the channel direction, more specifically, arranged in a line in an order of the third conductor 57-1, the third conductor 57-2, the second conductor 52, the third conductor 57-3, and the third conductor 57-4. These conductors are one-dimensionally arrayed.

The third conductor 57-2 and the third conductor 57-3 are disposed on one and the other sides of the second conductor 52, respectively. Accordingly, an increase and decrease in signal charge is cancelled out in the semiconductor layer around the second conductor 52, more specifically in the semiconductor layers on both sides of the second conductor 52. More specifically, by the overlap between the regions K1 and K2 of the second conductor 52 on the upper left side of the figure and the regions K2 and K1 of the third conductor 57-2 on the lower right side of the figure, an increase and decrease of signal charge in these regions is cancelled out. In addition, by the overlap between the regions K2 and K1 of the second conductor 52 on the lower right side of the figure and the regions K1 and K2 of the third conductor 57-3 on the upper left side of the figure, an increase and decrease of signal charge in these regions is cancelled out.

Moreover, a plurality of third conductors 57 are disposed on both sides of the second conductor 52. On the upper left side of the second conductor 52 in the figure, by the overlap between the regions K1 and K2 of the third conductor 57-2 on the upper left side of the figure and the regions K2 and K1 of the third conductor 57-1 on the lower right side of the figure, an increase and decrease of signal charge in these regions is cancelled out. In addition, on the lower right side of the second conductor 52 in the figure, by the overlap between the regions K2 and K1 of the third conductor 57-3 on the lower right side of the figure and the regions K1 and K2 of the third conductor 57-4 on the upper left side of the figure, an increase and decrease of signal charge in these regions is cancelled out. In such a manner, the region where the increase and decrease of signal charge around the second conductor 52 has been cancelled out can be widened by increasing the number of the third conductors 57 to be arrayed. Furthermore, the keep-out zone KOZ can be shifted to a farther position from the second conductor 52.

<<Manufacturing Method of Optical Detection Device>>

A manufacturing method of the optical detection device 1 will hereinafter be described with reference to FIGS. 63A and 63B. A manufacturing method of the third conductors 57 and the second conductor 52 will mainly be explained here. The third conductors 57 and the second conductor 52 are formed by via middle from the third surface S3 side. First, as depicted in FIG. 63A, the transistors T2 and the like are formed on the third surface S3 side of the second semiconductor layer 50*w*, and the insulation film 41 is laminated. Thereafter, holes 57*h* for forming the third conductors 57, the hole 53 for forming the second conductor 52, and the holes 44*h* for forming the vias 44 are formed from the insulation film 41 side (third surface S3 side). The holes 57*h* are formed simultaneously with the hole 53 by the same step, and have the same depth as the depth of the hole 53.

Subsequently, as depicted in FIG. 63B, tungsten is simultaneously embedded into the holes 57*h*, the hole 53, and the holes 44*h* by the same step from the insulation film 41 side (third surface S3 side), and an unnecessary portion of the tungsten is removed by known CMP. In such a manner, the third conductors 57, the second conductor 52, and the vias 44 are produced. Note that the third conductors 57 and the second conductor 52 are projected from the surface (fourth surface S4) on the side opposite to the third surface S3 side by performing steps similar to the corresponding steps in the first embodiment. In such a manner, the third conductor 57 is formed simultaneously with the second conductor 52 by the same step, and has the same length as the length of the second conductor 52 in the extending direction. The manufacturing method after this step has already been described, and hence, is not repeatedly explained.

<<Main Advantageous Effects of Eighth Embodiment>

Main advantageous effects of the eighth embodiment will hereinafter be described. According to the optical detection device 1 of the eighth embodiment, the third conductor 57 and the second conductor 52 are arrayed in the direction forming 45 degrees to the channel direction. In this case, the regions K1 and K2 of the third conductor 57 overlap with the regions K2 and K1 of the second conductor 52, and thus, an increase and decrease in signal charge in these reasons can be cancelled out. As a result, a region originally corresponding to the keep-out zone KOZ of the second conductor 52 becomes a region out of the keep-out zone, and thus, the transistors T2 are allowed to be formed in this region. Accordingly, the transistors T2 can be provided further closer to the second conductor 52. This configuration can lower a limitation imposed on the arrangement positions of the transistors T2 by the keep-out zone KOZ, and thus, can lower a limitation on the layout design of the transistors T2.

Moreover, according to the optical detection device 1 of the eighth embodiment, the third conductors 57 are disposed on both sides of the second conductor 52. Accordingly, an increase and decrease in signal charge can be cancelled out in the semiconductor layer around the second conductor 52, more specifically on both sides of the second conductor 52.

Further, according to the optical detection device 1 of the eighth embodiment, a plurality of third conductors 57 are disposed on both sides of the second conductor 52. The region where the increase and decrease of signal charge has been cancelled out around the second conductor 52 can be widened by increasing the number of the third conductors 57 to be arrayed. Further, the keep-out zone KOZ can be shifted to a farther position from the second conductor 52.

In addition, according to the optical detection device 1 of the eighth embodiment, the third conductor 57 and the second conductor 52 are simultaneously formed by the same step. In this case, an increase in the number of steps can be reduced. Accordingly, an increase in manufacturing costs can be reduced.

Note that the directions where the second conductors 52 and the third conductors 57 are arrayed are not limited to the directions depicted in FIG. 62. The directions where the second conductors 52 and the third conductors 57 are arrayed may be directions perpendicular to the directions depicted in FIG. 62. This point concerning the array directions is also applicable to the following modifications.

Moreover, while each of the third surface S3 and the fourth surface S4 in the second semiconductor layer 50 is (100) surface, these surfaces may be other surfaces. In that case, each of the directions where the second conductors 52 and the third conductors 57 are arrayed may have a different angle, i.e., an angle different from 45 degrees, to the channel direction.

<<Modifications of Eighth Embodiment>>

Hereinafter described will be modifications of the eighth embodiment.

<Modification 1>

While each of the third conductors 57 is projected into the second wiring layer 40 and the third wiring layer 60 according to the eighth embodiment, the present technology is not limited to this example. According to the optical detection device 1 in modification 1 of the eighth embodiment, each of the third conductors 57 is not projected into the second wiring layer 40 nor the third wiring layer 60 as depicted in FIG. 64. Each of the third conductors 57 is not required to project into the wiring layers overlapped with the second semiconductor layer 50 as long as the third conductor 57 at least penetrates the second semiconductor layer 50.

Advantageous effects similar to those of the optical detection device 1 of the eighth embodiment described above can be offered by the optical detection device 1 according to modification 1 of the eighth embodiment described here.

<Modification 2>

While the third conductors 57 are one-dimensionally arrayed for the second conductor 52 in the direction forming 45 degrees to the channel direction in the eighth embodiment, the present technology is not limited to this example. As depicted in FIG. 65, the third conductors 57 may be two-dimensionally arrayed for the second conductor 52 in two directions each forming 45 degrees to the channel direction. Note that the conductors depicted in FIG. 65 include the one second conductor 52 and the third conductors 57 as the remaining conductors. However, the number and the arrangement position of the second conductors 52 are not limited to the examples depicted in FIG. 65. For example, it is possible to define a layout of the second conductors 52 according to the conductors located in a matrix depicted in FIG. 65. More specifically, any of the third conductors 57 other than the conductors at the four corners depicted in FIG. 65 may be replaced with the second conductor 52. Even if the second conductor 52 is arranged at any position other than the four corners of the conductors depicted in FIG. 65 to increase the number of the second conductors 52, an increase and decrease of signal charge can be cancelled out.

Advantageous effects similar to those of the optical detection device 1 of the eighth embodiment described above can be offered by the optical detection device 1 according to modification 2 of the eighth embodiment described here.

Moreover, according to the optical detection device 1 in modification 2 of the eighth embodiment, the second conductors 52 and the third conductors 57 are two-dimensionally arrayed in a matrix. Accordingly, design of the arrangement position of the second conductors 52, particularly design of the arrangement positions of a plurality of second conductors, is facilitated.

<Modification 3>

While each of the third conductors 57 includes the same material as the material of the second conductor 52 and has the same diameter as the diameter of the second conductor 52 in the eighth embodiment, the present technology is not limited to this example. As depicted in FIG. 66, the third conductor 57 may include the same material as the material of the second conductor 52 but may have a diameter different from the diameter of the second conductor 52. More specifically, the third conductor 57 may have a diameter smaller than the diameter of the second conductor 52.

FIG. 66 depicts the one second conductor 52 and a plurality of third conductors 57 arrayed in one line. In addition, the third conductors 57 will also be referred to as third conductors 57-5, 57-6, and 57-7 for distinction between a plurality of third conductors 57. Moreover, these conductors are arrayed in a direction forming 45 degrees to the channel direction in one line in an order of the second conductor 52, the third conductor 57-5, the third conductor 57-6, and the third conductor 57-7. In addition, the diameters are decreased stepwise in this order (array order) from the second conductor 52. Specifically, the diameters of the third conductors 57 are gradually decreased with farness from the second conductor 52.

Stress applied to a surrounding semiconductor layer decreases as the diameter of the third conductor 57 decreases. In addition, the regions K1 and K2 also decrease as the stress decreases. The third conductor 57-5 having a diameter smaller than the diameter of the second conductor 52 is arranged on the lower right side of the second conductor 52 in the figure. In addition, the regions K2 and K1 on the lower right side of the second conductor 52 in the figure overlap with the regions K1 and K2 that are located on the upper left side of the third conductor 57-5 in the figure and that have smaller sizes than the regions K2 and K1 on the lower right side of the second conductor 52 in the figure. The regions K1 and K2 of the third conductor 57-5 are smaller than the regions K2 and K1 of the second conductor 52, but overlap with a part of the regions K2 and K1 of the second conductor 52. Accordingly, an increase and decrease in signal charge in the overlapped part of the regions is cancelled out. In addition, the regions K2 and K1 on the lower right side of the third conductor 57-5 in the figure overlap with the regions K1 and K2 that are located on the upper left side of the third conductor 57-6 in the figure and that have smaller sizes than the regions K2 and K1 on the lower right side of the third conductor 57-5 in the figure. The regions K1 and K2 of the third conductor 57-6 are smaller than the regions K2 and K1 of the third conductor 57-5, but overlap with a part of the regions K2 and K1 of the third conductor 57-5. Accordingly, an increase and decrease in signal charge in the overlapped part of the regions is cancelled out. The same is applicable to the following third conductor 57-7. In such a manner, the diameters of the third conductors 57 are decreased stepwise to reduce a part of each of the regions where an increase and decrease in signal charge is produced. In addition, the keep-out zone KOZ remaining for the third conductor 57-7 becomes smaller in size than the keep-out zone KOZ of the second conductor 52.

Advantageous effects similar to those of the optical detection device 1 of the eighth embodiment described above can be offered by the optical detection device 1 according to modification 3 of the eighth embodiment described here.

Moreover, according to the optical detection device 1 in modification 3 of the eighth embodiment, the diameters of the third conductor 57 are decreased stepwise. This configuration can reduce a part of each of the regions where an increase and decrease in signal charge is produced, and can reduce the size of the keep-out zone KOZ finally remaining. Furthermore, the size of the keep-out zone KOZ finally remaining can further decrease as the number of the third conductors 57 thus configured increases.

Note that the number of the third conductors 57 is not limited to the number depicted in FIG. 66. In addition, while the third conductors 57 are provided only on one side of the second conductor 52 in modification 3 of the eighth embodiment, the third conductors 57 may be provided on the other side or on both sides.

<Modification 4>

While the third conductors 57 and the second conductor 52 are formed by via middle from the third surface S3 side in the eighth embodiment, the present technology is not limited to this example. The third conductors 57 and the second conductor 52 may be formed by via last from the fourth surface S4 side as depicted in FIG. 67. In that case, each of the third conductors 57 and the second conductor 52 may include the same material as the material constituting the first conductor 51. According to modification 4 of the eighth embodiment, each of the third conductors 57, the second conductor 52, and the first conductor 51 includes copper, for example. However, this configuration is not required to be adopted.

A manufacturing method of the optical detection device 1 according to the present modification will next be described. As depicted in FIG. 68, the insulation film 61 is laminated on the fourth surface S4 side of the second semiconductor layer 50. Thereafter, the holes 57*h* for forming the third conductors 57, the hole 53 for forming the second conductor 52, and the hole 51*h* for forming the first conductor 51 are formed from the insulation film 61 side (fourth surface S4 side). Subsequently, copper is simultaneously embedded into the holes 57*h*, the hole 53, and the hole 51*h* by the same step from the insulation film 61 side (fourth surface S4 side), and an unnecessary portion of the copper is removed by known CMP. In such a manner, the third conductors 57, the second conductor 52, and the first conductor 51 depicted in FIG. 67 are produced.

Advantageous effects similar to those of the optical detection device 1 of the eighth embodiment described above can be offered by the optical detection device 1 according to modification 4 of the eighth embodiment described here.

<Modification 5>

While the third conductor 57 includes the same material as the material of the second conductor 52 and has the same diameter as the diameter of the second conductor 52 in the eighth embodiment, the present technology is not limited to this example. As depicted in FIGS. 69 and 70, the third conductor 57 may include a material different from the material of the second conductor 52 and have a diameter different from the diameter of the second conductor 52. According to the present modification, the third conductor 57 includes trunk, while the second conductor 52 includes tungsten. In addition, the diameter of the third conductor 57 is smaller than the diameter of the second conductor 52.

Typically, when a material constituting a through conductor is different, stress applied to a surrounding semiconductor layer is also different. In addition, stress applied to a surrounding semiconductor layer can be expressed by a product of a thermal expansion coefficient by a Young's modulus. For example, the following difference in stress applied to a surrounding semiconductor layer is produced between tungsten and copper. Note that a stress ratio described below is a value normalized on an assumption that stress applied to a surrounding semiconductor layer by tungsten is "1."

| Material/thermal expansion coefficient ($10^{-6}$/K)/ Young's modulus (GPa)/stress/stress ratio |
|---|
| tungsten/4.3/345/1483.5/1 |
| copper/16.8/129.8/2180.6/1.47 |

As apparent from above, in comparison between tungsten and copper, copper applies larger stress to a semiconductor layer. More specifically, copper applies approximately 1.5 times larger stress to a semiconductor layer than tungsten. Accordingly, if the third conductor 57 including copper has the same diameter as the diameter of the second conductor 52 including tungsten, the keep-out zone KOZ of the third conductor 57 is considered to become approximately 1.5 times larger than the keep-out zone KOZ of the second conductor 52. For cancelling out an increase and decrease in signal charge, it is preferable here that the third conductor 57 and the second conductor 52 apply substantially the same stress to a semiconductor layer in an ideal sense. Accordingly, in a case where the third conductor 57 includes trunk and the second conductor 52 includes tungsten, the diameter of the third conductor 57 is only required to be smaller than the diameter of the second conductor 52. In such a manner, as depicted in FIG. 70, the stress applied to the second semiconductor layer 50 by the third conductor 57 can be equalized with the stress applied to the second semiconductor layer 50 by the second conductor 52, and thus, an increase and decrease in signal charge can be cancelled out. In other words, the third conductor 57 including a material which applies larger stress to the semiconductor layer than the stress of the material constituting the second conductor 52 is allowed to have a smaller diameter than the diameter of the second conductor 52. Accordingly, space saving is achievable.

A manufacturing method of the optical detection device 1 according to the present modification will next be described. According to the present modification, the third conductor 57 is formed by via last from the fourth surface S4 side, while the second conductor 52 is formed by via middle from the third surface S3 side. First, as depicted in FIG. 71A, the second conductor 52 and the vias 44 are formed by via middle from the third surface S3 side. Thereafter, the steps already described are performed, and then the insulation film 61 is laminated on the fourth surface S4 side of the second semiconductor layer 50 as depicted in FIG. 71B. Subsequently, the holes 57*h* for forming the third conductors 57, the hole 51*h* for forming the first conductor 51, holes for forming wiring layers and the like, and others are formed from the insulation film 61 side (fourth surface S4 side). Then, copper is simultaneously embedded into the holes 57*h* and the hole 51*h* from the insulation film 61 side (fourth surface S4 side), and an unnecessary portion of the copper is removed by known CMP. In such a manner, the third conductors 57, the second conductor 52, and the first conductor 51 depicted in FIG. 69 are produced.

Advantageous effects similar to those of the optical detection device 1 of the eighth embodiment described above can be offered by the optical detection device 1 according to modification 5 of the eighth embodiment described here.

Moreover, according to the optical detection device 1 in modification 5 of the eighth embodiment, the third conductor 57 including a material which applies larger stress to the semiconductor layer than the stress of the material constituting the second conductor 52 is allowed to have a smaller diameter than the diameter of the second conductor 52. Accordingly, an installation area of the third conductor 57 can be reduced in the planar view, and thus, the third conductor 57 is allowed to be provided in a narrow place.

In addition, in a case where both the third conductor 57 and the second conductor 52 are formed by via middle from the third surface S3 side, the material may be embedded and formed in one side of the holes 57*h* and the hole 53 while the other side of the holes 57*h* and the hole 53 is covered by a resist. This is applicable to a case where both the third conductors 57 and the second conductor 52 are formed by via last from the fourth surface S4 side.

<Modification 6>

According to modification 6 of the eighth embodiment, the third conductors 57 are formed by via last from the fourth surface S4 side, while the second conductor 52 is formed by via middle from the third surface S3 side. However, the present technology is not limited to this example. As depicted in FIG. 72, the third conductors 57 may be formed by via middle from the third surface S3 side, while the second conductor 52 may be formed by via last from the fourth surface S4 side. In that case, the second conductor 52 includes the same material as the material constituting the first conductor 51. According to modification 6 of the eighth embodiment, each of the third conductor 57 and the via 44 includes tungsten, and each of the second conductor 52 and the first conductor 51 includes copper, for example. However, the respective materials are not limited to these examples. The second conductor 52 includes a material applying larger stress to a semiconductor layer than stress applied by the material constituting the third conductor 57. Accordingly, the diameter of the second conductor 52 is made smaller than the diameter of the third conductor 57.

First, as depicted in FIG. 73A, the third conductors 57 and the vias 44 are formed from the third surface S3 side. Thereafter, the steps already described are performed, and then the hole 53 for forming the second conductor 52 and the hole 51*h* for forming the first conductor 51 are formed from the fourth surface S4 side as depicted in FIG. 73B. Then, copper is embedded into the hole 53 and the hole 51*h* from the insulation film 61 side (fourth surface S4 side), and an unnecessary portion of the copper is removed by known CMP. In such a manner, the third conductors 57, the second conductor 52, and the first conductor 51 depicted in FIG. 72 are produced.

Ninth Embodiment

Hereinafter described will be the ninth embodiment of the present technology depicted in FIGS. 74A to 74C. The optical detection device 1 according to the present ninth embodiment is different from the optical detection device 1 according to the first embodiment described above in that a plurality of marks MK each including a fourth conductor 58 and an etching stop layer 46 are formed to constitute an alignment mark AL used for a lithography step. Other configurations of the optical detection device 1 are basically similar to the corresponding configurations of the optical detection device 1 according to the first embodiment described above. Note that the constituent elements already described will be given the same reference signs, and will not be repeatedly explained.

<<Configuration of Optical Detection Device>>

The configuration of the optical detection device 1 according to the ninth embodiment of the present technology will hereinafter be described while focus is placed on a part different from the configuration of the optical detection device 1 according to the first embodiment described above. Note that scales of constituent elements depicted in some of the figures associated with the present ninth embodiment are different from scales of the same constituent elements in the other figures describing the ninth embodiment. Moreover, the barrier metal layer is not depicted in the figures explaining the present ninth embodiment.

FIG. 74B is a plan diagram depicting the entire alignment mark AL in the planar view. The alignment mark AL has a size in microns. FIG. 74C is a partially enlarged plan diagram depicting an enlarged area AA in FIG. 74B. As depicted in FIG. 74C, the one alignment mark AL includes a plurality of marks MK. FIG. 74A is a longitudinal cross-sectional diagram depicting a cross-sectional structure of the one mark MK and the one second conductor 52 for convenience of explanation.

<Alignment Mark>

The alignment mark AL is provided for the purpose of alignment between the wire 62 and the second conductor 52 during a lithography step for forming the wire 62 connected to the end 52*a* of the second conductor 52. Accordingly, the alignment mark AL is formed during the step for forming the second conductor 52. FIG. 74B depicts an example of a shape of the alignment mark AL. The alignment mark AL may have a shape other than a cross shape depicted in FIG. 74B, such as a square shape and a circular shape. Moreover, the alignment mark AL is disposed not within a scribe line but within the semiconductor chip 2 to increase alignment accuracy.

<Mark>

As depicted in FIG. 74C, the one alignment mark AL includes a plurality of marks MK. More specifically, a plurality of marks MK are two-dimensionally arrayed to constitute the one alignment mark AL. The present embodiment will be explained on an assumption that the marks MK are arrayed in the X-direction and the Y-direction. The marks MK are densely arrayed in a matrix in the X-direction and the Y-direction. The alignment mark AL formed by the plurality of marks MK being arranged has a contour which looks like a line. The shape of each of the marks MK is not limited to the shape depicted in FIG. 74C, and may be any of shapes presented in modifications of the present embodiment or other shapes. Moreover, there exist various combinations of the shape of the marks MK and the shape of the alignment mark AL. The combination depicted in the figure is not required to be adopted.

As depicted in FIG. 74A, the mark MK is provided on the third surface S3 side of the second semiconductor layer 50. As depicted in FIGS. 74A and 74B, the mark MK has the fourth conductor 58, the etching stop layer 46, and the insulation film 41*m*.

<Fourth Conductor>

The fourth conductor 58 has the same diameter as the second conductor 52. For example, the fourth conductor 58 has a diameter in several hundreds nanometers. Moreover, the fourth conductor 58 includes the same material as the material constituting the second conductor 52. Described in the present embodiment will be an example where the fourth conductor 58 and the second conductor 52 include tungsten, for example. However, this configuration is not required to be adopted. The second conductor 52 and the fourth conductor 58 have a positional relation illustrated in FIG. 74A in the thickness direction of the optical detection device 1. More specifically, the end 52*a* of the second conductor 52 on the fourth surface S4 side extends in a direction away from the fourth surface S4, and connects to the wire 62 included in the third wiring layer 60. In addition, an end 58*a* of the fourth conductor 58 as an end near the wire 62 is located closer to the wire 42 included in the second wiring layer 40 than the connection position between the end 52*a* and the wire 62. Accordingly, the end 58*a* does not reach the connection position between the end 52*a* and the wire 62. Moreover, the etching stop layer 46 is provided between the fourth conductor 58 and the second semiconductor layer 50.

(Etching Stop Layer)

As will be described in detail in the following description of a manufacturing method, the etching stop layer 46 functions as a film which decreases an etching speed for etching a hole 58*h* in which the fourth conductor 58 is to be embedded. The etching stop layer 46 includes a single-layer film, and is laminated on the third surface S3 of the second semiconductor layer 50. The etching stop layer 46 is provided at a position overlapping with the fourth conductor 58 in the planar view, and has a circular shape in the planar view as depicted in FIG. 74C. The etching stop layer 46 includes a material which has a lower etching speed for selected etchant than each of the material constituting the insulation film 41 and the material (silicon) constituting the second semiconductor layer 50. For example, in a case where the insulation film 41 includes silicon oxide, the material constituting the etching stop layer 46 is silicon nitride, metal, or the like. The present embodiment will be described on an assumption that the insulation film 41 includes silicon oxide and that the etching stop layer 46 includes silicon nitride.

<<Manufacturing Method of Optical Detection Device>>

A manufacturing method of the optical detection device 1 will hereinafter be described with reference to FIGS. 75A to 75E. A manufacturing method of the fourth conductor 58 and the second conductor 52 will mainly be explained here. First, as depicted in FIG. 75A, the transistors T2 and the like are formed on the third surface S3 side of the second semiconductor layer 50*w*. Thereafter, the etching stop layer 46 is formed on the third surface S3 of the second semiconductor layer 50*w*. More specifically, the etching stop layer 46 is formed at a position where the mark MK is to be provided in the planar view. For example, the etching stop layer 46 is formed using a known film formation method, a known lithography technology, a known etching technology, and the like. Thereafter, the insulation film 41 is laminated in such a manner as to cover the etching stop layer 46.

Thereafter, as depicted in FIG. 75B, the hole 58*h* for forming the fourth conductor 58 and the hole 53 for forming the second conductor 52 are simultaneously formed from the insulation film 41 side (third surface S3 side) by using a known lithography technology and a known etching technology. More specifically, a resist pattern R6 having an opening R6*a* and an opening R6*b* is formed on an exposed surface of the insulation film 41 by a known lithography technology, and portions exposed through the opening R6*a* and the opening R6*b* are simultaneously etched by a known etching technology to produce the hole 58*h* and the hole 53.

The opening R6*a* is provided at a position where the hole 58*h* is to be formed, while the opening R6*b* is formed at a position where the hole 53 is to be formed, in the planar view. In these openings, the opening R6*a* is provided at a position overlapping with the etching stop layer 46 in the planar view, more specifically, at a position inside the etching stop layer 46 in the planar view. In such a manner, the hole 58*h* can be formed at a position overlapping with the etching stop layer 46 in the planar view. More specifically, the bottom of the hole 58*h* can be formed at a position inside the etching stop layer 46 in the planar view.

With an etching start, the insulation film 41 exposed through the opening R6*a* and the opening R6*b* is first etched. Thereafter, a portion exposed through the opening R6*b* in the pair of the opening R6*a* and the opening R6*b* is further etched until etching reaches the second semiconductor layer 50 and the third wiring layer 60 from the insulation film 41. As a result, the hole 53 is produced. Meanwhile, the speed of etching for the portion exposed through the opening R6*a* decreases after the hole 58*h* reaches the etching stop layer 46. If any part of the etching stop layer 46 is etched, this etched portion is only a small portion. As a result, the hole 58*h* is produced. Thereafter, etching for forming the hole 53 proceeds toward the second semiconductor layer 50 and the third wiring layer 60. During the etching of the hole 53, if any part of the etching stop layer 46 exposed on the bottom of the hole 58*h* is etched, this etched part is only a small portion. The hole 58*h* does not penetrate the etching stop layer 46. Accordingly, the second semiconductor layer 50 and the third wiring layer 60 are not etched. Hence, the hole 58*h* thus formed has a smaller depth than the hole 53. Thereafter, the resist pattern R6 is removed.

Subsequently, as depicted in FIG. 75C, the insulation film 41*m* is laminated within the hole 58*h* and the hole 53 from the insulation film 41 side (third surface S3 side). Thereafter, tungsten is embedded in the hole 58*h* and the hole 53. Then, unnecessary portions of the insulation film 41*m* and the tungsten are removed by CMP, for example. In such a manner, the fourth conductor 58 and the second conductor 52 are produced. The hole 58*h* has a smaller depth than the hole 53. Accordingly, the end 58*a* of the fourth conductor 58 is allowed to be provided at a position different from the position of the end 52*a* of the second conductor 52 in the lamination direction (thickness direction), more specifically, at a shallower position. Thereafter, the steps in the first embodiment depicted in FIGS. 5E to 5H are carried out.

Subsequently, as depicted in FIG. 75D, the silicon cover film 65 and the insulation film 61 are laminated in this order. Thereafter, as depicted in FIG. 75E, an exposed surface of the insulation film 61 is ground and flattened by CMP to expose the end 52*a* of the second conductor 52. More specifically, in the pair of the fourth conductor 58 and the second conductor 52, only the second conductor 52 is exposed. The end 58*a* of the fourth conductor 58 is located within the second wiring layer 40. This configuration prevents exposure of the end 58*a* caused by flattening of the wafer. Accordingly, the end 58*a* of the fourth conductor 58 is not subjected to grinding by CMP. As described above, the fourth conductor 58 of the mark MK is not ground by CMP. Accordingly, unevenness produced on the end 58*a* of the fourth conductor 58 is reduced.

Next, while not depicted in the figure, the insulation film 61 is further laminated on the flattened exposed surface, and the wire 62 and the like are formed to complete the third wiring layer 60. A step for forming the wire 62 will be described here. A resist pattern is formed using a known lithography technology to form a hole in which the wire 62 is to be embedded. At this time, the alignment mark AL including a plurality of marks MK is used for alignment between the second conductor 52 and the wire 62. As depicted in FIG. 75E, the fourth conductor 58 of the mark MK is not ground by CMP, and thus, unevenness produced on the end 58*a* is reduced. Accordingly, alignment light used during alignment is reflected on the end 58*a* of the fourth conductor 58 that is not ground by CMP. In such a manner, lowering of alignment accuracy can be reduced. The manufacturing method after this step has already been described, and hence is not repeatedly explained.

<<Main Advantageous Effects of Ninth Embodiment>>

Main advantageous effects of the ninth embodiment will hereinafter be described. Before the description of these effects, a conventional example will be touched upon. As depicted in FIG. 76, a conventional mark MKa has the fourth conductor 58 and the insulation film 41*m*, but does not have the etching stop layer 46. Because the fourth conductor 58 does not have the etching stop layer 46, a hole in which the fourth conductor 58 is to be embedded penetrates the second semiconductor layer 50 and reaches the insulation film 61. In addition, the end 58*a* of the fourth conductor 58 is formed at a position that corresponds to the position of the end 52*a* of the second conductor 52 in the lamination direction. Accordingly, both the end 58*a* and the end 52*a* are subjected to grinding by CMP. In a case of flattening by grinding using CMP here, it is desired to achieve flatness in an ideal sense. In a strict sense, however, unevenness may be produced in some cases. Accordingly, as depicted in FIG. 76, unevenness may be produced at the end 58*a* of the fourth conductor 58, and alignment light may be diffusedly reflected by the unevenness of the end 58*a* in a subsequent lithography step. As a result, alignment accuracy may be lowered. Moreover, when a grinding quantity of the fourth conductor 58 varies, more specifically, the grinding quantity changes in a chip surface or a wafer surface, alignment accuracy may be lowered.

Meanwhile, according to the optical detection device 1 of the ninth embodiment of the present technology, the mark MK has the etching stop layer 46. In this case, the etching speed for forming the hole 58*h* can be decreased in the middle of etching, and thus, the hole 58*h* having a smaller depth than the hole 53 can be formed. Accordingly, the end 58*a* of the fourth conductor 58 is allowed to be provided at a position different from the position of the end 52*a* of the second conductor 52 in the lamination direction (thickness direction), more specifically, at a shallower position. In FIG. 74A, the end 58*a* of the fourth conductor 58 is located in the second wiring layer 40. Accordingly, the end 58*a* of the fourth conductor 58 is not subjected to grinding by CMP. Because the fourth conductor 58 of the mark MK is not ground by CMP as described above, unevenness produced on the end 58*a* of the fourth conductor 58 is reduced. Accordingly, diffused reflection of alignment light by unevenness of the end 58*a* can be reduced, and thus, lowering of alignment accuracy can be reduced. Moreover, because grinding of the fourth conductor 58 of the mark MK by CMP is prevented, reduction of a change of the shape of the mark MK within the chip surface or the wafer surface, and hence, reduction of lowering of alignment accuracy can be achieved.

Note that the second conductor 52 may be connected to the third connection pad 63. In addition, timing for forming the etching stop layer 46 is not limited to the timing presented in the above description of the manufacturing method. The timing for forming the etching stop layer 46 may be any timing as long as the timing is before lamination of the insulation film 41 on the third surface S3.

<<Modifications of Ninth Embodiment>>

Hereinafter described will be modifications of the ninth embodiment.

<Modification 1>

While the etching stop layer 46 of the mark MK is a single-layer film in the ninth embodiment, the present technology is not limited to this example. According to the optical detection device 1 in modification 1 of the ninth embodiment, the etching stop layer 46 of the mark MK has a laminated structure where a third layer 46*a* and a fourth layer 46*b* are laminated in this order on the third surface S3 as depicted in FIG. 77. Moreover, the hole 58*h* penetrates only the fourth layer 46*b* in the pair of the third layer 46*a* and the fourth layer 46*b*.

The third layer 46*a* functions as an etching stop layer under a condition for etching the second semiconductor layer 50. The third layer 46*a* includes a material which has a lower etching speed for selected etchant than the material (silicon) constituting the second semiconductor layer 50. For example, the third layer 46*a* includes silicon oxide, but is not limited to this example.

Moreover, the fourth layer 46*b* functions as an etching stop layer under a condition for etching the insulation film 41. The fourth layer 46*b* includes a material which has a lower etching speed for selected etchant than the material (silicon oxide) constituting the insulation film 41. In addition, for example, the fourth layer 46*b* includes silicon, but is not limited to this example.

As described above, the fourth layer 46*b* functions as an etching stop layer during etching of the insulation film 41 in the pair of the insulation film 41 and the second semiconductor layer 50. Meanwhile, the third layer 46*a* functions as an etching stop layer during etching of the second semiconductor layer 50 in the pair of the insulation film 41 and the second semiconductor layer 50.

A manufacturing method of the optical detection device 1 will hereinafter be described with reference to FIGS. 78A to 78C. Note that a part different from the manufacturing method explained in the ninth embodiment will mainly be described in the present modification 1. First, as depicted in FIG. 78A, the third layer 46*a* and the fourth layer 46*b* are laminated in this order on the third surface S3 of the second semiconductor layer 50*w*. Thereafter, the insulation film 41 is laminated.

Next, as depicted in FIG. 78B, the resist pattern R6 is formed on an exposed surface of the insulation film 41, and portions exposed through the opening R6*a* and the opening R6*b* are simultaneously etched by a known etching technology to produce the hole 58*h* and the hole 53. During etching of the hole 53, two types of materials constituting the insulation film 41 and the second semiconductor layer 50 are etched. FIG. 78B depicts a stage of etching for the insulation film 41. The speed of etching for the portion exposed through the opening R6*a* decreases when the hole 58*h* reaches the fourth layer 46*b*. In addition, if any part of the fourth layer 46*b* is etched, this etched part is only a small portion.

Subsequently, as depicted in FIG. 78C, a step for etching the second semiconductor layer 50*w* (silicon) in a different etching condition is started. In this case, the fourth layer 46*b* exposed through the bottom of the hole 58*h* includes silicon. Accordingly, the exposed portion of the fourth layer 46*b* is etched at a speed substantially the same as an etching speed for the hole 53. Thereafter, the speed of etching for the portion exposed through the opening R6*a* again decreases when the hole 58*h* reaches the third layer 46*a*. In addition, if any part of the third layer 46*a* is etched, this etched part is only a small portion. As described above, the etching stop layer 46 has a multilayered structure in correspondence with the different types of materials in each of which the hole 53 is formed. This configuration prevents penetration of the hole 58*h* through all the layers of the etching stop layer 46 even if the etching condition is changed for each material.

Accordingly, the hole 58*h* having a smaller depth than the hole 53 can be formed. The manufacturing method after this step has already been described, and hence, is not repeatedly explained.

Advantageous effects similar to those of the optical detection device 1 of the ninth embodiment described above can be offered by the optical detection device 1 according to modification 1 of the ninth embodiment described here.

Moreover, according to the optical detection device 1 in modification 1 of the ninth embodiment, even in a case where the hole 53 for forming the second conductor 52 is formed in each of the different materials, the etching stop layer 46 has a multilayered structure in correspondence with the respective different types of materials. This configuration can prevent penetration of the hole 58*h* through all the layers of the etching stop layer 46 even if the etching condition is changed for each material. Accordingly, the hole 58*h* having a smaller depth than the hole 53 can be formed.

<Modification 2>

According to the ninth embodiment, the mark MK is provided on the third surface S3 side of the second semiconductor layer 50, and the end 58*a* of the fourth conductor 58 is located in the second wiring layer 40. However, the present technology is not limited to this example. As depicted in FIG. 79, the fourth conductor 58 may penetrate the second semiconductor layer 50, and the end 58*a* may be located in the third wiring layer 60. In addition, the mark MK includes an etching stop layer 46*c* instead of the etching stop layer 46.

(Fourth Conductor)

The fourth conductor 58 penetrates the etching stop layer 46*c* and the second semiconductor layer 50, and reaches the inside of the third wiring layer 60. In addition, the end 58*a* of the fourth conductor 58 is located closer to the wire 42 included in the second wiring layer 40 than the connection position between the end 52*a* and the wire 62. Accordingly, the end 58*a* does not reach the connection position between the end 52*a* and the wire 62.

(Etching Stop Layer)

The hole 58*h* formed by etching penetrates the etching stop layer 46*c*. This configuration is achieved by changing at least either a film thickness of the etching stop layer 46*c* or a material constituting the etching stop layer 46*c*. Described in present modification 2 will be an example where the film thickness of the etching stop layer 46*c* is made smaller than the film thickness of the etching stop layer 46 of the ninth embodiment.

The etching stop layer 46*c* includes silicon nitride similarly to the etching stop layer 46 of the ninth embodiment. The film thickness of the etching stop layer 46*c* is smaller than the film thickness of the etching stop layer 46 of the ninth embodiment. The etching speed for silicon nitride is low under the condition for etching the insulation film 41 and the second semiconductor layer 50, but this does not mean that silicon nitride is not etched at all under this condition. Accordingly, when the film thickness is reduced, the hole 58*h* penetrates the etching stop layer 46*c* by long-period etching.

A manufacturing method of the optical detection device 1 will hereinafter be described with reference to FIGS. 80A to 80C. Note that a part different from the manufacturing method explained in the ninth embodiment will mainly be described in the present modification 2. First, as depicted in FIG. 80A, the etching stop layer 46*c* having a smaller thickness than the etching stop layer 46 of the ninth embodiment is formed on the third surface S3 of the second semiconductor layer 50*w*. Thereafter, the insulation film 41 is laminated in such a manner as to cover the etching stop layer 46, and the resist pattern R6 having the opening R6*a* and the opening R6*b* is formed. Subsequently, portions exposed through the opening R6*a* and the opening R6*b* are simultaneously etched by a known etching technology to produce the hole 58*h* and the hole 53. The speed of etching for the portion exposed through the opening R6*a* decreases after the hole 58*h* reaches the etching stop layer 46. The etching for the etching stop layer 46 proceeds slowly while taking a long time. While the etching for the etching stop layer 46 of the hole 58*h* is proceeding slowly, etching of the portion exposed through the opening R6*b*, i.e., etching of the hole 53, continues, and advances from etching of the insulation film 41 to etching of the second semiconductor layer 50. After the hole 58*h* penetrates the etching stop layer 46, the etching of the hole 58*h* proceeds toward the second semiconductor layer 50. However, the etching for penetration through the etching stop layer 46 takes a long time, and hence, the hole 58*h* has a smaller depth than the hole 53 as depicted in the figure. Thereafter, as in the ninth embodiment, the insulation film 41*m* and tungsten are laminated in this order in each of the hole 58*h* and the hole 53 from the insulation film 41 side (third surface S3 side) to produce the fourth conductor 58 and the second conductor 52. Thereafter, the steps of the first embodiment depicted in FIGS. 5E to 5H are carried out.

Next, as depicted in FIG. 80B, the silicon cover film 65 and the insulation film 61 are laminated in this order in such a manner as to cover the fourth conductor 58 and the projected second conductor 52 projected from the fourth surface S4. Note that the projection of the fourth conductor 58 from the fourth surface S4 is smaller than the projection of the second conductor 52 in the state where the hole 58*h* described above has a smaller depth than the hole 53.

Thereafter, as depicted in FIG. 80C, an exposed surface of the insulation film 61 is ground and flattened by CMP to expose the end 52*a* of the second conductor 52. More specifically, in the pair of the fourth conductor 58 and the second conductor 52, only the second conductor 52 is exposed. The end 58*a* of the fourth conductor 58 is located in the insulation film 61 of the third wiring layer 60 similarly to the end 52*a* of the second conductor 52. However, the projection of the fourth conductor 58 from the fourth surface S4 is smaller than the projection of the second conductor 52. Accordingly, in the pair of the fourth conductor 58 and the second conductor 52, the second conductor 52 is exposed earlier in a case where the insulation film 61 is ground by CMP. Thereafter, grinding by CMP is stopped before exposure of the fourth conductor 58. In such a manner, exposure of the end 58*a* of the fourth conductor 58 caused by flattening of the wafer is prevented, and thus, the covered state by the insulation film 61 is maintained. Accordingly, the end 58*a* of the fourth conductor 58 is not subjected to grinding by CMP. Because the fourth conductor 58 of the mark MK is not ground by CMP as described above, unevenness produced on the end 58*a* of the fourth conductor 58 is reduced. Accordingly, alignment light used during alignment is reflected on the end 58*a* of the fourth conductor 58 that is not ground by CMP. As a result, lowering of alignment accuracy can be reduced. The manufacturing method after this step has already been described, and hence, is not repeatedly explained.

Advantageous effects similar to those of the optical detection device 1 of the ninth embodiment described above can be offered by the optical detection device 1 according to modification 2 of the ninth embodiment described here.

Moreover, according to the optical detection device 1 of modification 2 of the ninth embodiment, the end 58*a* of the fourth conductor 58 is located in the insulation film 61 of the third wiring layer 60. In this case, a distance of the end 58*a* from the exposed surface of the insulation film 61 is shorter than that distance in the ninth embodiment. Accordingly, the alignment mark AL is more easily identifiable during the lithography step for forming the wire 62, and hence, alignment is more facilitated.

Note that described in modification 2 of the ninth embodiment has been the example where the film thickness of the etching stop layer 46*c* is made smaller than a film thickness of the etching stop layer 46 of the ninth embodiment. However, other configurations may be adopted as long as penetration of the hole 58*h* through the etching stop layer 46*c* can be delayed. For example, the material constituting the etching stop layer 46*c* may be changed.

For example, the etching stop layer 46*c* may include a material which has a lower etching speed for selected etchant than the material (silicon) constituting the second semiconductor layer 50. More specifically, the etching stop layer 46*c* may include a material which has a lower etching speed for selected etchant than each of the material constituting the insulation film 41 and the material constituting the second semiconductor layer 50. Examples adoptable as the material of this type include silicon oxide having film properties different from those of the insulation film 41. For example, silicon oxide having different film properties is silicon oxide having density different from density of the insulation film 41 and thus having a lower etching speed for selected etchant than the insulation film 41, but is not limited to this example.

Moreover, for example, the etching stop layer 46*c* may include silicon. If the etching stop layer 46*c* includes silicon, the etching speed for selected etchant is low in comparison with the etching of the insulation film 41. In such a manner, penetration of the hole 58*h* through the second semiconductor layer 50 can be delayed. In addition, as for the etching of the second semiconductor layer 50, the etching stop layer 46*c* is laminated on the second semiconductor layer 50, and hence offers an effect of increasing the thickness of the etching target. In such a manner, penetration of the hole 58*h* through the second semiconductor layer 50 can be delayed.

<Modification 3>

While the etching stop layer 46*c* is laminated directly on the third surface S3 of the second semiconductor layer 50 in modification 2 of the ninth embodiment, the present technology is not limited to this example. As depicted in FIG. 81, the etching stop layer 46*c* may be laminated on the third surface S3 via the insulation film 41.

Advantageous effects similar to those of the optical detection device 1 of the ninth embodiment and modification 2 of the ninth embodiment described above can be offered by the optical detection device 1 according to modification 3 of the ninth embodiment described here.

<Modification 4>

While the etching stop layer 46 of each of the marks MK has a circular shape in the planar view in the ninth embodiment, the present technology is not limited to this example. As depicted in FIG. 82, the etching stop layer 46 of each of the marks MK may have a square shape in the planar view.

Advantageous effects similar to those of the optical detection device 1 of the ninth embodiment described above can be offered by the optical detection device 1 according to modification 4 of the ninth embodiment described here.

<Modification 5>

While each of the etching stop layer 46 and the fourth conductor 58 included in each of the marks MK has a circular shape in the planar view in the ninth embodiment, the present technology is not limited to this example. As depicted in FIG. 83, each of the etching stop layer 46 and the fourth conductor 58 included in each of the marks MK may have a rectangular shape in the planar view. In other words, each of the marks MK is rectangular. In addition, each of the rectangular marks MK extends from one side to the opposite side of a contour of the alignment mark AL in a longitudinal direction of the marks MK. The rectangular marks MK are densely arranged in a lateral direction of the marks MK.

Advantageous effects similar to those of the optical detection device 1 of the ninth embodiment described above can be offered by the optical detection device 1 according to modification 5 of the ninth embodiment described here.

<Modification 6>

While one alignment mark AL includes a plurality of marks MK in the ninth embodiment, the present technology is not limited to this example. As depicted in FIG. 84, one alignment mark AL may include one mark MK.

Advantageous effects similar to those of the optical detection device 1 of the ninth embodiment described above can be offered by the optical detection device 1 according to modification 6 of the ninth embodiment described here.

<Modification 7>

According to the optical detection device 1 in modification 7 of the ninth embodiment, the third conductor 57 described above in the eighth embodiment may be employed in place of the fourth conductor 58.

Advantageous effects similar to those of the optical detection device 1 of the ninth embodiment described above can be offered by the optical detection device 1 according to modification 7 of the ninth embodiment described here.

Tenth Embodiment

Hereinafter described will be the tenth embodiment of the present technology depicted in FIG. 85. The optical detection device 1 according to the present tenth embodiment is different from the optical detection device 1 according to the first embodiment described above in that a first fixing charge film so provided as to cover an outer circumferential surface of the one second conductor 52 and a second fixing charge film so provided as to cover an outer circumferential surface of the different one second conductor 52 are provided. Other configurations of the optical detection device 1 are basically similar to the corresponding configurations of the optical detection device 1 according to the first embodiment described above. Note that the constituent elements already described will be given the same reference signs, and will not be repeatedly explained.

<<Configuration of Optical Detection Device>>

The configuration of the optical detection device 1 according to the tenth embodiment of the present technology will hereinafter be described while focus is placed on a part different from the configuration of the optical detection device 1 according to the first embodiment described above. Note that scales of constituent elements depicted in some of the figures associated with the present tenth embodiment are different from scales of the same constituent elements in the other figures describing the tenth embodiment.

Moreover, while FIG. 85 depicts an example of a layout of the second conductors 52 and a structure around the second conductors 52, the layout of the second conductors 52 and the structure around the second conductors 52 are not limited to the example depicted in FIG. 85, and may appropriately be determined according to a circuit desired to be formed. Further, a size of a depletion layer typically varies according to a condition of voltage or the like. A depletion layer DL depicted in FIG. 85 only schematically represents a depletion layer under a certain condition. The same is applicable to each figure following FIG. 85. In addition, the barrier metal layer is not depicted in the figures explaining the present tenth embodiment.

<Second Semiconductor Layer>

For example, the second semiconductor layer 50 carries the readout circuit 15 depicted in FIG. 3. However, this configuration is not required to be adopted. The second semiconductor layer 50 includes a semiconductor substrate. For example, the second semiconductor layer 50 includes a monocrystal silicon substrate. However, this configuration is not required to be adopted. The second semiconductor layer 50 is a semiconductor layer formed by a first conductivity-type (p-type) semiconductor substrate p-sub. The second semiconductor layer 50 is a semiconductor layer which has an n-type semiconductor region and a p-type semiconductor region formed in the first conductivity-type (p-type) semiconductor substrate p-sub. For example, the second semiconductor layer 50 includes a third region 59A which is a first conductivity-type (p-type) semiconductor region and located on the fourth surface S4 side in the thickness direction of the second semiconductor layer 50, a fourth region w1 which is a second conductivity-type (n-type) semiconductor region and located on the third surface S3 side in the thickness direction of the second semiconductor layer 50, a fifth region w2 which is a first conductivity-type (p-type) semiconductor region and located on the third surface S3 side in the thickness direction of the second semiconductor layer 50, a sixth region w3 which is a second conductivity-type (n-type) semiconductor region and located between the third region 59A and the fifth region w2, a seventh region 59B which is a first conductivity-type (p-type) semiconductor region, and an eighth region 59C which is a second conductivity-type (n-type) semiconductor region. However, this configuration is not required to be adopted. Hereinafter, the respective semiconductor regions will be more specifically described.

The third region 59A faces the fourth surface S4. The silicon cover film 65 is laminated on the fourth surface S4. The third region 59A is a region where holes are accumulated near the fourth surface S4, i.e., a hole accumulation region, formed by the silicon cover film 65 which is an insulation film having a negative fixed charge (hereinafter referred to as a fixed charge film 65). The fourth region w1 faces the third surface S3. The fourth region w1 is an n-type well region. A transistor T2-1 (second transistor, PMOS), which is a p-channel conductivity-type field effect transistor, is provided within the fourth region w1. The transistor T2-1 has the gate electrode G, a p-type source region, and a p-type drain region. The fifth region w2 faces the third surface S3. The fifth region w2 is provided at a position away from the fourth region w1 in the horizontal direction. The fifth region w2 is a p-type well region. A transistor T2-2 (third transistor, NMOS), which is an n-channel conductivity-type field effect transistor, is provided within the fifth region w2. The transistor T2-2 has the gate electrode G, an n-type source region, and an n-type drain region. The sixth region w3 is an n-type well region provided at a deep position in the thickness direction of the second semiconductor layer 50, and electrically separates the third region 59A and the fifth region w2 from each other. The sixth region w3 can reduce a flow of holes between the third region 59A and the fifth region w2. Note that the gate electrode G of each of the transistors T2-1 and T2-2 is provided in the second wiring layer 40.

The seventh region 59B is located at such a position as to cover an outer circumferential surface of a first fixed charge film 47A. The seventh region 59B is a region where holes are accumulated near the first fixed charge film 47A, i.e., a hole accumulation region. The eighth region 59C is located at such a position as to cover an outer circumferential surface of a second fixed charge film 47B. The eighth region 59C is a region where electrons are accumulated near the second fixed charge film 47B, i.e., an electron accumulation region. The eighth region 59C exhibits the same conductivity-type as the sixth region w3 (the n-type in the present embodiment), and electrically separates the third region 59A and the fifth region w2 from each other in cooperation with the sixth region w3. More specifically, the sixth region w3 is continuously formed from the eighth region 59C in the horizontal direction. Accordingly, the eighth region 59C electrically separates the third region 59A and the fifth region w2 from each other in cooperation with the sixth region w3.

Moreover, the depletion layer DL is formed in the second semiconductor layer 50 on a boundary between the p-type semiconductor region and the n-type semiconductor region. For example, the depletion layer DL is formed on a boundary between the fourth region w1 and the p-type semiconductor region. Moreover, the depletion layer DL is formed on a boundary between the fifth region w2 and the n-type semiconductor region. Furthermore, the depletion layer DL is formed on a boundary between the sixth region w3 and the p-type semiconductor region.

<Second Conductor>

FIG. 85 depicts an example of three second conductors 52. The second conductors 52 include a fifth conductor 52-1 which is the one second conductor 52, a sixth conductor 52-2 which is the different one second conductor 52, and a second conductor 52-3. Each of the three second conductors 52 described here will simply be referred to as the second conductor 52 in a case where distinction between these conductors is unnecessary. Moreover, shallow trench isolations (Shallow Trench Isolations) STI are provided in the second semiconductor layer 50 at portions near the third surface S3. Each of the second conductors 52 penetrates the corresponding shallow trench isolation STI.

For example, a material constituting the second conductors 52 is high melting metal. For example, tungsten (W), cobalt (Co), ruthenium (Ru), or a metal material containing at least any one of these materials may be adopted as the high melting metal. According to the present embodiment, the second material is tungsten, but is not limited to this example.

The fifth conductor 52-1 penetrates the third region 59A and the fourth region w1. Specifically, the third region 59A and the fourth region w1 are so provided as to overlap with each other in the planar view. More specifically, the fifth conductor 52-1 penetrates the third region 59A, a region indicated as p-sub in the figure and the fourth region w1. Accordingly, the third region 59A, the region indicated as p-sub in the figure, and the fourth region w1 are so provided as to overlap with each other in the planar view. A third surface S3 side end of the fifth conductor 52-1 is electrically connected to the transistor T2-1 provided in the first conductivity-type (p-type) semiconductor substrate p-sub. More specifically, the third surface S3 side end of the fifth conductor 52-1 is electrically connected to the gate electrode G included in the transistor T2-1 via the wire 42 and the via 44. A fourth surface S4 side end of the fifth conductor 52-1 is connected to the wire 62.

The sixth conductor 52-2 penetrates the third region 59A, the sixth region w3, and the fifth region w2. Specifically, the third region 59A, the sixth region w3, and the fifth region w2 are so provided as to overlap with each other in the planar view. A third surface S3 side end of the sixth conductor 52-2 is electrically connected to the transistor T2-2 provided in the first conductivity-type (p-type) semiconductor substrate p-sub. More specifically, the third surface S3 side end of the sixth conductor 52-2 is electrically connected to the gate electrode G included in the transistor T2-2 via the wire 42 and the via 44. A fourth surface S4 side end of the sixth conductor 52-2 is connected to the wire 62. The second conductor 52-3 is electrically connected to a reference potential (e.g., ground).

<Fixed Charge Film>

The first fixed charge film 47A is provided on an outer circumferential surface of the fifth conductor 52-1. More specifically, the first fixed charge film 47A is provided in such a manner as to cover the outer circumferential surface of the fifth conductor 52-1. The state where the first fixed charge film 47A is so provided as to cover the outer circumferential surface of the fifth conductor 52-1 as referred to here includes both a state where the first fixed charge film 47A is provided directly on the outer circumferential surface of the fifth conductor 52-1 and a state where the first fixed charge film 47A is provided indirectly on the outer circumferential surface of the fifth conductor 52-1 with the insulation film 41*m* interposed between the first fixed charge film 47A and the fifth conductor 52-1.

Moreover, the first fixed charge film 47A is also provided on an outer circumferential surface of the second conductor 52-3. More specifically, the first fixed charge film 47A is provided in such a manner as to cover the outer circumferential surface of the second conductor 52-3. The state where the first fixed charge film 47A is so provided as to cover the outer circumferential surface of the second conductor 52-3 referred to here includes both a state where the first fixed charge film 47A is provided directly on the outer circumferential surface of the second conductor 52-3 and a state where the first fixed charge film 47A is provided indirectly on the outer circumferential surface of the second conductor 52-3 with the insulation film 41*m* interposed between the first fixed charge film 47A and the second conductor 52-3.

Each of the first fixed charge film 47A and the fixed charge film 65 is an insulation film having a negative fixed charge. More specifically, in a case where the first conductivity type is the p type (the semiconductor substrate is a p-type substrate), each of the first fixed charge film 47A and the fixed charge film 65 is a negative fixed charge film. The insulation film having a negative fixed charge will be referred to as a negative fixed charge film. For example, a material constituting the negative fixed charge film is a metal oxide film (insulation film) including aluminum oxide ($Al_2O_3$), hafnium oxide ($Hf_2O_3$), tantalum oxide ($Ta_2O_3$), or the like, but is not limited to these examples. It is assumed here that both the first fixed charge film 47A and the fixed charge film 65 include the same material in the following description. However, these films may include different materials. Described in the present embodiment will be an example where both the first fixed charge film 47A and the fixed charge film 65 include aluminum oxide, for example. However, this configuration is not required to be adopted.

The second fixed charge film 47B is provided on an outer circumferential surface of the sixth conductor 52-2. More specifically, the second fixed charge film 47B is provided in such a manner as to cover the outer circumferential surface of the sixth conductor 52-2. The state where the second fixed charge film 47B is so provided as to cover the outer circumferential surface of the sixth conductor 52-2 referred to here includes both a state where the second fixed charge film 47B is provided directly on the outer circumferential surface of the sixth conductor 52-2 and a state where the second fixed charge film 47B is provided indirectly on the outer circumferential surface of the sixth conductor 52-2 with the insulation film 41*m* interposed between the second fixed charge film 47B and the sixth conductor 52-2.

The second fixed charge film 47B is an insulation film having a positive fixed charge. More specifically, in a case where the first conductivity type is the p type (the semiconductor substrate is a p-type substrate), the second fixed charge film 47B is a positive fixed charge film. The insulation film having a positive fixed charge will be referred to as a positive fixed charge film. For example, a material constituting the positive fixed charge film is silicon oxynitride (SiON), silicon oxide containing carbon (SiOC), silicon nitride (SiN), silicon oxide ($SiO_2$), or the like, but is not limited to these examples. Described in the present embodiment will be an example where the second fixed charge film 47B includes silicon nitride, for example. However, this configuration is not required to be adopted.

<<Manufacturing Method of Optical Detection Device>>

A manufacturing method of the optical detection device 1 will hereinafter be described with reference to FIGS. 86A to 86E. A manufacturing method of the fifth conductor 52-1 and the sixth conductor 52-2 will mainly be explained here. First, as depicted in FIG. 86A, such semiconductor regions as the fourth region w1, the fifth region w2, and the sixth region w3 are formed in the second semiconductor layer 50*w* with use of a known method. Thereafter, the shallow trench isolations STI, the transistors T2-1 and T2-2, and others are formed in the second semiconductor layer 50*w* near the third surface S3 with use of a known method. Then, the insulation film 41 is laminated on the third surface S3 side, and a hole 53B is formed at a position where the sixth conductor 52-2 is to be formed, in the planar view. The hole 53B penetrates the shallow-trench isolation STI, the fifth region w2, and the sixth region w3 in the thickness direction of the second semiconductor layer 50*w*, and reaches an interior of the region indicated as p-sub in the figure.

Subsequently, as depicted in FIG. 86B, a material (silicon nitride) constituting the second fixed charge film 47B as the positive fixed charge film, the insulation film 41*m*, and a material (tungsten) constituting the sixth conductor 52-2 are deposited in this order on an exposed surface of an inner wall of the hole 53B, and an unnecessary portion is removed by CMP. Then, electrons are accumulated on an outer circumference of the second fixed charge film 47B thus formed, and the eighth region 59C is produced as an electron accumulation region.

Thereafter, the fifth conductor 52-1 is also formed in a manner similar to the manner of the sixth conductor 52-2. More specifically, as depicted in FIG. 86C, a hole 53A is first formed at a position where the fifth conductor 52-1 is to be formed in the planar view. The hole 53A penetrates the shallow trench isolation STI and the fourth region w1 in the thickness direction of the second semiconductor layer 50*w*, and reaches an interior of the region indicated as p-sub in the figure. Subsequently, a material (aluminum oxide) constituting the first fixed charge film 47A as a negative fixed charge film, the insulation film 41*m*, and a material (tungsten) constituting the fifth conductor 52-1 are deposited in this order on an exposed surface of an inner wall of the hole 53A, and an unnecessary portion is removed by CMP. Then, holes are accumulated on an outer circumference of the first fixed charge film 47A thus formed, and the seventh region 59B is produced as a hole accumulation region. While not depicted in the figure, the second conductor 52-3 includes the same material and is formed by the same step as those of the fifth conductor 52-1. In other words, the second conductor 52-3 is formed simultaneously with the fifth conductor 52-1.

Subsequently, as depicted in FIG. 86D, the thickness of the second semiconductor layer 50*w* is reduced from the side opposite to the third surface S3 side by back grinding, CMP, chemical dry-etching, or other methods. Thereafter, as a result of this step, ends of the fifth conductor 52-1, the sixth conductor 52-2, and the unillustrated second conductor 52-3 are projected from the fourth surface S4. If any part of the first fixed charge film 47A and the second fixed charge film 47B is etched at the projected ends of the fifth conductor 52-1, the sixth conductor 52-2, and the second conductor 52-3 from the fourth surface S4, this etched part is only a small portion.

Next, as depicted in FIG. 86E, the fixed charge film 65 is deposited on the fourth surface S4. Then, holes are accumulated near the fixed charge film 65 (fourth surface S4), and the third region 59A is formed as a hole accumulation region. Steps following this step may be performed by a known method. Accordingly, these steps are not described here.

<<Main Advantageous Effects of Tenth Embodiment>>

Main advantageous effects of the tenth embodiment will hereinafter be described. Before the description of these effects, a conventional example depicted in FIG. 87 will be touched upon. According to the conventional example depicted in FIG. 87, neither the first fixed charge film 47A nor the second fixed charge film 47B is provided. Typically, when the hole 53A, the hole 53B, and the hole 53C are formed in the second semiconductor layer 50 by etching, defects are produced near processing surfaces of the second semiconductor layer 50 (i.e., around the hole 53A, the hole 53B, and the hole 53C). More specifically, defects are produced in the semiconductor layer at positions indicated by "X" in the figure around the fifth conductor 52-1, the sixth conductor 52-2, and the second conductor 52-3. Particularly, the depletion layer DL is produced in an area corresponding to the defect of each of the fifth conductor 52-1 and the sixth conductor 52-2. Accordingly, electrons generated from the depletion layers DL produced in the defective portions may flow into p-type semiconductor regions as leak currents.

Meanwhile, the optical detection device 1 according to the tenth embodiment of the present technology includes the first fixed charge film 47A which is a negative fixed charge film so provided as to cover the outer circumferential surface of the fifth conductor 52-1 and the second fixed charge film 47B which is a positive fixed charge film so provided as to cover the outer circumferential surface of the sixth conductor 52-2. Accordingly, the seventh region 59B is formed as a hole accumulation region in such a manner as to cover the outer circumferential surface of the first fixed charge film 47A. This configuration can reduce the depletion layers DL produced in the areas of defects near the processing surfaces of the second semiconductor layer 50, and therefore can reduce a flow of leak currents. Moreover, the eighth region 59C is formed as an electron accumulation region such that the outer circumferential surface of the second fixed charge film 47B is covered with electrons accumulated on the outer circumferential surface of the second fixed charge film 47B. This configuration can reduce the depletion layers DL produced in the areas of defects near the processing surfaces of the second semiconductor layer 50, and thus can reduce a flow of leak currents.

Moreover, according to the second semiconductor layer 50 included in the optical detection device 1 of the tenth embodiment of the present technology, the sixth conductor 52-2 penetrates the third region 59A as a p-type semiconductor region, the sixth region w3 as an n-type semiconductor region, and the fifth region w2 as a p-type semiconductor region, and includes the eighth region 59C which is an n-type semiconductor region and covers the outer circumferential surface of the second fixed charge film 47B. The conductivity type of the eighth region 59C is the same as the conductivity type (n-type) of the sixth region w3. Accordingly, the eighth region 59C provided together with the sixth region w3 between the third region 59A and the fifth region w2 both forming the p-type semiconductor region can electrically separate the third region 59A and the fifth region w2 from each other. This configuration can reduce a flow of leak currents between the third region 59A and the fifth region w2.

While the second conductor 52-3 and the fifth conductor 52-1 are simultaneously formed to reduce the number of steps according to the optical detection device 1 of the tenth embodiment described above, the present technology is not limited to this example. The second conductor 52-3 and the fifth conductor 52-1 may be separately formed. In that case, in the pair of the first fixed charge film 47A and the insulation film 41*m*, only the insulation film 41*m* may be provided on the outer circumferential surface of the second conductor 52-3. This configuration is adoptable for the following reason. As depicted in FIGS. 85 and 87, the second conductor 52-3 penetrates only the first conductivity-type (p-type) semiconductor region in the pair of the first conductivity-type (p-type) semiconductor region and the second conductivity-type (n-type) semiconductor region. Accordingly, no depletion layer is produced in a defective portion of the semiconductor layer.

Moreover, according to the optical detection device 1 of the tenth embodiment described above, a portion near the fourth surface S4 in the eighth region 59C corresponding to the electron accumulation region may be affected by the negative fixed charge film 65. In this case, effects for achieving n-type conductivity may be lowered. However, the portion near the fourth surface S4 in the eighth region 59C is a portion near the bottom surface of the hole 53B. In addition, the number of colliding ions during etching is smaller in the bottom surface of the hole 53B than in other portions. Accordingly, it is considered that less defects are produced in the semiconductor layer near the bottom surface of the hole 53B. Further, even if the effects for achieving n-type conductivity in the portion near the fourth surface S4 in the eighth region 59C are lowered, required is only electric separation between the third region 59A and the fifth region w2 corresponding to the p-type semiconductor regions.

Moreover, according to the optical detection device 1 of the tenth embodiment described above, the eighth region 59C corresponding to the electron accumulation region is formed by providing the second fixed charge film 47B. However, the present technology is not limited to this example. Before filling of the hole 53B, impurities may be implanted to the exposed surface of the hole 53B by ion implantation, such as plasma ion implantation, to form the eighth region 59C. Alternatively, impurities may be implanted to the exposed surface of the hole 53B by solid-phase diffusion to form the eighth region 59C.

Further, according to the optical detection device 1 of the tenth embodiment described above, the third surface S3 side end of the fifth conductor 52-1 is electrically connected to the gate electrode G included in the transistor T2-1 via the wire 42 and the via 44. However, the present technology is not limited to this example. The third surface S3 side end of the fifth conductor 52-1 may be electrically connected to a source region or a drain region included in the transistor T2-1. Similarly, while the third surface S3 side end of the sixth conductor 52-2 is electrically connected to the gate electrode G included in the transistor T2-2 via the wire 42 and the via 44, the present technology is not limited to this example. The third surface S3 side end of the sixth conductor 52-2 may be electrically connected to a source region or a drain region included in the transistor T2-2.

<<Modifications of Tenth Embodiment>>

Hereinafter described will be modifications of the tenth embodiment.

<Modification 1>

According to the optical detection device 1 of the tenth embodiment described above, the first conductivity type is the p type, and the second conductivity type is the n type. However, according to the optical detection device 1 in modification 1 of the tenth embodiment depicted in FIG. 88, the first conductivity type is the n type, and the second conductivity type is the p type. Note that parts common to the corresponding parts in the optical detection device 1 of the tenth embodiment are not repeatedly described. Moreover, needless to say, even parts not described hereinafter are also applicable to the present modification by changing the n type to the p type, the p type to the n type, a positive sign to a negative sign, a negative sign to a positive sign, and other various changes in the tenth embodiment.

(Second Semiconductor Layer)

The second semiconductor layer 50 is a semiconductor layer formed by a first conductivity-type (n-type) semiconductor substrate n-sub. The second semiconductor layer 50 is a semiconductor layer which has a p-type semiconductor region and an n-type semiconductor region formed in the first conductivity-type (n-type) semiconductor substrate n-sub. For example, the second semiconductor layer 50 includes the third region 59A which is a first conductivity-type (n-type) semiconductor region and located on the fourth surface S4 side in the thickness direction of the second semiconductor layer 50, the fourth region w1 which is a second conductivity-type (p-type) semiconductor region and located on the third surface S3 side in the thickness direction of the second semiconductor layer 50, the fifth region w2 which is a first conductivity-type (n-type) semiconductor region and located on the third surface S3 side in the thickness direction of the second semiconductor layer 50, the sixth region w3 which is a second conductivity-type (p-type) semiconductor region and located between the third region 59A and the fifth region w2, the seventh region 59B which is a first conductivity-type (n-type) semiconductor region, and the eighth region 59C which is a second conductivity-type (p-type) semiconductor region. However, this configuration is not required to be adopted. Hereinafter, the respective semiconductor regions will be more specifically described.

The third region 59A is a region where electrons are accumulated near the fourth surface S4, i.e., an electron accumulation region, produced by the fixed charge film 65 which is an insulation film having a positive fixed charge. The fourth region w1 is a p-type well region. A transistor T2-1 (second transistor, NMOS), which is an n-channel conductivity-type field effect transistor, is provided within the fourth region w1. The fifth region w2 is an n-type well region. A transistor T2-2 (third transistor, PMOS), which is a p-channel conductivity-type field effect transistor, is provided within the fifth region w2. The sixth region w3 is a p-type well region provided at a deep position in the thickness direction of the second semiconductor layer 50, and electrically separates the third region 59A and the fifth region w2 from each other. The sixth region w3 can reduce a flow of electrons between the third region 59A and the fifth region w2.

The seventh region 59B is located on the outer circumference of the first fixed charge film 47A which is a positive fixed charge film described below, and covers the outer circumferential surface of the first fixed charge film 47A. The seventh region 59B is a region where electrons are accumulated near the first fixed charge film 47A, i.e., an electronic accumulation region. The eighth region 59C is located on the outer circumference of the second fixed charge film 47B which is a negative fixed charge film described below, and covers the outer circumferential surface of the second fixed charge film 47B. The eighth region 59C is a region where holes are accumulated near the second fixed charge film 47B, i.e., a hole accumulation region. The eighth region 59C exhibits the same conductivity-type as that of the sixth region w3 (the p-type in the present modification), and electrically separates the third region 59A and the fifth region w2 from each other in cooperation with the sixth region w3. More specifically, the sixth region w3 is continuously formed from the eighth region 59C in the horizontal direction. Accordingly, the eighth region 59C electrically separates the third region 59A and the fifth region w2 from each other in cooperation with the sixth region w3.

(Second Conductor)

The third surface S3 side end of the fifth conductor 52-1 is electrically connected to the transistor T2-1 provided in the first conductivity-type (n-type) semiconductor substrate n-sub. More specifically, the third surface S3 side end of the fifth conductor 52-1 is electrically connected to the gate electrode G included in the transistor T2-1 via the wire 42 and the via 44. In addition, the third surface S3 side end of the sixth conductor 52-2 is electrically connected to the transistor T2-2 provided in the first conductivity-type (n-type) semiconductor substrate n-sub. More specifically, the third surface S3 side end of the sixth conductor 52-2 is electrically connected to the gate electrode G included in the transistor T2-2 via the wire 42 and the via 44.

(Fixed Charge Film)

Each of the first fixed charge film 47A and the fixed charge film 65 is a positive fixed charge film. In addition, the second fixed charge film 47B is a negative fixed charge film. In a case where the first conductivity type is the n type (the semiconductor substrate is an n-type substrate), each of the first fixed charge film 47A and the fixed charge film 65 is a positive fixed charge film, while the second fixed charge film 47B is a negative fixed charge film.

Advantageous effects similar to those of the optical detection device 1 of the tenth embodiment described above can be offered by the optical detection device 1 according to modification 1 of the tenth embodiment described here.

<Modification 2>

According to the optical detection device 1 of the tenth embodiment described above, the first fixed charge film 47A and the fixed charge film 65 are negative fixed charge films, and the second fixed charge film 47B is a positive fixed charge film. However, according to the optical detection device 1 in modification 2 of the tenth embodiment depicted in FIG. 89, all of the first fixed charge film 47A, the fixed charge film 65, and the second fixed charge film 47B are negative fixed charge films.

Note that parts common to the corresponding parts in the optical detection device 1 of the tenth embodiment are not repeatedly described. Moreover, needless to say, even parts not described hereinafter are also applicable to the present modification by changing the n type to the p type, the p type to the n type, a positive sign to a negative sign, a negative sign to a positive sign, and other various changes in the tenth embodiment.

All of the first fixed charge film 47A, the fixed charge film 65, and the second fixed charge film 47B are negative fixed charge films. The eighth region 59C is located on the outer circumference of the second fixed charge film 47B, and covers the outer circumferential surface of the second fixed charge film 47B. The eighth region 59C is a region where holes are accumulated near the second fixed charge film 47B, i.e., a hole accumulation region. This configuration can reduce the depletion layers DL produced in the areas of defects near the processing surfaces of the second semiconductor layer 50, and thus can reduce a flow of leak currents.

In addition, the eighth region 59C has the same conductivity type as the conductivity type of the third region 59A and the fifth region w2. Accordingly, the third region 59A and the fifth region w2 are electrically connected to each other via the eighth region 59C.

Similarly to the optical detection device 1 according to the tenth embodiment described above, the optical detection device 1 according to modification 2 of the tenth embodiment thus configured can also reduce the depletion layers DL produced in the areas of defects near the processing surfaces of the second semiconductor layer 50, and thus can reduce a flow of leak currents from the depletion layers DL.

Eleventh Embodiment

Hereinafter described will be the eleventh embodiment of the present technology depicted in FIGS. 90A to 90C. The optical detection device 1 according to the present eleventh embodiment is different from the optical detection device 1 according to the first embodiment described above in a point that a second conductor 52D is provided in place of the second conductor 52. Other configurations of the optical detection device 1 are basically similar to the corresponding configurations of the optical detection device 1 according to the first embodiment described above. Note that the constituent elements already described will be given the same reference signs, and will not be repeatedly explained.

<<Configuration of Optical Detection Device>>

The configuration of the optical detection device 1 according to the eleventh embodiment of the present technology will hereinafter be described while focus is placed on a part different from the configuration of the optical detection device 1 according to the first embodiment described above. Note that scales of constituent elements depicted in some of the figures associated with the present eleventh embodiment are different from scales of the same constituent elements in the other figures describing the eleventh embodiment. Moreover, the barrier metal layer is not depicted in the figures explaining the present eleventh embodiment.

<Second Conductor>

As depicted in FIG. 90A, one second conductor 52D has a seventh conductor 52D1 located near the third surface S3 and an eighth conductor 52D2 located near the fourth surface S4 in the thickness direction of the second semiconductor layer 50. As depicted in FIG. 90B, a first end D1*a* of the seventh conductor 52D1 as an end near the fourth surface S4 is connected within the second semiconductor layer 50 to a second end D2*a* of the eighth conductor 52D2 as an end near the third surface S3.

In the thickness direction of the second semiconductor layer 50, the diameter of the seventh conductor 52D1 gradually decreases with nearness to the first end D1*a*, while the diameter of the eighth conductor 52D2 gradually decreases with nearness to the second end D2*a*. Accordingly, the smaller end of the seventh conductor 52D1 and the smaller end of the eighth conductor 52D2 in the thickness direction of the second semiconductor layer 50 are connected to each other. This configuration is provided for the following reason. The seventh conductor 52D1 is formed from the third surface S3 side, while the eighth conductor 52D2 is formed from the fourth surface S4 side. The conductors 52D1 and 52D2 are connected to each other within the second semiconductor layer 50. This configuration will be described in more detail in a following manufacturing method.

In addition, a diameter D2S4 of the eighth conductor 52D2 at a position of the fourth surface S4 in the thickness direction of the second semiconductor layer 50 is larger than a diameter D1S3 of the seventh conductor 52D1 at a position of the third surface S3. When the third surface S3 side and the fourth surface S4 side in the second semiconductor layer 50 are compared, a larger number of structures are provided on the third surface S3 side than on the fourth surface S4 side as depicted in FIG. 90A. More specifically, elements and structures such as the transistors T2 and the second conductor 52D are provided on the third surface S3 side. However, even though the second conductor 52D is provided on the fourth surface S4 side, elements such as the transistors T2 are not provided on this surface. For example, the readout circuit 15 depicted in FIG. 3 and the seventh conductor 52D1 are provided for each of the pixels 3 (photoelectric conversion regions 20) on the third surface S3 side, while this configuration is not required to be adopted. Meanwhile, for example, only the eighth conductor 52D2 is provided on the fourth surface S4 side, while this configuration is not required to be adopted. In this case, a severer design rule is imposed on the fourth surface S4 side than on the third surface S3 side. Accordingly, the eighth conductor 52D2 is less subject to a limitation of the design rule than the seventh conductor 52D1. In this case, the diameter D2S4 is allowed to be made larger than the diameter D1S3 as depicted in FIG. 90B. Moreover, a junction position between the first end D1*a* and the second end D2*a* is located near the third surface S3 in the pair of the third surface S3 and the fourth surface S4, in the thickness direction of the second semiconductor layer 50. The conductor which is the seventh conductor 52D1 or the eighth conductor 52D2 and is less subject to the limitation of the design rule has a larger diameter and a larger length (depth).

The second conductor 52D includes metal. Examples of the material constituting the second conductor 52D include tungsten, ruthenium, aluminum, and copper. The present embodiment will be explained on an assumption that the second conductor 52D includes tungsten.

As depicted in FIG. 90A, the second conductor 52D and the second semiconductor layer 50 are insulated from each other by an insulation film iso provided on an outer circumferential surface of the second conductor 52D. The insulation film iso includes the insulation film 41*m* mainly provided on an outer circumferential surface of the seventh conductor 52D1, and an insulation film 61*m*7 mainly provided on an outer circumferential surface of the eighth conductor 52D2. For example, the insulation film iso is a film including silicon oxide, but is not limited to this example.

FIG. 90C is an explanatory diagram depicting a size relation between the seventh conductor 52D1, the eighth conductor 52D2, and the insulation film iso in the planar view at a junction position between the seventh conductor 52D1 and the eighth conductor 52D2. More specifically, FIG. 90C depicts a size relation between the first end D1*a* of the seventh conductor 52D1, the second end D2*a* of the eighth conductor 52D2, and the insulation film iso in the planar view. A diameter D2*ad* of the second end D2*a* is different from a diameter D1*ad* of the first end D1*a*. More specifically, the diameter D2*ad* of the second end D2*a* is larger than the diameter D1*ad* of the first end D1*a*. Moreover, when the diameters D1*ad* and D2*ad* are compared with the diameters D1S3 and D2S4 depicted in FIG. 90B, the diameter D1S3 is larger than the diameter D1*ad*, and the diameter D2S4 is larger than the diameter D2*ad*.

Further, as depicted in FIG. 90B, a thickness of the insulation film iso formed at a portion on an outer circumferential surface of the first end D1*a* or the second end D2*a* as an end having a smaller diameter is larger than a thickness of the insulation film iso located at a portion other than this smaller end and formed on an outer circumferential surface of the conductor which is the seventh conductor 52D1 or the eighth conductor 52D2 and has the first end D1*a* or the second end D2*a* as the smaller end. In the pair of the first end D1*a* and the second end D2*a*, the first end D1*a* is the end having a smaller diameter according to the present embodiment. In addition, a thickness dsio1 of the insulation film iso at the portion formed on the outer circumferential surface of the first end D1*a* is larger than a thickness diso2 at the portion on the outer circumferential surface of the seventh conductor 52D1 other than the first end D1*a*.

<Transistor>

As depicted in FIG. 90A, the transistors T2 are FINFET-type transistors. The FINFET-type transistors T2 have already been described, and hence will not be repeatedly explained in detail here.

<<Manufacturing Method of Optical Detection Device>>

A manufacturing method of the optical detection device 1 will hereinafter be described with reference to FIGS. 91A to 91F. A manufacturing method of the second conductor 52D will mainly be explained here. First, as depicted in FIG. 91A, the transistors T2 and the like are formed in the second semiconductor layer 50*w* from the third surface S3 side. Next, the seventh conductor 52D1 and the like are formed in the second semiconductor layer 50*w* from the third surface S3 side. More specifically, a hole 53D is formed by a known lithography technology and a known etching technology, a material (tungsten) constituting the insulation film 41*m* and the seventh conductor 52D1 is laminated in this order on an exposed surface of an inner wall of the hole 53D, and an unnecessary portion is removed by a known method (e.g., CMP) to produce the seventh conductor 52D1. Note here that the hole 53D having a smaller depth than the hole 53 depicted in FIG. 5B is formed, for example. This configuration is adopted because a necessity of forming the hole 53D having a large depth is eliminated due to no necessity of exposure of the end of the seventh conductor 52D1 from the fourth surface S4. This configuration will be explained in a step presented below. Thereafter, the second wiring layer 40 is completed. Then, the second semiconductor layer 50*w* on which the second wiring layer 40 is laminated is turned over and deployed.

Subsequently, as depicted in FIG. 91B, the second semiconductor layer 50*w* is ground from the side opposite to the third surface S3 side by a known method such as back grinding and CMP to be reduced in thickness. As a result, a portion corresponding to the second semiconductor layer 50 is left. Thereafter, the fourth surface S4 flattened by a known method such as back grinding and CMP is produced. In this case, the second semiconductor layer 50*w* is ground by such an amount that the seventh conductor 52D1 is not exposed. The grinding of the second semiconductor layer 50*w* ends in such a state that the semiconductor layer covering the fourth surface S4 side end of the seventh conductor 52D1 still remains. In such a manner, exposure of the seventh conductor 52D1 from the fourth surface S4 is prevented. Thereafter, an insulation film 61*m*6 is laminated on the fourth surface S4. Note that the insulation film 61*m*6 may be laminated after lamination of other films such as the silicon cover film 65 on the fourth surface S4 is completed.

Subsequently, as depicted in FIG. 91C, a resist pattern R7 having an opening R7*a* is formed on an exposed surface of the insulation film 61*m*6. The opening R7*a* is positioned for the seventh conductor 52D1 (hole 53D) in the planar view. More specifically, the opening R7*a* is provided at such a position that at least a part of projection of the opening R7*a* overlaps with the seventh conductor 52D1 (hole 53D) in the planar view. Thereafter, the portion exposed through the opening R7*a* is etched by a known etching technology to produce a hole 53E. The hole 53E is formed in such a shape as to penetrate the insulation film 61*m*6, penetrate the flattened fourth surface S4, and reach the interior of the second semiconductor layer 50*w*. Then, etching is carried out until the fourth surface S4 side end of the seventh conductor 52D1 is exposed on the bottom of the hole 53E. Note that the exposure amount of the end of the seventh conductor 52D1 is not limited to the amount depicted in FIG. 91C. Thereafter, the resist pattern R7 is removed. In such a manner, the hole 53E can be formed such that at least a part of projection of the hole 53E overlaps with the hole 53D in the planar view.

Subsequently, as depicted in FIG. 91D, the insulation film 61*m*7 is laminated for insulation between the eighth conductor 52D2 and the second semiconductor layer 50. Thereafter, as depicted in FIG. 91E, an unnecessary portion of the insulation film 61*m*7 is etched back to remove this portion. In such a manner, the end of the seventh conductor 52D1 is exposed on the bottom of the hole 53E. In addition, the insulation film 61*m*7 remains on the side wall of the hole 53E. Then, as depicted in FIG. 91F, a material (tungsten) constituting the eighth conductor 52D2 is laminated in such a manner as to fill the hole 53E. The laminated tungsten is connected within the hole 53E to the exposed end of the seventh conductor 52D1 at the bottom of the hole 53E. In such a manner, the first end D1*a* and the second end D2*a* are connected to each other. Thereafter, an unnecessary portion of the tungsten is removed by a known method such as etching back and CMP to produce the eighth conductor 52D2. As described above, the eighth conductor 52D2 is formed from the fourth surface S4 after flattening of the fourth surface S4. Steps following this step may be performed by a known method. Accordingly, these steps are not described here.

<<Main Advantageous Effects of Eleventh Embodiment>>

Main advantageous effects of the eleventh embodiment will hereinafter be described. Before the description of these effects, a conventional example will be touched upon. There is a case where the second conductor 52 provided for each of the pixels 3 is disposed in a narrow area between the transistors T2. In that case, it is necessary to decrease the diameter of the second conductor 52, and to secure a sufficient length of the second conductor 52 for penetrating the second semiconductor layer 50. When the size of the pixel 3 is reduced, the second conductor 52 having a high aspect ratio may be difficult to form.

Moreover, the diameter of the second conductor 52 gradually decreases from one end to the other end in the thickness direction of the second semiconductor layer 50. This shape is formed because a gradual decrease in the diameter of the hole 53 toward the bottom of the hole 53 is produced by etching of the hole 53 in which the second conductor 52 is provided. Accordingly, depending on the thickness of the second semiconductor layer 50, the diameter of the smaller end of the second conductor 52 further decreases, and sufficient junction with a wire may become difficult to achieve in some cases.

Further, in the step for exposing the second conductor 52 from the fourth surface S4, the semiconductor layer may remain while rising on the side surface of the second conductor 52 as depicted in FIG. 92A. When the wire 62 is formed in that case, the semiconductor layer remaining and rising on the side surface of the second conductor 52 comes into contact with the wire 62, and may cause short-circuiting between the second semiconductor layer 50 and the wire 62 as depicted in FIG. 92B.

Meanwhile, according to the optical detection device 1 of the eleventh embodiment of the present technology, the one second conductor 52D has the seventh conductor 52D1 located near the third surface S3 and the eighth conductor 52D2 located near the fourth surface S4, in the thickness direction of the second semiconductor layer 50. The first end D1*a* which is the fourth surface S4 side end of the seventh conductor 52D1 is connected to the second end D2*a* which is the third surface S3 side end of the eighth conductor 52D2 within the second semiconductor layer 50. As described above, the one second conductor 52D is formed from the third surface S3 side and the fourth surface S4 side in two steps. In this case, the aspect ratio of the seventh conductor 52D1 and the aspect ratio of the eighth conductor 52D2 can be made lower than in a case of formation not in two steps. Accordingly, a difficulty increase in manufacturing the second conductor 52D can be reduced even in a case of reduction of the size of the pixel 3.

Moreover, according to the optical detection device 1 in the eleventh embodiment of the present technology, the conductor which is the seventh conductor 52D1 or the eighth conductor 52D2 and less subject to a limitation of design rule has a larger diameter. Accordingly, a difficulty increase in manufacturing the second conductor 52D can be further reduced even in a case of reduction of the size of the pixel 3.

Further, according to the optical detection device 1 in the eleventh embodiment of the present technology, the junction position between the first end D1*a* and the second end D2*a* is located near the third surface S3 side in the pair of the third surface S3 side and the fourth surface S4 side, in the thickness direction of the second semiconductor layer 50. Specifically, the conductor which is the seventh conductor 52D1 or the eighth conductor 52D2 and less subject to a limitation of the design rule has a large width and a large length (depth) within the second semiconductor layer 50. Accordingly, a difficulty increase in manufacturing the second conductor 52D can be further reduced even in a case of reduction of the size of the pixel 3.

In addition, according to the optical detection device 1 in the eleventh embodiment of the present technology, the one second conductor 52D is formed from the third surface S3 side and the fourth surface S4 side in two steps. In this case, the diameter of the seventh conductor 52D1 increases with nearness to the wire 42M0, while the diameter of the eighth conductor 52D2 increases with nearness to the wire 62. Accordingly, a contact area between the seventh conductor 52D1 and the wire 42M0 increases, and thus, reliable connection therebetween can be achieved. In addition, an increase in contact resistance can be reduced. Similarly, a contact area between the eighth conductor 52D2 and the wire 62 increases, and thus, reliable connection therebetween can be achieved. In addition, an increase in contact resistance can be reduced. In such a manner, insufficient junction between the second conductor 52 and the wire can be reduced. Even in a case of reduction of the size of the pixel 3, insufficient junction between the second conductor 52 and the wire can be reduced. Moreover, reduction of a decrease in the diameter of the second conductor 52 thus achieved contributes to reduction of an increase in resistance of the second conductor 52.

In addition, according to the optical detection device 1 in the eleventh embodiment of the present technology, the one second conductor 52D is formed from the third surface S3 side and the fourth surface S4 side in two steps. Accordingly, a necessity of exposing the second conductor from the fourth surface S4 by selective etching of the second semiconductor layer 50 is eliminated at the time of reduction of the thickness of the second semiconductor layer 50 from the side opposite to the third surface S3 side. Further, the eighth conductor 52D2 according to the present technology is formed from the fourth surface S4 side after flattening of the fourth surface S4. This configuration reduces the semiconductor layer remaining and rising on the side surface of the second conductor 52. Accordingly, reduction of short-circuiting between the second semiconductor layer 50 and the wire 62 is achievable.

While the diameter D2*ad* of the second end D2*a* is different from the diameter D1*ad* of the first end D1*a* in the optical detection device 1 according to the eleventh embodiment described above, the present technology is not limited to this example. The diameter D2*ad* and the diameter D1*ad* of the first end D1*a* may be the same diameter.

<<Modifications of Eleventh Embodiment>>

Hereinafter described will be modifications of the eleventh embodiment.

<Modification 1>

While the diameter of the eighth conductor 52D2 is larger than the diameter of the seventh conductor 52D1 in the optical detection device 1 according to the eleventh embodiment described above, the diameter of the seventh conductor 52D1 is larger than the diameter of the eighth conductor 52D2 in the optical detection device 1 according to modification 1 of the eleventh embodiment depicted in FIGS. 93A to 93C.

As depicted in FIG. 93B, the diameter D2S4 of the eighth conductor 52D2 is smaller than the diameter D1S3 of the seventh conductor 52D1 at a position in the third surface S3. As depicted in FIG. 93C, the diameter D2*ad* of the second end D2*a* is smaller than the diameter D1*ad* of the first end D1*a*. Moreover, when the diameters D1*ad* and D2*ad* are compared with the diameters D1S3 and D2S4 depicted in FIG. 93B, the diameter D1S3 is larger than the diameter D1*ad*, while the diameter D2S4 is larger than the diameter D2*ad*.

In addition, as depicted in FIG. 93B, the thickness dsio1 of the insulation film iso at the portion formed on the outer circumferential surface of the second end D2*a* is larger than the thickness diso2 at the portion on the outer circumferential surface of the eighth conductor 52D2 other than the second end D2*a*.

Advantageous effects similar to those of the optical detection device 1 of the eleventh embodiment described above can be offered by the optical detection device 1 according to modification 1 of the eleventh embodiment described here.

<Modification 2>

While each of the seventh conductor 52D1 and the eighth conductor 52D2 of the optical detection device 1 according to the eleventh embodiment described above is substantially circular in the planar view, the present technology is not limited to this example. According to the optical detection device 1 in modification 2 of the eleventh embodiment depicted in FIGS. 94A, 94B, and 94C, the seventh conductor 52D1 and the eighth conductor 52D2 have rectangular shapes which are long in directions different from each other in the planar view. In addition, the seventh conductor 52D1 and the eighth conductor 52D2 cross each other in the planar view.

FIG. 94C referred to here is an explanatory diagram depicting a size relation between the seventh conductor 52D1, the eighth conductor 52D2, and the insulation film iso in the planar view at the junction position between the seventh conductor 52D1 and the eighth conductor 52D2. More specifically, FIG. 94C depicts a size relation between the first end D1*a* of the seventh conductor 52D1, the second end D2*a* of the eighth conductor 52D2, and the insulation film iso in the planar view.

Each of the seventh conductor 52D1 and the eighth conductor 52D2 has a rectangular shape which has long sides and short sides in the planar view. The direction in which the long sides of the seventh conductor 52D1 extend crosses the direction in which the long sides of the eighth conductor 52D2 extend. According to the example depicted in FIG. 94A and FIG. 94C, the direction in which the long sides of the seventh conductor 52D1 extend crosses the direction in which the long sides of the eighth conductor 52D2 extend at right angles. More specifically, in FIG. 94A and FIG. 94C, the vertical direction in the figure corresponds to the direction in which the long sides of the seventh conductor 52D1 extend, and the left-right direction in the figure corresponds to the direction in which the long sides of the eighth conductor 52D2 extend. The seventh conductor 52D1 and the eighth conductor 52D2 have rectangular shapes which are long in directions different from each other in the planar view.

Moreover, each of the first end D1*a* and the second end D2*a* also has a rectangular shape which has long sides and short sides in the planar view. The direction in which the long sides of the first end D1*a* extend crosses the direction in which the long sides of the second end D2*a* extend. According to the example depicted in FIG. 94C, the direction in which the long sides of the first end D1*a* extend crosses the direction in which the long sides of the second end D2*a* extend at right angles. A part of the first end D1*a* overlaps with the second end D2*a*, and the first end D1*a* and the second end D2*a* are connected to each other at this overlapped portion.

There is a possibility that a forming position of at least either the seventh conductor 52D1 or the eighth conductor 52D2 deviates during the manufacturing step of the second conductor 52D. Even in such a case, the first end D1*a* and the second end D2*a* are connectable to each other by contact between one and the other of the ends D1*a* and D2*a* at any position in the long side directions of the rectangular shapes.

Advantageous effects similar to those of the optical detection device 1 of the eleventh embodiment described above can be offered by the optical detection device 1 according to modification 2 of the eleventh embodiment described here.

Moreover, according to the optical detection device 1 in modification 2 of the eleventh embodiment, the seventh conductor 52D1 and the eighth conductor 52D2 have rectangular shapes which are long in directions different from each other in the planar view. Accordingly, an overlapping margin can be widened by these elongated shapes. Accordingly, even in a case of deviation of the overlap between the first end D1*a* and the second end D2*a*, one and the other of these ends D1*a* and D2*a* are connectable to each other at any position in the long side directions of the rectangular shapes. Hence, this configuration can reduce opening of the connection between the first end D1*a* and the second end D2*a*.

Note that a size relation between the seventh conductor 52D1, the eighth conductor 52D2, the first end D1*a*, and the second end D2*a* (a size relation between the long sides, a size relation between the short sides) may be the same as the corresponding relation in the eleventh embodiment or modification 1 of the eleventh embodiment described above.

<Modification 3>

While the transistors T2 of the optical detection device 1 according to the eleventh embodiment described above are FINFET-type transistors, the transistors T2 of the optical detection device 1 according to modification 3 of the eleventh embodiment depicted in FIG. 95 are planar-type transistors.

Note that the hole 53D for forming the seventh conductor 52D1 may be formed by either the same step as or a different step from the step for forming the hole 44*h* for forming the via 44 in the manufacturing method. In a case where these holes are formed by the same step, etching for forming the hole 53D is advanced to reach the inside of the second semiconductor layer 50 while the etching speed for the hole 44*h* is lowered by the material constituting the gate electrodes of the transistors T2.

Advantageous effects similar to those of the optical detection device 1 of the eleventh embodiment described above can be offered by the optical detection device 1 according to modification 3 of the eleventh embodiment described here.

Note that the size relation between the seventh conductor 52D1, the eighth conductor 52D2, the first end D1*a*, and the second end D2*a* may be the same as the corresponding relation in the eleventh embodiment or modification 1 of the eleventh embodiment described above. Moreover, shapes of the seventh conductor 52D1, the eighth conductor 52D2, the first end D1*a*, and the second end D2*a* in the planar view may be the same as the corresponding shapes in modification 2 of the eleventh embodiment described above.

Twelfth Embodiment

<1. Example of Application to Electronic Apparatus>

Subsequently described will be an electronic apparatus 100 according to the twelfth embodiment of the present technology depicted in FIG. 96. The electronic apparatus 100 includes a solid-state imaging device 101, an optical lens 102, a shutter device 103, a driving circuit 104, and a signal processing circuit 105. For example, the electronic apparatus 100 is an electronic apparatus such as a camera, but is not limited to this example. Moreover, the electronic apparatus 100 includes the optical detection device 1 described above, as the solid-state imaging device 101.

The optical lens (optical system) 102 forms an image of image light (incident light 106) coming from a subject on an imaging surface of the solid-state imaging device 101. In such a manner, s signal charge is accumulated in the solid-state imaging device 101 for a certain period of time. The shutter device 103 controls a light irradiation period and a light shielding period to and from the solid-state imaging device 101. The driving circuit 104 supplies driving signals for controlling a transfer operation of the solid-state imaging device 101 and a shutter operation of the shutter device 103. Signal transfer is achieved by the solid-state imaging device 101 according to a driving signal (timing signal) supplied from the driving circuit 104. The signal processing circuit 105 performs various types of signal processing for a signal (pixel signal) output from the solid-state imaging device 101. A video signal subjected to the signal processing is stored in a storage medium such as a memory, or output to a monitor.

The electronic apparatus 100 thus configured includes the optical detection device 1 which is a low power consumption and high speed type device functioning as the solid-state imaging device 101. Accordingly, reduction of power consumption and further speed-up of the electronic apparatus 100 are achievable.

Note that the electronic apparatus 100 is not limited to the camera, and is applicable to other electronic apparatuses. For example, the electronic apparatus 100 may be an imaging apparatus such as a camera module for a mobile apparatus such as a cellular phone.

Moreover, the electronic apparatus 100 is allowed to include the optical detection device 1 according to any one of the first to eleventh embodiments and the modifications of these embodiments, or the optical detection device 1 associated with a combination of at least two of the first to eleventh embodiments and the modifications of these embodiments, as the solid-state imaging device 101.

<2. Example of Application to Mobile Body>

The technology according to the present disclosure (present technology) is applicable to various products. For example, the technology according to the present disclosure may be implemented as a device mounted on any type of mobile bodies such as a car, an electric car, a hybrid electric car, a motorcycle, a bicycle, a personal mobility, an airplane, a drone, a vessel, and a robot.

FIG. 97 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 97, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 97, an audio speaker 12061, a display section 12062, and an instrument panel 12063 are illustrated as the output device. The display section 12062 may, for example, include at least one of an on-board display and a head-up display.

FIG. 98 is a diagram depicting an example of the installation position of the imaging section 12031.

In FIG. 98, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 98 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Described above has been the one example of the vehicle control system to which the technology according to the present disclosure is applicable. For example, the technology according to the present disclosure is applicable to the plurality of electronic control units and the imaging section 12031 described above in the configurations presented above. Specifically, an optical detection device including any one of the first conductor, the second conductor, the third conductor, the fourth conductor, the fifth conductor, the sixth conductor, the seventh conductor, the eighth conductor, and the like depicted in FIG. 4B and other figures is applicable to the plurality of electronic control units and the imaging section 12031 described above. By applying the technology according to the present disclosure to the electronic control units and the imaging section 12031, desired through electrodes are allowed to be formed. Accordingly, a degree of freedom in design of the electronic control units and the imaging section 12031 can be raised.

<3. Example of Application to Endoscopic Surgery System>

The technology according to the present disclosure (present technology) is applicable to various products. For example, the technology according to the present disclosure may be applied to an endoscopic surgery system.

FIG. 99 is a view depicting an example of a schematic configuration of an endoscopic surgery system to which the technology according to an embodiment of the present disclosure (present technology) can be applied.

In FIG. 99, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photoelectrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 100 is a block diagram depicting an example of a functional configuration of the camera head 11102 and the CCU 11201 depicted in FIG. 99.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

Described above has been the one example of the endoscopic surgery system to which the technology according to the present disclosure is applicable. For example, the technology according to the present disclosure is applicable to the CCU 11201 and the image pickup unit 11402 of the camera head 11102 in the configurations described above. Specifically, an optical detection device including any one of the first conductor, the second conductor, the third conductor, the fourth conductor, the fifth conductor, the sixth conductor, the seventh conductor, the eighth conductor, and the like depicted in FIG. 4B and other figures is applicable to the CCU 11201 and the image pickup unit 10402. By applying the technology according to the present disclosure to the CCU 11201 and the image pickup unit 10402, desired through electrodes are allowed to be formed. Accordingly, a degree of freedom in design of the CCU 11201 and the image pickup unit 10402 rises.

While the endoscopic surgery system has been described here by way of example, the technology according to the present disclosure is also applicable to others such as a microscopic surgery system.

Thirteenth Embodiment

Hereinafter described will be a thirteenth embodiment of the present technology depicted in FIGS. 101A to 101D. The optical detection device 1 according to the present thirteenth embodiment is different from the optical detection device 1 according to the first embodiment described above in that a first conductor 51E is provided in place of the first conductor 51 and that a second conductor 52E is provided instead of the second conductor 52. Other configurations of the optical detection device 1 are basically similar to the corresponding configurations of the optical detection device 1 according to the first embodiment described above. Note that the constituent elements already described will be given the same reference signs, and will not be repeatedly explained. In addition, each of FIGS. 101A and 101B depicts a cross-sectional structure in a cross-sectional view taken along a section line E-E in FIG. 101C.

<<Configuration of Optical Detection Device>>

The configuration of the optical detection device 1 according to the thirteenth embodiment of the present technology will hereinafter be described while focus is placed on a part different from the configuration of the optical detection device 1 according to the first embodiment described above. Note that scales of constituent elements depicted in some of the figures associated with the present thirteenth embodiment are different from scales of the same constituent elements in the other figures describing the thirteenth embodiment. Moreover, the barrier metal layer is not depicted in the figures explaining the present thirteenth embodiment.

<First Conductor and Second Conductor>

The first conductor 51E includes the first material already described. In addition, the second conductor 52E includes the second material already described. The second material is a material different from the first material. In addition, the first conductor 51E has the first width already described, while the second conductor 52E has the second width already described. The second width is smaller than the first width.

As depicted in FIGS. 101A and 101B, each of the first conductor 51E and the second conductors 52E projects from the fourth surface S4 into the third wiring layer 60. In addition, a height of projection of the first conductor 51E into the third wiring layer 60 is different from a height of projection of the second conductors 52E into the third wiring layer 60. Moreover, when the present embodiment and the first embodiment are compared in terms of these heights, the height of projection of the first conductor 51 into the third wiring layer 60 is larger than the height of projection of the second conductors 52 into the third wiring layer 60 in the first embodiment, while the height of projection of the second conductor 52E into the third wiring layer 60 is larger than the height of the projection of the first conductor 51E into the third wiring layer 60 in the present embodiment.

As depicted in FIG. 101B, the first conductor 51E has an end 51Ea (one side end, first end) and an end 51Eb (other side end, second end) in a penetration direction in which the first conductor 51E penetrates the second semiconductor layer 50. The end 51Ea projects from the fourth surface S4 into the third wiring layer 60, while the end 51Eb projects from the third surface S3 into the second wiring layer 40. Meanwhile, the second conductor 52E has an end 52Ea (one side end) and an end 52Eb (other side end) in a penetration direction in which the second conductor 52E penetrates the second semiconductor layer 50. The end 52Ea projects from the fourth surface S4 into the third wiring layer 60, while the end 52Eb projects from the third surface S3 into the second wiring layer 40.

The height of projection of the end 52Ea of the second conductor 52E into the third wiring layer 60 is larger than the height of projection of the end 51Ea of the first conductor 51E into the third wiring layer 60. More specifically, an end surface 52Ec of the second conductor 52E on the end 52Ea side is located farther from the fourth surface S4 than an end surface 51Ec of the first conductor 51E on the end 51Ea side.

In addition, the end 51Ea of the first conductor 51E on the projection side into the third wiring layer 60 is electrically connected to the wire 62 included in the third wiring layer 60, via connection portions 69, while the end 52Ea of the second conductor 52E on the projection side into the third wiring layer 60 is electrically connected to the wire 62 directly. Hereinafter, the wire 62 to which the end 51Ea is connected will also be referred to as a wire (first wire) 62*a* for distinction from other wires, and the wire 62 to which the end 52Ea is connected will also be referred to as a wire (second wire) 62*b* for distinction from other wires. Note that each of the wires 62*a* and the wires 62*b* will simply be referred to as the wire 62 in a case where distinction from the other wires is unnecessary. The wire 62*a* and the wire 62*b* are wires belonging to one identical metal layer. More specifically, the wire 62*a* and the wire 62*b* are wires belonging to a metal layer M1.

The connection portions 69 extend in the lamination direction to electrically connect the end surface 52Ec of the second conductor 52E to the wire 62*a*. The present embodiment is an example which integrally forms the connection portions 69 and the wire 62*a* by use of dual damascene processing. FIG. 101C is a diagram depicting an example of a positional relation between the wires 62, the connection portions 69, the first conductor 51E, and the second conductor 52E in the planar view. End surfaces included in end surfaces of the connection portions 69 and connected to the end surface 51Ec of the first conductor 51E will be referred to as end surfaces 69*a*. As depicted in FIG. 101C, the end surfaces 69*a* of the connection portions 69 overlap with the end surface 51Ec of the first conductor 51E in the planar view. More specifically, the entire end surfaces 69*a* overlap with the end surface 51Ec in the planar view. Moreover, according to the present embodiment, a plurality of connection portions 69 are provided for each of the end surfaces 51Ec. More specifically, the four connection portions 69 are provided for each of the end surfaces 51Ec. The number of the connection portions 69 is not limited to four. At least the one connection portion 69 is only required to be provided for each of the end surfaces 51Ec.

As depicted in FIG. 101B, the third wiring layer 60 has the barrier insulation film 64 laminated as an interlayer dielectric film. The barrier insulation film 64 covers a majority of the end surface 51Ec of the first conductor 51E. More specifically, the barrier insulation film 64 covers a portion included in the end surface 51Ec and other than the portions to which the connection portions 69 are connected. In other words, the first conductor 51E is provided at a position closer to the second semiconductor layer 50 than the barrier insulation film 64 in the lamination direction. The connection portions 69 penetrate the barrier insulation film 64 and connect to the first conductor 51E. As depicted in FIG. 101A, the wire 62 is provided at a position closer to the fourth wiring layer 70 than the barrier insulation film 64. As depicted in FIG. 101B, the second conductor 52E penetrates the barrier insulation film 64. The end 52Ea of the second conductor 52E is located at a position closer to the fourth wiring layer 70 than the barrier insulation film 64.

Moreover, each of the first conductor 51E and the second conductor 52E is formed from the fourth surface S4 side by a via last method. Further, FIG. 101D depicts wires to which the first conductor 51E and the second conductor 52E are connected in the wires 42 included in the second wiring layer 40. In addition, the wires 42, the first conductor 51E, and the second conductor 52E in the planar view have a positional relation depicted in an example of FIG. 101D, for example.

<<Manufacturing Method of Optical Detection Device>>

A manufacturing method of the optical detection device 1 will hereinafter be described with reference to FIGS. 102A to 102J. A manufacturing method of the first conductor 51E, the second conductor 52E, and the wires 62 will mainly be explained here. First, as depicted in FIG. 102A, the first wiring layer 30 laminated on the first semiconductor layer 20 and the second wiring layer 40 laminated on the second semiconductor layer 50*w* are overlapped and joined to each other. Transistors and the like are already formed in the first semiconductor layer 20 and the second semiconductor layer 50*w*.

Next, as depicted in FIG. 102B, the back surface side of the second semiconductor layer 50*w* is ground by a known technology such as back grinding and CMP to reduce the thickness of the second semiconductor layer 50*w*. By this step, a part that is included in the second semiconductor layer 50*w* and that constitutes the second semiconductor layer 50 is left.

Subsequently, as depicted in FIG. 102C, the silicon cover film 65 and an insulation film 61*m*8 are laminated in this order on an exposed surface of the second semiconductor layer 50. Thereafter, the first conductor 51E is formed from the fourth surface S4 side of the second semiconductor layer 50 by a via last method with use of the method described in the different embodiments or other methods. More specifically, the first conductor 51E is formed by a known method such as plating and CMP. Then, the barrier insulation film 64 is laminated on the end surface 51Ec of the first conductor 51E, an exposed surface of the insulation film 61*m*8, and an exposed surface of the insulation film 61*m*3. The barrier insulation film 64 covering the end surface 51Ec of the first conductor 51E can reduce diffusion of copper from the end surface 51Ec.

Then, as depicted in FIG. 102D, an insulation film 61*m*9 is laminated on an exposed surface of the barrier insulation film 64. Thereafter, the second conductor 52E is formed from the fourth surface S4 side of the second semiconductor layer 50 by a via last method with use of the method described in the different embodiments or other methods.

Next, as depicted in FIG. 102E, an insulation film 61*m*10 is laminated. Thereafter, a resist pattern R8 is formed on an exposed surface of the insulation film 61*m*10. The resist pattern R8 has openings R8*a* at a position overlapping with the end surface 51Ec in the planar view. While not depicted in a plan diagram, four openings R8*a* are provided according to the present embodiment. Then, etching using a mask of the resist pattern R8 is carried out by a known etching technology. More specifically, etching is carried out until portions exposed through the openings R8*a* reach the barrier insulation film 64. The barrier insulation film 64 also functions as an etching stop layer for selected etchant. If any part of the barrier insulation film 64 is etched, this etched part is only a small portion. Holes 69*h* depicted in FIG. 102F are formed by this etching. While not depicted in the figure, four holes 69*h* are formed according to this embodiment. The entire bottom of each of the holes 69*h* overlaps with the end surface 51Ec in the planar view. Note that the first conductor 51E and the insulation film 61*m*3 are kept covered with the barrier insulation film 64 and not etched. Thereafter, the resist pattern R8 is removed.

Subsequently, as depicted in FIG. 102G, a resist pattern R9 is formed on the exposed surface of the insulation film 61*m*10. The resist pattern R9 is a pattern provided to form openings for the wires 62 in the insulation film, and has openings R9*a* at positions where the wires 62 are to be formed. The opening included in the openings R9*a* and formed at a position overlapping with the end surface 51Ec in the planar view will be referred to as an opening R9*al* for distinction from the other openings. Moreover, each of the openings included in the openings R9*a* and formed at positions overlapping with the end surfaces 52Ec in the planar view will be referred to as an opening R9*a*2 for distinction from the other openings. Each of the openings R9*al* and R9*a*2 will simply be referred to as the opening R9*a* in a case where distinction between these openings is unnecessary. Further, the holes 69*h* are filled with a resist material constituting the resist pattern R9.

Subsequently, as depicted in FIG. 102H, etching using a mask of the resist pattern R9 is carried out by a known etching technology. More specifically, portions exposed from the openings R9*a* are etched to form the openings 62*h*. Each of the openings 62*h* has a shape corresponding to the shape of the openings R9*a* in the planar view, such as a hole and a grooved-shape. The openings 62*h* are etched until a depth at which the second conductors 52E are substantially exposed is reached. Note that the opening 62*h* included in the openings 62*h* and produced by etching the portion exposed from the opening R9*al* will be referred to as an opening 62*ah* for distinction from the other openings. Moreover, each of the openings 62*h* included in the openings 62*h* and produced by etching the portions exposed from the openings R9*a*2 will be referred to as an opening 62*bh* for distinction from other openings. Each of the openings 62*ah* and 62*bh* will simply be referred to as the opening 62*h* in a case where distinction from other openings is unnecessary. The hole 69*h* is formed at the bottom of the opening 62*ah*. In addition, the barrier insulation film 64 is exposed at each bottom of the openings 62*bh*.

Note that a portion included in the insulation film 61*m*10 and located between the respective openings 62*h* is covered with the resist pattern R9 and protected from etching in the present step. Accordingly, a depression of the resist pattern R9 side surface (hereinafter referred to as an upper surface) of the insulation film 61*m*10 between the respective openings 62*h* can be reduced. If any part of the upper surface of the insulation film 61*m*10 is depressed in a case where the insulation film 61*m*10 is covered with the resist pattern R9, this depressed part is only a small portion in comparison with a case where the insulation film 61*m*10 is subject to etching without being covered by the resist pattern R9. In addition, if a corner between the insulation film 61*m*10 and any of the openings 62*h* is ground, this ground part is only a small portion. Moreover, the first conductor 51E and the insulation film 61*m*3 are kept covered with the barrier insulation film 64 and not etched.

Next, as depicted in FIG. 102I, the resist pattern R9 is removed by known ashing. Thereafter, portions included in the barrier insulation film 64 and exposed on the bottoms of the holes 69*h* are removed by a known etching technology. As a result, the end surface 51Ec of the first conductor 51E enters a state of being exposed on the bottoms of the holes 69*h*. Note that the barrier insulation film 64 laminated on the end surface 51Ec is mainly removed at the portion exposed on the bottoms of the holes 69*h* and that the portion laminated on the other region is left. Accordingly, this configuration can reduce an excessive increase in exposure of the end surface 51Ec of the first conductor 51E.

Subsequently, as depicted in FIG. 102J, copper is embedded into the openings 62*h* and the holes 69*h* by a known method such as plating and CMP to produce the wires 62 and the connection portions 69. Note that depression of the upper surface and grinding of the corners of the insulation film 61*m*10 between the respective openings 62*h* are reduced. Accordingly, deterioration of the shape of the wires 62 and also deterioration of insulation between the respective wires 62 are reduced. Steps following this step are similar to the corresponding steps in the embodiments and the like described above, and hence are not repeatedly explained here.

Note that each of the insulation film 61*m*1 to the insulation film 61*m*10 may simply be referred to as the insulation film 61 in a case where distinction between these insulation films is unnecessary.

<<Main Advantageous Effects of Thirteenth Embodiment>>

Main advantageous effects of the thirteenth embodiment will hereinafter be described. Advantageous effects similar to those of the optical detection device 1 of the first embodiment described above can be offered by the optical detection device 1 according to the thirteenth embodiment described here.

More specifically, according to the optical detection device 1 in the thirteenth embodiment of the present technology, each of the first conductor 51E and the second conductor 52E projects into the third wiring layer 60 from the fourth surface S4, and respective projections of the first conductor 51E and the second conductor 52E into the third wiring layer 60 have different heights. Accordingly, at the time of formation of the first conductor 51E, exposure of the second conductor 52E including tungsten is reduced during removal of unnecessary copper by CMP. This configuration reduces galvanic corrosion, and allows formation of the first conductor 51 and the second conductor 52 including different materials.

Moreover, according to the optical detection device 1 in the thirteenth embodiment of the present technology, the second conductor 52E is formed after formation of the first conductor 51E is completed. In this case, the height of projection of the first conductor 51E into the third wiring layer 60 is greater than the height of projection of the second conductor 52E into the third wiring layer 60. Specifically, the second conductor 52E is formed after completion of grinding for forming the first conductor 51E by CMP. In the materials of copper and tungsten, only copper is ground by CMP. Accordingly, this configuration can reduce galvanic corrosion, and allows formation of the first conductor 51 and the second conductor 52 including different materials.

Further, according to the optical detection device 1 in the thirteenth embodiment of the present technology, the end 51*a* of the first conductor 51E on the projection side into the third wiring layer 60 is electrically connected to the wire 62*a* included in the third wiring layer 60, via the connection portions 69, while the end 52*a* of the second conductor 52E on the projection side into the third wiring layer 60 is electrically connected directly to the wire 62*b* which is a wire that is included in the third wiring layer 60 and that belongs to the same metal layer as the wire 62*a*. The connection portions 69 are provided for compensating for the lack of the height of the lower first conductor 51E. Accordingly, even in a case where the height of projection of the second conductor 52E into the third wiring layer 60 is larger than the height of projection of the first conductor 51E into the third wiring layer 60, both electric conduction between the first conductor 51E and the wire 62*a* and electric conduction between the second conductor 52E and the wire 62*b* are securely achievable.

In addition, according to the optical detection device 1 in the thirteenth embodiment of the present technology, the entire end surfaces 69*a* of the connection portions 69 overlap with the end surface 51Ec of the first conductor 51E in the planar view. In this case, the barrier insulation film 64 laminated on the end surface 51Ec is mainly removed at the portion exposed on the bottoms of the holes 69*h*, and the portion laminated on the other region is left. This configuration can reduce an excessive increase in exposure of the end surface 51Ec of the first conductor 51E. Accordingly, even if copper is diffused from the end surface 51Ec, reduction of the amount of the diffused copper is achievable.

In addition, according to the optical detection device 1 in the thirteenth embodiment of the present technology, the entire end surfaces 69*a* of the connection portions 69 overlap with the end surface 51Ec of the first conductor 51E in the planar view. Moreover, as depicted in FIG. 102I, etching is ended when copper constituting the first conductor 51 is exposed from the bottoms of the holes 69*h* in the step for forming the connection portions 69. This configuration can reduce etching of the insulation film 61*m*3 formed on the circumferential surface of the first conductor 51E in the planar view, and thus, reduce formation of the wire throughout the area from the end surface 51Ec to the insulation film 61*m*3. Accordingly, reduction of an excessive decrease in the distance between the wire connected to the first conductor 51E and the second semiconductor layer 50 in the horizontal direction, and hence, reduction of deterioration of insulation between the wire connected to the first conductor 51E and the second semiconductor layer 50 can be achieved.

Further, according to the optical detection device 1 in the thirteenth embodiment of the present technology, the upper surface of the insulation film 61*m*10 between the respective openings 62*h* is covered with the resist pattern R9 in the etching step for forming the openings 62*h* in the insulation film 61*m*10 as openings in which the wires 62 are embedded. Accordingly, if any part of the upper surface of the insulation film 61*m*10 between the respective openings 62*h* is depressed, this depressed part is only a small portion in comparison with a case where the insulation film 61*m*10 is subject to etching without being covered by the resist pattern R9. In addition, if a corner between the insulation film 61*m*10 and any of the openings 62*h* is ground, this ground part is only a small portion. This configuration can reduce depression of the upper surface and grinding of the corners of the insulation film 61*m*10 between the respective openings 62*h*. Accordingly, even in a case of more size reduction of the wires 62, reduction of deterioration of the shape of the wires 62 and also reduction of deterioration of insulation between the respective wires 62 can be achieved.

Moreover, according to the optical detection device 1 in the thirteenth embodiment of the present technology, etching (etching back) subsequent to the step for removal of the resist by ashing is etching only for forming openings in the thin barrier insulation film 64. In this case, if any part of the insulation film 61 is depressed by etching back, this depressed part is only a small portion. Accordingly, a necessity of increasing the thickness of the insulation film 61 beforehand is eliminated, and hence, facilitation of film thickness design and wiring reduction of wires can be achieved.

In addition, according to the optical detection device 1 in the thirteenth embodiment of the present technology, the wire connected to the first conductor 51E is formed by dual damascene processing similarly to the other wires. Accordingly, wire performance improves, and a yield is further expected to increase.

<<Modification of Thirteenth Embodiment>>

Hereinafter described will be a modification of the thirteenth embodiment.

<Modification 1>

While a plurality of connection portions 69 are provided for each of the first conductors 51E in the optical detection device 1 of the thirteenth embodiment described above, only one connection portion 69 is provided for each of the first conductors 51E in the optical detection device 1 according to modification 1 of the thirteenth embodiment described in FIGS. 103A and 103B. Moreover, the diameter and the end surface 69*a* of the connection portion 69 according to modification 1 of the thirteenth embodiment are larger than the diameter and the end surface 69*a* of each of the connection portions 69 according to the thirteenth embodiment. Note that FIG. 103A depicts a cross-sectional structure in a cross-sectional view taken along a section line E-E in FIG. 103B.

As depicted in FIG. 103B, the entire end surface 69*a* of the connection portion 69 overlaps with the end surface 51Ec of the first conductor 51E in the planar view. The size of the end surface 69*a* may have the same size as the end surface 51Ec in an ideal state. However, it is preferable that the size of the end surface 69*a* be smaller than the size of the end surface 51Ec in consideration of overlap deviation or the like. Note that the diameter of the connection portion 69 and the size of the end surface 69*a* are not limited to the example depicted in FIGS. 103A and 103B.

Advantageous effects similar to those of the optical detection device 1 of the thirteenth embodiment described above can be offered by the optical detection device 1 according to modification 1 of the thirteenth embodiment described here.

Fourteenth Embodiment

Hereinafter described will be a fourteenth embodiment of the present technology depicted in FIGS. 104A and 104B. The optical detection device 1 according to the present fourteenth embodiment is different from the optical detection device 1 according to the first embodiment described above in that the circumferential surface of the second conductor 52 is located adjacent to a part of the second semiconductor layer 50. More specifically, difference can be found in that a part of the second semiconductor layer 50 is provided between an insulation member 61A including an insulation film 61*m*11 and the second conductor 52. Other configurations of the optical detection device 1 are basically similar to the corresponding configurations of the optical detection device 1 according to the first embodiment described above. Note that the constituent elements already described will be given the same reference signs, and will not be repeatedly explained.

<<Configuration of Optical Detection Device>>

The configuration of the optical detection device 1 according to the fourteenth embodiment of the present technology will hereinafter be described while focus is placed on a part different from the configuration of the optical detection device 1 according to the first embodiment described above. Note that scales of constituent elements depicted in some of the figures associated with the present fourteenth embodiment are different from scales of the same constituent elements in the other figures describing the fourteenth embodiment. Moreover, the barrier metal layer is not depicted in the figures explaining the present fourteenth embodiment.

<Second Conductor>

As depicted in FIG. 104A, the second conductor 52 is provided in such a manner as to penetrate the second semiconductor layer 50 which is an intermediate layer located at an intermediate position in a set of the first semiconductor layer 20, the second semiconductor layer 50, and the third semiconductor layer 80 laminated as three layers. In addition, the second conductor 52 penetrating the second semiconductor layer 50 located at the intermediate position functions as a path which electrically connects a circuit formed on the first semiconductor layer 20 side with respect to the second semiconductor layer 50 and a circuit formed on the third semiconductor layer 80 side with respect to the second semiconductor layer 50. Moreover, the second conductor 52 is provided in the second region 50*b* which is a region included in the second semiconductor layer 50 and overlapping with the pixel region 2A in the planar view (see FIG. 4B). A plurality of transistors T2 are provided in the second region 50*b*.

The second conductor 52 is provided for each of the pixels 3. As depicted in FIG. 104A, the second conductor 52 is provided in an area included in the second semiconductor layer 50 and other than regions where the transistors T2 are provided. For example, the second conductor 52 can be provided in a separation region which separates the region where the transistors T2 are provided from the other regions. The separation region will be referred to as a third region 50*c*, and each of the regions where the transistors T2 are provided will be referred to as a fourth region 50*d* for distinction between the separation region and the regions where the transistors T2 are provided in the horizontal direction. Note that each of the third region 50*c* and the fourth region 50*d* will simply be referred to as the second semiconductor layer 50 in a case where distinction between these regions is unnecessary. The third region 50*c* has a recess on the third surface S3 side to separate the transistors T2, and thus has a smaller thickness than the fourth region 50*d*. The insulation film 41 and the like are embedded in the recessed portion of the third region 50*c*. The second conductor 52 is provided in the third region 50*c* having a smaller thickness than the fourth region 50*d*. In addition, the second semiconductor layer 50 has a thickness of approximately 3 μm, for example.

The end 52*a* of the second conductor 52 is projected from the fourth surface S4 of the second semiconductor layer 50 into the third wiring layer 60, and connected to the wire 62. In addition, the end 52*b* of the second conductor 52 is projected from the third surface S3 of the second semiconductor layer 50 into the second wiring layer 40, and connected to the wire 42. The second conductor 52 is provided at a position overlapping with the pixel region 2A in the planar view. It is preferable that the second conductor 52 have a small diameter in correspondence with the size of the pixel 3. For example, it is preferable that the second conductor 52, more specifically, the end 52*a*, have a diameter equal to or smaller than 150 nm. However, this diameter is not required to be adopted. Moreover, the second conductor 52 includes metal containing any one of tungsten (W), ruthenium (Ru), and cobalt (Co). The present embodiment will be explained on an assumption that the second conductor 52 includes tungsten.

<Insulation Member>

The insulation member 61A including an insulation film 61*m*11 is provided for each of the second conductors 52. The insulation member 61A is provided in an area included in the second semiconductor layer 50 and other than the region where the transistors T2 are provided. For example, the insulation member 61A may be provided in the third region 50*c*. For example, the insulation film 61*m*11 includes silicon oxide, but is not limited to this example.

Adopted according to the first embodiment is the double structure where the second conductor 52 is directly surrounded by the insulation film 41*m*. Meanwhile, adopted according to the fourteenth embodiment is a triple structure depicted in FIG. 104B. Specifically, the circumference (outer circumferential surface) of the second conductor 52 is covered by a part of the second semiconductor layer 50 in the planar view, and a circumference (outer circumferential surface) of the part of the second semiconductor layer 50 is further surrounded by the insulation member 61A. Note that the part of the second semiconductor layer 50 described above will be referred to as a second semiconductor layer 50A, and the second semiconductor layer 50 located on the outer circumferential side of the insulation member 61A will be referred to as a second semiconductor layer 50B for distinction between the part of the second semiconductor layer 50 described above and the second semiconductor layer 50 located on the outer circumferential side of the insulation member 61A. Each of the second semiconductor layer 50A and the second semiconductor layer 50B will simply be referred to as the second semiconductor layer 50 in a case where distinction between these layers is unnecessary. Moreover, the second semiconductor layer 50A is the second semiconductor layer 50 located on the inner circumferential side of the insulation member 61A. The present embodiment presents an example indicating the second semiconductor layer 50A which surrounds the outer circumferential surface of the second conductor 52 in an annular shape without disconnection, and the insulation member 61A which surrounds the outer circumferential surface of the second semiconductor layer 50A in an annular shape without disconnection in the planar view. More specifically, each of the second semiconductor layer 50A and the insulation member 61A is provided in a circular ring shape in the planar view. In addition, the second semiconductor layer 50A is only required to cover the outer circumferential surface of the second conductor 52 in a shape of a layer, and hence, elements such as transistors are not provided in the second semiconductor layer 50A.

Typically, when a through conductor (e.g., second conductor 52), such as the second conductor 52, is formed in a semiconductor layer, stress is applied to the semiconductor layer around the through conductor. This stress is produced by a difference in thermal expansion coefficient between a material constituting the through conductor and a material constituting the semiconductor. In addition, the stress produced in the semiconductor layer located around the through conductor may affect characteristics of a transistor. An ion fluctuation δId of a transistor caused by stress is expressed by following formula (1).

[Math. 1]

$$\delta I_d = (\Pi_{11} - \Pi_{12}) \cdot \sigma_{TSV} \cdot (\cos^2\theta - \sin^2\theta) \cdot (\Phi/2r)^2 \quad (1)$$

In this formula, $\pi_{11}$ is a piezo coefficient in a case where force acts in a normal direction of a certain plane of silicon, $\pi_{12}$ is a piezo coefficient in a case where force acts in a shear direction of a certain plane of silicon, $\sigma_{TSV}$ is stress produced by a through conductor, φ is a diameter of the through conductor, and r is a distance from the through conductor. As presented by formula (1), the ion fluctuation δId of the transistor is proportional to the stress $\sigma_{TSV}$ produced by the through conductor. Accordingly, it is generally preferable that the transistor be arranged at a position away from the through conductor by a fixed distance. In other words, it is preferable that the transistor be disposed outside a keep-out zone.

Stress is also produced by a difference in thermal expansion coefficient between the second conductor 52 and the second semiconductor layer 50. However, this stress mainly concentrates on an interface between the second conductor 52 and the second semiconductor layer 50A.

The insulation member 61A penetrates the second semiconductor layer 50 in the thickness direction, and divides the second semiconductor layer 50 into a plurality of parts. More specifically, the insulation member 61A divides the second semiconductor layer 50 into the second semiconductor layer 50A and the second semiconductor layer 50B. In the state where the insulation member 61A physically divides the second semiconductor layer 50 into the second semiconductor layer 50A and the second semiconductor layer 50B, stress produced between the second conductor 52 and the second semiconductor layer 50 does not easily reach the second semiconductor layer 50B (fourth region 50*d*). Moreover, the insulation member 61A having insulation properties is used as an insulation film for electrically separating the second semiconductor layer 50A and the second conductor 52 from the second semiconductor layer 50B. Note that electric conduction is allowed between the second semiconductor layer 50A and the second conductor 52. The second semiconductor layer 50A is so provided as to come into contact with the second conductor 52. However, a native oxide may be produced between the second semiconductor layer 50A and the second conductor 52. The insulation member 61A includes a known material. For example, the insulation member 61A includes silicon oxide. Moreover, it is preferable that a distance between an inner circumferential surface and an outer circumferential surface of the insulation member 61A (hereinafter also referred to as a width) in the planar view be smaller than the diameter of the second conductor 52. However, this configuration is not required to be adopted.

<<Manufacturing Method of Optical Detection Device>>

A manufacturing method of the optical detection device 1 will hereinafter be described with reference to FIGS. 105A to 105E. Note that a manufacturing method of the insulation member 61A and the second conductor 52 will mainly be described in the present embodiment and that other parts will not be explained.

First, the insulation member 61A is formed. As depicted in FIG. 105A, a groove 61*h*1 that penetrates the second semiconductor layer 50 in the thickness direction is formed by a known lithography technology, a known etching technology, or the like. More specifically, the groove 61*h*1 having a circular ring shape in the planar view (see FIG. 104B) is formed in the third region 50*c* of the second semiconductor layer 50 from the fourth surface S4 side. In addition, the groove 61*h*1 thus formed divides the second semiconductor layer 50 into the second semiconductor layer 50A and the second semiconductor layer 50B.

Next, as depicted in FIG. 105B, the insulation film 61*m*11 is formed within the groove 61*h*1 with use of CVD, for example, to fill an interior of the groove 61*h*1 with the insulation film 61*m*11. In such a manner, the insulation member 61A is produced.

Subsequently, the second conductor 52 is formed. More specifically, the second conductor 52 is formed from the fourth surface S4 side by a via last method. As depicted in FIG. 105C, an insulation film 61*m*12 is formed on an exposed surface of the second semiconductor layer 50 by a known film forming technology. Thereafter, a hard mask including an insulation film 61*m*13 is formed on an exposed surface of the insulation film 61*m*12 with use of a known film forming technology, a known lithography technology, a known etching technology, or the like. The hard mask has an opening 61*h*2 at a position overlapping with the second semiconductor layer 50A in the planar view.

Then, as depicted in FIG. 105D, a hole 61*h*3 is formed by etching a portion exposed through the opening 61*h*2 with use of a known etching technology such as dry etching. The hole 61*h*3 is formed by etching a portion penetrating the insulation film 61*m*12 and the second semiconductor layer 50A and reaching the wire 42.

Thereafter, while not depicted in the figure, a metal film containing any or all of tantalum (Ta), titanium (Ti), and nickel (Ni) is laminated within the hole 61*h*3 as a barrier layer and an adhesion layer. Subsequently, as depicted in FIG. 105E, tungsten is deposited within the hole 61*h*3 by CVD or other methods to fill an interior of the hole 61*h*3 with tungsten. Thereafter, an unnecessary metal film is removed by CMP, an etching technology, or the like. In such a manner, the second conductor 52 is produced. Steps following this step are not repeatedly explained.

Note that each of the insulation film 61*m*1 to the insulation film 61*m*13 may simply be referred to as the insulation film 61 in a case where distinction between these insulation films is unnecessary. In addition, while the hard mask including the insulation film 61*m*13 remains during formation of the second conductor 52 in FIG. 105E, the hard mask may be removed before formation of the second conductor 52.

<<Main Advantageous Effects of Fourteenth Embodiment>>

Main advantageous effects of the fourteenth embodiment will hereinafter be described. Before the description of these effects, a conventional configuration will be touched upon with reference to FIG. 106. According to the conventional configuration, the second conductor 52 is required to be provided at a position away from a transistor by a distance KOZ1 or longer. The distance KOZ1 represents a size of a keep-out zone of the transistor T2.

Meanwhile, according to the optical detection device 1 in the fourteenth embodiment of the present technology, a distance KOZ2 representing a size of a keep-out zone of the transistor T2 is shorter than the conventional distance KOZ1 as depicted in FIG. 107. Accordingly, the second conductor 52 is allowed to be provided at a position closer to the transistor T2 than in the conventional case. As a result, the second conductor 52 is allowed to be provided in the second semiconductor layer 50 with higher density according to size reduction of the pixels 3 than in the conventional case.

More specifically, the optical detection device 1 in the fourteenth embodiment of the present technology has the insulation member 61A penetrating the second semiconductor layer 50 in the thickness direction, and has the following triple structure in the planar view. The circumference of the second conductor 52 is surrounded by the second semiconductor layer 50A which is a part of the second semiconductor layer 50, and the second semiconductor layer 50A is further surrounded by the insulation member 61A. In the state where the insulation member 61A physically divides the second semiconductor layer 50 into the second semiconductor layer 50A and the second semiconductor layer 50B as described above, stress produced by a difference in thermal expansion coefficient between the material of the second conductor 52 and the material of the second semiconductor layer 50 mainly concentrates on the interface between the second conductor 52 and the second semiconductor layer 50A, and does not easily reach the second semiconductor layer 50B (fourth region 50*d*). This configuration can reduce the size of the keep-out zone, and thus reduce an increase in the distance between the second conductor 52 and the transistor T2. Accordingly, even in a case of size reduction of the pixel 3, the second conductor 52 is allowed to be provided outside the keep-out zone. This configuration can reduce effects imposed on the characteristics of the transistor T2 by the second conductor 52. In addition, reduction of the size of the keep-out zone contributes to reduction of an increase in a layout design load of the second conductor 52.

Further, according to the optical detection device 1 in the fourteenth embodiment of the present technology, the second conductor 52 and the insulation member 61A are provided in the third region 50*c* that is included in the second semiconductor layer 50 and that has a smaller thickness than the fourth region 50*d*. Accordingly, this configuration reduces an etching amount of the second semiconductor layer 50 in the thickness direction during formation of the groove 61*h*1 in the second semiconductor layer 50 as a groove into which the insulation member 61A is embedded, and facilitates formation of the insulation member 61A having a small width in the planar view.

While the insulation member 61A has a circular ring shape in the planar view in the fourteenth embodiment described above, the insulation member 61A may have a square ring shape in the planar view.

<<Modifications of Fourteenth Embodiment>>

Hereinafter described will be modifications of the fourteenth embodiment.

<Modification 1>

According to the optical detection device 1 of the fourteenth embodiment, the second conductor 52 and the insulation member 61A are provided in the third region 50*c* of the second semiconductor layer 50. However, the second conductor 52 and the insulation member 61A are provided in a fifth region 50*e* of the second semiconductor layer 50 in the optical detection device 1 according to modification 1 of the fourteenth embodiment depicted in FIG. 108. The fifth region 50*e* is a region included in the second semiconductor layer 50 and other than the third region 50*c* and the fourth region 50*d*. The fifth region 50*e* has a thickness corresponding to the thickness of the fourth region 50*d*, but larger than the thickness of the third region 50*c*.

Advantageous effects similar to those of the optical detection device 1 of the fourteenth embodiment described above can be offered by the optical detection device 1 according to modification 1 of the fourteenth embodiment described here.

<Modification 2>

According to the optical detection device 1 of the fourteenth embodiment, the single insulation member 61A is provided for each of the second conductors 52. However, in the optical detection device 1 in modification 2 of the fourteenth embodiment depicted in FIGS. 109A and 109B, two insulation members 61A are provided for each of the second conductors 52. The inner insulation member 61A will be referred to as an insulation member 61Aa, and the outer insulation member 61A will be referred to as an insulation member 61Ab, for distinction between the two insulation members 61A. Each of the insulation member 61Aa and the insulation member 61Ab will simply be referred to as the insulation member 61A in a case where distinction between these members is unnecessary.

As depicted in FIG. 109A, the insulation member 61Ab located outside further divides the second semiconductor layer 50B into a second semiconductor layer 50B1 and a second semiconductor layer 50B2. The second semiconductor layer 50B1 is located between the insulation member 61Aa and the insulation member 61Ab, while the second semiconductor layer 50B2 is located on the outer circumferential side of the insulation member 61Ab. Note that each of the second semiconductor layer 50B1 and the second semiconductor layer 50B2 will be simply referred to as the second semiconductor layer 50B in a case where distinction between these layers is unnecessary.

As depicted in FIG. 109B, a quintuple structure in the planar view is formed in the present modification. Specifically, the circumference (outer circumferential surface) of the second conductor 52 is surrounded by the second semiconductor layer 50A, the circumference (outer circumferential surface) of the second semiconductor layer 50A is surrounded by the insulation member 61Aa, the circumference (outer circumferential surface) of the insulation member 61Aa is surrounded by the second semiconductor layer 50B1 (the different part of the second semiconductor layer 50), and the circumference (outer circumferential surface) of the second semiconductor layer 50B1 is surrounded by the insulation member 61Ab.

Each of the second semiconductor layer 50A, the second semiconductor layer 50B1, the insulation member 61Aa, and the insulation member 61Ab has a circular ring shape in the planar view. In addition, each of the second semiconductor layer 50A and the second semiconductor layer 50B1 has a layer shape, and does not contain elements such as transistors.

In the state where the insulation member 61Aa physically divides the second semiconductor layer 50 into the second semiconductor layer 50A and the second semiconductor layer 50B, stress produced by a difference in thermal expansion coefficient between the material of the second conductor 52 and the material of the second semiconductor layer 50 mainly concentrates on the interface between the second conductor 52 and the second semiconductor layer 50A, and thus does not easily reach the second semiconductor layer 50B (fourth region 50*d*). According to the present modification, the insulation member 61Ab further physically divides the second semiconductor layer 50B into the second semiconductor layer 50B1 and the second semiconductor layer 50B2 on the outer circumferential side of the insulation member 61Aa. Accordingly, it is more difficult for the stress to reach the second semiconductor layer 50B2 (fourth region 50*d*) located on the outer circumferential side of the insulation member 61Ab.

A manufacturing method of the optical detection device 1 will hereinafter be described with reference to FIG. 110. Note that only points different from the manufacturing method described in the fourteenth embodiment will be described and that other parts will not be explained. As depicted in FIG. 110, grooves 61*h*1*a* and 61*h*1*b* each penetrating the second semiconductor layer 50 in the thickness direction are formed by a known lithography technology, a known etching technology, or the like. More specifically, the grooves 61*h*1*a* and 61*h*1*b* each having a circular ring shape in the planar view (see FIG. 109B) are formed in the third region 50*c* of the second semiconductor layer 50 from the fourth surface S4 side. Note that each of the groove 61*h*1*a* and the groove 61*h*1*b* will simply be referred to as the groove 61*h*1 in a case where distinction between these grooves is unnecessary. The groove 61*h*1 thus formed divides the second semiconductor layer 50 into the second semiconductor layer 50A, the second semiconductor layer 50B1, and the second semiconductor layer 50B2. Subsequently, while not depicted in the figure, the insulation film 61*m*11 is formed within the grooves 61*h*1*a* and 61*h*1*b* by CVD, for example, to fill interiors of the grooves 61*h*1*a* and 61*h*1*b* with the insulation film 61*m*11. In such a manner, the insulation member 61Aa and the insulation member 61Ab are produced. The following processes are the same as the corresponding processes of the manufacturing method described in the fourteenth embodiment.

Advantageous effects similar to those of the optical detection device 1 of the fourteenth embodiment described above can be offered by the optical detection device 1 according to modification 2 of the fourteenth embodiment described here.

Moreover, according to the optical detection device 1 in modification 2 of the fourteenth embodiment, the second semiconductor layer 50B located on the outer circumferential side of the insulation member 61Aa is further divided by the insulation member 61Ab. In this case, it is more difficult for stress to reach the second semiconductor layer 50B2 (fourth region 50*d*). Accordingly, the second conductor 52 is allowed to be provided at a position further closer to the transistor T2. As a result, the second conductor 52 is allowed to be provided with further higher density in the second semiconductor layer 50 according to size reduction of the pixels 3.

<Modification 3>

According to the optical detection device 1 of the fourteenth embodiment, the single insulation member 61A is provided for each of the second conductors 52. According to the optical detection device 1 in modification 2 of the fourteenth embodiment, two insulation members 61A are provided for each of the second conductors 52. According to the optical detection device 1 in modification 3 of the fourteenth embodiment depicted in FIGS. 111A and 111B, three insulation members 61A are provided for each of the second conductors 52. More specifically, adopted is such a configuration where the insulation member 61A is further provided outside the insulation member 61Ab of modification 2. The insulation member 61A provided outside the insulation member 61Ab will be referred to as an insulation member 61Ac for distinction between this insulation member 61A and other insulation members 61A. Specifically, the three insulation members 61A will be referred to as the insulation member 61Aa, the insulation member 61Ab, and the insulation member 61Ac in this order from the inner side for distinction between these insulation members. Each of the insulation member 61Aa, the insulation member 61Ab, and the insulation member 61Ac will simply be referred to as the insulation member 61A in a case where distinction between these members is unnecessary.

As depicted in FIG. 111A, the insulation member 61Ac located on the outermost side further divides the second semiconductor layer 50B2 into a second semiconductor layer 50B2*a* and a second semiconductor layer 50B2*b*. The second semiconductor layer 50B2*a* is located between the insulation member 61Ab and the insulation member 61Ac, while the second semiconductor layer 50B2*b* is located on the outer circumferential side of the insulation member 61Ac. Note that each of the second semiconductor layer 50B2*a* and the second semiconductor layer 50B2*b* will simply be referred to as the second semiconductor layer 50B2 in a case where distinction between these layers is unnecessary.

As depicted in FIG. 111B, a seven-ply structure in the planar view is formed in the present modification. Specifically, the circumference (outer circumferential surface) of the second conductor 52 is surrounded by the second semiconductor layer 50A, the circumference (outer circumferential surface) of the second semiconductor layer 50A is surrounded by the insulation member 61Aa, the circumference (outer circumferential surface) of the insulation member 61Aa is surrounded by the second semiconductor layer 50B1 (the different part of the second semiconductor layer 50), the circumference (outer circumferential surface) of the second semiconductor layer 50B1 is surrounded by the insulation member 61Ab, the circumference (outer circumferential surface) of the insulation member 61Ab is surrounded by the second semiconductor layer 50B2*a*, and the circumference (outer circumferential surface) of the second semiconductor layer 50B2*a* is surrounded by the insulation member 61Ac.

Each of the second semiconductor layer 50A, the second semiconductor layer 50B1, the second semiconductor layer 50B2*a*, the insulation member 61Aa, the insulation member 61Ab, and the insulation member 61Ac has a circular ring shape in the planar view. In addition, each of the second semiconductor layer 50A, the second semiconductor layer 50B1, and the second semiconductor layer 50B2*a* has a layer shape, and does not contain elements such as transistors.

According to the present modification, the insulation member 61Ac further physically divides the second semiconductor layer 50B2 into the second semiconductor layer 50B2*a* and the second semiconductor layer 50B2*b* on the outer circumferential side of the insulation member 61Ab. Accordingly, it is more difficult for stress to reach the second semiconductor layer 50B2*b* (fourth region 50*d*) located on the outer circumferential side of the insulation member 61Ac.

A manufacturing method of the optical detection device 1 will hereinafter be described with reference to FIG. 112. Note that only points different from the manufacturing method described in the fourteenth embodiment will be described in the present modification and that other parts will not be explained. As depicted in FIG. 112, the grooves 61*h*1*a*, 61*h*1*b*, and 61*h*1*c* each penetrating the second semiconductor layer 50 in the thickness direction are formed by a known lithography technology, a known etching technology, or the like. More specifically, the grooves 61*h*1*a*, 61*h*1*b*, and 61*h*1*c* each having a circular ring shape in the planar view (see FIG. 111B) are formed in the third region 50*c* of the second semiconductor layer 50 from the fourth surface S4 side. Note that each of the groove 61*h*1*a*, the groove 61*h*1*b*, and the groove 61*h*1*c* will simply be referred to as the groove 61*h*1 in a case where distinction between these grooves is unnecessary. The grooves 61*h*1 thus formed divide the second semiconductor layer 50 into the second semiconductor layer 50A, the second semiconductor layer 50B1, the second semiconductor layer 50B2*a*, and the second semiconductor layer 50B2*b*. Subsequently, while not depicted in the figure, the insulation film 61*m*11 is formed inside the grooves 61*h*1*a*, 61*h*1*b*, and 61*h*1*c* to fill the inside of the grooves 61*h*1*a*, 61*h*1*b*, and 61*h*1*c* with the insulation film 61*m*11, by CVD, for example. In such a manner, the insulation member 61Aa, the insulation member 61Ab, and the insulation member 61Ac are produced. The following processes are the same as the corresponding processes of the manufacturing method described in the fourteenth embodiment.

Advantageous effects similar to those of the optical detection device 1 of the fourteenth embodiment described above can be offered by the optical detection device 1 according to modification 3 of the fourteenth embodiment described here.

Moreover, according to the optical detection device 1 in modification 3 of the fourteenth embodiment, the second semiconductor layer 50B2 located on the outer circumferential side of the insulation member 61Ab is further divided by the insulation member 61Ac. In this configuration, it is more difficult for stress to reach the second semiconductor layer 50B2*b* (fourth region 50*d*). Accordingly, the second conductor 52 is allowed to be provided at a position further closer to the transistor T2. In such a manner, the second conductor 52 is allowed to be provided with further higher density in the second semiconductor layer 50 according to size reduction of the pixels 3.

Fifteenth Embodiment

Hereinafter described will be a fifteenth embodiment of the present technology depicted in FIG. 113. The optical detection device 1 according to the present fifteenth embodiment is different from the optical detection device 1 according to the first embodiment described above in that a second conductor 52F is provided in place of the second conductor 52. Other configurations of the optical detection device 1 are basically similar to the corresponding configurations of the optical detection device 1 according to the first embodiment described above. Note that the constituent elements already described will be given the same reference signs, and will not be repeatedly explained.

<<Configuration of Optical Detection Device>>>

The configuration of the optical detection device 1 according to the fifteenth embodiment of the present technology will hereinafter be described while focus is placed on a part different from the configuration of the optical detection device 1 according to the first embodiment described above. Note that scales of constituent elements depicted in some of the figures associated with the present fifteenth embodiment are different from scales of the same constituent elements in the other figures describing the fifteenth embodiment. Moreover, the barrier metal layer is not depicted in the figures explaining the present fifteenth embodiment.

<Second Conductor>

The second conductor 52F has an end 52Fa (first end) which is a fourth surface S4 side end and an end 52Fb (second end) which is a third surface S3 side end in the lamination direction. The end 52Fa is connected to the wire 62. Note that an end surface of the end 52Fa is located substantially at the same position as the position of the fourth surface S4 in the lamination direction in FIG. 113. However, this configuration is not required to be adopted. This end surface may be located on the third wiring layer 60 side with respect to the fourth surface S4, or on the second semiconductor layer 50 side with respect to the fourth surface S4.

The second conductor 52F further has an intermediate portion 52Fc in the lamination direction. The intermediate portion 52Fc is a portion located between the end 52Fa and the end 52Fb. In addition, diameters of the end 52Fa, the end 52Fb, and the intermediate portion 52Fc will be referred to as a diameter dFa, a diameter dFb, and a diameter dFc, respectively. Moreover, a diameter of a portion included in the intermediate portion 52Fc and located at a boundary with the end 52Fa will be referred to as a diameter dFc1. Note that the diameter of the second conductor 52F is a size of the second conductor 52F in the horizontal direction. In addition, while the second conductor 52F has a circular shape in the planar view in the present embodiment, the size of the second conductor 52F in the horizontal direction may be referred to as a diameter even when the second conductor 52F has a polygonal shape such as a square shape. The size of the diameter of the second conductor 52F changes in the lamination direction as depicted in the figure. Specifically, a size of an area of a lateral cross-section of the second conductor 52F (hereinafter referred to as a lateral cross-sectional area) changes in the lamination direction. The lateral cross-sectional area of the second conductor 52F increases as the diameter of the portion of the second conductor 52F increases.

The end 52Fa is an expanded diameter portion that is included in the second conductor 52F and that has a large diameter and a large cross-sectional area. The end 52Fa has a larger diameter and a larger lateral cross-sectional area than the intermediate portion 52Fc (dFa>dFc). More specifically, the diameter dFa of the end 52Fa is larger than the diameter dFc1 which is a diameter of the portion included in the intermediate portion 52Fc and located at the boundary with the end 52Fa (dFa>dFc1). Described hereinafter will be the second conductor 52F as viewed from the end 52Fb toward the end 52Fa via the intermediate portion 52Fc. For example, the second conductor 52F has a forward tapered shape in a direction toward the end 52Fa in the area from the end 52Fb to the intermediate portion 52Fc in the example depicted in FIG. 113. The diameter and the lateral cross-sectional area gradually decrease with nearness to the end 52Fa. In addition, the diameter and the lateral cross-sectional area of the intermediate portion 52Fc are minimized (diameter dFc1) at the boundary between the intermediate portion 52Fc and the end 52Fa, and increase from this boundary. More specifically, the decrease in the diameter and the lateral cross-sectional area of the second conductor 52F turns to an increase at the end 52Fa. Each of the diameter and the lateral cross-sectional area of the second conductor 52F has an inflection point at the boundary between the intermediate portion 52Fc and the end 52Fa.

The second conductor 52F includes metal. For example, the second conductor 52F includes metal containing any one of tungsten (W), ruthenium (Ru), and cobalt (Co). The present embodiment will be explained on an assumption that the second conductor 52F includes tungsten.

<<Manufacturing Method of Optical Detection Device>>

A manufacturing method of the optical detection device 1 will hereinafter be described with reference to FIGS. 114A to 114I. Note that a manufacturing method of the second conductor 52F will mainly be described in the present embodiment and that other parts will not be explained.

According to the present embodiment, the second conductor 52F is formed by a via middle method. First, as depicted in FIG. 114A, the transistors T2 and the like are formed in the second semiconductor layer 50*w* from the third surface S3 side, and a part of the insulation film 41 is laminated. Thereafter, a hole 53F in which the second conductor 52F is to be embedded is formed in the second semiconductor layer 50*w* from the third surface S3 side by a known lithography technology and a known etching technology. More specifically, a resist pattern R10 having an opening R10*a* is formed on an exposed surface of the insulation film 41, and the insulation film 41 and the second semiconductor layer 50*w* exposed through the opening R10*a* are etched to form the hole 53F.

Subsequently, as depicted in FIG. 114B, a protection film 41*n* is formed in such a manner as to cover a side wall and a bottom of the hole 53F. Thereafter, a portion included in the protection film 41*n* and covering the bottom of the hole 53F is removed by etching-back. The protection film 41*n* includes a material having a lower etching rate for selected etchant than the material of the second semiconductor layer 50*w*. For example, the protection film 41*n* includes silicon nitride, but is not limited to this example.

Next, as depicted in FIG. 114C, silicon contained in the hole 53F and exposed on the bottom not covered with the protection film 41*n* is etched by isotropic etching to expand the bottom of the hole 53F. In such a manner, a diameter expansion chamber 53Fa is formed at the bottom of the hole 53F as a region where the end 52Fa is to be embedded. FIG. 114C depicts shapes of the hole 53F and the diameter expansion chamber 53Fa in the planar view. Each of the hole 53F and the diameter expansion chamber 53Fa has a circular shape in the planar view. The diameter expansion chamber 53Fa has a larger diameter and a larger lateral cross-sectional area than the hole 53F. Thereafter, the protection film 41*n* and the resist pattern R10 are removed.

Subsequently, as depicted in FIG. 114D, the insulation film 41*m* is laminated as a protection film on side walls and bottom surfaces of the hole 53F and the diameter expansion chamber 53Fa. Thereafter, as depicted in FIG. 114E, a resist pattern R11 having openings Rlla is formed on an exposed surface of the insulation film 41*m* by a known lithography technology. Interiors of the hole 53F and the diameter expansion chamber 53Fa are also filled with the resist pattern R11. Then, holes 44*h* in which the vias 44 connected to the transistors T2 are to be embedded are formed by etching the insulation film 41 exposed through the openings Rlla, with use of a known etching technology. Thereafter, the resist pattern R11 is removed.

Next, as depicted in FIG. 114F, the interiors of the hole 53F and the diameter expansion chamber 53Fa and interiors of the holes 44*h* are filled with tungsten with use of a known method. More specifically, the interiors of the hole 53F and the diameter expansion chamber 53Fa are filled with tungsten at a time. As a result, the second conductor 52F is formed inside the hole 53F and the diameter expansion chamber 53Fa. More specifically, the end 52Fa of the second conductor 52F is formed inside the diameter expansion chamber 53Fa, while the end 52Fb and the intermediate portion 52Fc are formed inside the hole 53F. The interiors of the hole 53F and the diameter expansion chamber 53Fa are filled at a time by one step, and not separately filled by different steps. Accordingly, the second conductor 52F is continuously formed from the end 52Fb to the end 52Fa as one body without disconnection. Thereafter, the vias 44 are formed inside the holes 44*h*.

Subsequently, the second wiring layer 40 is completed as depicted in FIG. 114G. Thereafter, while not depicted in the figure, the second semiconductor layer 50*w* on which the second wiring layer 40 is laminated and the first semiconductor layer 20 as a separately prepared layer on which the first wiring layer 30 is laminated are joined to each other by junction between the respective wiring layers.

Then, as depicted in FIG. 114H, the thickness of the second semiconductor layer 50*w* is reduced from the side opposite to the third surface S3. More specifically, the thickness of the second semiconductor layer 50*w* is reduced by CMP. Thereafter, a portion corresponding to the second semiconductor layer 50 is left in such a manner, and the end 52Fa of the second conductor 52F is exposed from the fourth surface S4. This grinding of the second semiconductor layer 50*w* by CMP is stopped when an exposed state of the end 52Fa of the second conductor 52F is achieved. According to the present embodiment, the second conductor 52F includes tungsten, and hence includes a material different from silicon. When a material different from silicon is exposed to a grinding surface during grinding of the second semiconductor layer 50*w* by CMP, a grinding pressure changes. Accordingly, grinding stop timing is recognizable by detecting the change of the grinding pressure. According to the present embodiment, the end 52Fa of the second conductor 52F is an expanded diameter portion which has a large diameter and a large cross-sectional area. In this case, the area of the end 52Fa exposed through the fourth surface S4 increases, and therefore the grinding pressure remarkably changes. Accordingly, the grinding stop timing is clearly recognizable. Subsequently, as depicted in FIG. 114I, the wire 62 is formed. Steps following this step are not repeatedly explained.

<<Main Advantageous Effects of Fifteenth Embodiment>>

Main advantageous effects of the fifteenth embodiment will hereinafter be described. Conventionally, the second semiconductor layer 50*w* is ground by CMP to expose the end 52Fa of the second conductor 52F from the fourth surface S4 in a certain case. At this time, a grinding pressure changes when a material different from silicon is exposed on a grinding surface. Accordingly, grinding stop timing is recognizable according to this grinding pressure change. However, the grinding pressure change is not sufficiently clear depending on the size of the diameter of the second conductor 52F. Meanwhile, according to the optical detection device 1 in the fifteenth embodiment of the present technology, the diameter of the end 52Fa of the second conductor 52F on the fourth surface S4 side is larger than the diameter of the intermediate portion 52Fc that is included in the second conductor 52F and that corresponds to a portion between the end 52Fb on the third surface S3 side and the end 52Fa. In this case, the area of the second conductor 52F exposed from the fourth surface S4 increases at the time of exposure of the second conductor 52F from the fourth surface S4 by grinding of the second semiconductor layer 50*w* by CMP, and thus, the grinding pressure remarkably changes. This configuration clarifies the grinding stop timing, and hence allows easy recognition of the stop timing of grinding by CMP.

Moreover, according to the optical detection device 1 in the fifteenth embodiment of the present technology, the diameter of the end 52Fa is larger than the diameter of the intermediate portion 52Fc. Accordingly, even in a case where the diameter of the second conductor 52F decreases according to size reduction of the pixels 3, this configuration can reduce a decrease in the area of the second conductor 52F exposed from the fourth surface S4, and can hence restrain grinding stop timing from being unclear.

Further, according to the optical detection device 1 in the fifteenth embodiment of the present technology, when viewed from the end 52*b* toward the end 52*a*, the diameter of the second conductor 52F first decreases, and then increases from the boundary between the intermediate portion 52Fc and the end 52Fa. This configuration can reduce a decrease in the area of the second conductor 52F exposed from the fourth surface S4, and can hence restrain grinding stop timing from being unclear.

While the second conductor 52F has a forward tapered shape in the direction toward the end 52Fa in the area from the end 52Fb to the intermediate portion 52Fc in the fifteenth embodiment described above, the present technology is not limited to this example. The second conductor 52F may have an inverse tapered shape toward the end 52Fa, or a straight shape having an invariable size of the diameter, in the area from the end 52Fb to the intermediate portion 52Fc. The area from the end 52Fb to the intermediate portion 52Fc may have any shape as long as the diameter dFa of the end 52Fa is larger than the diameter dFc1 which is a diameter of the portion included in the intermediate portion 52Fc and located at the boundary with the end 52Fa.

Moreover, while the wire 62 connected to the end 52*a* is provided on the third wiring layer 60 side with respect to the fourth surface S4 according to the fifteenth embodiment, this configuration is not required to be adopted. The exposed surface of the end 52*a* exposed on the fourth surface S4 may be recessed, and the wire 62 may be provided on this recess.

Further, according to the fifteenth embodiment described above, the first semiconductor layer 20 may have the photoelectric conversion region 20*a*, the second semiconductor layer 50 may have elements such as transistors of the readout circuit 15, and the third semiconductor layer 80 may have a logic circuit such as the logic circuit 13 or elements such as transistors of a memory.

In addition, in a case where the first conductor 51 is formed by a via first method or a via middle method, the structure of the second conductor 52F may be applied to the first conductor 51.

<<Modifications of Fifteenth Embodiment>>

Hereinafter described will be modifications of the fifteenth embodiment.

<Modification 1>

According to the optical detection device 1 in the fifteenth embodiment, the end 52Fa formed by the manufacturing method using isotropic etching has a circular shape in the planar view. However, in the optical detection device 1 in modification 1 of the fifteenth embodiment depicted in FIGS. 115 and 116, the end 52Fa formed by a manufacturing method using anisotropic etching has a square shape in the planar view. For example, the end 52Fa has a rhomboidal shape in the planar view as depicted in FIG. 116.

A manufacturing method of the optical detection device 1 will hereinafter be described with reference to FIG. 116. Note that only points different from the manufacturing method described in the fifteenth embodiment will be described in the present modification and that other parts will not be explained. Silicon contained in the hole 53F and exposed on the bottom not covered with the protection film 41*n* is etched by anisotropic etching to expand the bottom of the hole 53F. In such a manner, the diameter expansion chamber 53Fa is formed at the bottom of the hole 53F as a region where the end 52Fa is to be embedded. FIG. 116 depicts shapes of the hole 53F and the diameter expansion chamber 53Fa in the planar view. The diameter expansion chamber 53Fa has a square shape in the planar view. For example, the diameter expansion chamber 53Fa has a rhomboidal shape in the planar view. The diameter expansion chamber 53Fa has a larger diameter and a larger lateral cross-sectional area than the hole 53F.

The end 52Fa having a square shape includes tungsten embedded in the diameter expansion chamber 53Fa having such shape. Processes following this process are similar to the corresponding steps in the fifteenth embodiment, and hence are not repeatedly explained.

Advantageous effects similar to those of the optical detection device 1 of the fifteenth embodiment described above can be offered by the optical detection device 1 according to modification 1 of the fifteenth embodiment described here.

<Modification 2>

According to the optical detection device 1 in the fifteenth embodiment, the second conductor 52F is formed by the via middle method. However, the second conductor 52F of the optical detection device 1 according to modification 2 of the fifteenth embodiment depicted in FIGS. 117A and 117B is formed by a via first method.

A manufacturing method of the optical detection device 1 will hereinafter be described. Note that only points different from the manufacturing method described in the fifteenth embodiment will be described in the present modification and that other parts will not be explained. First, as depicted in FIG. 117A, the hole 53F and the diameter expansion chamber 53Fa are formed from the third surface S3 side in the second semiconductor layer 50*w* where elements such as transistors are not formed. Subsequently, the insulation film 41*m* is laminated as a protection film on the side walls and the bottom surfaces of the hole 53F and the diameter expansion chamber 53Fa. Thereafter, a sacrificial layer 41*k* is embedded into the hole 53F and the diameter expansion chamber 53Fa. It is preferable that the sacrificial layer 41*k* include a material not easily producing contaminants during formation of elements such as transistors. For example, the sacrificial layer 41*k* includes polysilicon, but is not limited to this example.

Next, as depicted in FIG. 117B, elements such as the transistors T2 are formed, and a part of the insulation film 41 is laminated. Thereafter, a hole 53Fb for removing the sacrificial layer 41*k* is formed in the insulation film 41 by a known lithography technology and a known etching technology. Then, the sacrificial layer 41*k* is removed using the hole 53Fb. Processes following this process are similar to the corresponding steps in the fifteenth embodiment, and hence are not repeatedly explained.

Advantageous effects similar to those of the optical detection device 1 of the fifteenth embodiment described above can be offered by the optical detection device 1 according to modification 2 of the fifteenth embodiment described here.

In addition, the second conductor 52F included in the optical detection device 1 according to modification 1 of the fifteenth embodiment may be formed by a via first method.

<Modification 3>

While the optical detection device 1 of the fifteenth embodiment has the triple-layer lamination structure where the first semiconductor layer 20 to the third semiconductor layer 80 are overlapped and laminated, the optical detection device 1 according to modification 3 of the fifteenth embodiment depicted in FIG. 118 has a double-layer lamination structure where the first semiconductor layer 20 and the second semiconductor layer 50 are overlapped and laminated. In addition, a rewiring layer 62C having a wire 62Ca and a bump 62Cb is formed on the fourth surface S4 of the second semiconductor layer 50. Note that the bump 62Cb may be provided on a mounting board side. Examples of metal constituting the bump 62Cb include lead, nickel, and copper. Moreover, according to the present modification, the first semiconductor layer 20 has the photoelectric conversion region 20*a*, while the second semiconductor layer 50 has elements such as transistors of the logic circuit 13.

Advantageous effects similar to those of the optical detection device 1 of the fifteenth embodiment described above can be offered by the optical detection device 1 according to modification 3 of the fifteenth embodiment described here.

Note that the elements such as transistors included in the readout circuit 15 are only required to be provided in either the first semiconductor layer 20 or the second semiconductor layer 50. Moreover, the first semiconductor layer 20 is only required to include any one of a memory, elements such as transistors included in a logic circuit such as the logic circuit 13, and the photoelectric conversion region 20*a*. The second semiconductor layer 50 is only required to include either a memory or elements such as transistors included in a logic circuit such as the logic circuit 13.

Sixteenth Embodiment

Hereinafter described will be a sixteenth embodiment of the present technology depicted in FIGS. 119A to 119D. The optical detection device 1 according to the present sixteenth embodiment is different from the optical detection device 1 according to the first embodiment described above in that a reflection member is provided in the wiring layer. Other configurations of the optical detection device 1 are basically similar to the corresponding configurations of the optical detection device 1 according to the first embodiment described above. Note that the constituent elements already described will be given the same reference signs, and will not be repeatedly explained.

<<Configuration of Optical Detection Device>>

The configuration of the optical detection device 1 according to the sixteenth embodiment of the present technology will hereinafter be described while focus is placed on a part different from the configuration of the optical detection device 1 according to the first embodiment described above. Note that scales of constituent elements depicted in some of the figures associated with the present sixteenth embodiment are different from scales of the same constituent elements in the other figures describing the sixteenth embodiment. Moreover, in some of the figures explaining the present sixteenth embodiment, some of the constituent elements of the optical detection device 1, such as a light collection layer 90 and the photoelectric conversion region 20*a*, are not depicted. Furthermore, the barrier metal layer is not depicted in some of the figures explaining the present sixteenth embodiment.

<First Wiring Layer>

FIG. 119A is a diagram depicting a partial longitudinal cross-sectional structure of the pixel region 2A. As depicted in FIG. 119A, the first wiring layer 30 has a multilayer wiring layer including the insulation film 31, the wires 32, and the vias (contacts) 34. Note that the first connection pads 33 described in the first embodiment are treated as the wires 32 in the present embodiment. The wires 32 are laminated via the insulation film 31. More specifically, the first wiring layer 30 has a plurality of metal layers laminated in the lamination direction via the insulation film 31. In addition, each of the metal layers has a plurality of wires 32 in the horizontal direction. The plurality of wires 32 belonging to the same metal layer may be affected by unevenness of a base, but can be regarded as being located at the same height in the lamination direction (Z-direction). FIG. 119A depicts an example where the first wiring layer 30 has two metal layers M1 and M2. Each of the metal layers M1 and M2 has a plurality of wires 32 in the horizontal direction. The wires 32 include metal. For example, the metal constituting the wires 32 is copper or aluminum, but is not limited to these examples. The present embodiment will be explained on an assumption that the wires 32 include copper.

The vias 34 extend in the lamination direction. The first wiring layer 30 has a plurality of via layers in the lamination direction. In addition, each of the via layers has a plurality of vias 34 in the horizontal direction. The plurality of vias 34 belonging to the same via layer may be affected by unevenness of the base, but can be regarded as being located at the same height in the lamination direction (Z-direction). FIG. 119A depicts an example where the first wiring layer 30 has two via layers V1 and V2. Each of the via layers V1 and V2 has a plurality of vias 34 in the horizontal direction. Each of the vias 34 electrically connects two members. For example, the vias 34 achieve electric connection between the respective wires 32, connection between the wires 32 and the first semiconductor layer 20, and other connection. However, this configuration is not required to be adopted. More specifically, the vias 34 belonging to the via layer V2 achieves electric connection between the respective wires 32. In addition, the vias 34 belonging to the via layer V1 achieves electric connection between the wires 32 and the first semiconductor layer 20. For example, the vias 34 belonging to the via layer V1 achieves electric connection between the charge accumulation region FD formed in the first semiconductor layer 20 and the wires 32. However, this configuration is not required to be adopted. The vias 34 include metal. For example, the metal constituting the vias 34 is tungsten (W), cobalt (Co), ruthenium (Ru), or copper (Cu), but is not limited to these examples. The present embodiment will be explained on an assumption that the vias 34 include tungsten.

Moreover, as depicted in FIG. 119B, the first wiring layer 30 has dummy vias (reflection members) 34D each extending in the lamination direction. The dummy vias 34D are provided for each of the plurality of via layers. According to the present embodiment, the dummy vias 34D are provided for each of the via layers V1 and V2. Further, the dummy vias 34D include metal expected to reflect light. For example, the dummy vias 34D may include the same material as the material of the vias 34, or a different material. The present embodiment will be explained on an assumption that the dummy vias 34D include tungsten similarly to the vias 34. Note that the dummy vias 34D provided for the via layer V2 have a configuration similar to a configuration of the dummy vias 34D provided for the via layer V1, and hence are not depicted in the figure. The vias 34 and the dummy vias 34D provided in the via layer V1 will hereinafter be described by way of example.

The dummy vias 34D provided for the via layer V1 may be affected by unevenness of a base, but are located at the same height as the height of the vias 34 belonging to the via layer V1 in the lamination direction. According to the present embodiment, it is assumed that both the vias 34 and the dummy vias 34D provided for the via layer V1 belong to the via layer V1. Note that the dummy vias 34D each have a size different from the size of the vias 34 in the extension direction, and are only required to be formed such that a majority of the dummy vias 34D are located at the same height position as the height position of the vias 34. Specifically, at least some of the dummy vias 34D and the vias 34 are only required to be arranged in a line in the horizontal direction.

The dummy vias 34D are in an electrically floating state. More specifically, the dummy vias 34D are not connected to the first semiconductor layer 20 and the wires 32. Moreover, the dummy vias 34D including light reflecting metal is capable of reflecting at least a part of light entering the optical detection device 1 and reaching the first wiring layer 30. More specifically, the first semiconductor layer 20 side end surface of each of the dummy vias 34D is capable of reflecting at least a part of light entering the optical detection device 1 and reaching the first wiring layer 30 toward the first semiconductor layer 20. Further, for example, each of the dummy vias 34D has a size of 100 nm or longer in the extension direction. However, this configuration is not required to be adopted. The foregoing configuration can reduce transmission of light through the dummy vias 34D. FIG. 119C depicts a planar region VIR which is a partial planar region of the via layer V1. As depicted in FIG. 119C, the dummy vias 34D are arranged in a matrix in the planar view, and fill regions between the respective vias 34. The vias 34 are sparsely provided in the planar region V1R. When an area where the vias 34 are provided and an area where the dummy vias 34D are provided are compared, the area where the dummy vias 34D are provided is considerably larger. For example, in the example depicted in FIG. 119C, an approximately ten times larger number of the dummy vias 34D than the number of the vias 34 are provided in the planar region VIR. Moreover, a proportion of the dummy vias 34D occupying the planar region VIR is preferably 30% or higher, more preferably 40% or higher, further preferably 50% or higher.

In addition, it is preferable that the size of the dummy vias 34D in the planar view be the same or approximately the same as the size of the vias 34 in the planar view. Such a configuration including the dummy vias 34D each having a small size in the planar view allows the dummy vias 34D to be arranged even in a small free space unlike a case where a dummy pattern, such as dummy wiring, having a large size is arranged.

As described above, the dummy vias 34D are uniformly spread through the wide area where the vias 34 are not provided. In this manner, a larger number of structures are allowed to be provided in the planar region VIR. More specifically, a larger number of structures can be provided in the planar region VIR without causing serious problems. It is thus possible to increase a total area of the structures reflecting light toward the first semiconductor layer 20. More specifically, it is possible to maximize the total area of the structures reflecting light toward the first semiconductor layer 20 in an allowable range. This configuration can reduce a decrease in reflection of light toward the first semiconductor layer 20, and can thus reduce a light amount transmitted through the via layer V1.

It is preferable that the dummy vias 34D be arranged as uniformly as possible in the planar view. This configuration is preferable because the shape of the dummy vias 34D may considerably change in association with a considerable change of an arrangement pitch of the dummy vias 34D. In addition, by providing the dummy vias 34D having the same or approximately the same size in the planar view as the size of the vias 34 in the planar view, a mask used in a lithography step can easily be manufactured.

As depicted in FIG. 119B, the insulation film 31 is a film including a plurality of interlayer dielectric films. The insulation film 31 has an NSG film 31*a* and a TEOS film 31*b* as the interlayer dielectric films. Each of the NSG film 31*a* and the TEOS film 31*b* will simply be referred to as the insulation film 31 without distinction in a case where distinction between the NSG film 31*a* and the TEOS film 31*b* or between these films and other films is unnecessary. The NSG film 31*a* is a non-doped silicon oxide ($SiO_2$) film, and so provided as to cover the first surface S1 of the first semiconductor layer 20. The TEOS film 31*b* is a silicon oxide film formed by CVD with use of TEOS (tetra-ethyl-ortho-silicate) as material gas. The TEOS film 31*b* is a silicon monoxide film (SiO). Note that the TEOS film 31*b* is not required to have a thickness and a height position in the lamination direction depicted in FIG. 119B.

Moreover, the insulation film 31 has an unillustrated tungsten oxide film. The tungsten oxide film has a function as a reflection film which reflects light toward the first semiconductor layer 20 side. More specifically, tungsten oxide has a refractive index which is approximately 2.2 and is higher than refractive indexes of the interlayer dielectric films (approximately 1.45) such as the NSG film 31*a* and the TEOS film 31*b*. In this case, the tungsten oxide film having a high refractive index exhibits a higher surface reflectance than those of other interlayer dielectric films, and hence has a function as a reflection film. It is preferable that the tungsten oxide film be provided at a closest possible position to the first semiconductor layer 20 where the photoelectric conversion element PD is provided, from a viewpoint of light reflection. For example, the tungsten oxide film may be provided between the first semiconductor layer 20 and the NSG film 31*a*. Moreover, for example, the tungsten oxide film may be provided between the NSG film 31*a* and the TEOS film 31*b*.

<Second Wiring Layer>

As depicted in FIG. 119A, the second wiring layer 40 has a multilayer wiring layer which includes the insulation film 41, the wires 42, and the vias (contacts) 44. Note that the second connection pads 43 described in the first embodiment are treated as the wires 42 in the present embodiment. The wires 42 are laminated via the insulation film 41. More specifically, the second wiring layer 40 has a plurality of metal layers laminated in the lamination direction via the insulation film 41. In addition, each of the metal layers has a plurality of wires 42 in the horizontal direction. The plurality of wires 42 belonging to the same metal layer may be affected by unevenness of a base, but can be regarded as being located at the same height in the lamination direction (Z-direction). FIG. 119A depicts an example where the second wiring layer 40 has the two metal layers M1 and M2. Each of the metal layers M1 and M2 has a plurality of wires 42 in the horizontal direction. The wires 42 include metal. For example, the metal constituting the wires 42 is copper or aluminum, but is not limited to these examples. The present embodiment will be explained on an assumption that the wires 42 include copper.

The vias 44 extend in the lamination direction. The second wiring layer 40 has a plurality of via layers in the lamination direction. In addition, each of the via layers has a plurality of vias 44 in the horizontal direction. The plurality of vias 44 belonging to the same via layer may be affected by unevenness of the base, but are considered to be located at the same height in the lamination direction (Z-direction). FIG. 119A depicts an example where the second wiring layer 40 has two via layers V1 and V2. Each of the via layers V1 and V2 has a plurality of the vias 44 in the horizontal direction. Each of the vias 44 electrically connects two members. For example, the vias 44 achieve electric connection between the respective wires 42, connection between the wires 42 and the second semiconductor layer 50, and other connection. However, this configuration is not required to be adopted. More specifically, the vias 44 belonging to the via layer V2 achieve electric connection between the respective wires 42. In addition, the vias 44 belonging to the via layer V1 achieve electric connection between the wires 42 and the second semiconductor layer 50. For example, the vias 44 belonging to the via layer V1 achieve electric connection between the transistors T2 formed in the second semiconductor layer 50 and the wires 42. However, this configuration is not required to be adopted. The vias 44 include metal. The metal constituting the vias 44 is tungsten (W), cobalt (Co), ruthenium (Ru), or copper (Cu), but is not limited to these examples. The present embodiment will be explained on an assumption that the vias 44 include tungsten.

Moreover, as depicted in FIG. 119D, the second wiring layer 40 has dummy vias (reflection members) 44D each extending in the lamination direction. The dummy vias 44D are provided for each of the plurality of via layers. According to the present embodiment, the dummy vias 44D are provided for each of the via layers V1 and V2. Further, the dummy vias 44D include metal expected to reflect light. The dummy vias 44 may include the same material as the material of the vias 44, or a different material. The present embodiment will be explained on an assumption that the dummy vias 44D include tungsten similarly to the vias 44. Note that the dummy vias 44D provided for the via layer V2 have a configuration similar to a configuration of the dummy vias 44D provided for the via layer V1, and hence are not depicted in the figure. The vias 44 and the dummy vias 44D provided in the via layer V1 will hereinafter be described by way of example.

The dummy vias 44D provided for the via layer V1 may be affected by unevenness of the base, but are located at the same height position as the height position of the vias 44 belonging to the via layer V1 in the lamination direction. According to the present embodiment, it is assumed that both the vias 44 and the dummy vias 44D provided for the via layer V1 belong to the via layer V1. Note that the dummy vias 44D have a size different from the size of the vias 44 in the extension direction, but are only required to be formed such that a majority of the dummy vias 44D are located at the same height position as the height position of the vias 44. Specifically, at least some of the dummy vias 44D and the vias 44 are only required to be arranged in a line in the horizontal direction.

The dummy vias 44D are in an electrically floating state. More specifically, the dummy vias 44D are not connected to the second semiconductor layer 50 and the wires 42. Moreover, the dummy vias 44D including light reflecting metal is capable of reflecting at least a part of light entering the optical detection device 1 and reaching the second wiring layer 40. More specifically, the second semiconductor layer 50 side end surface of each of the dummy vias 44D is capable of reflecting at least a part of light entering the optical detection device 1 and reaching the second wiring layer 40 toward the first semiconductor layer 20. Further, for example, each of the dummy vias 44D has a size of 100 nm or longer in the extension direction. However, this configuration is not required to be adopted. The foregoing configuration can reduce transmission of light through the dummy vias 44D. In addition, while not depicted in the figure, the dummy vias 44D are arranged in a matrix in the planar view as in the case of the first wiring layer 30, and fill regions between the respective vias 44. Moreover, as in the case of the dummy vias 34D, it is preferable that the size of the dummy vias 44D in the planar view be the same or approximately the same as the size of the vias 44 in the planar view. The dummy vias 44D are uniformly spread throughout the wide area where the vias 44 are not provided in the planar view. In this manner, a larger number of structures are allowed to be provided in the planar region. More specifically, a larger number of structures can be provided in the planar region without causing serious problems. It is thus possible to increase a total area of the structures reflecting light toward the first semiconductor layer 20. More specifically, it is possible to maximize the total area of the structures reflecting light toward the first semiconductor layer 20 in an allowable range. This configuration can reduce a decrease in reflection of light toward the first semiconductor layer 20, and thus can reduce a light amount transmitted through the via layer V1.

As described above, the dummy vias 34D and 44D are provided in the wiring layer located between the first semiconductor layer 20 and the second semiconductor layer 50 in the present embodiment.

<Third Wiring Layer>

As depicted in FIG. 119A, the third wiring layer 60 is a multilayer wiring layer which includes the insulation film 61, the wires 62, and the vias (contacts) 67. Note that the third connection pads 63 described in the first embodiment are treated as the wires 62 in the present embodiment.

<<Manufacturing Method of Optical Detection Device>>

A manufacturing method of the optical detection device 1 will be hereinafter described with reference to FIGS. 120A to 120G. Note that the same manufacturing method of the vias and the dummy vias is applicable to the respective via layers in the first wiring layer 30 and the respective via layers in the second wiring layer 40. Accordingly, the method for manufacturing the vias 34 and the dummy vias 34D belonging to the via layer V1 of the first wiring layer 30 will be described in the present embodiment by way of example. Note that the manufacturing method of the vias 34 and the dummy vias 34D will mainly be described in the present embodiment, and that other parts will not be explained.

First, as depicted in FIG. 120A, an insulation film 31*m*1, an insulation film 31*m*2, and an insulation film 31*m*3 are laminated in this order on the first surface S1 of the first semiconductor layer 20. For example, the insulation film 31*m*1 may be the NSG film 31*a*, but is not limited to this example. For example, the insulation film 31*m*2 may be a silicon nitride film, but is not limited to this example. For example, the insulation film 31*m*3 may be the TEOS film 31*b*, but is not limited to this example. Note that each of the insulation film 31*m*1, the insulation film 31*m*2, the insulation film 31*m*3, and an insulation film 31*m*4 described below will simply be referred to as the insulation film 31 in a case where distinction between these films is unnecessary. Thereafter, a resist pattern R12 having openings R12*a* is formed on an exposed surface of the insulation film 31*m*3 by a known lithography technology. The openings R12*a* are provided at positions overlapping with positions where the vias 34 are to be provided in the planar view. Thereafter, as depicted in FIG. 120B, portions exposed through the openings R12*a* are etched by a known dry-etching technology to form holes 34*h* each penetrating the insulation film 31*m*3, the insulation film 31*m*2, and the insulation film 31*m*1 and having a bottom reaching the first semiconductor layer 20. Thereafter, the resist pattern R12 is removed.

Next, as depicted in FIG. 120C, a resist pattern R13 having openings R13*a* is formed on an exposed surface of the insulation film 31*m*3 by a known lithography technology. The openings R13*a* are provided at positions overlapping with positions where the dummy vias 34D are to be provided in the planar view. The openings R13*a* are provided at positions not overlapping with the holes 34*h* in the planar view. Interiors of the holes 34*h* are also filled with resist constituting the resist pattern R13. Subsequently, as depicted in FIG. 120D, holes 34Dh are formed as holes in which the dummy vias 34D are to be embedded by etching portions exposed through the openings R13*a*, with use of a known dry-etching technology. At this time, etching processing time is controlled such that etching is stopped before the bottoms of the holes 34Dh reach the first semiconductor layer 20. In such a manner, the bottoms of the holes 34Dh are formed within the insulation film 31. Thereafter, the resist pattern R13 is removed.

Then, as depicted in FIG. 120E, a barrier metal layer BM including metal such as titanium is vapor-deposited on an exposed surface including inner walls of the holes 34*h* and the holes 34Dh, by a known sputtering technology. Thereafter, a tungsten film 34*m* is formed such that the interiors of the holes 34*h* and the holes 34Dh are filled with tungsten. Then, as depicted in FIG. 120F, unnecessary portions of the barrier metal layer BM and the tungsten film 34*m* are removed and flattened by CMP. In such a manner, the vias 34 and the dummy vias 34D are produced.

Subsequently, as depicted in FIG. 120G, the insulation film 31*m*4 is laminated on an exposed surface, and grooves 32*h* in which the wires 32 are to be embedded are formed by a known lithography technology and a known etching technology. Thereafter, a barrier metal layer and metal (copper) constituting the wires 32 are laminated in this order on an exposed surface including interiors of the grooves 32*h*. The copper constituting the wires 32 is laminated by plating. Then, unnecessary portions of the barrier metal layer and the tungsten film 34*m* are removed and flattened by CMP. In such a manner, the wires 32 are produced. In addition, in a case where the wiring layer of the optical detection device 1 has a plurality of via layers, processing similar to the above processing is only required to be repeatedly performed for each of the via layers. Processes following this process are not repeatedly explained.

<<Main Advantageous Effects of Sixteenth Embodiment>>

Main advantageous effects of the optical detection device 1 according to the sixteenth embodiment will hereinafter be described. Before the description of these effects, a summary of the present technology will be touched upon. For example, the optical detection device 1 of a certain laminated type has the following configuration. The photoelectric conversion element PD and the charge accumulation region FD are formed in the first semiconductor layer 20. Elements such as the amplification transistor AMP included in the readout circuit 15 are formed in the second semiconductor layer 50. Elements included in the logic circuit 13 are formed in the third semiconductor layer 80. According to the optical detection device 1 of such a laminated type, it is preferable to reduce the number of wires (the number of metal layers) between the charge accumulation region FD and the amplification transistor AMP (between the first semiconductor layer 20 and the second semiconductor layer 50) and thus reduce a distance between the charge accumulation region FD and the amplification transistor AMP as much as possible, for example. In such a manner, a wiring capacity can be reduced, and hence, effects imposed on photoelectric conversion efficiency by the wiring capacity can be reduced.

According to the optical detection device 1 described above, the number of wires is reduced. Accordingly, this configuration may decrease an amount of light that has transmitted through the first semiconductor layer 20, enters the first wiring layer 30 and the second wiring layer 40, and is then returned to the first semiconductor layer 20 by reflection on the wires. In this case, sensitivity of the photoelectric conversion element PD may be lowered. Moreover, when the distance between the charge accumulation region FD and the amplification transistor AMP is reduced, the light transmitted through the first semiconductor layer 20 may enter the second semiconductor layer 50. If the light enters the second semiconductor layer 50, the characteristics of the transistors formed in the second semiconductor layer 50 may change.

Meanwhile, the optical detection device 1 according to the sixteenth embodiment of the present technology has the dummy vias 34D and 44D each functioning as a reflection member, and uniformly provides the dummy vias 34D and 44D in the wide area where the vias 34 and 44 are not provided. Accordingly, a larger number of structures are allowed to be formed in the planar region. It is thus possible to increase a total area of the structures reflecting light toward the first semiconductor layer 20. As a result, lowering of sensitivity of the photoelectric conversion element PD can be reduced. Moreover, entrance of light into the second semiconductor layer 50 can be reduced, and hence, changes of the characteristics of the transistors formed in the second semiconductor layer 50 can be reduced.

Further, according to the optical detection device 1 of the sixteenth embodiment of the present technology, the vias 34 and 44 are sparsely provided in the planar view, but the dummy vias 34D and 44D functioning as reflection members are arranged in such a manner as to fill the free regions between the respective vias. In this case, a larger number of structures reflecting light toward the first semiconductor layer 20 are allowed to be provided without causing serious problems. Accordingly, it is possible to maximize the total area of the structures reflecting light toward the first semiconductor layer 20 in an allowable range. As a result, lowering of sensitivity of the photoelectric conversion element PD can be reduced. Moreover, entrance of light into the second semiconductor layer 50 can be reduced, and hence, changes of the characteristics of the transistors formed in the second semiconductor layer 50 can be reduced.

In addition, according to the optical detection device 1 of the sixteenth embodiment of the present technology, the dummy vias 34D and 44D functioning as reflection members are provided between the first semiconductor layer 20 and the second semiconductor layer 50. Accordingly, even in a case where the number of wires (the number of metal layers) between the first semiconductor layer 20 and the second semiconductor layer 50 is reduced, the dummy vias 34D and 44D reflect light toward the first semiconductor layer 20 in place of the reduced wires. In such a manner, the dummy vias 34D and 44 can compensate for light reflection by the wires. Accordingly, lowering of sensitivity of the photoelectric conversion element PD can be reduced. Moreover, entrance of light into the second semiconductor layer 50 can be reduced, and hence, changes of the characteristics of the transistors formed in the second semiconductor layer 50 can be reduced.

Further, according to the optical detection device 1 of the sixteenth embodiment of the present technology, the size of the dummy vias 34D in the planar view is the same or approximately the same as the size of the vias 34 in the planar view. Such a configuration including the dummy vias 34D each having a small size in the planar view allows the dummy vias 34D to be arranged even in a small free region unlike a case where a dummy pattern having a large size is arranged. It is thus possible to further increase the total area of the structures reflecting light toward the first semiconductor layer 20. As a result, lowering of sensitivity of the photoelectric conversion element PD can be further reduced. Moreover, entrance of light into the second semiconductor layer 50 can be further reduced, and hence, changes of the characteristics of the transistors formed in the second semiconductor layer 50 can be further reduced.

Moreover, the optical detection device 1 of the sixteenth embodiment of the present technology has the tungsten oxide film having a higher refractive index than interlayer dielectric films such as the NSG film 31*a* and the TEOS film 31*b*. In addition, the tungsten oxide film can reflect light toward the first semiconductor layer 20. As a result, lowering of sensitivity of the photoelectric conversion element PD can be reduced. Moreover, entrance of light into the second semiconductor layer 50 can be reduced, and hence, changes of the characteristics of the transistors formed in the second semiconductor layer 50 can be reduced.

While the dummy vias are provided for both the first wiring layer 30 and the second wiring layer 40 in the present sixteenth embodiment, the dummy vias may be provided for only either the first wiring layer 30 or the second wiring layer 40.

Moreover, while the dummy vias 34D are provided for all the via layers included in the first wiring layer 30 in the present sixteenth embodiment, the dummy vias 34D may be provided for only some of the via layers included in the first wiring layer 30. For example, the dummy vias 34D may be provided for only one layer of the via layers. Similarly, while the dummy vias 44D are provided for all the via layers included in the second wiring layer 40 in the present sixteenth embodiment, the dummy vias 34D may be provided for only some of the via layers included in the second wiring layer 40. For example, the dummy vias 44D may be provided for only one layer of the via layers. Further, the dummy vias may be provided for at least one layer of the via layers in the wiring layer located between the first semiconductor layer 20 and the second semiconductor layer 50.

In addition, according to the manufacturing method of the optical detection device 1 of the present sixteenth embodiment, the heights of the wire 32 side (upper side in the figure) ends of the vias 34 and the dummy vias 34D are equalized as depicted in FIG. 120F. However, this configuration is not required to be adopted. For example, the heights of the wire 32 side ends of the dummy vias 34D may be smaller than the heights of the wire 32 side ends of the vias 34. For example, the dummy vias 34D may first be formed, and then the vias 34 may be formed after the insulation film is laminated on the exposed surface. However, this configuration is not required to be adopted. In this case, the heights of the wire 32 side ends of the dummy vias 34D can be made smaller than the heights of the wire 32 side ends of the vias 34. Accordingly, the wires 32 electrically separated from the dummy vias 34D are allowed to be formed at positions overlapping with the dummy vias 34D in the planar view.

<<Modifications of Sixteenth Embodiment>>

Hereinafter described will be modifications of the sixteenth embodiment.

<Modification 1>

While the first semiconductor layer 20 and the second semiconductor layer 50 of the optical detection device 1 according to the sixteenth embodiment are joined to each other by F2F (Face to Face), the first semiconductor layer 20 and the second semiconductor layer 50 of the optical detection device 1 according to modification 1 of the sixteenth embodiment are joined to each other by F2B (Face to Back) as depicted in FIG. 6.

As depicted in FIG. 6, the third wiring layer 60 is overlapped and affixed to the first wiring layer 30. In that case, it is sufficient if the dummy vias are formed within the third wiring layer 60.

Advantageous effects similar to those of the optical detection device 1 of the sixteenth embodiment described above can be offered by the optical detection device 1 according to modification 1 of the sixteenth embodiment described here.

<Modification 2>

While the reflection members are provided in the via layers of the wiring layers according to the optical detection device 1 of the sixteenth embodiment, the reflection members are provided in the metal layers of the wiring layers according to the optical detection device 1 in modification 2 of the sixteenth embodiment depicted in FIGS. 121A and 121B. Note that the reflection members are provided in each of the metal layers included in the first wiring layer 30 and the second wiring layer 40 in the present modification. The reflection members of the respective metal layers have different shapes and are located at different arrangement positions in the planar view in some cases. Described in the present embodiment by way of example will be a case where the reflection members are provided in the metal layer M1 included in the first wiring layer 30.

<First Wiring Layer>

As depicted in FIGS. 121A and 121B, dummy wires (reflection members) 32D are formed in the metal layer M1 included in the first wiring layer 30. Moreover, the dummy wires 32D include metal expected to reflect light. For example, the dummy wires 32D may include the same material as the material of the wires 32, or a different material. The present embodiment will be explained on an assumption that the dummy wires 32D include copper similarly to the wires 32.

The dummy wires 32D provided for the metal layer M1 may be affected by unevenness of a base, but are located at the same height position as the height position of the wires 32 belonging to the metal layer M1, in the thickness direction. More specifically, at least some of the dummy wires 32D and the wires 32 are arranged in a line in the horizontal direction. In addition, according to the present embodiment, it is assumed that both the wires 32 and the dummy wires 32D provided for the metal layer M1 are considered to belong to the metal layer M1.

The dummy wires 32D are in an electrically floating state. More specifically, the dummy wire 32D are not connected to the vias 34 and the like. Moreover, the dummy wires 32D including light reflecting metal is capable of reflecting at least a part of light entering the optical detection device 1 and reaching the first wiring layer 30. More specifically, the first semiconductor layer 20 side end surface of each of the dummy wires 32D is capable of reflecting at least a part of light entering the optical detection device 1 and reaching the first wiring layer 30 toward the first semiconductor layer 20. Further, for example, each of the dummy wires 32D has a size of 100 nm or longer in the extension direction. However, this configuration is not required to be adopted. The foregoing configuration can reduce transmission of light through the dummy wires 32D. FIG. 121B depicts a planar region MIR which is a partial planar region of the metal layer M1. As depicted in FIG. 121B, the dummy wires 32D are arranged in an area between the respective wires 32. In such a configuration, the dummy wires 32D are arranged in the area where the wires 32 are not provided, and thus, a larger number of structures are allowed to be provided in the planar region MIR. Accordingly, a total area of the structures reflecting light toward the first semiconductor layer 20 increases. As a result, reduction of a decrease in reflection of light toward the first semiconductor layer 20 and reduction of a light amount transmitted through the metal layer M1 are achievable.

Advantageous effects similar to those of the optical detection device 1 of the sixteenth embodiment described above can be offered by the optical detection device 1 according to modification 2 of the sixteenth embodiment described here.

While the dummy wires are provided for both the first wiring layer 30 and the second wiring layer 40 in present modification 2 of the sixteenth embodiment, the dummy wires may be provided for only either the first wiring layer 30 or the second wiring layer 40.

Moreover, while the dummy wires 32D are provided for all the metal layers included in the first wiring layer 30 in present modification 2 of the sixteenth embodiment, the dummy wires 32D may be provided for only some of the metal layers included in the first wiring layer 30. For example, the dummy wires 32D may be provided for only one layer of the metal layers. Similarly, while the dummy wires 32D are provided for all the metal layers included in the second wiring layer 40 in the present sixteenth embodiment, the dummy wires 32D may be provided for only some of the metal layers included in the second wiring layer 40. For example, the dummy wires 32D may be provided for only one layer of the metal layers. Furthermore, the dummy wires may be provided for at least one layer of the metal layers in the wiring layer located between the first semiconductor layer 20 and the second semiconductor layer 50.

In addition, the present modification 2 of the sixteenth embodiment may be combined with the sixteenth embodiment described above, and the present modification 2 of the sixteenth embodiment may be combined with modification 1 of the sixteenth embodiment. Lowering of sensitivity of the photoelectric conversion element PD can be further reduced by providing the two types of reflection members which are the dummy vias and the dummy wires for the optical detection device 1. Moreover, entrance of light into the second semiconductor layer 50 can be further reduced, and hence, changes of the characteristics of the transistors formed in the second semiconductor layer 50 can be further reduced.

Seventeenth Embodiment

Hereinafter described will be a seventeenth embodiment of the present technology depicted in FIGS. 122 to 123C. The optical detection device 1 according to the present seventeenth embodiment is different from the optical detection device 1 according to the first embodiment described above in that a heat dissipation path PH which has one end connected to the second semiconductor layer 50 and the other end connected to the third semiconductor layer 80 is provided. Other configurations of the optical detection device 1 are basically similar to the corresponding configurations of the optical detection device 1 according to the first embodiment described above. Note that the constituent elements already described will be given the same reference signs, and will not be repeatedly explained.

<<Configuration of Optical Detection Device>>

The configuration of the optical detection device 1 according to the seventeenth embodiment of the present technology will hereinafter be described while focus is placed on a part different from the configuration of the optical detection device 1 according to the first embodiment described above. In addition, an optical detection unit UT according to the seventeenth embodiment of the present technology will be described. Note that scales of constituent elements depicted in some of the figures associated with the present seventeenth embodiment are different from scales of the same constituent elements in the other figures describing the seventeenth embodiment. Moreover, in some of the figures explaining the present seventeenth embodiment, some of the constituent elements of the optical detection device 1 are not depicted. Furthermore, the barrier metal layer is not depicted in some of the figures explaining the present seventeenth embodiment.

<Optical Detection Unit>

The optical detection unit UT will first be described. As depicted in FIG. 122, the optical detection unit UT has a frame FR, a transparent substrate GL, and the semiconductor chip 2 which is sealed in a closed space surrounded by the frame FR and the transparent substrate GL and carries the optical detection device 1. A light entrance surface of the semiconductor chip 2 faces the transparent substrate GL. The first semiconductor layer 20 is located near the light entrance surface of the semiconductor chip 2. A surface of the semiconductor chip 2 on the side (adhesive surface) opposite to the light entrance surface is fixed to the frame FR by a die attach member DA. The third semiconductor layer 80 is located near the adhesive surface of the semiconductor chip 2. Moreover, the semiconductor chip 2 is electrically connected to an inner lead IL provided within the frame FR via wire bonding WB. The inner lead IL is electrically connected to a land LD in the surface of the optical detection unit UT on the side opposite to the transparent substrate GL. The land LD is mounted on a mounting substrate MB via bumps BP. In such a manner, the optical detection unit UP is mounted on the mounting substrate MB. In addition, the frame FR and the transparent substrate GL constitute a package.

For example, a material constituting the frame FR is ceramic or resin. The present embodiment will be described on an assumption that the frame FR includes ceramic. For example, the transparent substrate GL includes glass. For example, the die attach member DA includes silver paste. Each of the inner lead IL and the land LD includes metal. For example, the wire bonding WB includes gold. For example, the bumps BP include solder.

At least a part of heat generated within the semiconductor chip 2 is dissipated from the light entrance surface side, the adhesive surface side, and the like toward the outside of the semiconductor chip 2. Arrows G1 in FIG. 122 depict routes of heat dissipated from the adhesive surface side and the like. As indicated by the arrows G1, heat is dissipated from the adhesive surface of the semiconductor chip 2 toward the mounting substrate MB. More specifically, heat is dissipated from the adhesive surface of the semiconductor chip 2 toward the mounting substrate MB via the die attach member DA, the land LD, the bumps BP, and the like.

<Heat Dissipation Path>

As depicted in FIG. 123A, the optical detection device 1 has the heat dissipation path PH for dissipating heat, separately from an electric path provided for transmitting electric signals. The heat dissipation path PH is a path mainly used for heat transmission. The optical detection device 1 has a plurality of such heat dissipation paths PH described here. The heat dissipation path PH extends in the thickness direction of the optical detection device 1 between the second semiconductor layer 50 and the third semiconductor layer 80 to thermally connect the second semiconductor layer 50 and the third semiconductor layer 80. One end of the heat dissipation path PH is connected to the third semiconductor layer 80 side surface of the second semiconductor layer 50, and the other end of the heat dissipation path PH is connected to the second semiconductor layer 50 side surface of the third semiconductor layer 80. According to the present embodiment, the one end of the heat dissipation path PH is connected to the fourth surface S4 of the second semiconductor layer 50, and the other end of the heat dissipation path PH is connected to the fifth surface S5 of the third semiconductor layer 80. For example, an electric path including the second conductor 52 here is so provided as to penetrate the second semiconductor layer 50. However, the heat dissipation path PH, which is a path mainly used for heat transfer, is only required to connect the respective opposite surfaces of the second semiconductor layer 50 and the third semiconductor layer 80, and thus is not required to penetrate the second semiconductor layer 50. Moreover, the heat dissipation path PH penetrates the wiring layer located between the second semiconductor layer 50 and the third semiconductor layer 80. According to the present embodiment, the heat dissipation path PH penetrates the third wiring layer 60 and the fourth wiring layer 70. Such a configuration allows at least a part of heat generated within the second semiconductor layer 50 to be dissipated into the third semiconductor layer 80 via the heat dissipation path PH, and then dissipated to the mounting substrate MB along the routes indicated by the arrows G1 depicted in FIG. 122.

The heat dissipation path PH includes a heat conductor. In a case where a heat dissipation effect of the heat dissipation path PH is examined from a viewpoint of material, heat resistance of the heat dissipation path PH decreases as heat conductivity of the heat conductor increases. With a decrease in the heat resistance, heat is allowed to smoothly shift via the heat dissipation path PH. Accordingly, the heat conductivity of the heat conductor constituting the heat dissipation path PH preferably has the highest possible value within the allowable range. Note that the phrase which reads that the heat dissipation path PH "preferably has the highest possible value within the allowable range" permits selection of the material of the heat conductor in consideration of factors other than the heat conductivity, such as a factor associated with a manufacturing step.

The one end of the heat dissipation path PH constitutes one of a heat collection portion and a heat dissipation portion, while the other end of the heat dissipation path PH constitutes the other of the heat collection portion and the heat dissipation portion. According to the present embodiment, as depicted in FIG. 123A, the one end of the heat dissipation path PH constitutes a heat collection portion PHa, while the other end of the heat dissipation path Ph constitutes a heat dissipation portion PHb. Moreover, a portion included in the heat dissipation path PH and located between the heat collection portion PHa and the heat dissipation portion PHb will be referred to as an intermediate portion PHc for distinction from the heat collection portion PHa and the heat dissipation portion PHb. Note that each of the heat collection portion PHa, the heat dissipation portion PHb, and the intermediate portion PHc will simply be referred to as the heat dissipation path PH in a case where distinction between these portions is unnecessary. Moreover, a portion integrating the heat collection portion PHa, the heat dissipation portion PHb, and the intermediate portion PHc will also be referred to as the heat dissipation path PH. At least a part of the heat collection portion PHa corresponding to the one end of the heat dissipation path PH is embedded within the second semiconductor layer. In addition, at least a part of the heat dissipation portion PHb corresponding to the other end of the heat dissipation path PH is embedded within the third semiconductor layer 80. The heat collection portion PHa, the heat dissipation portion PHb, and the intermediate portion PHc will hereinafter be described. Note that a see-through shape of the intermediate portion PHc in the figure described in the following explanation is presented for easy understanding of the explanation even though a position of the intermediate portion PHc in the Y-direction is different from a position of the heat collection portion PHa in the Y-direction.

<Heat Collection Portion>

As depicted in FIG. 123B, the heat collection portion PHa has a function of collecting a part of heat generated within the second semiconductor layer 50. More specifically, the heat collection portion PHa has a function of collecting heat from a portion around the heat collection portion PHa in the second semiconductor layer 50. The heat collection portion PHa has an embedded portion PHa1 and a connection member PHa2. The heat collection portion PHa and the second semiconductor layer 50 are insulated from each other by an insulation film. For example, the embedded portion PHa1 and the second semiconductor layer 50 are insulated from each other by an insulation film 61*m*14, while the connection member PHa2 and the second semiconductor layer 50 are insulated from each other by the silicon cover film 65. However, this configuration is not required to be adopted. For example, the insulation film 61*m*14 includes silicon oxide, but is not limited to this example. The silicon cover film 65 is an insulation film.

A plurality of embedded portions PHa1 are provided for each of the heat dissipation paths PH. More specifically, a plurality of embedded portions PHa1 are provided for each of the heat collection portions PHa. The embedded portions PHa1 are portions included in the heat collection portion PHa and embedded in the second semiconductor layer 50. The embedded portions PHa1 are embedded in holes formed in the thickness direction of the second semiconductor layer 50 from the fourth surface S4. The embedded portions PHa1 thus embedded in the second semiconductor layer 50 can increase a contact area between the heat collection portion PHa and the second semiconductor layer 50. In such a manner, heat collection efficiency can be made higher than in a case where no embedded portion is provided. An end included in each of the embedded portions PHa1 in the Z-direction and located on the third semiconductor layer 80 side is exposed from the second semiconductor layer 50, and connected to the connection member PHa2.

The connection member PHa2 is laminated on the fourth surface S4 of the second semiconductor layer 50 via the silicon cover film 65. As depicted in FIG. 123B, the one connection member PHa2 is connected to a plurality of embedded portions PHa1. More specifically, the second semiconductor layer 50 side surface of the one connection member PHa2 is connected to the plurality of embedded portions Pha1. In addition, the silicon cover film 65 at a portion of contact between the connection member Pha2 and the embedded portions PHa1 is removed. FIG. 123B depicts an example where the six embedded portions PHa1 are connected to the connection member PHa2. However, the number of the embedded portions PHa1 connected to the connection member PHa2 is not limited to six. The connection member PHa2 is disposed in such a manner as to avoid contact with the second conductor 52, the wires 62, and the like.

As depicted in FIGS. 123A and 123B, the third semiconductor layer 80 side surface of the connection member PHa2 is connected to the intermediate portion PHc. Heat collected by the plurality of embedded portions PHa1 is integrated by the connection member PHa2, and transmitted to the intermediate portion PHc.

Examples of the material constituting the embedded portions PHa1 include tungsten (heat conductivity: 198 (W/mk)), tungsten-silicon alloy (heat conductivity: 177 (W/mk)), cobalt (heat conductivity: 105 (W/mk)), copper (heat conductivity: 403 (W/mk)), and ruthenium. However, the material of the embedded portions PHa1 is not limited to these examples. Moreover, examples of the material constituting the connection member PHa2 include the same materials as the materials constituting the embedded portions PHa1, carbon nanotube (heat conductivity: 200 (W/mk)), and graphene (heat conductivity: 1200 (W/mk)). However, the material constituting the connection member PHa2 is not limited to these examples. In addition, each heat conductivity described above is heat conductivity at 20° C. Note that silicon oxide used as an insulation film for the wiring layers such as the third wiring layer 60 and the fourth wiring layer 70 has a heat conductivity of 1.38 (W/mk). It is apparent from above that the heat conductivity of each of the materials constituting the embedded portions PHa1 and the connection member PHa2 is higher than the heat conductivity of silicon oxide. Described in the present embodiment will be an example where each of the embedded portions PHa1 and the connection member PHa2 includes tungsten.

<Intermediate Portion>

As depicted in FIG. 123A, the intermediate portion PHc is provided in an area from the heat collection portion PHa to the heat dissipation portion PHb without disconnection. Such a configuration allows the intermediate portion PHc to function as a heat transfer portion for transferring at least a part of heat generated within the second semiconductor layer 50 to the heat dissipation portion PHb. The intermediate portion PHc is formed by the same manufacturing process as that of the electric path for transmitting electric signals. Accordingly, the intermediate portion PHc has a laminated structure where a plurality of wires are laminated and connected in the thickness direction of the optical detection device 1. In the example depicted in FIG. 123A, the intermediate portion PHc has a laminated structure where a plurality of wires 62 and a plurality of wires 72 are laminated and connected. More specifically, the intermediate portion PHc has a laminated structure where the wires 62 of the respective metal layers M1 and M2 included in the third wiring layer 60 and the wires 72 of the respective metal layers M1 to M5 included in the fourth wiring layer 70 are laminated and connected in the thickness direction of the optical detection device 1. The numbers of the metal layers included in the respective wiring layers are not limited to the numbers of the example depicted in FIG. 123A. Note that the third connection pads 63 described in the first embodiment are handled as the wires 62 in the present embodiment. Similarly, the fourth connection pads 73 described in the first embodiment are treated as the wires 62 in the present embodiment. In addition, the wire 62 constituting the intermediate portion PHc will be referred to as a wire 62*p* for distinction from the wire 62 constituting the electric path. The wire 62*p* will simply be referred to as the wire 62 in a case where distinction from other wires 62 is unnecessary. Similarly, the wire 72 constituting the intermediate portion PHc will be referred to as a wire 72*p* for distinction from the wire 72 constituting the electric path. The wire 72*p* will simply be referred to as the wire 72 in a case where distinction from other wires 72 is unnecessary. Moreover, while each of the wires 62 and 62*p* and the wires 72 and 72*p* is configured such that the wire and the via are formed integrally with each other by damascene processing in the present embodiment, the present technology is not limited to this example. Each of the wires and the vias may be separately formed. Even in this case, each of the wires and the vias is only required to include a heat conductor.

According to the example depicted in FIG. 123B, the wire 62*p* belonging to the metal layer M1 of the third wiring layer 60 in the wires included in the intermediate portion PHc is connected to the connection member PHa2. A planar position of connection between the wire 62*p* and the connection member PHa2 is not limited to the position depicted in FIG. 123B. According to an example depicted in FIG. 123C, the wire 72*p* belonging to the metal layer M1 of the fourth wiring layer 70 in the wires included in the intermediate portion PHc is connected to a connection member PHb2 described below. More specifically, a plurality of portions of the wire 72*p* are connected to the connection member PHa2. Connection between the plurality of portions of the wire 72*p* and the connection member PHa2 allows heat to be smoothly transferred to the connection member PHa2. Note that only one portion of the wire 72*p* may be connected to the connection member PHa2.

For example, a material constituting the intermediate portion PHc, more specifically, a material constituting the respective wires of the intermediate portion PHc, is copper, carbon nanotube, or graphene, but is not limited to these examples. Moreover, a part of the intermediate portion PHc may include copper, while a different part of the intermediate portion PHc may include carbon nanotube. It is apparent from above that the heat conductivity of the material constituting the intermediate portion PHc is higher than the heat conductivity of silicon oxide (1.38 (W/mk)). Described in the present embodiment will be an example where each of the wires of the intermediate portion PHc includes copper.

<Heat Dissipation Portion>

The heat dissipation portion PHb functions as a heat sink for dissipating a part of heat generated within the second semiconductor layer 50 into the third semiconductor layer 80. As depicted in FIG. 123C, the heat dissipation portion PHb has embedded portions PHb1 and the connection member PHb2. The heat dissipation portion PHb and the third semiconductor layer 80 are insulated from each other by an insulation film 61*m*15. For example, the insulation film 61*m*15 includes silicon oxide, but is not limited to this example. As described above, the heat collection portion PHa is electrically separated from the second semiconductor layer 50, and the heat dissipation portion PHb is electrically separated from the third semiconductor layer 80. Accordingly, the heat dissipation path PH is in an electrically floating state.

A plurality of embedded portions PHb1 are provided for each of the heat dissipation paths PH. More specifically, a plurality of embedded portions PHb1 are provided for each of the heat dissipation portions Phb. The embedded portions PHb1 are portions included in the heat dissipation portion PHb and embedded in the third semiconductor layer 80. The embedded portions PHb1 are embedded in holes formed in the thickness direction of the third semiconductor layer 80 from the fifth surface S5. The embedded portions PHb1 embedded in the third semiconductor layer 80 can increase a contact area between the heat dissipation portion PHb and the third semiconductor layer 80. In such a manner, heat dissipation efficiency can be made higher than in a case where no embedded portion is provided. An end included in each of the embedded portions PHb1 in the Z-direction and located on the second semiconductor layer 50 side is exposed from the third semiconductor layer 80, and connected to the connection member PHb2.

The connection member PHb2 is laminated on the fourth surface S4 of the third semiconductor layer 80 via the insulation film 61*m*15. As depicted in FIG. 123C, the one connection member PHb2 is connected to a plurality of embedded portions PHb1. More specifically, the third semiconductor layer 80 side surface of the one connection member PHb2 is connected to the plurality of embedded portions Phb1. In addition, the insulation film 61*m*15 at a portion of contact between the connection member PHb2 and the embedded portions PHb1 is removed. FIG. 123C depicts an example where nine embedded portions PHb1 are connected to the connection member PHb2. However, the number of the embedded portions PHb1 connected to the connection member PHb2 is not limited to nine.

As depicted in FIGS. 123A and 123C, the second semiconductor layer 50 side surface of the connection member PHb2 is connected to the intermediate portion PHc. The connection member PHb2 receives heat from the intermediate portion PHc. At least a part of the received heat is transferred to a plurality of embedded portions PHb1, and then transferred from the embedded portions PHb1 to the third semiconductor layer 80. Thereafter, the heat within the third semiconductor layer 80 is allowed to be dissipated to the outside of the semiconductor chip 2 via the frame FR as indicated by the arrows G1 in FIG. 122.

For example, a material constituting the embedded portions PHb1 is the same materials as the materials constituting the embedded portions PHa1, but is not limited to these examples. In addition, for example, a material constituting the connection member PHb2 is the same materials as the materials constituting the connection member PHa2, but is not limited to this example. It is apparent from above that the heat conductivity of each of the materials constituting the embedded portions PHb1 and the connection member PHb2 is higher than the heat conductivity of silicon oxide (1.38 (W/mk)). Described in the present embodiment will be an example where each of the embedded portions PHb1 and the connection member PHb2 includes tungsten.

<<Main Advantageous Effects of Seventeenth Embodiment>>

Main advantageous effects of the optical detection device 1 according to the seventeenth embodiment will hereinafter be described. Before the description of these effects, a summary of the present technology will be touched upon. The optical detection device 1 of a three-layer laminated type has a laminated structure where the first semiconductor layer 20, the second semiconductor layer 50, and the third semiconductor layer 80 are laminated in the thickness direction. Each of these semiconductor layers includes elements such as transistors. In addition, heat is generated in the semiconductor layers by operation of the transistors. It is preferable that the heat generated in the semiconductor layers be dissipated to the outside of the optical detection device 1 as much as possible so as to reduce accumulation of the heat within the optical detection device 1.

The second semiconductor layer 50 is located between the first semiconductor layer 20 and the third semiconductor layer 80. Accordingly, heat generated within the second semiconductor layer 50 is more difficult to dissipate to the outside of the optical detection device 1 than heat generated within the first semiconductor layer 20 and the third semiconductor layer 80. Moreover, the first wiring layer 30 and the second wiring layer 40 are interposed between the third surface S3 of the second semiconductor layer 50 and the first surface S1 of the first semiconductor layer 20, while the third wiring layer 60 and the fourth wiring layer 70 are interposed between the fourth surface S4 of the second semiconductor layer 50 and the fifth surface S5 of the third semiconductor layer 80. Each of these wiring layers has an insulation film. In addition, the heat conductivity of silicon oxide constituting the insulation film is 1.38 (W/mk), which is approximately one hundredth of the conductivity of silicon having heat conductivity of 120 to 140 (W/mk) and constituting the semiconductor layers. When silicon oxide having low heat conductivity is provided on both sides of the second semiconductor layer 50 in the Z-direction, the heat generated within the second semiconductor layer 50 is difficult to dissipate to the outside of the optical detection device 1 in the Z-direction.

Meanwhile, the optical detection device 1 according to the seventeenth embodiment of the present technology has the heat dissipation path PH which has one end connected to the third semiconductor layer 80 side surface of the second semiconductor layer 50 and the other end connected to the third semiconductor layer 80. Accordingly, a part of heat generated within the second semiconductor layer 50 is discharged into the third semiconductor layer 80 via the heat dissipation path PH. Thereafter, at least a part of the heat discharged into the third semiconductor layer 80 is discharged to the frame FR of the package via the junction surface of the optical detection device 1, and then discharged to the mounting substrate MB via the bumps BP. Accordingly, a part of the heat generated within the second semiconductor layer 50 can be discharged to the outside of the optical detection device 1 via the heat dissipation path PH. Moreover, a part of the heat generated within the second semiconductor layer 50 can be discharged to the outside of the optical detection unit UT.

Further, according to the optical detection device 1 of the seventeenth embodiment of the present technology, the embedded portions PHa1 of the heat collection portion PHa are embedded in the second semiconductor layer 50. Accordingly, a contact area between the heat collection portion PHa and the second semiconductor layer 50 increases, and hence, heat collection efficiency improves in comparison with a case where no embedded portion is provided.

In addition, according to the optical detection device 1 of the seventeenth embodiment of the present technology, a plurality of embedded portions PHa1 of the heat collection portion PHa are provided for each of the heat collection portions PHa. Accordingly, the contact area between the heat collection portion PHa and the second semiconductor layer 50 further increases, and therefore heat collection efficiency further improves.

Moreover, according to the optical detection device 1 of the seventeenth embodiment of the present technology, the embedded portions PHb1 of the heat dissipation portion PHb are embedded in the third semiconductor layer 80. Accordingly, a contact area between the heat dissipation portion PHb and the third semiconductor layer 80 increases, and thus, heat dissipation efficiency improves in comparison with a case where no embedded portion is provided.

Further, according to the optical detection device 1 of the seventeenth embodiment of the present technology, a plurality of embedded portions PHb1 of the heat dissipation portion PHb are provided for each of the heat dissipation paths PH. Accordingly, the contact area between the heat dissipation portion PHb and the third semiconductor layer 80 further increases, and thus, heat dissipation efficiency further improves.

In addition, the optical detection device 1 according to the seventeenth embodiment of the present technology has a plurality of heat dissipation paths PH. Accordingly, a heat amount corresponding to the number of heat dissipation paths PH can be discharged to the outside of the optical detection device 1.

Moreover, according to the optical detection device 1 of the seventeenth embodiment of the present technology, the heat collection portion PHa is electrically separated from the second semiconductor layer 50, and the heat dissipation portion PHb is electrically separated from the third semiconductor layer 80. In this case, the heat dissipation path PH is in an electrically floating state. Accordingly, a flow of electric signals in the heat dissipation path PH can be reduced.

Furthermore, according to the optical detection device 1 of the seventeenth embodiment of the present technology, the heat dissipation path PH is connected to the third semiconductor layer 80 side surface of the second semiconductor layer 50. The heat dissipation path PH is a path mainly used for transmission of heat, and hence is not required to penetrate the second semiconductor layer 50 unlike the electric path. In this case, a necessity of forming a hole that penetrates the second semiconductor layer 50 during formation of the heat dissipation path PH can be eliminated. Accordingly, this configuration can reduce a region where elements are not allowed to be formed in the second semiconductor layer by the presence of the heat dissipation path PH.

<<Modifications of Seventeenth Embodiment>>

Hereinafter described will be modifications of the seventeenth embodiment.

<Modification 1>

According to the optical detection device 1 in the seventeenth embodiment of the present technology, the heat collection portion PHa is electrically separated from the second semiconductor layer 50, and the heat dissipation portion PHb is electrically separated from the third semiconductor layer 80, and hence, the heat dissipation path PH is in an electrically floating state. However, an electric conduction state is achieved in the optical detection device 1 according to modification 1 of the seventeenth embodiment.

According to the configuration of the present modification, the insulation film 61*m*14 depicted in FIG. 123B is not provided, and thus, electric conduction is achieved between the heat collection portion PHa and the second semiconductor layer 50. Further, a configuration eliminating the silicon cover film 65 located between the connection member PHa2 and the second semiconductor layer 50 may be adopted. In addition, according to the configuration of the present modification, the insulation film 61*m*15 depicted in FIG. 123C is not provided, and hence, electric conduction is achieved between the heat dissipation portion PHb and the third semiconductor layer 80.

In a case where the heat dissipation path PH is allowed to be fixed to a reference potential (e.g., ground), the electric conduction state may be achieved by directly connecting the heat dissipation path PH to the second semiconductor layer 50 and the third semiconductor layer 80 as described above. Each of the semiconductor layers has a potential fixed to the reference potential. Accordingly, if the heat dissipation path PH is allowed to be fixed to the reference potential by appropriately defining a layout position of the heat dissipation path PH, the heat dissipation path PH may be directly connected to the semiconductor layers. In addition, in a case where the heat dissipation path PH is difficult to fix to the reference potential, the heat dissipation path PH is only required to be brought into an electrically floating state as described above in the seventeenth embodiment. By bringing the heat dissipation path PH into an electrically floating state, a design load of the layout position can be made lower than in the case of the heat dissipation path PH brought into the conduction state.

Advantageous effects similar to those of the optical detection device 1 of the seventeenth embodiment described above can be offered by the optical detection device 1 according to modification 1 of the seventeenth embodiment described here.

Moreover, according to the optical detection device 1 in modification 1 of the seventeenth embodiment, the heat dissipation path PH can be directly connected to the semiconductor layers without the necessity of providing an insulation film having low heat conductivity, such as silicon oxide, between the heat dissipation path PH and the semiconductor layers. Accordingly, a shift of heat via the heat dissipation path PH can be more smoothly achieved.

<Modification 2>

While the second semiconductor layer 50 and the third semiconductor layer 80 are joined to each other by B2F (Back to Face) in the optical detection device 1 according to the seventeenth embodiment, these layers are joined by F2F (Face to Face) as depicted in FIG. 6 in the optical detection device 1 according to modification 2 of the seventeenth embodiment.

As depicted in FIG. 6, the fourth wiring layer 70 is overlapped and affixed to the second wiring layer 40. In this case, the heat collection portion PHa of the heat dissipation path PH is connected to the third surface S3 of the second semiconductor layer 50, while the heat dissipation portion PHb is connected to the fifth surface S5 of the third semiconductor layer 80. In addition, the heat dissipation path PH penetrates the second wiring layer 40 and the fourth wiring layer 70.

Advantageous effects similar to those of the optical detection device 1 of the seventeenth embodiment described above can be offered by the optical detection device 1 according to modification 2 of the seventeenth embodiment described here.

OTHER EMBODIMENTS

While the first embodiment to the twelfth embodiments have been described above to explain the present technology, the present technology should not be considered to be limited to the statements and the drawings constituting a part of this disclosure. Various alternative embodiments, examples, and operation techniques may become apparent for those skilled in the art in the light of this disclosure.

For example, the respective technical ideas described in the first embodiment to the twelfth embodiment and the modifications of these embodiments may be combined. For example, while the second conductor 52 according to modification 2 of the first embodiment described above is formed by the via last method, such a technical idea may be applied to the other modifications of the first embodiment. In this manner, various combinations following the respective technical ideas may be adopted.

Moreover, the present technology is applicable to not only a solid-state imaging device functioning as the image sensor described above, but also optical detection devices in general including a ranging sensor, which is also called a ToF (Time of Flight) sensor, for measuring a distance. The ranging sensor is a sensor which emits irradiation light toward an object, detects reflection light as the irradiation light reflected on and returned from a surface of the object, and calculates a distance to the object in reference to a flight time taken from emission of the irradiation light to reception of the reflection light. The structure of the first conductor and the second conductor described above is adoptable as a structure of this ranging sensor. Moreover, the present technology is applicable to a semiconductor device other than the optical detection device 1. Further, for example, the materials constituting the constituent elements described above may contain additives, impurities, or the like.

In addition, for example, the first width corresponding to the width of the first conductor (the size in the horizontal direction) may be a width in microns, while the second width corresponding to the width of the second conductor (the size in the horizontal direction) may be a width in nanometers. As can be understood, each of the widths of the first conductor and the second conductor is not limited to a size representing a local part of the first conductor or the second conductor, and may be interpreted as a size viewed on the whole.

Moreover, while the first embodiment to the seventeenth embodiments have been described above to explain the present technology, the present technology should not be considered to be limited to statements and drawings constituting a part of this disclosure. Various alternative embodiments, examples, and operation techniques may become apparent for those skilled in the art in the light of this disclosure.

For example, the respective technical ideas described in the first embodiment to the seventeenth embodiment and the modifications of these embodiments may be combined. Various combinations following the respective technical ideas are adoptable.

Further, the optical detection devices 1 described above in the thirteenth embodiment to the seventeenth embodiment may be applied to the electronic apparatus, the mobile body, and the endoscopic surgery system described in the twelfth embodiment.

As described above, it is obvious that the present technology includes various embodiments and the like not described here. Accordingly, it is intended that the technical scope of the present technology be defined only by particular matters of the invention described in the claims and appropriate in light of the above description.

In addition, advantageous effects to be offered are not limited to those described in the present description only by way of example, and other advantageous effects may be produced.

Note that the present technology may also have the following configurations.

(1)

An optical detection device including:

a first semiconductor layer that includes a photoelectric conversion region, and has one surface corresponding to a first surface and another surface corresponding to a second surface that is a light entrance surface;

a first wiring layer overlapped with the first surface of the first semiconductor layer;

a second wiring layer overlapped with a surface of the first wiring layer on a side opposite to the first semiconductor layer side surface;

a second semiconductor layer that has one surface corresponding to a third surface and another surface corresponding to a fourth surface, the third surface being overlapped with a surface of the second wiring layer on the side opposite to the first wiring layer side surface;

a third wiring layer overlapped with the fourth surface of the second semiconductor layer;

a first conductor that has a first width, includes a first material, and penetrates the second semiconductor layer in a thickness direction; and a second conductor that has a second width smaller than the first width, includes a second material different from the first material, and penetrates the second semiconductor layer in the thickness direction.

(2)

The optical detection device according to (1), in which one side end of the first conductor and one side end of the second conductor are respectively connected to different wires belonging to one metal layer.

(3)

The optical detection device according to (2), in which the one metal layer is a metal layer included in metal layers of the second wiring layer or the third wiring layer and located closest to the second semiconductor layer.

(4)

The optical detection device according to (2) or (3), including:

a barrier insulation film that is provided at a position overlapping with the wires in the thickness direction, and prevents diffusion of metal.

(5)

The optical detection device according to any one of (1) through (4), in which the second conductor is provided in a region that is included in the second semiconductor layer and that overlaps, in a planar view, with a pixel region where a plurality of the photoelectric conversion regions are arranged in a matrix.

(6)

The optical detection device according to (5), in which the first conductor is provided in a region that is included in the second semiconductor layer and that overlaps, in the planar view, with a peripheral region that is provided outside the pixel region and that surrounds the pixel region.

(7)

The optical detection device according to any one of (1) through (6), in which the first width corresponds to a size of a larger end of the first conductor in a penetration direction, and the second width corresponds to a size of a larger end of the second conductor in a penetration direction.

(8)

The optical detection device according to (7), in which both the end that is included in the first conductor and that has the first width and the end that is included in the second conductor and that has the second width are located in an identical wiring layer that is either the second wiring layer or the third wiring layer.

(9)

The optical detection device according to (7), in which one of the end that is included in the first conductor and that has the first width and the end that is included in the second conductor and that has the second width is located in the second wiring layer, and the other of the end that is included in the first conductor and that has the first width and the end that is included in the second conductor and that has the second width is located in the third wiring layer.

(10)

The optical detection device according to any one of (1) through (9), in which the first width ranges from 1 to 5 μm inclusive, and the second width ranges from 40 to 300 nm inclusive.

(11)

The optical detection device according to any one of (1) through (10), in which the first conductor contains copper, and the second conductor contains high melting metal.

(12)

The optical detection device according to any one of (1) to (11), including:

a fourth wiring layer overlapped with a surface of the third wiring layer on a side opposite to the second semiconductor layer side surface; and a third semiconductor layer overlapped with a surface of the fourth wiring layer on a side opposite to the third wiring layer side surface, in which the second semiconductor layer has a transistor constituting a readout circuit, and the third semiconductor layer has a transistor constituting a logic circuit.

(13)

An optical detection device including:

a first semiconductor layer that includes a photoelectric conversion region, and has one surface corresponding to a first surface and another surface corresponding to a second surface that is a light entrance surface;

a first wiring layer overlapped with the first surface of the first semiconductor layer;

a second wiring layer overlapped with a surface of the first wiring layer on a side opposite to the first semiconductor layer side surface;

a second semiconductor layer that has one surface corresponding to a third surface and another surface corresponding to a fourth surface, the third surface being overlapped with a surface of the second wiring layer on a side opposite to the first wiring layer side surface;

a third wiring layer overlapped with the fourth surface of the second semiconductor layer;

a first conductor that has a first width, and penetrates the second semiconductor layer in a thickness direction; and a second conductor that has a second width smaller than the first width, and penetrates the second semiconductor layer in the thickness direction.

(14)

An optical detection device including:

a first semiconductor layer that includes a photoelectric conversion region, and has one surface corresponding to a first surface and another surface corresponding to a second surface that is a light entrance surface;

a first wiring layer overlapped with the first surface of the first semiconductor layer;

a second wiring layer overlapped with a surface of the first wiring layer on a side opposite to the first semiconductor layer side surface;

a second semiconductor layer that has one surface corresponding to a third surface and another surface corresponding to a fourth surface, the third surface being overlapped with a surface of the second wiring layer on the side opposite to the first wiring layer side surface;

a third wiring layer overlapped with the fourth surface of the second semiconductor layer;

a first conductor that includes a first material, and penetrates the second semiconductor layer in a thickness direction; and a second conductor that includes a second material different from the first material, and penetrates the second semiconductor layer in the thickness direction.

(15)

A manufacturing method of an optical detection device, the manufacturing method including:

forming one conductor in a semiconductor layer such that the one conductor penetrates the semiconductor layer;

laminating an insulation film such that the insulation film covers one end of the one conductor;

forming, from the insulation film side, a different conductor that includes a material different from a material constituting the one conductor and has a larger diameter than the one conductor such that the different conductor penetrates the semiconductor layer; and forming, from the insulation film side, a wire connected to the one conductor and a wire connected to the different conductor.

(16)

An electronic apparatus including:

an optical detection device; and an optical system that causes the optical detection device to form an image of image light coming from a subject, in which the optical detection device includes a first semiconductor layer that includes a photoelectric conversion region, and has one surface corresponding to a first surface and another surface corresponding to a second surface that is a light entrance surface, a first wiring layer overlapped with the first surface of the first semiconductor layer, a second wiring layer overlapped with a surface of the first wiring layer on a side opposite to the first semiconductor layer side surface, a second semiconductor layer that has one surface corresponding to a third surface and another surface corresponding to a fourth surface, the third surface being overlapped with a surface of the second wiring layer on a side opposite to the first wiring layer side surface, a third wiring layer overlapped with the fourth surface of the second semiconductor layer, a first conductor that has a first width, includes a first material, and penetrates the second semiconductor layer in a thickness direction, and a second conductor that has a second width smaller than the first width, includes a second material different from the first material, and penetrates the second semiconductor layer in the thickness direction.

(17)

The optical detection device according to (13), in which the second semiconductor layer has a first transistor including the second conductor as a gate electrode, and including, as a gate insulation film, an insulation film provided between a side surface of the second conductor and the second semiconductor layer.

(18)

The optical detection device according to (17), in which the second conductor is connected to only a conductor provided in the third wiring layer in a pair of a conductor provided in the second wiring layer and the conductor provided in the third wiring layer.

(19)

The optical detection device according to (17) or (18), in which at least one of a diffusion region constituting a source of the first transistor and a diffusion region constituting a drain of the first transistor is connected to only the conductor included in the third wiring layer in the pair of the conductor included in the second wiring layer and the conductor included in the third wiring layer.

(20)

The optical detection device according to (13), in which the third wiring layer has an insulation film and a third connection pad that is provided in the insulation film and has one surface corresponding to a bottom surface and another surface corresponding to a junction surface, an end of the second conductor on the fourth surface side is extended to the third connection pad, and connected to the third connection pad, the bottom surface of the third connection pad is a surface on the second semiconductor layer side, and a portion that is included in the insulation film and that is in contact with the bottom surface of the third connection pad includes a material having a higher etching rate for selected etchant than a material constituting a portion that is included in the insulation film and that is in contact with a side surface that is a surface connecting the bottom surface of the third connection pad and the junction surface.

(21)

The optical detection device according to (20), in which an end of the second conductor on the fourth surface side faces the junction surface of the third connection pad.

(22)

The optical detection device according to (20), in which an end of the second conductor on the fourth wiring layer side is located within the third connection pad.

(23)

The optical detection device according to any one of (20) through (22), including:

a third semiconductor layer; and a fourth wiring layer that has one surface overlapped with the third semiconductor layer and another surface overlapped with the other of the second wiring layer and the third wiring layer, in which the junction surface of the third connection pad is connected to a connection pad included in the wiring layer that is either the first wiring layer or the fourth wiring layer and is overlapped with the third wiring layer.

(24)

The optical detection device according to (13), in which the second wiring layer has an insulation film and wires provided in the insulation film, an end of the first conductor on the third surface side extends to one wire of the wires and is connected to the one wire, and the one wire has a laminated structure that has a first layer including a first conductive material and a second layer that includes a second conductive material not containing the first conductive material and is located between the first layer and the end of the first conductor on the third surface side.

(25)

The optical detection device according to (24), in which the second conductive material is tungsten, ruthenium, titanium, tantalum, tantalum nitride, aluminum, or silicon.

(26)

The optical detection device according to (24) or (25), in which the first conductive material is copper.

(27)

The optical detection device according to (13), in which a separation insulation film is provided between the second conductor and the second semiconductor layer, the third wiring layer has an insulation film and wires provided in the insulation film, the second conductor includes a material identical to a material of one wire of the wires included in the third wiring layer, and is provided integrally with the one wire, and the separation insulation film projects into the insulation film of the third wiring layer.

(28)

The optical detection device according to (27), in which a thickness of the separation insulation film is larger on the third surface side than on the fourth surface side.

(29)

The optical detection device according to (27) or (28), in which the separation insulation film has higher density than the insulation film included in the third wiring layer.

(30)

The optical detection device according to any one of (27) through (29), in which a high melting metal film is provided between the second conductor and the separation insulation film, the second conductor is connected to one wire included in the second wiring layer, and the high melting metal film is also provided between the second conductor and the one wire included in the second wiring layer.

(31)

The optical detection device according to (30), in which a thickness of a portion included in the high melting metal film and provided between the second conductor and the separation insulation film is larger on the fourth surface side than on the third surface side.

(32)

The optical detection device according to any one of (27) through (31), in which the second conductor including a third material and the second conductor including a fourth material different from the third material are provided.

(33)

The optical detection device according to (13), in which the second semiconductor layer is a part of a semiconductor layer included in an SOI substrate.

(34)

The optical detection device according to (33), in which a plurality of the second conductors are provided, and height positions of ends of a plurality of the second conductors on the fourth surface side are equalized in the thickness direction of the second semiconductor layer.

(35)

The optical detection device according to (33), including:

an insulation layer of the SOI substrate, in which the end of the second conductor on the fourth surface side penetrates the insulation layer.

(36)

The optical detection device according to (13), in which the third wiring layer has an insulation film, a protection insulation film laminated on the fourth surface side of the second semiconductor layer via the insulation film, and a conductor, and an end of the second conductor on the fourth surface side extends in a direction away from the fourth surface, and is connected to the conductor at a position not exceeding a lamination position of the protection insulation film.

(37)

The optical detection device according to (36), in which the protection insulation film includes a material ground at a lower speed for chemical mechanical polishing under a selected condition than a material constituting the insulation film.

(38)

The optical detection device according to (36) or (37), in which the protection insulation film includes a material ground at a lower speed for chemical mechanical polishing under a selected condition than a material constituting the second conductor.

(39)

The optical detection device according to any one of (36) through (38), in which the protection insulation film includes silicon nitride or silicon carbonitride.

(40)

The optical detection device according to any one of (36) through (39), in which the protection insulation film is not in contact with the second conductor.

(41)

The optical detection device according to (13), including:

a first fixed charge film so provided as to cover an outer circumferential surface of a fifth conductor that is the one second conductor; and a second fixed charge film so provided as to cover an outer circumferential surface of a sixth conductor that is the different one second conductor, in which the first fixed charge film and the second fixed charge film are one of a negative fixed charge film and a positive fixed charge film and the other of the negative fixed charge film and the positive fixed charge film, respectively.

(42)

The optical detection device according to (41), in which the second semiconductor layer includes a third region that is a first conductivity-type semiconductor region and is located on the fourth surface side, a fourth region that is a second conductivity-type semiconductor region and is located on the third surface side, a fifth region that is a first conductivity-type semiconductor region and is located on the third surface side, and a sixth region that is a second conductivity-type semiconductor region and located between the third region and the fifth region, the fifth conductor penetrates the third region and the fourth region, and the sixth conductor penetrates the third region, the sixth region, and the fifth region.

(43)

The optical detection device according to (41) or (42), in which the second semiconductor layer includes a seventh region that is a first conductivity-type semiconductor region and an eighth region that is a second conductivity-type semiconductor region, the seventh region is located in such a position as to cover an outer circumferential surface of the first fixed charge film, and the eighth region is located in such a position as to cover an outer circumferential surface of the second fixed charge film.

(44)

The optical detection device according to (42), in which the first fixed charge film is the negative fixed charge film in a case where the first conductivity type is a p type, and the first fixed charge film is the positive fixed charge film in a case where the first conductivity type is an n type.

(45)

The optical detection device according to (41), in which the first fixed charge film is the negative fixed charge film, the second fixed charge film is the positive fixed charge film, the second semiconductor layer is a semiconductor layer formed using a p-type semiconductor substrate, the second semiconductor layer includes a second transistor that is a p-channel conductivity-type field effect transistor and a third transistor that is an n-channel conductivity-type field effect transistor, the fifth conductor is electrically connected to any one of a gate electrode, a source region, and a drain region included in the second transistor, and the sixth conductor is electrically connected to any one of a gate electrode, a source region, and a drain region included in the third transistor.

(46)

The optical detection device according to (41), in which the first fixed charge film is the positive fixed charge film, the second fixed charge film is the negative fixed charge film, the second semiconductor layer is a semiconductor layer formed using an n-type semiconductor substrate, the second semiconductor layer includes a second transistor that is an n-channel conductivity-type field effect transistor and a third transistor that is a p-channel conductivity-type field effect transistor, the fifth conductor is electrically connected to any one of a gate electrode, a source region, and a drain region included in the second transistor, and the sixth conductor is electrically connected to any one of a gate electrode, a source region, and a drain region included in the third transistor.

(47)

The optical detection device according to (13), in which the one second conductor has a seventh conductor located near the third surface and an eighth conductor located near the fourth surface in the thickness direction of the second semiconductor layer, and a first end that is an end of the seventh conductor and that is located near the fourth surface is connected, within the second semiconductor layer, to a second end that is an end of the eighth conductor and that is located near the third surface.

(48)

The optical detection device according to (47), in which a diameter of the seventh conductor gradually decreases with nearness to the first end, and a diameter of the eighth conductor gradually decreases with nearness to the second end.

(49)

The optical detection device according to (47) or (48), in which a diameter of the second end is different from a diameter of the first end.

(50)

The optical detection device according to (49), in which the diameter of the second end is larger than the diameter of the first end.

(51)

The optical detection device according to any one of (47) through (50), in which a diameter of the eighth conductor at a position of the fourth surface in the thickness direction of the second semiconductor layer is larger than a diameter of the seventh conductor at a position of the third surface.

(52)

The optical detection device according to any one of (47) through (51), in which the second conductor and the second semiconductor layer are insulated from each other by an insulation film provided on an outer circumferential surface of the second conductor, and a thickness of a portion included in the insulation film and provided on an outer circumferential surface of a smaller end that is either the first end or the second end and has a smaller diameter is larger than a thickness of a portion provided in an area other than the smaller end and on an outer circumferential surface of the conductor that is either the seventh conductor or the eighth conductor and has the smaller end.

(53)

The optical detection device according to any one of (47) through (52), in which the seventh conductor and the eighth conductor have rectangular shapes that are elongated in different directions.

(54)

The optical detection device according to (16), in which the first conductor includes a first material, the second conductor includes a second material different from the first material, each of the first conductor and the second conductor projects into the third wiring layer from the fourth surface, and heights of projection of the first conductor and the second conductor into the third wiring layer are different from each other.

(55)

The optical detection device according to (54), in which the height of projection of the second conductor into the third wiring layer is larger than the height of projection of the first conductor into the third wiring layer.

(56)

The optical detection device according to (54), in which the height of projection of the first conductor into the third wiring layer is larger than the height of projection of the second conductor into the third wiring layer.

(57)

The optical detection device according to (56), in which an end included in the first conductor and projecting into the third wiring layer is electrically connected via a connection portion to a first wire included in the third wiring layer, and an end included in the second conductor and projecting into the third wiring layer is electrically and directly connected to a second wire included in the third wiring layer and belonging to a metal layer identical to a metal layer including the first wire.

(58)

The optical detection device according to (16), including:

an insulation member that penetrates the second semiconductor layer in the thickness direction, in which the optical detection device has a triple structure so formed as to surround a periphery of the second conductor by a part of the second semiconductor layer and further surround the part of the second semiconductor layer by the insulation member in a planar view.

(59)

The optical detection device according to (16), in which the second conductor has a first end that is an end on the fourth surface side, a second end that is included in the second conductor and that is an end on the third surface side, and an intermediate portion located between the first end and the second end, and the first end has a larger diameter than the intermediate portion.

(60)

The optical detection device according to (59), in which the diameter of the first end is larger than a diameter of a portion included in the intermediate portion and located on a boundary with the first end.

(61)

The optical detection device according to (16), in which each of the wiring layer that is the second wiring layer or the third wiring layer and is overlapped with the first wiring layer and the first wiring layer has a plurality of wires laminated via an insulation film, a plurality of vias extending in a lamination direction, and a plurality of reflection members, each of the vias achieves electric connection between the respective wires, or between the wires and one of the first semiconductor layer and the second semiconductor layer, and the reflection members are arranged at height positions identical to height positions of the vias in the lamination direction, and arranged in a matrix in a planar view in such a manner as to fill an area between the respective vias.

(62)

The optical detection device according to (61), in which each of the reflection members is in an electrically floating state.

(63)

The optical detection device according to (16), including:

a third semiconductor layer;

a fourth wiring layer that has one surface overlapped with the third semiconductor layer and another surface overlapped with the other of the second wiring layer and the third wiring layer; and a heat dissipation path that has one end connected to a surface of the second semiconductor layer on the third semiconductor layer side and another end connected to the third semiconductor layer 80.

(64)

The optical detection device according to (63), in which at least a part of the one end of the heat dissipation path is embedded in the second semiconductor layer, and at least a part of the other end of the heat dissipation path is embedded in the third semiconductor layer.

Moreover, the present technology may also have the following configurations.

(1)

An optical detection device including:

a first semiconductor layer that includes a photoelectric conversion region, and has one surface corresponding to a first surface and another surface corresponding to a second surface that is a light entrance surface;

a second semiconductor layer that has one surface corresponding to a third surface and another surface corresponding to a fourth surface;

a second wiring layer overlapped with the third surface of the second semiconductor layer;

a third wiring layer overlapped with the fourth surface of the second semiconductor layer;

a first wiring layer that has one surface overlapped with the first surface of the first semiconductor layer and another surface overlapped with one of the second wiring layer and the third wiring layer;

a first conductor that has a first width, includes a first material, and penetrates the second semiconductor layer in a thickness direction; and a second conductor that has a second width smaller than the first width, includes a second material different from the first material, and penetrates the second semiconductor layer in the thickness direction.

(2)

The optical detection device according to (1), in which one side end of the first conductor and one side end of the second conductor are respectively connected to different wires belonging to one metal layer.

(3)

The optical detection device according to (2), in which the one metal layer is a metal layer included in metal layers of the third wiring layer and located closest to the second semiconductor layer.

(4)

The optical detection device according to (2) or (3), including:

a barrier insulation film that is provided at a position overlapping with the wires in the thickness direction, and reduces diffusion of metal.

(5)

The optical detection device according to any one of (1) through (4), in which the second conductor is provided in a region that is included in the second semiconductor layer and that overlaps, in a planar view, with a pixel region where a plurality of the photoelectric conversion regions are arranged in a matrix.

(6)

The optical detection device according to (5), in which the first conductor is provided in a region that is included in the second semiconductor layer and that overlaps, in the planar view, with a peripheral region that is provided outside the pixel region and that surrounds the pixel region.

(7)

The optical detection device according to any one of (1) through (6), in which the first width corresponds to a size of a larger end of the first conductor in a penetration direction, and the second width corresponds to a size of a larger end of the second conductor in a penetration direction.

(8)

The optical detection device according to (7), in which both the end that is included in the first conductor and that has the first width and the end that is included in the second conductor and that has the second width are located in an identical wiring layer that is either the second wiring layer or the third wiring layer.

(9)

The optical detection device according to (7), in which one of the end that is included in the first conductor and that has the first width and the end that is included in the second conductor and that has the second width is located in the second wiring layer, and the other of the end that is included in the first conductor and that has the first width and the end that is included in the second conductor and that has the second width is located in the third wiring layer.

(10)

The optical detection device according to any one of (1) through (9), in which the first width ranges from 1 to 5 μm inclusive, and the second width ranges from 40 to 300 nm inclusive.

(11)

The optical detection device according to any one of (1) through (10), in which the first conductor contains copper, and the second conductor contains high melting metal.

(12)

The optical detection device according to any one of (1) through (11), including:

a third semiconductor layer; and a fourth wiring layer that has one surface overlapped with the third semiconductor layer and another surface overlapped with the other of the second wiring layer and the third wiring layer, in which the second semiconductor layer has a transistor constituting a readout circuit, and the third semiconductor layer has a transistor constituting a logic circuit.

(13)

An optical detection device including:

a first semiconductor layer that includes a photoelectric conversion region, and has one surface corresponding to a first surface and another surface corresponding to a second surface that is a light entrance surface;

a second semiconductor layer that has one surface corresponding to a third surface and another surface corresponding to a fourth surface;

a second wiring layer overlapped with the third surface of the second semiconductor layer;

a third wiring layer overlapped with the fourth surface of the second semiconductor layer;

a first wiring layer that has one surface overlapped with the first surface of the first semiconductor layer and another surface overlapped with one of the second wiring layer and the third wiring layer;

a first conductor that includes a first material, and penetrates the second semiconductor layer in a thickness direction; and a second conductor that includes a second material different from the first material, and penetrates the second semiconductor layer in the thickness direction.

(14)

A manufacturing method of an optical detection device, the manufacturing method including:

forming one conductor in a semiconductor layer such that the one conductor penetrates the semiconductor layer;

laminating an insulation film such that the insulation film covers one end of the one conductor;

forming, from the insulation film side, a different conductor that includes a material different from a material constituting the one conductor and has a larger diameter than the one conductor such that the different conductor penetrates the semiconductor layer; and forming, from the insulation film side, a wire connected to the one conductor and a wire connected to the different conductor.

(15)

An electronic apparatus including:

an optical detection device; and an optical system that causes the optical detection device to form an image of image light coming from a subject, in which the optical detection device includes a first semiconductor layer that includes a photoelectric conversion region, and has one surface corresponding to a first surface and another surface corresponding to a second surface that is a light entrance surface, a second semiconductor layer that has one surface corresponding to a third surface and another surface corresponding to a fourth surface, a second wiring layer overlapped with the third surface of the second semiconductor layer, a third wiring layer overlapped with the fourth surface of the second semiconductor layer, a first wiring layer that has one surface overlapped with the first surface of the first semiconductor layer and another surface overlapped with one of the second wiring layer and the third wiring layer, a first conductor that has a first width, includes a first material, and penetrates the second semiconductor layer in a thickness direction, and a second conductor that has a second width smaller than the first width, includes a second material different from the first material, and penetrates the second semiconductor layer in the thickness direction.

(16)

An optical detection device including:

a first semiconductor layer that includes a photoelectric conversion region, and has one surface corresponding to a first surface and another surface corresponding to a second surface that is a light entrance surface;

a second semiconductor layer that has one surface corresponding to a third surface and another surface corresponding to a fourth surface;

a second wiring layer overlapped with the third surface of the second semiconductor layer;

a third wiring layer overlapped with the fourth surface of the second semiconductor layer;

a first wiring layer that has one surface overlapped with the first surface of the first semiconductor layer and another surface overlapped with one of the second wiring layer and the third wiring layer;

a first conductor that has a first width, and penetrates the second semiconductor layer in a thickness direction; and a second conductor that has a second width smaller than the first width, and penetrates the second semiconductor layer in the thickness direction.

(17)

The optical detection device according to (16), in which the second semiconductor layer has a first transistor including the second conductor as a gate electrode, and including, as a gate insulation film, an insulation film provided between a side surface of the second conductor and the second semiconductor layer.

(18)

The optical detection device according to (17), in which the second conductor is connected to only a conductor provided in the third wiring layer in a pair of a conductor provided in the second wiring layer and the conductor provided in the third wiring layer.

(19)

The optical detection device according to (17) or (18), in which at least one of a diffusion region constituting a source of the first transistor and a diffusion region constituting a drain of the first transistor is connected to only the conductor included in the third wiring layer in the pair of the conductor included in the second wiring layer and the conductor included in the third wiring layer.

(20)

The optical detection device according to (16), in which the third wiring layer has an insulation film and a third connection pad that is provided in the insulation film and has one surface corresponding to a bottom surface and another surface corresponding to a junction surface, an end of the second conductor on the fourth surface side is extended to the third connection pad, and connected to the third connection pad, the bottom surface of the third connection pad is a surface on the second semiconductor layer side, and a portion that is included in the insulation film and that is in contact with the bottom surface of the third connection pad includes a material having a higher etching rate for selected etchant than a material constituting a portion that is included in the insulation film and that is in contact with a side surface that is a surface connecting the bottom surface of the third connection pad and the junction surface.

(21)

The optical detection device according to (20), in which an end of the second conductor on the fourth surface side faces the junction surface of the third connection pad.

(22)

The optical detection device according to (20), in which an end of the second conductor on the fourth wiring layer side is located within the third connection pad.

(23)

The optical detection device according to any one of (20) through (22), including:

a third semiconductor layer; and a fourth wiring layer that has one surface overlapped with the third semiconductor layer and another surface overlapped with the other of the second wiring layer and the third wiring layer, in which the junction surface of the third connection pad is connected to a connection pad included in the wiring layer that is either the first wiring layer or the fourth wiring layer and is overlapped with the third wiring layer.

The optical detection device according to (16), in which the second wiring layer has an insulation film and wires provided in the insulation film, an end of the first conductor on the third surface side extends to one wire of the wires and is connected to the one wire, and the one wire has a laminated structure that has a first layer including a first conductive material and a second layer that includes a second conductive material not containing the first conductive material and is located between the first layer and the end of the first conductor on the third surface side.

(25)

The optical detection device according to (24), in which the second conductive material is tungsten, ruthenium, titanium, tantalum, tantalum nitride, aluminum, or silicon.

(26)

The optical detection device according to (24) or (25), in which the first conductive material is copper.

(27)

The optical detection device according to (16), in which a separation insulation film is provided between the second conductor and the second semiconductor layer, the third wiring layer has an insulation film and wires provided in the insulation film, the second conductor includes a material identical to a material of one wire of the wires included in the third wiring layer, and is provided integrally with the one wire, and the separation insulation film projects into the insulation film of the third wiring layer.

(28)

The optical detection device according to (27), in which a thickness of the separation insulation film is larger on the third surface side than on the fourth surface side.

(29)

The optical detection device according to (27) or (28), in which the separation insulation film has higher density than the insulation film included in the third wiring layer.

(30)

The optical detection device according to any one of (27) through (29), in which a high melting metal film is provided between the second conductor and the separation insulation film, the second conductor is connected to one wire included in the second wiring layer, and the high melting metal film is also provided between the second conductor and the one wire included in the second wiring layer.

(31)

The optical detection device according to (30), in which a thickness of a portion included in the high melting metal film and provided between the second conductor and the separation insulation film is larger on the fourth surface side than on the third surface side.

(32)

The optical detection device according to any one of (27) through (31), in which the second conductor including a third material and the second conductor including a fourth material different from the third material are provided.

(33)

The optical detection device according to (16), in which the second semiconductor layer is a part of a semiconductor layer included in an SOI substrate.

(34)

The optical detection device according to (33), in which a plurality of the second conductors are provided, and height positions of ends of a plurality of the second conductors on the fourth surface side are equalized in the thickness direction of the second semiconductor layer.

(35)

The optical detection device according to (33), including:

an insulation layer of the SOI substrate, in which the end of the second conductor on the fourth surface side penetrates the insulation layer.

(36)

The optical detection device according to (16), in which the third wiring layer has an insulation film, a protection insulation film laminated on the fourth surface side of the second semiconductor layer via the insulation film, and a conductor, and an end of the second conductor on the fourth surface side extends in a direction away from the fourth surface, and is connected to the conductor at a position not exceeding a lamination position of the protection insulation film.

(37)

The optical detection device according to (36), in which the protection insulation film includes a material ground at a lower speed for chemical mechanical polishing under a selected condition than a material constituting the insulation film.

(38)

The optical detection device according to (36) or (37), in which the protection insulation film includes a material ground at a lower speed for chemical mechanical polishing under a selected condition than a material constituting the second conductor.

(39)

The optical detection device according to any one of (36) through (38), in which the protection insulation film includes silicon nitride or silicon carbonitride.

(40)

The optical detection device according to any one of (36) through (39), in which the protection insulation film is not in contact with the second conductor.

(41)

The optical detection device according to (16), including:

a first fixed charge film so provided as to cover an outer circumferential surface of a fifth conductor that is the one second conductor; and a second fixed charge film so provided as to cover an outer circumferential surface of a sixth conductor that is the different one second conductor, in which the first fixed charge film and the second fixed charge film are one of a negative fixed charge film and a positive fixed charge film and the other of the negative fixed charge film and the positive fixed charge film, respectively.

(42)

The optical detection device according to (41), in which the second semiconductor layer includes a third region that is a first conductivity-type semiconductor region and is located on the fourth surface side, a fourth region that is a second conductivity-type semiconductor region and is located on the third surface side, a fifth region that is a first conductivity-type semiconductor region and is located on the third surface side, and a sixth region that is a second conductivity-type semiconductor region and located between the third region and the fifth region, the fifth conductor penetrates the third region and the fourth region, and the sixth conductor penetrates the third region, the sixth region, and the fifth region.

(43)

The optical detection device according to (41) or (42), in which the second semiconductor layer includes a seventh region that is a first conductivity-type semiconductor region and an eighth region that is a second conductivity-type semiconductor region, the seventh region is located in such a position as to cover an outer circumferential surface of the first fixed charge film, and the eighth region is located in such a position as to cover an outer circumferential surface of the second fixed charge film.

(44)

The optical detection device according to (42), in which the first fixed charge film is the negative fixed charge film in a case where the first conductivity type is a p type, and the first fixed charge film is the positive fixed charge film in a case where the first conductivity type is an n type.

(45)

The optical detection device according to (41), in which the first fixed charge film is the negative fixed charge film, the second fixed charge film is the positive fixed charge film, the second semiconductor layer is a semiconductor layer formed using a p-type semiconductor substrate, the second semiconductor layer includes a second transistor that is a p-channel conductivity-type field effect transistor and a third transistor that is an n-channel conductivity-type field effect transistor, the fifth conductor is electrically connected to any one of a gate electrode, a source region, and a drain region included in the second transistor, and the sixth conductor is electrically connected to any one of a gate electrode, a source region, and a drain region included in the third transistor.

(46)

The optical detection device according to (41), in which the first fixed charge film is the positive fixed charge film, the second fixed charge film is the negative fixed charge film, the second semiconductor layer is a semiconductor layer formed using an n-type semiconductor substrate, the second semiconductor layer includes a second transistor that is an n-channel conductivity-type field effect transistor and a third transistor that is a p-channel conductivity-type field effect transistor, the fifth conductor is electrically connected to any one of a gate electrode, a source region, and a drain region included in the second transistor, and the sixth conductor is electrically connected to any one of a gate electrode, a source region, and a drain region included in the third transistor.

(47)

The optical detection device according to (16), in which the one second conductor has a seventh conductor located near the third surface and an eighth conductor located near the fourth surface in the thickness direction of the second semiconductor layer, and a first end that is an end of the seventh conductor and that is located near the fourth surface is connected, within the second semiconductor layer, to a second end that is an end of the eighth conductor and that is located near the third surface.

(48)

The optical detection device according to (47), in which a diameter of the seventh conductor gradually decreases with nearness to the first end, and a diameter of the eighth conductor gradually decreases with nearness to the second end.

(49)

The optical detection device according to (47) or (48), in which a diameter of the second end is different from a diameter of the first end.

(50)

The optical detection device according to (49), in which the diameter of the second end is larger than the diameter of the first end.

(51)

The optical detection device according to any one of (47) through (50), in which a diameter of the eighth conductor at a position of the fourth surface in the thickness direction of the second semiconductor layer is larger than a diameter of the seventh conductor at a position of the third surface.

(52)

The optical detection device according to any one of (47) through (51), in which the second conductor and the second semiconductor layer are insulated from each other by an insulation film provided on an outer circumferential surface of the second conductor, and a thickness of a portion included in the insulation film and provided on an outer circumferential surface of a smaller end that is either the first end or the second end and has a smaller diameter is larger than a thickness of a portion provided in an area other than the smaller end and on an outer circumferential surface of the conductor that is either the seventh conductor or the eighth conductor and has the smaller end.

(53)

The optical detection device according to any one of (47) through (52), in which the seventh conductor and the eighth conductor have rectangular shapes that are elongated in different directions.

(54)

The optical detection device according to (16), in which the first conductor includes a first material, the second conductor includes a second material different from the first material, each of the first conductor and the second conductor projects into the third wiring layer from the fourth surface, and heights of projection of the first conductor and the second conductor into the third wiring layer are different from each other.

(55)

The optical detection device according to (54), in which the height of projection of the second conductor into the third wiring layer is larger than the height of projection of the first conductor into the third wiring layer.

(56)

The optical detection device according to (54), in which the height of projection of the first conductor into the third wiring layer is larger than the height of projection of the second conductor into the third wiring layer.

(57)

The optical detection device according to (56), in which an end included in the first conductor and projecting into the third wiring layer is electrically connected via a connection portion to a first wire included in the third wiring layer, and an end included in the second conductor and projecting into the third wiring layer is electrically and directly connected to a second wire included in the third wiring layer and belonging to a metal layer identical to a metal layer including the first wire.

(58)

The optical detection device according to (16), including:

an insulation member that penetrates the second semiconductor layer in the thickness direction, in which the optical detection device has a triple structure so formed as to surround a periphery of the second conductor by a part of the second semiconductor layer and further surround the part of the second semiconductor layer by the insulation member in a planar view.

(59)

The optical detection device according to (16), in which the second conductor has a first end that is an end on the fourth surface side, a second end that is included in the second conductor and that is an end on the third surface side, and an intermediate portion located between the first end and the second end, and the first end has a larger diameter than the intermediate portion.

(60)

The optical detection device according to (59), in which the diameter of the first end is larger than a diameter of a portion included in the intermediate portion and located on a boundary with the first end.

(61)

The optical detection device according to (16), in which each of the wiring layer that is the second wiring layer or the third wiring layer and is overlapped with the first wiring layer and the first wiring layer has a plurality of wires laminated via an insulation film, a plurality of vias extending in a lamination direction, and a plurality of reflection members, each of the vias achieves electric connection between the respective wires, or between the wires and one of the first semiconductor layer and the second semiconductor layer, and the reflection members are arranged at height positions identical to height positions of the vias in the lamination direction, and arranged in a matrix in a planar view in such a manner as to fill an area between the respective vias.

(62)

The optical detection device according to (61), in which each of the reflection members is in an electrically floating state.

(63)

The optical detection device according to (16), including:

a third semiconductor layer;

a fourth wiring layer that has one surface overlapped with the third semiconductor layer and another surface overlapped with the other of the second wiring layer and the third wiring layer; and a heat dissipation path that has one end connected to a surface of the second semiconductor layer on the third semiconductor layer side and another end connected to the third semiconductor layer 80.

(64)

The optical detection device according to (63), in which at least a part of the one end of the heat dissipation path is embedded in the second semiconductor layer, and at least a part of the other end of the heat dissipation path is embedded in the third semiconductor layer.

The scope of the present technology is not limited to the exemplary embodiments depicted and described, and also include all embodiments offering advantageous effects identical to objects to be achieved by the present technology. In addition, the scope of the present technology is not limited to combinations of features of the invention defined by the claims, and may be defined by any desired combinations of specific features included in all of the disclosed features.

REFERENCE SIGNS LIST

1: Optical detection device
1A: Semiconductor device
2: Semiconductor chip
2A: Pixel region 2B: Peripheral region
3: Pixel
4: Vertical driving circuit
5: Column signal processing circuit
6: Horizontal driving circuit
7: Output circuit
8: Control circuit
10: Pixel drive line
11: Vertical signal line
12: Horizontal signal line
13: Logic circuit
14: Bonding pad
15: Readout circuit
20: First semiconductor layer
20*a*: Photoelectric conversion region
30: First wiring layer
32: Wire
33: First connection pad
40: Second wiring layer
41, 41*m*: Insulation film
42, 42A: Wire
42A1: First layer
42A2: Second layer
42*h*, 42*h*1, 42*h*2: Hole
43: Second connection pad
45: Insulation film
46, 46*c*: Etching stop layer
46*a*: Third layer
46*b*: Fourth layer
50: Second semiconductor layer
50*a*: First region
50*b*: Second region
51: First conductor
51*a*, 51*b*: End
52, 52L, 52B, 52C: Second conductor
52*a*, 52*b*, 52La, 52Lb: End
55: Barrier metal layer
56: Sacrificial layer
57: Third conductor
58: Fourth conductor
58*a*: End
58*h*: Hole
60: Third wiring layer
61, 61*a*, 61*b*: Insulation film
61*d*: First insulation film
61*h*: Hole
62, 62*a*, 62*b*, 62B: Wire
63, 63A: Third connection pad
64: Barrier insulation film
65: Silicon cover film (fixed charge film)
68: Protection insulation film
70: Fourth wiring layer
72: Wire
73: Fourth connection pad
80: Third semiconductor layer
90: Light collection layer
91: Color filter
92: On-chip lens
100: Electronic apparatus
101: Solid-state imaging device
102: Optical system (optical lens)
103: Shutter device
104: Driving circuit
105: Signal processing circuit
AL: Alignment mark
D: Drain
G: Gate electrode
KOZ: Keep-out zone
K1, K2: Region
MK: Mark
S: Source
T2, T2-1, T2-2: Transistor
47A: First fixed charge film
47B: Second fixed charge film
52-1: Fifth conductor
52-2: Sixth conductor
52-3: Second conductor
52D: Second conductor
52D1: Seventh conductor
52D2: Eighth conductor
59A: Third region
59B: Seventh region
59C: Eighth region
61*m*7: Insulation film
D1*a*: First end
D1*ad*: Diameter
D1S3: Diameter
D2*a*: Second end
D2*ad*: Diameter
D2S4: Diameter
DL: Depletion layer
iso: Insulation film
w1: Fourth region
w2: Fifth region
w3: Sixth region
51E: First conductor
52E: Second conductor
69: Connection portion
61A: Insulation member
52Fa, 52Fb: End
52Fc: Intermediate portion
32D: Dummy wire
34D, 44D: Dummy via
PHa: Heat collection portion
PHb: Heat dissipation portion
PHc: Intermediate portion
PHa1, PHb1: Embedded portion
PHa2, PHb2: Connection member

What is claimed is:

1. An optical detection device, comprising:

a first semiconductor layer that includes a photoelectric conversion region, and has one surface corresponding to a first surface and another surface corresponding to a second surface that is a light entrance surface;

a second semiconductor layer that has one surface corresponding to a third surface and another surface corresponding to a fourth surface;

a second wiring layer overlapped with the third surface of the second semiconductor layer;

a third wiring layer overlapped with the fourth surface of the second semiconductor layer;

a first wiring layer that has one surface overlapped with the first surface of the first semiconductor layer and another surface overlapped with one of the second wiring layer and the third wiring layer;

a first conductor that has a first width, includes a first material, and penetrates the second semiconductor layer in a thickness direction;

a second conductor that has a second width smaller than the first width, includes a second material different from the first material, and penetrates the second semiconductor layer in the thickness direction, wherein one side end of the first conductor and one side end of the second conductor are respectively connected to different wires belonging to one metal layer; and a barrier insulation film that is provided at a position overlapping with the wires in the thickness direction, wherein the barrier insulation film is disposed between a silicon cover film and an insulation film of the third wiring layer.

2. The optical detection device according to claim 1, wherein the one metal layer is a metal layer included in metal layers of the third wiring layer and located closest to the second semiconductor layer.

3. The optical detection device according to claim 1, wherein the second conductor is provided in a region that is included in the second semiconductor layer and that overlaps, in a planar view, with a pixel region where a plurality of the photoelectric conversion regions are arranged in a matrix.

4. The optical detection device according to claim 3, wherein the first conductor is provided in a region that is included in the second semiconductor layer and that overlaps, in the planar view, with a peripheral region that is provided outside the pixel region and that surrounds the pixel region.

5. The optical detection device according to claim 1, wherein the first width corresponds to a size of a larger end of the first conductor in a penetration direction, and the second width corresponds to a size of a larger end of the second conductor in a penetration direction.

6. The optical detection device according to claim 5, wherein both the end that is included in the first conductor and that has the first width and the end that is included in the second conductor and that has the second width are located in an identical wiring layer that is either the second wiring layer or the third wiring layer.

7. The optical detection device according to claim 5, wherein one of the end that is included in the first conductor and that has the first width and the end that is included in the second conductor and that has the second width is located in the second wiring layer, and the other of the end that is included in the first conductor and that has the first width and the end that is included in the second conductor and that has the second width is located in the third wiring layer.

8. The optical detection device according to claim 1, wherein the first width ranges from 1 to 5 μm inclusive, and the second width ranges from 40 to 300 nm inclusive.

9. The optical detection device according to claim 1, wherein the first conductor contains copper, and the second conductor contains high melting metal.

10. The optical detection device according to claim 1, comprising:

a third semiconductor layer; and a fourth wiring layer that has one surface overlapped with the third semiconductor layer and another surface overlapped with the other of the second wiring layer and the third wiring layer, wherein the second semiconductor layer has a transistor constituting a readout circuit, and the third semiconductor layer has a transistor constituting a logic circuit.

11. A manufacturing method of an optical detection device, the manufacturing method comprising:

forming one conductor in a semiconductor layer such that the one conductor penetrates the semiconductor layer;

laminating an insulation film such that the insulation film covers one end of the one conductor;

forming, from the insulation film side, a different conductor that includes a material different from a material constituting the one conductor and has a larger diameter than the one conductor such that the different conductor penetrates the semiconductor layer; and forming, from the insulation film side, a wire connected to the one conductor and a wire connected to the different conductor.

12. An optical detection device, comprising:

a first semiconductor layer that includes a photoelectric conversion region, and has one surface corresponding to a first surface and another surface corresponding to a second surface that is a light entrance surface;

a second semiconductor layer that has one surface corresponding to a third surface and another surface corresponding to a fourth surface;

a second wiring layer overlapped with the third surface of the second semiconductor layer;

a third wiring layer overlapped with the fourth surface of the second semiconductor layer;

a first wiring layer that has one surface overlapped with the first surface of the first semiconductor layer and another surface overlapped with one of the second wiring layer and the third wiring layer;

a first conductor that has a first width, and penetrates the second semiconductor layer in a thickness direction; and a second conductor that has a second width smaller than the first width, and penetrates the second semiconductor layer in the thickness direction, wherein the second semiconductor layer has a first transistor including the second conductor as a gate electrode, and including, as a gate insulation film, an insulation film provided between a side surface of the second conductor and the second semiconductor layer.

13. The optical detection device according to claim 12, wherein the second conductor is connected to only a conductor provided in the third wiring layer in a pair of a conductor provided in the second wiring layer and the conductor provided in the third wiring layer.

14. The optical detection device according to claim 13, wherein at least one of a diffusion region constituting a source of the first transistor and a diffusion region constituting a drain of the first transistor is connected to only the conductor included in the third wiring layer in the pair of the conductor included in the second wiring layer and the conductor included in the third wiring layer.

15. The optical detection device according to claim 12, wherein the second wiring layer has an insulation film and wires provided in the insulation film, an end of the first conductor on the third surface side extends to one wire of the wires and is connected to the one wire, and the one wire has a laminated structure that has a first layer including a first conductive material and a second layer that includes a second conductive material not containing the first conductive material and is located between the first layer and the end of the first conductor on the third surface side.

16. The optical detection device according to claim 15, wherein the second conductive material is tungsten, ruthenium, titanium, tantalum, tantalum nitride, aluminum, or silicon.

17. The optical detection device according to claim 16, wherein the first conductive material is copper.

18. The optical detection device according to claim 12, wherein the second semiconductor layer is a part of a semiconductor layer included in an SOI substrate.

19. An optical detection device, comprising:

a first semiconductor layer that includes a photoelectric conversion region, and has one surface corresponding to a first surface and another surface corresponding to a second surface that is a light entrance surface;

a second semiconductor layer that has one surface corresponding to a third surface and another surface corresponding to a fourth surface;

a second wiring layer overlapped with the third surface of the second semiconductor layer;

a third wiring layer overlapped with the fourth surface of the second semiconductor layer;

a first wiring layer that has one surface overlapped with the first surface of the first semiconductor layer and another surface overlapped with one of the second wiring layer and the third wiring layer;

a first conductor that has a first width, and penetrates the second semiconductor layer in a thickness direction; and a second conductor that has a second width smaller than the first width, and penetrates the second semiconductor layer in the thickness direction, wherein the third wiring layer has an insulation film and a third connection pad that is provided in the insulation film and has one surface corresponding to a bottom surface and another surface corresponding to a junction surface, an end of the second conductor on the fourth surface side is extended to the third connection pad, and connected to the third connection pad, the bottom surface of the third connection pad is a surface on the second semiconductor layer side, and a portion that is included in the insulation film and that is in contact with the bottom surface of the third connection pad includes a material having a higher etching rate for selected etchant than a material constituting a portion that is included in the insulation film and that is in contact with a side surface that is a surface connecting the bottom surface of the third connection pad and the junction surface.

20. The optical detection device according to claim 19, wherein an end of the second conductor on the fourth surface side faces the junction surface of the third connection pad.

21. The optical detection device according to claim 19, wherein an end of the second conductor on the fourth wiring layer side is located within the third connection pad.

22. The optical detection device according to claim 19, comprising:

a third semiconductor layer; and a fourth wiring layer that has one surface overlapped with the third semiconductor layer and another surface overlapped with the other of the second wiring layer and the third wiring layer, wherein the junction surface of the third connection pad is connected to a connection pad included in the wiring layer that is either the first wiring layer or the fourth wiring layer and is overlapped with the third wiring layer.

23. An optical detection device, comprising:

a first semiconductor layer that includes a photoelectric conversion region, and has one surface corresponding to a first surface and another surface corresponding to a second surface that is a light entrance surface;

a second semiconductor layer that has one surface corresponding to a third surface and another surface corresponding to a fourth surface;

a second wiring layer overlapped with the third surface of the second semiconductor layer;

a third wiring layer overlapped with the fourth surface of the second semiconductor layer;

a first wiring layer that has one surface overlapped with the first surface of the first semiconductor layer and another surface overlapped with one of the second wiring layer and the third wiring layer;

a first conductor that has a first width, and penetrates the second semiconductor layer in a thickness direction; and a second conductor that has a second width smaller than the first width, and penetrates the second semiconductor layer in the thickness direction, wherein a separation insulation film is provided between the second conductor and the second semiconductor layer, the third wiring layer has an insulation film and wires provided in the insulation film, the second conductor includes a material identical to a material of one wire of the wires included in the third wiring layer, and is provided integrally with the one wire, and the separation insulation film projects into the insulation film of the third wiring layer.

24. The optical detection device according to claim 23, wherein a thickness of the separation insulation film is larger on the third surface side than on the fourth surface side.

25. The optical detection device according to claim 23, wherein the separation insulation film has higher density than the insulation film included in the third wiring layer.

26. The optical detection device according to claim 23, wherein a high melting metal film is provided between the second conductor and the separation insulation film, the second conductor is connected to one wire included in the second wiring layer, and the high melting metal film is also provided between the second conductor and the one wire included in the second wiring layer.

27. The optical detection device according to claim 26, wherein a thickness of a portion included in the high melting metal film and provided between the second conductor and the separation insulation film is larger on the fourth surface side than on the third surface side.

28. The optical detection device according to claim 23, wherein the second conductor including a third material and the second conductor including a fourth material different from the third material are provided.

29. An optical detection device, comprising:

a first semiconductor layer that includes a photoelectric conversion region, and has one surface corresponding to a first surface and another surface corresponding to a second surface that is a light entrance surface;

a second semiconductor layer that has one surface corresponding to a third surface and another surface corresponding to a fourth surface, wherein the second semiconductor layer is a part of a semiconductor layer included in an SOI substrate;

a second wiring layer overlapped with the third surface of the second semiconductor layer;

a third wiring layer overlapped with the fourth surface of the second semiconductor layer;

a first wiring layer that has one surface overlapped with the first surface of the first semiconductor layer and another surface overlapped with one of the second wiring layer and the third wiring layer;

a first conductor that has a first width, and penetrates the second semiconductor layer in a thickness direction; and a second conductor that has a second width smaller than the first width, and penetrates the second semiconductor layer in the thickness direction, wherein a plurality of the second conductors are provided, and height positions of ends of a plurality of the second conductors on the fourth surface side are equalized in the thickness direction of the second semiconductor layer.

30. An optical detection device, comprising:

a first semiconductor layer that includes a photoelectric conversion region, and has one surface corresponding to a first surface and another surface corresponding to a second surface that is a light entrance surface;

a second semiconductor layer that has one surface corresponding to a third surface and another surface corresponding to a fourth surface, wherein the second semiconductor layer is a part of a semiconductor layer included in an SOI substrate;

a second wiring layer overlapped with the third surface of the second semiconductor layer;

a third wiring layer overlapped with the fourth surface of the second semiconductor layer;

a first wiring layer that has one surface overlapped with the first surface of the first semiconductor layer and another surface overlapped with one of the second wiring layer and the third wiring layer;

a first conductor that has a first width, and penetrates the second semiconductor layer in a thickness direction; and a second conductor that has a second width smaller than the first width, and penetrates the second semiconductor layer in the thickness direction; and an insulation layer of the SOI substrate, wherein the end of the second conductor on the fourth surface side penetrates the insulation layer.

31. An optical detection device, comprising:

a first semiconductor layer that includes a photoelectric conversion region, and has one surface corresponding to a first surface and another surface corresponding to a second surface that is a light entrance surface;

a second semiconductor layer that has one surface corresponding to a third surface and another surface corresponding to a fourth surface;

a second wiring layer overlapped with the third surface of the second semiconductor layer;

a third wiring layer overlapped with the fourth surface of the second semiconductor layer;

a first wiring layer that has one surface overlapped with the first surface of the first semiconductor layer and another surface overlapped with one of the second wiring layer and the third wiring layer;

a first conductor that has a first width, and penetrates the second semiconductor layer in a thickness direction; and a second conductor that has a second width smaller than the first width, and penetrates the second semiconductor layer in the thickness direction, wherein the third wiring layer has an insulation film, a protection insulation film laminated on the fourth surface side of the second semiconductor layer via the insulation film, and a conductor, and an end of the second conductor on the fourth surface side extends in a direction away from the fourth surface, and is connected to the conductor at a position not exceeding a lamination position of the protection insulation film.

32. The optical detection device according to claim 31, wherein the protection insulation film includes a material ground at a lower speed for chemical mechanical polishing under a selected condition than a material constituting the insulation film.

33. The optical detection device according to claim 31, wherein the protection insulation film includes a material ground at a lower speed for chemical mechanical polishing under a selected condition than a material constituting the second conductor.

34. The optical detection device according to claim 31, wherein the protection insulation film includes silicon nitride or silicon carbonitride.

35. The optical detection device according to claim 31, wherein the protection insulation film is not in contact with the second conductor.

36. An optical detection device, comprising:

a first semiconductor layer that includes a photoelectric conversion region, and has one surface corresponding to a first surface and another surface corresponding to a second surface that is a light entrance surface;

a second semiconductor layer that has one surface corresponding to a third surface and another surface corresponding to a fourth surface;

a second wiring layer overlapped with the third surface of the second semiconductor layer;

a third wiring layer overlapped with the fourth surface of the second semiconductor layer;

a first wiring layer that has one surface overlapped with the first surface of the first semiconductor layer and another surface overlapped with one of the second wiring layer and the third wiring layer;

a first conductor that has a first width, and penetrates the second semiconductor layer in a thickness direction;

a second conductor that has a second width smaller than the first width, and penetrates the second semiconductor layer in the thickness direction;

a first fixed charge film so provided as to cover an outer circumferential surface of a fifth conductor that is the one second conductor; and a second fixed charge film so provided as to cover an outer circumferential surface of a sixth conductor that is different from the one second conductor, wherein the first fixed charge film and the second fixed charge film are one of a negative fixed charge film and a positive fixed charge film and the other of the negative fixed charge film and the positive fixed charge film, respectively.

37. The optical detection device according to claim 36, wherein the second semiconductor layer includes a third region that is a first conductivity-type semiconductor region and is located on the fourth surface side, a fourth region that is a second conductivity-type semiconductor region and is located on the third surface side, a fifth region that is a first conductivity-type semiconductor region and is located on the third surface side, and a sixth region that is a second conductivity-type semiconductor region and located between the third region and the fifth region, the fifth conductor penetrates the third region and the fourth region, and the sixth conductor penetrates the third region, the sixth region, and the fifth region.

38. The optical detection device according to claim 36, wherein the second semiconductor layer includes a seventh region that is a first conductivity-type semiconductor region and an eighth region that is a second conductivity-type semiconductor region, the seventh region is located in such a position as to cover an outer circumferential surface of the first fixed charge film, and the eighth region is located in such a position as to cover an outer circumferential surface of the second fixed charge film.

39. The optical detection device according to claim 37, wherein the first fixed charge film is the negative fixed charge film in a case where the first conductivity-type is a p type, and the first fixed charge film is the positive fixed charge film in a case where the first conductivity-type is an n type.

40. The optical detection device according to claim 36, wherein the first fixed charge film is the negative fixed charge film, the second fixed charge film is the positive fixed charge film, the second semiconductor layer is a semiconductor layer formed using a p-type semiconductor substrate, the second semiconductor layer includes a second transistor that is a p-channel conductivity-type field effect transistor and a third transistor that is an n-channel conductivity-type field effect transistor, the fifth conductor is electrically connected to any one of a gate electrode, a source region, and a drain region included in the second transistor, and the sixth conductor is electrically connected to any one of a gate electrode, a source region, and a drain region included in the third transistor.

41. The optical detection device according to claim 36, wherein the first fixed charge film is the positive fixed charge film, the second fixed charge film is the negative fixed charge film, the second semiconductor layer is a semiconductor layer formed using an n-type semiconductor substrate, the second semiconductor layer includes a second transistor that is an n-channel conductivity-type field effect transistor and a third transistor that is a p-channel conductivity-type field effect transistor, the fifth conductor is electrically connected to any one of a gate electrode, a source region, and a drain region included in the second transistor, and the sixth conductor is electrically connected to any one of a gate electrode, a source region, and a drain region included in the third transistor.

42. An optical detection device, comprising:

a first semiconductor layer that includes a photoelectric conversion region, and has one surface corresponding to a first surface and another surface corresponding to a second surface that is a light entrance surface;

a second semiconductor layer that has one surface corresponding to a third surface and another surface corresponding to a fourth surface;

a second wiring layer overlapped with the third surface of the second semiconductor layer;

a third wiring layer overlapped with the fourth surface of the second semiconductor layer;

a first wiring layer that has one surface overlapped with the first surface of the first semiconductor layer and another surface overlapped with one of the second wiring layer and the third wiring layer;

a first conductor that has a first width, and penetrates the second semiconductor layer in a thickness direction; and a second conductor that has a second width smaller than the first width, and penetrates the second semiconductor layer in the thickness direction, wherein the one second conductor has a seventh conductor located near the third surface and an eighth conductor located near the fourth surface in the thickness direction of the second semiconductor layer, and a first end that is an end of the seventh conductor and that is located near the fourth surface is connected, within the second semiconductor layer, to a second end that is an end of the eighth conductor and that is located near the third surface.

43. The optical detection device according to claim 42, wherein a diameter of the seventh conductor gradually decreases with nearness to the first end, and a diameter of the eighth conductor gradually decreases with nearness to the second end.

44. The optical detection device according to claim 42, wherein a diameter of the second end is different from a diameter of the first end.

45. The optical detection device according to claim 44, wherein the diameter of the second end is larger than the diameter of the first end.

46. The optical detection device according to claim 42, wherein a diameter of the eighth conductor at a position of the fourth surface in the thickness direction of the second semiconductor layer is larger than a diameter of the seventh conductor at a position of the third surface.

47. The optical detection device according to claim 44, wherein the second conductor and the second semiconductor layer are insulated from each other by an insulation film provided on an outer circumferential surface of the second conductor, and a thickness of a portion included in the insulation film and provided on an outer circumferential surface of a smaller end that is either the first end or the second end and has a smaller diameter is larger than a thickness of a portion provided in an area other than the smaller end and on an outer circumferential surface of the conductor that is either the seventh conductor or the eighth conductor and has the smaller end.

48. The optical detection device according to claim 42, wherein the seventh conductor and the eighth conductor have rectangular shapes that are elongated in different directions.

49. An optical detection device, comprising:

a first semiconductor layer that includes a photoelectric conversion region, and has one surface corresponding to a first surface and another surface corresponding to a second surface that is a light entrance surface;

a second semiconductor layer that has one surface corresponding to a third surface and another surface corresponding to a fourth surface;

a second wiring layer overlapped with the third surface of the second semiconductor layer;

a third wiring layer overlapped with the fourth surface of the second semiconductor layer;

a first wiring layer that has one surface overlapped with the first surface of the first semiconductor layer and another surface overlapped with one of the second wiring layer and the third wiring layer;

a first conductor that has a first width, and penetrates the second semiconductor layer in a thickness direction;

a second conductor that has a second width smaller than the first width, and penetrates the second semiconductor layer in the thickness direction, wherein the first conductor includes a first material, the second conductor includes a second material different from the first material, each of the first conductor and the second conductor projects into the third wiring layer from the fourth surface, and heights of projection of the first conductor and the second conductor into the third wiring layer are different from each other.

50. The optical detection device according to claim 49, wherein the height of projection of the second conductor into the third wiring layer is larger than the height of projection of the first conductor into the third wiring layer.

51. The optical detection device according to claim 49, wherein the height of projection of the first conductor into the third wiring layer is larger than the height of projection of the second conductor into the third wiring layer.

52. The optical detection device according to claim 51, wherein an end included in the first conductor and projecting into the third wiring layer is electrically connected via a connection portion to a first wire included in the third wiring layer, and an end included in the second conductor and projecting into the third wiring layer is electrically and directly connected to a second wire included in the third wiring layer and belonging to a metal layer identical to a metal layer including the first wire.

53. An optical detection device, comprising:

a first semiconductor layer that includes a photoelectric conversion region, and has one surface corresponding to a first surface and another surface corresponding to a second surface that is a light entrance surface;

a second semiconductor layer that has one surface corresponding to a third surface and another surface corresponding to a fourth surface;

a second wiring layer overlapped with the third surface of the second semiconductor layer;

a third wiring layer overlapped with the fourth surface of the second semiconductor layer;

a first wiring layer that has one surface overlapped with the first surface of the first semiconductor layer and another surface overlapped with one of the second wiring layer and the third wiring layer;

a first conductor that has a first width, and penetrates the second semiconductor layer in a thickness direction;

a second conductor that has a second width smaller than the first width, and penetrates the second semiconductor layer in the thickness direction; and an insulation member that penetrates the second semiconductor layer in the thickness direction, wherein the optical detection device has a triple structure so formed as to surround a periphery of the second conductor by a part of the second semiconductor layer and further surround the part of the second semiconductor layer by the insulation member in a planar view.

54. An optical detection device, comprising:

a first semiconductor layer that includes a photoelectric conversion region, and has one surface corresponding to a first surface and another surface corresponding to a second surface that is a light entrance surface;

a second semiconductor layer that has one surface corresponding to a third surface and another surface corresponding to a fourth surface;

a second wiring layer overlapped with the third surface of the second semiconductor layer;

a third wiring layer overlapped with the fourth surface of the second semiconductor layer;

a first wiring layer that has one surface overlapped with the first surface of the first semiconductor layer and another surface overlapped with one of the second wiring layer and the third wiring layer;

a first conductor that has a first width, and penetrates the second semiconductor layer in a thickness direction; and a second conductor that has a second width smaller than the first width, and penetrates the second semiconductor layer in the thickness direction, wherein the second conductor has a first end that is an end on the fourth surface side, a second end that is included in the second conductor and that is an end on the third surface side, and an intermediate portion located between the first end and the second end, and the first end has a larger diameter than the intermediate portion.

55. The optical detection device according to claim 54, wherein the diameter of the first end is larger than a diameter of a portion included in the intermediate portion and located on a boundary with the first end.

56. An optical detection device, comprising:

a first semiconductor layer that includes a photoelectric conversion region, and has one surface corresponding to a first surface and another surface corresponding to a second surface that is a light entrance surface;

a second semiconductor layer that has one surface corresponding to a third surface and another surface corresponding to a fourth surface;

a second wiring layer overlapped with the third surface of the second semiconductor layer;

a third wiring layer overlapped with the fourth surface of the second semiconductor layer;

a first wiring layer that has one surface overlapped with the first surface of the first semiconductor layer and another surface overlapped with one of the second wiring layer and the third wiring layer;

a first conductor that has a first width, and penetrates the second semiconductor layer in a thickness direction; and a second conductor that has a second width smaller than the first width, and penetrates the second semiconductor layer in the thickness direction, wherein each of the wiring layer that is the second wiring layer or the third wiring layer and is overlapped with the first wiring layer and the first wiring layer has a plurality of wires laminated via an insulation film, a plurality of vias extending in a lamination direction, and a plurality of reflection members, each of the vias achieves electric connection between the respective wires, or between the wires and one of the first semiconductor layer and the second semiconductor layer, and the reflection members are arranged at height positions identical to height positions of the vias in the lamination direction, and arranged in a matrix in a planar view in such a manner as to fill an area between the respective vias.

57. The optical detection device according to claim 56, wherein each of the reflection members is in an electrically floating state.

58. An optical detection device, comprising:

a first semiconductor layer that includes a photoelectric conversion region, and has one surface corresponding to a first surface and another surface corresponding to a second surface that is a light entrance surface;

a second semiconductor layer that has one surface corresponding to a third surface and another surface corresponding to a fourth surface;

a second wiring layer overlapped with the third surface of the second semiconductor layer;

a third wiring layer overlapped with the fourth surface of the second semiconductor layer;

a first wiring layer that has one surface overlapped with the first surface of the first semiconductor layer and another surface overlapped with one of the second wiring layer and the third wiring layer;

a first conductor that has a first width, and penetrates the second semiconductor layer in a thickness direction; and a second conductor that has a second width smaller than the first width, and penetrates the second semiconductor layer in the thickness direction a third semiconductor layer;

a fourth wiring layer that has one surface overlapped with the third semiconductor layer and another surface overlapped with the other of the second wiring layer and the third wiring layer; and a heat dissipation path that has one end connected to a surface of the second semiconductor layer on the third semiconductor layer side and another end connected to the third semiconductor layer 80.

59. The optical detection device according to claim 58, wherein at least a part of the one end of the heat dissipation path is embedded in the second semiconductor layer, and at least a part of the other end of the heat dissipation path is embedded in the third semiconductor layer.

* * * * *